US006476863B1

(12) United States Patent
Silverbrook

(10) Patent No.: US 6,476,863 B1
(45) Date of Patent: Nov. 5, 2002

(54) IMAGE TRANSFORMATION MEANS INCLUDING USER INTERFACE

(75) Inventor: Kia Silverbrook, Sydney (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

(21) Appl. No.: 09/113,070

(22) Filed: Jul. 10, 1998

(30) Foreign Application Priority Data

Jul. 15, 1997 (AU) .............................................. PO7988
Jul. 15, 1997 (AU) .............................................. PO7991

(51) Int. Cl.[7] .......................... H04N 5/76; H04N 5/225
(52) U.S. Cl. ...................................... 348/233; 348/207
(58) Field of Search ................................ 348/207, 231, 348/233, 375, 552, 588; 358/1.18, 1.6; 396/211; 235/380, 470

(56) References Cited

U.S. PATENT DOCUMENTS

| 4,837,628 A | * | 6/1989 | Sasaki ........................ 348/231 |
| 4,897,724 A | * | 1/1990 | Veldhuis ..................... 348/588 |
| 4,937,676 A | * | 6/1990 | Finelli et al. ................ 348/375 |
| 5,184,169 A | * | 2/1993 | Nishitani ..................... 396/211 |
| 5,734,154 A | * | 3/1998 | Jachimowicz et al. ...... 235/492 |
| 5,818,023 A | * | 10/1998 | Meyerson et al. ........... 235/470 |
| 5,835,136 A | * | 11/1998 | Watanabe et al. ........... 348/207 |

* cited by examiner

Primary Examiner—Wendy R. Garber
Assistant Examiner—Luong Nguyen

(57) ABSTRACT

This patent describes an alternative form of user interface for operating a device such as a camera comprising a card which is inserted in a machine. On the face of the card is contained a visual representation of the effect the card will have on the output of the machine. Preferably the camera device is capable of transforming a sensed image substantially in accordance with the transformation of a standard image comprising the visual representation and the transformation of the sensed image is printed out on the printer. Alternatively the machine comprises a book reader and the card includes a books contents for display by the book reader as indicated by the visual representation on the front of the card. On one surface of the card, the visual representation of the effect is displayed, and on a second surface, an optically encoded representation of the effect able to be read by a sensing device of the machine and decoded so as to produce the effect.

4 Claims, 140 Drawing Sheets

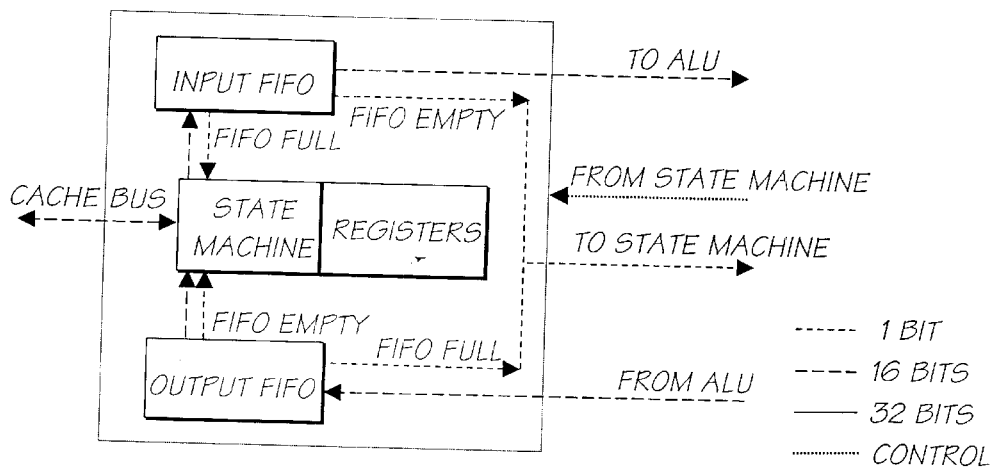
FIG. 16
ORDER OF PIXELS PRESENTED BY A SEQUENTIAL READ ITERATOR
ON A 4 X 2 IMAGE WITH PADDING.
| 0 | 1 | 2 | 3 | |
|---|---|---|---|---|
| 4 | 5 | 6 | 7 | |
FIG. 17
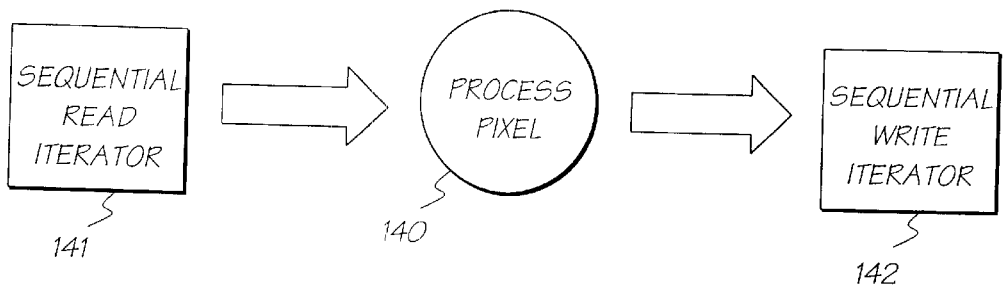
FIG. 18

A 3x3 BOX VIEW TRAVERSES THE PIXELS IN ORDER: 0, 1, 2, 3, 4, 5, 6, 7, 8 ETC, PLACING A 3x3 BOX CENTERED OVER EACH PIXEL...

3x3 BOX VIEW OF FIRST
PIXEL IN IMAGE = 9 PIXELS,
5 OF WHICH ARE OUTSIDE
THE IMAGE

FIRST 9 PIXELS FROM THE BOX READ ITERATOR:

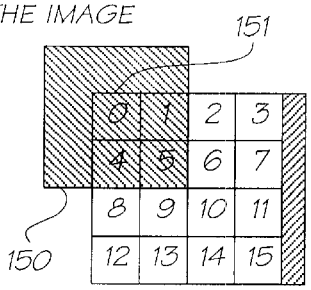

IF DUPLICATION OF EDGE PIXELS IS ON: 0, 0, 0, 0, 0, 1, 4, 4, 5

IF DUPLICATION OF EDGE PIXELS IS OFF: V, V, V, V, 0, 1, V, 4, 5
WHERE V IS CONSTANTPIXEL REGISTER VALUE REPRESENTING "OUTSIDE THE IMAGE"

3x3 BOX VIEW OF
SECOND PIXEL IN IMAGE
= 9 PIXELS,
3 OF WHICH ARE
OUTSIDE THE IMAGE

SECOND 9 PIXELS FROM THE BOX READ ITERATOR:

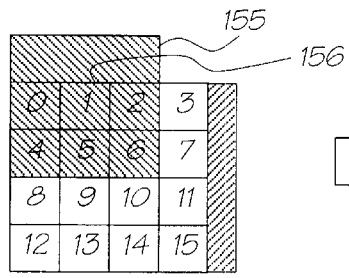

IF DUPLICATION OF EDGE PIXELS IS ON: 0, 1, 2, 0, 1, 2, 4, 5, 6

IF DUPLICATION OF EDGE PIXELS IS OFF: V, V, V, 0, 1, 2, 4, 5, 6
WHERE V IS CONSTANTPIXEL REGISTER VALUE REPRESENTING "OUTSIDE THE IMAGE"

FIG. 19

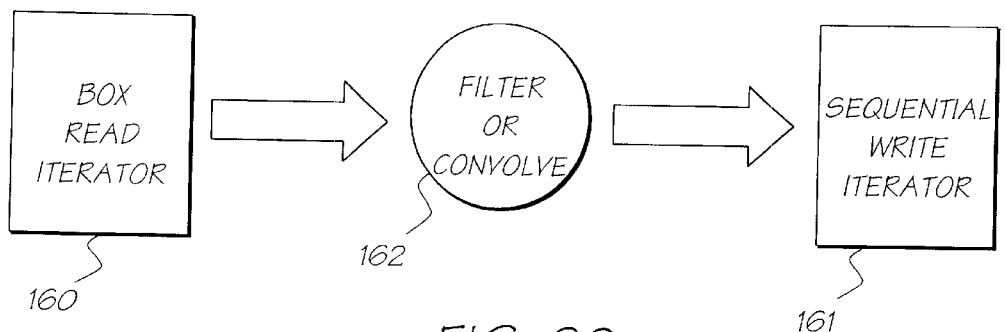
FIG. 20
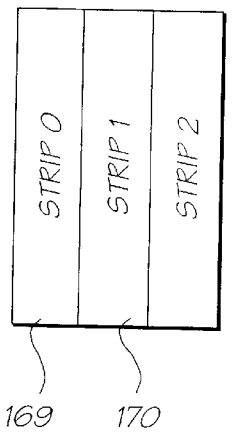
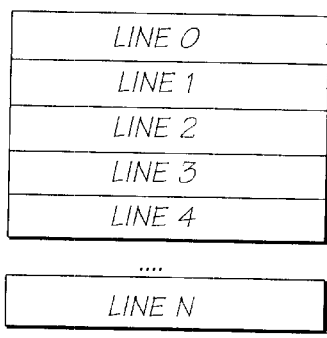
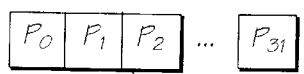
FIG. 21
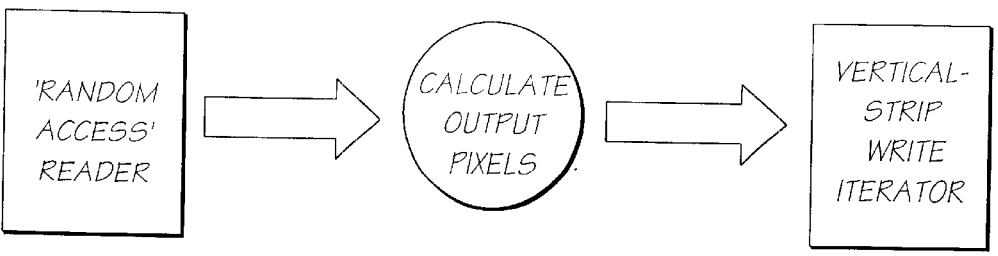
FIG. 22

2X2 PIXEL BLOCK FROM SENSOR

2X2 PIXEL BLOCK FROM CCD

LAB STORED IN PLANAR FASHION. ALL 3 COMPONENTS ARE UNCOMPRESSED.

LAB STORED IN PLANAR FASHION. L IS NOT COMPRESSED. a AND b ARE COMPRESSED.

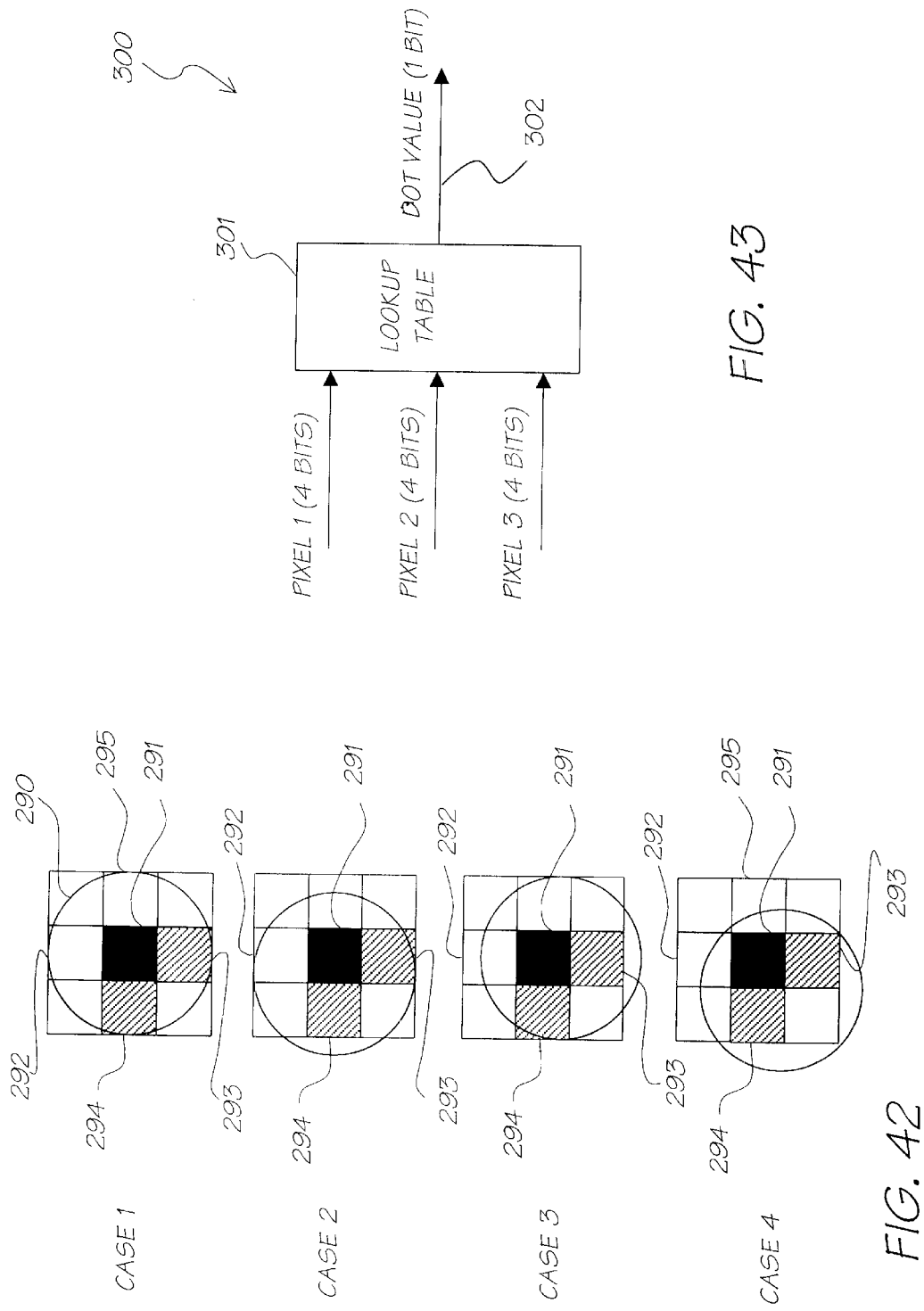

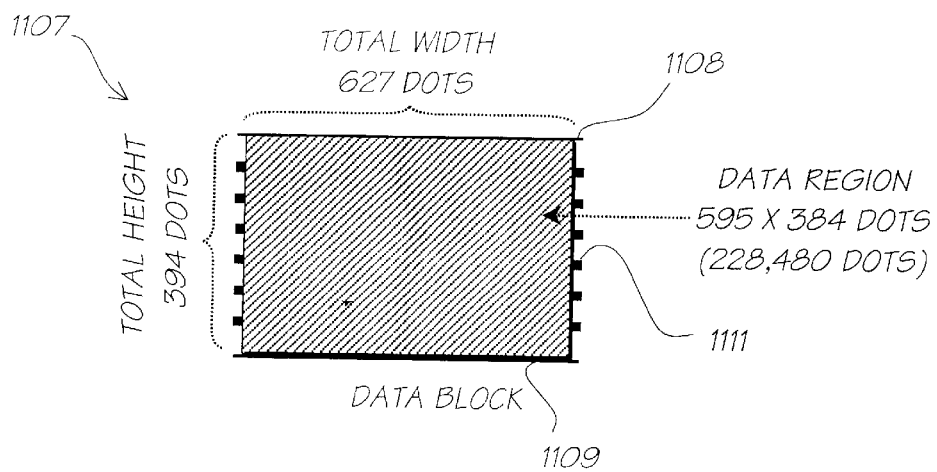
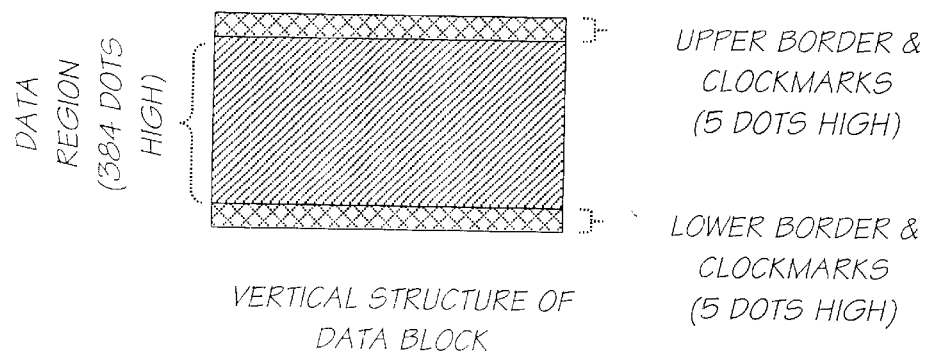
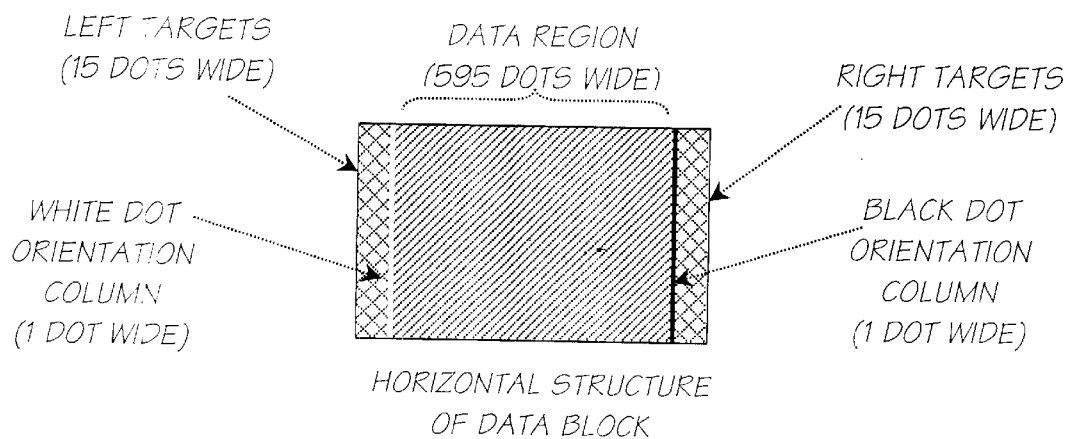
FIG. 49

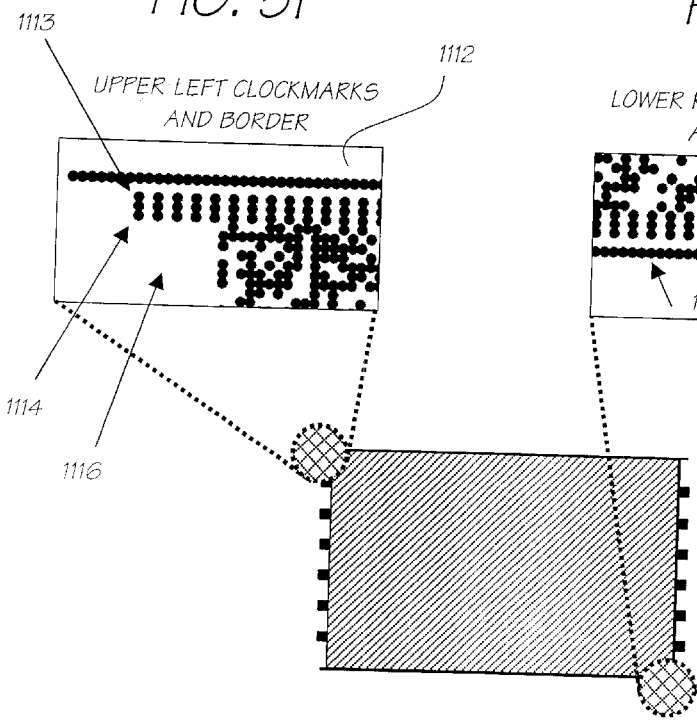
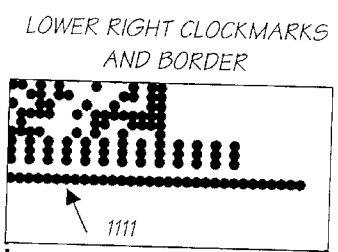
FIG. 51 — UPPER LEFT CLOCKMARKS AND BORDER
FIG. 52 — LOWER RIGHT CLOCKMARKS AND BORDER
FIG. 50

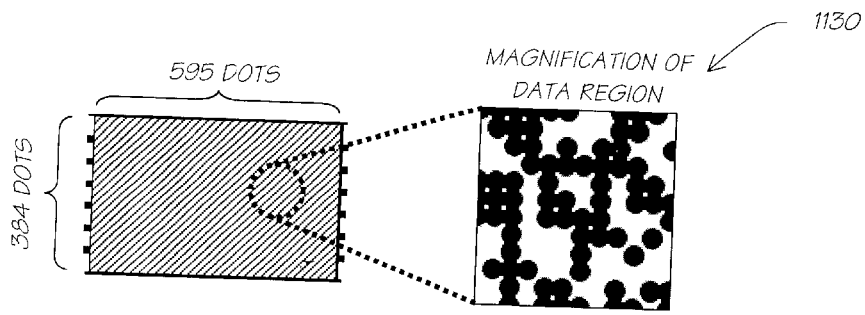
FIG. 57
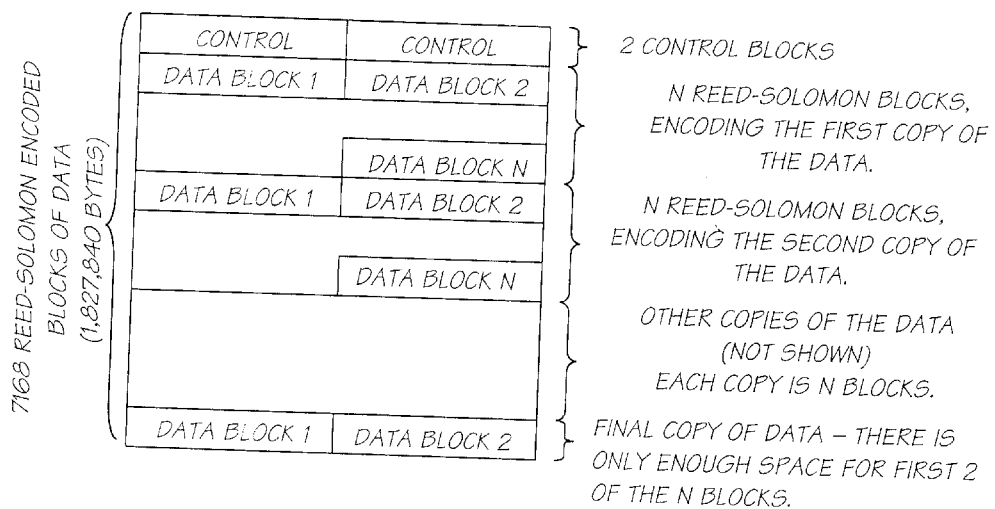
FIG. 58
```
00: 4F 00 3D 4F 00 3D 4F 00 3D 4F 00 3D
0C: 4F 00 3D 4F 00 3D 4F 00 3D 4F 00 3D
18: 4F 00 3D 4F 00 3D 4F 00 3D 4F 00 3D
24: 4F 00 3D 4F 00 3D 4F 00 3D 4F 00 3D
30: 4F 00 3D 4F 00 3D 4F 00 3D 4F 00 3D
3C: 4F 00 3D 4F 00 3D 4F 00 3D 4F 00 3D
48: 4F 00 3D 4F 00 3D 4F 00 3D 4F 00 3D
54: 4F 00 3D 4F 00 3D 4F 00 3D 4F 00 3D
60: 00 00 00 00 00 00 00 00 00 00 00 00
6C: 00 00 00 00 00 00 00 00 00 00 00 00
78: 00 00 00 00 00 00 00 00 00 00 00 00
```
} 32 COPIES OF THE 3 BYTE CONTROL INFORMATION
} RESERVED BYTES ARE 0
FIG. 59

PROBABILITY OF A SYMBOL BEING IN ERROR DURING A READ

UPPER LEFT CLOCKMARKS AND BORDER $$X_N = (P2_x - P0_x) * SCALE\ FACTOR$$
$$Y_N = (P2_y - P0_y) * SCALE\ FACTOR$$

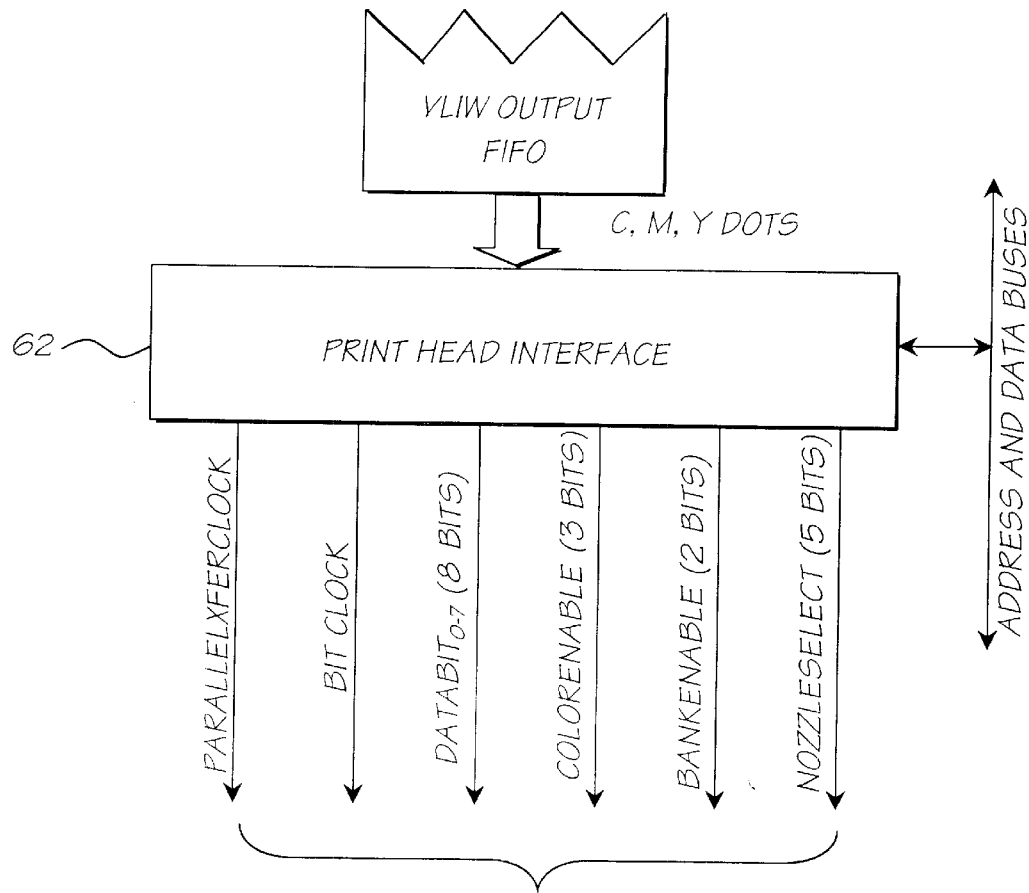
FIG. 154
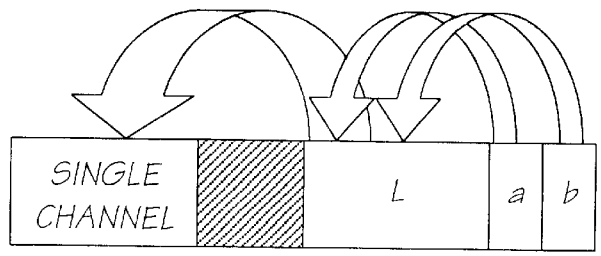
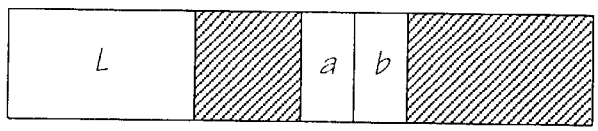
FIG. 155

Start Address 0 1000 0000

| Adr Table 1 (32) |

0 1010 0000

| Adr Table 2 (32) |

0 1100 0000

| DBR Table (8) |

0 1100 1000

| Program (312) |

| DATA TYPE | BITS |
|---|---|
| Factory Code | 16 |
| Batch Number | 32 |
| Serial Number | 48 |
| Manufacturing Date | 16 |
| Media Length | 24 |
| Media Type | 8 |
| Preprinted Media Length | 16 |
| Cyan Ink Viscosity | 8 |
| Magenta Ink Viscosity | 8 |
| Yellow Ink Viscosity | 8 |
| Cyan Drop Volume | 8 |
| Magenta Drop Volume | 8 |
| Yellow Drop Volume | 8 |
| Cyan Ink Color | 24 |
| Magenta Ink Color | 24 |
| Yellow Ink Color | 24 |
| Remaining-media Length Indicator | 16 |
| Authentication Key | 128 |
| Copyrightable bit pattern | 512 |
| Reserved for Camera Use | 88 |
| TOTAL | 1024 |

FIG. 204

IMAGE TRANSFORMATION MEANS INCLUDING USER INTERFACE

CROSS REFERENCES TO RELATED APPLICATIONS

The following Australian provisional patent applications are hereby incorporated by cross-reference. For the purposes of location and identification, US patent applications, identified by their US patent application serial numbers (USSN) are listed alongside the Australian applications from which the US patent applications claim the right of priority.

FIELD OF THE INVENTION

The present invention relates to an image processing method and apparatus and, in particular, discloses a Image Transformation Means Including User Interface.

The present invention further relates to the field of digital camera technology and, particularly, discloses a digital camera having an integral colour printer.

BACKGROUND OF THE INVENTION

Traditional camera technology has for many years relied upon the provision of an optical processing system which images a negative of an image onto a photosensitive film which is subsequently chemically processed so as to "fix" the film and to subsequently allow for positive prints to be produced which reproduce the original image. Such an image processing technology, although it has become a standard, can be unduly complexed, is expensive and difficult technologies are involved in full colour processing of images. Recently, digital cameras have become available. These cameras normally rely upon the utilisation of a charged coupled device (CCD) to image the particular image. The camera normally includes the storage media for the storage of the imaged devices in addition to a connector for the transfer of images to a subsequent computer device for manipulation and printing out.

Such devices are generally inconvenient in that all images must be stored by the camera and printed out at some later stage. Hence, the camera must have sufficient storage capabilities for the storing of multiple images and, additionally, the user of the camera must have access to a subsequent computer system for the downloading of the images and there printing out by a computer device or the like. Further, it would be desirable to be able to provide a simplified user interface for the production of image manipulations and enhancements to images captured.

SUMMARY OF THE INVENTION

The present invention relates to an alternative form of user interface for operating a device such as a camera.

In accordance with a first aspect of the invention there is provided a user interface for operating a device, said user interface comprising a card which is inserted in a machine and on the face of the card is contained a visual representation of the effect the card will have on the output of the machine.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIG. 16 illustrates the I/O address generator block in more detail;

FIG. 17 illustrates a pixel storage format;

FIG. 18 illustrates a sequential read iterator process;

FIG. 19 illustrates a box read iterator process;

FIG. 20 illustrates a box write iterator process;

FIG. 21 illustrates the vertical strip read/write iterator process;

FIG. 22 illustrates the vertical strip read/write iterator process;

FIG. 42 illustrates the process of centroid drift;

FIG. 43 shows one form of centroid lookup table;

FIG. 49 illustrates schematically the layout of a single datablock;

FIG. 50 illustrates a single datablock;

FIG. 51 and FIG. 52 illustrate magnified views of portions of the datablock of FIG. 50;

FIG. 57 illustrates the array of dots of a datablock;

FIG. 58 illustrates schematically the structure of data for Reed-Solomon encoding;

FIG. 59 illustrates an example Reed-Solomon encoding;

FIG. 119 illustrates the implementation of the calculation of $1/\sqrt{X}$ in more detail;

FIG. 120 illustrates the process of Normal calculation with a bump map;

FIG. 121 illustrates the process of illumination calculation with a bump map;

FIG. 122 illustrates the process of illumination calculation with a bump map in more detail;

FIG. 123 illustrates the process of calculation of L using a directional light;

FIG. 124 illustrates the process of calculation of L using a Omni lights and spotlights;

FIG. 125 illustrates one form of implementation of calculation of L using a Omni lights and spotlights;

FIG. 126 illustrates the process of calculating the N.L dot product;

FIG. 127 illustrates the process of calculating the N.L dot product in more detail;

FIG. 128 illustrates the process of calculating the R.V dot product;

FIG. 129 illustrates the process of calculating the R.V dot product in more detail;

FIG. 130 illustrates the attenuation calculation inputs and outputs;

Figure 131:
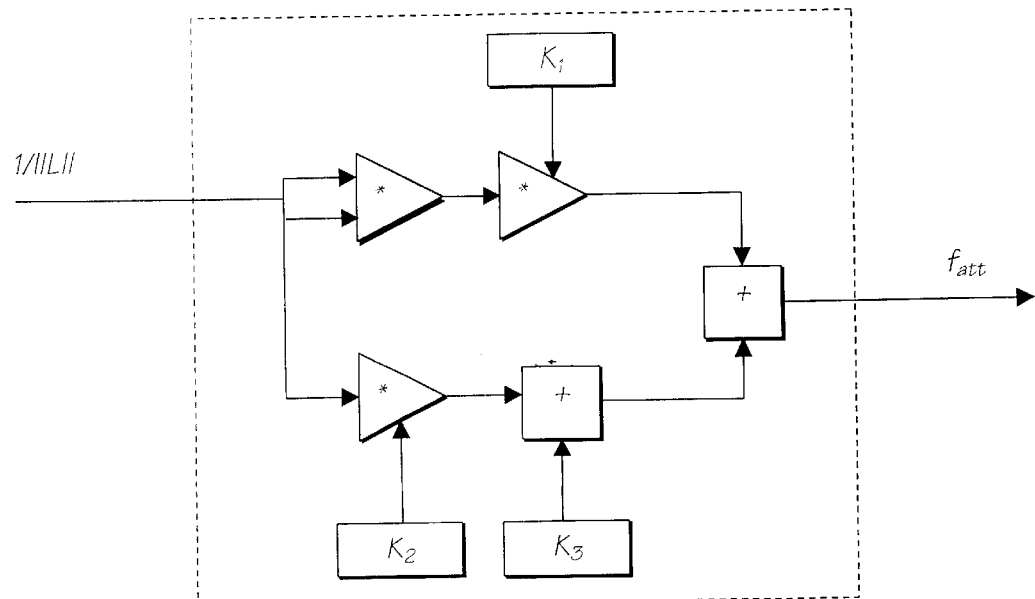
Figure 132:
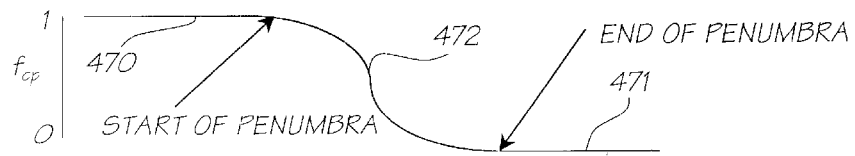
Figure 133:
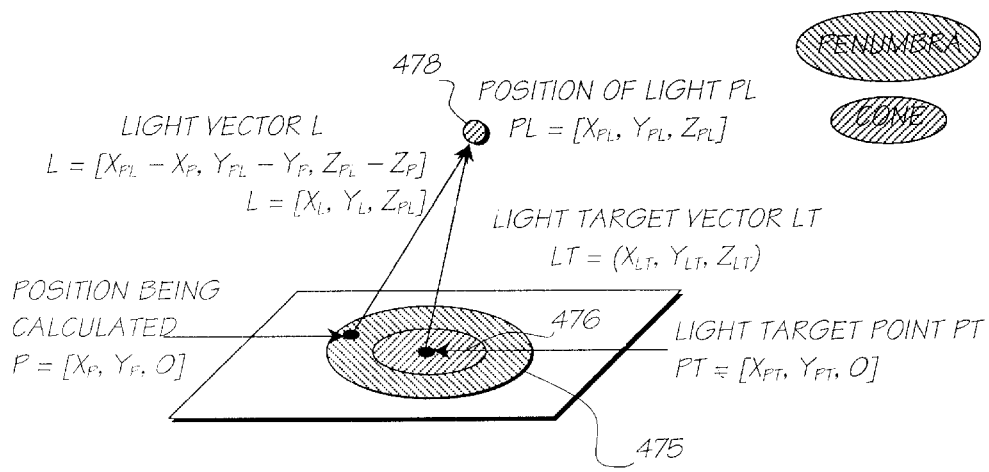
Figure 134:
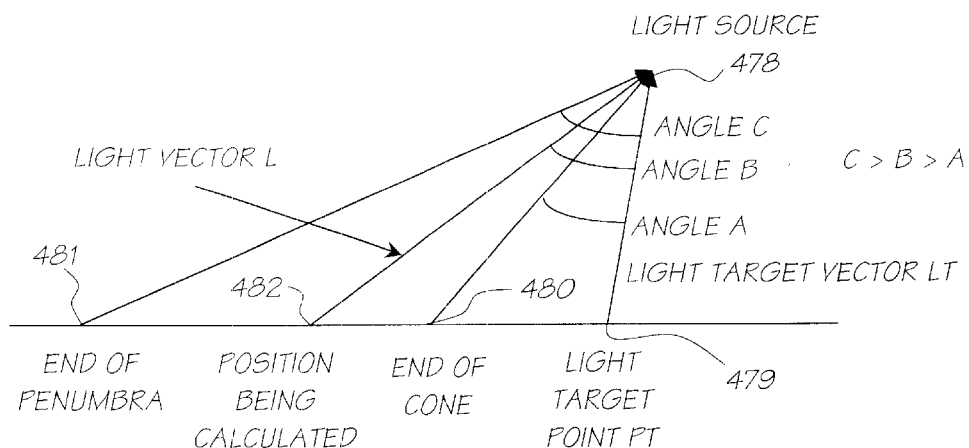
Figure 135:
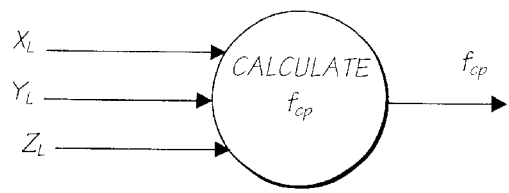
Figure 136:
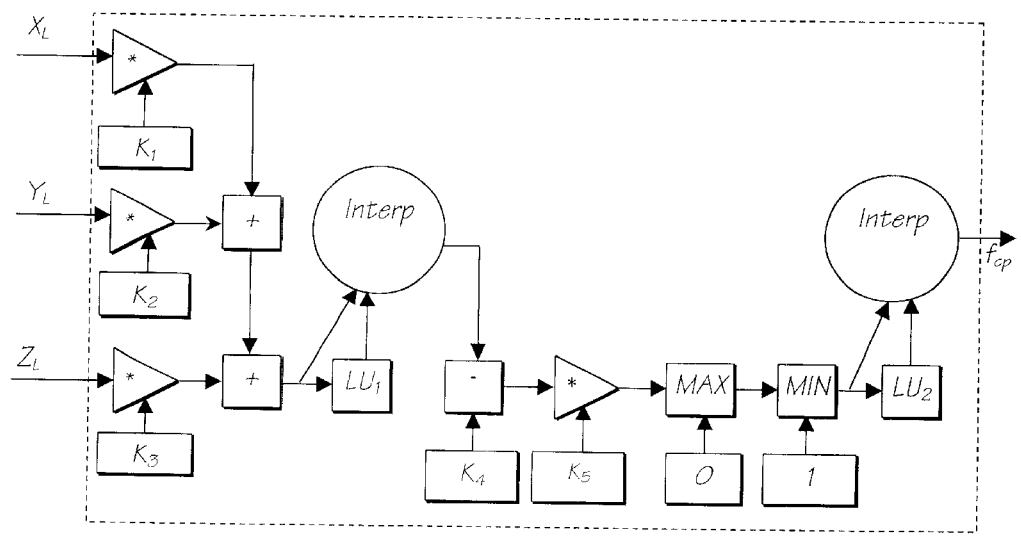
Figure 137:
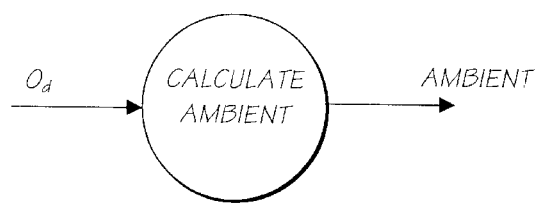
Figure 138:
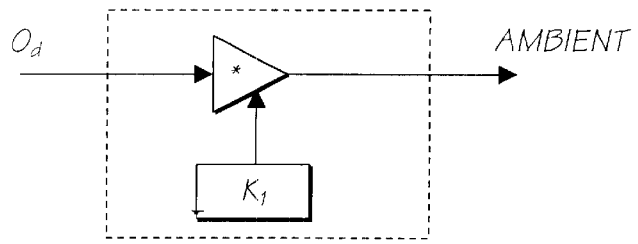
Figure 139:
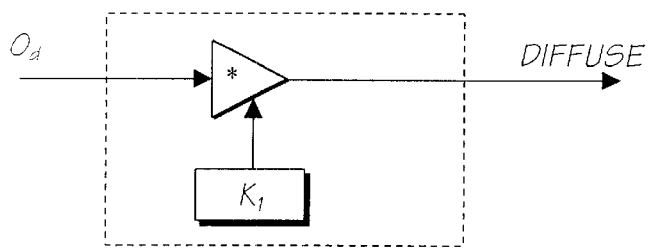
Figure 140:
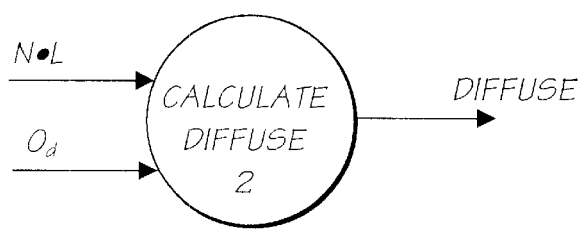
Figure 141:
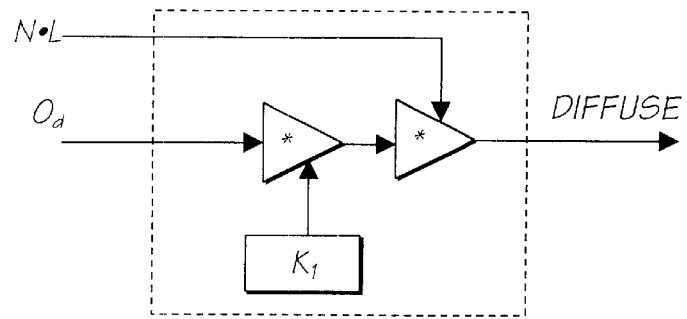
Figure 142:
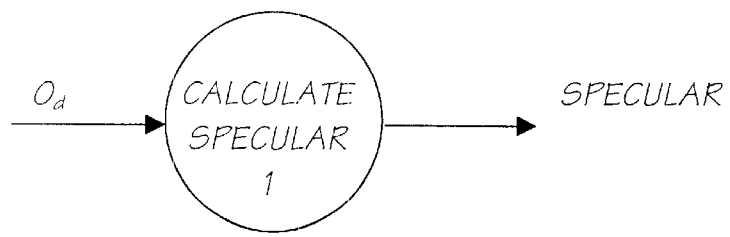
Figure 143:
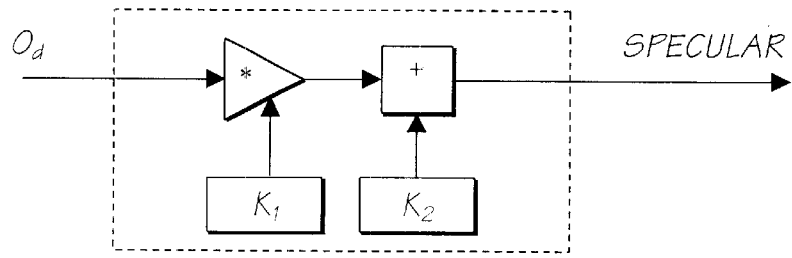
Figure 144:
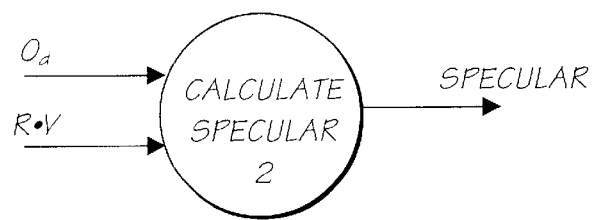
Figure 145:
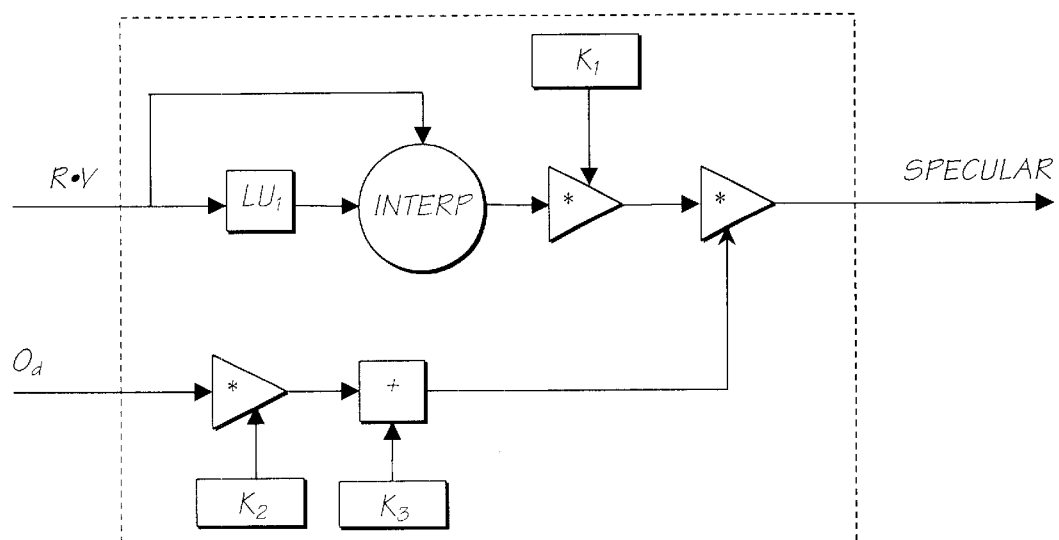
Figure 146:
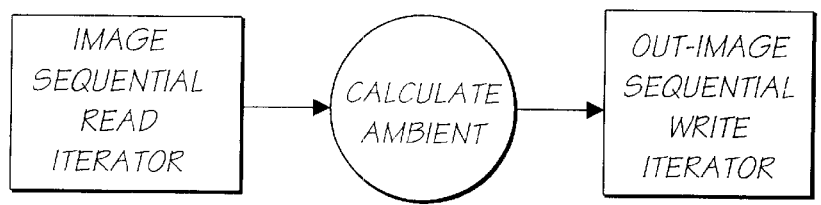
Figure 147:
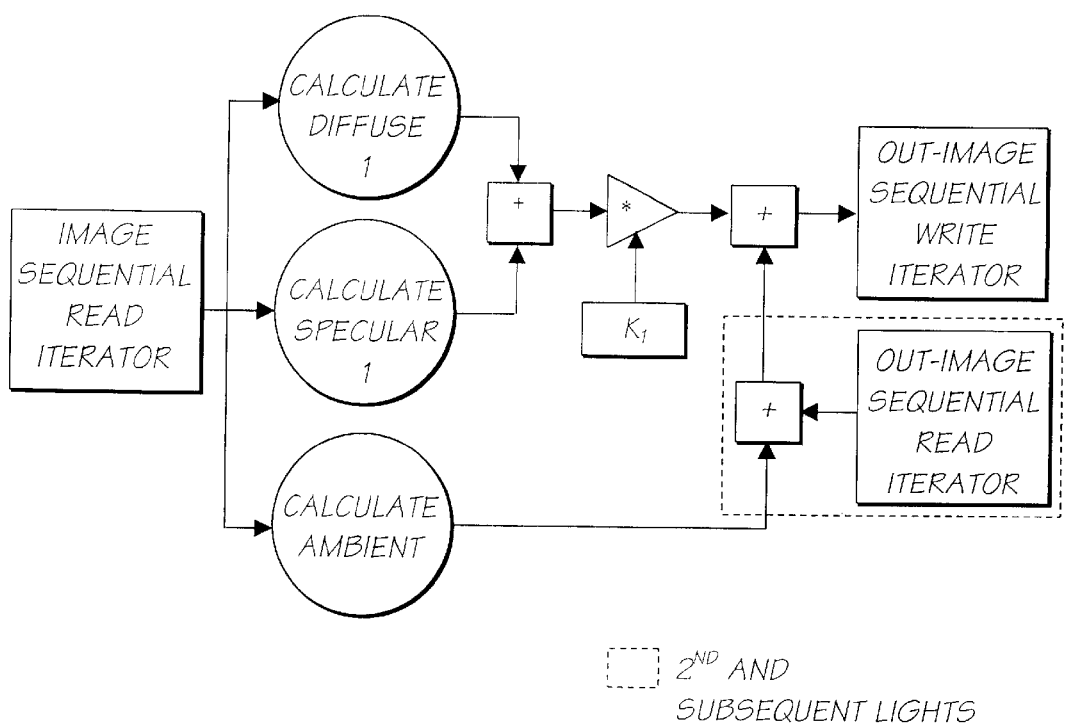
Figure 148:
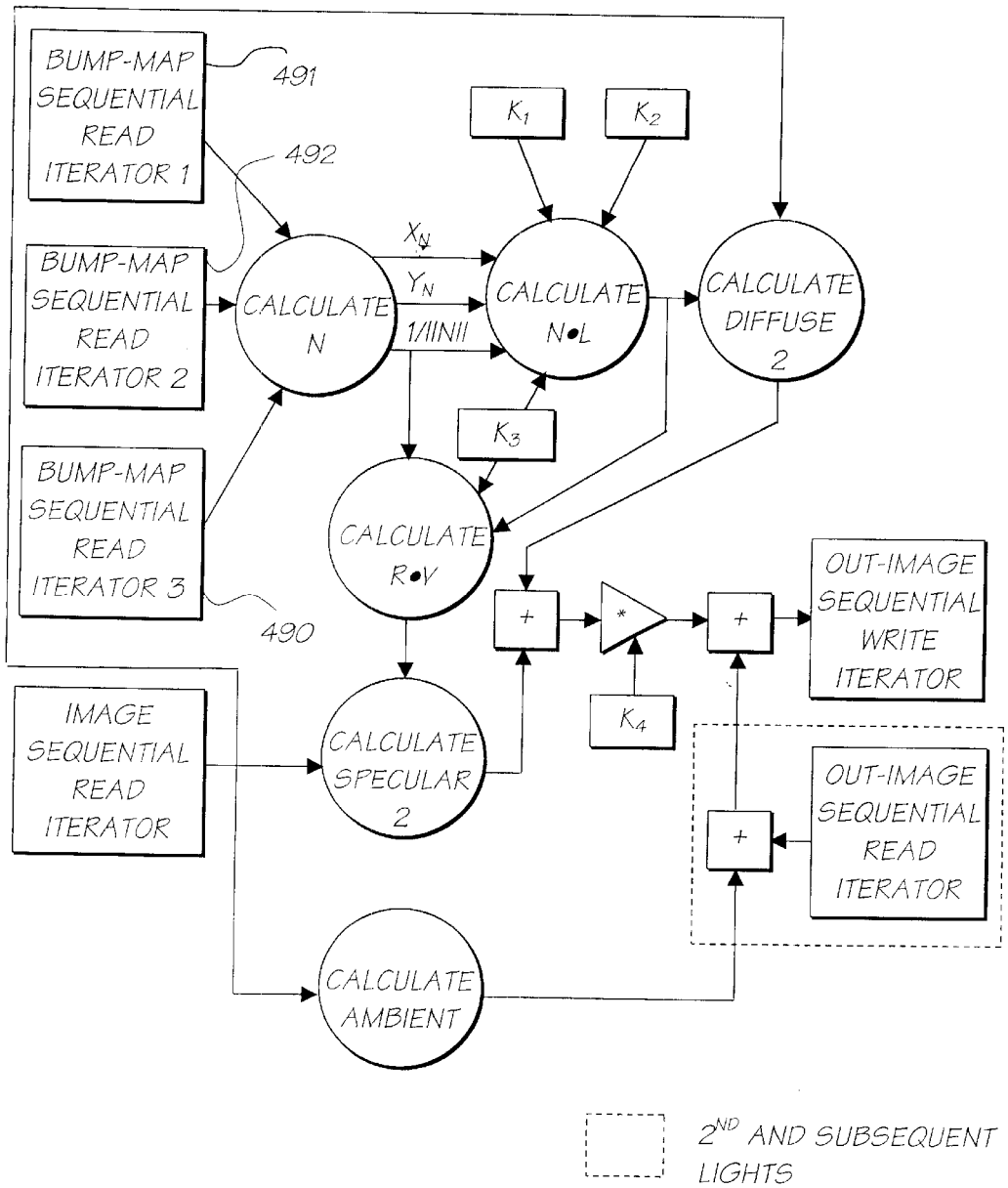
Figure 149:
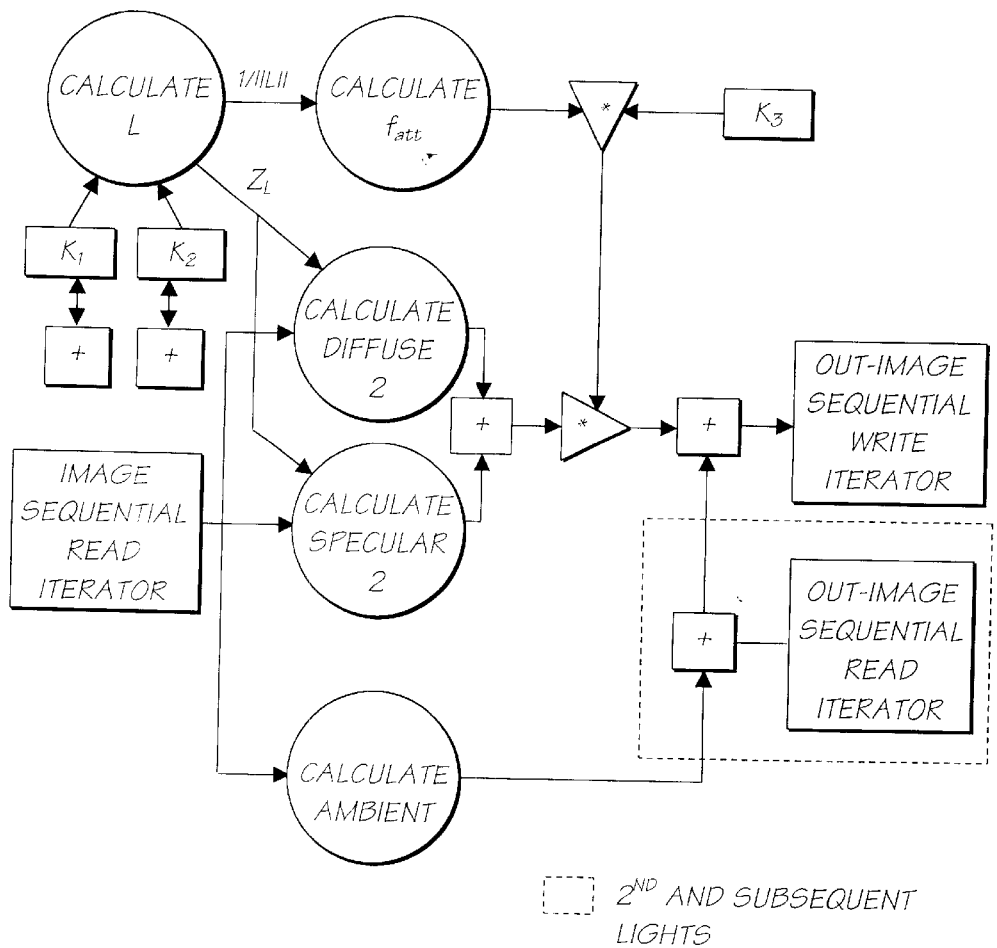
Figure 150:
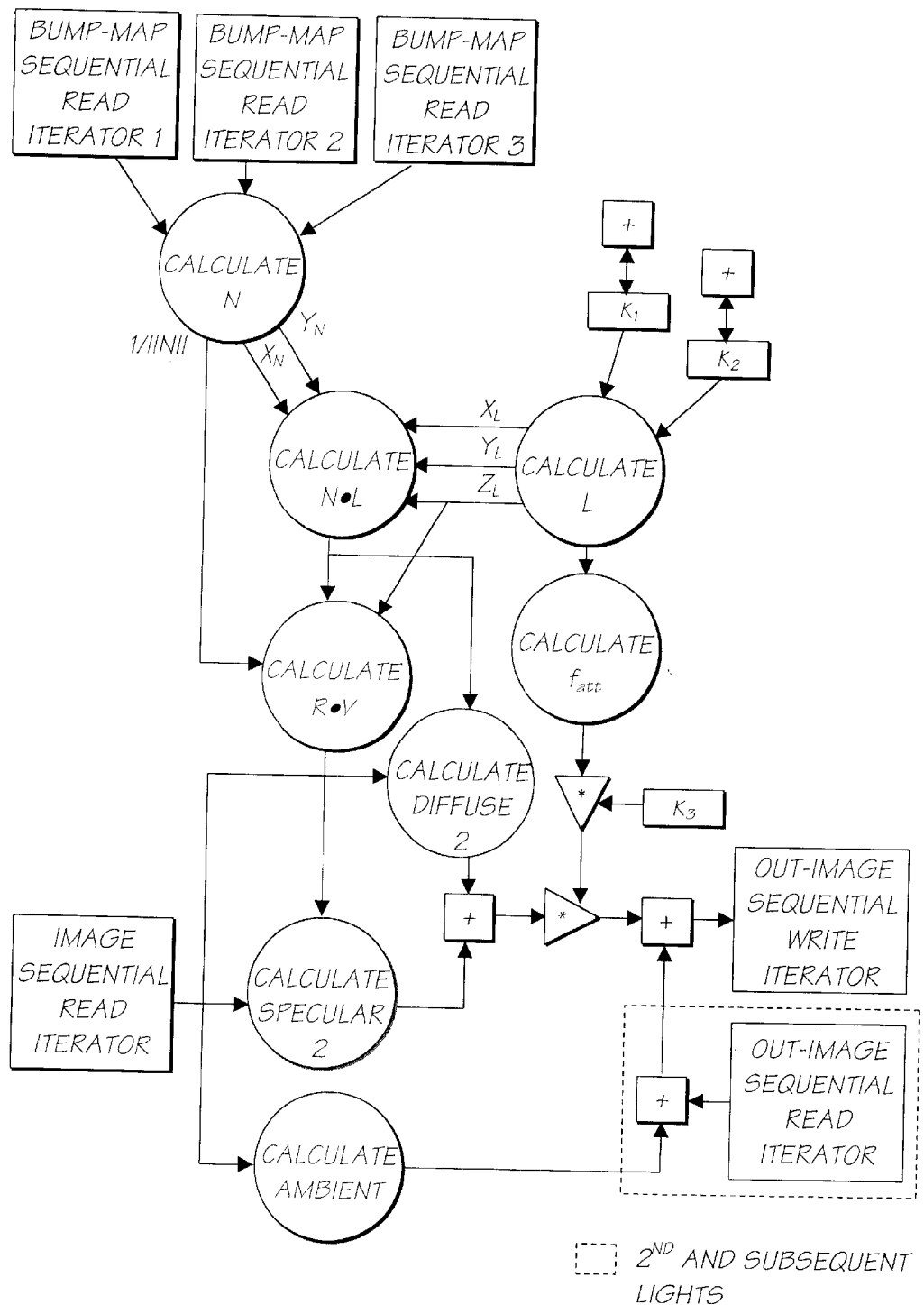
Figure 151:
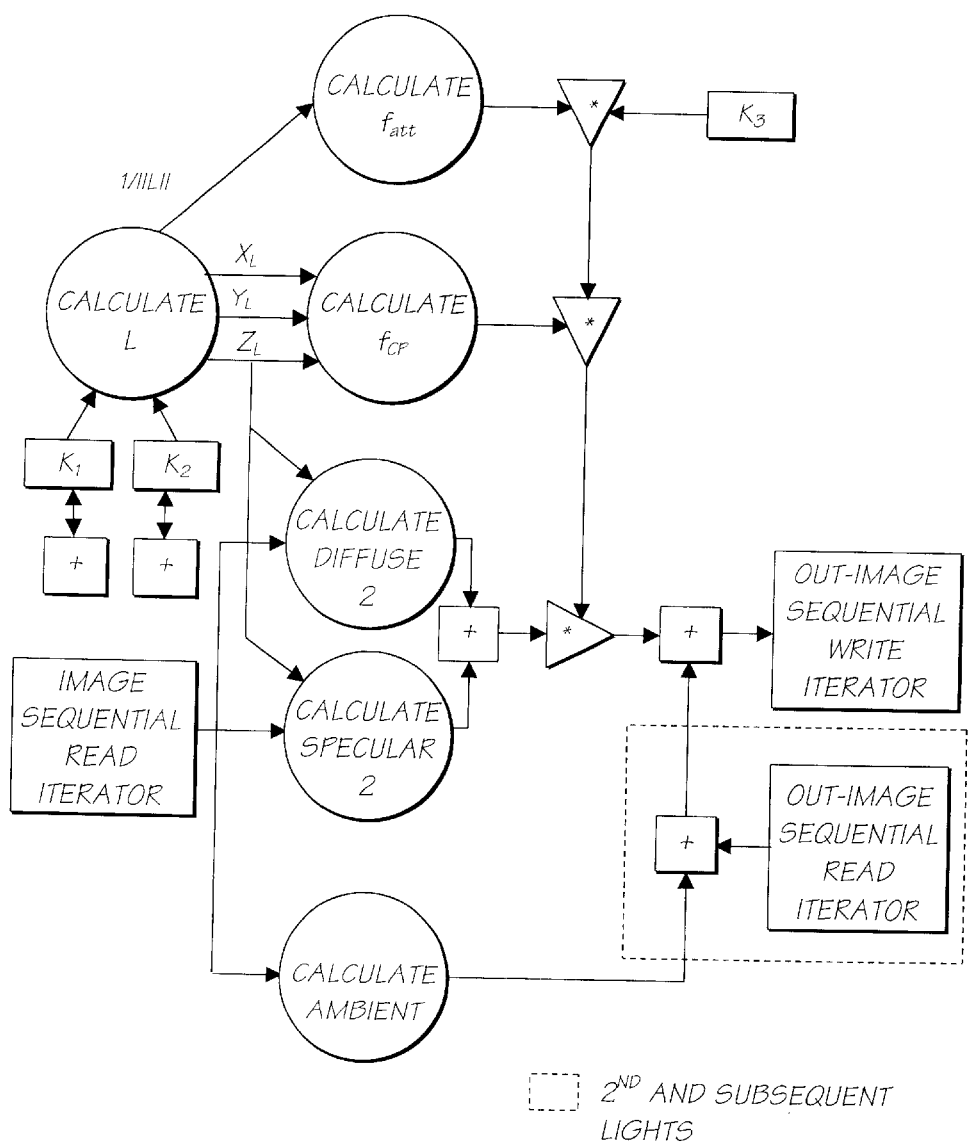
Figure 152:
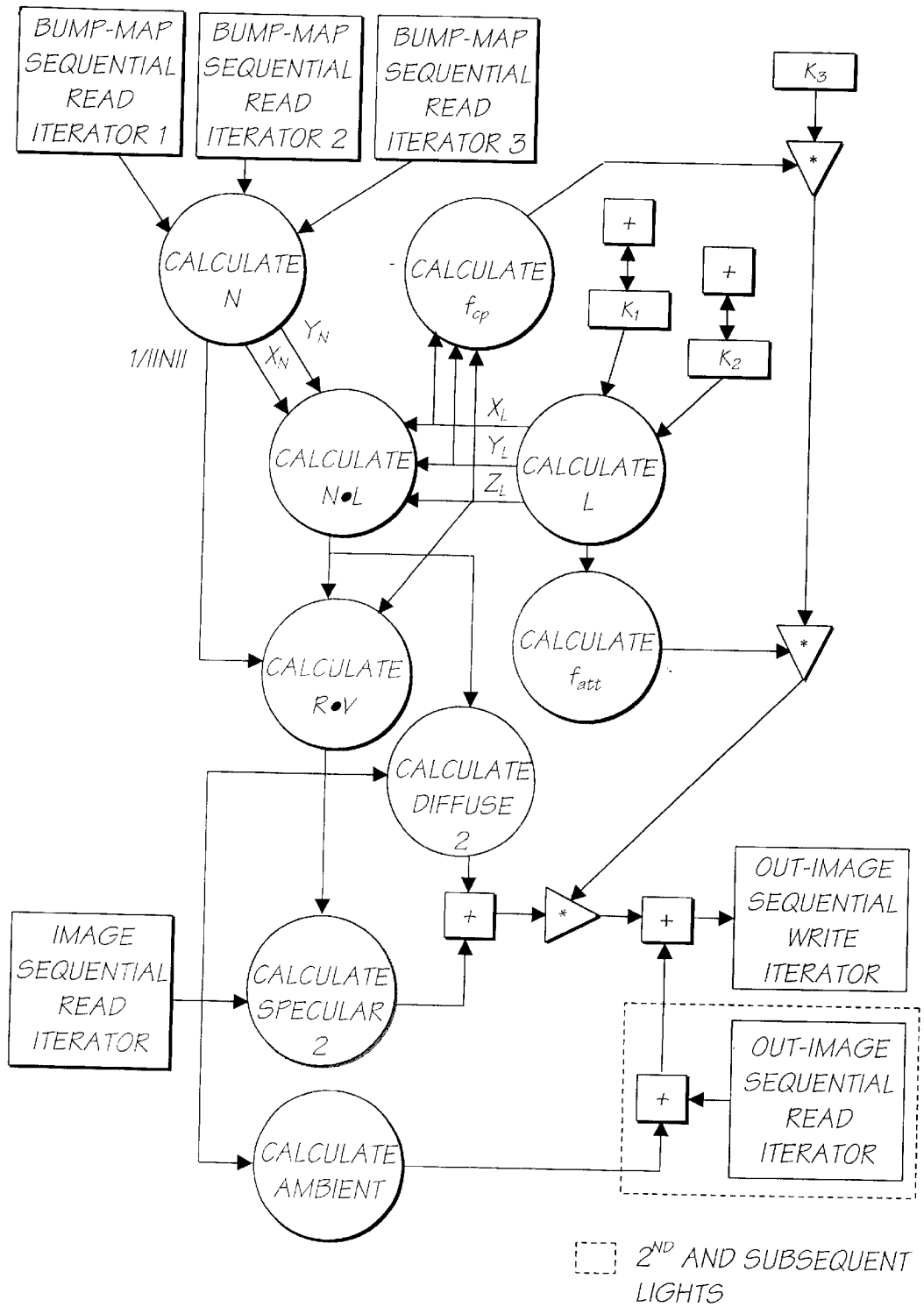
Figure 153:
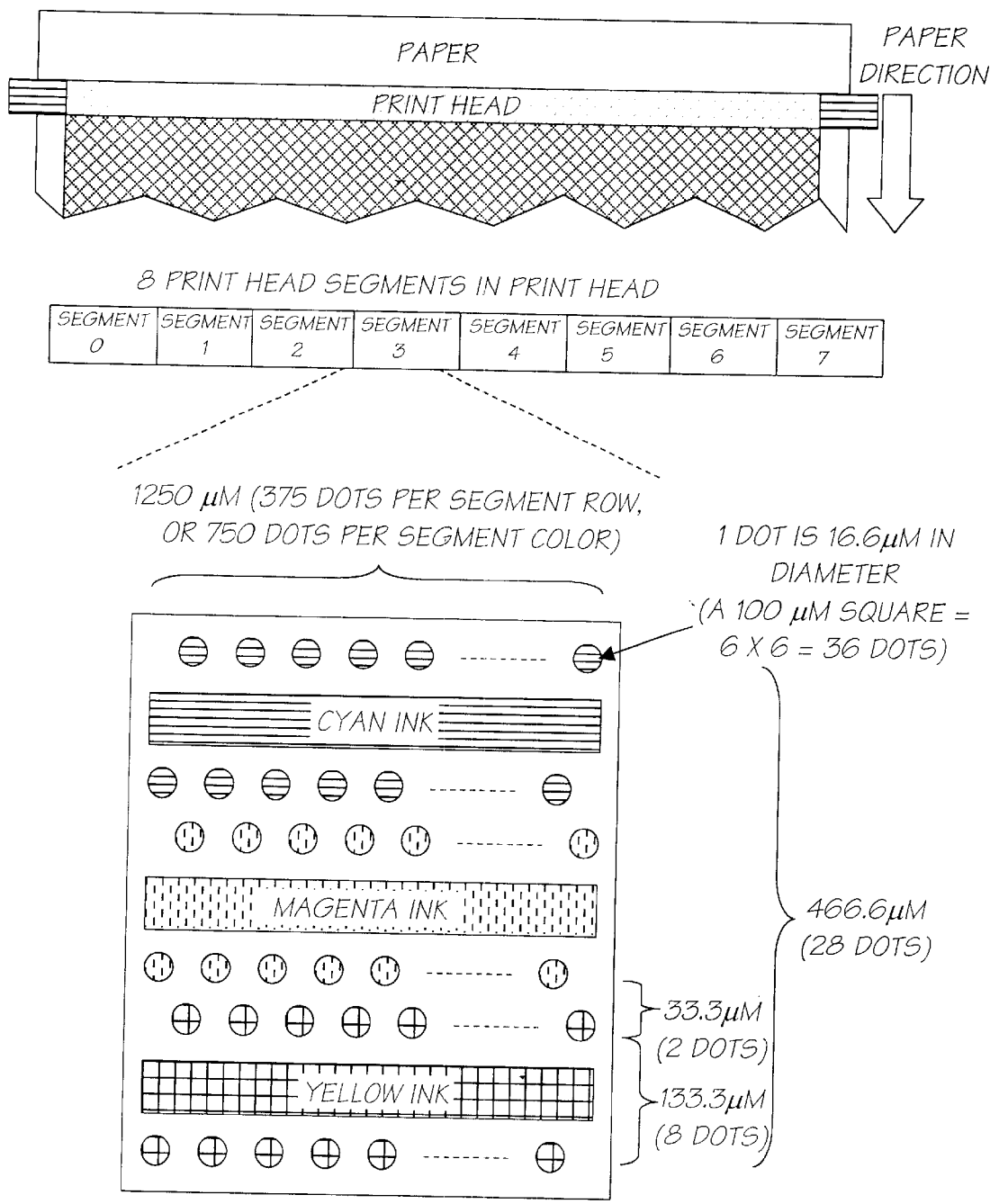
Figure 156:
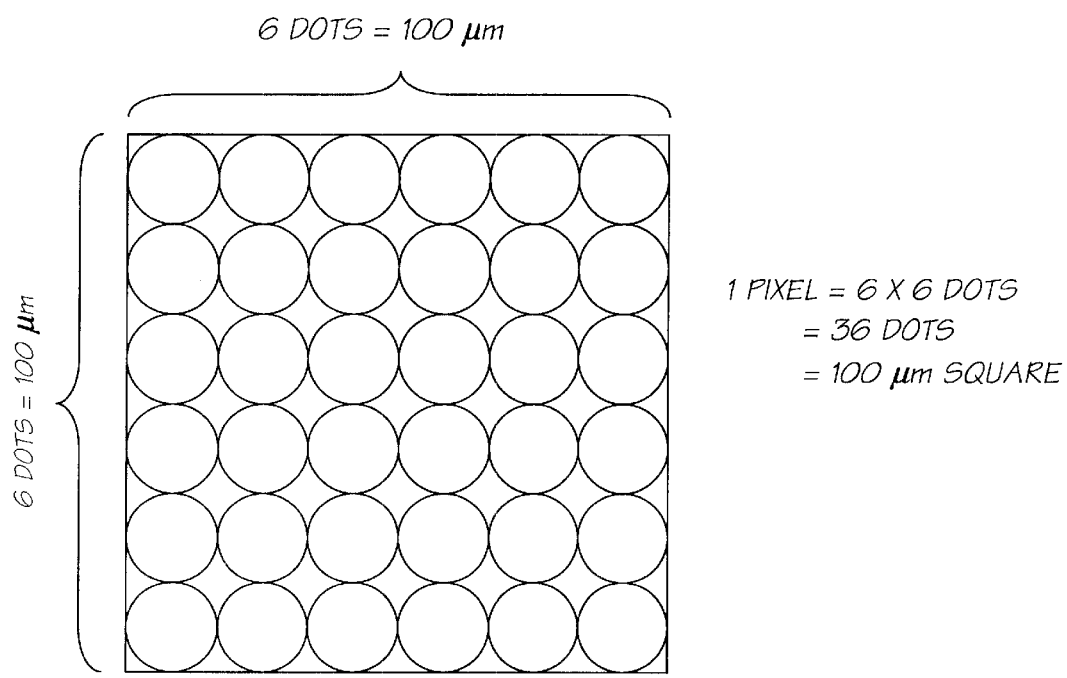
Figure 157:
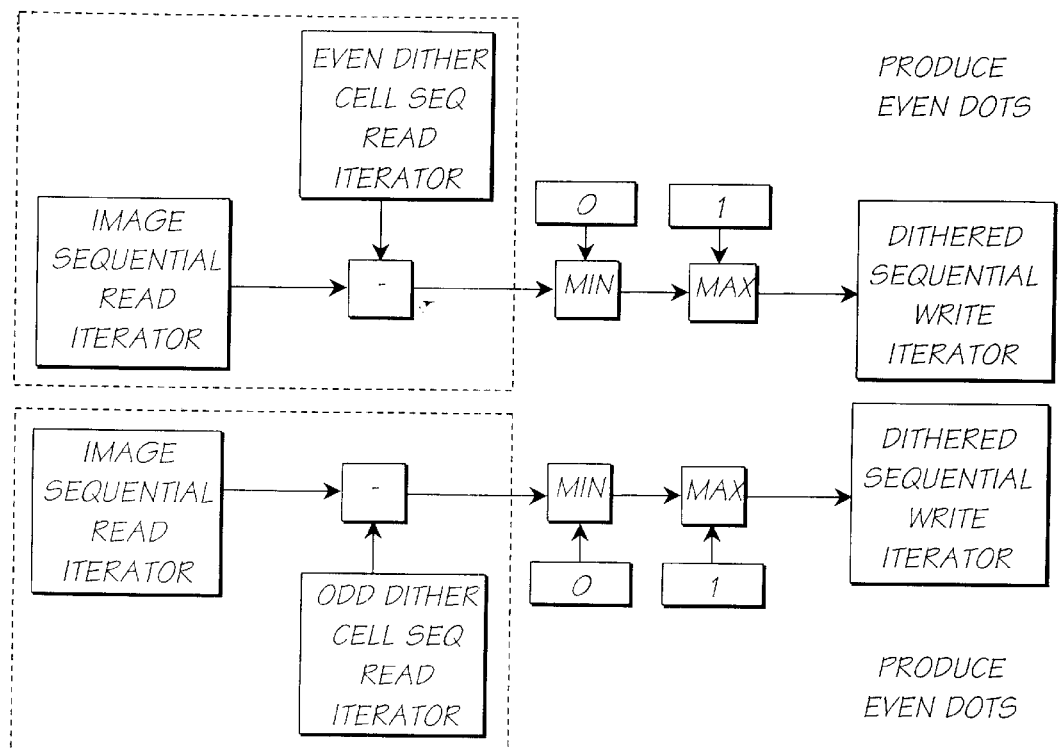
Figure 158:
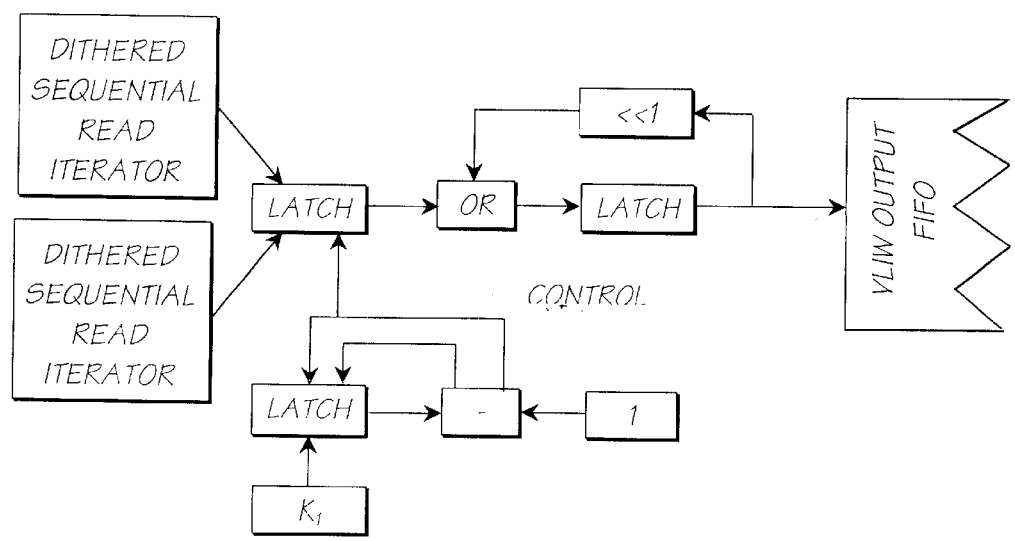
Figure 159:
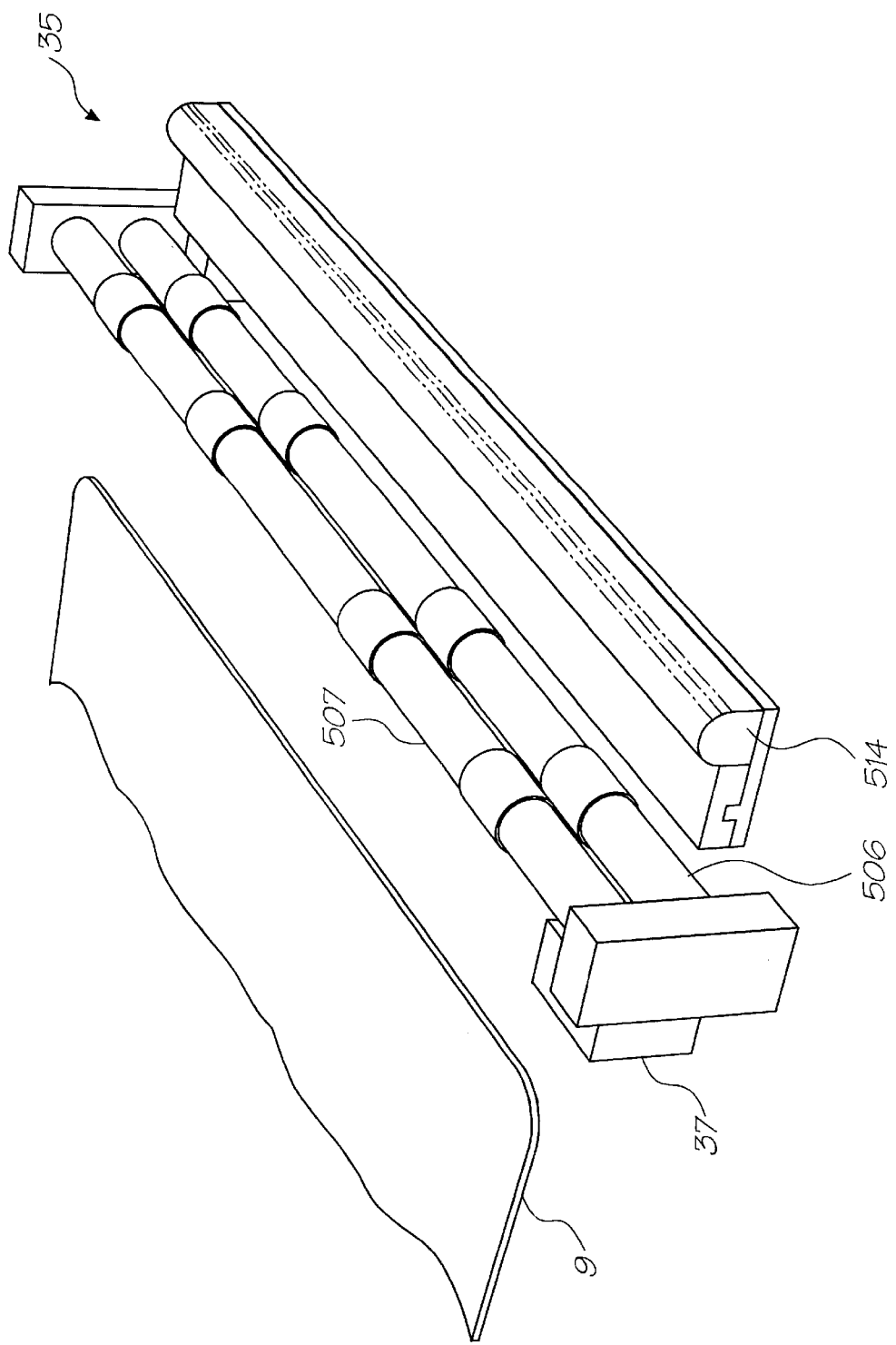
Figure 160:
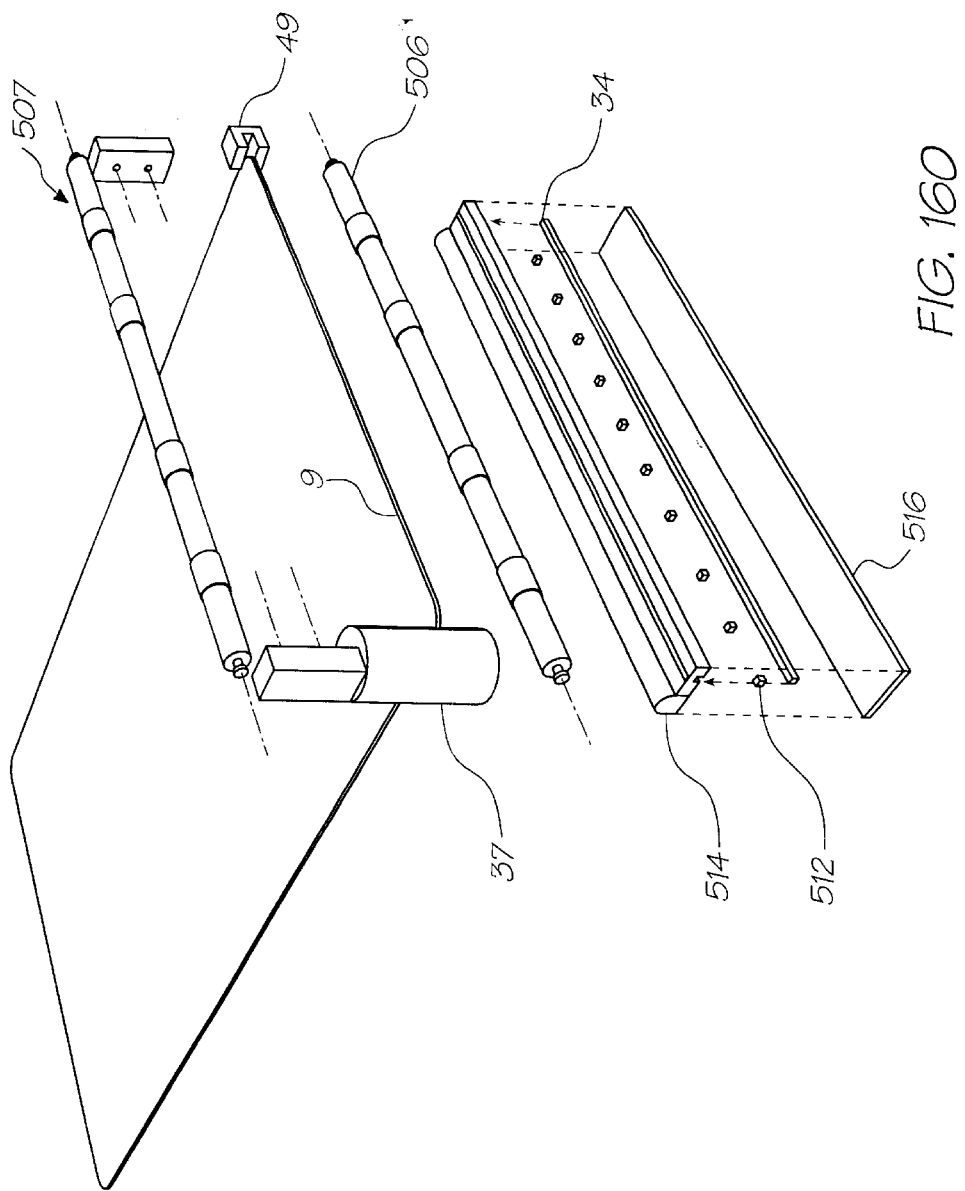
Figure 161:
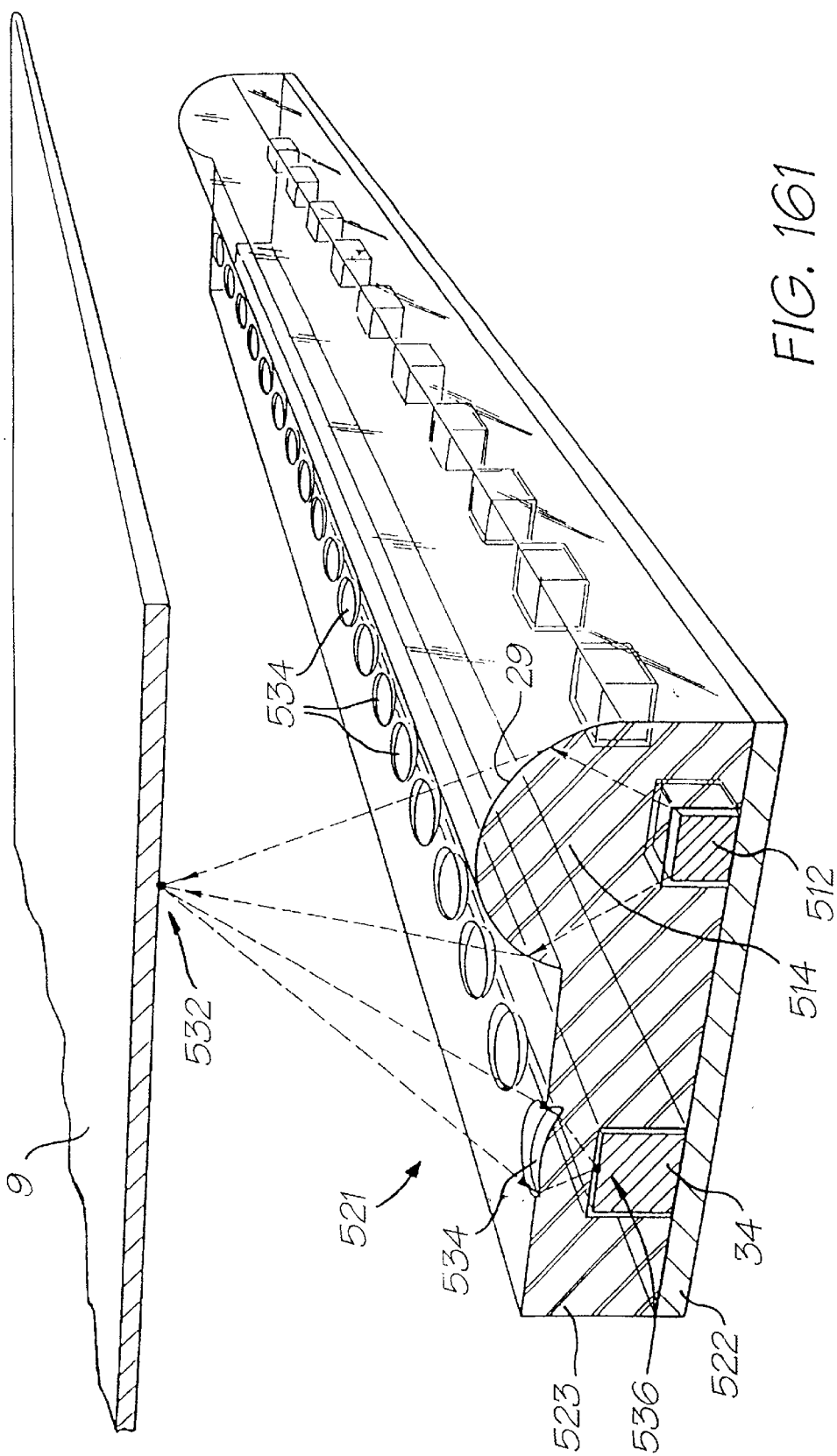
Figure 162:
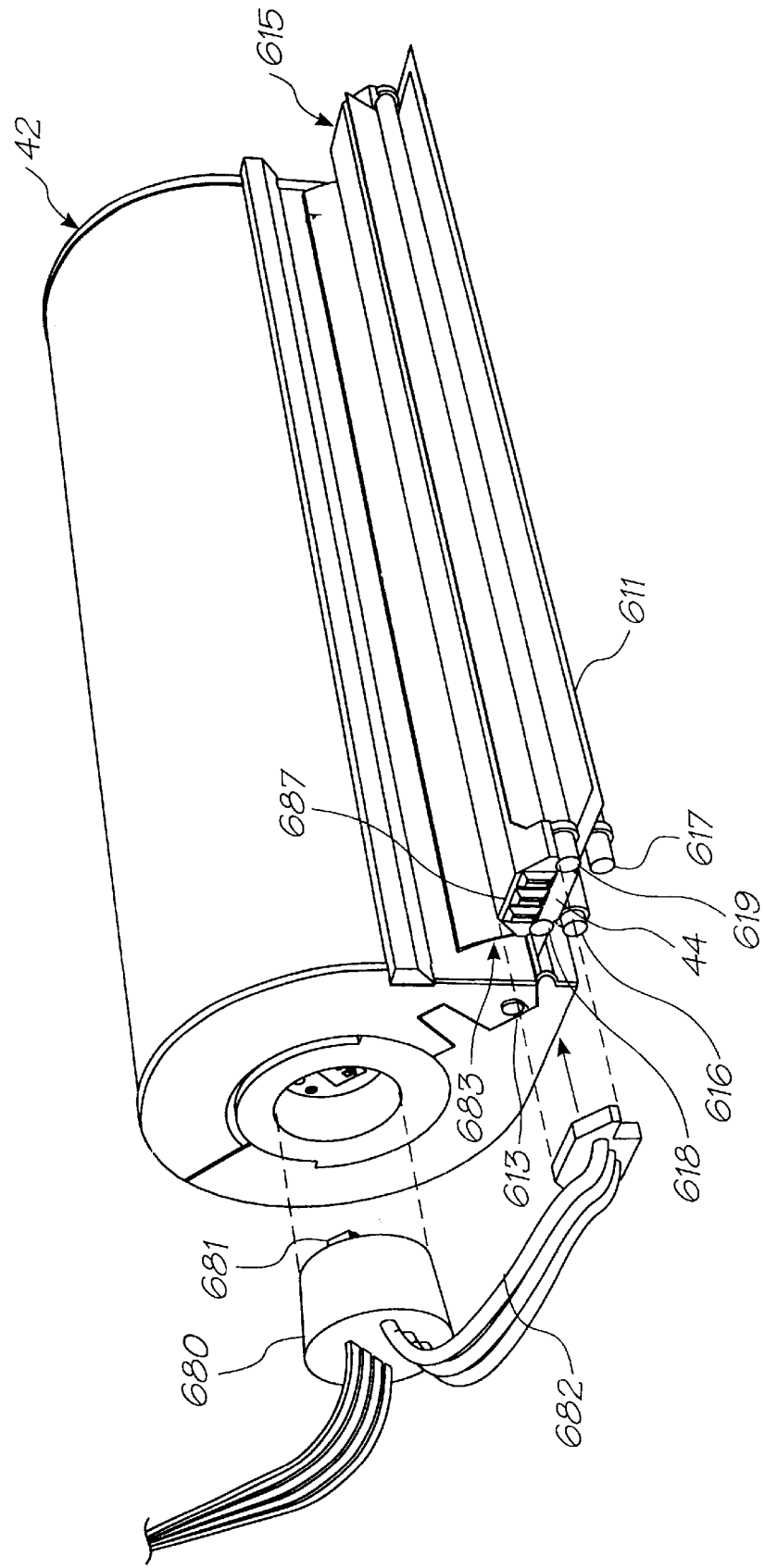
Figure 163:
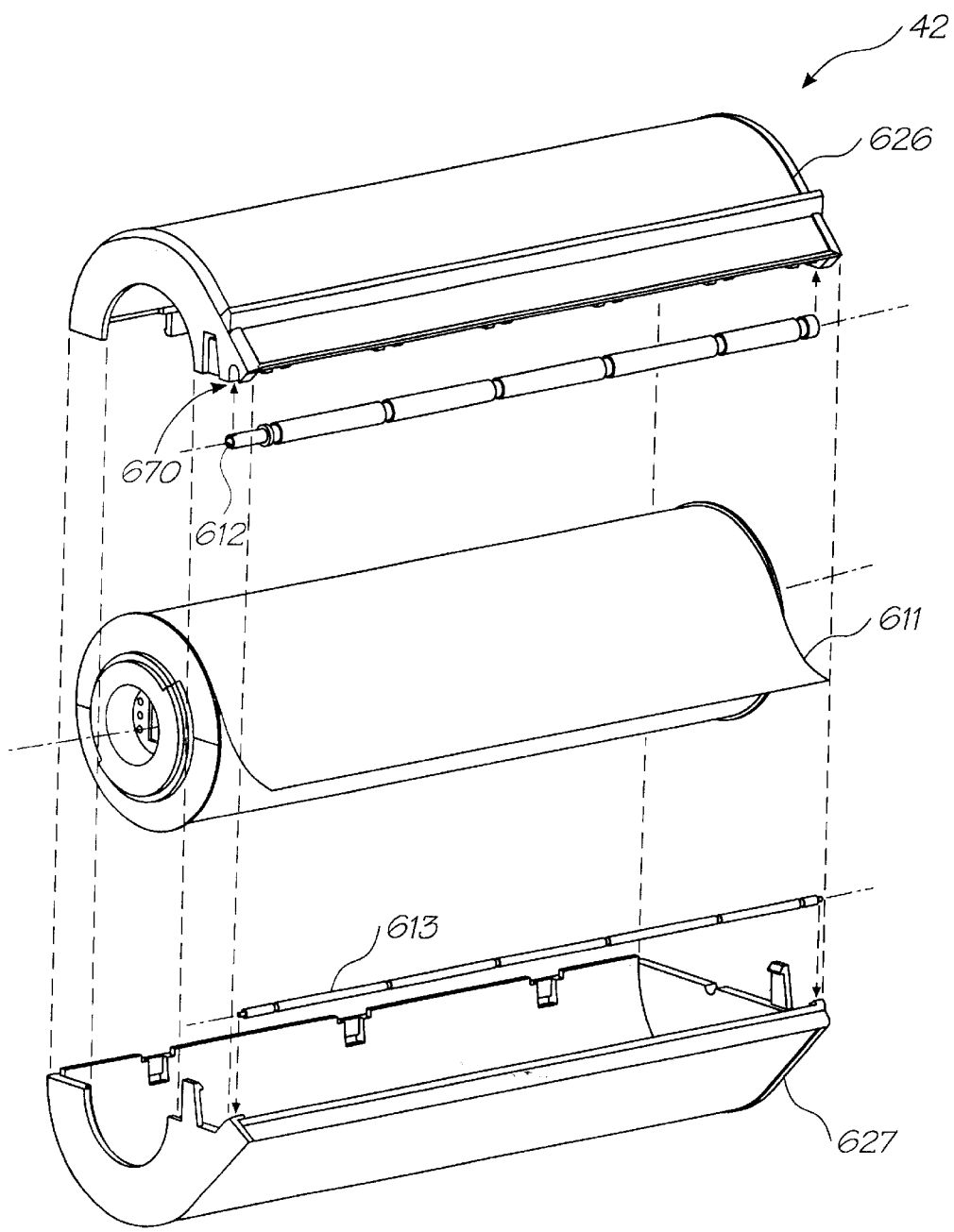
Figure 164:
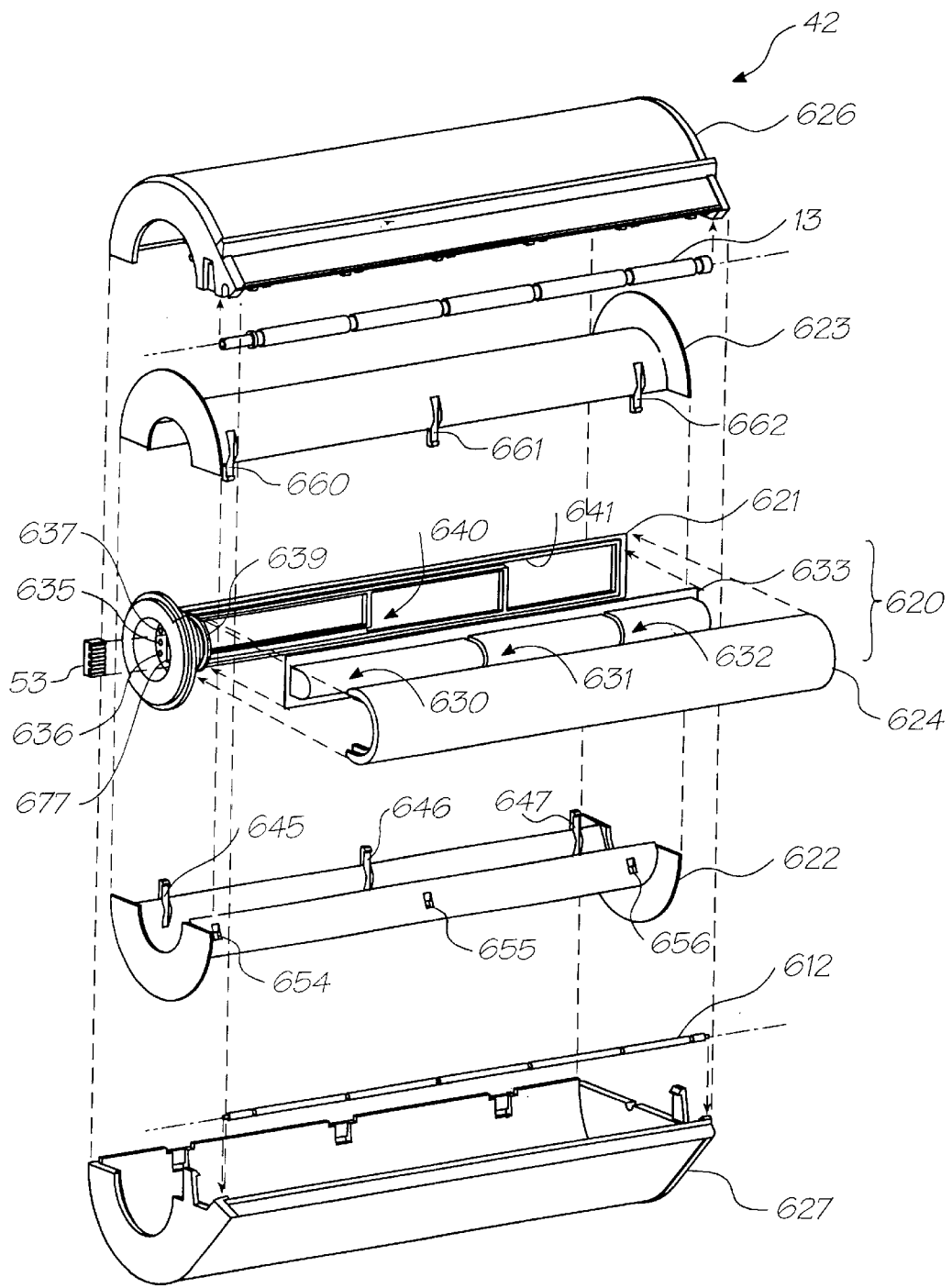
Figure 165:
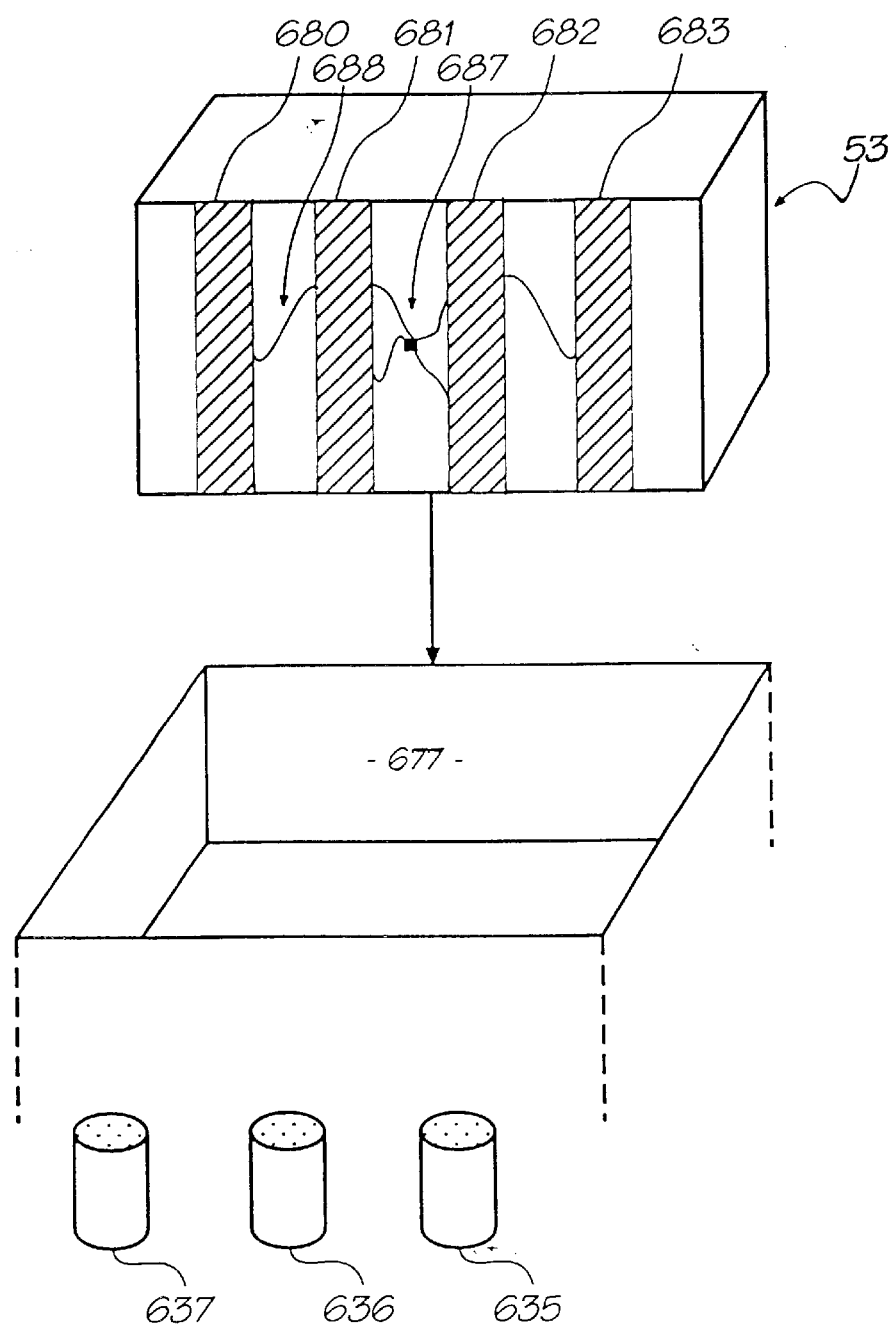
Figure 166:
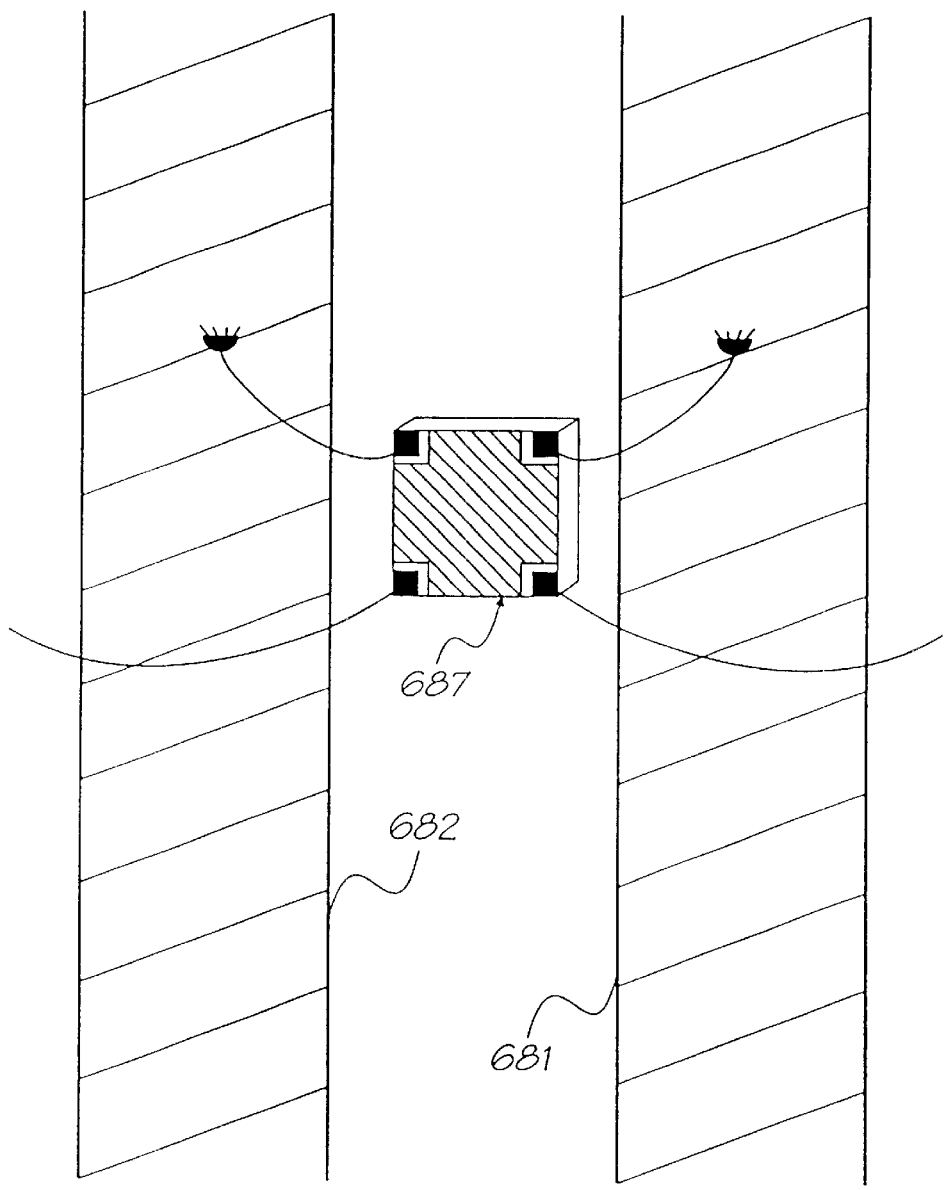
Figure 167:
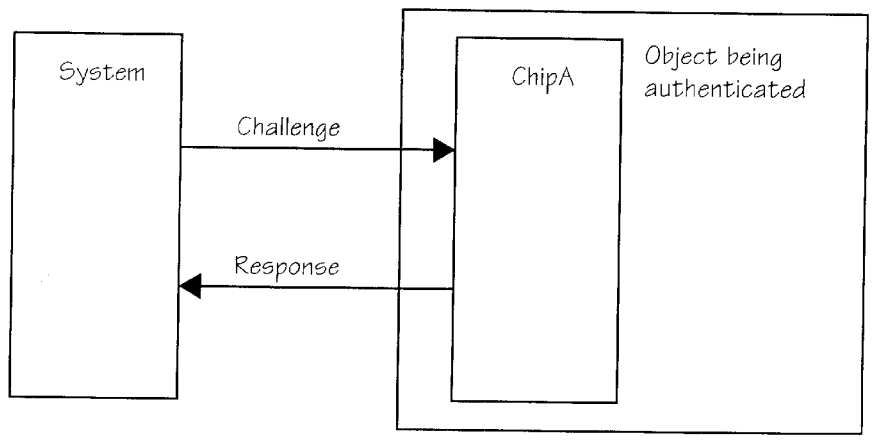
Figure 168:
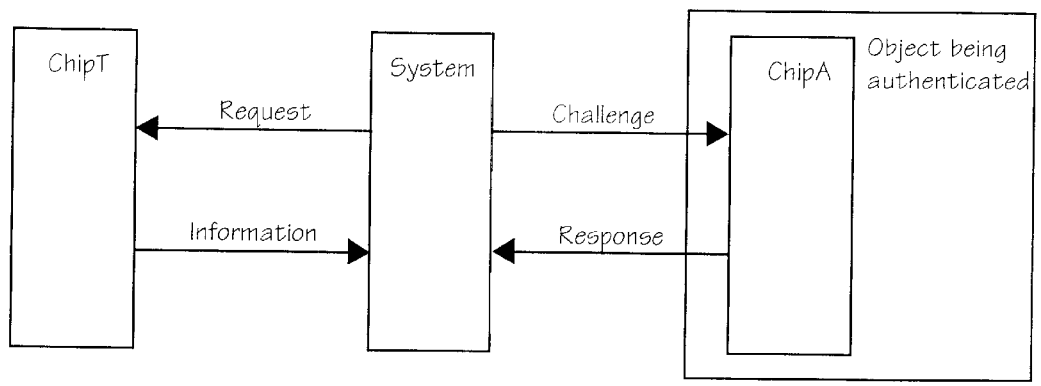
Figure 169:
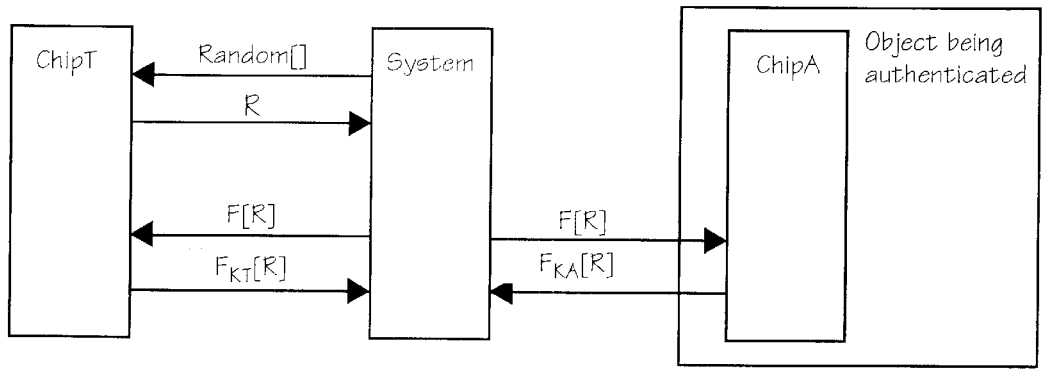
Figure 170:
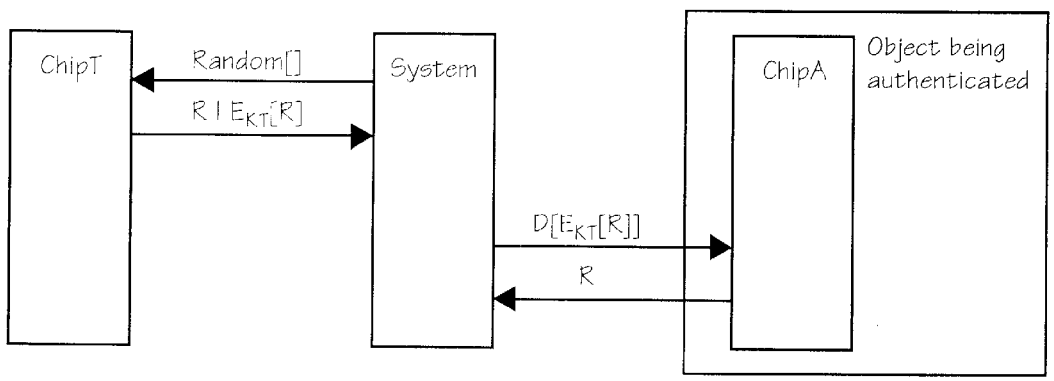
Figure 171:
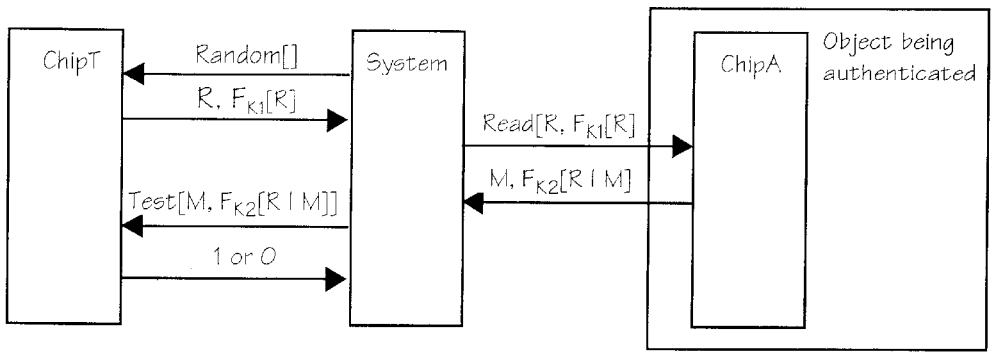
Figure 172:
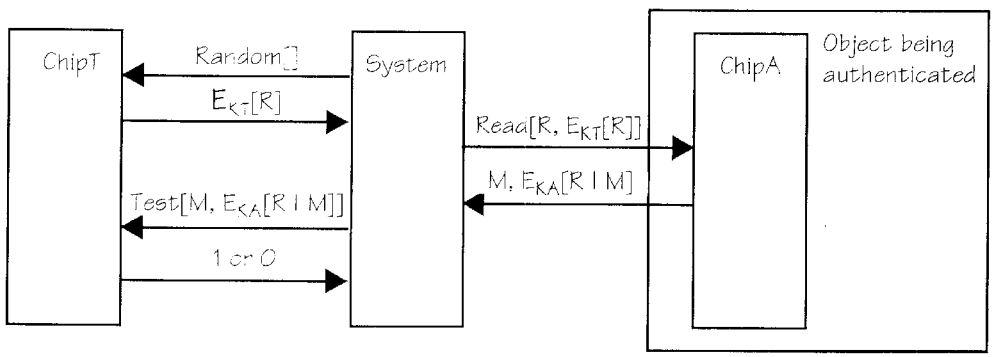
Figure 173:
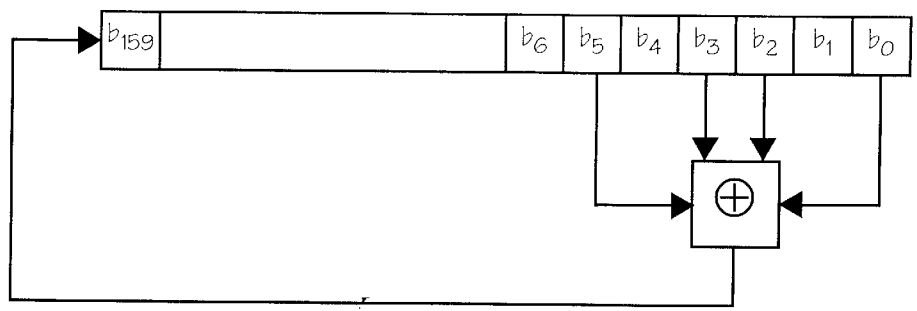
Figure 174:
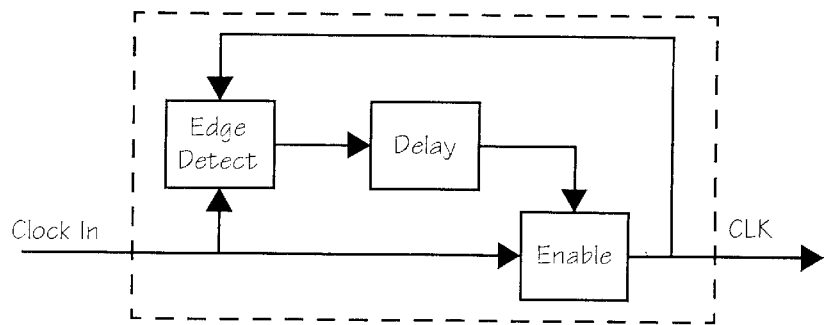
Figure 175:
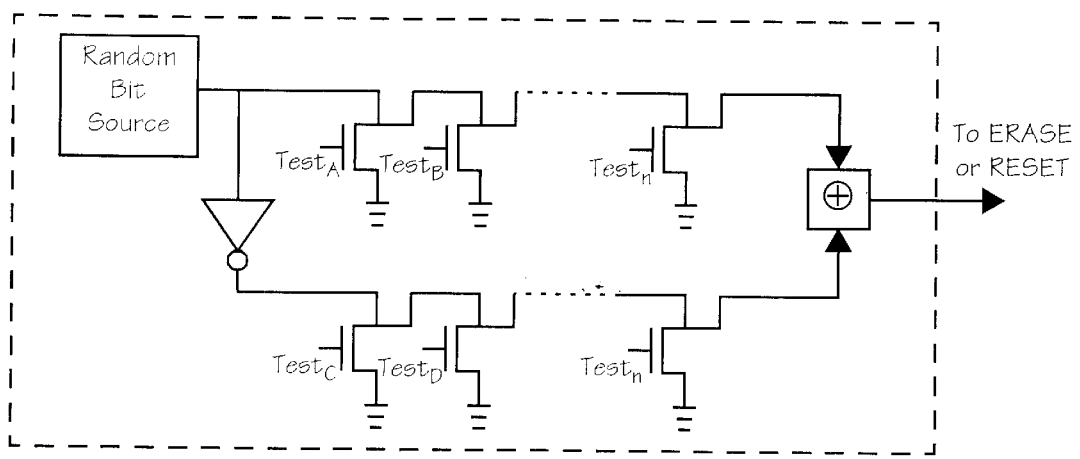
Figure 176:
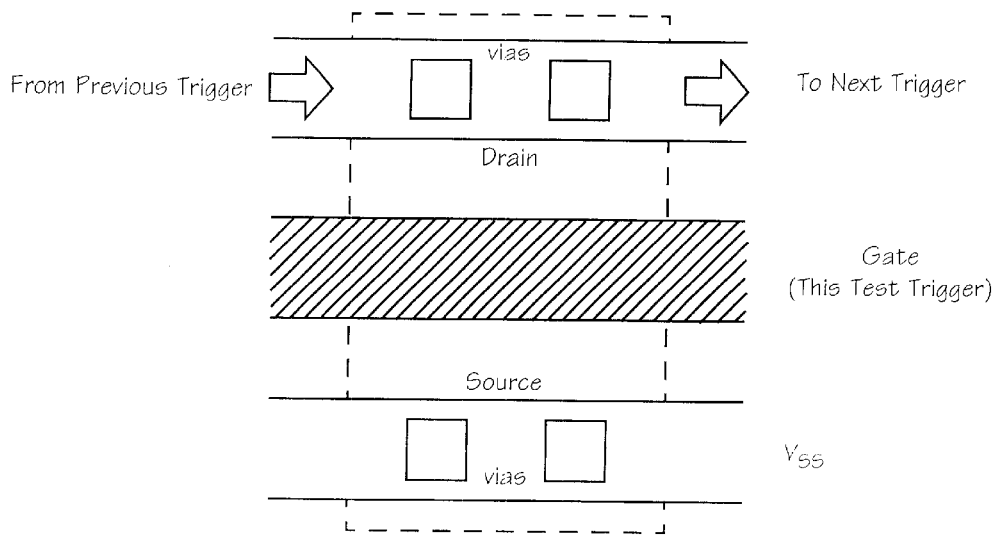
Figure 177:
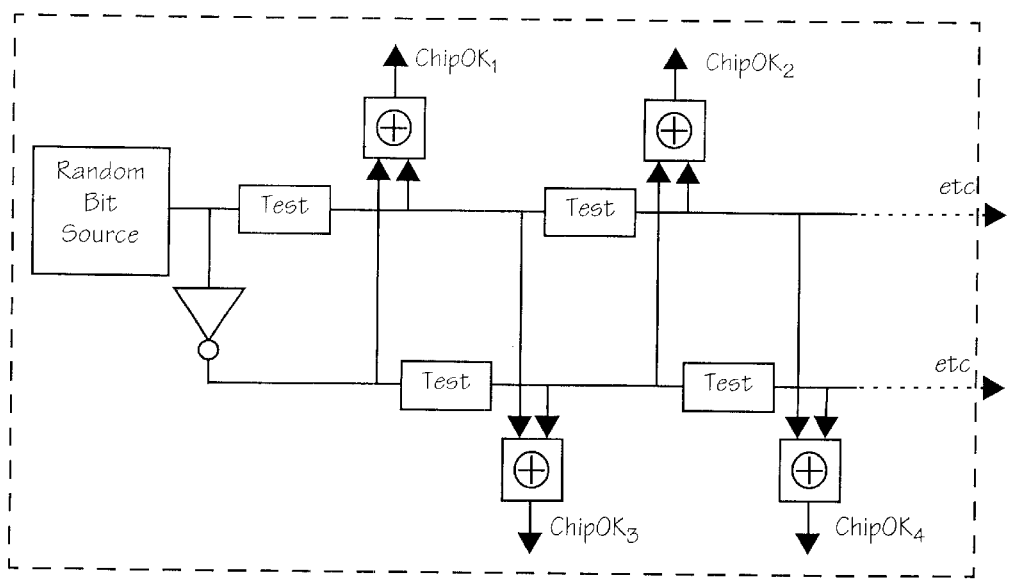

FIG. 131 illustrates an actual implementation of attenuation calculation;

FIG. 132 illustrates an graph of the cone factor;

FIG. 133 illustrates the process of penumbra calculation;

FIG. 134 illustrates the angles utilised in penumbra calculation;

FIG. 135 illustrates the inputs and outputs to penumbra calculation;

FIG. 136 illustrates an actual implementation of penumbra calculation;

FIG. 137 illustrates the inputs and outputs to ambient calculation;

FIG. 138 illustrates an actual implementation of ambient calculation;

FIG. 139 illustrates an actual implementation of diffuse calculation;

FIG. 140 illustrates the inputs and outputs to a diffuse calculation;

FIG. 141 illustrates an actual implementation of a diffuse calculation;

FIG. 142 illustrates the inputs and outputs to a specular calculation;

FIG. 143 illustrates an actual implementation of a specular calculation;

FIG. 144 illustrates the inputs and outputs to a specular calculation;

FIG. 145 illustrates an actual implementation of a specular calculation;

FIG. 146 illustrates an actual implementation of a ambient only calculation;

FIG. 147 illustrates the process overview of light calculation;

FIG. 148 illustrates an example illumination calculation for a single infinite light source;

FIG. 149 illustrates an example illumination calculation for a Omni light source without a bump map;

FIG. 150 illustrates an example illumination calculation for a Omni light source with a bump map;

FIG. 151 illustrates an example illumination calculation for a Spotlight light source without a bump map;

FIG. 152 illustrates the process of applying a single Spotlight onto an image with an associated bump-map;

FIG. 153 illustrates the logical layout of a single printhead;

FIG. 154 illustrates the structure of the printhead interface;

FIG. 155 illustrates the process of rotation of a Lab image;

FIG. 156 illustrates the format of a pixel of the printed image;

FIG. 157 illustrates the dithering process;

FIG. 158 illustrates the process of generating an 8 bit dot output;

FIG. 159 illustrates a perspective view of the card reader;

FIG. 160 illustrates an exploded perspective of a card reader;

FIG. 161 illustrates a close up view of the Artcard reader;

FIG. 162 illustrates a perspective view of the print roll and print head;

FIG. 163 illustrates a first exploded perspective view of the print roll;

FIG. 164 illustrates a second exploded perspective view of the print roll;

FIG. 165 illustrates the print roll authentication chip;

FIG. 166 illustrates an enlarged view of the print roll authentication chip;

FIG. 167 illustrates a single authentication chip data protocol;

FIG. 168 illustrates a dual authentication chip data protocol;

FIG. 169 illustrates a first presence only protocol;

FIG. 170 illustrates a second presence only protocol;

FIG. 171 illustrates a third data protocol;

FIG. 172 illustrates a fourth data protocol;

FIG. 173 is a schematic block diagram of a maximal period LFSR;

FIG. 174 is a schematic block diagram of a clock limiting filter;

FIG. 175 is a schematic block: diagram of the tamper detection lines;

FIG. 176 illustrates an oversized nMOS transistor;

FIG. 177 illustrates the taking of multiple XORs from the Tamper Detect Line

Figure 178:
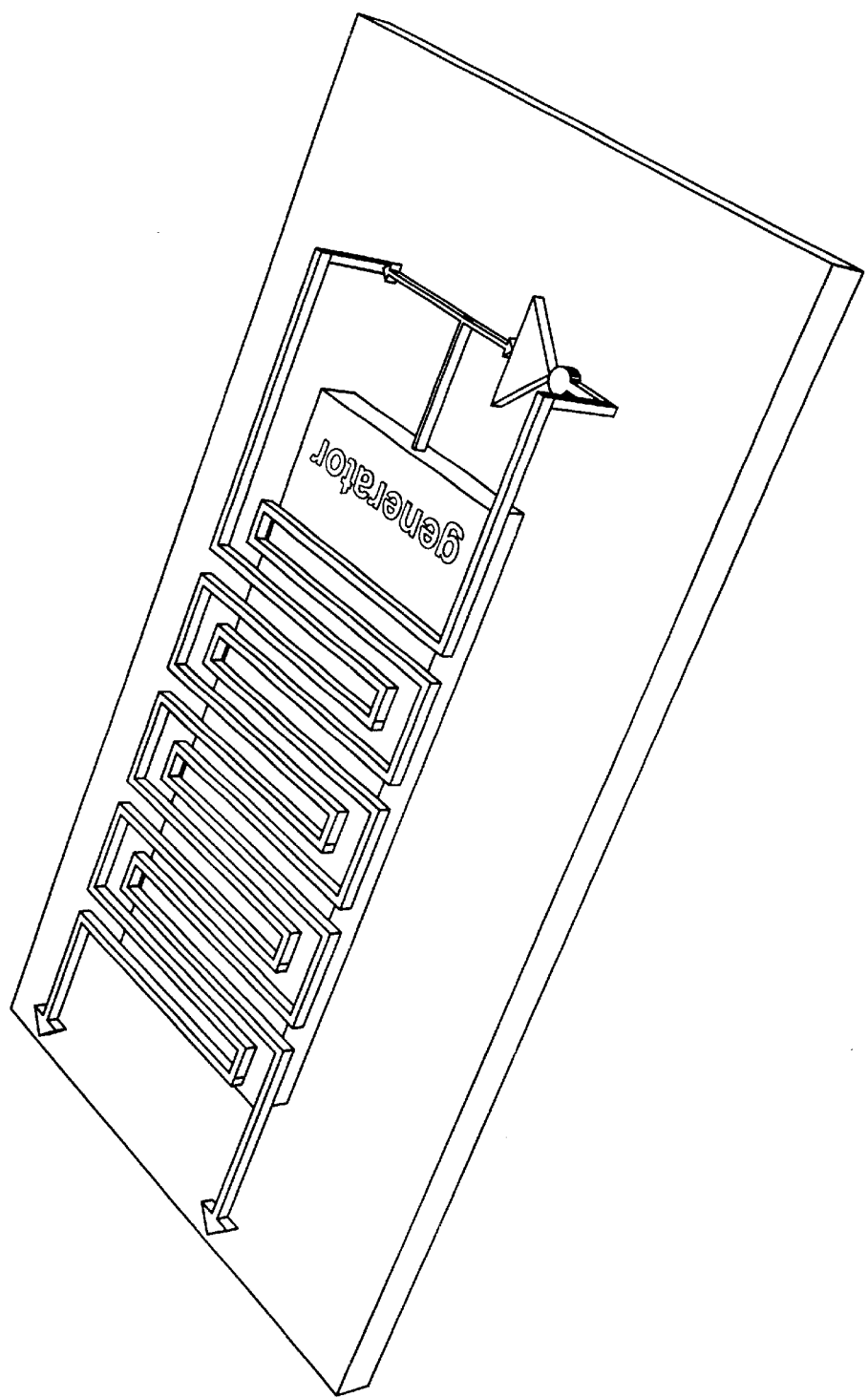
Figure 179:
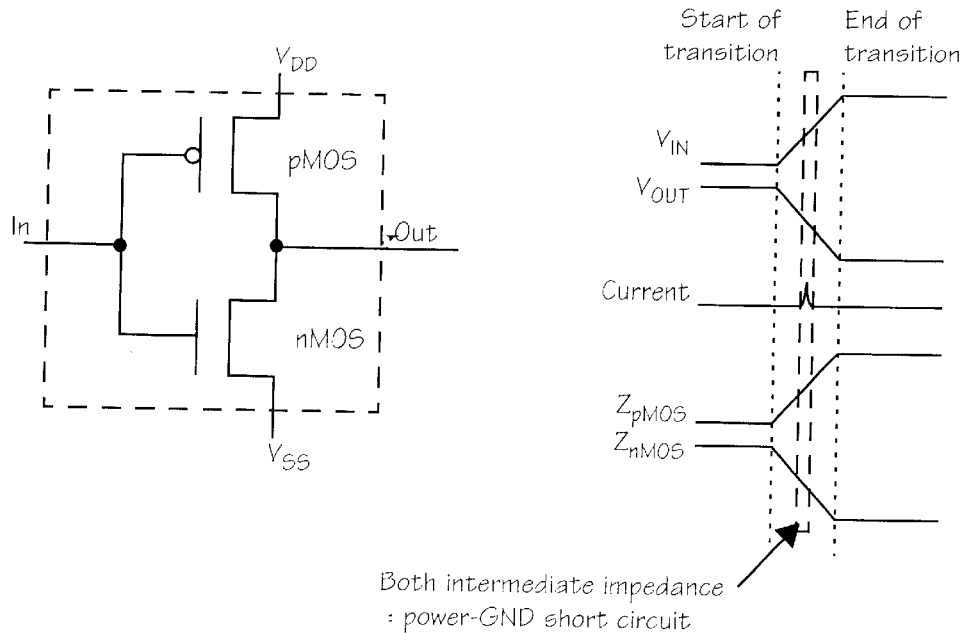
Figure 180:
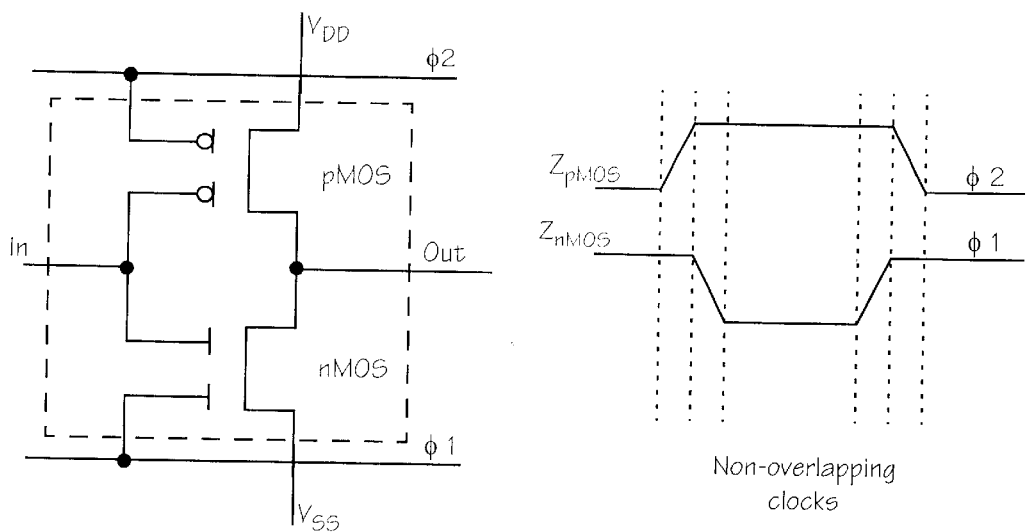
Figure 181:
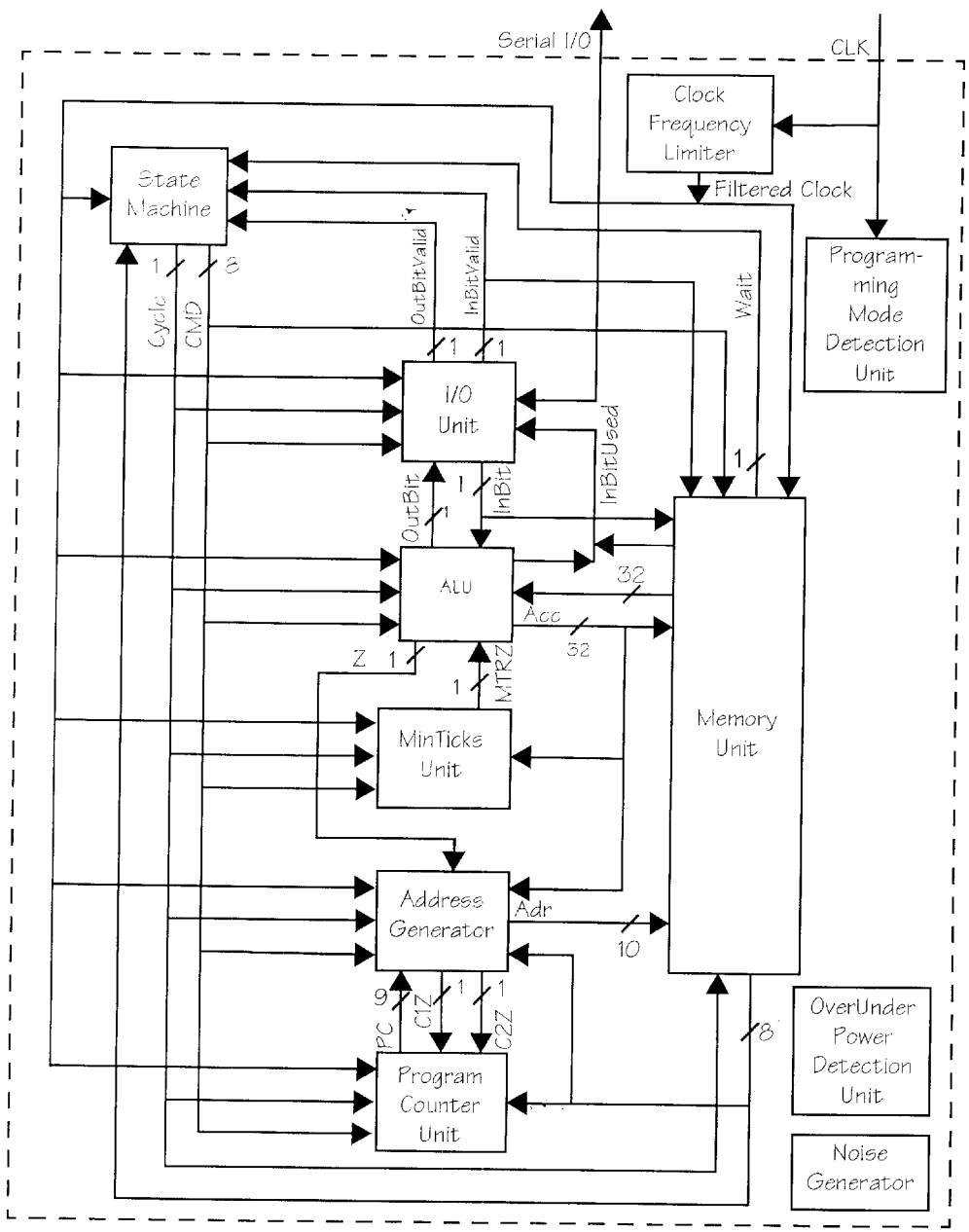
Figure 182:
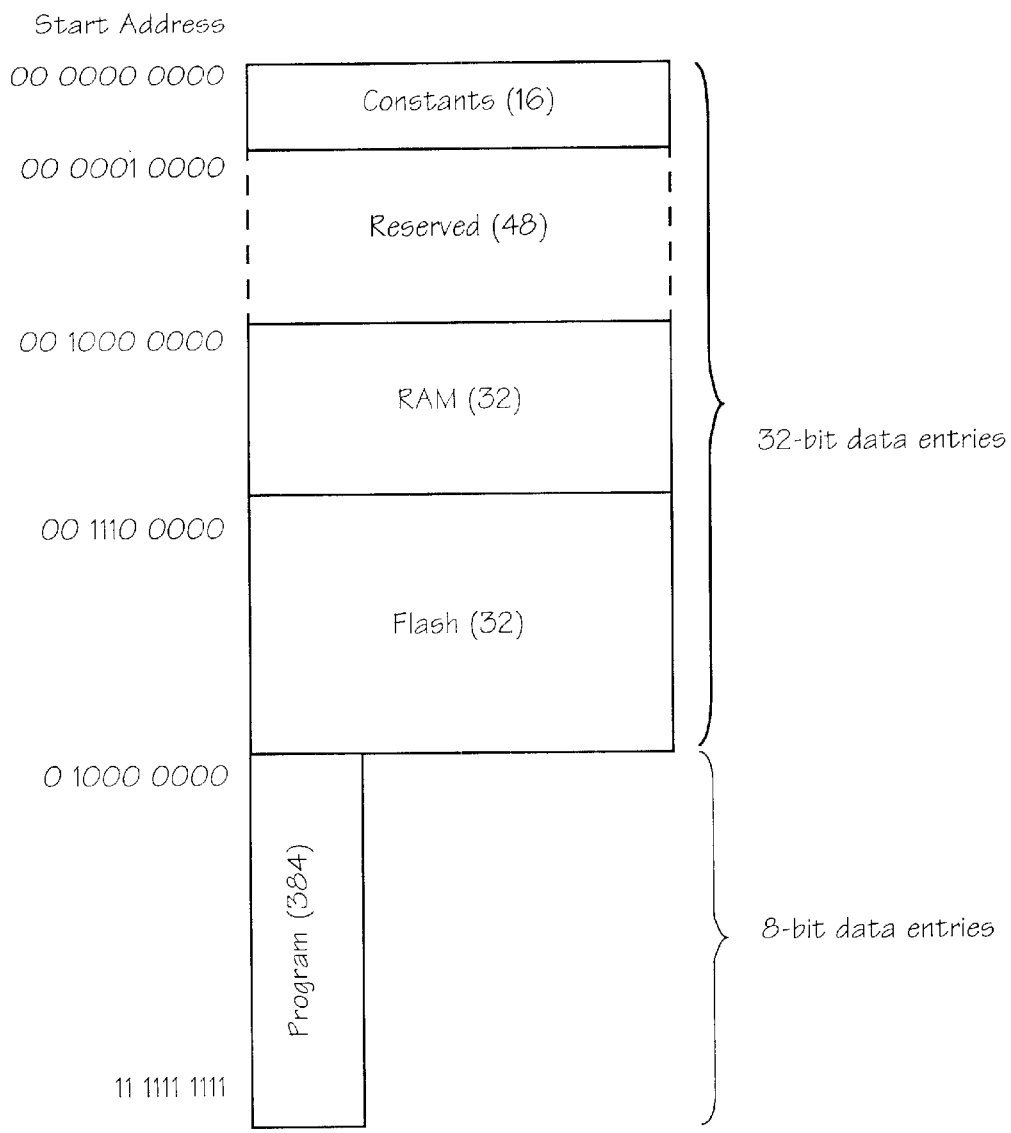
Figure 183:
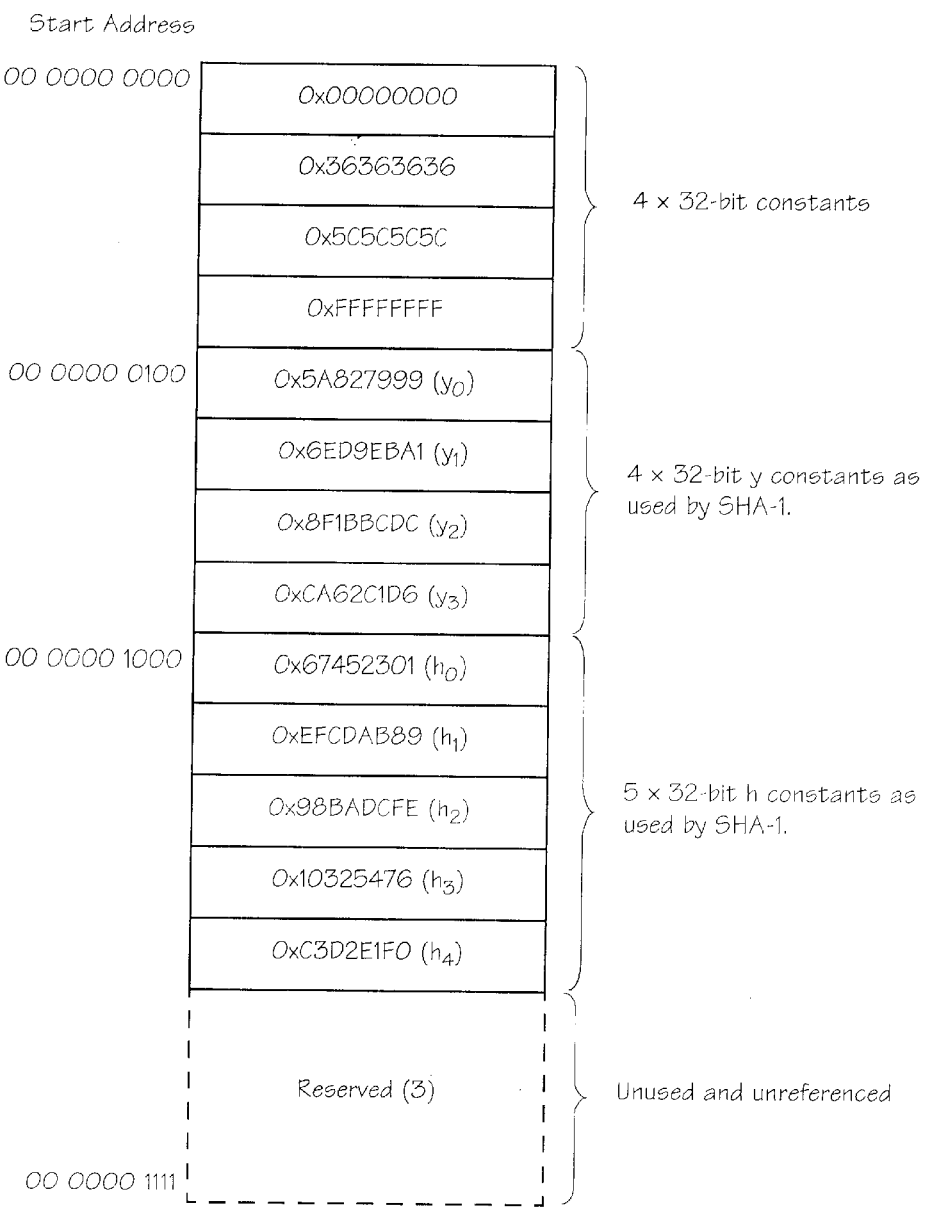
Figure 184:
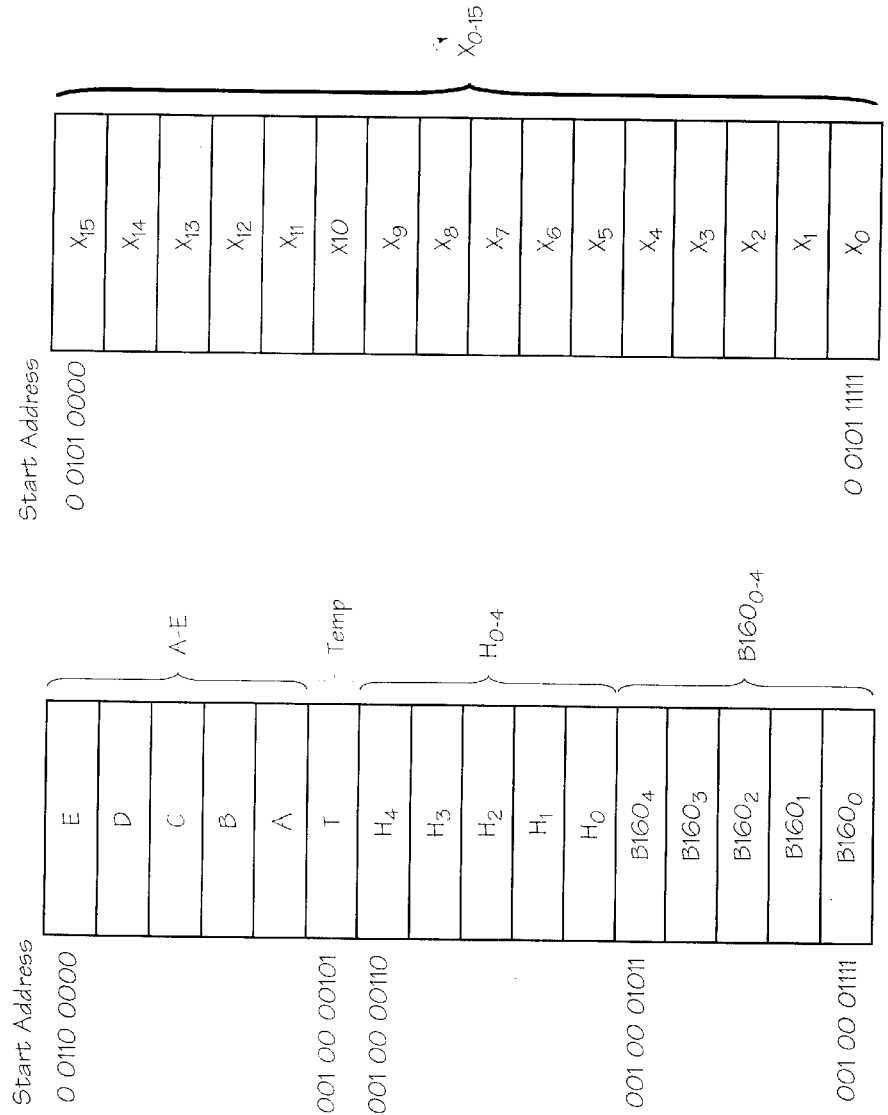
Figure 185:
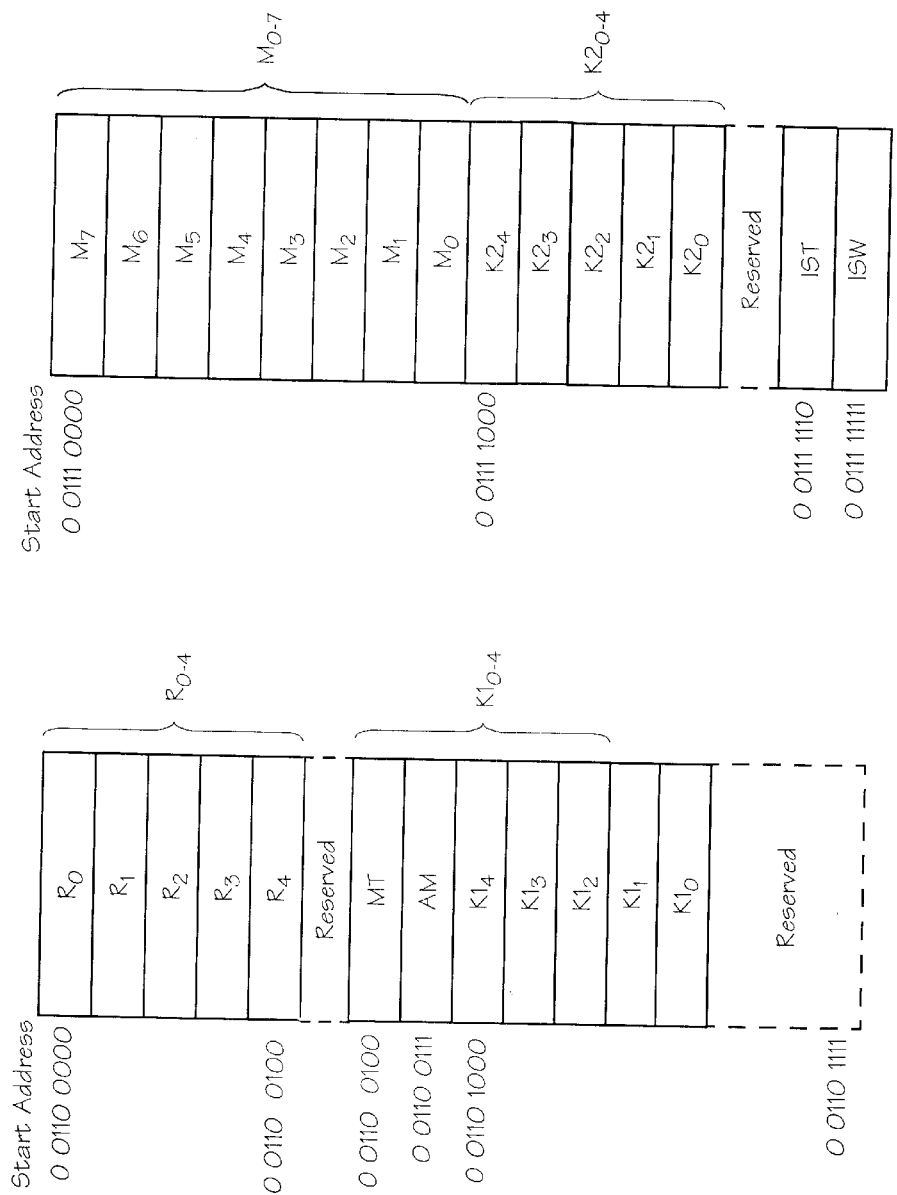
Figure 187:
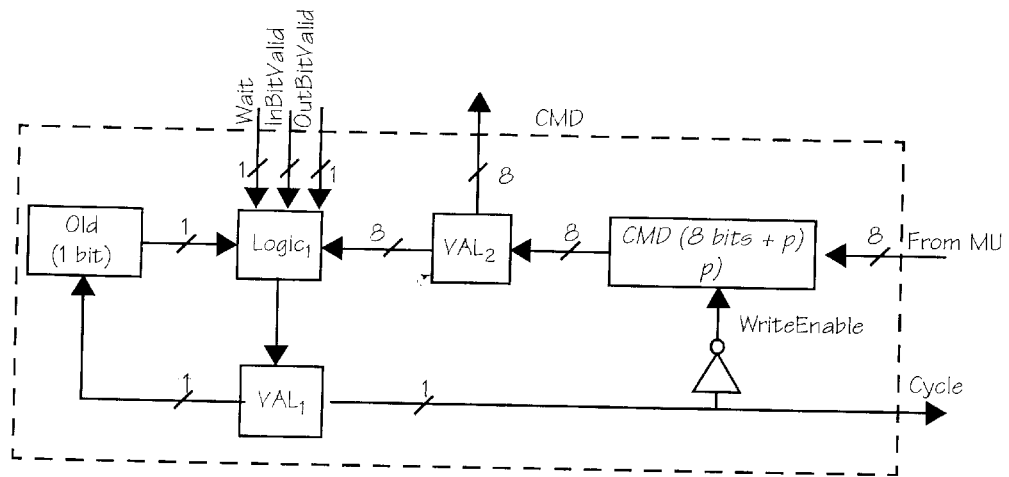
Figure 188:
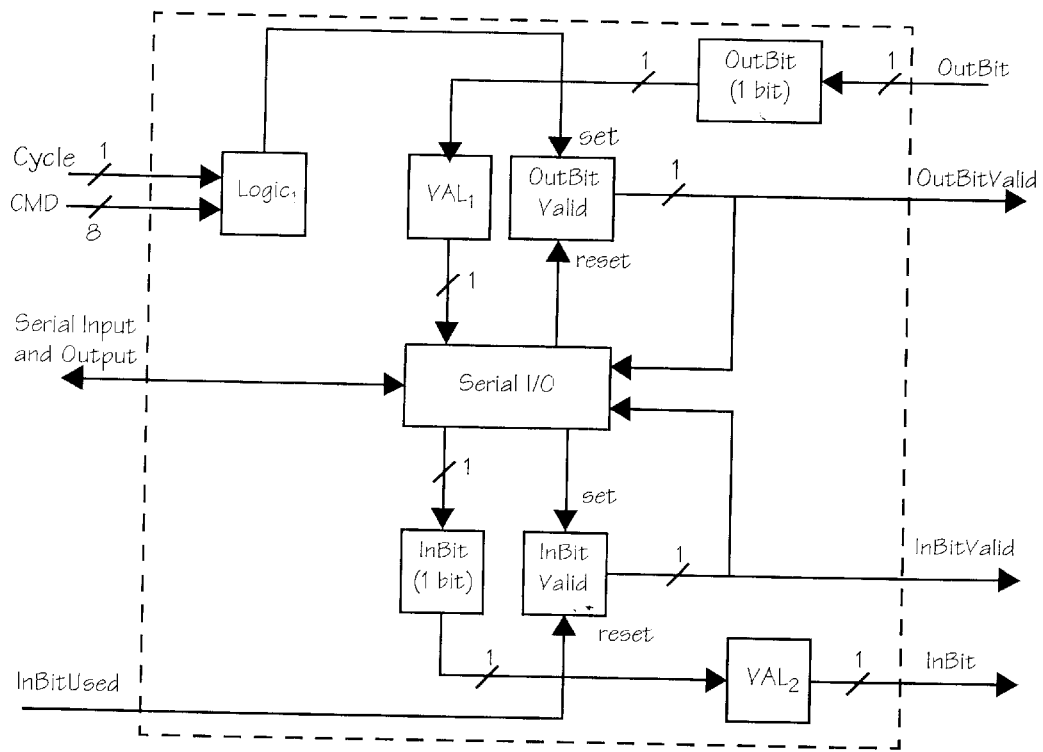

FIG. 178 illustrate how the Tamper Lines cover the noise generator circuitry;

FIG. 179 illustrates the normal form of FET implementation;

FIG. 180 illustrates the modified form of FET implementation of the preferred embodiment;

FIG. 181 illustrates a schematic block diagram of the authentication chip;

FIG. 182 illustrates an example memory map;

FIG. 183 illustrates an example of the constants memory map;

FIG. 184 illustrates an example of the RAM memory map;

FIG. 185 illustrates an example of the Flash memory variables memory map;

FIG. 186 illustrates an example of the Flash memory program memory map;

FIG. 187 shows the data flow and relationship between components of the State Machine;

FIG. 188 shows the data flow and relationship between components of the I/O Unit.

Figure 189:
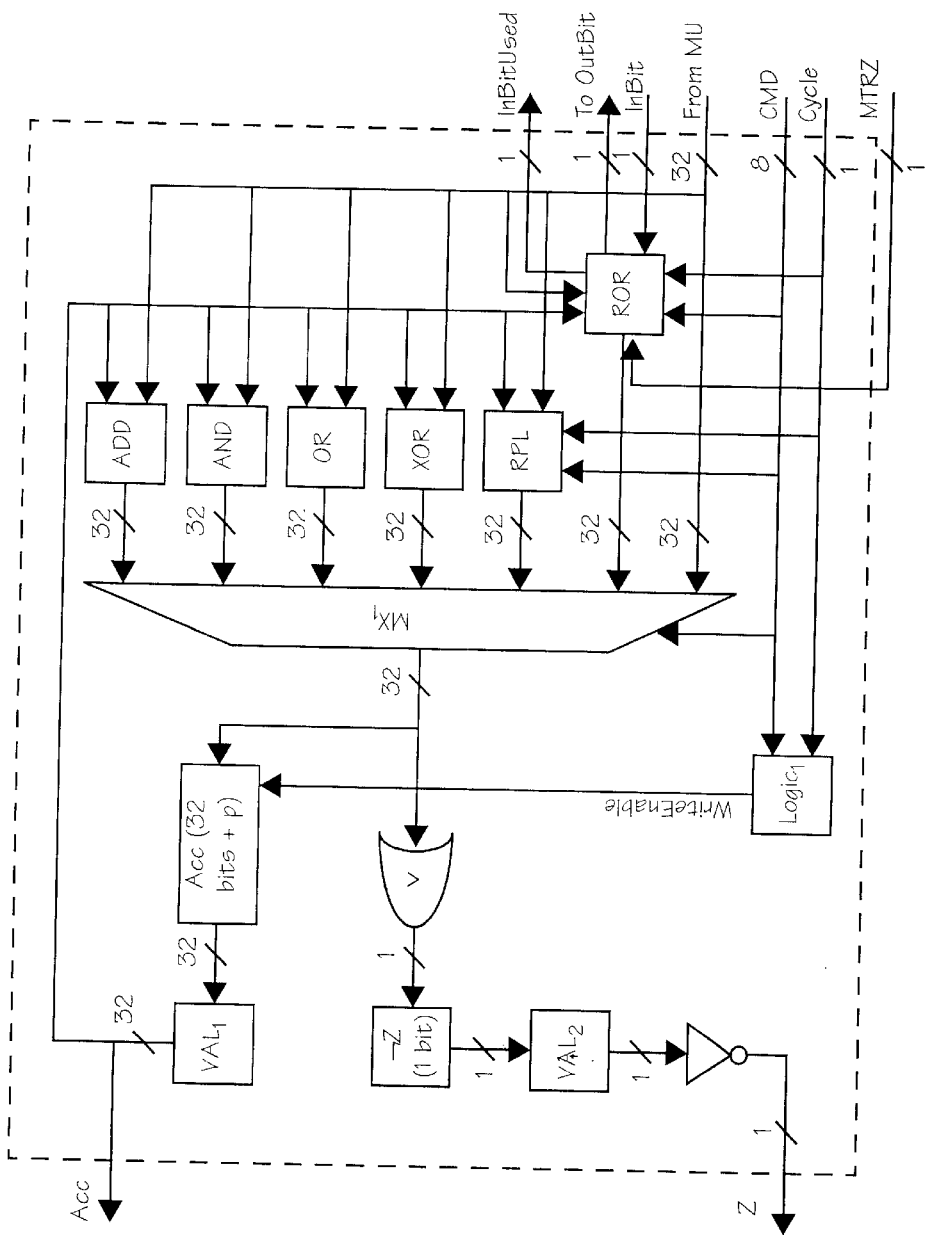
Figure 190:
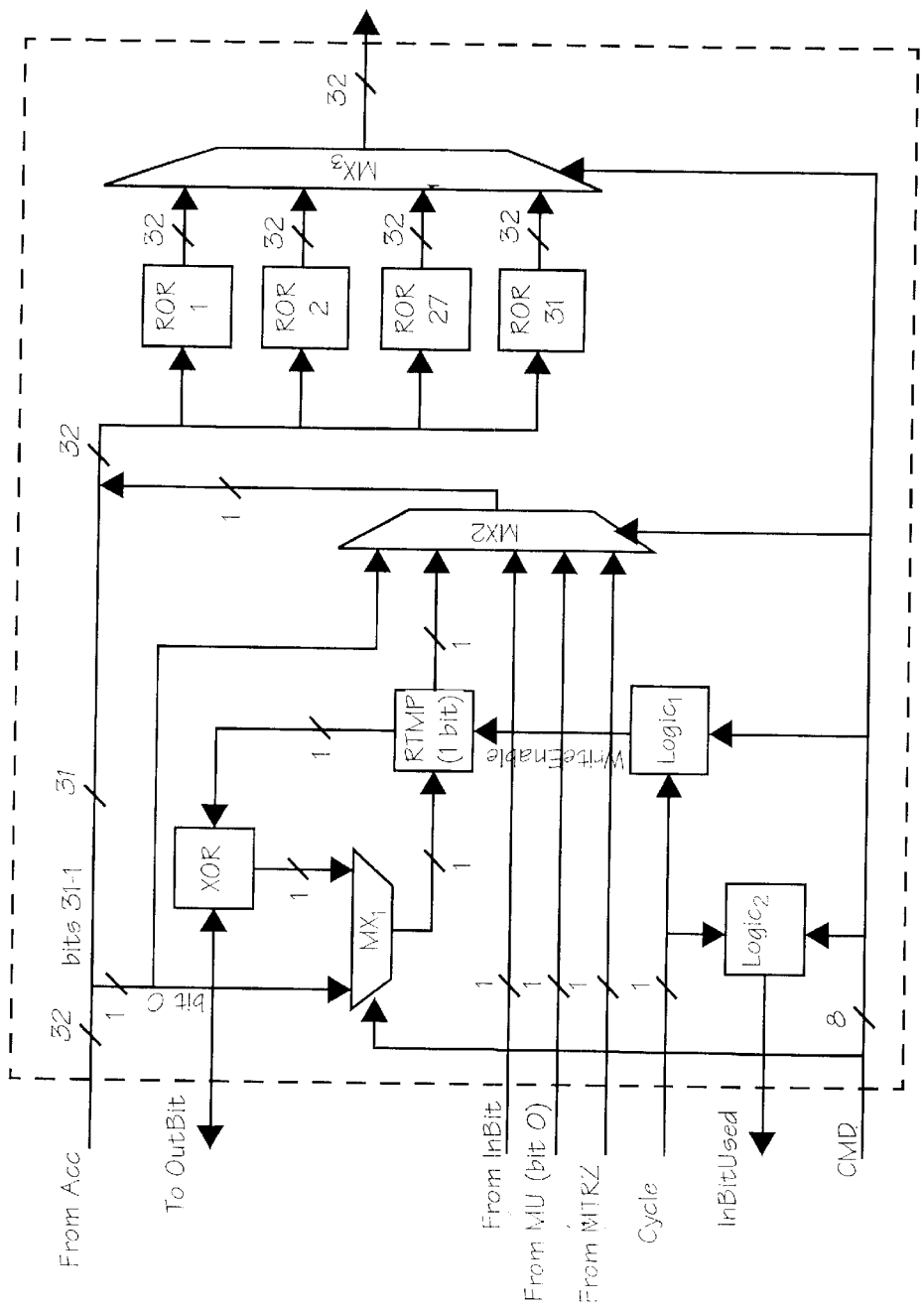
Figure 191:
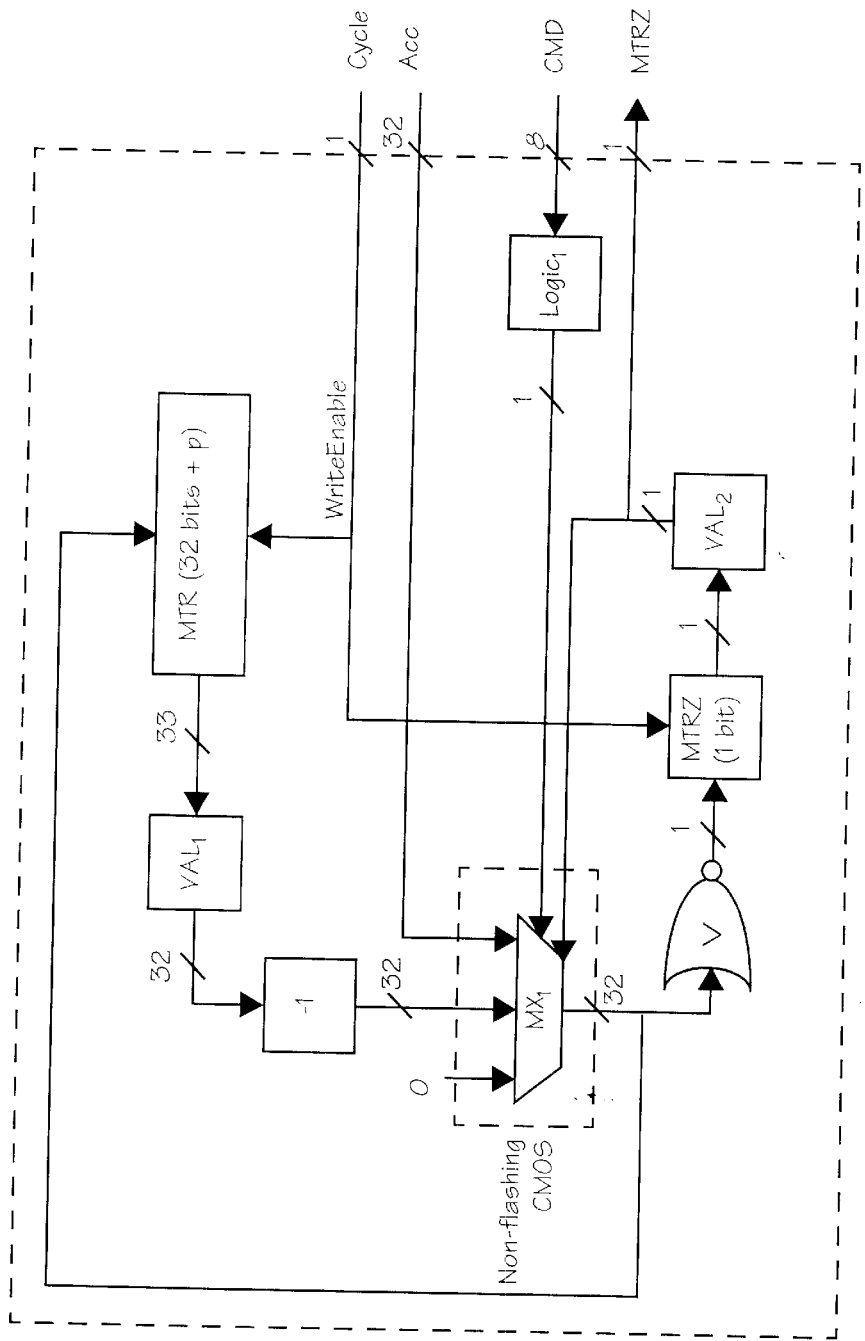
Figure 192:
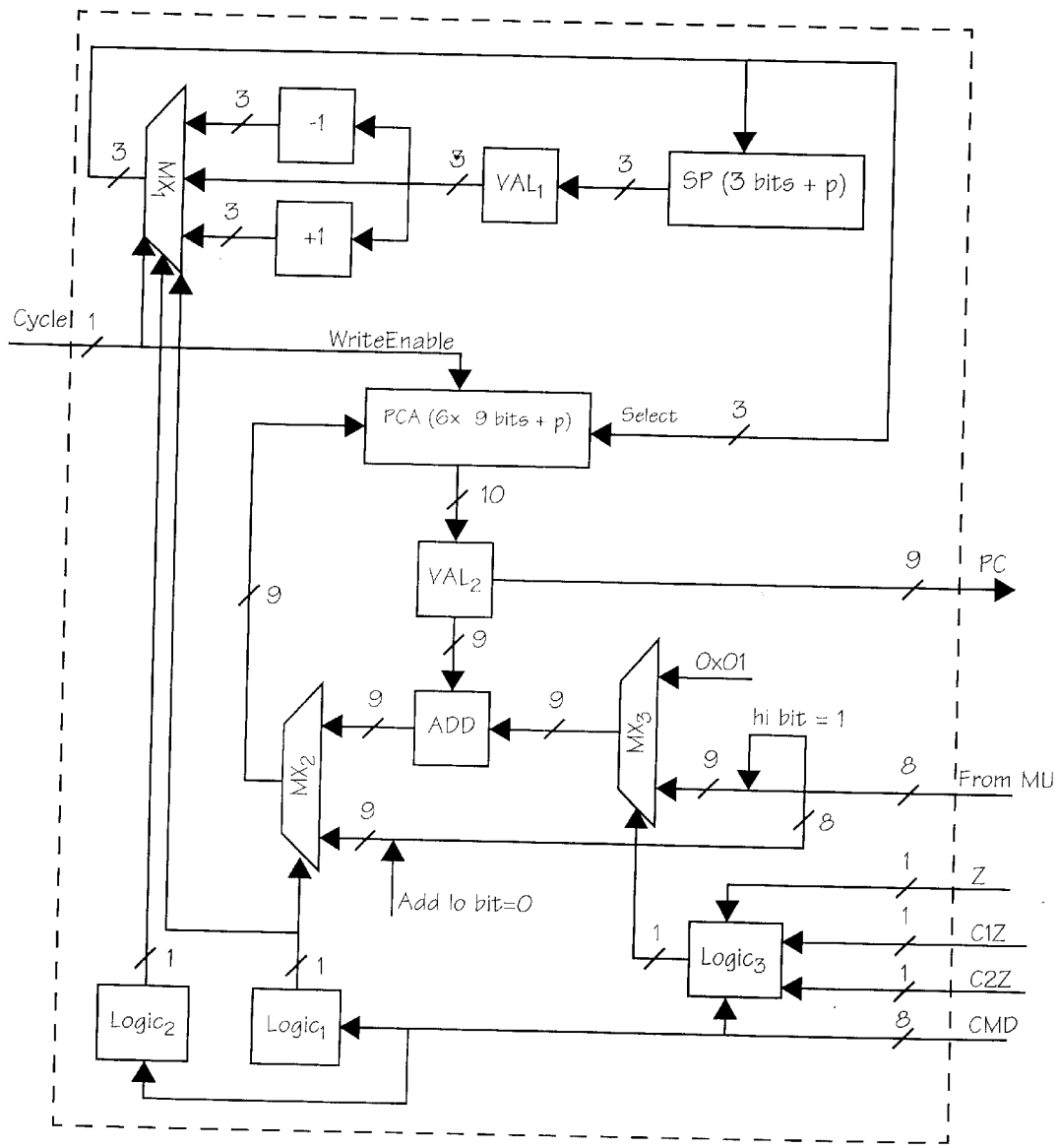
Figure 193:
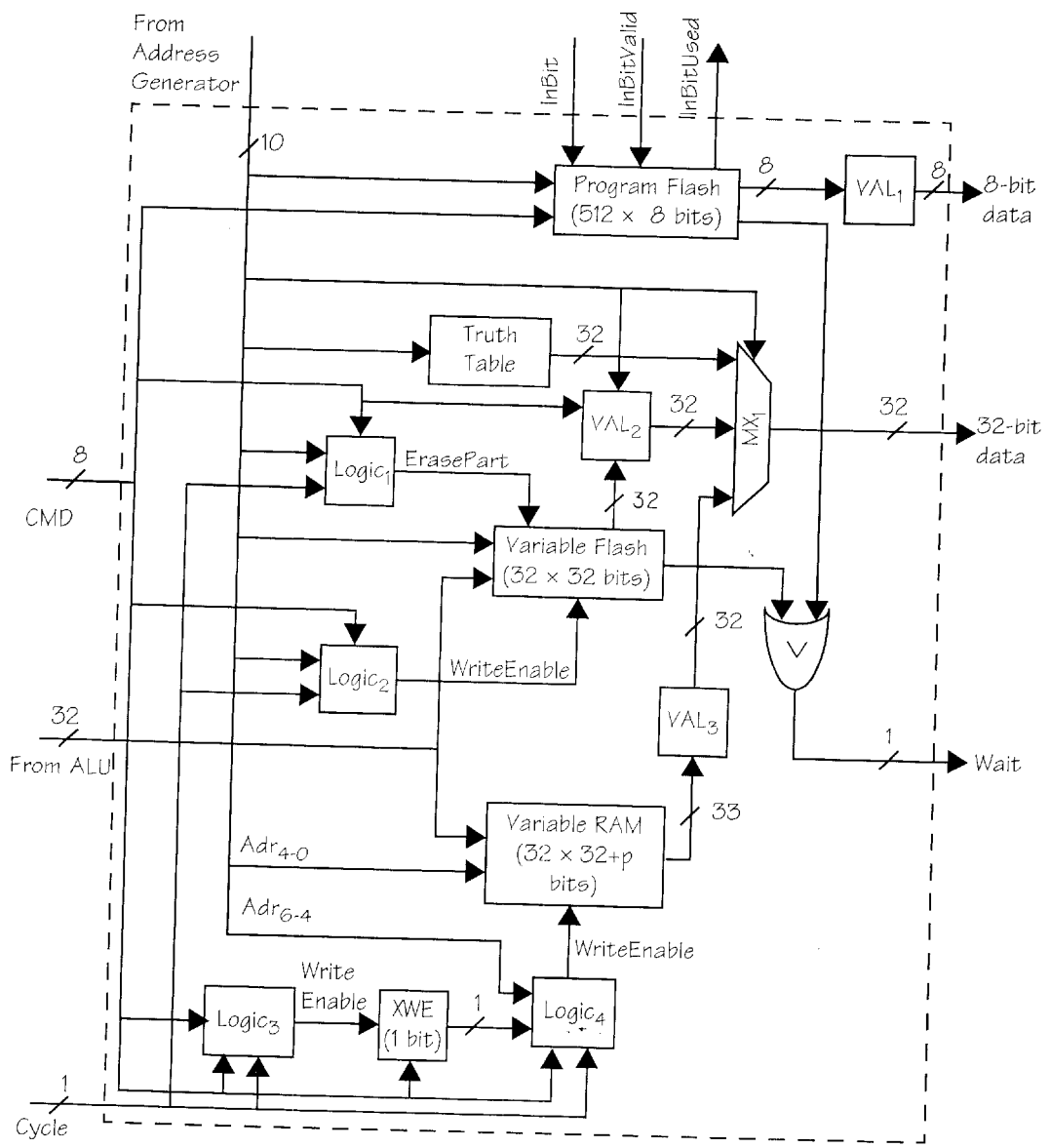
Figure 194:
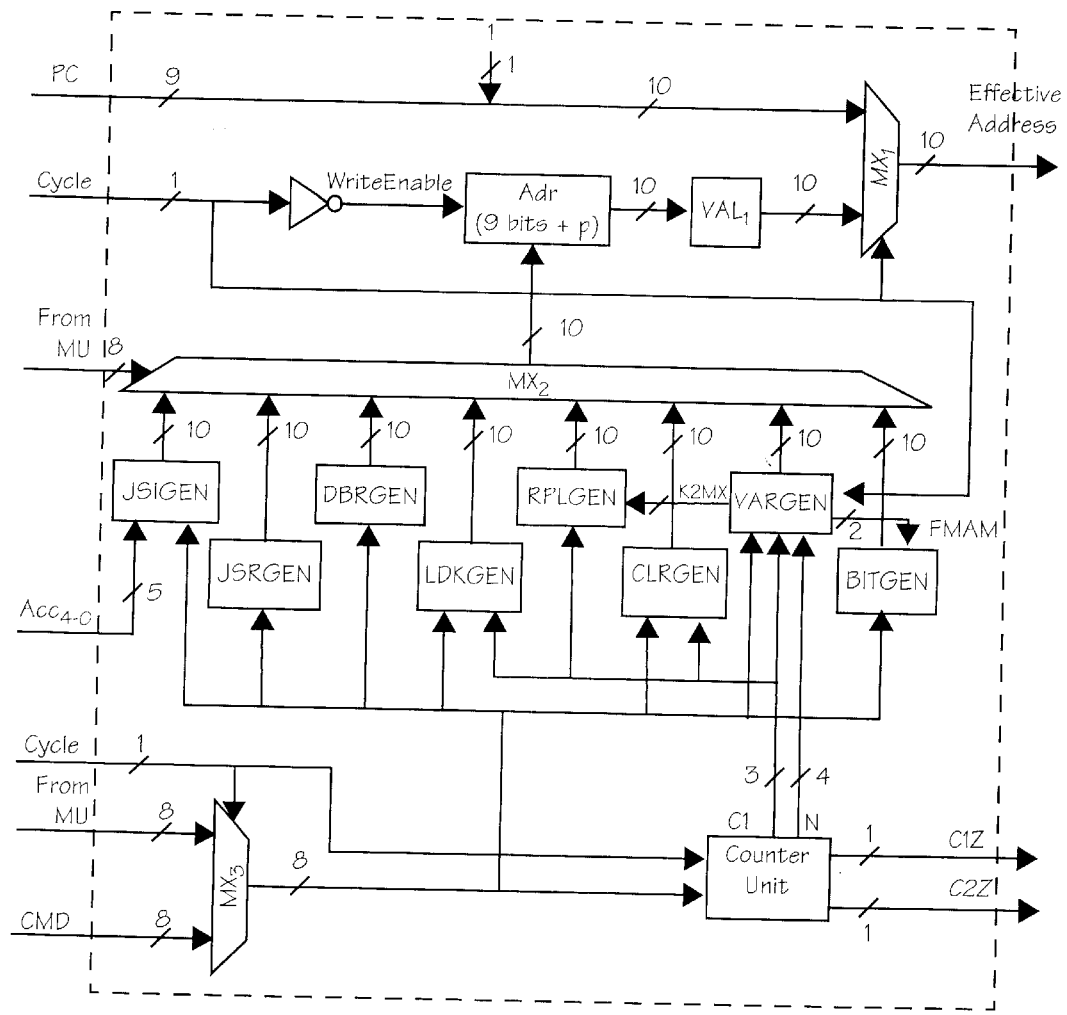
Figure 195:
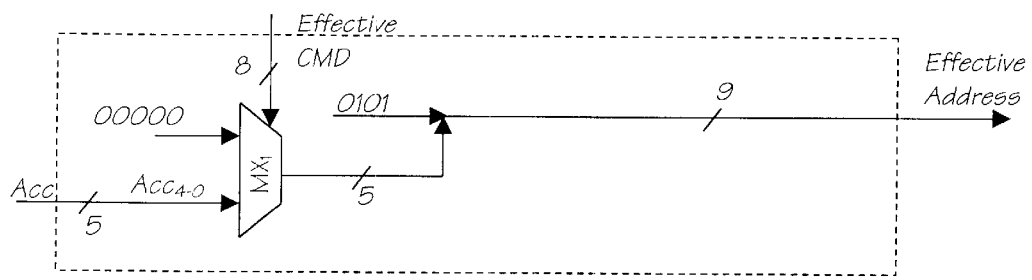
Figure 196:
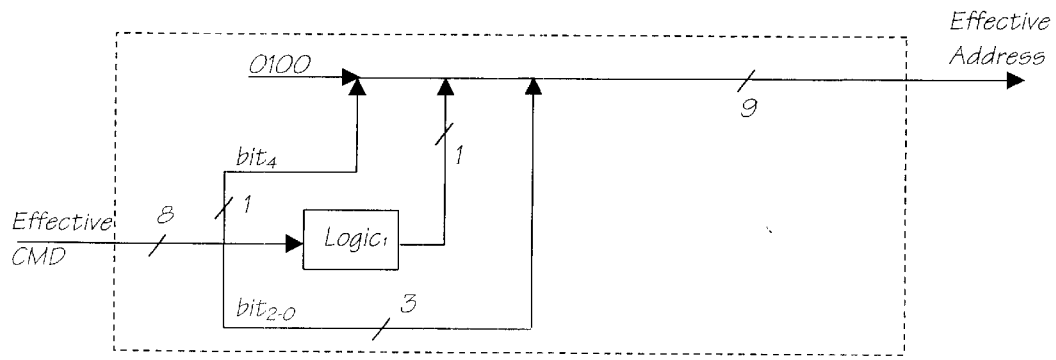

FIG. 189 illustrates a schematic block diagram of the Arithmetic Logic Unit;

FIG. 190 illustrates a schematic block diagram of the RPL unit;

FIG. 191 illustrates a schematic block diagram of the ROR block of the ALU;

FIG. 192 is a block diagram of the Program Counter Unit;

FIG. 193 is a block diagram of the Memory Unit;

FIG. 194 shows a schematic block diagram for the Address Generator Unit;

FIG. 195 shows a schematic block diagram for the JSI-GEN Unit;

FIG. 196 shows a schematic block diagram for the JSR-GEN Unit.

Figure 197:
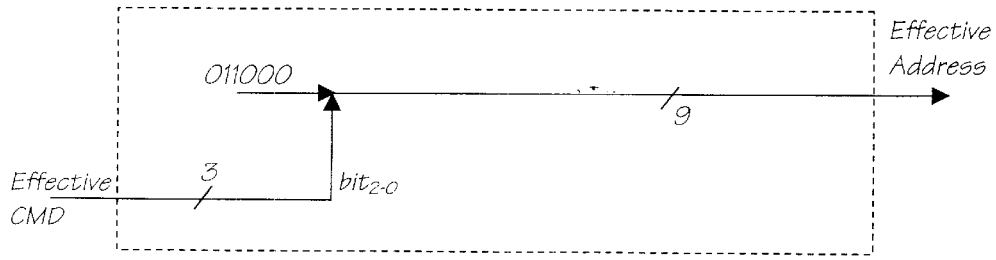
Figure 198:
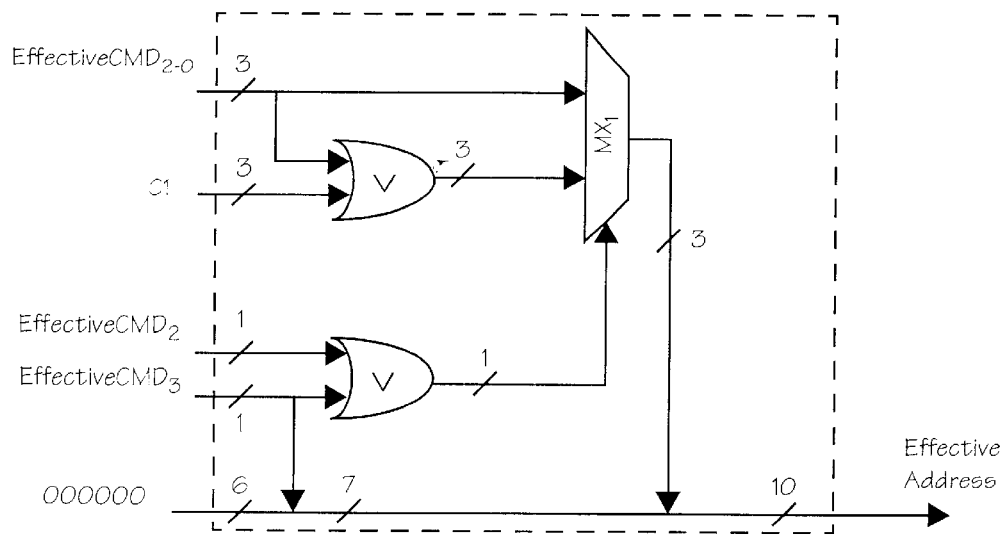
Figure 199:
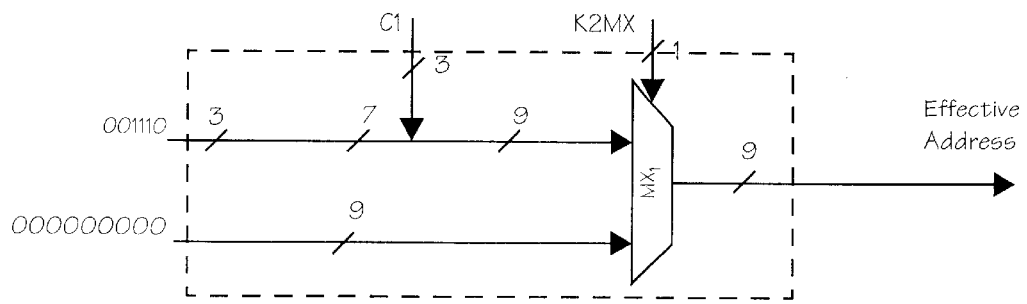
Figure 200:
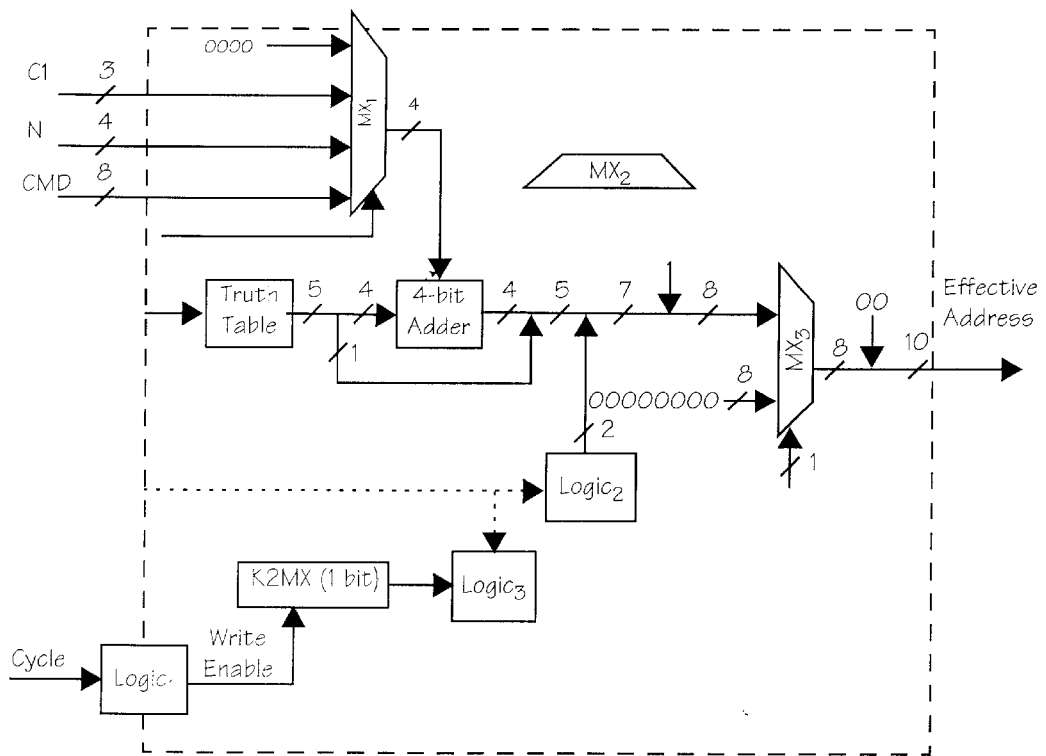

FIG. 197 shows a schematic block diagram for the DBRGEN Unit;

FIG. 198 shows a schematic block diagram for the LDK-GEN Unit;

FIG. 199 shows a schematic block diagram for the RPLGEN Unit;

FIG. 200 shows a schematic block diagram for the VARGEN Unit.

Figure 201:
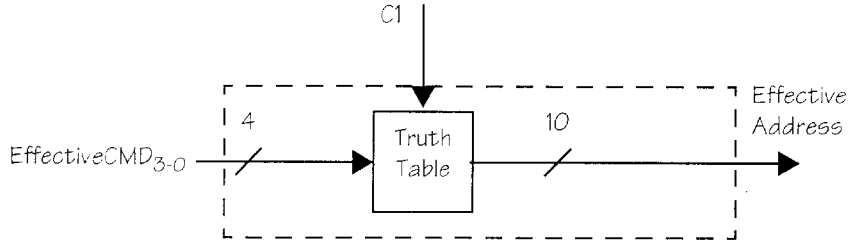

FIG. 201 shows a schematic block diagram for the CLR-GEN Unit.

Figure 202:
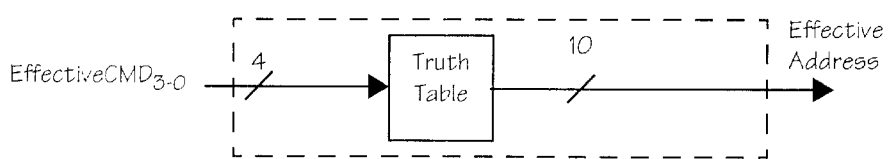

FIG. 202 shows a schematic block diagram for the BIT-GEN Unit.

Figure 203:
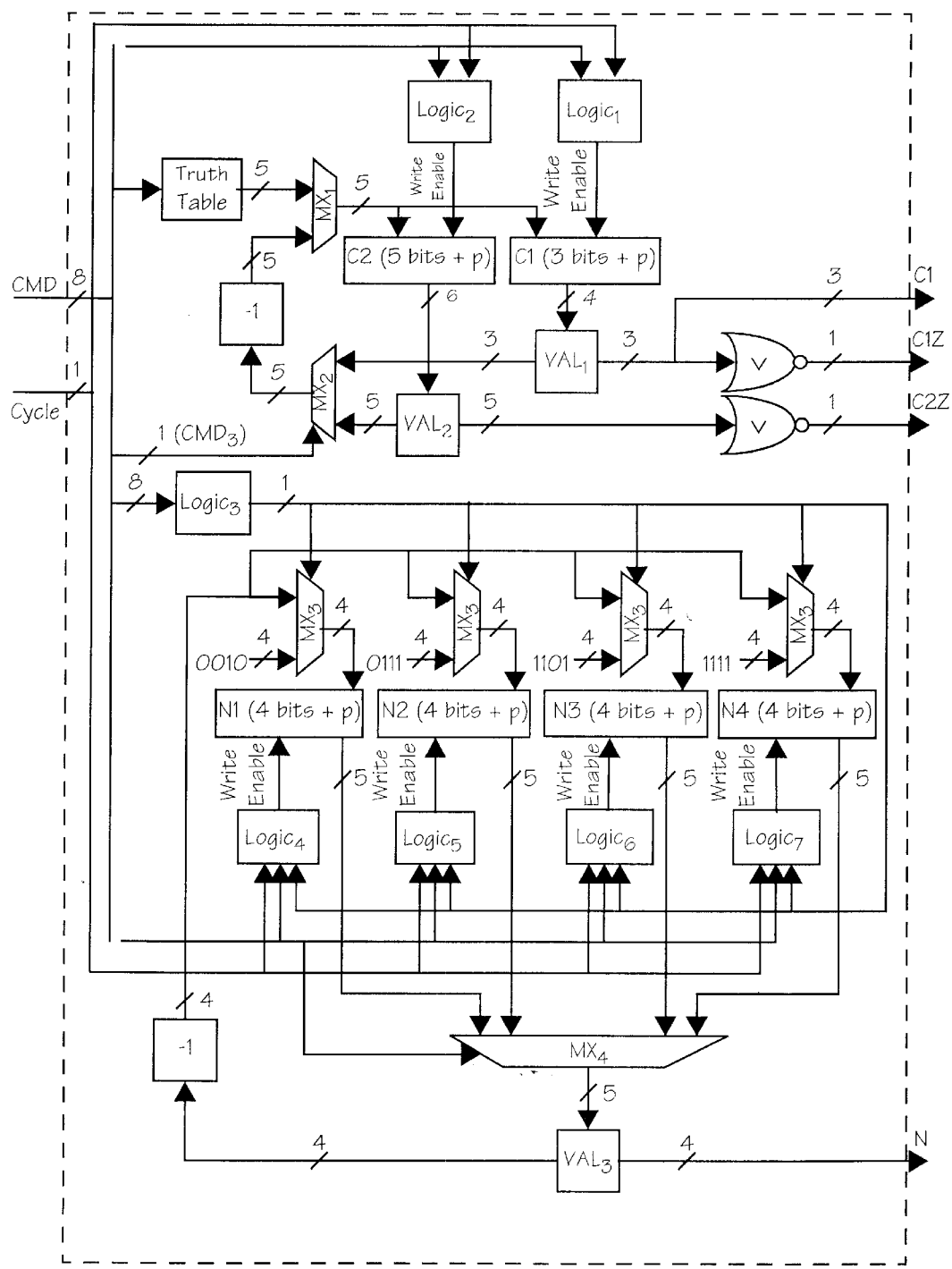
Figure 205:
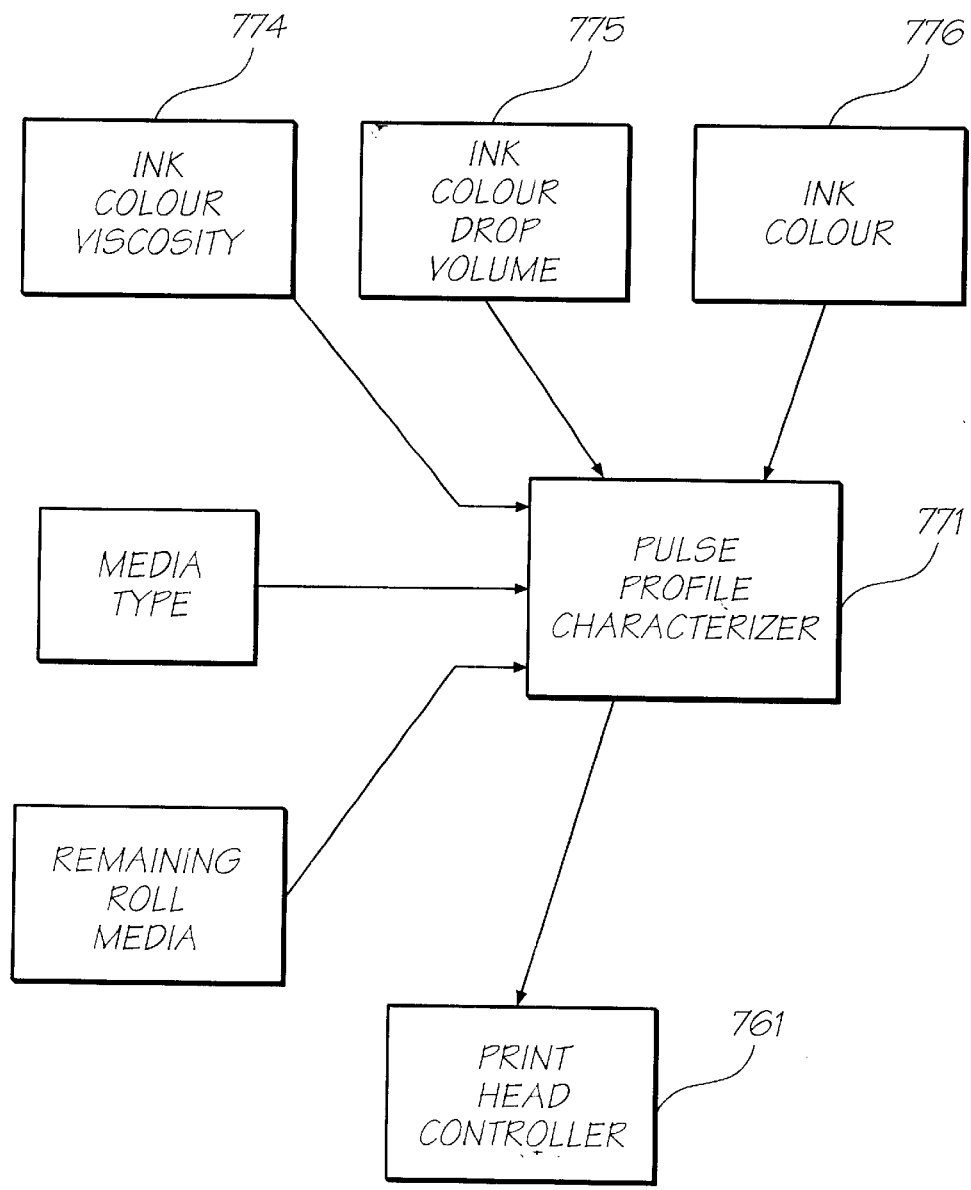
Figure 206:
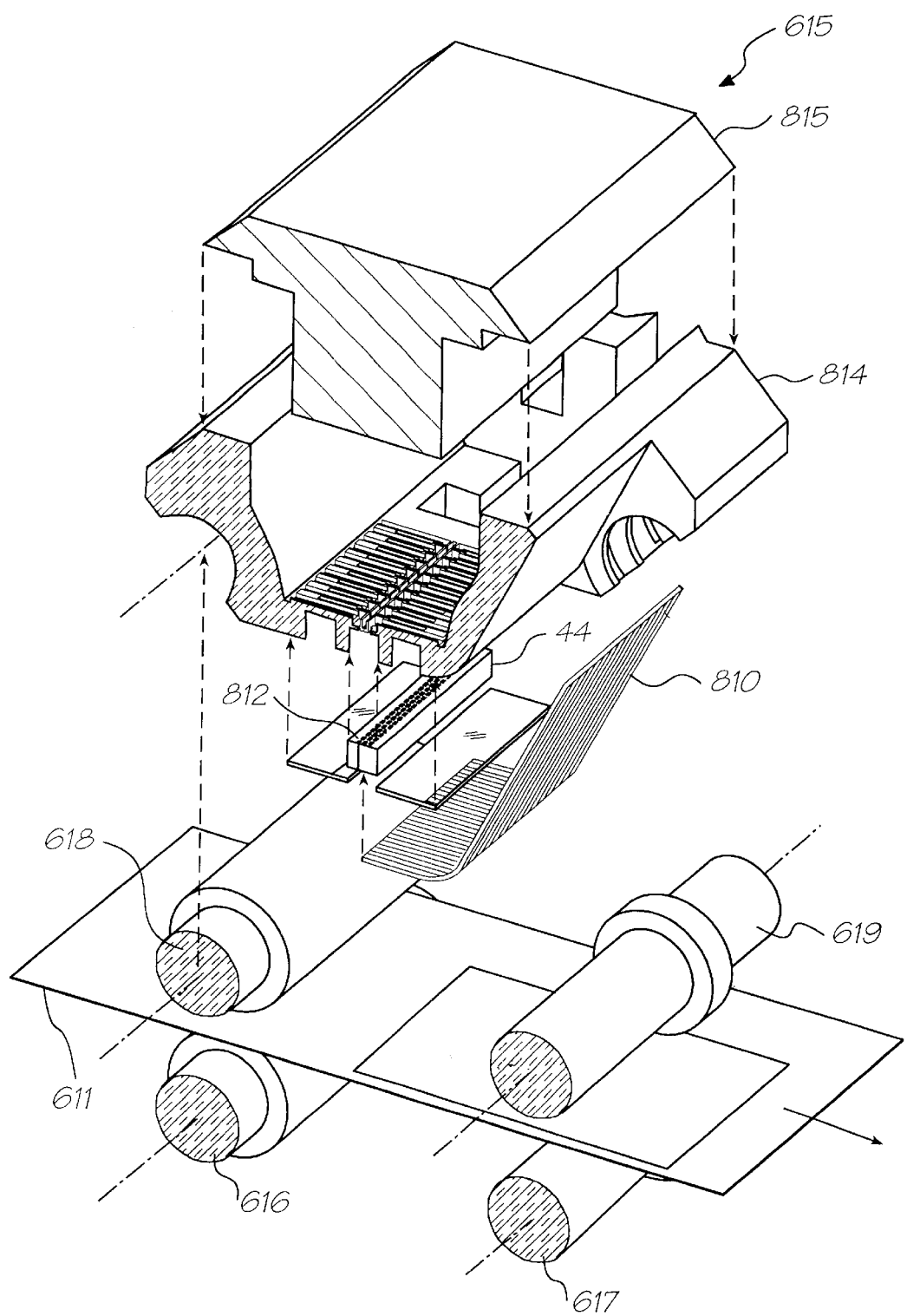
Figure 207:
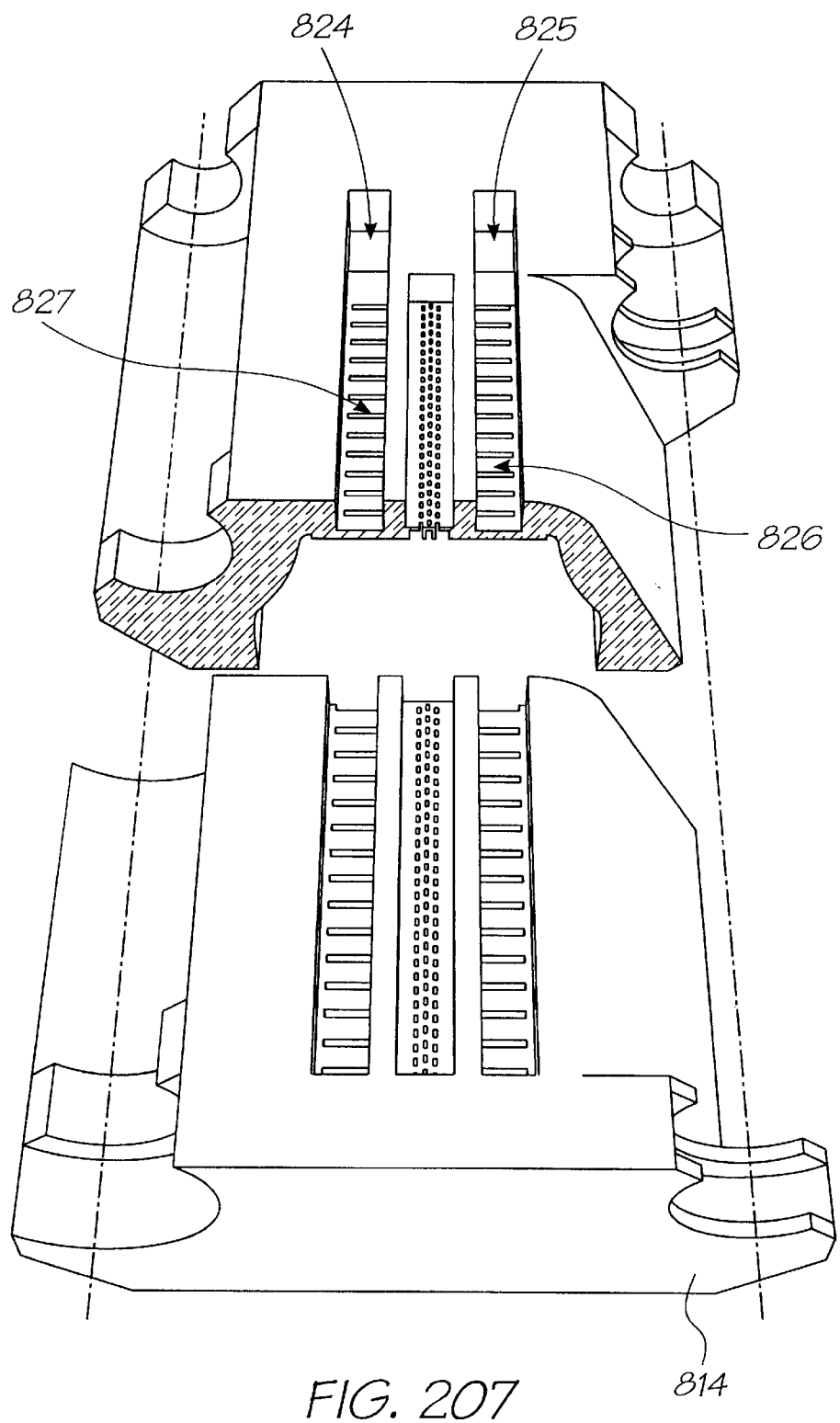

FIG. 203 sets out the information stored on the print roll authentication chip;

FIG. 204 illustrates the data stored within the Artcam authorization chip;

FIG. 205 illustrates the process of print head pulse characterization;

FIG. 206 is an exploded perspective, in section, of the print head ink supply mechanism;

FIG. 207 is a bottom perspective of the ink head supply unit;.

Figure 208:
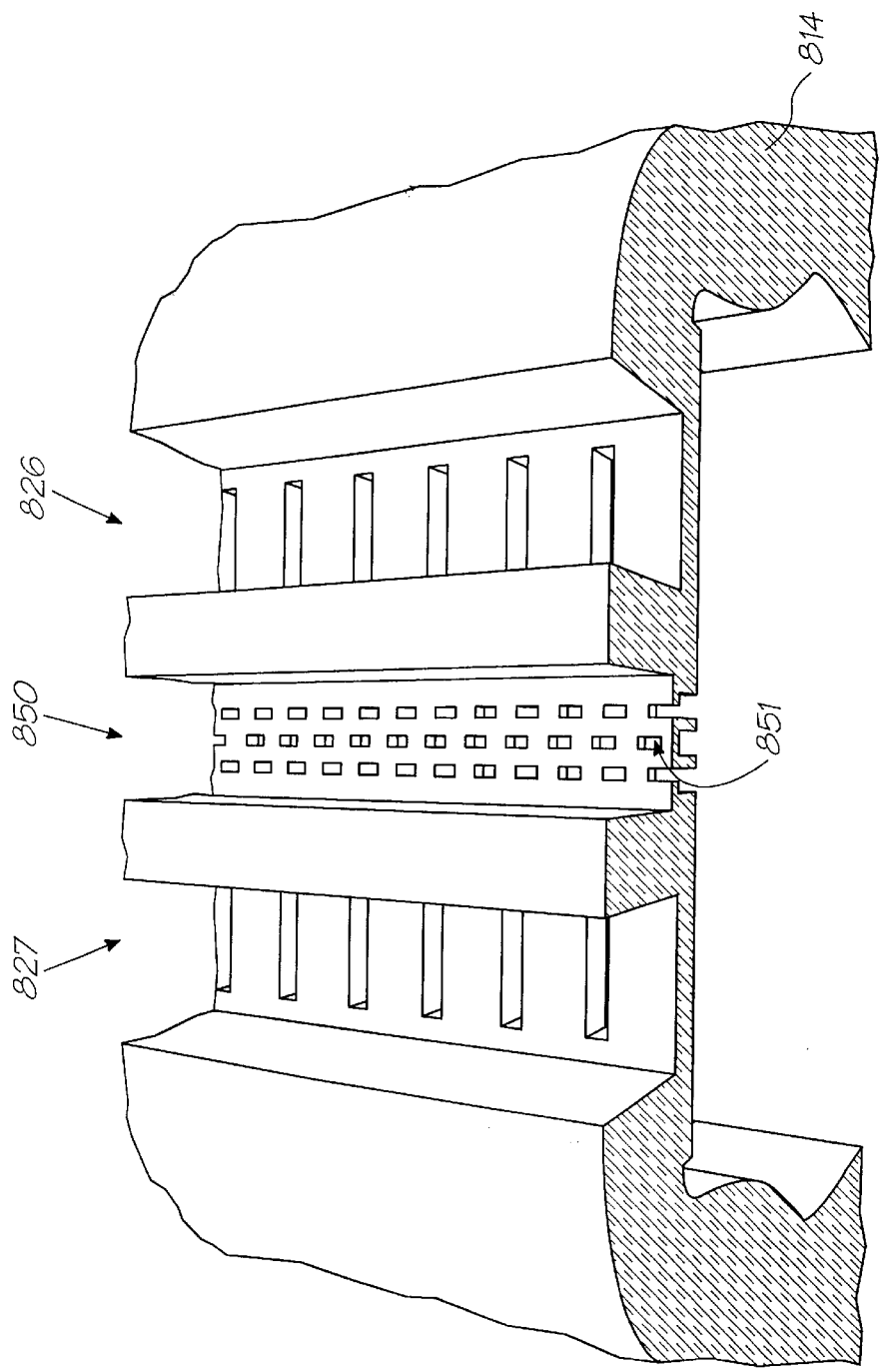
Figure 209:
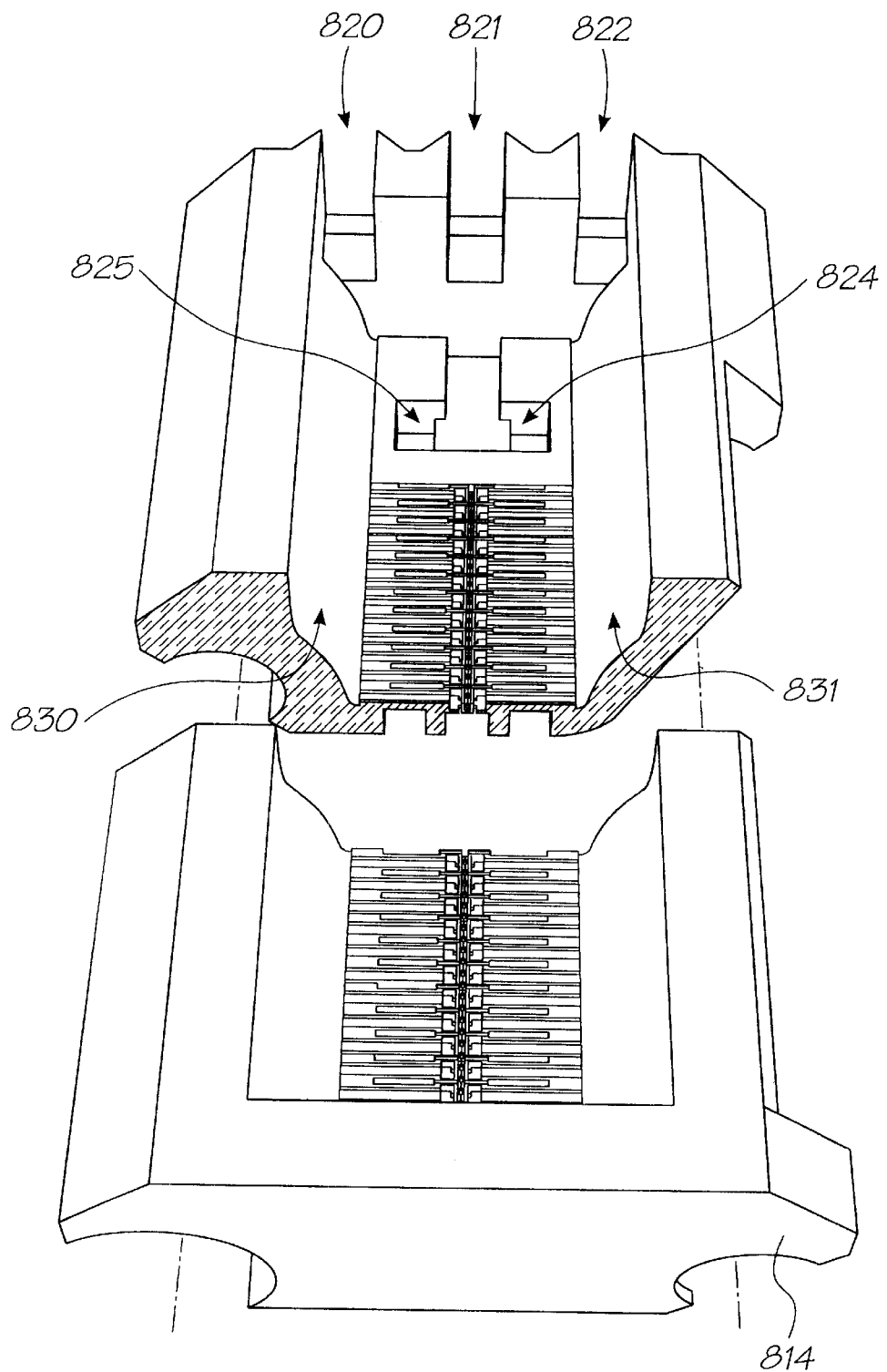
Figure 210:
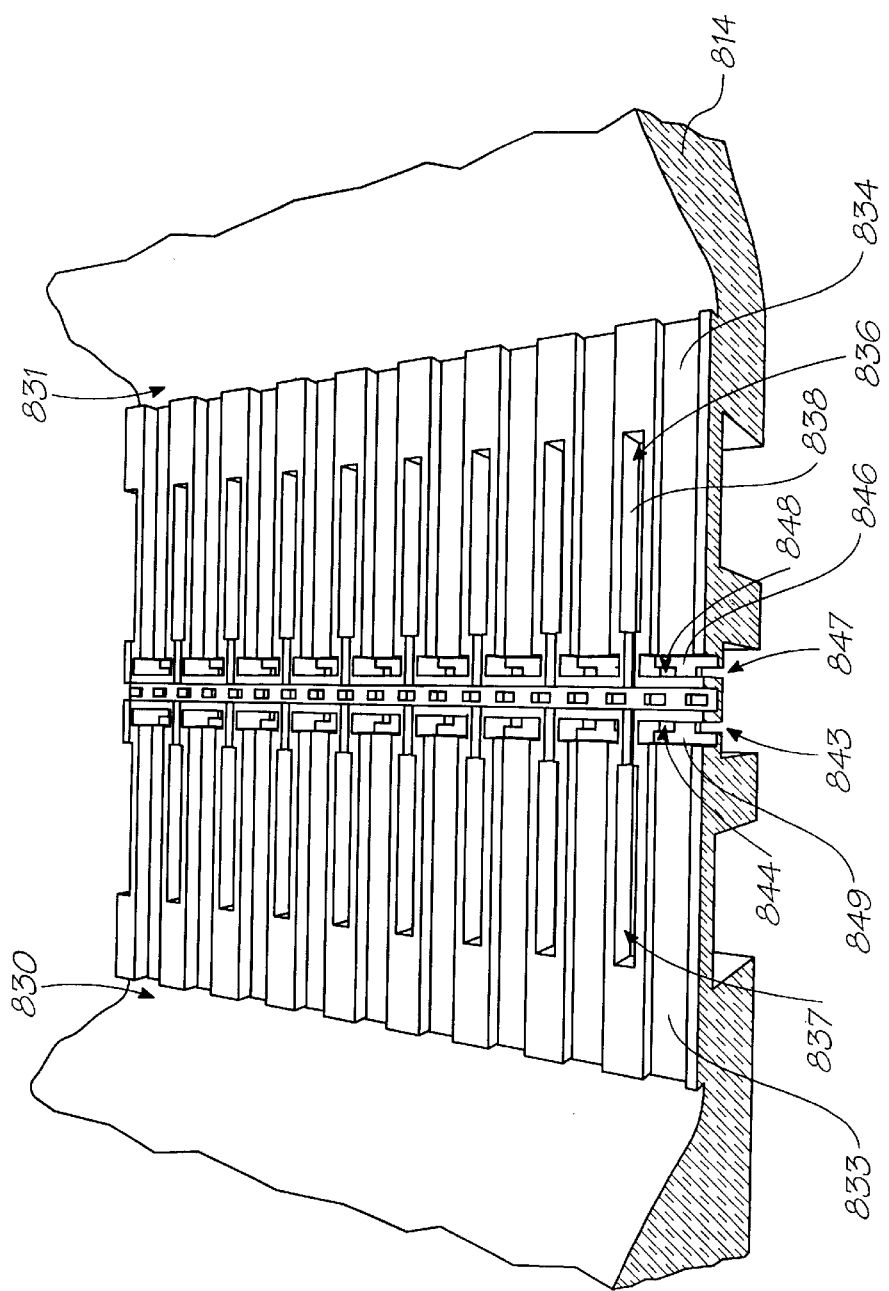
Figure 211:
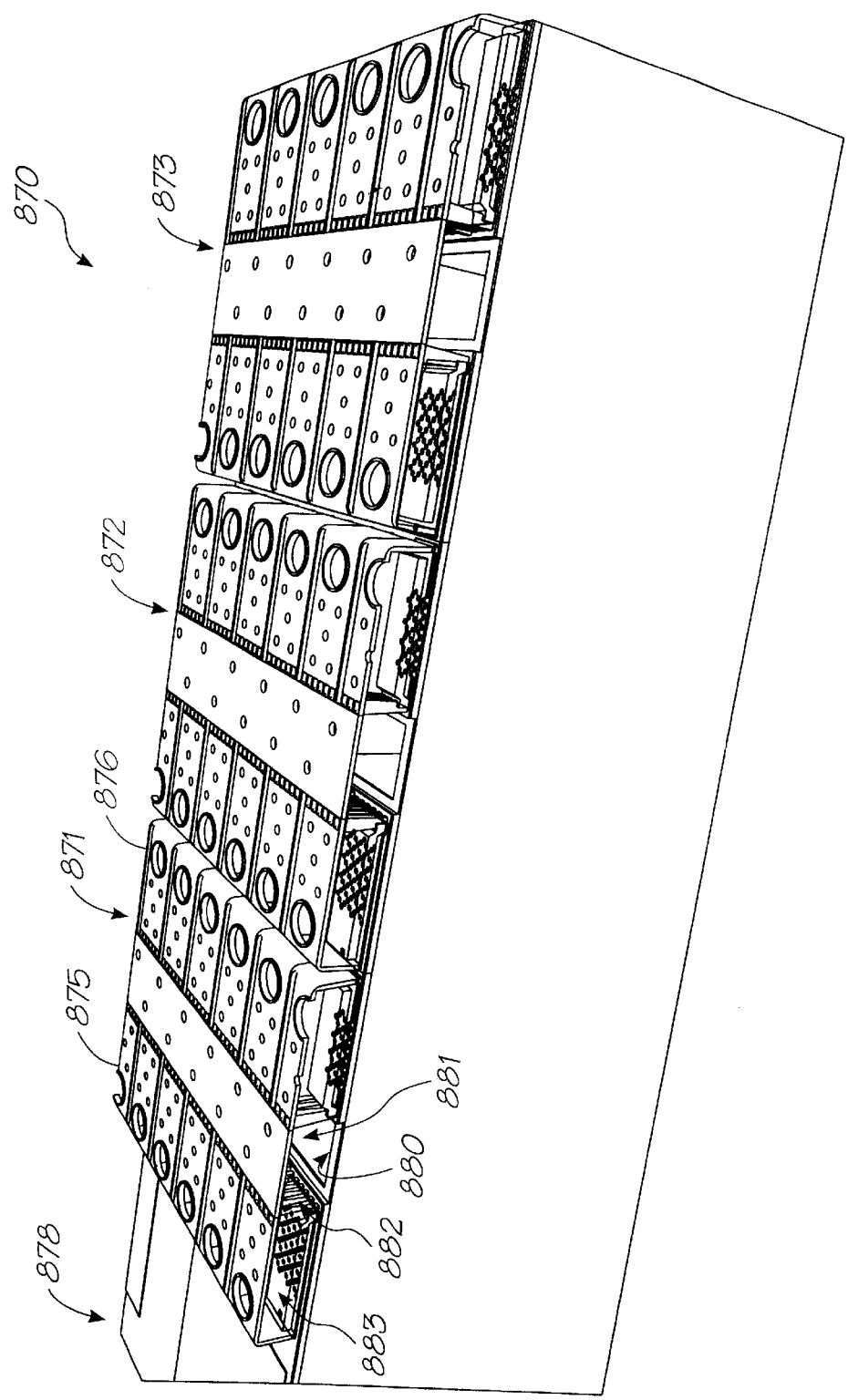
Figure 212:
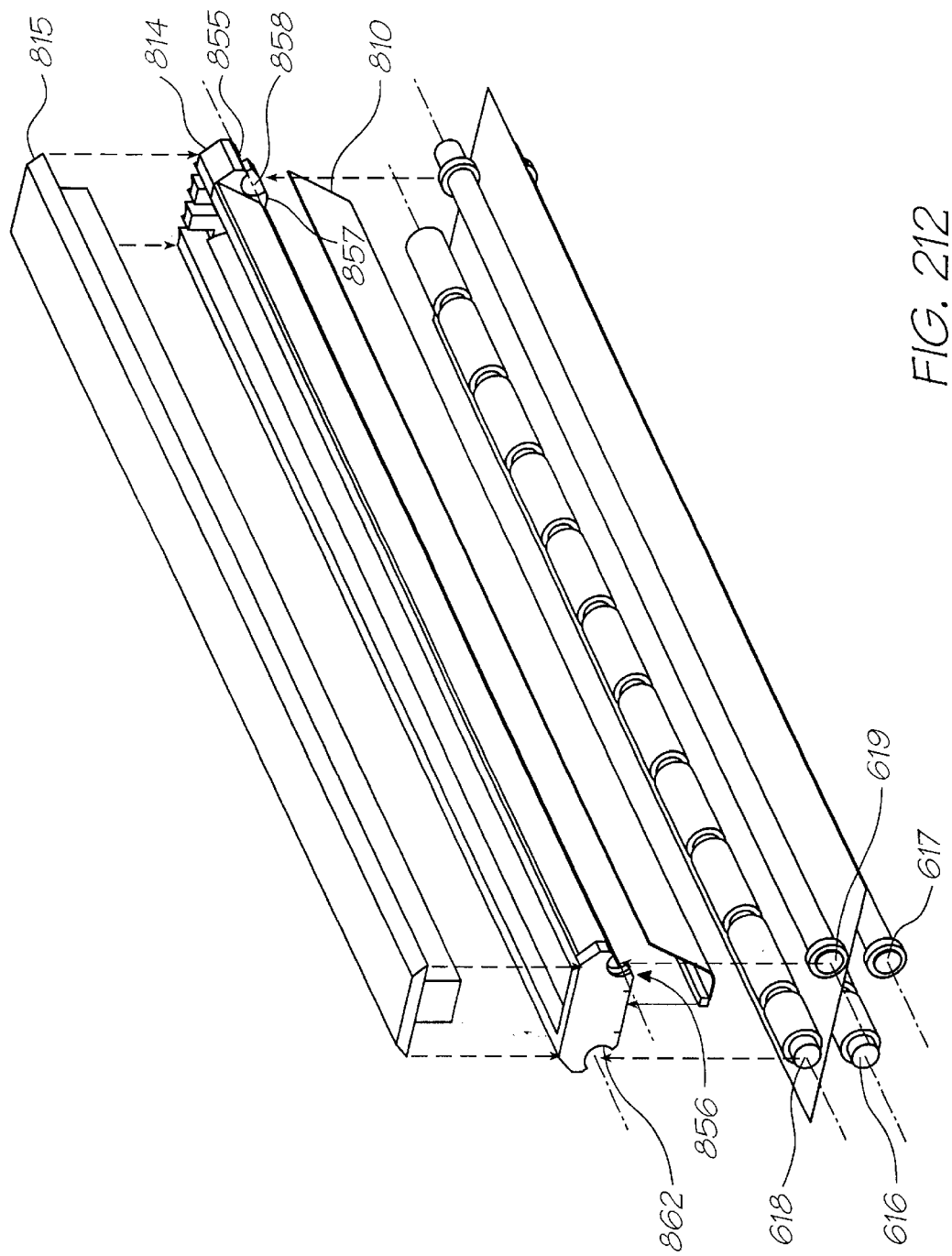
Figure 213:
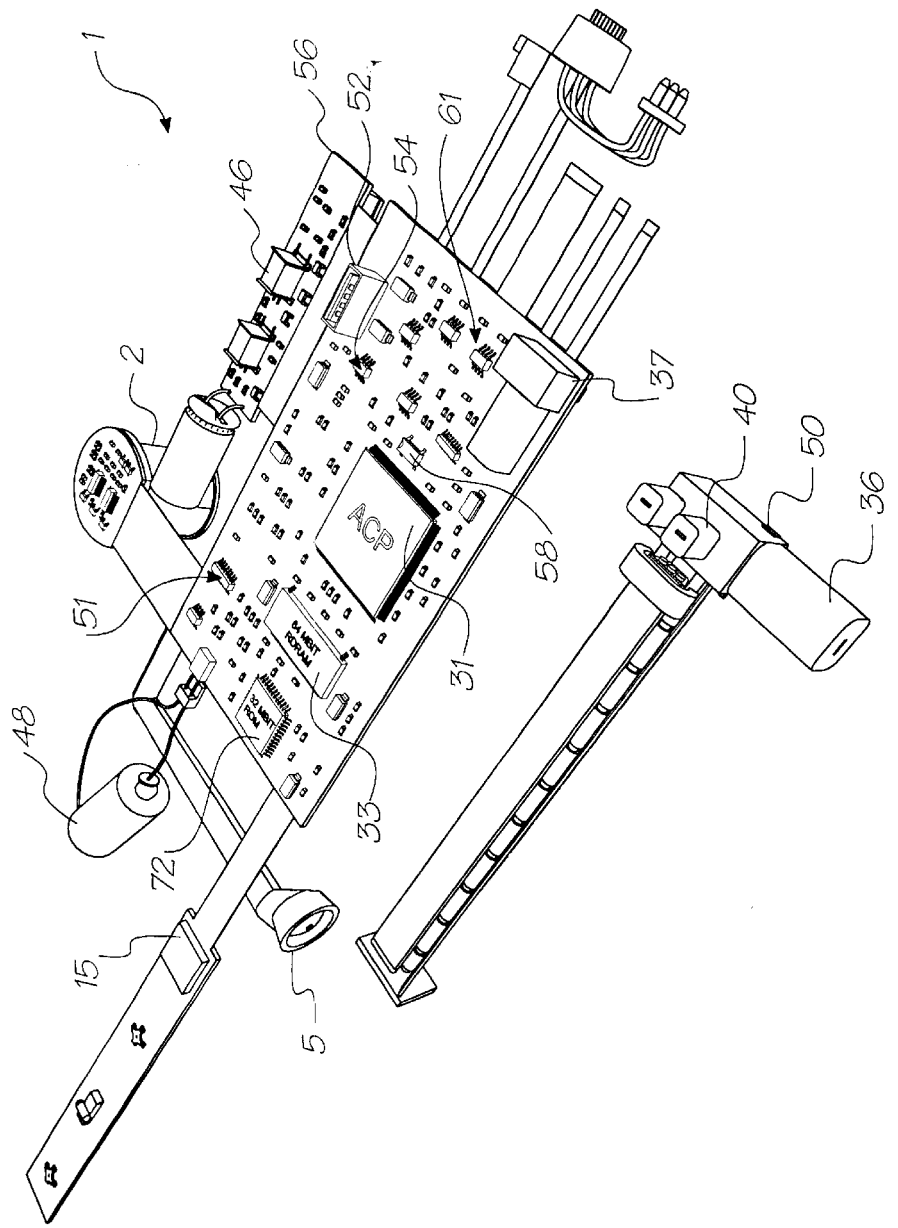
Figure 214:
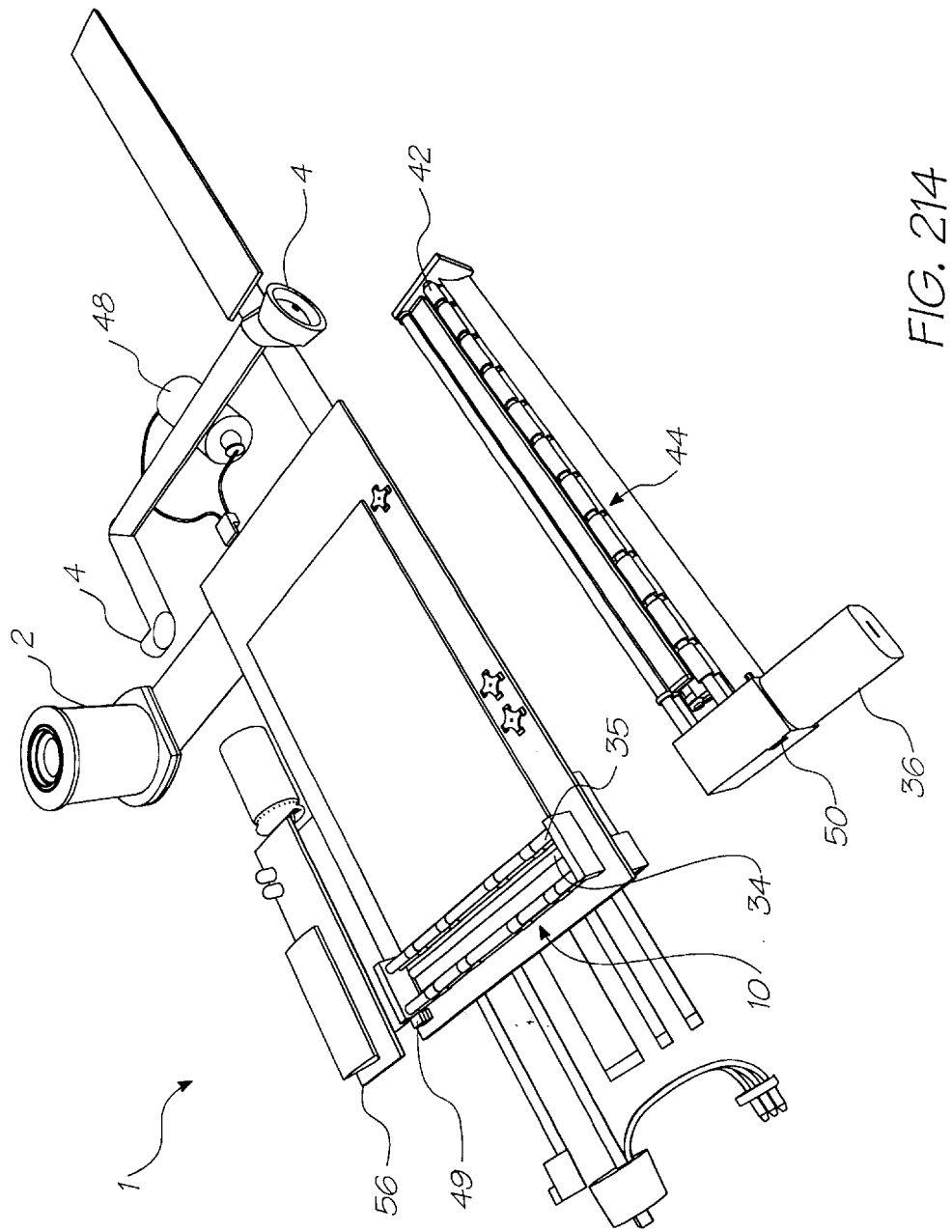
Figure 215:
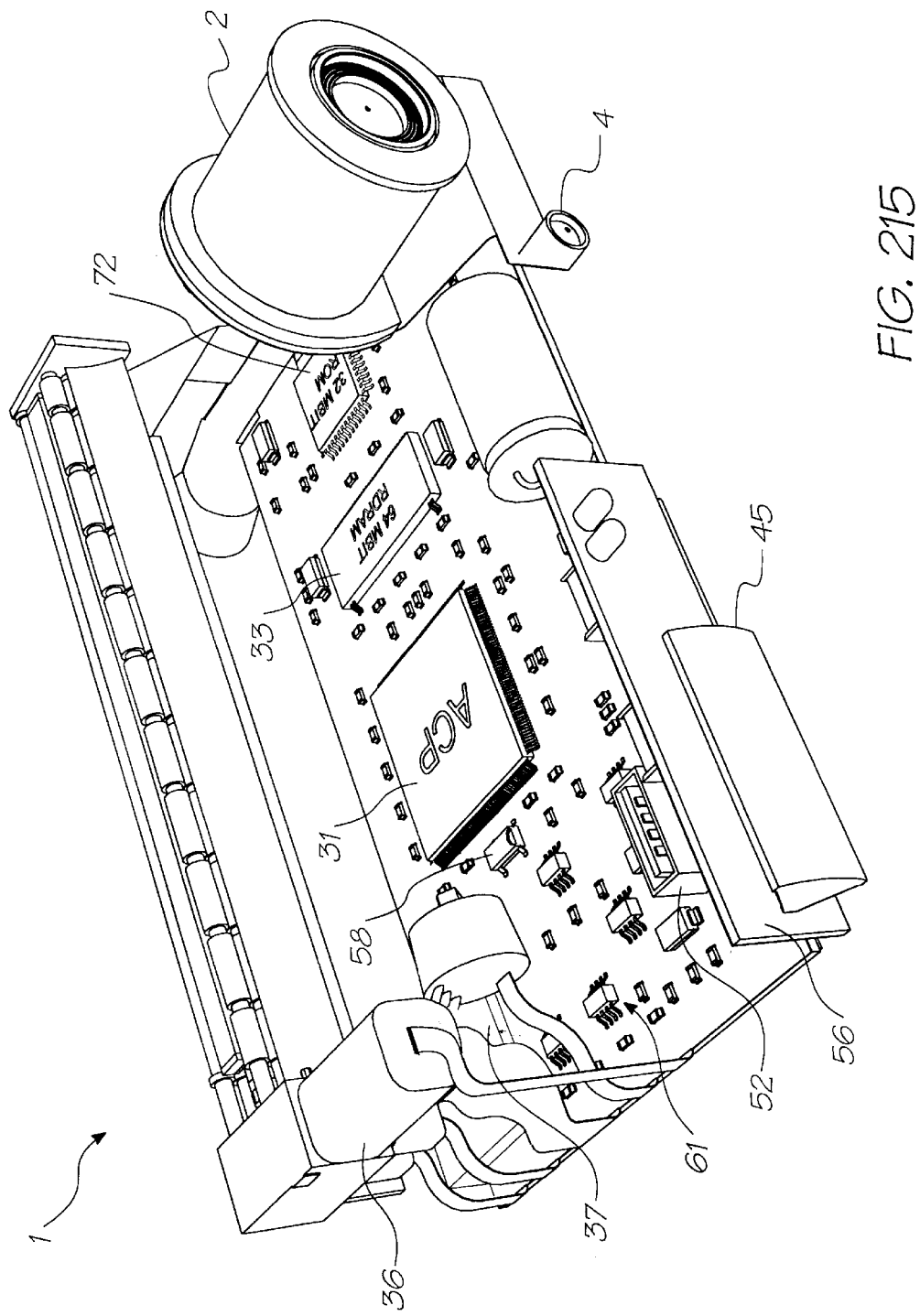
Figure 216:
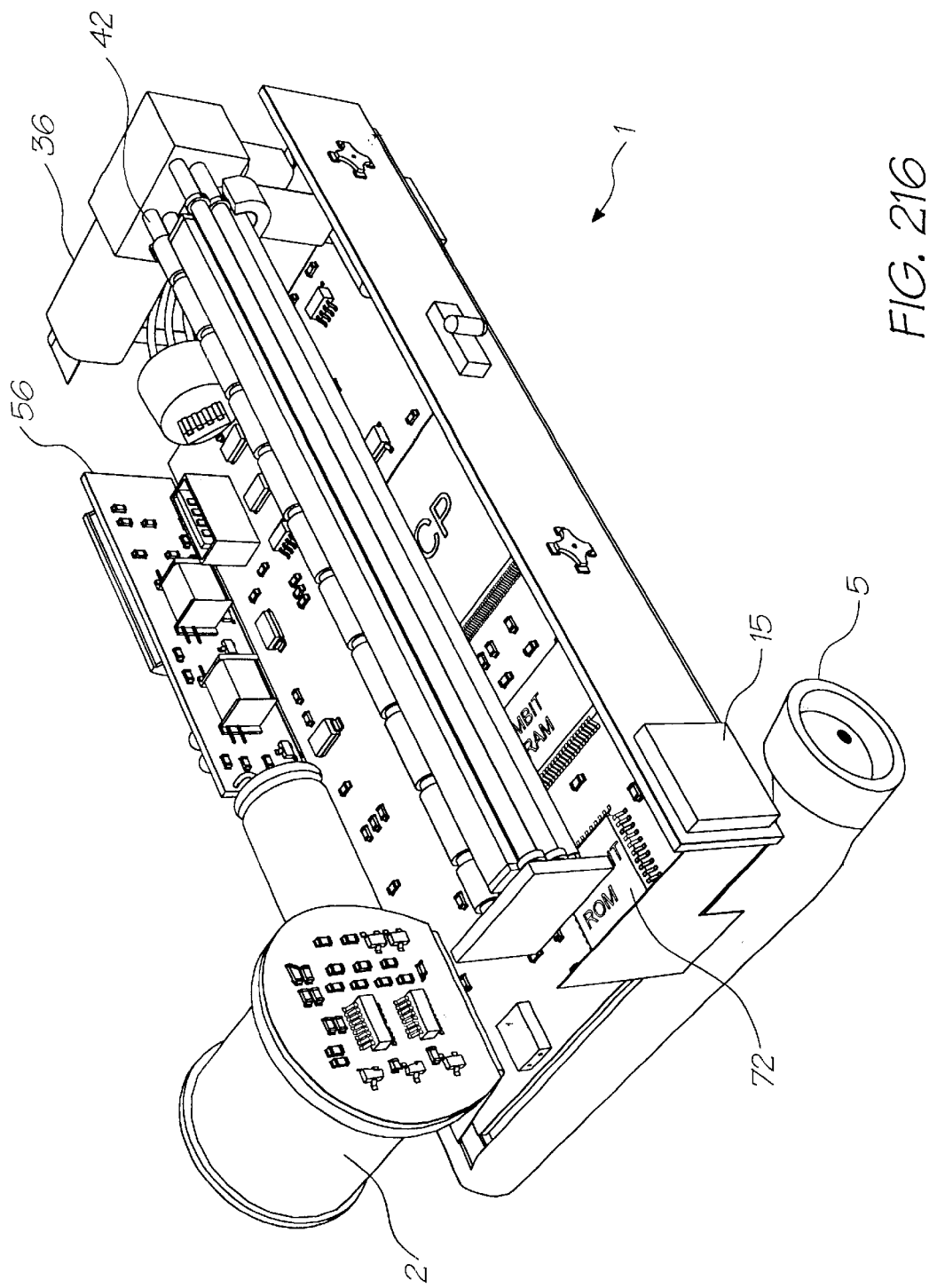
Figure 217:
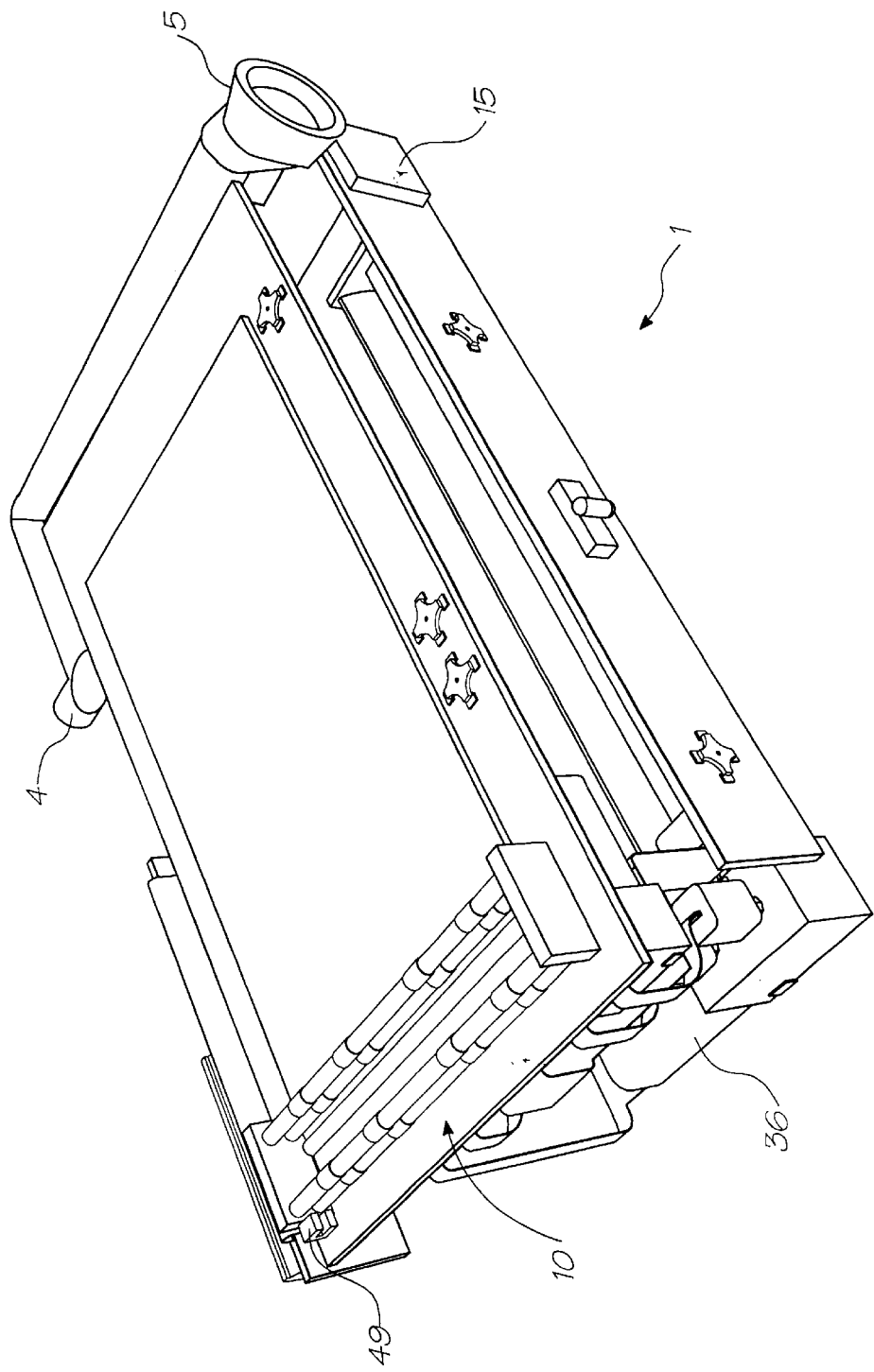
Figure 218:
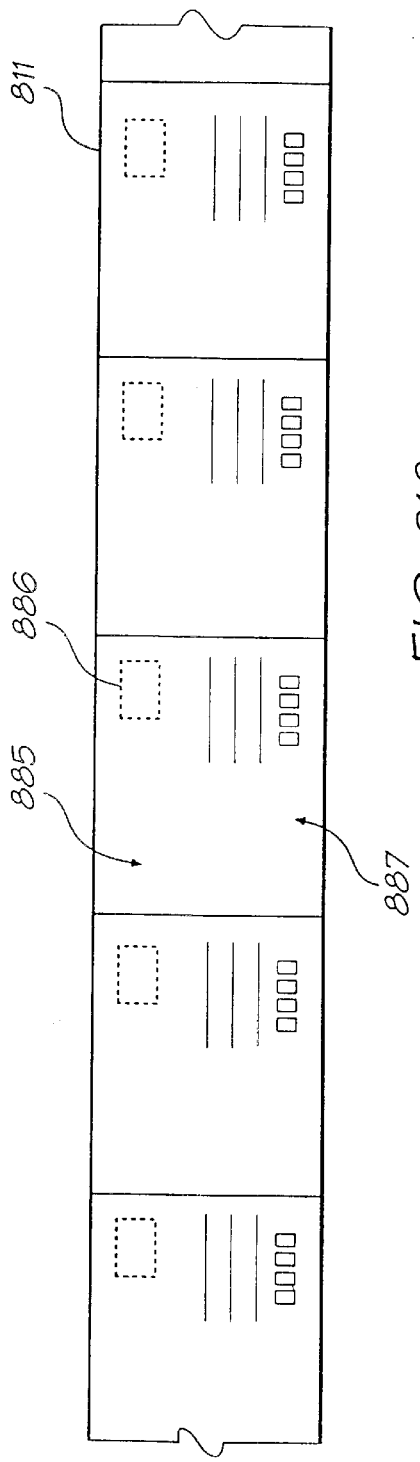
Figure 219:
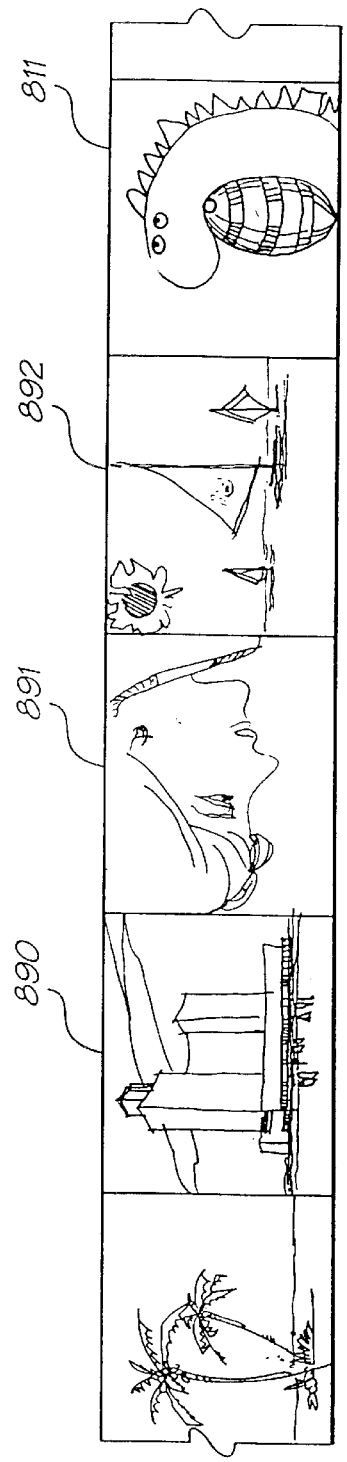
Figure 220:
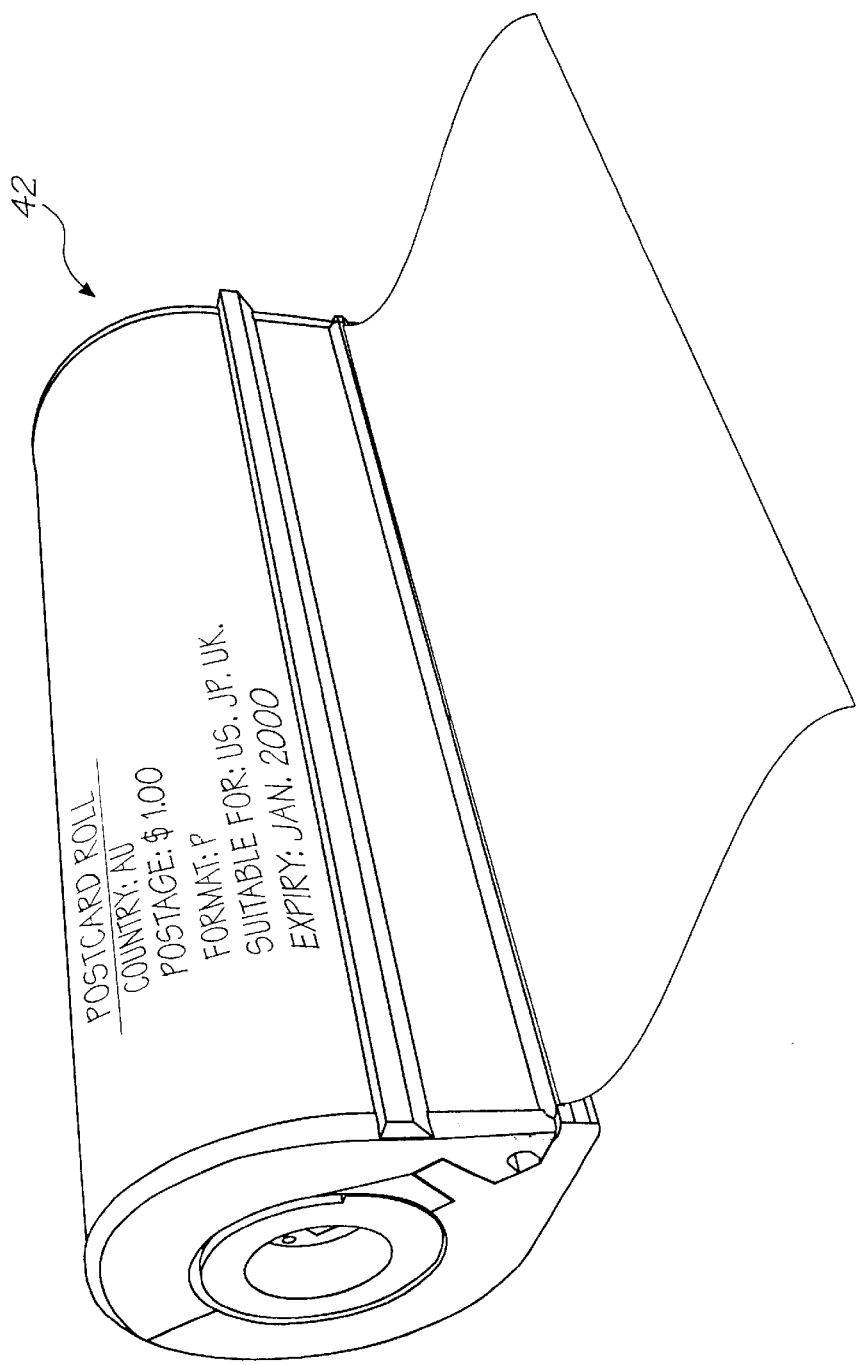
Figure 221:
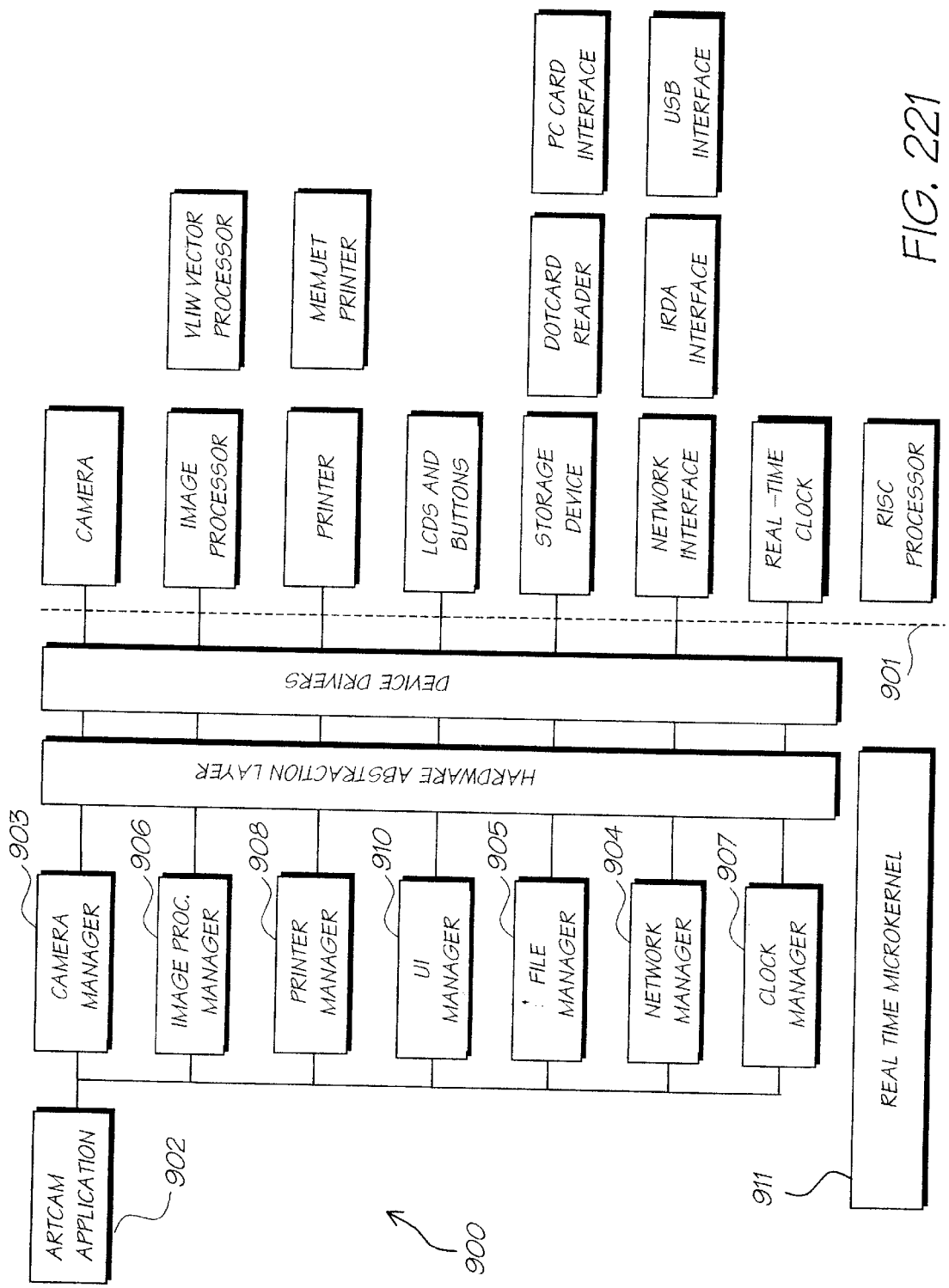
Figure 222:
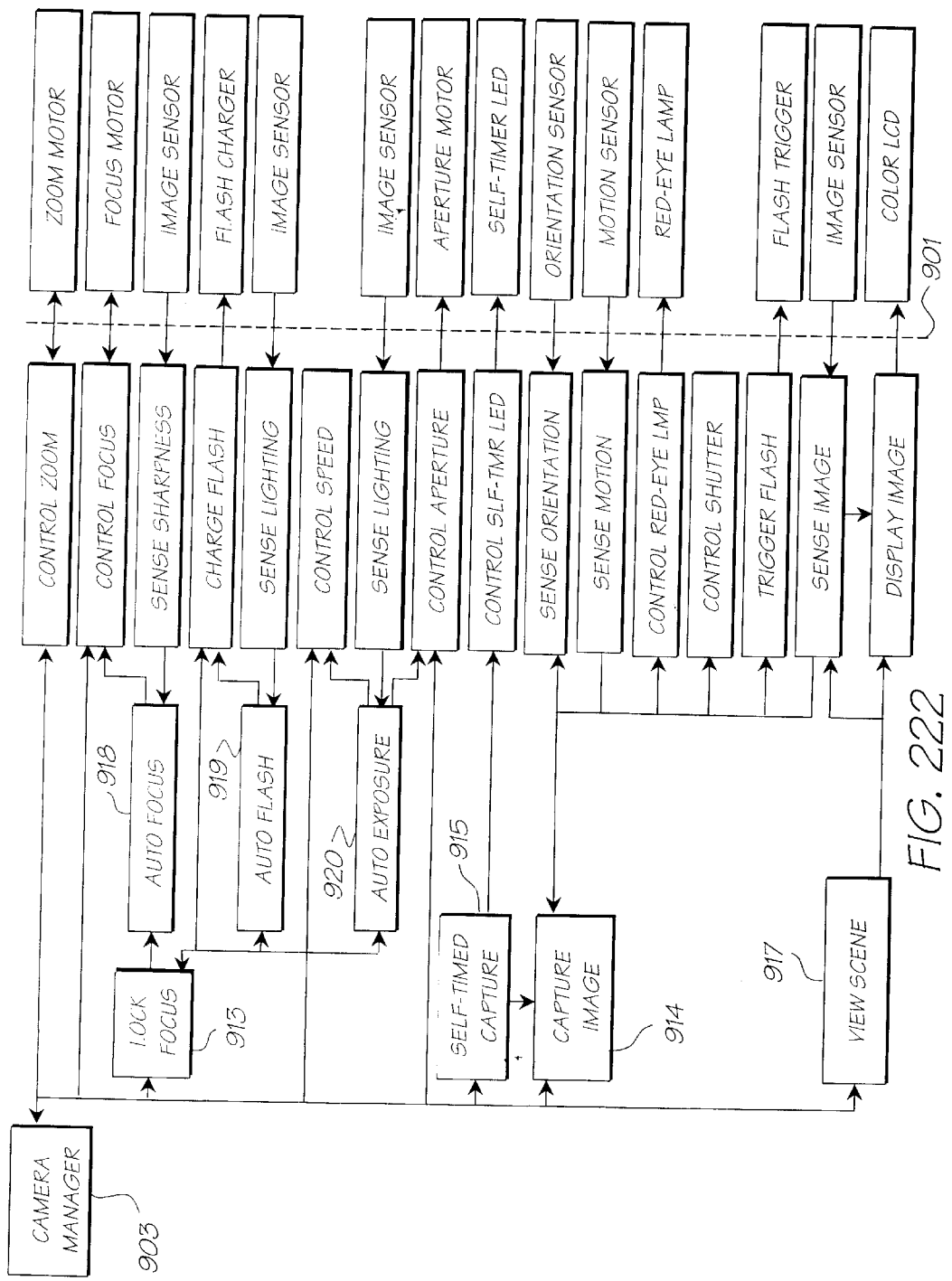
Figure 223:
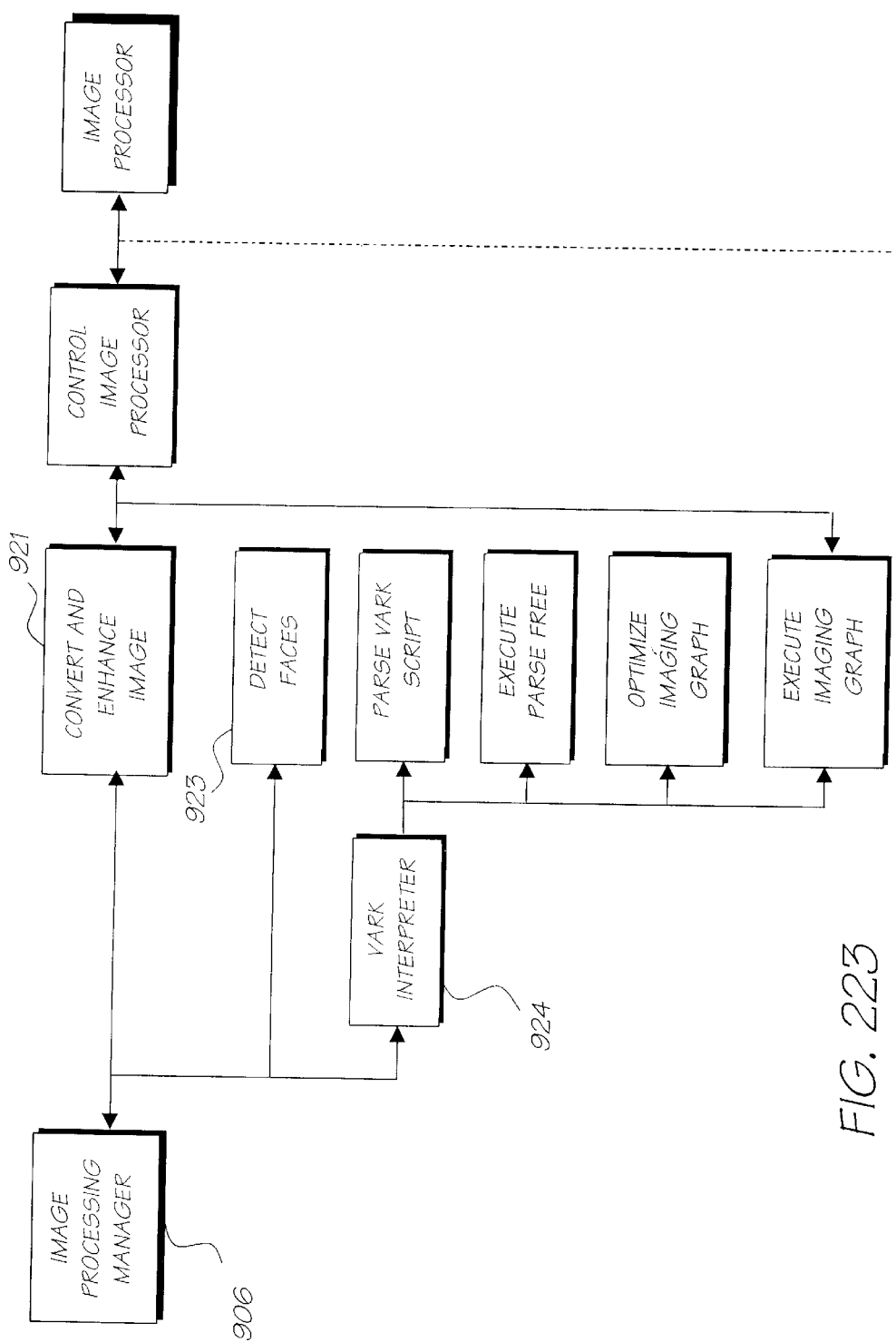
Figure 224:
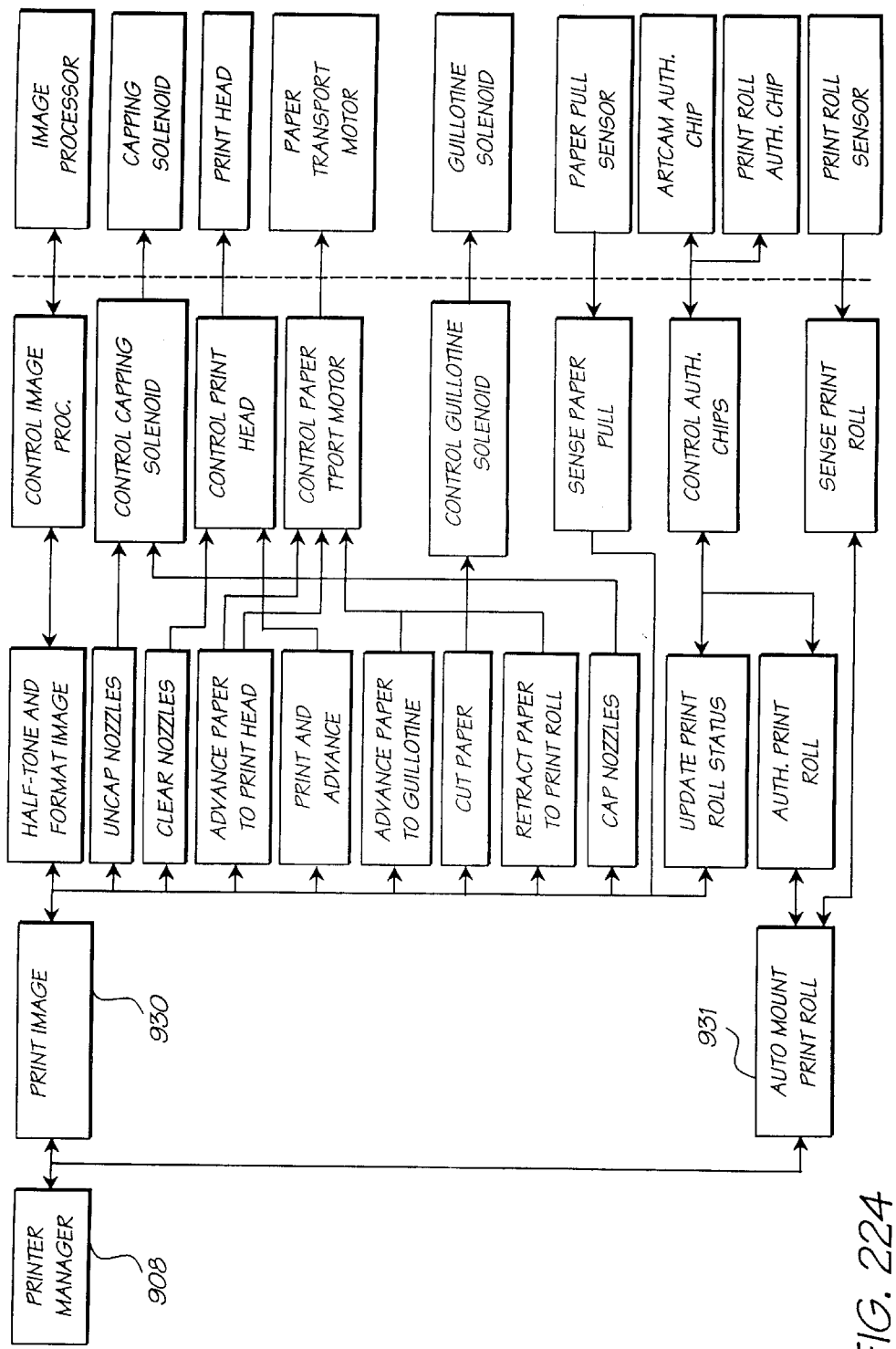
Figure 225:
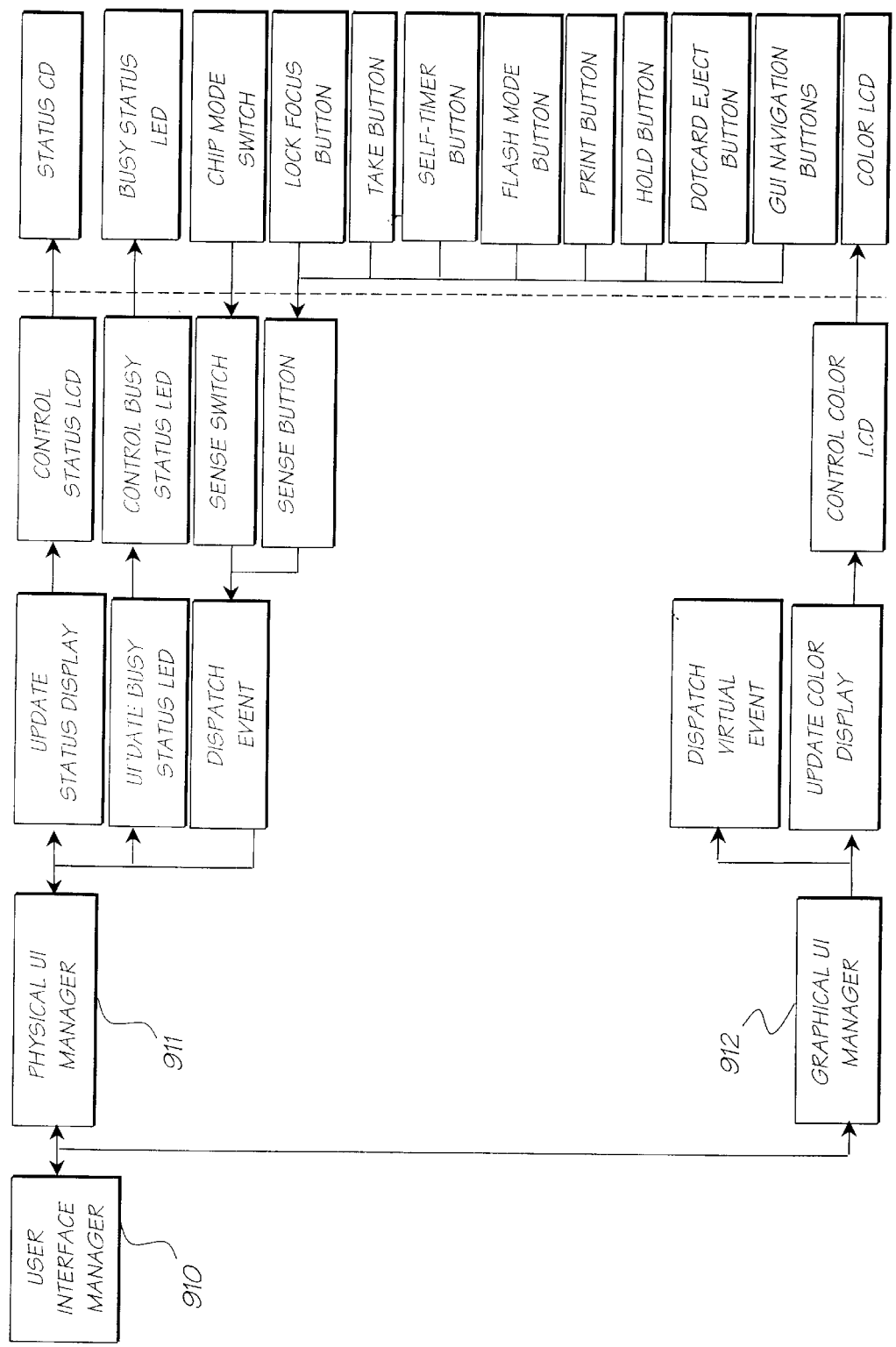
Figure 226:
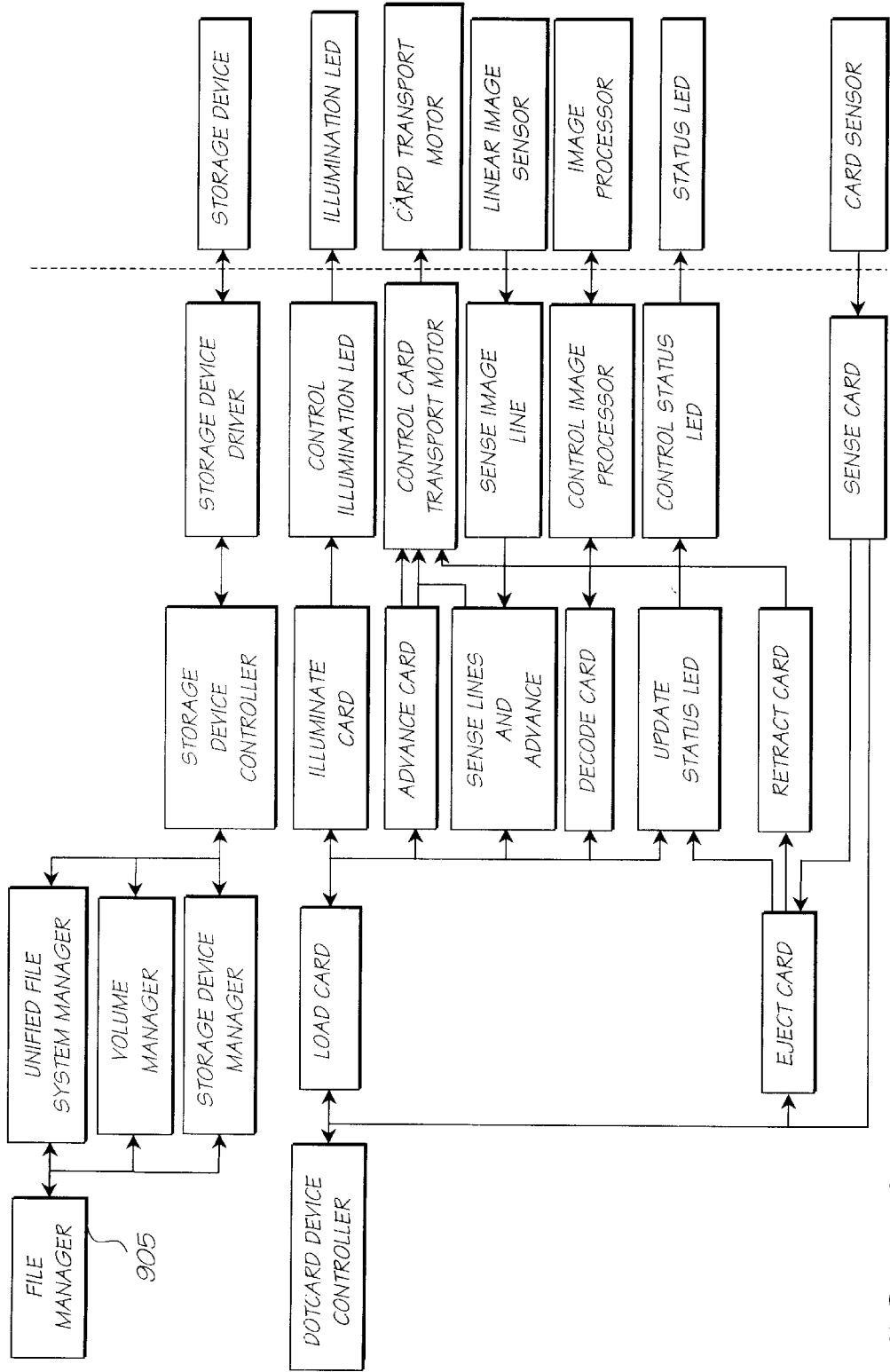
Figure 227:
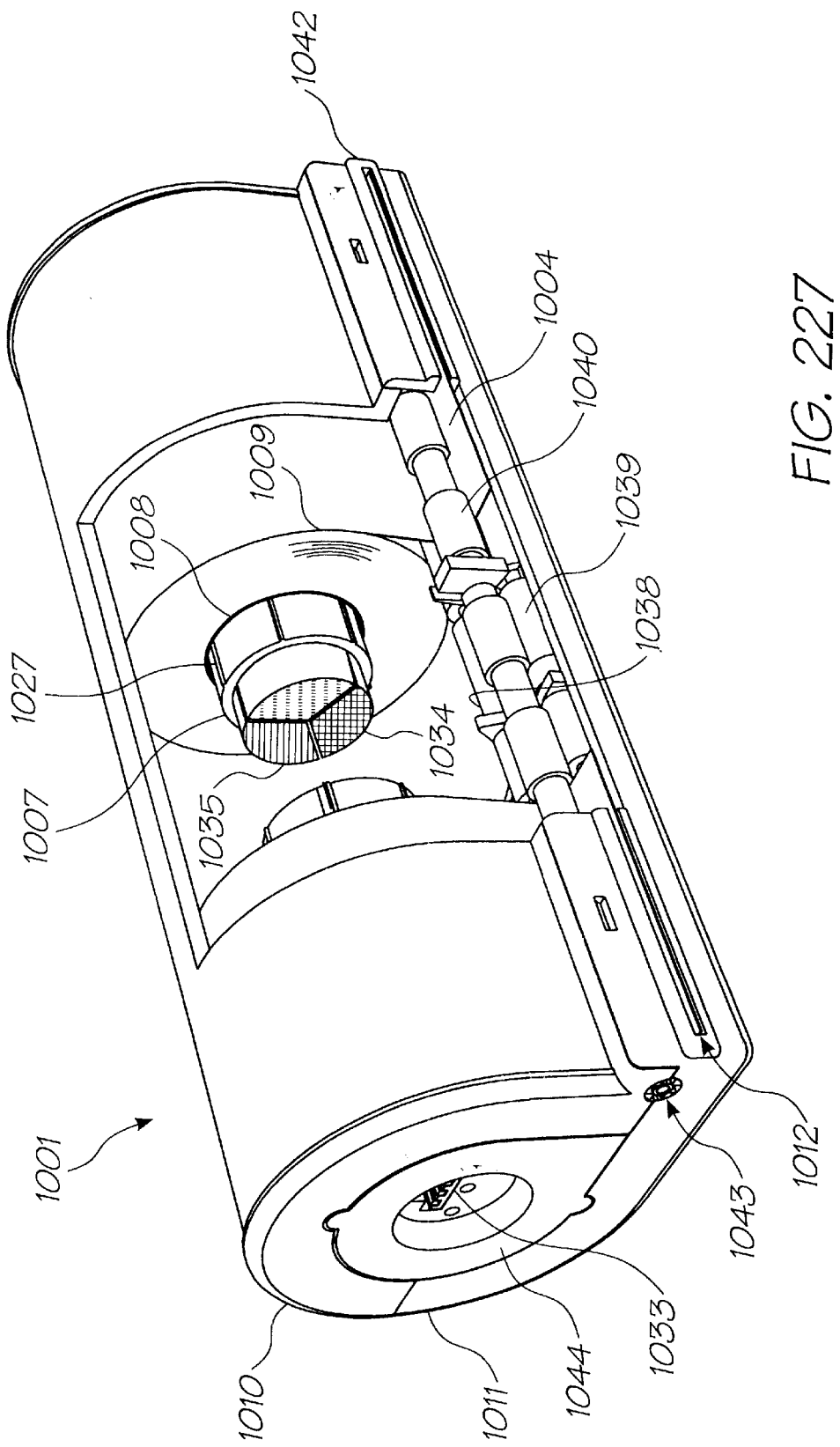
Figure 228:
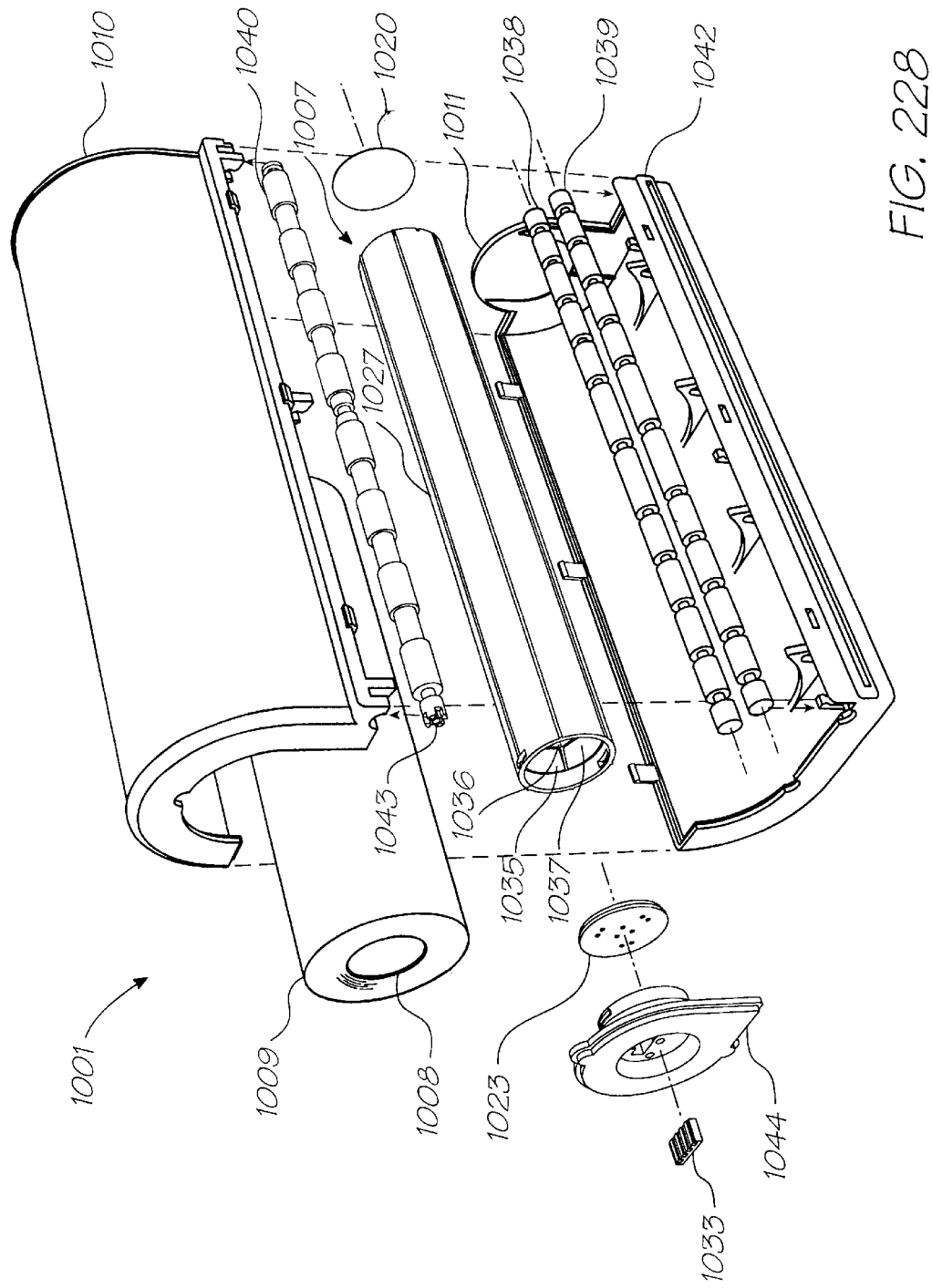
Figure 229:
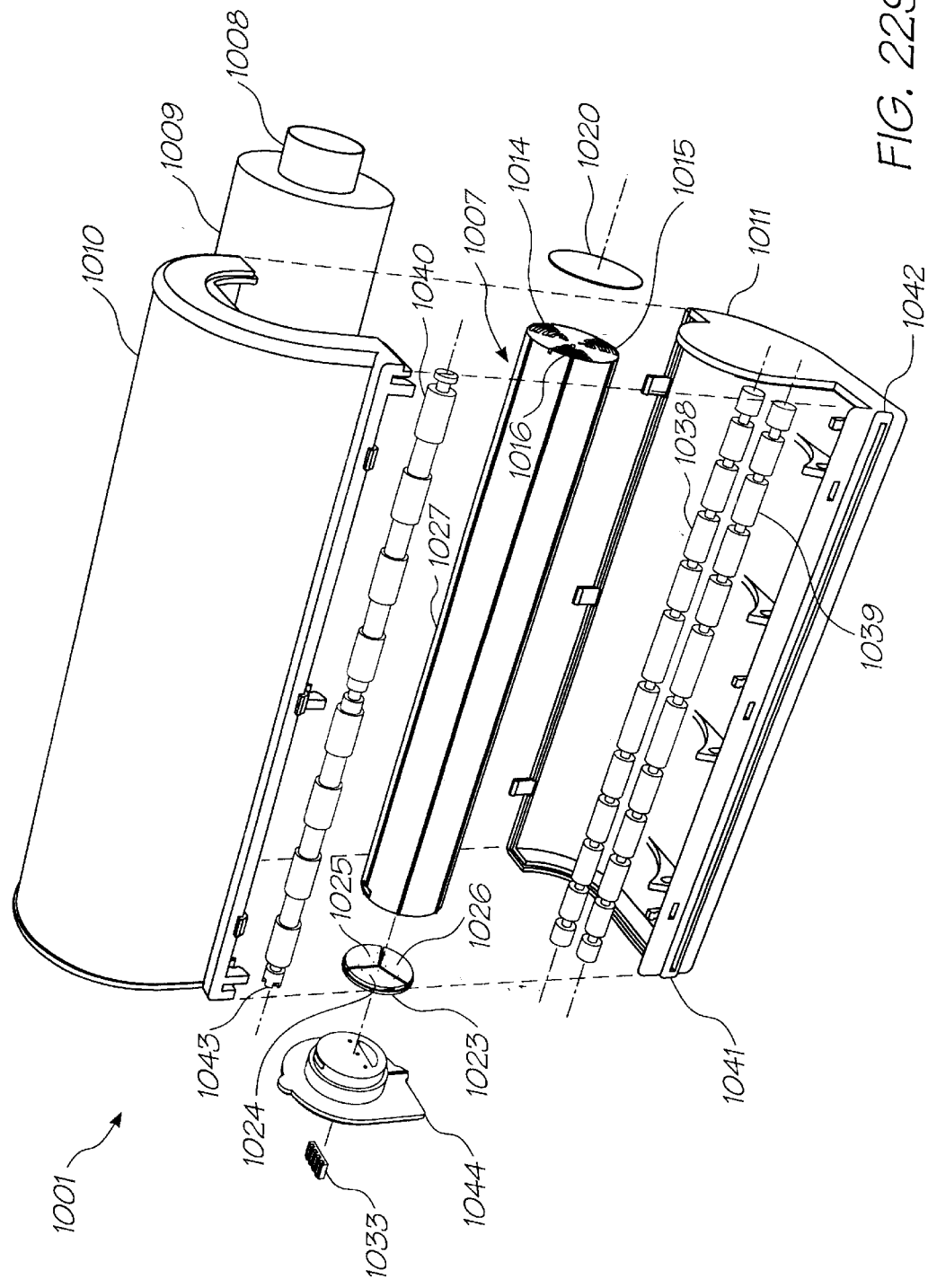
Figure 230:
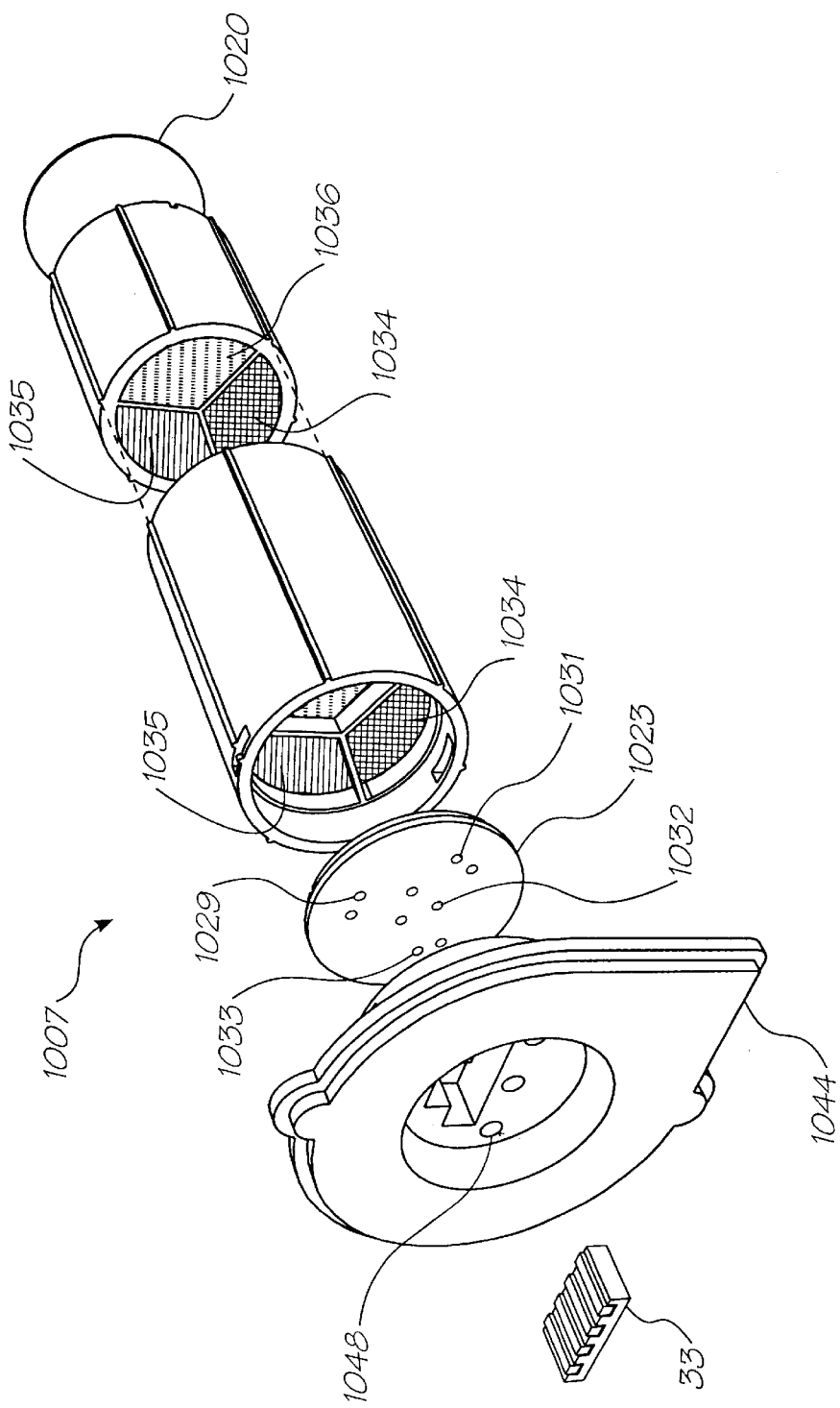
Figure 231:
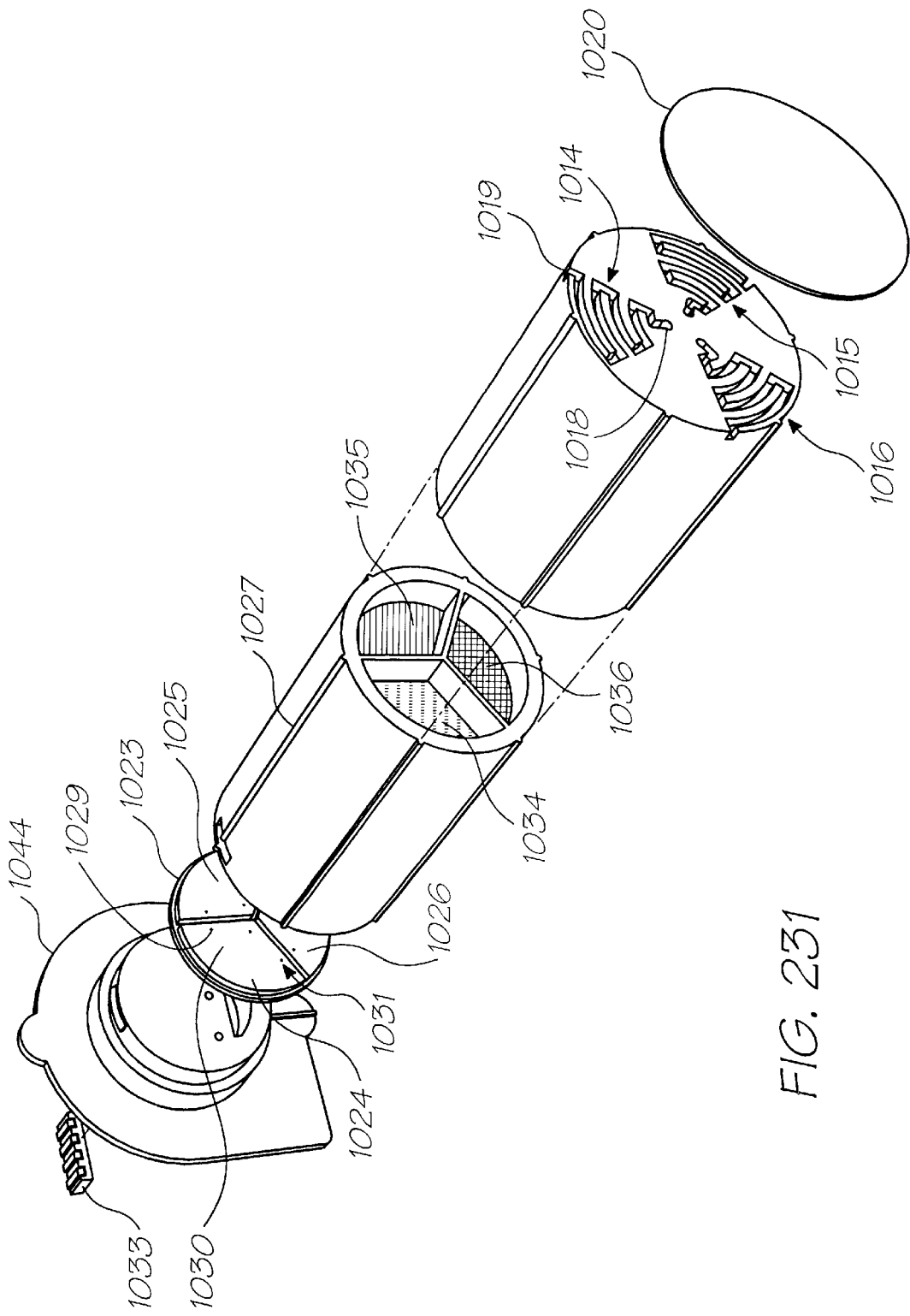

FIG. 208 is a bottom side sectional view of the ink head supply unit;

FIG. 209 is a top perspective of the ink head supply unit;

FIG. 210 is a top side sectional view of the ink head supply unit;

FIG. 211 illustrates a perspective view of a small portion of the print head;

FIG. 212 illustrates is an exploded perspective of the print head unit;

FIG. 213 illustrates a top side perspective view of the internal portions of an Artcam camera, showing the parts flattened out;

FIG. 214 illustrates a bottom side perspective view of the internal portions of an Artcam camera, showing the parts flattened out;

FIG. 215 illustrates a first top side perspective view of the internal portions of an Artcam camera, showing the parts as encased in an Artcam;

FIG. 216 illustrates a second top side perspective view of the internal portions of an Artcam camera, showing the parts as encased in an Artcam;

FIG. 217 illustrates a second top side perspective view of the internal portions of an Artcam camera, showing the parts as encased in an Artcam;

FIG. 218 illustrates the backing portion of a postcard print roll;

FIG. 219 illustrates the corresponding front image on the postcard print roll after printing out images;

FIG. 220 illustrates a form of print roll ready for purchase by a consumer;

FIG. 221 illustrates a layout of the software/hardware modules of the overall Artcam application;

FIG. 222 illustrates a layout of the software/hardware modules of the Camera Manager;

FIG. 223 illustrates a layout of the software/hardware modules of the Image Processing Manager;

FIG. 224 illustrates a layout of the software/hardware modules of the Printer Manager;

FIG. 225 illustrates a layout of the software/hardware modules of the Image Processing Manager;

FIG. 226 illustrates a layout of the software/hardware modules of the File Manager;

FIG. 227 illustrates a perspective view, partly in section, of an alternative form of printroll;

FIG. 228 is a left side exploded perspective view of the print roll of FIG. 227;

FIG. 229 is a right side exploded perspective view of a single printroll;

FIG. 230 is an exploded perspective view, partly in section, of the core portion of the printroll; and FIG. 231 is a second exploded perspective view of the core portion of the printroll.

DESCRIPTION OF PREFERRED AND OTHER EMBODIMENTS

Figure 1:
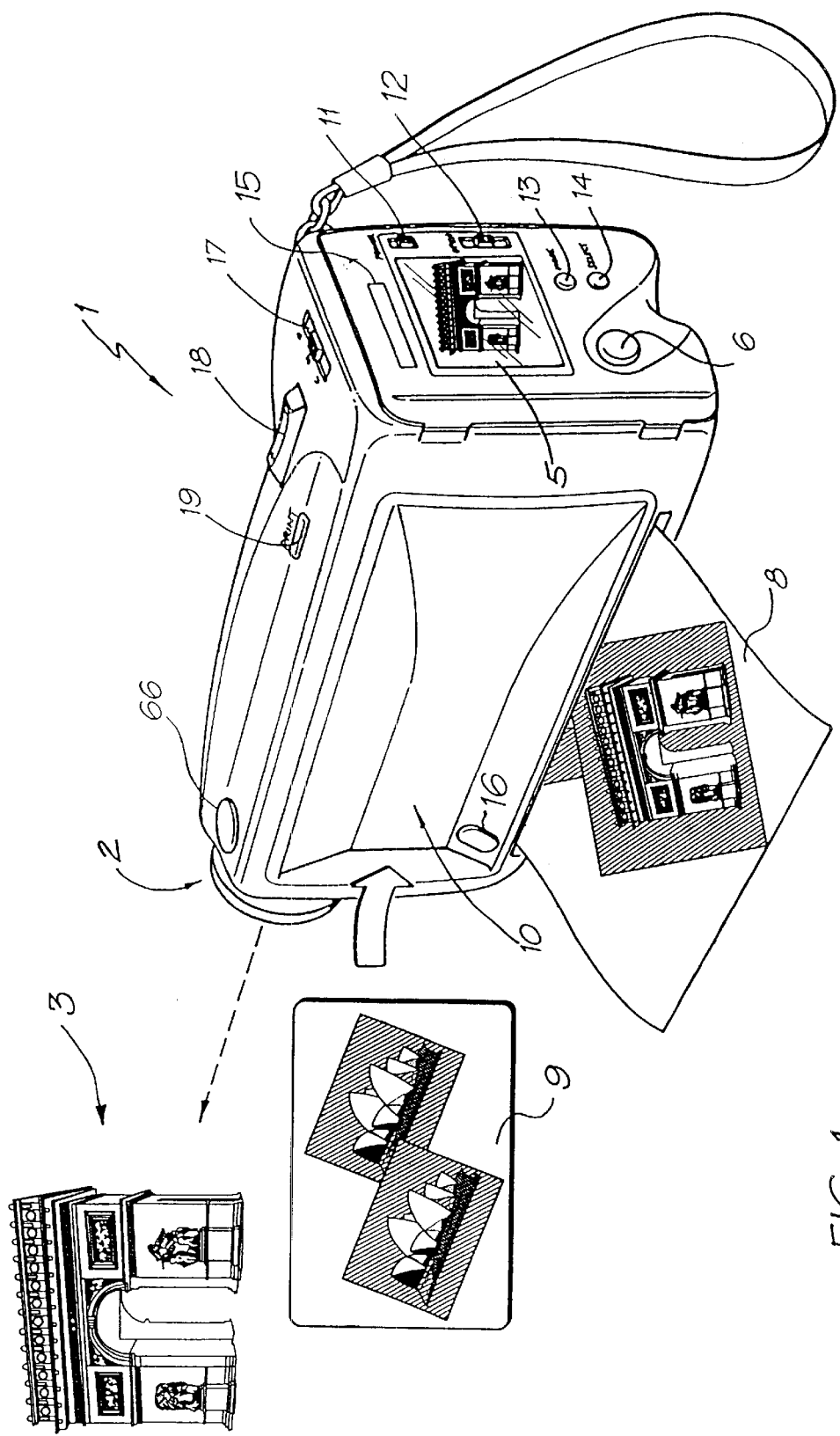
FIG. 1 illustrates an Artcam device constructed in accordance with the preferred embodiment.

The digital image processing camera system constructed in accordance with the preferred embodiment is as illustrated in FIG. 1. The camera unit 1 includes means for the insertion of an integral print roll (not shown). The camera unit 1 can include an area image sensor 2 which sensors an image 3 for captured by the camera. Optionally, the second area image sensor can be provided to also image the scene 3 and to optionally provide for the production of stereographic output effects.

The camera 1 can include: an optional color display 5 for the display of the image being sensed by the sensor 2. When a simple image is being displayed on the display 5, the button 6 can be depressed resulting in the printed image 8 being output by the camera unit 1. A series of cards, herein after known as "Artcards" 9 contain, on one surface encoded information and on the other surface, contain an image distorted by the particular effect produced by the Artcard 9. The Artcard 9 is inserted in an Artcard reader 10 in the side of camera 1 and, upon insertion, results in output image 8 being distorted in the same manner as the distortion appearing on the surface of Artcard 9. Hence, by means of this simple user interface a user wishing to produce a particular effect can insert one of many Artcards 9 into the Artcard reader 10 and utilize button 19 to take a picture of the image 3 resulting in a corresponding distorted output image 8.

The camera unit 1 can also include a number of other control button 13, 14 in addition to a simple LCD output display 15 for the display of informative information including the number of printouts left on the internal print roll on the camera unit. Additionally, different output formats can be controlled by CHP switch 17.

Figure 2:
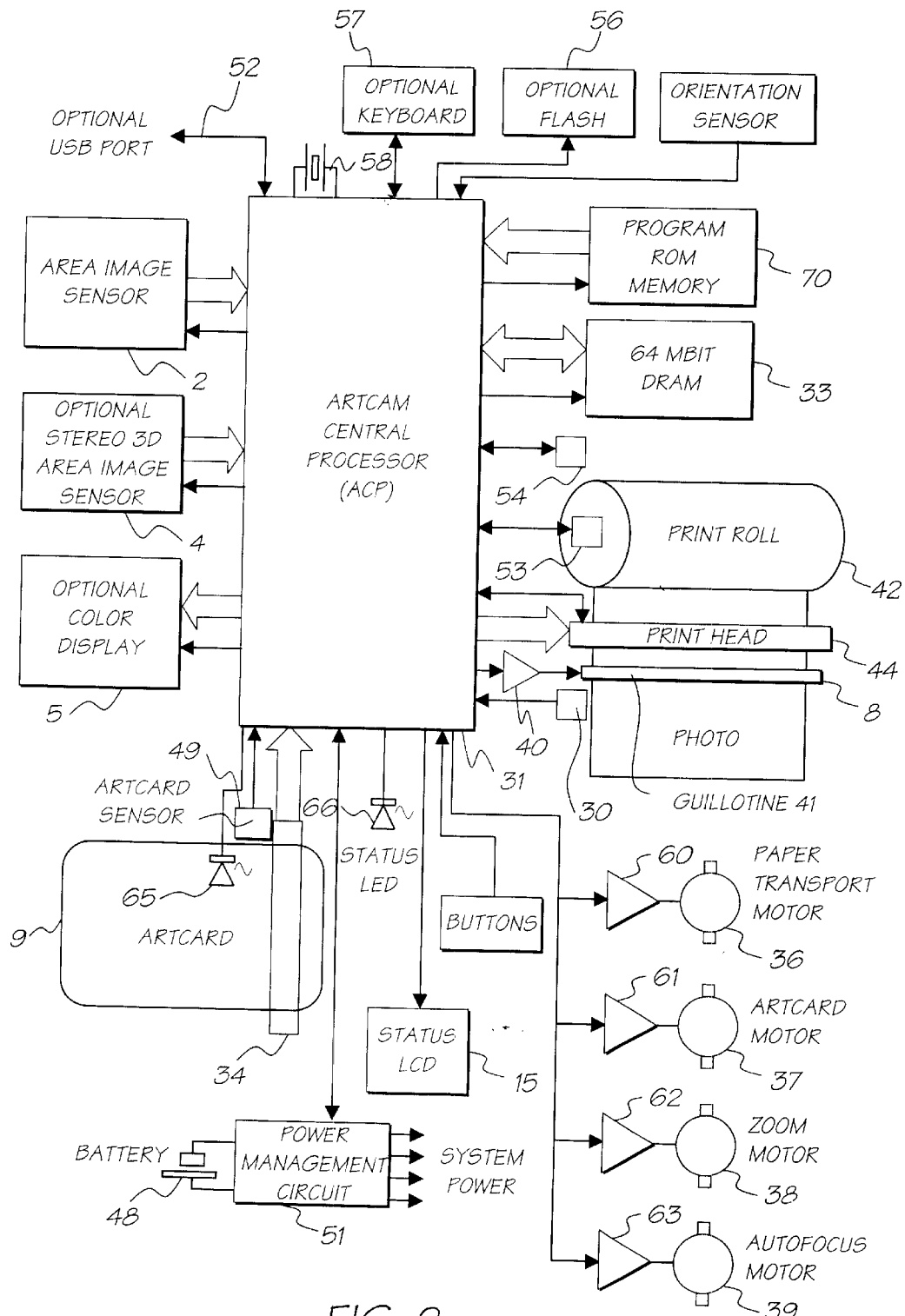
FIG. 2 is a schematic block diagram of the main Artcam electronic components.

Turning now to FIG. 2, there is illustrated a schematic view of the internal hardware of the camera unit 1. The internal hardware is based around an Artcam central processor unit (ACP) 31.

Artcam Central Processor 31

The Artcam central processor 31 provides many functions which form the 'heart' of the system. The ACP 31 is preferably implemented as a complex, high speed, CMOS system on-a-chip. Utilising standard cell design with some full custom regions is recommended. Fabrication on a $0.25\mu$ CMOS process will provide the density and speed required, along with a reasonably small die area.

The functions provided by the ACP 31 include:

1. Control and digitization of the area image sensor 2. A 3D stereoscopic version of the ACP requires two area image sensor interfaces with a second optional image sensor 4 being provided for stereoscopic effects.
2. Area image sensor compensation, reformatting, and image enhancement.
3. Memory interface and management to a memory store 33.
4. Interface, control, and analog to digital conversion of an Artcard reader linear image sensor 34 which is provided for the reading of data from the Artcards 9.
5. Extraction of the raw Artcard data from the digitized and encoded Artcard image.
6. Reed-Solomon error detection and correction of the Artcard encoded data. The encoded surface of the Artcard 9 includes information on how to process an image to produce the effects displayed on the image distorted surface of the Artcard 9. This information is in the form of a script, hereinafter known as a "Vark script". The Vark script is utilised by an interpreter running within the ACP 31 to produce the desired effect.
7. Interpretation of the Vark script on the Artcard 9.
8. Performing image processing operations as specified by the Vark script.
9. Controlling various motors for the paper transport 36, zoom lens 38, autofocus 39 and Artcard driver 37.
10. Controlling a guillotine actuator 40 for the operation of a guillotine 41 . for the cutting of photographs 8 from print roll 42.
11. Half-toning of the image data for printing.
12. Providing the print data to a print-head 44 at the appropriate times.
13. Controlling the print head 44.
14. Controlling the ink pressure feed to print-head 44.
15. Controlling optional flash unit 56.
16. Reading and acting on various sensors in the camera, including camera orientation sensor 46, autofocus 47 and Artcard insertion sensor 49.
17. Reading and acting on the user interface buttons 6, 13, 14.
18. Controlling the status display 15.
19. Providing viewfinder and preview images to the color display 5.
20. Control of the system power consumption, including the ACP power consumption via power management circuit 51.
21. Providing external communications 52 to general purpose computers (using part USB).
22. Reading and storing information in a printing roll authentication chip 53.
23. Reading and storing information in a camera authentication chip 54.
24. Communicating with an optional mini-keyboard 57 for text modification.

Quartz Crystal 58

A quartz crystal 58 is used as a frequency reference for the system clock. As the system clock is very high, the ACP 31 includes a phase locked loop clock circuit to increase the frequency derived from the crystal 58.

Image Sensing

Area Image Sensor 2

The area image sensor 2 converts an image through its lens into an electrical signal. It can either be a charge coupled device (CCD) or an active pixel sensor (APS) CMOS image sector. At present, available CCD's normally have a higher image quality, however, there is currently much development occurring in CMOS imagers. CMOS imagers are eventually expected to be substantially cheaper than CCD's have smaller pixel areas, and be able to incorporate drive circuitry and signal processing. They can also be made in CMOS fabs, which are transitioning to 12" wafers. CCD's are usually built in 6" wafer fabs, and economics may not allow a conversion to 12" fabs. Therefore, the difference in fabrication cost between CCD's and CMOS imagers is likely to increase, progressively favoring CMOS imagers. However, at present, a CCD is probably the best option.

The Artcam unit will produce suitable results with a 1,500×1,000 area image sensor. However, smaller sensors, such as 750×500, will be adequate for many markets. The Artcam is less sensitive to image sensor resolution than are conventional digital cameras. This is because many of the styles contained on Artcards 9 process the image in such a way as to obscure the lack of resolution. For example, if the image is distorted to simulate the effect of being converted to an impressionistic painting, low source image resolution can be used with minimal effect. Further examples for which low resolution input images will typically not be noticed include image warps which produce high distorted images, multiple miniature copies of the of the image (eg. passport photos), textural processing such as bump mapping for a base relief metal look, and photo-compositing into structured scenes.

This tolerance of low resolution image sensors may be a significant factor in reducing the manufacturing cost of an Artcam unit 1 camera. An Artcam with a low cost 750×500 image sensor will often produce superior results to a conventional digital camera with a much more expensive 1,500×1,000 image sensor.

Optional Stereoscopic 3D Image Sensor 4

The 3D versions of the Artcam unit 1 have an additional image sensor 4, for stereoscopic operation. This image sensor is identical to the main image sensor. The circuitry to drive the optional image sensor may be included as a standard part of the ACP chip 31 to reduce incremental design cost. Alternatively, a separate 3D Artcam ACP can be designed. This option will reduce the manufacturing cost of a mainstream single sensor Artcam.

Print Roll Authentication Chip 53

A small chip 53 is included in each print roll 42. This chip replaced the functions of the bar code, optical sensor and wheel, and ISO/ASA sensor on other forms of camera film units such as Advanced Photo Systems film cartridges.

The authentication chip also provides other features:

1. The storage of data rather than that which is mechanically and optically sensed from APS rolls
2. A remaining media length indication, accurate to high resolution.
3. Authentication Information to prevent inferior clone print roll copies.

The authentication chip 53 contains 1024 bits of Flash memory, of which 128 bits is an authentication key, and 512 bits is the authentication information. Also included is an encryption circuit to ensure that the authentication key cannot be accessed directly.

Print-head 44

The Artcam unit 1 can utilize any color print technology which is small enough, low enough power, fast enough, high enough quality, and low enough cost, and is compatible with the print roll. Relevant printheads will be specifically discussed hereinafter.

The specifications of the ink jet head are:

| | |
|---|---|
| Image type | Bi-level, dithered |
| Color | CMY Process Color |
| Resolution | 1600 dpi |
| Print head length | 'Page-width' (100 mm) |
| Print speed | 2 seconds per photo |

Optional Ink Pressure Controller (not Shown)

The function of the ink pressure controller depends upon the type of ink jet print head 44 incorporated in the Artcam. For some types of ink jet, the use of an ink pressure controller can be eliminated, as the ink pressure is simply atmospheric pressure. Other types of print head require a regulated positive ink pressure. In this case, the in pressure controller consists of a pump and pressure transducer.

Other print heads may require an ultrasonic transducer to cause regular oscillations in the ink pressure, typically at frequencies around 100 KHz. In the case, the ACP 31 controls the frequency phase and amplitude of these oscillations.

Paper Transport Motor 36

The paper transport motor 36 moves the paper from within the print roll 42 past the print head at a relatively constant rate. The motor 36 is a miniature motor geared down to an appropriate speed to drive rollers which move the paper. A high quality motor and mechanical gears are required to achieve high image quality, as mechanical rumble or other vibrations will affect the printed dot row spacing.

Paper Transport Motor Driver 60

The motor driver 60 is a small circuit which amplifies the digital motor control signals from the APC 31 to levels suitable for driving the motor 36.

Paper Pull Sensor

A paper pull sensor 50 detects a user's attempt to pull a photo from the camera unit during the printing process. The APC 31 reads this sensor 50, and activates the guillotine 41 if the condition occurs. The paper pull sensor 50 is incorporated to make the camera more 'foolproof' in operation. Were the user to pull the paper out forcefully during printing, the print mechanism 44 or print roll 42 may (in extreme cases) be damaged. Since it is acceptable to pull out the 'pod' from a Polaroid type camera before it is fully ejected, the public has been 'trained' to do this. Therefore, they are unlikely to heed printed instructions not to pull the paper.

The Artcam preferably restarts the photo print process after the guillotine 41 has cut the paper after pull sensing.

The pull sensor can be implemented as a strain gauge sensor, or as an optical sensor detecting a small plastic flag which is deflected by the torque that occurs on the paper drive rollers when the paper is pulled. The latter implementation is recommendation for low cost.

Paper Guillotine Actuator 40

The paper guillotine actuator 40 is a small actuator which causes the guillotine 41 to cut the paper either at the end of a photograph, or when the paper pull sensor 50 is activated.

The guillotine actuator 40 is a small circuit which amplifies a guillotine control signal from the APC tot the level required by the actuator 41.

Artcard 9

The Artcard 9 is a program storage medium for the Artcam unit. As noted previously, the programs are in the form of Vark scripts. Vark is a powerful image processing language especially developed for the Artcam unit. Each Artcard 9 contains one Vark script, and thereby defines one image processing style.

Preferably, the VARK language is highly image processing specific. By being highly image processing specific, the amount of storage required to store the details on the card are substantially reduced. Further, the ease with which new programs can be created, including enhanced effects, is also substantially increased. Preferably, the language includes facilities for handling many image processing functions including image warping via a warp map, convolution, color lookup tables, posterizing an image, adding noise to an image, image enhancement filters, painting algorithms, brush jittering and manipulation edge detection filters, tiling, illumination via light sources, bump maps, text, face detection and object detection attributes, fonts, including three dimensional fonts, and arbitrary complexity pre-rendered icons. Further details of the operation of the Vark language interpreter are contained hereinafter.

Hence, by utilizing the language constructs as defined by the created language, new affects on arbitrary images can be created and constructed for inexpensive storage on Artcard and subsequent distribution to camera owners. Further, on one surface of the card can be provided an example illustrating the effect that a particular VARK script, stored on the other surface of the card, will have on an arbitrary captured image.

By utilizing such a system, camera technology can be distributed without a great fear of obsolescence in that, provided a VARK interpreter is incorporated in the camera device, a device independent scenario is provided whereby the underlying technology can be completely varied over time. Further, the VARK scripts can be updated as new filters are created and distributed in an inexpensive manner, such as via simple cards for card reading.

The Artcard 9 is a piece of thin white plastic with the same format as a credit card (86 mm long by 54 mm wide). The Artcard is printed on both sides using a high resolution ink jet printer. The inkjet printer technology is assumed to be the same as that used in the Artcam, with 1600 dpi (63 dpmm) resolution. A major feature of the Artcard 9 is low manufacturing cost. Artcards can be manufactured at high speeds as a wide web of plastic film. The plastic web is coated on both sides with a hydrophilic dye fixing layer. The web is printed simultaneously on both sides using a 'pagewidth' color ink jet printer. The web is then cut and punched into individual cards. On one face of the card is printed a human readable representation of the effect the Artcard 9 will have on the sensed image. This can be simply a standard image which has been processed using the Vark script stored on the back face of the card.

On the back face of the card is printed an array of dots which can be decoded into the Vark script that defines the image processing sequence. The print area is 80 mm×50 mm, giving a total of 15,876,000 dots. This array of dots could represent at least 1.89 Mbytes of data. To achieve high reliability, extensive error detection and correction is incorporated in the array of dots. This allows a substantial portion of the card to be defaced, worn, creased, or dirty with no effect on data integrity. The data coding used is Reed- Solomon coding, with half of the data devoted to error correction. This allows the storage of 967 Kbytes of error corrected data on each Artcard 9.

Linear Image Sensor 34

The Artcard linear sensor 34 converts the aforementioned Artcard data image to electrical signals. As with the area image sensor 2, 4, the linear image sensor can be fabricated using either CCD or APS CMOS technology. The active length of the image sensor 34 is 50 mm, equal to the width of the data array on the Artcard 9. To satisfy Nyquist's sampling theorem, the resolution of the linear image sensor 34 must be at least twice the highest spatial frequency of the Artcard optical image reaching the image sensor. In practice, data detection is easier if the image sensor resolution is substantially above this. A resolution of 4800 dpi (189 dpmm) is chosen, giving a total of 9,450 pixels. This resolution requires a pixel sensor pitch of 5.3 $\mu$m. This can readily be achieved by using four staggered rows of 20 $\mu$m pixel sensors.

The linear image sensor is mounted in a special package which includes a LED 65 to illuminate the Artcard 9 via a light-pipe (not shown).

The Artcard reader light-pipe can be a molded light-pipe which has several function:

1. It diffuses the light from the LED over the width of the card using total internal reflection facets.
2. It focuses the light onto a 16 $\mu$m wide strip of the Artcard 9 using an integrated cylindrical lens.
3. It focuses light reflected from the Artcard onto the linear image sensor pixels using a molded array of microlenses.

The operation of the Artcard reader is explained further hereinafter.

Artcard Reader Motor 37

The Artcard reader motor propels the Artcard past the linear image sensor 34 at a relatively constant rate. As it may not be cost effective to include extreme precision mechanical components in the Artcard reader, the motor 37 is a standard miniature motor geared down to an appropriate speed to drive a pair of rollers which move the Artcard 9. The speed variations, rumble, and other vibrations will affect the raw image data as circuitry within the APC 31 includes extensive compensation for these effects to reliably read the Artcard data.

The motor 37 is driven in reverse when the Artcard is to be ejected.

Artcard Motor Driver 61

The Artcard motor driver 61 is a small circuit which amplifies the digital motor control signals from the APC 31 to levels suitable for driving the motor 37.

Card Insertion Sensor 49

The card insertion sensor 49 is an optical sensor which detects the presence of a card as it is being inserted in the card reader 34. Upon a signal from this sensor 49, the APC 31 initiates the card reading process, including the activation of the Artcard reader motor 37.

Card Eject Button 16

A card eject button 16 (FIG. 1) is used by the user to eject the current Artcard, so that another Artcard can be inserted. The APC 31 detects the pressing of the button, and reverses the Artcard reader motor 37 to eject the card.

Card Status Indicator 66

A card status indicator 66 is provided to signal the user as to the status of the Artcard reading process. This can be a standard bi-color (red/green) LED. When the card is successfully read, and data integrity has been verified, the LED lights up green continually. If the card is faulty, then the LED lights up red.

If the camera is powered from a 1.5 V instead of 3V battery, then the power supply voltage is less than the forward voltage drop of the greed LED, and the LED will not light. In this case, red LEDs can be used, or the LED can be powered from a voltage pump which also powers other circuits in the Artcam which require higher voltage.

64 Mbit DRAM 33

To perform the wide variety of image processing effects, the camera utilizes 8 Mbytes of memory 33. This can be provided by a single 64 Mbit memory chip. Of course, with changing memory technology increased Dram storage sizes may be substituted.

High speed access to the memory chip is required. This can be achieved by using a Rambus DRAM (burst access rate of 500 Mbytes per second) or chips using the new open standards such as double data rate (DDR) SDRAM or Synclink DRAM.

Camera Authentication Chip

The camera authentication chip 54 is identical to the print roll authentication chip 53, except that it has different information stored in it. The camera authentication chip 54 has three main purposes:

1. To provide a secure means of comparing authentication codes with the print roll authentication chip;
2. To provide storage for manufacturing information, such as the serial number of the camera;
3. To provide a small amount of non-volatile memory for storage of user information.

Displays

The Artcam includes an optional color display 5 and small status display 15. Lowest cost consumer cameras may include a color image display, such as a small TFT LCD 5 similar to those found on some digital cameras and camcorders. The color display 5 is a major cost element of these versions of Artcam, and the display 5 plus back light are a major power consumption drain.

Status Display 15

The status display 15 is a small passive segment based LCD, similar to those currently provided on silver halide and digital cameras. Its main function is to show the number of prints remaining in the print roll 42 and icons for various standard camera features, such as flash and battery status.

Color Display 5

The color display 5 is a full motion image display which operates as a viewfinder, as a verification of the image to be printed, and as a user interface display. The cost of the display 5 is approximately proportional to its area, so large displays (say 4" diagonal) unit will be restricted to expensive versions of the Artcam unit. Smaller displays, such as color camcorder viewfinder TFT's at around 1", may be effective for mid-range Artcams.

Zoom Lens (not Shown)

The Artcam can include a zoom lens. This can be a standard electronically controlled zoom lens, identical to one which would be used on a standard electronic camera, and similar to pocket camera zoom lenses. A referred version of the Artcam unit may include standard interchangeable 35 mm SLR lenses.

Autofocus Motor 39

The autofocus motor 39 changes the focus of the zoom lens. The motor is a miniature motor geared down to an appropriate speed to drive the autofocus mechanism.

Autofocus Motor Driver 63

The autofocus motor driver 63 is a small circuit which amplifies the digital motor control signals from the APC 31 to levels suitable for driving the motor 39.

Zoom Motor 38

The zoom motor 38 moves the zoom front lenses in and out. The motor is a miniature motor geared down to an appropriate speed to drive the zoom mechanism.

Zoom Motor Driver 62

The zoom motor driver 62 is a small circuit which amplifies the digital motor control signals from the APC 31 to levels suitable for driving the motor.

Communications

The ACP 31 contains a universal serial bus (USB) interface 52 for communication with personal computers. Not all Artcam models are intended to include the USB connector. However, the silicon area required for a USB circuit 52 is small, so the interface can be included in the standard ACP.

Optional Keyboard 57

The Artcam unit may include an optional miniature keyboard 57 for customizing text specified by the Artcard. Any text appearing in an Artcard image may be editable, even if it is in a complex metallic 3D font. The miniature keyboard includes a single line alphanumeric LCD to display the original text and edited text. The keyboard may be a standard accessory.

The ACP 31 contains a serial communications circuit for transferring data to and from the miniature keyboard.

Power Supply

The Artcam unit uses a battery 48. Depending upon the Artcam options, this is either a 3V Lithium cell, 1.5 V AA alkaline cells, or other battery arrangement.

Power Management Unit 51

Power consumption is an important design constraint in the Artcam. It is desirable that either standard camera batteries (such as 3V lithium batteries) or standard AA or AAA alkaline cells can be used. While the electronic complexity of the Artcam unit is dramatically higher than 35 mm photographic cameras, the power consumption need not be commensurately higher. Power in the Artcam can be carefully managed with all unit being turned off when not in use.

The most significant current drains are the ACP 31, the area image sensors 2,4, the printer 44 various motors, the flash unit 56, and the optional color display 5 dealing with each part separately:

1. ACP: If fabricated using 0.25 $\mu$m CMOS, and running on 1.5V, the ACP power consumption can be quite low. Clocks to various parts of the ACP chip can be quite low. Clocks to various parts of the ACP chip can be turned off when not in use, virtually eliminating standby current consumption. The ACP will only fully used for approximately 4 seconds for each photograph printed.
2. Area image sensor: power is only supplied to the area image sensor when the user has their finger on the button.
3. The printer power is only supplied to the printer when actually printing. This is for around 2 seconds for each photograph. Even so, suitably lower power consumption printing should be used.
4. The motors required in the Artcam are all low power miniature motors, and are typically only activated for a few seconds per photo.
5. The flash unit 45 is only used for some photographs. Its power consumption can readily be provided by a 3V lithium battery for a reasonably battery life.
6. The optional color display 5 is a major current drain for two reasons: it must be on for the whole time that the camera is in use, and a backlight will be required if a liquid crystal display is used. Cameras which incorporate a color display will require a larger battery to achieve acceptable battery life.

Flash Unit 56

The flash unit 56 can be a standard miniature electronic flash for consumer cameras.

Overview of the ACP 31

Figure 3:
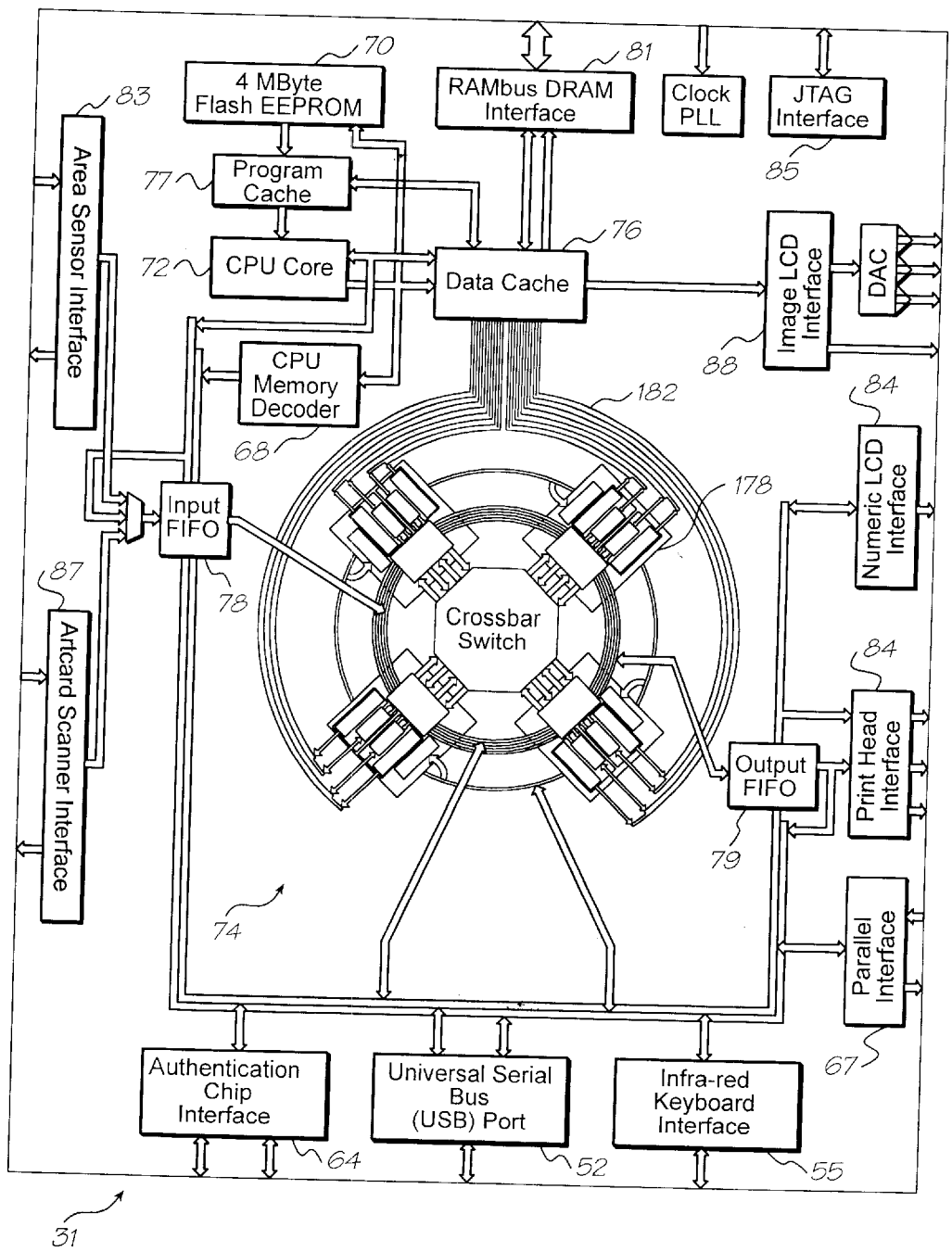
FIG. 3 is a schematic block diagram of the Artcam Central Processor.

FIG. 3 illustrates the Artcam Central Processor (ACP) 31 in more detail. The Artcam Central Processor provides all of the processing power for Artcam. It is designed for a 0.25 micron CMOS process, with approximately 1.5 million transistors and an area of around 50 mm$^2$. The ACP 31 is a complex design, but design effort can be reduced by the use of datapath compilation techniques, macrocells, and IP cores. The ACP 31 contains:

A RISC CPU core 72

A 4 way parallel VLIW Vector Processor 74

A Direct RAMbus interface 81

A CMOS image sensor interface 83

A CMOS linear image sensor interface 88

A USB serial interface 52

An infrared keyboard interface 55

A numeric LCD interface 84, and

A color TFT LCD interface 88

A 4Mbyte Flash memory 70 for program storage 70

The RISC CPU, Direct RAMbus interface 81, CMOS sensor interface 83 and USB serial interface 52 can be vendor supplied cores. The ACP 31 is intended to run at a clock speed of 200 MHz on 3V externally and 1.5V internally to minimize power consumption. The CPU core needs only to run at 100 MHz. The following two block diagrams give two views of the ACP 31:

A view of the ACP 31 in isolation An example Artcam showing a high-level view of the ACP 31 connected to the rest of the Artcam hardware.

Image Access

As stated previously, the DRAM Interface 81 is responsible for interfacing between other client portions of the ACP chip and the RAMBUS DRAM. In effect, each module within the DRAM Interface is an address generator.

There are three logical types of images manipulated by the ACP. They are:

CCD Image, which is the Input Image captured from the CCD.

Internal Image format—the Image format utilised internally by the Artcam device.

Print Image—the Output Image format printed by the Artcam.

These images are typically different in color space, resolution, and the output & input color spaces which can vary from camera to camera. For example, a CCD image on a low-end camera may be a different resolution, or have different color characteristics from that used in a high-end camera. However all internal image formats are the same format in terms of color space across all cameras.

In addition, the three image types can vary with respect to which direction is 'up'. The physical orientation of the camera causes the notion of a portrait or landscape image, and this must be maintained throughout processing. For this reason, the internal image is always oriented correctly, and rotation is performed on images obtained from the CCD and during the print operation.

CPU Core (CPU) 72

The ACP 31 incorporates a 32 bit RISC CPU 72 to run the Vark image processing language interpreter and to perform Artcam's general operating system duties. A wide variety of CPU cores are suitable: it can be any processor core with sufficient processing power to perform the required core calculations and control functions fast enough to met consumer expectations. Examples of suitable cores are: MIPS R4000 core from LSI Logic, StrongARM core. There is no need to maintain instruction set continuity between different Artcam models. Artcard compatibility is maintained irrespective of future processor advances and changes, because the Vark interpreter is simply re-compiled for each new instruction set. The ACP 31 architecture is therefore also free to evolve. Different ACP 31 chip designs may be fabricated by different manufacturers, without requiring to license or port the CPU core. This device independence avoids the chip vendor lock-in such as has occurred in the PC market with Intel. The CPU operates at 100 MHz, with a single cycle time of 10 ns. It must be fast enough to run the Vark interpreter, although the VLIW Vector Processor 74 is responsible for most of the time-critical operations.

Program Cache 72

Although the program code is stored in on-chip Flash memory 70, it is unlikely that well packed Flash memory 70 will be able to operate at the 10 ns cycle time required by the CPU. Consequently a small cache is required for good performance. 16 cache lines of 32 bytes each are sufficient, for a total of 512 bytes. The program cache 72 is defined in the chapter entitled Program cache 72.

Data Cache 76

A small data cache 76 is required for good performance. This requirement is mostly due to the use of a RAMbus DRAM, which can provide high-speed data in bursts, but is inefficient for single byte accesses. The CPU has access to a memory caching system that allows flexible manipulation of CPU data cache 76 sizes. A minimum of 16 cache lines (512 bytes) is recommended for good performance.

CPU Memory Model

An Artcam's CPU memory model consists of a 32 MB area. It consists of 8 MB of physical RDRAM off-chip in the base model of Artcam, with provision for up to 16 MB of off-chip memory. There is a 4 MB Flash memory 70 on the ACP 31 for program storage, and finally a 4 MB address space mapped to the various registers and controls of the ACP 31. The memory map then, for an Artcam is as follows:

| Contents | Size |
| --- | --- |
| Base Artcam DRAM | 8 MB |
| Extended DRAM | 8 MB |
| Program memory (on ACP 31 in Flash memory 70) | 4 MB |
| Reserved for extension of program memory | 4 MB |
| ACP 31 registers and memory-mapped I/O | 4 MB |
| Reserved | 4 MB |
| TOTAL | 32 MB |

A straightforward way of decoding addresses is to use address bits 23–24:

If bit 24 is clear, the address is in the lower 16-MB range, and hence can be satisfied from DRAM and the Data cache 76. In most cases the DRAM will only be 8 MB, but 16 MB is allocated to cater for a higher memory model Artcams.

If bit 24 is set, and bit 23 is clear, then the address represents the Flash memory 70 4 Mbyte range and is satisfied by the Program cache 72.

If bit 24=1 and bit 23=1, the address is translated into an access over the low speed bus to the requested component in the AC by the CPU Memory Decoder 68.

Flash Memory 70

The ACP 31 contains a 4 Mbyte Flash memory 70 for storing the Artcam program. It is envisaged that Flash memory 70 will have denser packing coefficients than masked ROM, and allows for greater flexibility for testing camera program code. The downside of the Flash memory 70 is the access time, which is unlikely to be fast enough for the 100 MHz operating speed (10 ns cycle time) of the CPU. A fast Program Instruction cache 77 therefore acts as the interface between the CPU and the slower Flash memory 70.

Program Cache 72

A small cache is required for good CPU performance. This requirement is due to the slow speed Flash memory 70 which stores the Program code. 16 cache lines of 32 bytes each are sufficient, for a total of 512 bytes. The Program cache 72 is a read only cache. The data used by CPU programs comes through the CPU Memory Decoder 68 and if the address is in DRAM, through the general Data cache 76. The separation allows the CPU to operate independently of the VLIW Vector Processor 74. If the data requirements are low for a given process, it can consequently operate completely out of cache.

Finally, the Program cache 72 can be read as data by the CPU rather than purely as program instructions. This allows tables, microcode for the VLIW etc to be loaded from the Flash memory 70. Addresses with bit 24 set and bit 23 clear are satisfied from the Program cache 72.

CPU Memory Decoder 68

The CPU Memory Decoder 68 is a simple decoder for satisfying CPU data accesses. The Decoder translates data addresses into internal ACP register accesses over the internal low speed bus, and therefore allows for memory mapped I/O of ACP registers. The CPU Memory Decoder 68 only interprets addresses that have bit 24 set and bit 23 clear. There is no caching in the CPU Memory Decoder 68.

DRAM Interface 81

The DRAM used by the Artcam is a single channel 64 Mbit (8 MB) RAMbus RDRAM operating at 1.6 GB/sec. RDRAM accesses are by a single channel (16-bit data path) controller. The RDRAM also has several useful operating modes for low power operation. Although the Rambus specification describes a system with random 32 byte transfers as capable of achieving a greater than 95% efficiency, this is not true if only part of the 32 bytes are used. Two reads followed by two writes to the same device yields over 86% efficiency. The primary latency is required for bus turn-around going from a Write to a Read, and since there is a Delayed Write mechanism, efficiency can be further improved. With regards to writes, Write Masks allow specific subsets of bytes to be written to. These write masks would be set via internal cache. "dirty bits". The upshot of the Rambus Direct RDRAM is a throughput of >1 GB/sec is easily achievable, and with multiple reads for every write (most processes) combined with intelligent algorithms making good use of 32 byte transfer knowledge, transfer rates of >1.3 GB/sec are expected. Every 10 ns, 16 bytes can be transferred to or from the core.

DRAM Organization

The DRAM organization for a base model (8 MB RDRAM) Artcam is as follows:

| Contents | Size |
| --- | --- |
| Program scratch RAM | 0.50 MB |
| Artcard data | 1.00 MB |
| Photo Image; captured from CMOS Sensor | 0.50 MB |
| Print Image (compressed) | 2.25 MB |
| 1 Channel of expanded Photo Image | 1.50 MB |

-continued

| Contents | Size |
| --- | --- |
| 1 Image Pyramid of single channel | 1.00 MB |
| Intermediate Image Processing | 1.25 MB |
| TOTAL | 8 MB |

Notes
  Uncompressed, the Print Image requires 4.5 MB (1.5 MB per channel). To accommodate other objects in the 8 MB model, the Print Image needs to be compressed. If the chrominance channels are compressed by 4:1 they require only 0.375 MB each).
  The memory model described here assumes a single 8 MB RDRAM. Other models of the Artcam may have more memory, and thus not require compression of the Print Image. In addition, with more memory a larger part of the final image can be worked on at once, potentially giving a speed improvement.
  Note that ejecting or inserting an Artcard invalidates the 5.5 MB area holding the Print Image, 1 channel of expanded photo image, and the image pyramid. This space may be safely used by the Artcard Interface for decoding the Artcard data.

Data Cache 76

The ACP 31 contains a dedicated CPU instruction cache 77 and a general data cache 76. The Data cache 76 handles all DRAM requests (reads and writes of data) from the CPU, the VLIW vector Processor 74, and the Display Controller 88. These requests may have very different profiles in terms of memory usage and algorithmic timing requirements. For example, a VLIW process may be processing an image in linear memory, and lookup a value in a table for each value in the image. There is little need to cache much of the image, but it may be desirable to cache the entire lookup table so that no real memory access is required. Because of these differing requirements, the Data cache 76 allows for an intelligent definition of caching. Although the Rambus DRAM interface 81 is capable of very high-speed memory access (an average throughput of 32 bytes in 25 ns); it is not efficient dealing with single byte requests. In order to reduce effective memory latency, the ACP 31 contains 128 cache lines. Each cache line is 32 bytes wide. Thus the total amount of data cache 76 is 4096 bytes (4 KB). The 128 cache lines are configured into 16 programmable-sized groups. Each of the 16 groups must be a contiguous set of cache lines. The CPU is responsible for determining how many cache lines to allocate to each group. Within each group cache lines are filled according to a simple Least Recently Used algorithm. In terms of CPU data requests, the Data cache 76 handles memory access requests that have address bit 24 clear. If bit 24 is clear, the address is in the lower 16 MB range, and hence can be satisfied from DRAM and the Data cache 76. In most cases the DRM will only be 8 MB, but 16 MB is allocated to cater for a higher memory model Artcam. If bit 24 is set, the address is ignored by the Data cache 76.

All CPU data requests are satisfied from Cache Group 0. A minimum of 16 cache lines is recommended for good CPU performance, although the CPU can assign any number of cache lines (except none) to Cache Group 0. The remaining Cache Groups (1 to 15) are allocated according to the current requirements. This could mean allocation to a VLIW Vector Processor 74 program or the Display Controller 88. For example, a 256 byte lookup table required to be permanently available would require 8 cache lines. Writing out a sequential image would only require 2–4 cache lines (depending on the size of record being generated and whether write requests are being Write Delayed for a significant number of cycles). Associated with each cache line byte is a dirty bit, used for creating a Write Mask when writing memory to DRAM. Associated with each cache line is another dirty bit, which indicates whether any of the cache line bytes has been written to (and therefore the cache line must be written back to DRAM before it can be reused). Note that it is possible for two different Cache Groups to be accessing the same address in memory and to get out of sync. The VLIW program writer is responsible to ensure that this is not an issue. It could be perfectly reasonable, for example, to have a Cache Group responsible for reading an image, and another Cache Group responsible for writing the changed image back to memory again. If the images are read or written sequentially there may be advantages in allocating cache lines in this manner. A total of 8 buses 182 connect the VLIW Vector Processor 74 to the Data cache 76. Each bus is connected to an I/O Address Generator. (There are 2 I/O Address Generators 189, 190 per Processing Unit 178, and there are 4 Processing Units in the VLIW Vector Processor 74. The total number of buses is therefore 8.)

In any given cycle, in addition to a single 32 bit (4 byte) access to the CPU's cache group (Group 0), 4 simultaneous accesses of 16 bits (2 bytes) to remaining cache groups are permitted on the 8 VLIW Vector Processor 74 buses. The Data cache 76 is responsible for fairly processing the requests. On a given cycle, no more than 1 request to a specific Cache Group will be processed. Given that there are 8 Address Generators 189, 190 in the VLIW Vector Processor 74, each one of these has the potential to refer to an individual Cache Group. However it is possible and occasionally reasonable for 2 or more Address Generators 189, 190 to access the same Cache Group. The CPU is responsible for ensuring that the Cache Groups have been allocated the correct number of cache lines, and that the various Address Generators 189, 190 in the VLIW Vector Processor 74 reference the specific Cache Groups correctly. The Data cache 76 as described allows for the Display Controller 88 and VLIW Vector Processor 74 to be active simultaneously. If the operation of these two components were deemed to never occur simultaneously, a total 9 Cache Groups would suffice. The CPU would use Cache Group 0, and the VLIW Vector Processor 74 and the Display Controller 88 would share the remaining 8 Cache Groups, requiring only 3 bits (rather than 4) to define which Cache Group would satisfy a particular request.

JTAG Interface 85

A standard JTAG (Joint Test Action Group) Interface is included in the ACP 31 for testing purposes. Due to the complexity of the chip, a variety of testing techniques are required, including BIST (Built In Self Test) and functional block isolation. An overhead of 10% in chip area is assumed for overall chip testing circuitry. The test circuitry is beyond the scope of this document.

Serial Interfaces

USB Serial Port Interface 52

This is a standard USB serial port, which is connected to the internal chip low speed bus, thereby allowing the CPU to control it.

Keyboard Interface 65

This is a standard low-speed serial port, which is connected to the internal chip low speed bus, thereby allowing the CPU to control it. It is designed to be optionally connected to a keyboard to allow simple data input to customize prints.

Authentication Chip Serial Interfaces 64

These are 2 standard low-speed serial ports, which are connected to the internal chip low speed bus, thereby allowing the CPU to control them. The reason for having 2 ports is to connect to both the on-camera Authentication chip, and to the print-roll Authentication chip using separate lines. Only using 1 line may make it possible for a clone print-roll manufacturer to design a chip which, instead of generating an authentication code, tricks the camera into using the code generated by the authentication chip in the camera.

Parallel Interface 67

The parallel interface connects the ACP 31 to individual static electrical signals. The CPU is able to control each of these connections as memory-mapped I/O via the low speed bus. The following table is a list of connections to the parallel interface:

| Connection | Direction | Pins |
|---|---|---|
| Paper transport stepper motor | Out | 4 |
| Artcard stepper motor | Out | 4 |
| Zoom stepper motor | Out | 4 |
| Guillotine motor | Out | 1 |
| Flash trigger | Out | 1 |
| Status LCD segment drivers | Out | 7 |
| Status LCD common drivers | Out | 4 |
| Artcard illumination LED | Out | 1 |
| Artcard status LED (red/green) | In | 2 |
| Artcard sensor | In | 1 |
| Paper pull sensor | In | 1 |
| Orientation sensor | In | 2 |
| Buttons | In | 4 |
| | TOTAL | 36 |

VLIW Input and Output FIFOs 78, 79

The VLIW Input and Output FIFOs are 8 bit wide FIFOs used for communicating between processes and the VLIW Vector Processor 74. Both FIFOs are under the control of the VLIW Vector Processor 74, but can be cleared and queried (e.g. for status) etc by the CPU.

VLIW Input FIFO 78

A client writes 8-bit data to the VLIW Input FIFO 78 in order to have the data processed by the VLIW Vector Processor 74. Clients include the Image Sensor Interface, Artcard Interface, and CPU. Each of these processes is able to offload processing by simply writing the data to the FIFO, and letting the VLIW Vector Processor 74 do all the hard work. An example of the use of a client's use of the VLIW Input FIFO 78 is the Image Sensor Interface (ISI 83). The ISI 83 takes data from the Image Sensor and writes it to the FIFO. A VLIW process takes it from the FIFO, transforming it into the correct image data format, and writing it out to DRAM. The ISI 83 becomes much simpler as a result.

VLIW Output FIFO 79

The VLIW Vector Processor 74 writes 8-bit data to the VLIW Output FIFO 79 where clients can read it. Clients include the Print Head Interface and the CPU. Both of these clients is able to offload processing by simply reading the already processed data from the FIFO, and letting the VLIW Vector Processor 74 do all the hard work. The CPU can also be interrupted whenever data is placed into the VLIW Output FIFO 79, allowing it to only process the data as it becomes available rather than polling the FIFO continuously. An example of the use of a client's use of the VLIW Output FIFO 79 is the Print Head Interface (PHI 62). A VLIW process takes an image, rotates it to the correct orientation, color converts it, and dithers the resulting image according to the print head requirements. The PHI 62 reads the dithered formatted 8-bit data from the VLIW Output FIFO 79 and simply passes it on to the Print Head external to the ACP 31. The PHI 62 becomes much simpler as a result.

VLIW Vector Processor 74

To achieve the high processing requirements of Artcam, the ACP 31 contains a VLIW (Very Long Instruction Word) Vector Processor. The VLIW processor is a set of 4 identical Processing Units (PU e.g. 178) working in parallel, connected by a crossbar switch 183. Each PU e.g 178 can perform four 8-bit multiplications, eight 8-bit additions, three 32-bit additions, I/O processing, and various logical operations in each cycle. The PUs e.g 178 are microcoded, and each has two Address Generators 189, 190 to allow full use of available cycles for data processing. The four PUs e.g 178 are normally synchronized to provide a tightly interacting VLIW processor. Clocking at 200 MHz, the VLIW Vector Processor 74 runs at 12 Gops (12 billion operations per second). Instructions are tuned for image processing functions such as warping, artistic brushing, complex synthetic illumination, color transforms, image filtering, and compositing. These are accelerated by two orders of magnitude over desktop computers.

Figure 3A:
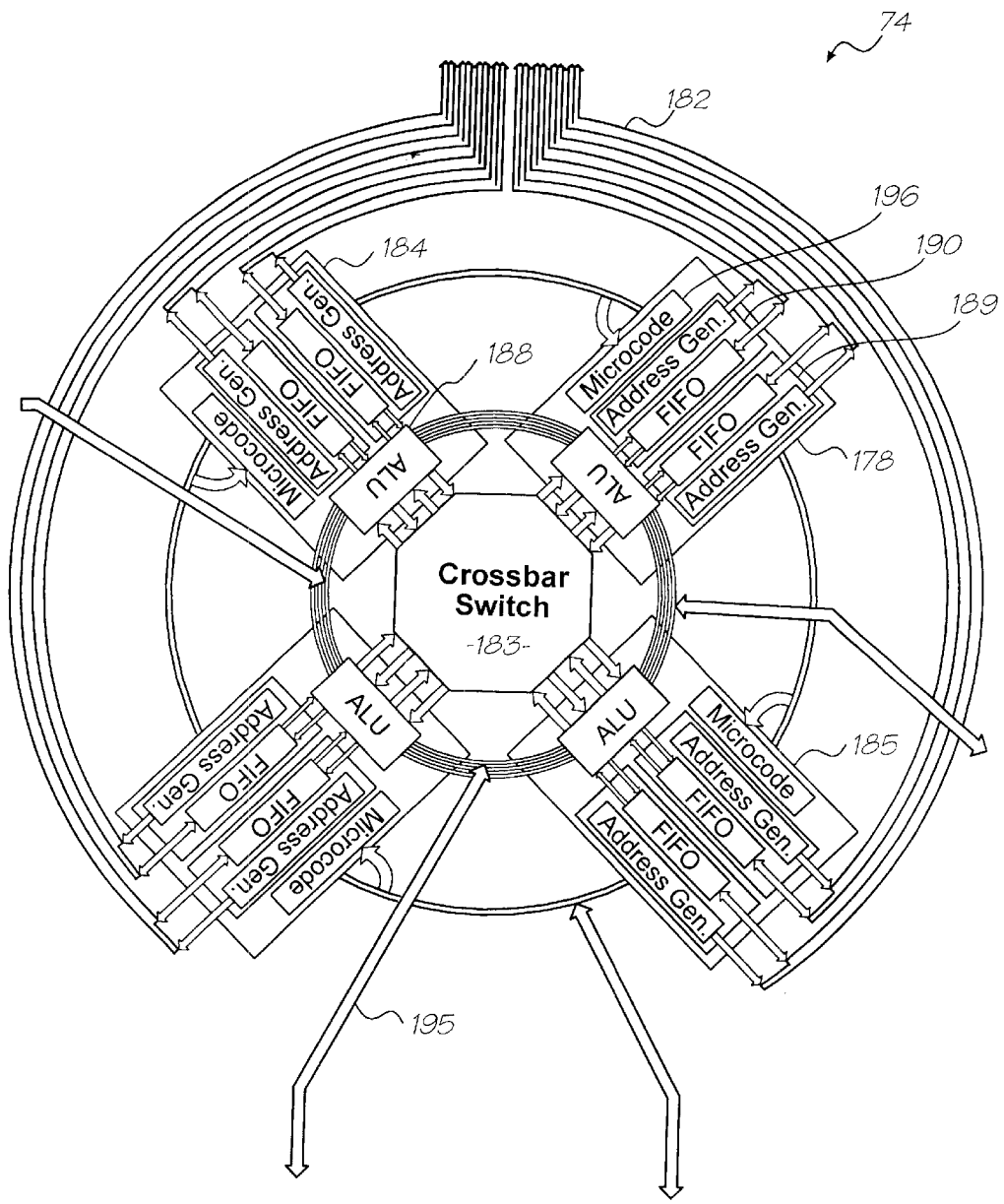
FIG. 3(a) illustrates the VLIW Vector Processor in more detail.

As shown in more detail in FIG. 3(a), the VLIW Vector Processor 74 is 4 PUs e.g 178 connected by a crossbar switch 183 such that each PU e.g 178 provides two inputs to, and takes two outputs from, the crossbar switch 183. Two common registers form a control and synchronization mechanism for the PUs e.g 178. 8 Cache buses 182 allow connectivity to DRAM via the Data cache 76, with 2 buses going to each PU e.g 178 (1 bus per I/O Address Generator).

Figure 4:
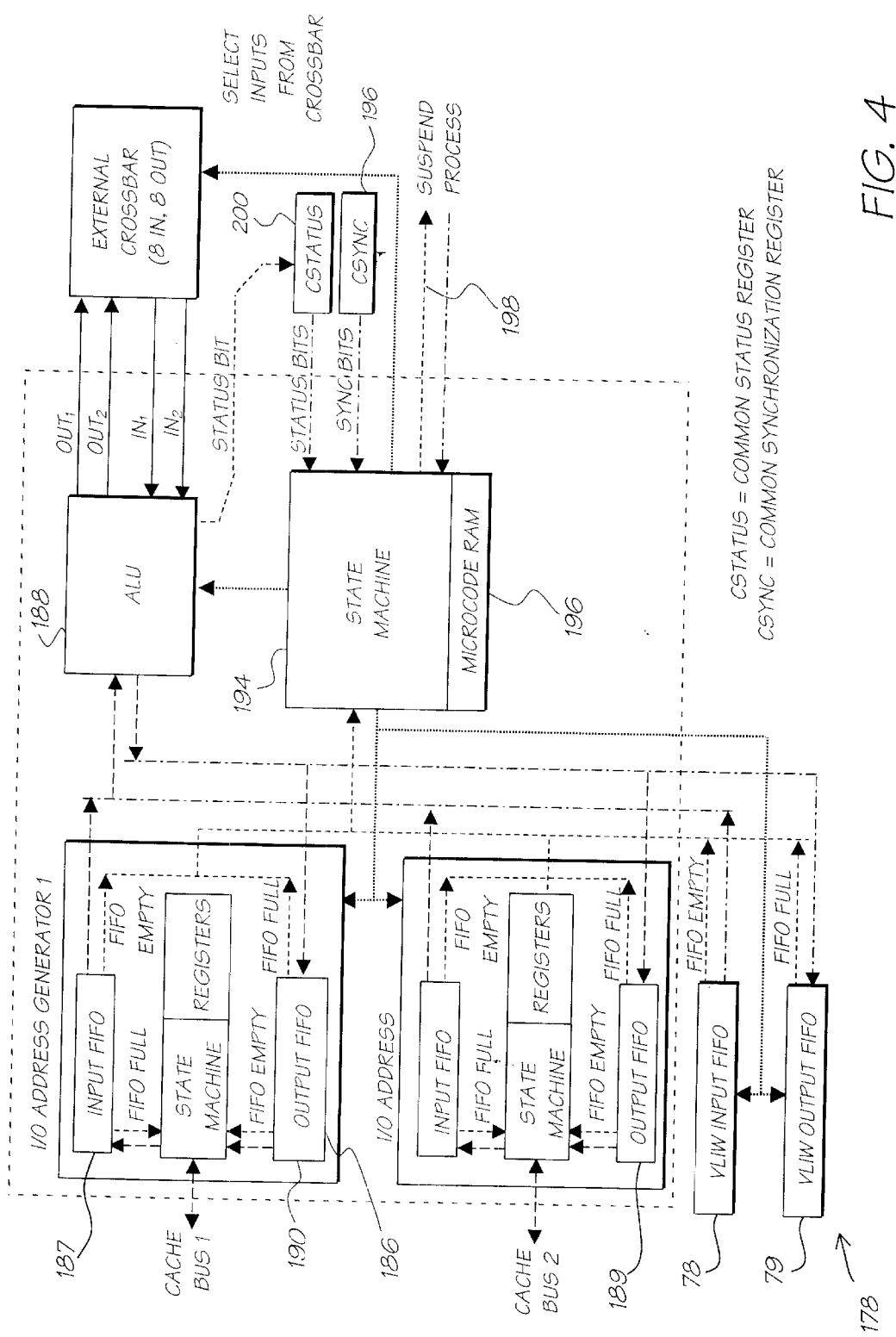
FIG. 4 illustrates the Processing Unit in more detail.

Each PU e.g 178 consists of an ALU 188 (containing a number of registers & some arithmetic logic for processing data), some microcode RAM 196, and connections to the outside world (including other ALUs). A local PU state machine runs in microcode and is the means by which the PU e.g 178 is controlled. Each PU e.g 178 contains two I/O Address Generators 189, 190 controlling data flow between DPAM (via the Data cache 76) and the ALU 188 (via Input FIFO and Output FIFO). The address generator is able to read and write data (specifically images in a variety of formats) as well as tables and simulated FIFOs in DRAM. The formats are customizable under software control, but are not microcoded. Data taken from the Data cache 76 is transferred to the ALU 188 via the 16-bit wide Input FIFO. Output data is written to the 16-bit wide Output FIFO and from there to the Data cache 76. Finally, all PUs e.g 178 share a single 8-bit wide VLIW Input FIFO 78 and a single 8-bit wide VLIW Output FIFO 79. The low speed data bus connection allows the CPU to read and write registers in the PU e.g 178, update microcode, as well as the common registers shared by all PUs e.g 178 in the VLIW Vector Processor 74. Turning now to FIG. 4, a closer detail of the internals of a single PU e.g 178 can be seen, with components and control signals detailed in subsequent hereinafter:

Microcode

Each PU e.g 178 contains a microcode RAM 196 to hold the program for that particular PU e.g 178. Rather than have the microcode in ROM, the microcode is in RAM, with the CPU responsible for loading it up. For the same space on chip, this tradeoff reduces the maximum size of any one function to the size of the RAM, but allows an unlimited number of functions to be written in microcode. Functions implemented using microcode include Vark acceleration, Artcard reading, and Printing. The VLIW Vector Processor 74 scheme has several advantages for the case of the ACP 31:

Hardware design complexity is reduced

Hardware risk is reduced due to reduction in complexity

Hardware design time does not depend on all Vark functionality being implemented in dedicated silicon Space on chip is reduced overall (due to large number of processes able to be implemented as microcode)

Functionality can be added to Vark (via microcode) with no impact on hardware design time Size and Content The CPU loaded microcode RAM 196 for controlling each PU e.g 178 is 128 words, with each word being 96 bits wide. A summary of the microcode size for control of various units of the PU e.g 178 is listed in the following table:

| Process Block | Size (bits) |
| --- | --- |
| Status Output | 3 |
| Branching (microcode control) | 11 |
| In | 8 |
| Out | 6 |
| Registers | 7 |
| Read | 10 |
| Write | 6 |
| Barrel Shifter | 12 |
| Adder/Logical | 14 |
| Multiply/Interpolate | 19 |
| TOTAL | 96 |

With 128 instruction words, the total microcode RAM 196 per PU e.g 178 is 12,288 bits, or 1.5 KB exactly. Since the VLIW Vector Processor 74 consists of 4 identical PUs e.g 178 this equates to 6,144 bytes, exactly 6 KB. Some of the bits in a microcode word are directly used as control bits, while others are decoded. See the various unit descriptions that detail the interpretation of each of the bits of the microcode word.

Synchronization Between PUs e.g 178

Each PU e.g 178 contains a 4 bit Synchronization Register 197. It is a mask used to determine which PUs e.g 178 work together, and has one bit set for each of the corresponding PUs e.g 178 that are functioning as a single process. For example, if all of the PUs e.g 178 were functioning as a single process, each of the 4 Synchronization Register 197s would have all 4 bits set. If there were two asynchronous processes of 2 PUs e.g 178 each, two of the PUs e.g 178 would have 2 bits set in their Synchronization Register 197s (corresponding to themselves), and the other two would have the other 2 bits set in their Synchronization Register 197s (corresponding to themselves).

The Synchronization Register 197 is used in two basic ways:

Stopping and starting a given process in synchrony

Suspending execution within a process

Stopping and Starting Processes

The CPU is responsible for loading the microcode RAM 196 and loading the execution address for the first instruction (usually 0). When the CPU starts executing microcode, it begins at the specified address.

Execution of microcode only occurs when all the bits of the Synchronization Register 197 are also set in the Common Synchronization Register 197. The CPU therefore sets up all the PUs e.g 178 and then starts or stops processes with a single write to the Common Synchronization Register 197.

This synchronization scheme allows multiple processes to be running asynchronously on the PUs e.g 178, being stopped and started as processes rather than one PU e.g 178 at a time.

Suspending Execution within a Process

In a given cycle, a PU e.g 178 may need to read from or write to a FIFO (based on the opcode of the current microcode instruction). If the FIFO is empty on a read request, or full on a write request, the FIFO request cannot be completed. The PU e.g 178 will therefore assert its SuspendProcess control signal 198. The SuspendProcess signals from all PUs e.g 178 are fed back to all the PUs e.g 178. The Synchronization Register 197 is ANDed with the 4 SuspendProcess bits, and if the result is non-zero, none of the PU e.g 178's register WriteEnables or FIFO strobes will be set. Consequently none of the PUs e.g 178 that form the same process group as the PU e.g 178 that was unable to complete its task will have their registers or FIFOs updated during that cycle. This simple technique keeps a given process group in synchronization. Each subsequent cycle the PU e.g 178's state machine will attempt to re-execute the microcode instruction at the same address, and will continue to do so until successful. Of course the Common Synchronization Register 197 can be written to by the CPU to stop the entire process if necessary. This synchronization scheme allows any combinations of PUs e.g 178 to work together, each group only affecting its co-workers with regards to suspension due to data not being ready for reading or writing.

Control and Branching

During each cycle, each of the four basic input and calculation units within a PU e.g 178's ALU 188 (Read, Adder/Logic, Multiply/Interpolate, and Barrel Shifter) produces two status bits: a Zero flag and a Negative flag indicating whether the result of the operation during that cycle was 0 or negative. Each cycle one of those 4 status bits is chosen by microcode instructions to be output from the PU e.g 178. The 4 status bits (1 per PU e.g 178's ALU 188) are combined into a 4 bit Common Status Register 200. During the next cycle, each PU e.g 178's microcode program can select one of the bits from the Common Status Register 200, and branch to another microcode address dependent on the value of the status bit.

Status Bit

Each PU e.g 178's ALU 188 contains a number of input and calculation units. Each unit produces 2 status bits—a negative flag and a zero flag. One of these status bits is output from the PU e.g 178 when a particular unit asserts the value on the 1-bit tri-state status bit bus. The single status bit is output from the PU e.g 178, and then combined with the other PU e.g 178 status bits to update the Common Status Register 200. The microcode for determining the output status bit takes the following form:

| # Bits | Description |
| --- | --- |
| 2 | Select unit whose status bit is to be output<br>00 = Adder unit<br>01 = Multiply/Logic unit<br>10 = Barrel Shift unit<br>11 = Reader unit |
| 1 | 0 = Zero flag<br>1 = Negative flag |
| 3 | TOTAL |

Within the ALU 188, the 2-bit Select Processor Block value is decoded into four 1-bit enable bits, with a different enable bit sent to each processor unit block. The status select bit (choosing Zero or Negative) is passed into all units to determine which bit is to be output onto the status bit bus.

Branching within Microcode

Each PU e.g 178 contains a 7 bit Program Counter (PC) that holds the current microcode address being executed. Normal program execution is linear, moving from address N in one cycle to address N+1 in the next cycle. Every cycle however, a microcode program has the ability to branch to a different location, or to test a status bit from the Common Status Register 200 and branch. The microcode for determining the next execution address takes the following form:

| # Bits | Description |
| --- | --- |
| 2 | 00 = NOP (PC = PC+1) |
|  | 01 = Branch always |
|  | 10 = Branch if status bit clear |
|  | 11 = Branch if status bit set |
| 2 | Select status bit from status word |
| 7 | Address to branch to (absolute address, 00–7F) |
| 11 | TOTAL |

ALU 188

Figure 5:
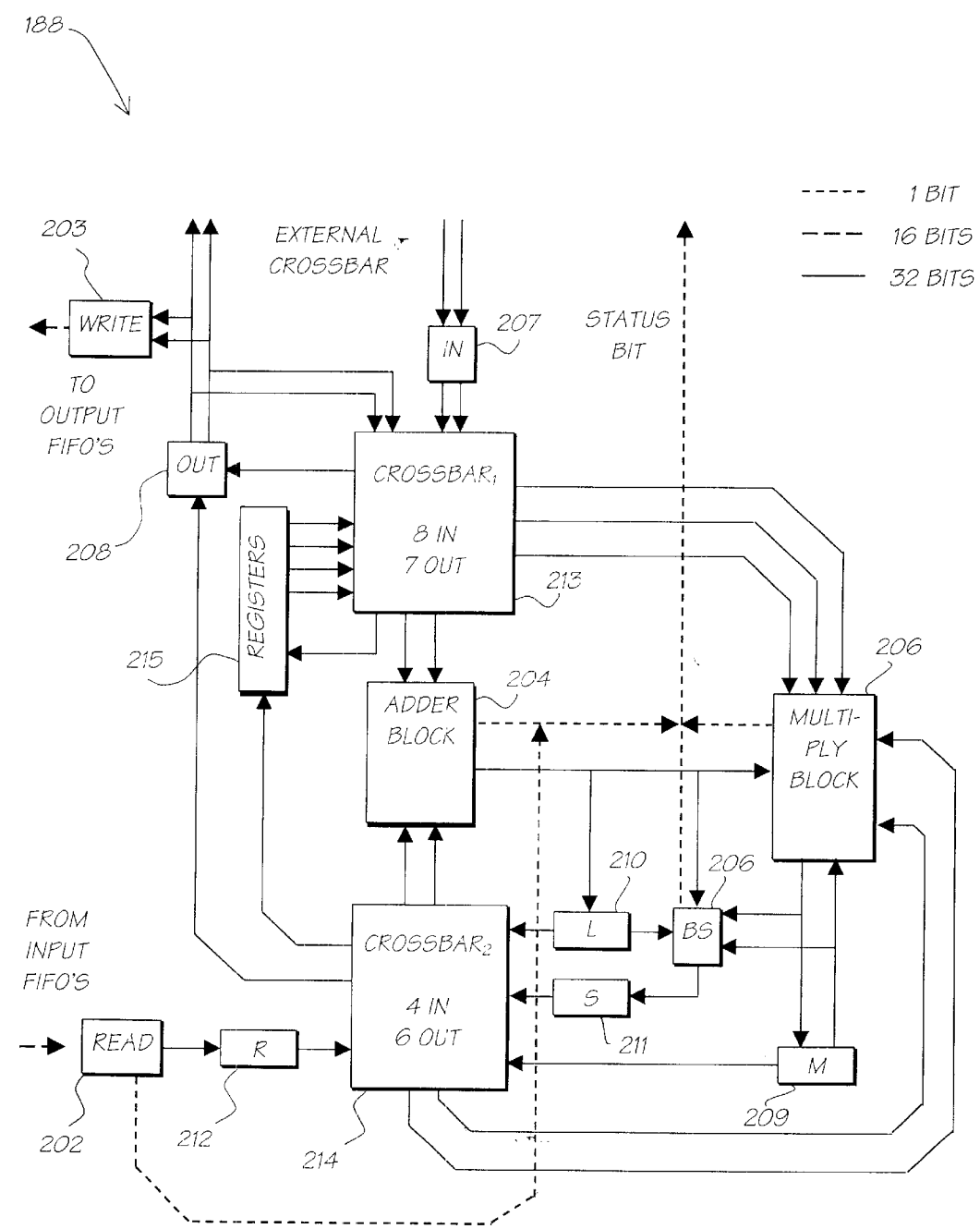
FIG. 5 illustrates the ALU 188 in more detail.

FIG. 5 illustrates the ALU 188 in more detail. Inside the ALU 188 are a number of specialized processing blocks, controlled by a microcode program. The specialized processing blocks include:

Read Block 202, for accepting data from the input FIFOs

Write Block 203, for sending data out via the output FIFOs

Adder/Logical block 204, for addition & subtraction, comparisons and logical operations Multiply/Interpolate block 205, for multiple types of interpolations and multiply/accumulates Barrel Shift block 206, for shifting data as required In block 207, for accepting data from the external crossbar switch 183

Out block 208, for sending data to the external crossbar switch 183

Registers block 215, for holding data in temporary storage

Four specialized 32 bit registers hold the results of the 4 main processing blocks:

M register 209 holds the result of the Multiply/Interpolate block

L register 209 holds the result of the Adder/Logic block

S register 209 holds the result of the Barrel Shifter block

R register 209 holds the result of the Read Block 202

In addition there are two internal crossbar switches 213m 214 for data transport. The various process blocks are further expanded in the following sections, together with the microcode definitions that pertain to each block. Note that the microcode is decoded within a block to provide the control signals to the various units within.

Data Transfers Between PUs e.g 178

Each PU e.g 178 is able to exchange data via the external crossbar. A PU e.g 178 takes two inputs and outputs two values to the external crossbar. In this way two operands for processing can be obtained in a single cycle, but cannot be actually used in an operation until the following cycle.

In 207

Figure 6:
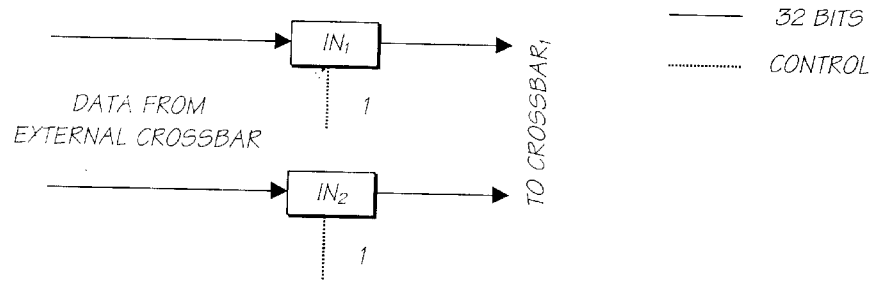
FIG. 6 illustrates the In block in more detail.

This block is illustrated in FIG. 6 and contains two registers, $In_1$ and $In_2$ that accept data from the external crossbar. The registers can be loaded each cycle, or can remain unchanged. The selection bits for choosing from among the 8 inputs are output to the external crossbar switch 183. The microcode takes the following form:

| # Bits | Description |
| --- | --- |
| 1 | 0 = NOP |
|  | 1 = Load $In_1$ from crossbar |
| 3 | Select Input 1 from external crossbar |
| 1 | 0 = NOP |
|  | 1 = Load-$In_2$ from crossbar |
| 3 | Select Input 2 from external crossbar |
| 8 | TOTAL |

Out 208

Figure 7:
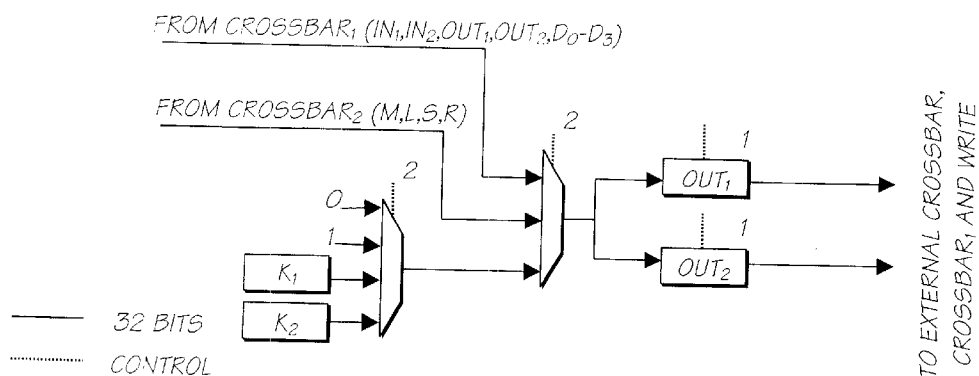
FIG. 7 illustrates the Out block in more detail.

Complementing In is Out 208. The Out block is illustrated in more , detail in FIG. 7. Out contains two registers, $Out_1$ and $Out_2$, both of which are output to the external crossbar each cycle for use by other PUs e.g 178. The Write unit is also able to write one of $Out_1$ or $Out_2$ to one of the output FIFOs attached to the ALU 188. Finally, both registers are available as inputs to Crossbar1 213, which therefore makes the register values available as inputs to other units within the ALU 188. Each cycle either of the two registers can be updated according to microcode selection. The data loaded into the specified register can be one of $D_0$–$D_3$ (selected from Crossbar1 213) one of M, L, S, and R (selected from Crossbar2 214), one of 2 programmable constants, or the fixed values 0 or 1. The microcode for Out takes the following form:

| # Bits | Description |
| --- | --- |
| 1 | 0 = NOP |
|  | 1 = Load Register |
| 1 | Select Register to load [$Out_1$ or $Out_2$] |
| 4 | Select input [$In_1$,$In_2$,$Out_1$,$Out_2$,$D_0$,$D_1$,$D_2$,$D_3$,M,L,S,R, $K_1$,$K_2$,0,1] |
| 6 | TOTAL |

Local Registers and Data Transfers within ALU 188

As noted previously, the ALU 188 contains four specialized 32-bit registers to hold the results of the 4 main processing blocks:

M register 209 holds the result of the Multiply/Interpolate block

L register 209 holds the result of the Adder/Logic block

S register 209 holds the result of the Barrel Shifter block

R register 209 holds the result of the Read Block 202

Figure 8:
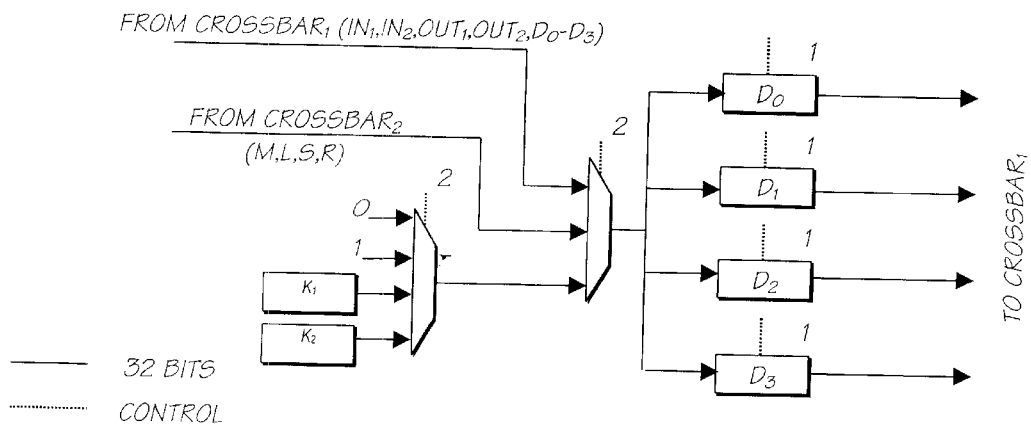
FIG. 8 illustrates the Registers block in more detail.

The CPU has direct access to these registers, and other units can select them as inputs via Crossbar2 214. Sometimes it is necessary to delay an operation for one or more cycles. The Registers block contains four 32-bit registers $D_0$–$D_3$ to hold temporary variables during processing. Each cycle one of the registers can be updated, while all the registers are output for other units to use via Crossbar1 213 (which also includes $In_1$, $In_2$, $Out_1$ and $Out_2$). The CPU has direct access to these registers. The data loaded into the specified register can be one of $D_0$–$D_3$ (selected from Crossbar1 213) one of M, L, S, and R (selected from Crossbar2 214), one of 2 programmable constants, or the fixed values 0 or 1. The Registers block 215 is illustrated in more detail in FIG. 8. The microcode for Registers takes the following form:

| # Bits | Description |
|---|---|
| 1 | 0 = NOP |
|  | 1 = Load Register |
| 2 | Select Register to load [$D_0$–$D_3$] |
| 4 | Select input [$In_1$,$In_2$,$Out_1$,$Out_2$,$D_0$,$D_1$,$D_2$,$D_3$,M,L,S,R, $K_1$,$K_2$,0,1] |
| — |  |
| 7 | TOTAL |

Crossbar1 213

Figure 9:
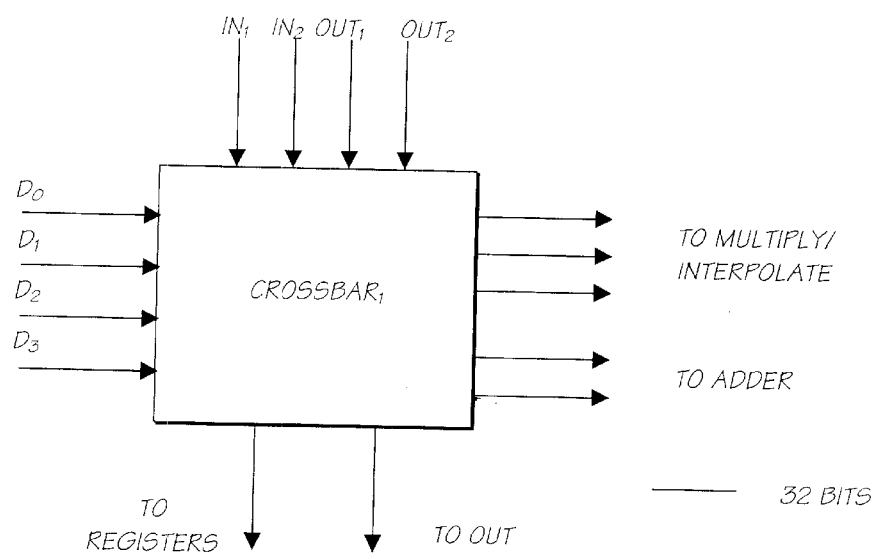
FIG. 9 illustrates the Crossbar1 in more detail.

Crossbar1 213 is illustrated in more detail in FIG. 9. Crossbar1 213 is used to select from inputs $In_1$, $In_2$, $Out_1$, $Out_2$, $D_0$–$D_3$. 7 outputs are generated from Crossbar1 213: 3 to the Multiply/Interpolate Unit, 2 to the Adder Unit, 1 to the Registers unit and 1 to the Out unit. The control signals for Crossbar1 213 come from the various units that use the Crossbar inputs. There is no specific microcode that is separate for Crossbar1 213.

Crossbar2 214

Figure 10:
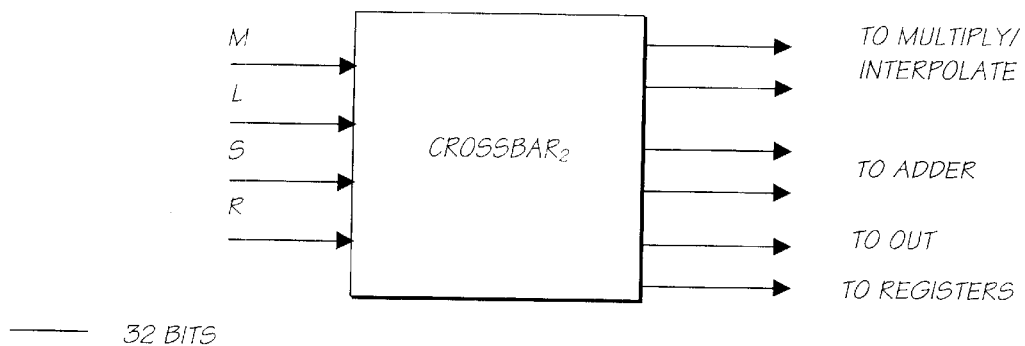
FIG. 10 illustrates the Crossbar2 in more detail.

Crossbar2 214 is illustrated in more detail in FIG. 10. Crossbar2 214 is used to select from the general ALU 188 registers M, L, S and R. 6 outputs are generated from Crossbar1 213: 2 to the Multiply/Interpolate Unit, 2 to the Adder Unit, 1 to the Registers unit and 1 to the Out unit. The control signals for Crossbar2 214 come from the various units that use the Crossbar inputs. There is no specific microcode that is separate for Crossbar2 214.

Data Transfers Between PUs e.g 178 and DRAM or External Processes

Returning to FIG. 4, PUs e.g 178 share data with each other directly via the external crossbar. They also transfer data to and from external processes as well as DRAM. Each PU e.g 178 has 2 I/O Address Generators 189, 190 for transferring data to and from DRAM. A PU e.g 178 can send data to DRAM via an I/O Address Generator's Output FIFO e.g. 186, or accept data from DRAM via an I/O Address Generator's Input FIFO 187. These FIFOs are local to the PU e.g 178. There is also a mechanism for transferring data to and from external processes in the form of a common VLIW Input FIFO 78 and a common VLIW Output FIFO 79, shared between all ALUs. The VLIW Input and Output FIFOs are only 8 bits wide, and are used for printing, Artcard reading, transferring data to the CPU etc. The local Input and Output FIFOs are 16 bits wide.

Read

Figure 11:
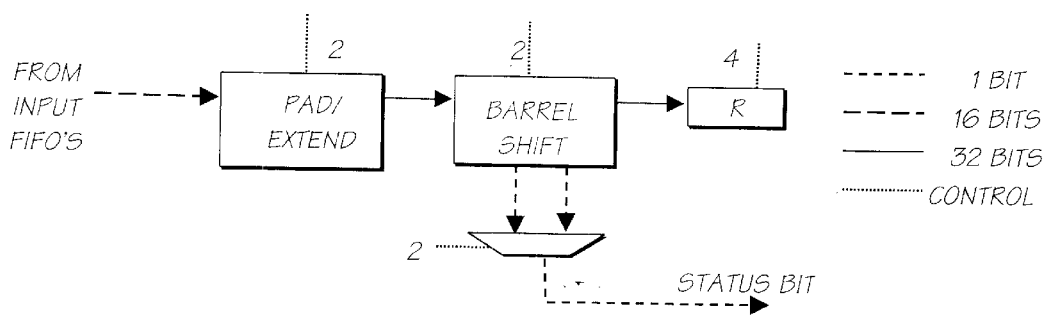
FIG. 11 illustrates the read process block in more detail.

The Read process block 202 of FIG. 5 is responsible for updating the ALU 188's R register 209, which represents the external input data to a VLIW microcoded process. Each cycle the Read Unit is able to read from either the common VLIW Input FIFO 78 (8 bits) or one of two local Input FIFOs (16 bits). A 32-bit value is generated, and then all or part of that data is transferred to the R register 209. The process can be seen in FIG. 11. The microcode for Read is described in the following table. Note that the interpretations of some bit patterns are deliberately chosen to aid decoding.

Write

Figure 12:
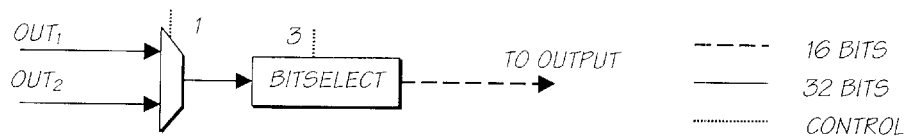
FIG. 12 illustrates the read process block in more detail.

The Write process block is able to write to either the common VLIW Output FIFO 79 or one of the two local Output FIFOs each cycle. Note that since only 1 FIFO is written to in a given cycle, only one 16-bit value is output to all FIFOs, with the low 8 bits going to the VLIW Output FIFO 79. The microcode controls which of the FIFOs gates in the value. The process of data selection can be seen in more detail in FIG. 12. The source values $Out_1$ and $Out_2$ come from the Out block. They are simply two registers. The microcode for Write takes the following form:

Computational Blocks

Each ALU 188 has two computational process blocks, namely an Adder/Logic process block 204, and a Multiply/Interpolate process block 205. In addition there is a Barrel Shifter block to provide help to these computational blocks. Registers from the Registers block 215 can be used for temporary storage during pipelined operations.

Barrel Shifter

Figure 13:
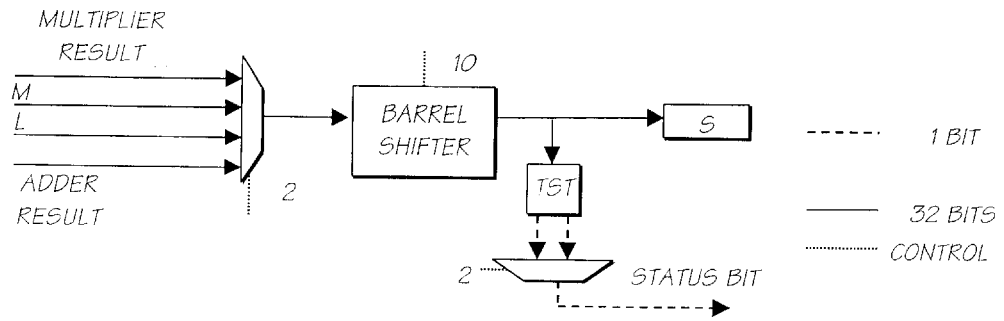
FIG. 13 illustrates the barrel shifter block in more detail.

The Barrel Shifter process block 206 is shown in more detail in FIG. 13 and takes its input from the output of Adder/Logic or Multiply/Interpolate process blocks or the previous cycle's results from those blocks (ALU registers L and M). The 32 bits selected are barrel shifted an arbitrary number of bits in either direction (with sign extension as necessary), and output to the ALU 188's S register 209. The microcode for the Barrel Shift process block is described in the following table. Note that the interpretations of some bit patterns are deliberately chosen to aid decoding.

Adder/Logic 204

Figure 14:
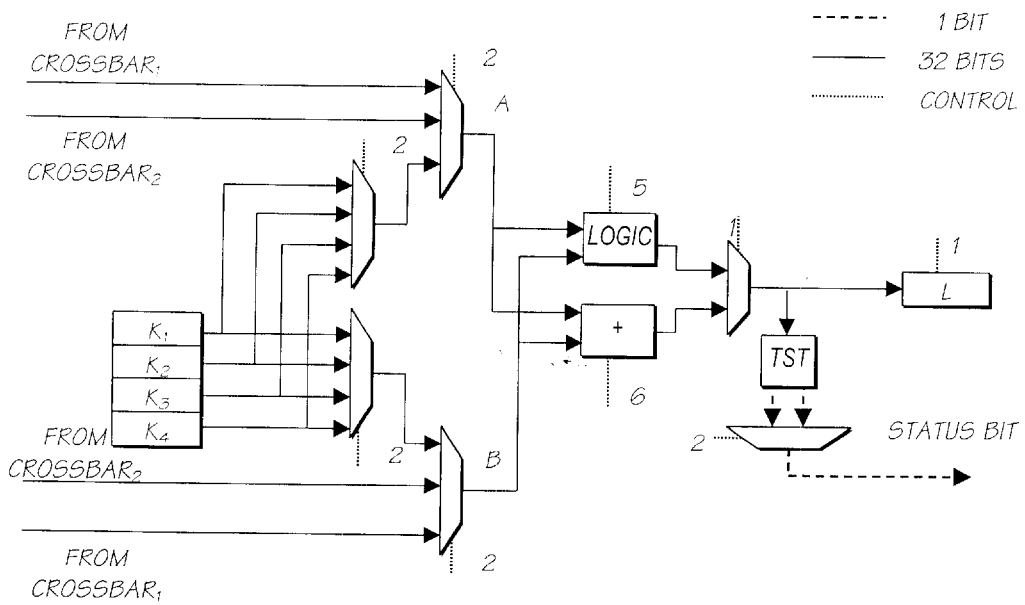
FIG. 14 illustrates the adder/logic block in more detail.

The Adder/Logic process block is shown in more detail in FIG. 14 and is designed for simple 32-bit addition/subtraction, comparisons, and logical operations. In a single cycle a single addition, comparison, or logical operation can be performed, with the result stored in the ALU 188's L register 209. There are two primary operands, A and B, which are selected from either of the two crossbars or from the 4 constant registers. One crossbar selection allows the results of the previous cycle's arithmetic operation to be used while the second provides access to operands previously calculated by this or another ALU 188. The CPU is the only unit that has write access to the four constants ($K_1$–$K_4$). In cases where an operation such as (A+B)×4 is desired, the direct output from the adder can be used as input to the Barrel Shifter, and can thus be shifted left 2 places without needing to be latched into the L register 209 first. The output from the adder can also be made available to the multiply unit for a multiply-accumulate operation. The microcode for the Adder/Logic process block is described in the following table. The interpretations of some bit patterns are deliberately chosen to aid decoding. Microcode bit interpretation for Adder/Logic unit Multiply/Interpolate 205

Figure 15:
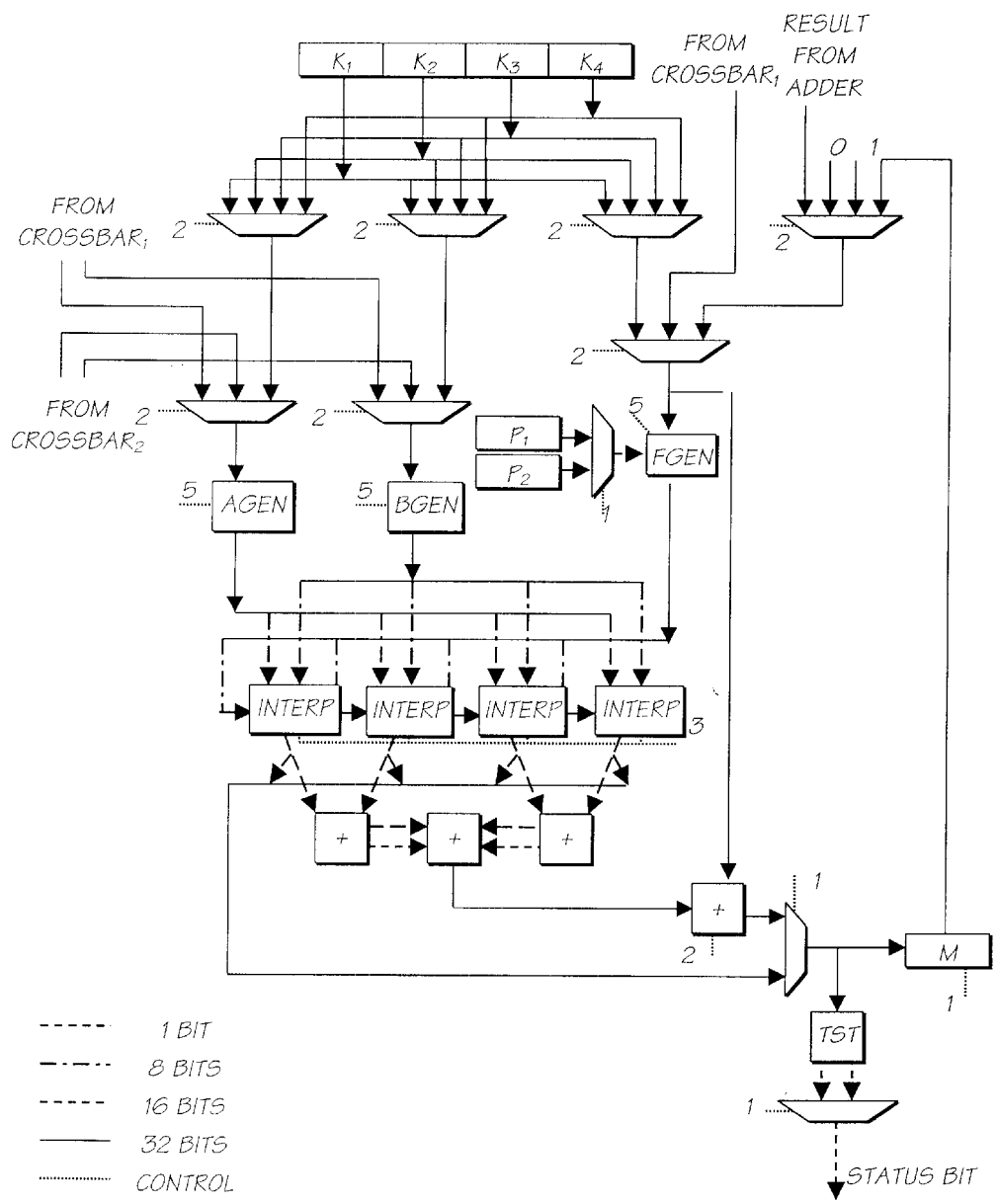
FIG. 15 illustrates the multiply block in more detail.

The Multiply/Interpolate process block is shown in more detail in FIG. 15 and is a set of four 8×8 interpolator units that are capable of performing four individual 8×8 interpolates per cycle, or can be combined to perform a single 16×16 multiply. This gives the possibility to perform up to 4 linear interpolations, a single bi-linear interpolation, or half of a tri-linear interpolation in a single cycle. The result of the interpolations or multiplication is stored in the ALU 188's M register 209. There are two primary operands, A and B, which are selected from any of the general registers in the ALU 188 or from four programmable constants internal to the Multiply/Interpolate process block. Each interpolator block functions as a simple 8 bit interpolator [result=A+(B−A)f] or as a simple 8×8 multiply [result=A*B]. When the operation is interpolation, A and B are treated as four 8 bit numbers $A_0$ thru $A_3$ ($A_0$ is the low order byte), and $B_0$ thru $B_3$. Agen, Bgen, and Fgen are responsible for ordering the inputs to the Interpolate units so that they match the operation being performed. For example, to perform bilinear interpolation, each of the 4 values must be multiplied by a different factor & the result summed, while a 16×16 bit multiplication requires the factors to be 0. The microcode for the Adder/Logic process block is described in the following table. Note that the interpretations of some bit patterns are deliberately chosen to aid decoding.

The same 4 bits are used for the selection of V and f, although the last 4 options for V don't generally make sense as f values. Interpolating with a factor of 1 or 0 is pointless, and the previous multiplication or current result is unlikely to be a meaningful value for f.

I/O Address GeneratorS 189, 190

The I/O Address Generators are shown in more detail in FIG. 16. A VLIW process does not access DRAM directly. Access is via 2 I/O Address Generators 189, 190, each with its own Input and Output FIFO. A PU e.g 178 reads data from one of two local Input FIFOs, and writes data to one of two local Output FIFOs. Each I/O Address Generator is responsible for reading data from DRAM and placing it into its Input FIFO, where it can be read by the PU e.g .178, and is responsible for taking the data from its Output FIFO (placed there by the PU e.g 178) and writing it to DRAM. The I/O Address Generator is a state machine responsible for generating addresses and control for data retrieval and storage in DRAM via the Data cache 76. It is customizable under CPU software control, but cannot be microcoded. The address generator produces addresses in two broad categories:

Image Iterators, used to iterate (reading, writing or both) through pixels of an image in a variety of ways Table I/O, used to randomly access pixels in images, data in tables, and to simulate FIFOs in DRAM Each of the I/O Address Generators 189, 190 has its own bus connection to the Data cache 76, making 2 bus connections per PU e.g 178, and a total of 8 buses over the entire VLIW Vector Processor 74. The Data cache 76 is able to service 4 of the maximum 8 requests from the 4 PUs e.g 178 each cycle. The Input and Output FIFOs are 8 entry deep 16-bit wide FIFOs. The various types of address generation (Image Iterators and Table I/O) are described in the subsequent sections.

Registers

The I/O Address Generator has a set of registers for that are used to control address generation. The addressing mode also determines how the data is formatted and sent into the local Input FIFO, and how data is interpreted from the local output FIFO. The CPU is able to access the registers of the I/O Address Generator via the low speed bus. The first set of registers define the housekeeping parameters for the I/O Generator:

The Status register has the following values

Caching

Several registers are used to control the caching mechanism, specifying which cache group to use for inputs, outputs etc. See the section on the Data cache 76 for more information about cache groups.

Image Iterators=Sequential Automatic Access to Pixels

The primary image pixel access method for software and hardware algorithms is via Image Iterators. Image iterators perform all of the addressing and access to the caches of the pixels within an image channel and read, write or read & write pixels for their client. Read Iterators read pixels in a specific order for their clients, and Write Iterators write pixels in a specific order for their clients. Clients of Iterators read pixels from the local Input FIFO or write pixels via the local Output FIFO.

Read Image Iterators read through an image in a specific order, placing the pixel data into the local Input FIFO. Every time a client reads a pixel from the Input FIFO, the Read Iterator places the next pixel from the image (via the Data cache 76) into the FIFO.

Write Image Iterators write pixels in a specific order to write out the entire image. Clients write pixels to the Output FIFO that is in turn read by the Write Image Iterator and written to DRAM via the Data cache 76.

Typically a VLIW process will have its input tied to a Read Iterator, and output tied to a corresponding Write Iterator. From the PU e.g 178 microcode program's perspective, the FIFO is the effective interface to DRAM. The actual method of carrying out the storage (apart from the logical ordering of the data) is not of concern. Although the FIFO is perceived to be effectively unlimited in length, in practice the FIFO is of limited length, and there can be delays storing and retrieving data, especially if several memory accesses are competing. A variety of Image Iterators exist to cope with the most common addressing requirements of image processing algorithms. In most cases there is a corresponding Write Iterator for each Read Iterator. The different Iterators are listed in the following table:

The 4 bit Address Mode Register is used to determine the Iterator type:

The Access Specific registers are used as follows:

The Flags register (AccessSpecific$_1$) contains a number of flags used to determine factors affecting the reading and writing of data. The Flags register has the following composition:

Notes on ReadEnable and WriteEnable

When ReadEnable is set, the I/O Address Generator acts as a Read Iterator, and therefore reads the image in a particular order, placing the pixels into the Input FIFO.

When WriteEnable is set, the I/O Address Generator acts as a Write Iterator, and therefore writes the image in a particular order, taking the pixels from the Output FIFO.

When both ReadEnable and WriteEnable are set, the I/O Address Generator acts as a Read Iterator and as a Write Iterator, reading pixels into the Input FIFO, and writing pixels from the Output FIFO. Pixels are only written after they have been read—i.e. the Write Iterator will never go faster than the Read Iterator. Whenever this mode is used, care should be taken to ensure balance between in and out processing by the VLIW microcode. Note that separate cache groups can be specified on reads and writes by loading different values in CacheGroup1 and CacheGroup2.

Notes on PassX and PassY

If PassX and PassY are both set, the Y ordinate is placed into the Input FIFO before the X ordinate. PassX and PassY are only intended to be set when the ReadEnable bit is clear. Instead of passing the ordinates to the address generator, the ordinates are placed directly into the Input FIFO. The ordinates advance as they are removed from the FIFO.

If WriteEnable bit is set, the VLIW program must ensure that it balances reads of ordinates from the Input FIFO with writes to the Output FIFO, as writes will only occur up to the ordinates (see note on ReadEnable and WriteEnable above).

Notes on Loop

If the Loop bit is set, reads will recommence at [StartPixel, StartRow] once it has reached [EndPixel, EndRow]. This is ideal for processing a structure such a convolution kernel or a dither cell matrix, where the data must be read repeatedly.

Looping with ReadEnable and WriteEnable set can be useful in an environment keeping a single line history, but only where it is useful to have reading occur before writing. For a FIFO effect (where writing occurs before reading in a length constrained fashion), use an appropriate Table I/O addressing mode instead of an Image Iterator.

Looping with only WriteEnable set creates a written window of the last N pixels. This can be used with an asynchronous process that reads the data from the window. The Artcard Reading algorithm makes use of this mode.

Sequential Read and Write Iterators

FIG. 17 illustrates the pixel data format. The simplest Image Iterators are the Sequential Read Iterator and corresponding Sequential Write Iterator. The Sequential Read Iterator presents the pixels from a channel one line at a time from top to bottom, and within a line, pixels are presented left to right. The padding bytes are not presented to the client. It is most useful for algorithms that must perform some process on each pixel from an image but don't care about the order of the pixels being processed, or want the data specifically in this order. Complementing the Sequential Read Iterator is the Sequential Write Iterator. Clients write pixels to the Output FIFO. A Sequential Write Iterator subsequently writes out a valid image using appropriate caching and appropriate padding bytes. Each Sequential Iterator requires access to 2 cache lines. When reading, while 32 pixels are presented from one cache line, the other cache line can be loaded from memory. When writing, while 32 pixels are being filled up in one cache line, the other can be being written to memory.

A process that performs an operation on each pixel of an image independently would typically use a Sequential Read Iterator to obtain pixels, and a Sequential Write Iterator to write the new pixel values to their corresponding locations within the destination image. Such a process is shown in FIG. 18.

In most cases, the source and destination images are different, and are represented by 2 I/O Address Generators 189, 190. However it can be valid to have the source image and destination image to be the same, since a given input pixel is not read more than once. In that case, then the same Iterator can be used for both input and output, with both the ReadEnable and WriteEnable registers set appropriately. For maximum efficiency, 2 different cache groups should be used—one for reading and the other for writing. If data is being created by a VLIW process to be written via a Sequential Write Iterator, the PassX and PassY flags can be used to generate coordinates that are then passed down the Input FIFO. The VLIW process can use these coordinates and create the output data appropriately.

Box Read Iterator

The Box Read Iterator is used to present pixels in an order most useful for performing operations such as general-purpose filters and convolve. The Iterator presents pixel values in a square box around the sequentially read pixels. The box is limited to being 1, 3, 5, or 7 pixels wide in X and Y (set XBoxSize and YBoxSize– they must be the same value or 1 in one dimension and 3, 5, or 7 in the other). The process is shown in FIG. 19: BoxOffset: This special purpose register is used to determine a sub-sampling in terms of which input pixels will be used as the center of the box. The usual value is 1, which means that each pixel is used as the center of the box. The value "2" would be useful in scaling an image down by 4:1 as in the case of building an image pyramid. Using pixel addresses from the previous diagram, the box would be centered on pixel 0, then 2, 8, and 10. The Box Read Iterator requires access to a maximum of 14 (2×7) cache lines. While pixels are presented from one set of 7 lines, the other cache lines can be loaded from memory.

Box Write Iterator

There is no corresponding Box Write Iterator, since the duplication of pixels is only required on input. A process that uses the Box Read Iterator for input would most likely use the Sequential Write Iterator for output since they are in sync. A good example is the convolver, where N input pixels are read to calculate 1 output pixel. The process flow is as illustrated in FIG. 20. The source and destination images should not occupy the same memory when using a Box Read Iterator, as subsequent lines of an image require the original (not newly calculated) values.

Vertical-Strip Read and Write Iterators

In some instances it is necessary to write an image in output pixel order, but there is no knowledge about the direction of coherence in input pixels in relation to output pixels. An example of this is rotation. If an image is rotated 90 degrees, and we process the output pixels horizontally, there is a complete loss of cache coherence. On the other hand, if we process the output image one cache line's width of pixels at a time and then advance to the next line (rather than advance to the next cache-line's worth of pixels on the same line), we will gain cache coherence for our input image pixels. It can also be the case that there is known 'block' coherence in the input pixels (such as color coherence), in which case the read governs the processing order, and the write, to be synchronized, must follow the same pixel order.

The order of pixels presented as input (Vertical-Strip Read), or expected for output (Vertical-Strip Write) is the same. The order is pixels 0 to 31 from line 0, then pixels 0 to 31 of line 1 etc for all lines of the image, then pixels 32 to 63 of line 0, pixels 32 to 63 of line 1 etc. In the final vertical strip there may not be exactly 32 pixels wide. In this case only the actual pixels in the image are presented or expected as input. This process is illustrated in FIG. 21.

Process that requires only a Vertical-Strip Write Iterator will typically have a way of mapping input pixel coordinates given an output pixel coordinate. It would access the input image pixels according to this mapping, and coherence is determined by having sufficient cache lines on the 'random-access' reader for the input image. The coordinates will typically be generated by setting the PassX and PassY flags on the VerticalStripWrite Iterator, as shown in the process overview illustrated in FIG. 22.

It is not meaningful to pair a Write Iterator with a Sequential Read Iterator or a Box read Iterator, but a Vertical-Strip Write Iterator does give significant improvements in performance when there is a non trivial mapping between input and output coordinates.

It can be meaningful to pair a Vertical Strip Read Iterator and Vertical Strip Write Iterator. In this case it is possible to assign both to a single ALU 188 if input and output images are the same. If coordinates are required, a further Iterator must be used with PassX and PassY flags set. The Vertical Strip Read/Write Iterator presents pixels to the Input FIFO, and accepts output pixels from the Output FIFO. Appropriate padding bytes will be inserted on the write. Input and output require a minimum of 2 cache lines each for good performance.

Table I/O Addressing Modes

It is often necessary to lookup values in a table (such as an image). Table I/O addressing modes provide this functionality, requiring the client to place the index/es into the Output FIFO. The I/O Address Generator then processes the index/es, looks up the data appropriately, and returns the looked-up values in the Input FIFO for subsequent processing by the VLIW client.

1D, 2D and 3D tables are supported, with particular modes targeted at interpolation. To reduce complexity on the VLIW client side, the index values are treated as fixed-point numbers, with AccessSpecific registers defining the fixed point and therefore which bits should be treated as the integer portion of the index. Data formats are restricted forms of the general Image Characteristics in that the PixelOffset register is ignored, the data is assumed to be contiguous within a row, and can only be 8 or 16 bits (1 or 2 bytes) per data element. The 4 bit Address Mode Register is used to determine the I/O type:

The access specific registers are:

FractX, FractY, and FractZ are used to generate addresses based on indexes, and interpret the format of the index in terms of significant bits and integer/fractional components. The various parameters are only defined as required by the number of dimensions in the table being indexed. A 1D table only needs FractX, a 2D table requires FractX and FractY. Each Fract_ value consists of the number of fractional bits in the corresponding index. For example, an X index may be in the format 5:3. This would indicate 5 bits of integer, and 3 bits of fraction. FractX would therefore be set to 3. A simple 1D lookup could have the format 8:0, i.e. no fractional component at all. FractX would therefore be 0. ZOffset is only required for 3D lookup and takes on two different interpretations. It is described more fully in the 3D-table lookup section. The Flags register (AccessSpecific$_1$) contains a number of flags used to determine factors affecting the reading (and in one case, writing) of data. The Flags register has the following composition:

With the exception of the 1D Direct Lookup and DRAM FIFO, all Table I/O modes only support reading, and not writing. Therefore the ReadEnable bit will be set and the WriteEnable bit will be clear for all I/O modes other than these two modes. The 1D Direct Lookup supports 3 modes:

Read only, where the ReadEnable bit is set and the WriteEnable bit is clear

Write only, where the ReadEnable bit is clear and the WriteEnable bit is clear

Read-Modify-Write, where both ReadEnable and the WriteEnable bits are set

The different modes are described in the 1D Direct Lookup section below. The DRAM FIFO mode supports only 1 mode:

Write-Read mode, where both ReadEnable and the WriteEnable bits are set

This mode is described in the DRAM FIFO section below. The DataSize flag determines whether the size of each data elements of the table is 8 or 16 bits. Only the two data sizes are supported. 32 bit elements can be created in either of 2 ways depending on the requirements of the process:

Reading from 2 16-bit tables simultaneously and combining the result. This is convenient if timing is an issue, but has the disadvantage of consuming 2 I/O Address Generators 189, 190, and each 32-bit element is not readable by the CPU as a 32-bit entity.

Reading from a 16-bit table twice and combining the result. This is convenient since only 1 lookup is used, although different indexes must be generated and passed into the lookup.

1 Dimensional Structures
Direct Lookup

A direct lookup is a simple indexing into a 1 dimensional lookup table. Clients can choose between 3 access modes by setting appropriate bits in the Flags register:

Read only

Write only

Read-Modify-Write

Read Only

A client passes the fixed-point index X into the Output FIFO, and the 8 or 16-bit value at Table[Int(X)] is returned in the Input FIFO. The fractional component of the index is completely ignored. If the index is out of bounds, the DuplicateEdge flag determines whether the edge pixel or ConstantPixel is returned. The address generation is straightforward:

If DataSize indicates 8 bits, X is barrel-shifted right FractX bits, and the result is added to the table's base address ImageStart.

If DataSize indicates 16 bits, X is barrel-shifted right FractX bits, and the result shifted left 1 bit (bit0 becomes 0) is added to the table's base address ImageStart.

The 8 or 16-bit data value at the resultant address is placed into the Input FIFO. Address generation takes 1 cycle, and transferring the requested data from the cache to the Output FIFO also takes 1 cycle (assuming a cache hit). For example, assume we are looking up values in a 256-entry table, where each entry is 16 bits, and the index is a 12 bit fixed-point format of 8:4. FractX should be 4, and DataSize 1. When an index is passed to the lookup, we shift right 4 bits, then add the result shifted left 1 bit to ImageStart.

Write Only

A client passes the fixed-point index X into the Output FIFO followed by the 8 or 16-bit value that is to be written to the specified location in the table. A complete transfer takes a minimum of 2 cycles. 1 cycle for address generation, and 1 cycle to transfer the data from the FIFO to DRAM. There can be an arbitrary number of cycles between a VLIW process placing the index into the FIFO and placing the value to be written into the FIFO. Address generation occurs in the same way as Read Only mode, but instead of the data being read from the address, the data from the Output FIFO is written to the address. If the address is outside the table range, the data is removed from the FIFO but not written to DRAM.

Read-Modify-Write

A client passes the fixed-point index X into the Output FIFO, and the 8 or 16-bit value at Table[Int(X)] is returned in the Input FIFO. The next value placed into the Output FIFO is then written to Table[Int(X)], replacing the value that had been returned earlier. The general processing loop then, is that a process reads from a location, modifies the value, and writes it back. The overall time is 4 cycles:

Generate address from index

Return value from table

Modify value in some way

Write it back to the table

There is no specific read/write mode where a client passes in a flag saying "read from X" or "write to X". Clients can simulate a "read from X" by writing the original value, and a "write to X" by simply ignoring the returned value. However such use of the mode is not encouraged since each action consumes a minimum of 3 cycles (the modify is not required) and 2 data accesses instead of 1 access as provided by the specific Read and Write modes.

Interpolate Table

This is the same as a Direct Lookup in Read mode except that two values are returned for a given fixed-point index X instead of one. The values returned are Table[Int(X)], and Table[Int(X)+1]. If either index is out of bounds the DuplicateEdge flag determines whether the edge pixel or ConstantPixel is returned. Address generation is the same as Direct Lookup, with the exception that the second address is simply Address1+1 or 2 depending on 8 or 16 bit data. Transferring the requested data to the Output FIFO takes 2 cycles (assuming a cache hit), although two 8-bit values may actually be returned from the cache to the Address Generator in a single 16-bit fetch.

DRAM FIFO

A special case of a read/write 1D table is a DRAM FIFO. It is often necessary to have a simulated FIFO of a given length using DRAM and associated caches. With a DRAM FIFO, clients do not index explicitly into the table, but write to the Output FIFO as if it was one end of a FIFO and read from the Input FIFO as if it was the other end of the same logical FIFO. 2 counters keep track of input and output positions in the simulated FIFO, and cache to DRAM as needed. Clients need to set both ReadEnable and WriteEnable bits in the Flags register. An example use of a DRAM FIFO is keeping a single line history of some value. The initial history is written before processing begins. As the general process goes through a line, the previous line's value is retrieved from the FIFO, and this line's value is placed into the FIFO (this line will be the previous line when we process the next line). So long as input and outputs match each other on average, the Output FIFO should always be full. Consequently there is effectively no access delay for this kind of FIFO (unless the total FIFO length is very small—say 3 or 4 bytes, but that would defeat the purpose of the FIFO).

2 Dimensional Tables

Direct Lookup

A 2 dimensional direct lookup is not supported. Since all cases of 2D lookups are expected to be accessed for bi-linear interpolation, a special bi-linear lookup has been implemented.

Bi-Linear Lookup

This kind of lookup is necessary for bi-linear interpolation of data from a 2D table. Given fixed-point X and Y coordinates (placed into the Output FIFO in the order Y, X), 4 values are returned after lookup. The values (in order) are:

Table[Int(X), Int(Y)]
Table[Int(X)+1, Int(Y) ]
Table[Int(X), Int(Y)+1]
Table[Int(X)+1, Int(Y)+1]

The order of values returned gives the best cache coherence. If the data is 8-bit, 2 values are returned each cycle over 2 cycles with the low order byte being the first data element. If the data is 16-bit, the 4 values are returned in 4 cycles, 1 entry per cycle. Address generation takes 2 cycles. The first cycle has the index (Y) barrel-shifted right FractY bits being multiplied by RowOffset, with the result added to ImageStart. The second cycle shifts the X index right by FractX bits, and then either the result (in the case of 8 bit data) or the result shifted left 1 bit (in the case of 16 bit data) is added to the result from the first cycle. This gives us address Adr=address of Table[Int(X), Int(Y)]:

$$Adr=ImageStart+ShiftRight(Y, FractY)*RowOffset+ShiftRight(X, FractX)$$

We keep a copy of Adr in AdrOld for use fetching subsequent entries.

If the data is 8 bits, the timing is 2 cycles of address generation, followed by 2 cycles of data being returned (2 table entries per cycle).

If the data is 16 bits, the timing is 2 cycles of address generation, followed by 4 cycles of data being returned (1 entry per cycle)

The following 2 tables show the method of address calculation for 8 and 16 bit data sizes:

In both cases, the first cycle of address generation can overlap the insertion of the X index into the FIFO, so the effective timing can be as low as 1 cycle for address generation, and 4 cycles of return data. If the generation of indexes is 2 steps ahead of the results, then there is no effective address generation time, and the data is simply produced at the appropriate rate (2 or 4 cycles per set).

3 Dimensional Lookup

Direct Lookup

Since all cases of 2D lookups are expected to be accessed for tri-linear interpolation, two special tri-linear lookups have been implemented. The first is a straightforward lookup table, while the second is for tri-linear interpolation from an Image Pyramid.

Tri-linear Lookup

This type of lookup is useful for 3D tables of data, such as color conversion tables. The standard image parameters define a single XY plane of the data—i.e. each plane consists of ImageHeight rows, each row containing RowOffset bytes. In most circumstances, assuming contiguous planes, one XY plane will be ImageHeight×RowOffset bytes after another. Rather than assume or calculate this offset, the software via the CPU must provide it in the form of a 12-bit ZOffset register. In this form of lookup, given 3 fixed-point indexes in the order Z, Y, X, 8 values are returned in order from the lookup table:

Table [Int(X), Int(Y), Int(Z)]
Table[Int(X)+1, Int(Y), Int(Z)]
Table[Int(X), Int(Y)+1, Int(Z)]
Table[Int(X)+1, Int(Y)+1, Int(Z)]
Table[Int(X), Int(Y), Int(Z)+1]
Table[Int(X)+1, Int(Y), Int(Z)+1]
Table[Int(X), Int(Y)+1, Int(Z)+1]
Table(Int(X)+1, Int(Y)+1, Int(Z)+1]

The order of values returned gives the best cache coherence. If the data is 8-bit, 2 values are returned each cycle over 4 cycles with the low order byte being the first data element. If the data is 16-bit, the 4 values are returned in 8 cycles, 1 entry per cycle. Address generation takes 3 cycles. The first cycle has the index (Z) barrel-shifted right FractZ bits being multiplied by the 12-bit Zoffset and added to ImageStart. The second cycle has the index (Y) barrel-shifted right FractY bits being multiplied by RowOffset, with the result added to the result of the previous cycle. The second cycle shifts the X index right by FractX bits, and then either the result (in the case of 8 bit data) or the result shifted left 1 bit (in the case of 16 bit data) is added to the result from the second cycle. This gives us address Adr=address of Table[Int(X), Int(Y), Int(Z)]:

$$Adr=ImageStart+(ShiftRight(Z, FractZ)*ZOffset)+(ShiftRight(Y, FractY)*RowOffset)+ShiftRight(X, FractX)$$

We keep a copy of Adr in AdrOld for use fetching subsequent entries.

If the data is 8 bits, the timing is 2 cycles of address generation, followed by 2 cycles of data being returned (2 table entries per cycle).

If the data is 16 bits, the timing is 2 cycles of address generation, followed by 4 cycles of data being returned (1 entry per cycle)

The following 2 tables show the method of address calculation for 8 and 16 bit data sizes:

In both cases, the cycles of address generation can overlap the insertion of the indexes into the FIFO, so the effective timing for a single one-off lookup can be as low as 1 cycle for address generation, and 4 cycles of return data. If the generation of indexes is 2 steps ahead of the results, then there is no effective address generation time, and the data is simply produced at the appropriate rate (4 or 8 cycles per set).

Image Pyramid Lookup during brushing, tiling, and warping it is necessary to compute the average color of a particular area in an image. Rather than calculate the value for each area given, these functions make use of an image pyramid. The description and construction of an image pyramid is detailed in the section on Internal Image Formats in the DRAM interface 81 chapter of this document. This section is concerned with a method of addressing given pixels in the pyramid in terms of 3 fixed-point indexes ordered: level (Z), Y, and X. Note that Image Pyramid lookup assumes 8 bit data entries, so the DataSize flag is completely ignored. After specification of Z, Y, and X, the following 8 pixels are returned via the Input FIFO:

The pixel at [Int(X), Int(Y)], level Int(Z)
The pixel at [Int(X)+1, Int(Y)], level Int(Z)
The pixel at [Int(X), Int(Y)+1], level Int(Z)
The pixel at [Int(X)+1, Int(Y)+1], level Int(Z)
The pixel at [Int(X), Int(Y)], level Int(Z)+1
The pixel at [Int(X)+1, Int(Y)], level Int(Z)+1
The pixel at [Int(X), Int(Y)+1], level Int(Z)+1
The pixel at [Int(X)+1, Int(Y)+1], level Int(Z)+1

The 8 pixels are returned as 4×16 bit entries, with X and X+1 entries combined hi/lo. For example, if the scaled (X, Y) coordinate was (10.4, 12.7) the first 4 pixels returned would be: (10, 12), (11, 12), (10, 13) and (11, 13). When a coordinate is outside the valid range, clients have the choice of edge pixel duplication or returning of a constant color value via the DuplicateEdgePixels and ConstantPixel registers (only the low 8 bits are used). When the Image Pyramid has been constructed, there is a simple mapping from level 0 coordinates to level Z coordinates. The method is simply to shift the X or Y coordinate right by Z bits. This must be done in addition to the number of bits already shifted to retrieve the integer portion of the coordinate (i.e. shifting right FractX and FractY bits for X and Y ordinates respectively). To find the ImageStart and RowOffset value for a given level of the image pyramid, the 24-bit ZOffset register is used as a pointer to a Level Information Table. The table is an array of records, each representing a given level of the pyramid, ordered by level number. Each record consists of a 16-bit offset ZOffset from ImageStart to that level of the pyramid (64-byte aligned address as lower 6 bits of the offset are not present), and a 12 bit ZRowOffset for that level. Element 0 of the table would contain a ZOffset of 0, and a ZRowOffset equal to the general register RowOffset, as it simply points to the full sized image. The ZOffset value at element N of the table should be added to ImageStart to yield the effective ImageStart of level N of the image pyramid. The RowOffset value in element N of the table contains the RowOffset value for level N. The software running on the CPU must set up the table appropriately before using this addressing mode. The actual address generation is outlined here in a cycle by cycle description:

The address generation as described can be achieved using a single Barrel Shifter, 2 adders, and a single 16×16 multiply/add unit yielding 24 bits. Although some cycles have 2 shifts, they are either the same shift value (i.e. the output of the Barrel Shifter is used two times) or the shift is 1 bit, and can be hard wired. The following internal registers are required: ZAdr, Adr, ZInt, YInt, XInt, ZRowOffset, and ZImageStart. The _Int registers only need to be 8 bits maximum, while the others can be up to 24 bits. Since this access method only reads from, and does not write to image pyramids, the CacheGroup2 is used to lookup the Image Pyramid Address Table (via ZAdr). CacheGroup1 is used for lookups to the image pyramid itself (via Adr). The address table is around 22 entries (depending on original image size), each of 4 bytes. Therefore 3 or 4 cache lines should be allocated to CacheGroup2, while as many cache lines as possible should be allocated to CacheGroup1. The timing is 8 cycles for returning a set of data, assuming that Cycle 8 and Cycle 0 overlap in operation—i.e. the next request's Cycle 0 occurs during Cycle 8. This is acceptable since Cycle 0 has no memory access, and Cycle 8 has no specific operations.

Generation of Coordinates Using VLIW Vector Processor 74

Some functions that are linked to Write Iterators require the X and/or Y coordinates of the current pixel being processed in part of the processing pipeline. Particular processing may also need to take place at the end of each row, or column being processed. In most cases, the PassX and PassY flags should be sufficient to completely generate all coordinates. However, if there are special requirements, the following functions can be used. The calculation can be spread over a number of ALUs, for a single cycle generation, or be in a single ALU 188 for a multi-cycle generation.

Generate Sequential [X, Y]

Figure 23:
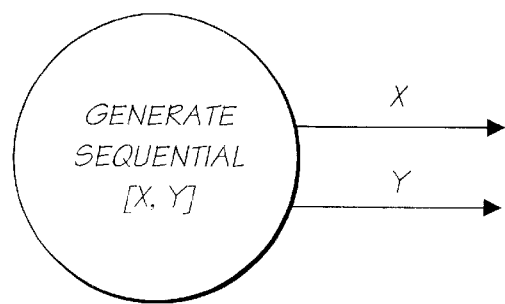
FIG. 23 illustrates the generate sequential process.

When a process is processing pixels in sequential order according to the Sequential Read Iterator (or generating pixels and writing them out to a Sequential Write Iterator), the following process can be used to generate X, Y coordinates instead of PassX/PassY flags as shown in FIG. 23.

Figure 24:
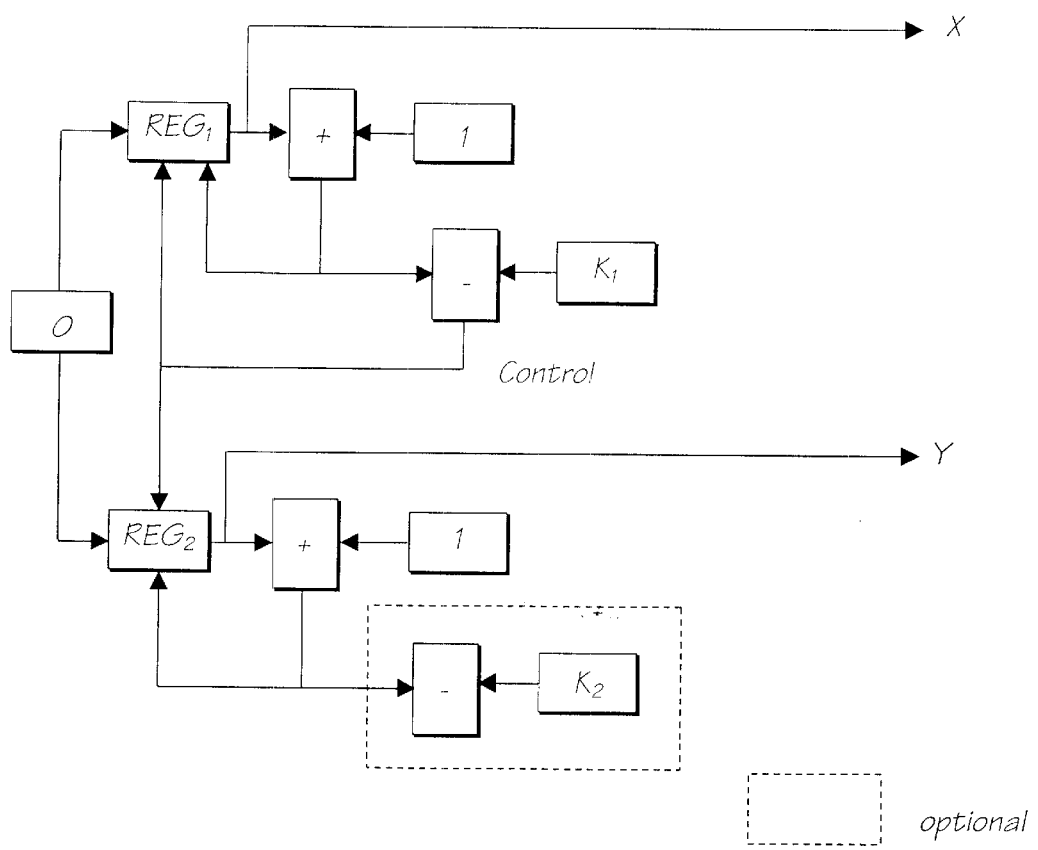
FIG. 24 illustrates the generate sequential process.

The coordinate generator counts up to ImageWidth in the X ordinate, and once per ImageWidth pixels increments the Y ordinate. The actual process is illustrated in FIG. 24, where the following constants are set by software:

The following registers are used to hold temporary variables:

The requirements are summarized as follows:

Generate Vertical Strip [X, Y]

Figure 25:
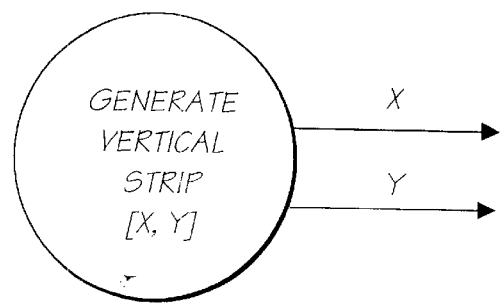
FIG. 25 illustrates the generate vertical strip process.
Figure 26:
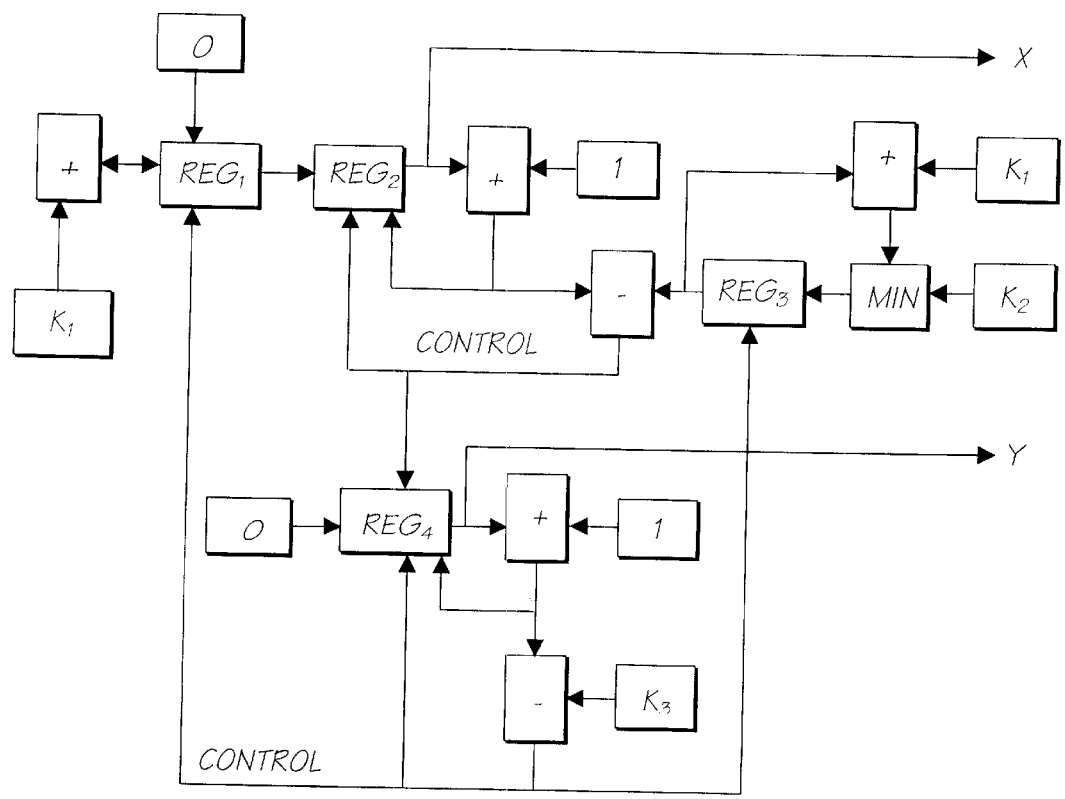
FIG. 26 illustrates the generate vertical strip process.

When a process is processing pixels in order to write them to a Vertical Strip Write Iterator, and for some reason cannot use the PassX/PassY flags, the process as illustrated in FIG. 25 can be used to generate X, Y coordinates. The coordinate generator simply counts up to ImageWidth in the X ordinate, and once per ImageWidth pixels increments the Y ordinate. The actual process is illustrated in FIG. 26, where the following constants are set by software:

The following registers are used to hold temporary variables:

The requirements are summarized as follows:

The calculations that occur once per vertical strip (2 additions, one of which has an associated MIN) are not included in the general timing statistics because they are not really part of the per pixel timing. However they do need to be taken into account for the programming of the microcode for the particular function.

Image Sensor Interface (ISI 83)

Figure 27:
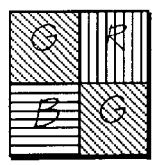
FIG. 27 illustrates a pixel data configuration.
Figure 28:
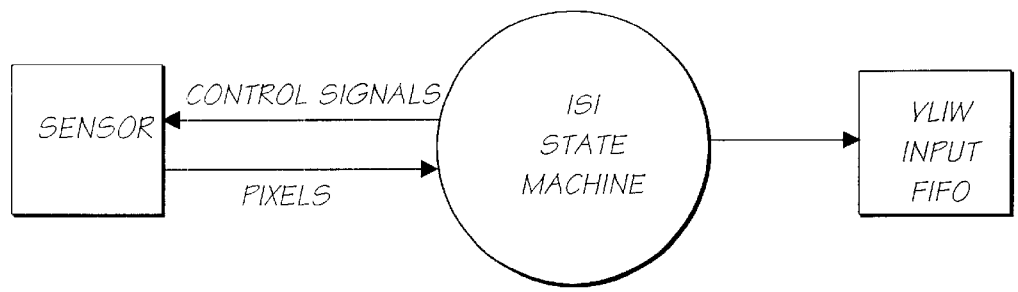
FIG. 28 illustrates a pixel processing process.

The Image Sensor Interface (ISI 83) takes data from the CMOS Image Sensor and makes it available for storage in DRAM. The image sensor has an aspect ratio of 3:2, with a typical resolution of 750×500 samples, yielding 375K (8 bits per pixel). Each 2×2 pixel block has the configuration as shown in FIG. 27. The ISI 83 is a state machine that sends control information to the Image Sensor, including frame sync pulses and pixel clock pulses in order to read the image. Pixels are read from the image sensor and placed into the VLIW Input FIFO 78. The VLIW is then able to process and/or store the pixels. This is illustrated further in FIG. 28.

The ISI 83 is used in conjunction with a VLIW program that stores the sensed Photo Image in DRAM. Processing occurs in 2 steps:

A small VLIW program reads the pixels from the FIFO and writes them to DRAM via a Sequential Write Iterator.

The Photo Image in DRAM is rotated 90, 180 or 270 degrees according to the orientation of the camera when the photo was taken.

If the rotation is 0 degrees, then step 1 merely writes the Photo Image out to the final Photo Image location and step 2 is not performed. If the rotation is other than 0 degrees, the image is written out to a temporary area (for example into the Print Image memory area), and then rotated during step 2 into the final Photo Image location. Step 1 is very simple microcode, taking data from the VLIW Input FIFO 78 and writing it to a Sequential Write Iterator. Step 2's rotation is accomplished by using the accelerated Vark Affine Transform function. The processing is performed in 2 steps in order to reduce design complexity and to re-use the Vark affine transform rotate logic already required for images. This is acceptable since both steps are completed in approximately 0.03 seconds, a time imperceptible to the operator of the Artcam. Even so, the read process is sensor speed bound, taking 0.02 seconds to read the full frame, and approximately 0.01 seconds to rotate the image.

The orientation is important for converting between the sensed Photo Image and the internal format image, since the relative positioning of R, G, and B pixels changes with orientation. The processed image may also have to be rotated during the Print process in order to be in the correct orientation for printing. The 3D model of the Artcam has 2 image sensors, with their inputs multiplexed to a single ISI 83 (different microcode, but same ACP 31). Since each sensor is a frame store, both images can be taken simultaneously, and then transferred to memory one at a time.

Display Controller 88

Figure 29:
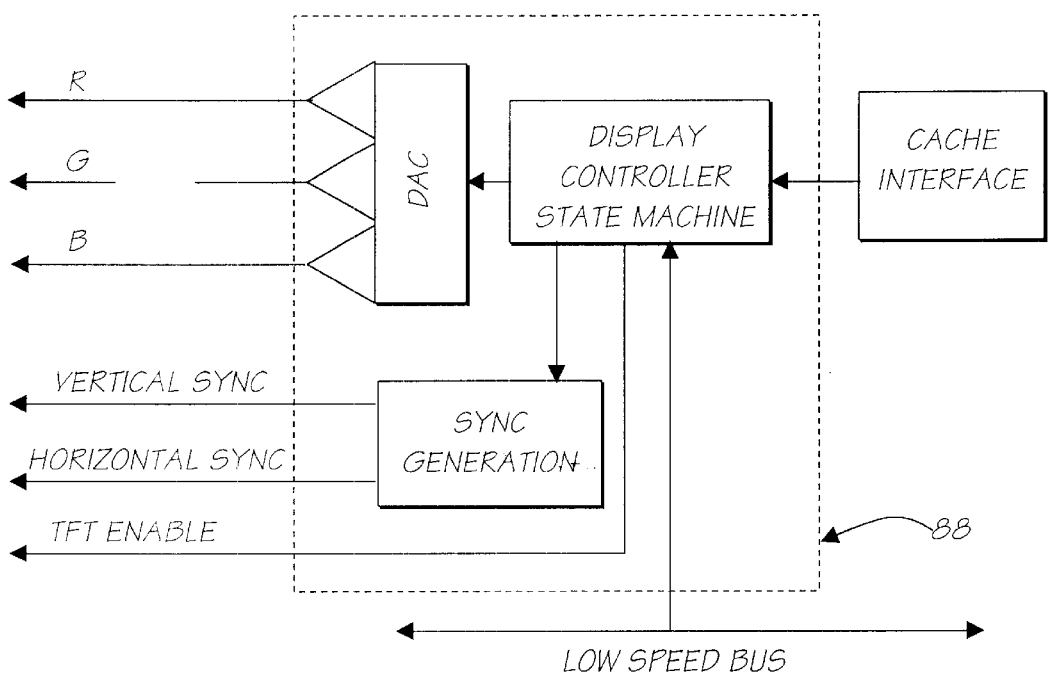
FIG. 29 illustrates a schematic block diagram of the display controller.

When the "Take" button on an Artcam is half depressed, the TFT will display the current image from the image sensor (converted via a simple VLIW process). Once the Take button is fully depressed, the Taken Image is displayed. When the user presses the Print button and image processing begins, the TFT is turned off. Once the image has been printed the TFT is turned on again. The Display Controller 88 is used in those Artcam models that incorporate a flat panel display. An example display is a TFT LCD of resolution 240×160 pixels. The structure of the Display Controller 88 isl illustrated in FIG. 29. The Display Controller 88 State Machine contains registers that control the timing of the Sync Generation, where the display image is to be taken from (in DRAM via the Data cache 76 via a specific Cache Group), and whether the TFT should be active or not (via TFT Enable) at the moment. The CPU can write to these registers via the low speed bus. Displaying a 240×160 pixel image on an RGB TFT requires 3 components per pixel. The image taken from DRAM is displayed via 3 DACs, one for each of the R, G, and B output signals. At an image refresh rate of 30 frames per second (60 fields per second) the Display Controller 88 requires data transfer rates of:

$$240\times160\times3\times30=3.5 \text{ MB per second}$$

This data rate is low compared to the rest of the system. However it is high enough to cause VLIW programs to slow down during the intensive image processing. The general principles of TFT operation should reflect this.

Image Data Formats

As stated previously, the DRAM Interface 81 is responsible for interfacing between other client portions of the ACP chip and the RAMBUS DRAM. In effect, each module within the DRAM Interface is an address generator.

There are three logical types of images manipulated by the ACP. They are:

CCD Image, which is the Input Image captured from the CCD.

Internal Image format—the Image format utilised internally by the Artcam device.

Print Image—the Output Image format printed by the Artcam

These images are typically different in color space, resolution, and the output & input color spaces which can vary from camera to camera. For example, a CCD image on a low-end camera may be a different resolution, or have different color characteristics from that used in a high-end camera. However all internal image formats are the same format in terms of color space across all cameras.

In addition, the three image types can vary with respect to which direction is 'up'. The physical orientation of the camera causes the notion of a portrait or landscape image, and this must be maintained throughout processing. For this reason, the internal image is always oriented correctly, and rotation is performed on images obtained from the CCD and during the print operation.

CCD Image Organization

Figure 30:
FIG. 30 illustrates the CCD image organization.

Although many different CCD image sensors could be utilised, it will be assumed that the CCD itself is a 750×500 image sensor, yielding 375,000 bytes (8 bits per pixel). Each 2×2 pixel block having the configuration as depicted in FIG. 30.

A CCD Image as stored in DRAM has consecutive pixels with a given line contiguous in memory. Each line is stored one after the other. The image sensor Interface 83 is responsible for taking data from the CCD and storing it in the DRAM correctly oriented. Thus a CCD image with rotation 0 degrees has its first line G, R, G, R, G, R . . . and its second line as B, G, B, G, B, G . . . If the CCD image should be portrait, rotated 90 degrees, the first line will be R, G, R, G, R, G and the second line G, B, G, B, G, B . . . etc.

Pixels are stored in an interleaved fashion since all color components are required in order to convert to the internal image format.

It should be noted that the ACP 31 makes no assumptions about the CCD pixel format, since the actual CCDs for imaging may vary from Artcam to Artcam, and over time. All processing that takes place via the hardware is controlled by major microcode in an attempt to extend the usefulness of the ACP 31.

Internal Image Organization

Internal images typically consist of a number of channels. Vark images can include, but are not limited to:

Lab

Labα

LabΔ

αΔ

L

L, a and b correspond to components of the Lab color space, α is a matte channel (used for compositing), and Δ is a bump-map channel (used during brushing, tiling and illuminating).

The VLIW processor 74 requires images to be organized in a planar configuration. Thus a Lab image would be stored as 3 separate blocks of memory:

one block for the L channel,
one block for the a channel, and
one block for the b channel Within each channel block, pixels are stored contiguously for a given row (plus some optional padding bytes), and rows are stored one after the other.

Figure 31:
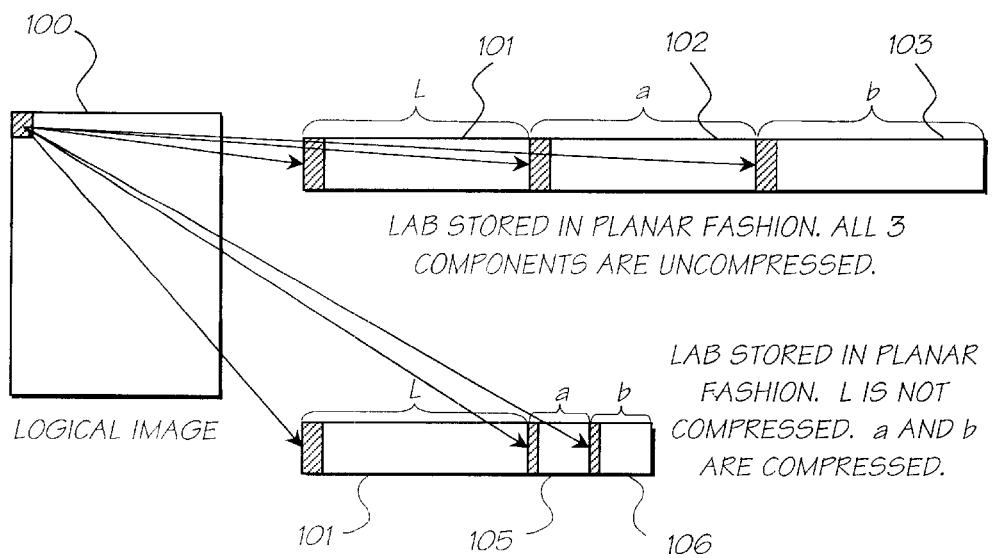
FIG. 31 illustrates the storage format for a logical image.

Turning to FIG. 31 there is illustrated an example form of storage of a logical image 100. The logical image 100 is stored in a planar fashion having L 101, a 102 and b 103 color components stored one after another. Alternatively, the logical image 100 can be stored in a compressed format having an uncompressed L component 101 and compressed A and B components 105, 106.

Figure 32:
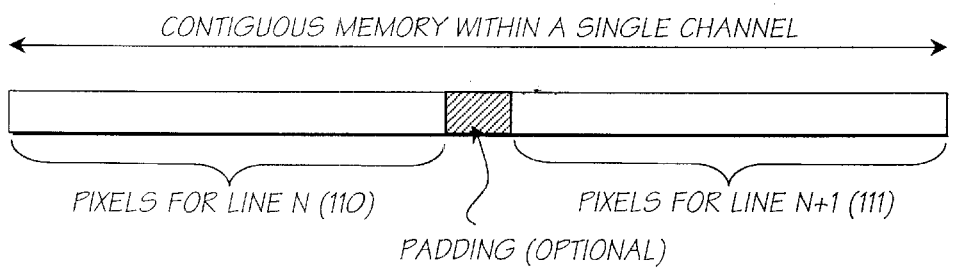
FIG. 32 illustrates the internal image memory storage format.

Turning to FIG. 32, the pixels of for line n 110 are stored together before the pixels of for line and n+1 (111). With the image being stored in contiguous memory within a single channel.

In the 8 MB-memory model, the final Print Image after all processing is finished, needs to be compressed in the chrominance channels. Compression of chrominance channels can be 4:1, causing an overall compression of 12:6, or 2:1.

Other than the final Print Image, images in the Artcam are typically not compressed. Because of memory constraints, software may choose to compress the final Print Image in the chrominance channels by scaling each of these channels by 2:1. If this has been done, the PRINT Vark function call utilised to print an image must be told to treat the specified chrominance channels as compressed. The PRINT function is the only function that knows how to deal with compressed chrominance, and even so, it only deals with a fixed 2:1 compression ratio.

Although it is possible to compress an image and then operate on the compressed image to create the final print image, it is not recommended due to a loss in resolution. In addition, an image should only be compressed once—as the final stage before printout. While one compression is virtually undetectable, multiple compressions may cause substantial image degradation.

Clip Image Organization

Clip images stored on Artcards have no explicit support by the ACP 31. Software is responsible for taking any images from the current Artcard and organizing the data into a form known by the ACP. If images are stored compressed on an Artcard, software is responsible for decompressing them, as there is no specific hardware support for decompression of Artcard images.

Image Pyramid Organization

Figure 33:
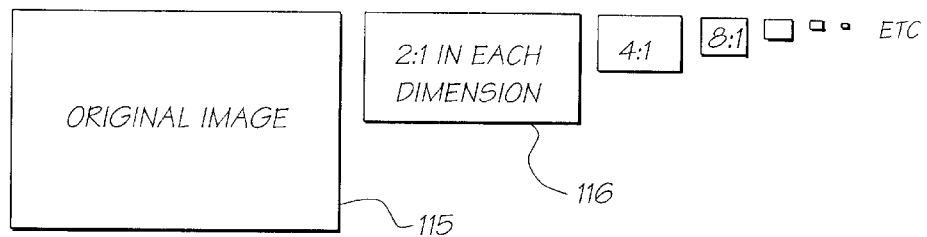
FIG. 33 illustrates the image pyramid storage format.

During brushing, tiling, and warping processes utilised to manipulate an image it is often necessary to compute the average color of a particular area in an image. Rather than calculate the value for each area given, these functions make use of an image pyramid. As illustrated in FIG. 33, an image pyramid is effectively a multi-resolutionpixel-map. The original image 115 is a 1:1 representation. Low-pass filtering and sub-sampling by 2:1 in each dimension produces an image ¼ the original size 116. This process continues until the entire image is represented by a single pixel. An image pyramid is constructed from an original internal format image, and consumes ⅓ of the size taken up by the original image (¼+¹⁄₁₆+¹⁄₆₄+ . . . ). For an original image of 1500× 1000 the corresponding image pyramid is approximately ½ MB. An image pyramid is constructed by a specific Vark function, and is used as a parameter to other Vark functions.

Print Image Organization

The entire processed image is required at the same time in order to print it. However the Print Image output can comprise a CMY dithered image and is only a transient image format, used within the Print Image functionality. However, it should be noted that color conversion will need to take place from the internal color space to the print color space. In addition, color conversion can be tuned to be different for different print rolls in the camera with different ink characteristics e.g. Sepia output can be accomplished by. using a specific sepia toning Artcard, or by using a sepia tone print-roll (so all Artcards will work in sepia tone).

Color Spaces

As noted previously there are 3 color spaces used in the Artcam, corresponding to the different image types.

The ACP has no direct knowledge of specific color spaces. Instead, it relies on client color space conversion tables to convert between CCD, internal, and printer color spaces:
CCD:RGB
Internal:Lab
Printer:CMY Removing the color space conversion from the ACP 31 allows:
Different CCDs to be used in different cameras
Different inks (in different print rolls over time) to be used in the same camera
Separation of CCD selection from ACP design path
A well defined internal. color space for accurate color processing Artcard Interface 87

The Artcard Interface (AI) takes data from the linear image Sensor while an Artcard is passing under it, and makes that data available for storage in DRAM. The image sensor produces 11,000 8-bit samples per scanline, sampling the Artcard at 4800 dpi. The AI is a state machine that sends control information to the linear sensor, including LineSync pulses and PixelClock pulses in order to read the image. Pixels are read from the linear sensor and placed into the VLIW Input FIFO 78. The VLIW is then able to process and/or store the pixels. The AI has only a few registers:

Note that the CPU should clear the VLIW Input FIFO 78 before initiating a Scan. The Status register has bit interpretations as follows:

Artcard Interface (AI) 87

The Artcard Interface (AI) 87 is responsible for taking an Artcard image from the Artcard Reader 34 and decoding it into the original data (usually a Vark script). Specifically, the AI 87 accepts signals from the Artcard scanner linear CCD 34, detects the bit pattern printed on the card, and converts the bit pattern into the original data, correcting read errors.

With no Artcard 9 inserted, the image printed from an Artcam is simply the sensed Photo Image cleaned up by any standard image processing routines. The Artcard 9 is the means by which users are able to modify a photo before printing it out. By the simple task of inserting a specific Artcard 9 into an Artcam, a user is able to define complex image processing to be performed on the Photo Image. With no Artcard inserted the Photo Image is processed in a standard way to create the Print Image. When a single Artcard 9 is inserted into the Artcam, that Artcard's effect is applied to the Photo Image to generate the Print Image. When the Artcard 9 is removed (ejected), the printed image reverts to the Photo Image processed in a standard way. When the user presses the button to eject an Artcard, an event is placed in the event queue maintained by the operating system running on the Artcam Central Processor 31. When the event is processed (for example after the current Print has occurred) the following things occur:

If the current Artcard is valid, then the Print Image is marked as invalid and a 'Process Standard' event is placed in the event queue. When the event is eventually processed it will perform the standard image processing operations on the Photo Image to produce the Print Image. The motor is started to eject the Artcard and a time-specific 'Stop-Motor' Event is added to the event queue.

Inserting an Artcard

When a user inserts an Artcard 9, the Artcard Sensor 49 detects it notifying the ACP72. This results in the software inserting an 'Artcard Inserted' event into the event queue. When the event is processed several things occur:

The current Artcard is marked as invalid (as opposed to 'none').

The Print Image is marked as invalid.

The Artcard motor 37 is started up to load the Artcard

The Artcard Interface 87 is instructed to read the Artcard

The Artcard Interface 87 accepts signals from the Artcard scanner linear CCD 34, detects the bit pattern printed on the card, and corrects errors in the detected bit pattern, producing a valid Artcard data block in DRAM.

Reading Data from the Artcard CCD—General Considerations

Figure 34:
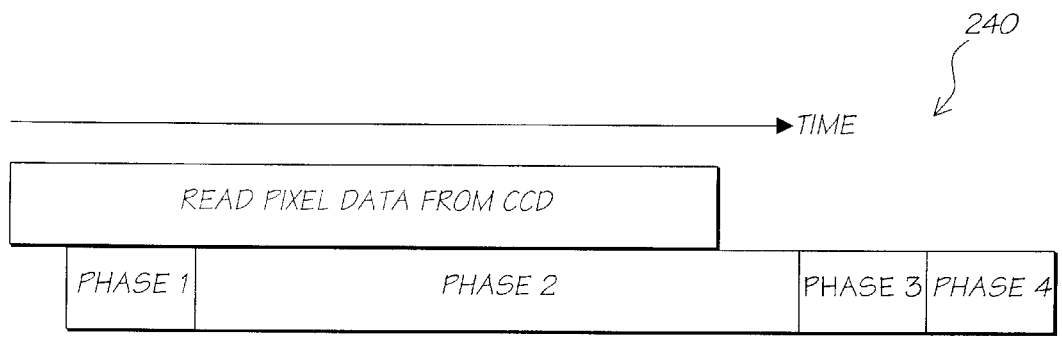
FIG. 34 illustrates a time line of the process of sampling an Artcard.

As illustrated in FIG. 34, the Data Card reading process has 4 phases operated while the pixel data is read from the card. The phases are as follows:

Phase 1. Detect data area on Artcard

Phase 2. Detect bit pattern from Artcard based on CCD pixels, and write as bytes.

Phase 3. Descramble and XOR the byte-pattern

Phase 4. Decode data (Reed-Solomon decode)

Figure 35:
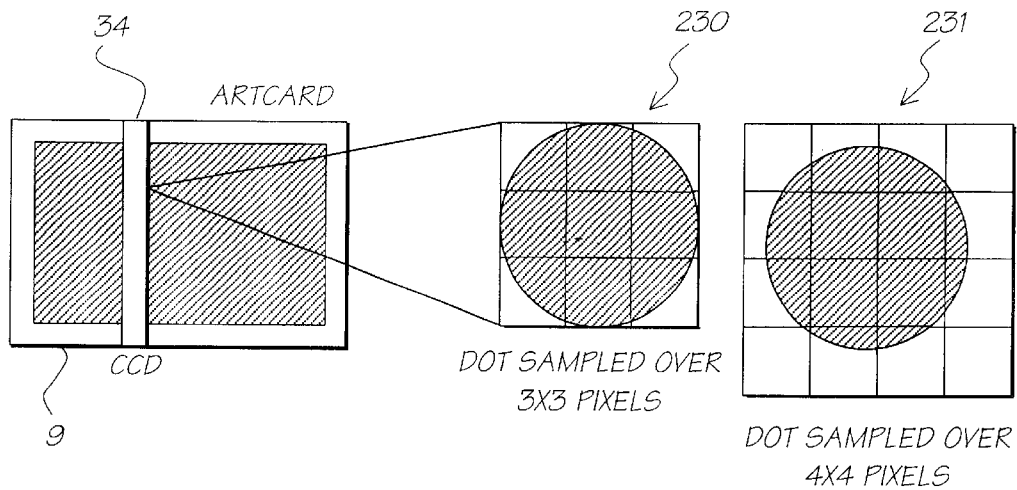
FIG. 35 illustrates the super sampling process.

As illustrated in FIG. 35, the Artcard 9 must be sampled at least at double the printed resolution to satisfy Nyquist's Theorem. In practice it is better to sample at a higher rate than this. Preferably, the pixels are sampled 230 at 3 times the resolution of a printed dot in each dimension, requiring 9 pixels to define a single dot. Thus if the resolution of the Artcard 9 is 1600 dpi, and the resolution of the sensor 34 is 4800 dpi, then using a 50 mm CCD image sensor results in 9450 pixels per column. Therefore if we require 2 MB of dot data (at 9 pixels per dot) then this requires 2 MB*8*9/9450= 15,978 columns=approximately 16,000 columns. Of course if a dot is not exactly aligned with the sampling CCD the worst and most likely case is that a dot will be sensed over a 16 pixel area (4×4) 231.

Figure 36:
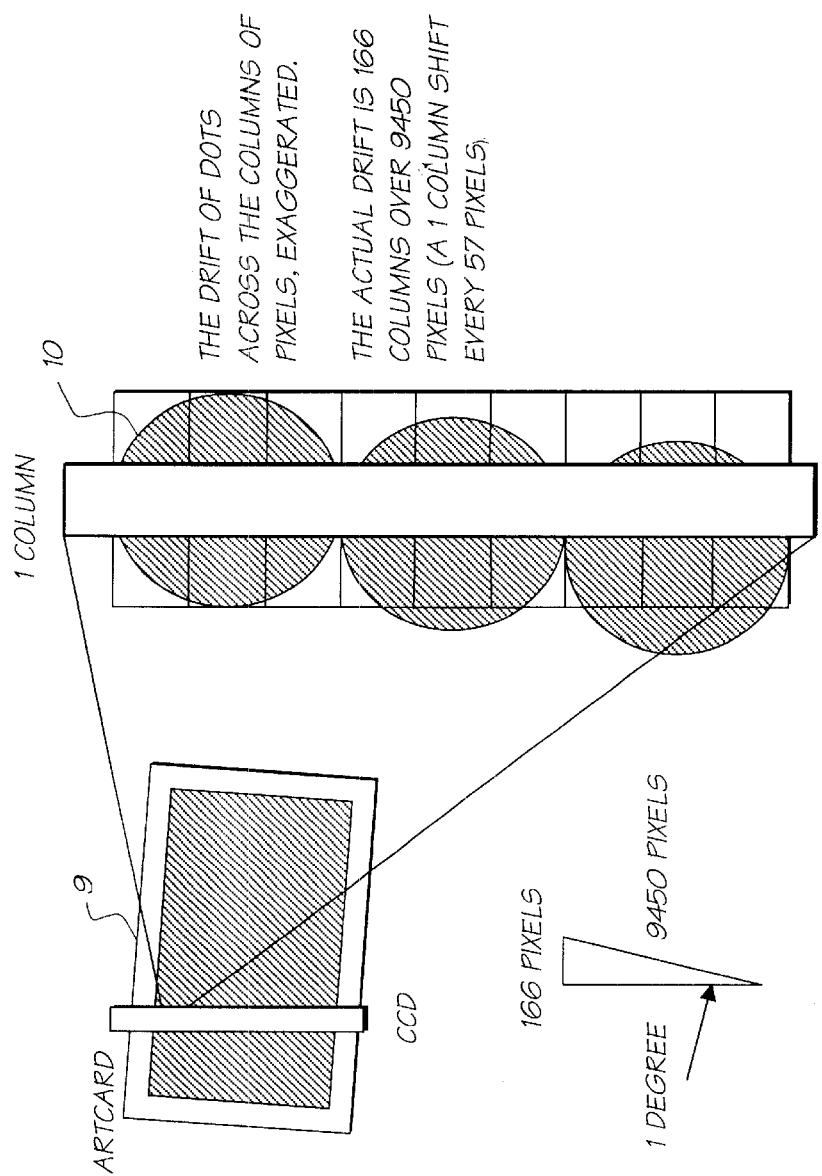
FIG. 36 illustrates the process of reading a rotated Artcard.

An Artcard 9 may be slightly warped due to heat damage, slightly rotated (up to, say 1 degree) due to differences in insertion into an Artcard reader, and can have slight differences in true data rate due to fluctuations in the speed of the reader motor 37. These changes will cause columns of data from the card not to be read as corresponding columns of pixel data. As illustrated in FIG. 36, a 1 degree rotation in the Artcard 9 can cause the pixels from a column on the card to be read as pixels across 166 columns:

Finally, the Artcard 9 should be read in a reasonable amount of time with respect to the human operator. The data on the Artcard covers most of the Artcard surface, so timing concerns can be limited to the Artcard data itself. A reading time of 1.5 seconds is adequate for-Artcard reading.

The Artcard should be loaded in 1.5 seconds. Therefore all 16,000 columns of pixel data must be read from the CCD 34 in 1.5 second, i.e. 10,667 columns per second. Therefore the time available to read one column is 1/10667 seconds, or 93,747 ns. Pixel data can be written to the DRAM one column at a time, completely independently from any processes that are reading the pixel data.

The time to write one column of data (9450/2 bytes since the reading can be 4 bits per pixel giving 2×4 bit pixels per byte) to DRAM is reduced by using 8 cache lines. If 4 lines were written out at one time, the 4 banks can be written to independently, and thus overlap latency reduced. Thus the 4725 bytes can be written in 11,840 ns (4725/128*320 ns). Thus the time taken to write a given column's data to DRAM uses just under 13% of the available bandwidth.

Decoding an Artcard

A simple look at the data sizes shows the impossibility of fitting the process into the 8 MB of memory 33 if the entire Artcard pixel data (140 MB if each bit is read as a 3×3 array) as read by the linear CCD 34 is kept. For this reason, the reading of the linear CCD, decoding of the bitmap, and the un-bitmap process should take place in real time (while the Artcard 9 is traveling past the linear CCD 34), and these processes must effectively work without having entire data stores available.

When an Artcard 9 is inserted, the old stored Print Image and any expanded Photo Image becomes invalid. The new Artcard 9 can contain directions for creating a new image based on the currently captured Photo Image. The old Print Image is invalid, and the area holding expanded Photo Image data and image pyramid is invalid, leaving more than 5 MB that can be used as scratch memory during the read process. Strictly speaking, the 1 MB area where the Artcard raw data is to be written can also be used as scratch data during the Artcard read process as long as by the time the final Reed-Solomon. decode is to occur, that 1 MB area is free again. The reading process described here does not make use of the extra 1 MB area (except as a final destination for the data).

It should also be noted that the unscrambling process requires two sets of 2 MB areas of memory since unscrambling cannot occur in place. Fortunately the 5 MB scratch area contains enough space for this process.

Figure 37:
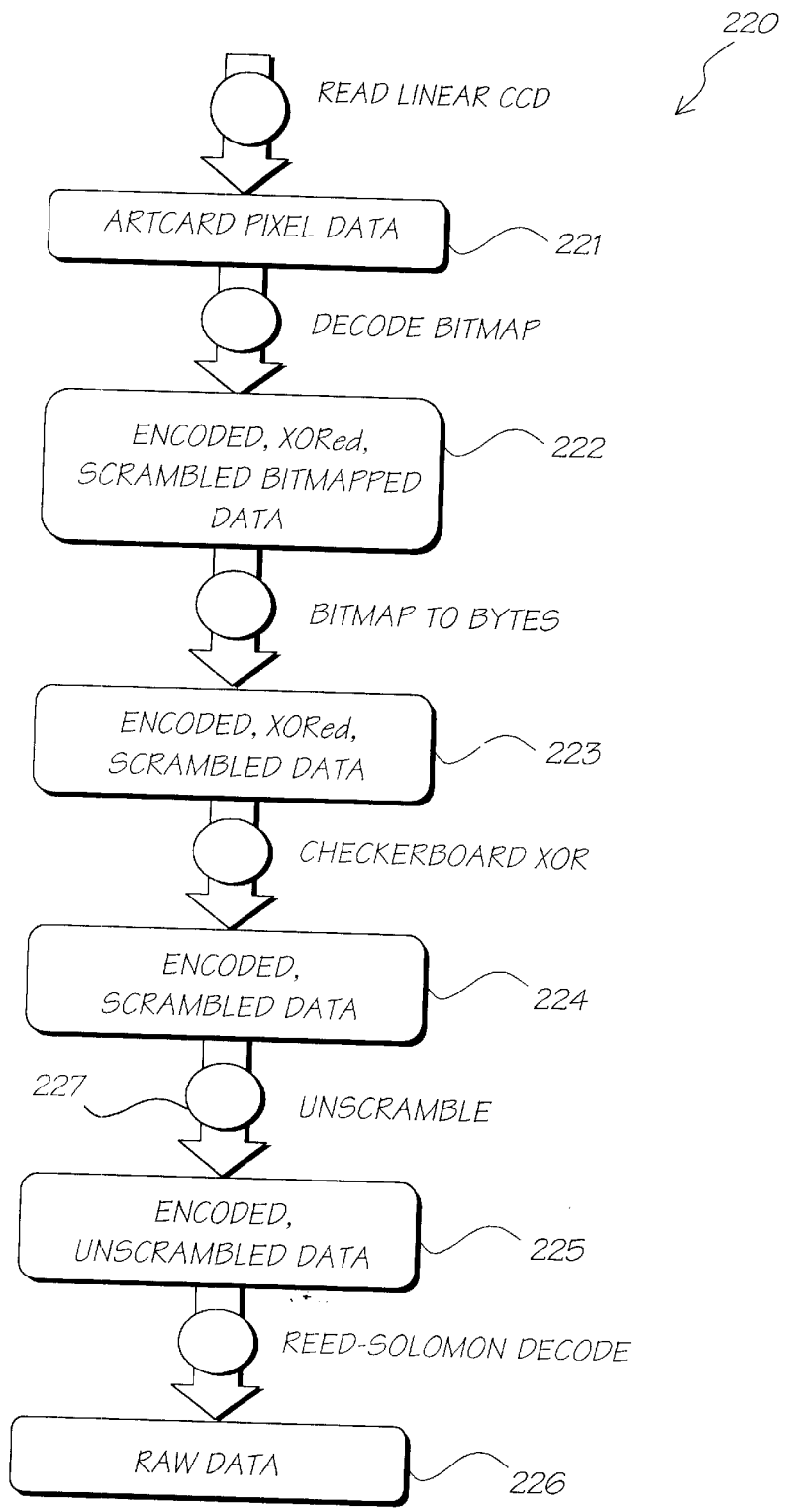
FIG. 37 illustrates a flow chart of the steps necessary to decode an Artcard.

Turning now to FIG. 37, there is shown a flowchart 220 of the steps necessary to decode the Artcard data. These steps include reading in the Artcard 221, decoding the read data to produce corresponding encoded XORed scrambled bitmap data 223. Next a checkerboard XOR is applied to the data to produces encoded scrambled data 224. This data is then unscrambled 227 to produce data 225 before this data is subjected to Reed-Solomon decoding to produce the original raw data 226. Alternatively, unscrambling and XOR process can take place together, not requiring a separate pass of the data. Each of the above steps is discussed in further detail hereinafter. As noted previously with reference to FIG. 37, the Artcard interface, therefore, has 4 phases, the first 2 of which are time-critical, and must take place while pixel data is being read from the CCD:

Phase 1. Detect data area on Artcard

Phase 2. Detect bit pattern from Artcard based on CCD pixels, and write as bytes.

Phase 3. Descramble and XOR the byte-pattern

Phase 4. Decode data (Reed-Solomon decode)

The four phases are described in more detail as follows:

Phase 1. As the Artcard 9 moves past the CCD 34 the AI must detect the start of the data area by robustly detecting special targets on the Artcard to the left of the data area. If these cannot be detected, the card is marked as invalid. The detection must occur in real-time, while the Artcard 9 is moving past the CCD 34.

If necessary, rotation invariance can be provided. In this case, the targets are repeated on the right side of the Artcard, but relative to the bottom right corner instead of the top corner. In this way the targets end up in the correct orientation if the card is inserted the "wrong" way. Phase 3 below can be altered to detect the orientation of the data, and account for the potential rotation.

Phase 2. Once the data area has been determined, the main read process begins, placing pixel data from the CCD into an 'Artcard data window', detecting bits from this window, assembling the detected bits into bytes, and constructing a byte-image in DRAM. This must all be done while the Artcard is moving past the CCD.

Phase 3. Once all the pixels have been read from the Artcard data area, the Artcard motor 37 can be stopped, and the byte image descrambled and XORed. Although not requiring real-time performance, the process should be fast enough not to annoy the human operator. The process must take 2 MB of scrambled bit-image and write the unscrambled/XORed bit-image to a separate 2 MB image.

Phase 4. The final phase in the Artcard read process is the Reed-Solomon decoding process, where the 2 MB bit-image is decoded into a 1 MB valid Artcard data area. Again, while not requiring real-time performance it is still necessary to decode quickly with regard to the human operator. If the decode process is valid, the card is marked as valid. If the decode failed, any duplicates of data in the bit-image are attempted to be decoded, a process that is repeated until success or until there are no more duplicate images of the data in the bit image.

The four phase process described requires 4.5 MB of DRAM. 2 MB is reserved for Phase 2 output, and 0.5 MB is reserved for scratch data during phases 1 and 2. The remaining 2 MB of space can hold over 440 columns at 4725 byes per column. In practice, the pixel data being read is a few columns ahead of the phase 1 algorithm, and in the worst case, about 180 columns behind phase 2, comfortably inside the 440 column limit.

A description of the actual operation of each phase will now be provided in greater detail.

Phase 1—Detect Data Area on Artcard

This phase is concerned with robustly detecting the left-hand side of the data area on the Artcard 9. Accurate detection of the data area is achieved by accurate detection of special targets printed on the left side of the card. These targets are especially designed to be easy to detect even if rotated up to 1 degree.

Figure 38:
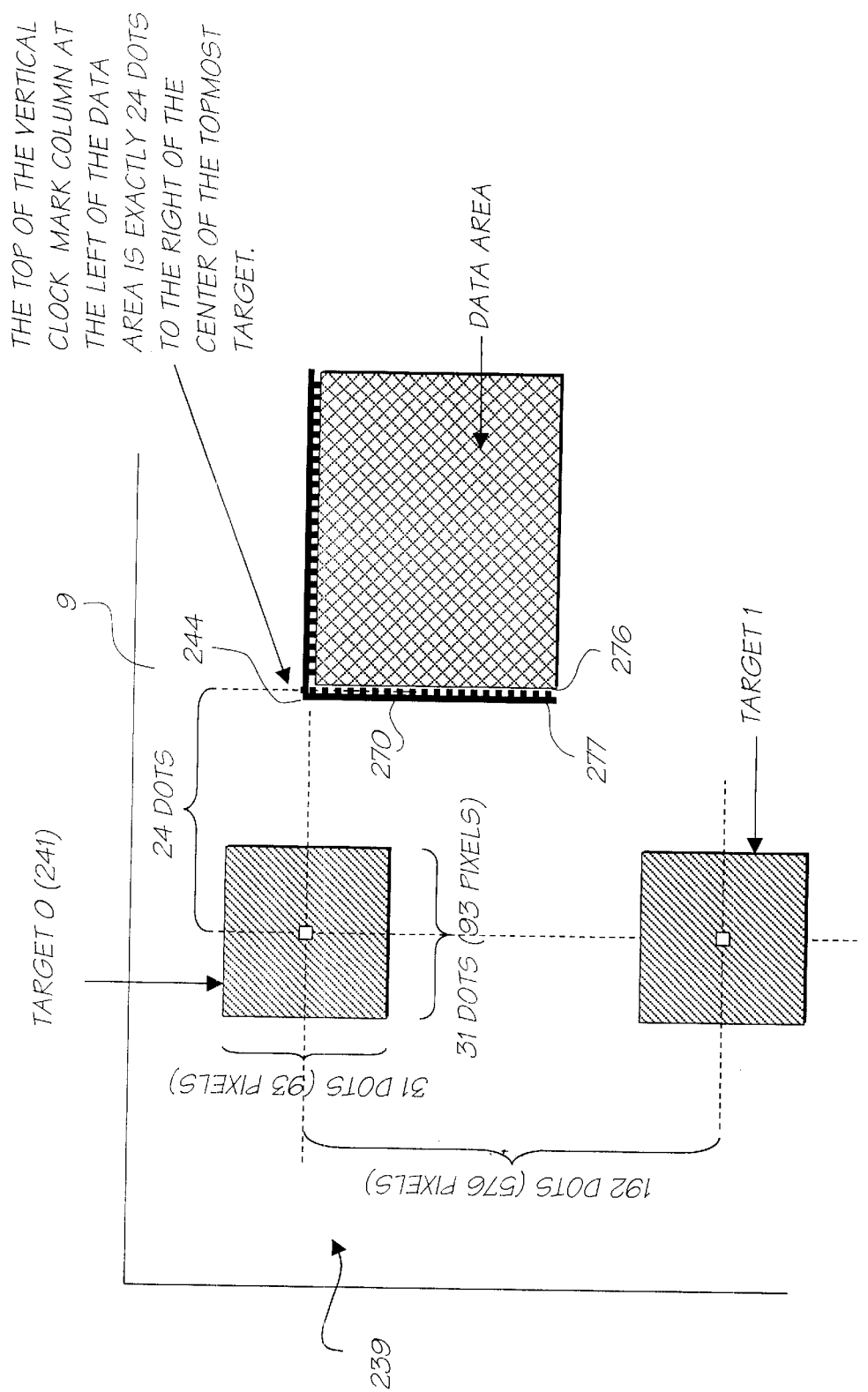
FIG. 38 illustrates an enlargement of the left hand corner of a single Artcard.
Figure 39:
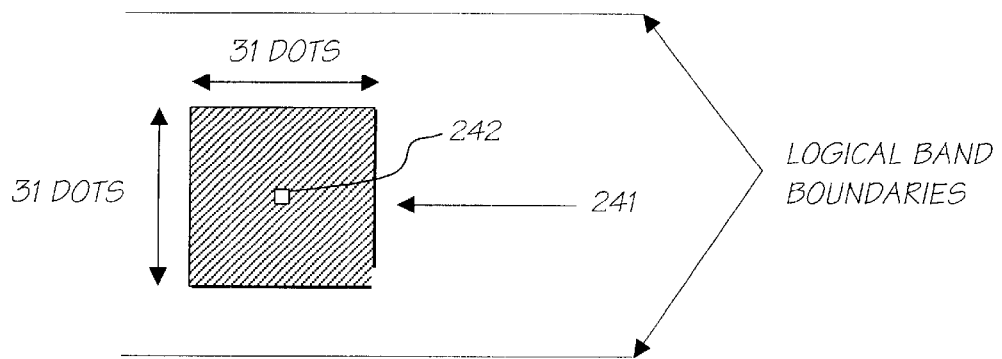
FIG. 39 illustrates a single target for detection.

Turning to FIG. 38, there is shown an enlargement of the left hand side of an Artcard 9. The side of the card is divided into 16 bands, 239 with a target eg. 241 located at the center of each band. The bands are logical in that there is no line drawn to separate bands. Turning to FIG. 39, there is shown a single target 241. The target 241, is a printed black square containing a single white dot. The idea is to detect firstly as many targets 241 as possible, and then to join at least 8 of the detected white-dot locations into a single logical straight line. If this can be done, the start of the data area 243 is a fixed distance from this logical line. If it cannot be done, then the card is rejected as invalid.

As shown in FIG. 38, the height of the card 9 is 3150 dots. A target (Target0) 241 is placed a fixed distance of 24 dots away from the top left corner 244 of the data area so that it falls well within the first of 16 equal sized regions 239 of 192 dots (576 pixels) with no target in the final pixel region of the card. The target 241 must be big enough to be easy to detect, yet be small enough not to go outside the height of the region if the card is rotated 1 degree. A suitable size for the target is a 31×31 dot (93×93 sensed pixels) black square 241 with the white dot 242.

At the worst rotation of 1 degree, a 1 column shift occurs every 57 pixels. Therefore in a 590 pixel sized band, we cannot place any part of our symbol in the top or bottom 12 pixels or so of the band or they could be detected in the wrong band at CCD read time if the card is worst case rotated.

Therefore, if the black part of the rectangle is 57 pixels high (19 dots) we can be sure that at least 9.5 black pixels will be read in the same column by the CCD (worst case is half the pixels are in one column and half in the next). To be sure of reading at least 10 black dots in the same column, we must have a height of 20 dots. To give room for erroneous detection on the edge of the start of the black dots, we increase the number of dots to 31, giving us 15 on either side of the white dot at the target's local coordinate (15, 15). 31 dots is 91 pixels, which at most suffers a 3 pixel shift in column, easily within the 576 pixel band.

Thus each target is a block of 31×31 dots (93×93 pixels) each with the composition:
- 15 columns of 31 black dots each (45 pixel width columns of 93 pixels).
- column of 15 black dots (45 pixels) followed by 1 white dot (3 pixels) and then a further 15 black dots (45 pixels)
- 15 columns of 31 black dots each (45 pixel width columns of 93 pixels)

Detect Targets

Targets are detected by reading columns of pixels, one column at a time rather than by detecting dots. It is necessary to look within a given band for a number of columns consisting of large numbers of contiguous black pixels to build up the left side of a target. Next, it is expected to see a white region in the center of further black columns, and finally the black columns to the left of the target center.

Eight cache lines are required for good cache performance on the reading of the pixels. Each logical read fills 4 cache lines via 4 sub-reads while the other 4 cache-lines are being used. This effectively uses up 13% of the available DRAM bandwidth.

Figure 40:
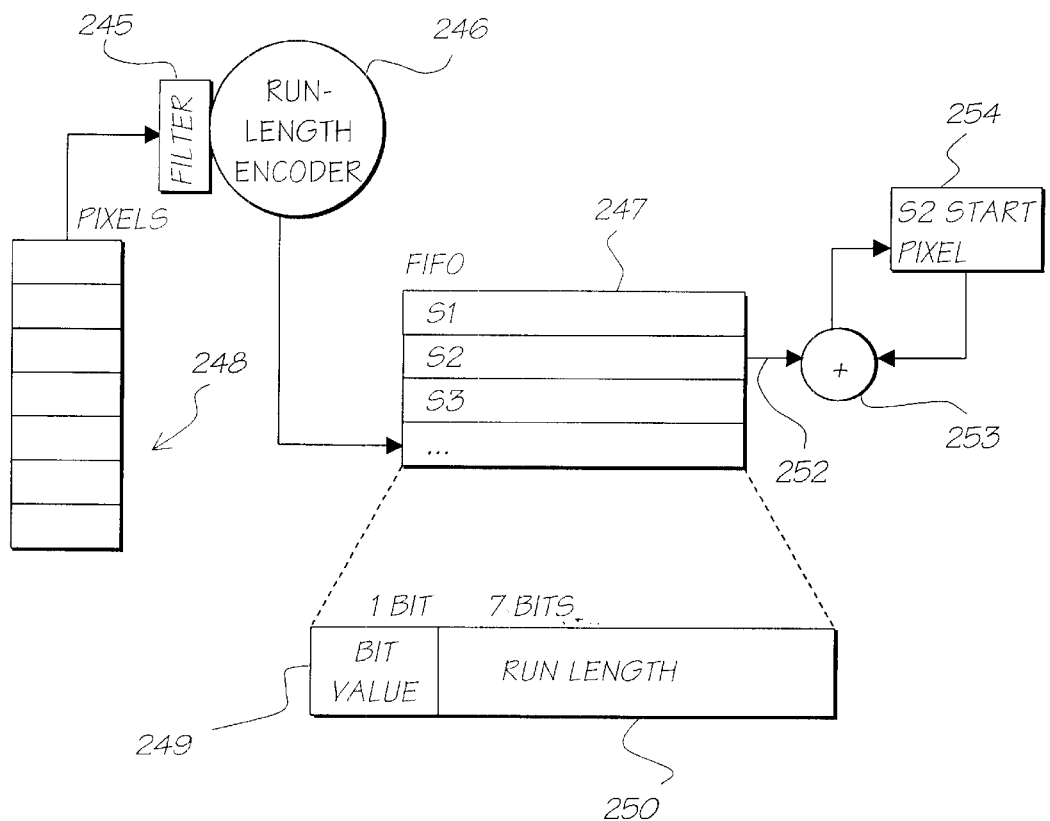
FIG. 40 illustrates the method utilised to detect targets.
Figure 41:
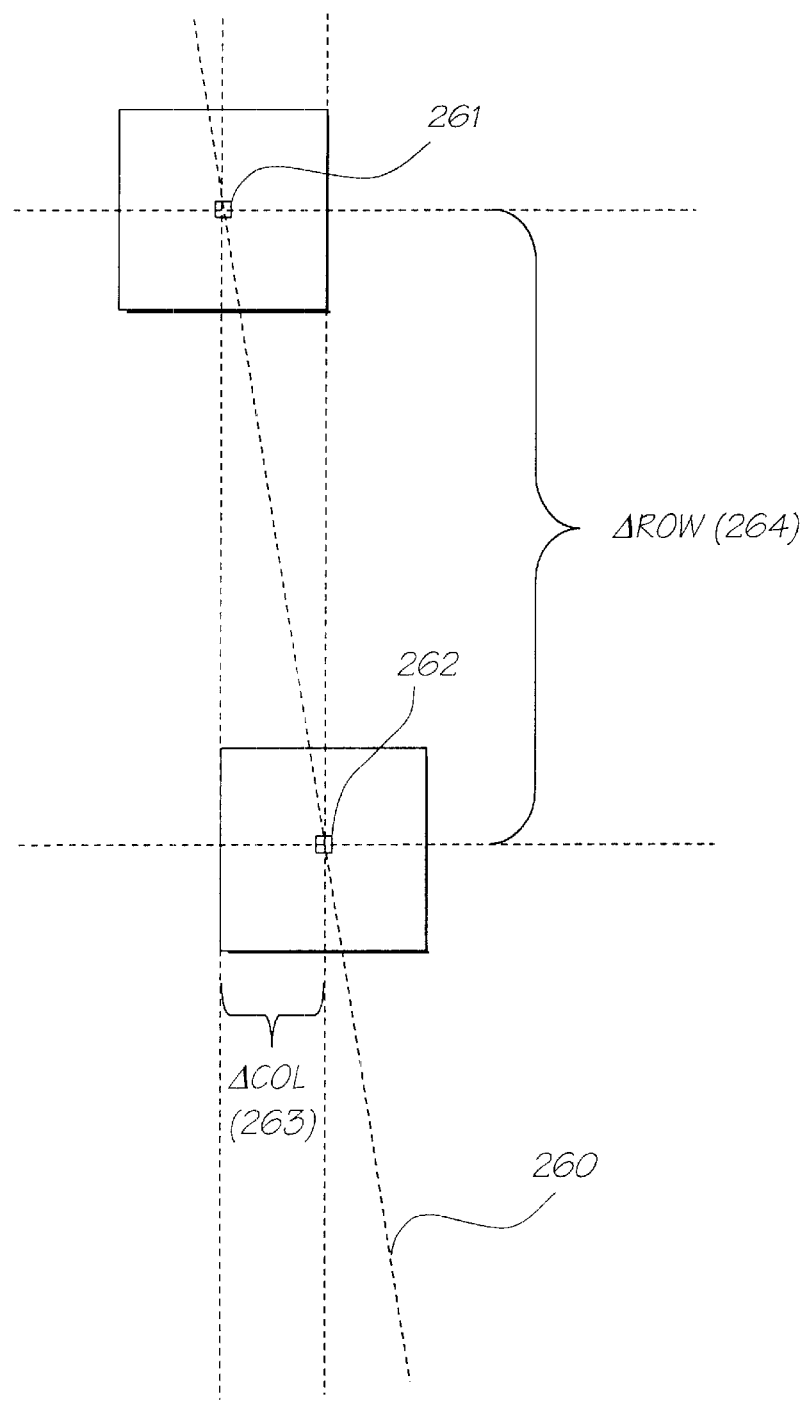
FIG. 41 illustrates the method of calculating the distance between two targets.

As illustrated in FIG. 40, the detection mechanism FIFO for detecting the targets uses a filter 245, run-length encoder 246, and a FIFO 247 that requires special wiring of the top 3 elements (S1, S2, and S3) for random access.

The columns of input pixels are processed one at a time until either all the targets are found, or until a specified number of columns have been processed. To process a column, the pixels are read from DRAM, passed through a filter 245 to detect a 0 or 1, and then run length encoded 246. The bit value and the number of contiguous bits of the same value are placed. in FIFO 247. Each entry of the FIFO 249 is in 8 bits, 7 bits 250 to hold the run-length, and 1 bit 249 to hold the value of the bit detected.

The run-length encoder 246 only encodes contiguous pixels within a 576 pixel (192 dot) region.

The top 3 elements in the FIFO 247 can be accessed 252 in any random order. The run lengths (in pixels) of these entries are filtered into 3 values: short, medium, and long in accordance with the following table:

Looking at the top three entries in the FIFO 247 there are 3 specific cases of interest:

Preferably, the following information per region band is kept:

Given a total of 7 bytes. It makes address generation easier if the total is assumed to be 8 bytes. Thus 16 entries requires 16*8=128 bytes, which fits in 4 cache lines. The address range should be inside the scratch 0.5 MB DRAM area since other phases make use of the remaining 4 MB data area.

When beginning to process a given pixel column, the register value S2StartPixel 254 is reset to 0. As entries in the FIFO advance from S2 to S1, they are also added 255 to the existing S2StartPixel value, giving the exact pixel position of the run currently defined in S2. Looking at each of the 3 cases of interest in the FIFO, S2StartPixel can be used to determine the start of the black area of a target (Cases 1 and 2) and also the start of the white dot in the center of the target (Case 3). An algorithm for processing columns can be as follows:

The steps involved in the processing a column (Process Column) are as follows:

The processing for each of the 3 (Process Cases) cases is as follows:

Case 1
Case 2

No special processing is recorded except for setting the 'PrevCaseWasCase2' flag for identifying Case 3 (see Step 3 of processing a column described above)

Case 3

At the end of processing a given column, a comparison is made of the current column to the maximum number of columns for target detection. If the number of columns allowed has been exceeded, then it is necessary to check how many targets have been found. If fewer than 8 have been found, the card is considered invalid.

Process Targets

After the targets have been detected, they should be processed. All the targets may be available or merely some of them. Some targets may also have been erroneously detected.

This phase of processing is to determine a mathematical line that passes through the center of as many targets as possible. The more targets that the line passes through, the more confident the target position has been found. The limit is set to be 8 targets. If a line passes through at least 8 targets, then it is taken to be the right one.

It is all right to take a brute-force but straightforward approach since there is the time to do so (see below), and lowering complexity makes testing easier. It is necessary to determine the line between targets 0 and 1 (if both targets are considered valid) and then determine how many targets fall on this line. Then we determine the line between targets 0 and 2, and repeat the process. Eventually we do the same for the line between targets 1 and 2, 1 and 3 etc. and finally for the line between targets 14 and 15. Assuming all the targets have been found, we need to perform 15+14+13+ . . . =90 sets of calculations (with each set of calculations requiring 16 tests=1440 actual calculations), and choose the line which has the maximum number of targets found along the line. The algorithm for target location can be as follows:

TargetA:=0
   MaxFound:=0
   BestLine:=0
   While (TargetA<15)
     It (TargetA is Valid)
     TargetB:=TargetA+1
     While (TargetB<=15)
     If (TargetB is valid)
     CurrentLine:=line between TargetA and TargetB
     TargetC:=0;
     While (TargetC<=15)
       If (TargetC valid AND TargetC on line AB)
         TargetsHit++
       EndIf
       If (TargetsHit>MaxFound)
         MaxFound:=TargetsHit
         BestLine:=CurrentLine
       EndIf
       TargetC++
     EndWhile
     EndIf
     TargetB ++
     EndWhile
    EndIf
    TargetA++
   EndWhile
   If (MaxFound<8)
     Card is Invalid
   Else
     Store expected centroids for rows based on BestLine
   EndIf As illustrated in FIG. 34, in the algorithm above, to determine a CurrentLine 260 from Target A 261 and target B, it is necessary to calculate $\Delta$row (264) & $\Delta$column (263) between targets 261, 262, and the location of Target A. It is then possible to move from Target 0 to Target 1 etc. by adding $\Delta$row and $\Delta$column. The found (if actually found) location of target N can be compared to the calculated expected position of Target N on the line, and if it falls within the tolerance, then Target N is determined to be on the line.

To calculate $\Delta$row & $\Delta$column:

$$\Delta\text{row}=(\text{row}_{TargetA}-\text{row}_{TargetB})/(B-A)$$

$$\Delta\text{column}=(\text{column}_{TargetA}-\text{column}_{TargetB})/(B-A)$$

Then we calculate the position of Target0:

$$\text{row}=\text{rowTargetA}-(A*\Delta\text{row})$$

$$\text{column}=\text{columnTargetA}-(A*\Delta\text{column})$$

And compare (row, column) against the actual $\text{row}_{Target0}$ and $\text{column}_{Target0}$. To move from one expected target to the next (e.g. from Target0 to Target1), we simply add $\Delta$row and $\Delta$column to row and column respectively. To check if each target is on the line, we must calculate the expected position of Target0, and then perform one add and one comparison for each target ordinate.

At the end of comparing all 16 targets against a maximum of 90 lines, the result is the best line through the valid targets. If that line passes through at least 8 targets (i.e. MaxFound>=8), it can be said that enough targets have been found to form a line, and thus the card can be processed. If the best line passes through fewer than 8, then the card is considered invalid.

The resulting algorithm takes 180 divides to calculate $\Delta$row and $\Delta$column, 180 multiply/adds to calculate target0 position, and then 2880 adds/comparisons. The time we have to perform this processing is the time taken to read 36 columns of pixel data=3,374,892 ns. Not even accounting for the fact that an add takes less time than a divide, it is necessary to perform 3240 mathematical operations in 3,374,892 ns. That gives approximately 1040 ns per operation, or 104 cycles. The CPU can therefore safely perform the entire processing of targets, reducing complexity of design.

Update Centroids Based on Data Edge Border and Clockmarks Step 0: Locate the Data Area From Target 0 (241 of FIG. 38) it is a predetermined fixed distance in rows and columns to the top left border 244 of the data area, and then a further 1 dot column to the vertical clock marks 276. So we use TargetA, $\Delta$row and $\Delta$column found in the previous stage ($\Delta$row and $\Delta$column refer to distances between targets) to calculate the centroid or expected location for Target0 as described previously.

Since the fixed pixel offset from Target0 to the data area is related to the distance between targets (192 dots between targets, and 24 dots between Target0 and the data area 243), simply add $\Delta row/8$ to Target0's centroid column coordinate (aspect ratio of dots is 1:1). Thus the top co-ordinate can be defined as:

$$(column_{DotColumnTop} = column_{Target0} + (\Delta row/8)$$

$$(row_{DotColumnTop} = row_{Target0} + (\Delta column/8)$$

Next $\Delta row$ and $\Delta column$ are updated to give the number of pixels between dots in a single column (instead of between targets) by dividing them by the number of dots between targets:

$$\Delta row = \Delta row/192$$

$$\Delta column = \Delta column/192$$

We also set the currentColumn register (see Phase 2) to be −1 so that after step 2, when phase 2 begins, the current-Column register will increment from −1 to 0.

Step 1: Write Out the Initial Centroid Deltas ($\Delta$) and Bit History

This simply involves writing setup information required for Phase 2.

This can be achieved by writing 0s to all the $\Delta row$ and $\Delta column$ entries for each row, and a bit history. The bit history is actually an expected bit history since it is known that to the left of the clock mark column 276 is a border column 277, and before that, a white area. The bit history therefore is 011, 010, 011, 010 etc.

Step 2: Update the centroids based on actual pixels read.

The bit history is set up in Step 1 according to the expected clock marks and data border. The actual centroids for each dot row can now be more accurately set (they were initially 0 ) by comparing the expected data against the actual pixel values. The centroid updating mechanism is achieved by simply performing step 3 of Phase 2.

Phase 2—Detect Bit Pattern from Artcard Based on Pixels Read, and Write as Bytes Since a dot from the Artcard 9 requires a minimum of 9 sensed pixels over 3 columns to be represented, there is little point in performing dot detection calculations every sensed pixel column. It is better to average the time required for processing over the average dot occurrence, and thus make the most of the available processing time. This allows processing of a column of dots from an Artcard 9 in the time it takes to read 3 columns of data from the Artcard. Although the most likely case is that it takes 4 columns to represent a dot, the 4$^{th}$ column will be the last column of one dot and the first column of a next dot. Processing should therefore be limited to only 3 columns.

As the pixels from the CCD are written to the DRAM in 13% of the time available, 83% of the time is available for processing of 1 column of dots i.e. 83% of (93,747*3)=83% of 281,241 ns=233,430 ns.

In the available time, it is necessary to detect 3150 dots, and write their bit values into the raw data area of memory. The processing therefore requires the following steps:

For each column of dots on the Artcard:

Step 0: Advance to the next dot column

Step 1: Detect the top and bottom of an Artcard dot column (check clock marks)

Step 2: Process the dot column, detecting bits and storing them appropriately

Step 3: Update the centroids

Since we are processing the Artcard's logical dot columns, and these may shift over 165 pixels, the worst case is that we cannot process the first column until at least 165 columns have been read into DRAM. Phase 2 would therefore finish the same amount of time after the read process had terminated. The worst case time is: 165*93,747 ns=15,468,255 ns or 0.015 seconds.

Step 0: Advance to the Next Dot Column

In order to advance to the next column of dots we add $\Delta row$ and $\Delta column$ to the dotColumnTop to give us the centroid of the dot at the top of the column. The first time we do this, we are currently at the clock marks column 276 to the left of the bit image data area, and so we advance to the first column of data. Since $\Delta row$ and $\Delta column$ refer to distance between dots within a column, to move between dot columns it is necessary to add $\Delta row$ to column$_{dotColumnTop}$ and $\Delta column$ to row$_{dotColumnTop}$.

To keep track of what column number is being processed, the column number is recorded in a register called Current-Column. Every time the sensor advances to the next dot column it is necessary to increment the CurrentColumn register. The first time it is incremented, it is incremented from −1 to 0 (see Step 0 Phase 1) The CurrentColumn register determines when to terminate the read process (when reaching maxColumns), and also is used to advance the DataOut Pointer to the next column of byte information once all 8 bits have been written to the byte (once every 8 dot columns). The lower 3 bits determine what bit we're up to within the current byte. It will be the same bit being written for the whole column.

Step 1: Detect the Top and Bottom of an Artcard Dot Column

In order to process a dot column from an Artcard, it is necessary to detect the top and bottom of a column. The column should form a straight line between the top and bottom of the column (except for local warping etc.). Initially dotColumnTop points to the. clock mark column 276. We simply toggle the expected value, write it out into the bit history, and move on to step 2, whose first task will be to add the $\Delta row$ and $\Delta column$ values to dotColumnTop to arrive at the first data dot of the column.

Step 2: Process an Artcard's Dot Column

Given the centroids of the top and bottom of a column in pixel coordinates the column should form a straight line between them, with possible minor variances due to warping etc.

Assuming the processing is to start at the top of a column (at the top centroid coordinate) and move down to the bottom of the column, subsequent expected dot centroids are given as:

$$row_{next} = row + \Delta row$$

$$column_{next} = column + \Delta column$$

This gives us the address of the expected centroid for the next dot of the column. However to account for local warping and error we add another $\Delta row$ and $\Delta column$ based on the last time we found the dot in a given row. In this way we can account for small drifts that accumulate into a maximum drift of some percentage from the straight line joining the top of the column to the bottom.

We therefore keep 2 values for each row, but store them in separate tables since the row history is used in step 3 of this phase.

$\Delta row$ and $\Delta column$ (2@4 bits each=1 byte)

row history (3 bits per row, 2 rows are stored per byte)

For each row we need to read a $\Delta row$ and $\Delta column$ to determine the change to the centroid. The read process takes 5% of the bandwidth and 2 cache lines:

76*(3150/32)+2*3150=13,824 ns=5% of bandwidth

Once the centroid has been determined, the pixels around the centroid need to be examined to detect the status of the dot and hence the value of the bit. In the worst case a dot covers a 4×4 pixel area. However, thanks to the fact that we are sampling at 3 times the resolution of the dot, the number of pixels required to detect the status of the dot and hence the bit value is much less than this. We only require access to 3 columns of pixel columns at any one time.

In the worst case of pixel drift due to a 1% rotation, centroids will shift 1 column every 57 pixel rows, but since a dot is 3 pixels in diameter, a given column will be valid for 171 pixel rows (3*57). As a byte contains 2 pixels, the number of bytes valid in each buffered read (4 cache lines) will be a worst case of 86 (out of 128 read).

Once the bit has been detected it must be written out to DRAM. We store the bits from 8 columns as a set of contiguous bytes to minimize DRAM delay. Since all the bits from a given dot column will correspond to the next bit position in a data byte, we can. read the old value for the byte, shift and OR in the new bit, and write the byte back. The read/shift&OR/write process requires 2 cache lines.

We need to read and write the bit history for the given row as we update it. We only require 3 bits of history per row, allowing the storage of 2 rows of history in a single byte. The read/shift&OR/write process requires 2 cache lines.

The total bandwidth required for the bit detection and storage is summarised in the following table:

Detecting a Dot

The process of detecting the value of a dot (and hence the value of a bit) given a centroid is accomplished by examining 3 pixel values and getting the result from a lookup table. The process is fairly simple and is illustrated in FIG. 42. A dot 290 has a radius of about 1.5 pixels. Therefore the pixel 291 that holds the centroid, regardless of the actual position of the centroid within that pixel, should be 100% of the dot's value. If the centroid is exactly in the center of the pixel 291, then the pixels above 292 & below 293 the centroid's pixel, as well as the pixels to the left 294 & right 295 of the centroid's pixel will contain a majority of the dot's value. The further a centroid is away from the exact center of the pixel 295, the more likely that more than the center pixel will have 100% coverage by the dot.

Although FIG. 42 only shows centroids differing to the left and below the center, the same relationship obviously holds for centroids above and to the right of center center. In Case 1, the centroid is exactly in the center of the middle pixel 295. The center pixel 295 is completely covered by the dot, and the pixels above, below, left, and right are also well covered by the dot. In Case 2, the centroid is to the left of the center of the middle pixel 291. The center pixel is still completely covered by the dot, and the pixel 294 to the left of the center is now completely covered by the dot. The pixels above 292 and below 293 are still well covered. In Case 3, the centroid is below the center of the middle pixel 291. The center pixel 291 is still completely covered by the dot 291, and the pixel below center is now completely covered by the dot. The pixels left 294 and right 295 of center are still well covered. In Case 4, the centroid is left and below the center of the middle pixel. The center pixel 291 is still completely covered by the dot, and both the pixel to the left of center 294 and the pixel below center 293 are completely covered by the dot.

The algorithm for updating the centroid uses the distance of the centroid from the center of the middle pixel 291 in order to select 3 representative pixels and thus decide the value of the dot:

Pixel 1: the pixel containing the centroid

Pixel 2: the pixel to the left of Pixel 1 if the centroid's X coordinate (column value) is <½, otherwise the pixel to the right of Pixel 1.

Pixel 3: the pixel above pixel 1 if the centroid's Y coordinate (row value) is <½, otherwise the pixel below Pixel 1.

As shown in FIG. 43, the value of each pixel is output to a pre-calculated lookup table 301. The 3 pixels are fed into a 12-bit lookup table, which outputs a single bit indicating the value of the dot—on or off. The lookup table 301 is constructed at chip definition time, and can be compiled into about 500 gates. The lookup table can be a simple threshold table, with the exception that the center pixel (Pixel 1) is weighted more heavily.

Step 3: Update the Centroid Δs for Each Row in the Column

The idea of the Δs processing is to use the previous bit history to generate a 'perfect' dot at the expected centroid location for each row in a current column. The actual pixels (from the CCD) are compared with the expected 'perfect' pixels. If the two match, then the actual centroid location must be exactly in the expected position, so the centroid Δs must be valid and not need updating. Otherwise a process of changing the centroid Δs needs to occur in order to best fit the expected centroid location to the actual data. The new centroid Δs will be used for. processing the dot in the next column.

Updating the centroid Δs is done as a subsequent process from Step 2 for the following reasons:

to reduce complexity in design, so that it can be performed as Step 2 of Phase 1 there is enough bandwidth remaining to allow it to allow reuse of DRAM buffers, and to ensure that all the data required for centroid updating is available at the start of the process without special pipelining.

The centroid Δ are processed as Δcolumn Δrow respectively to reduce complexity.

Although a given dot is 3 pixels in diameter, it is likely to occur in a 4×4 pixel area. However the edge of one dot will as a result be in the same pixel as the edge of the next dot. For this reason, centroid updating requires more than simply the information about a given single dot.

Figure 44:
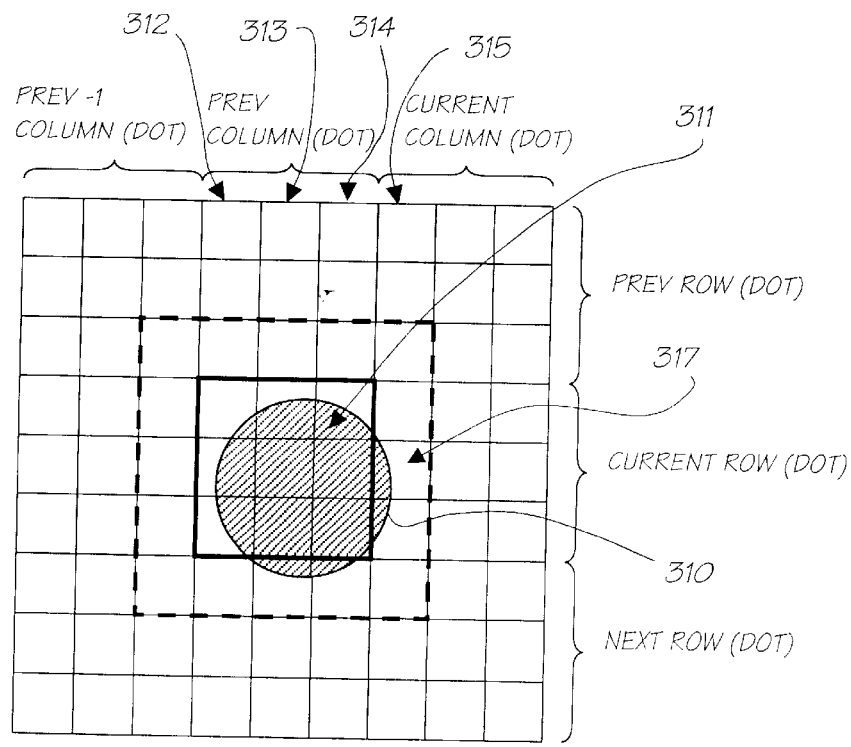
FIG. 44 illustrates the centroid updating process.

FIG. 44 shows a single dot 310 from the previous column with a given centroid 311. In this example, the dot 310 extend Δ over 4 pixel columns 312–315 and in fact, part of the previous dot column's dot (coordinate=(Prevcolumn, Current Row)) has entered the current column for the dot on the current row. If the dot in the current row and column was white, we would expect the rightmost pixel column 314 from the previous dot column to be a low value, since there is only the dot information from the previous column's dot (the current column's dot is white). From this we can see that the higher the pixel value is in this pixel column 315, the more the centroid should be to the right Of course, if the dot to the right was also black, we cannot adjust the centroid as we cannot get information sub-pixel. The same can be said for the dots to the left, above and below the dot at dot coordinates (PrevColumn, CurrentRow).

From this we can say that a maximum of 5 pixel columns and rows are required. It is possible to simplify the situation by taking the cases of row and column centroid Δs separately, treating them as the same problem, only rotated 90 degrees.

Taking the horizontal case first, it is necessary to change the column centroid Δs if the expected pixels don't match the detected pixels. From the bit history, the value of the bits found for the Current Row in the current dot column, the previous dot column, and the (previous-1)th dot column are known. The expected centroid location is also known. Using these two pieces of information, it is possible to generate a 20 bit expected bit pattern should the read be 'perfect'. The 20 bit bit-pattern represents the expected Δ values for each of the 5 pixels across the horizontal dimension. The first nibble would represent the rightmost pixel of the leftmost dot. The next 3 nibbles represent the 3 pixels across the center of the dot 310 from the previous column, and the last nibble would be the pixel 317 of the rightmost dot (from the current column).

If the expected centroid is in the center of the pixel, we a 20 bit pattern based on the following table:

The pixels to the left and right of the center dot are either 0 or D depending on whether the bit was a 0 or 1 respectively. The center three pixels are either 000 or DFD depending on whether the bit was a 0 or 1 respectively. These values are based on the physical area taken by a dot for a given pixel. Depending on the distance of the centroid from the exact center of the pixel, we would expect data shifted slightly, which really only affects the pixels either side of the center pixel. Since there are 16 possibilities, it is possible to divide the distance from the center by 16 and use to shift the expected pixels.

Once the 20 bit 5 pixel expected value has been determined it can be compared against the actual pixels read. This can proceed by subtracting the expected pixels from the actual pixels read on a pixel by pixel basis, and finally adding the differences together to obtain a distance from the expected Δ values.

Figure 45:
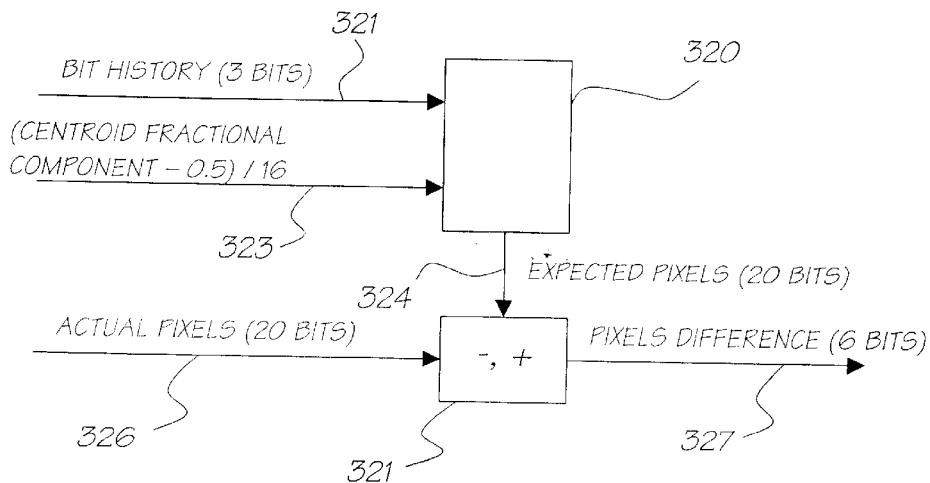
FIG. 45 illustrates a delta processing lookup table utilised in the preferred embodiment.

FIG. 45 illustrates one form of implementation of the above algorithm which includes a look up table 320 which receives the bit history 322 and central fractional component 323 and outputs 324 the corresponding 20 bit number which is subtracted 321 from the central pixel input 326 to produce a pixel difference 327.

This process is carried out for the expected centroid and once for a shift of the centroid left and right by 1 amount in Δcolumn. The centroid with the smallest difference from the actual pixels is considered to be the 'winner' and the Δcolumn updated accordingly (which hopefully is 'no change'). As a result, a Δcolumn cannot change by more than 1 each dot column.

The process is repeated for the vertical pixels, and Δrow is consequentially updated.

There is a large amount of scope here for parallelism. Depending on the rate of the clock chosen for the ACP unit 31 these units can be placed in series (and thus the testing of 3 different Δ could occur in consecutive clock cycles), or in parallel where all 3 can be tested simultaneously. If the clock rate is fast enough, there is less need for parallelism.
Bandwidth Utilization It is necessary to read the old Δ of the Δs, and to write them out again. This takes 10% of the bandwidth:

2* (76(3150/32)+2*3150)=27,648 ns=10% of bandwidth

It is necessary to read the bit history for the given row as we update its Δs. Each byte contains 2 row's bit histories, thus taking 2.5% of the bandwidth:

76((3150/2)/=)+2*(3150/2)=4,085 ns=2.5% of bandwidth

In the worst case of pixel drift due to a 1% rotation, centroids will shift 1 column every 57 pixel rows, but since a dot is 3 pixels in diameter, a given pixel column will be valid for 171 pixel rows (3*57). As a byte contains 2 pixels, the number of bytes valid in cached reads will be a worst case of 86 (out of 128 read). The worst case timing for 5 columns is therefore 31% bandwidth.

5* (((9450/(128*2))*320)*128/86)=88, 112 ns=31% of bandwidth.

The total bandwidth required for the updating the centroid Δ is summarised in the following table:
Memory Usage for Phase 2

The 2 MB bit-image DRAM area is read from and written to during Phase 2 processing. The 2 MB pixel-data DRAM area is read.

The 0.5 MB scratch DRAM area is used for storing row data, namely:
Phase 3—Unscramble and XOR the Raw Data Returning to FIG. 37, the next step in decoding is to unscramble and XOR the raw data. The 2 MB byte image, as taken from the Artcard, is in a scrambled XORed form. It must be unscrambled and re-XORed to retrieve the bit image necessary for the Reed Solomon decoder in phase 4.

Figure 46:
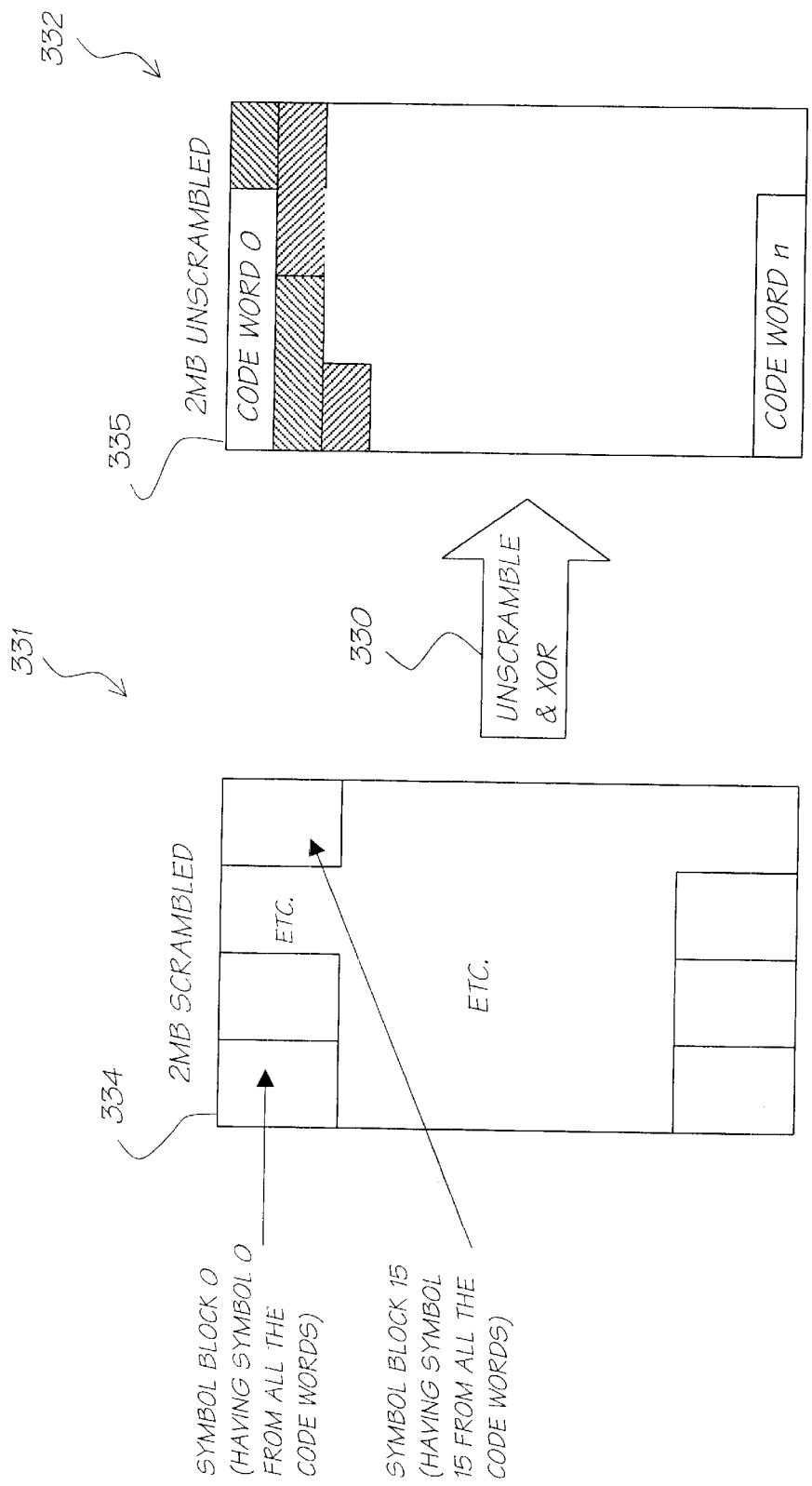
FIG. 46 illustrates the process of unscrambling Artcard data.

Turning to FIG. 46, the unscrambling process 330 takes a 2 MB scrambled byte image 331 and writes an unscrambled 2 MB image 332. The process cannot reasonably be performed in-place, so 2 sets of 2 MB areas are utilised. The scrambled data 331 is in symbol block order arranged in a 16×16 array, with symbol block 0 (334) having all the symbol 0's from all the code words in random order. Symbol block 1 has all the symbol 1's from all the code words in random order etc. Since there are only 255 symbols, the $256^{th}$ symbol block is currently unused.

A linear feedback shift register is used to determine the relationship between the position within a symbol block eg. 334 and what code word eg. 355 it came from. This works as long as the same seed is used when generating the original Artcard images. The XOR of bytes from alternative source lines with 0xAA and 0x55 respectively is effectively free (in time) since the bottleneck of time is waiting for the DRAM to be ready to read/write to non-sequential addresses.

The timing of the unscrambling XOR process is effectively 2 MB of random byte-reads, and 2 MB of random byte-writes i.e. 2*(2 MB *76 ns+2 MB *2 ns)=327,155,712 ns or approximately 0.33 seconds. This timing assumes no caching.
Phase 4—Reed Solomon Decode This phase is a loop, iterating through copies of the data in the bit image, passing them to the Reed-Solomon decode module until either a successful decode is made or until there are no more copies to attempt decode from.

The Reed-Solomon decoder used can be the VLIW processor, suitably programmed or, alternatively, a separate hardwired core such as LSI Logic's L64712. The L64712 has a throughput of 50 Mbits per second (around 6.25 MB per second), so the time may be bound by the speed of the Reed-Solomon decoder rather than the 2 MB read and 1 MB write memory access time (500 MB/sec for sequential accesses). The time taken in the worst case is thus 2/6.25s= approximately 0.32 seconds.
Phase 5 Running the Vark Script The overall time taken to read the Artcard 9 and decode it is therefore approximately 2.15 seconds. The apparent delay to the user is actually only 0.65 seconds (the total of Phases 3 and 4), since the Artcard stops moving after 1.5 seconds.

Once the Artcard is loaded, the Artvark script must be interpreted, Rather than run the script immediately, the script is only run upon the pressing of the 'Print' button 13 (FIG. 1). The taken to run the script will vary depending on the complexity of the script, and must be taken into account for the perceived delay between pressing the print button and the actual print button and the actual printing.

Alternative Artcard Fomat

Of course, other artcard formats are possible. There will now be described one such alternative artcard format with a number of preferable feature. Described hereinafter will be the alternative Artcard data format, a mechanism for mapping user data onto dots on an alternative Artcard, and a fast alternative Artcard reading algorithm for use in embedded. systems where resources are scarce.

Alternative Artcard Overview

The Alternative Artcards can be used in both embedded and PC type applications, providing a user-friendly interface to large amounts of data or configuration information.

While the back side of an alternative Artcard has the same visual appearance regardless of the application (since it stores the data), the front of an alternative Artcard can be application dependent. It must make sense to the user in the context of the application.

Alternative Artcard technology can also be independent of the printing resolution. The notion of storing data as dots on a card simply means that if it is possible put more dots in the same space (by increasing resolution), then those dots can represent more data. The preferred embodiment assumes utilisation of 1600 dpi printing on a 86 mm×55 mm card as the sample Artcard, but it is simple to determine alternative equivalent layouts and data sizes for other card sizes and/or other print resolutions. Regardless of the print resolution, the reading technique remain the same. After all decoding and other overhead has been taken into account, alternative Artcards are capable of storing up to 1 Megabyte of data at print resolutions up to 1600 dpi. Alternative Artcards can store megabytes of data at print resolutions greater than 1600 dpi. The following two tables summarize the effective alternative Artcard data storage capacity for certain print resolutions:

Format of an Alternative Artcard

The structure of data on the alternative Artcard is therefore specifically designed to aid the recovery of data. This section describes the format of the data (back) side of an alternative Artcard.

Dots

Figure 47:
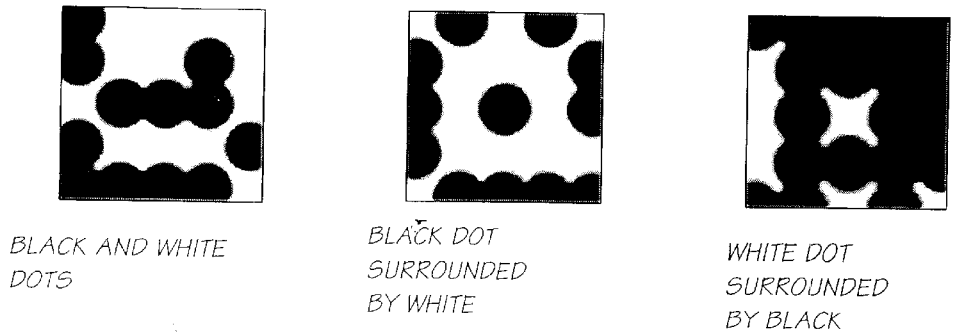
FIG. 47 illustrates a magnified view of a series of dots.

The dots on the data side of an alternative Artcard can be monochrome. For example, black dots printed on a white background at a predetermined desired print resolution. Consequently a "black dot" is physically different from a "white dot". FIG. 47 illustrates various examples of magnified views of black and white dots. The monochromatic scheme of black dots on a white background is preferably chosen to maximize dynamic range in blurry reading environments.

Although the black dots are printed at a particular pitch (eg. 1600 dpi), the dots themselves are slightly larger in order to create continuous lines when dots are printed contiguously. In the example images of FIG. 47, the dots are not as merged as they may be in reality as a result of bleeding. There would be more smoothing out of the black indentations. Although the alternative Artcard system described in the preferred embodiment allows for flexibly different dot sizes, exact dot sizes and ink/printing behaviour for a particular printing technology should be studied in more detail in order to obtain best results.

In describing this artcard embodiment, the term dot refers to a physical printed dot (ink, thermal, electro-photographic, silver-halide etc) on an alternative Artcard. When an alternative Artcard reader scans an alternative Artcard, the dots must be sampled at least double the printed resolution to satisfy Nyquist's Theorem. The term pixel refers to a sample value from an alternative Artcard reader device. For example, when 1600 dpi dots are scanned at 4800 dpi there are 3 pixels in each dimension of a dot, or 9 pixels per dot. The sampling process will be further explained hereinafter.

Figure 48:
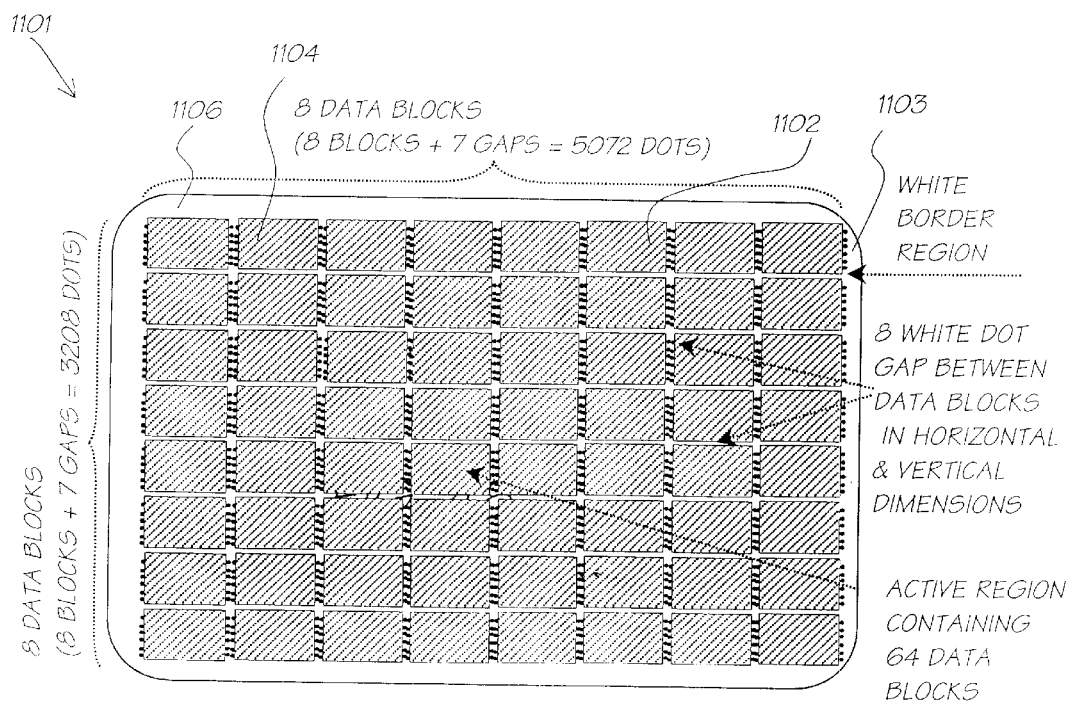
FIG. 48 illustrates the data surface of a dot card.

Turning to FIG. 48, there is shown the data surface 1101 a sample of alternative Artcard. Each alternative Artcard consists of an "active" region 1102 surrounded by a white border region 1103. The white border 1103 contains no data information, but can be used by an alternative Artcard reader to calibrate white levels. The active region is an array of data blocks eg. 1104, with each data block separated from the next by a gap of 8 white dots eg. 1106. Depending on the print resolution, the number of data blocks on an alternative Artcard will vary. On a 1600 dpi alternative Artcard, the array can be 8×8. Each data block 1104 has dimensions of 627×394 dots. With an inter-block gap 1106 of 8 white dots, the active area of an alternative Artcard is therefore 5072× 3208 dots (8.1 mm×5.1 mm at 1600 dpi).

Data Blocks

Turning now to FIG. 49, there is shown a single data block 1107. The active region of an alternative Artcard consists of an array of identically structured data blocks 1107. Each of the data blocks has the following structure: a data region 1108 surrounded by clock-marks 1109, borders 1110, and targets 1111. The data region holds the encoded data proper, while the clock-marks, borders and targets are present specifically to help locate the data region and ensure accurate recovery of data from within the region.

Each data block 1107 has dimensions of 627×394 dots. Of this, the central area of 595×384 dots is the data region 1108. The surrounding dots are used to hold the clock-marks, borders, and targets.

Borders and Clockmarks

FIG. 50 illustrates a data block with FIG. 51 and FIG. 52 illustrating magnified edge portions thereof. As illustrated in FIG. 51 and FIG. 52, there are two 5 dot high border and clockmark regions 1170, 1177 in each data block: one above and one below the data region. For example, The top 5 dot high region consists of an outer black dot border line 1112 (which stretches the length of the data block), a white dot separator line 1113 (to ensure the border line is independent), and a 3 dot high set of clock marks 1114. The clock marks alternate between a white and black row, starting with a black clock mark at the 8th column from either end of the data block. There is no separation between clockmark dots and dots in the data region.

The clock marks are symmetric in that if the alternative Artcard is inserted rotated 180 degrees, the same relative border/clockmark regions will be encountered. The border 1112, 1113 is intended for use by an alternative Artcard reader to keep vertical tracking as data is read from the data region. The clockmarks 1114 are intended to keep horizontal tracking as data is read from the data region. The separation between the border and clockmarks by a white line of dots is desirable as a result of blurring occurring during reading. The border thus becomes a black line with white on either side, making for a good frequency response on reading. The clockmarks alternating between white and black have a similar result, except in the horizontal rather than the vertical dimension. Any alternative Artcard reader must locate the clockmarks and border if it intends to use them for tracking. The next section deals with targets, which are designed to point the way to the clockmarks, border and data.

Targets in the Target Region

Figure 53:
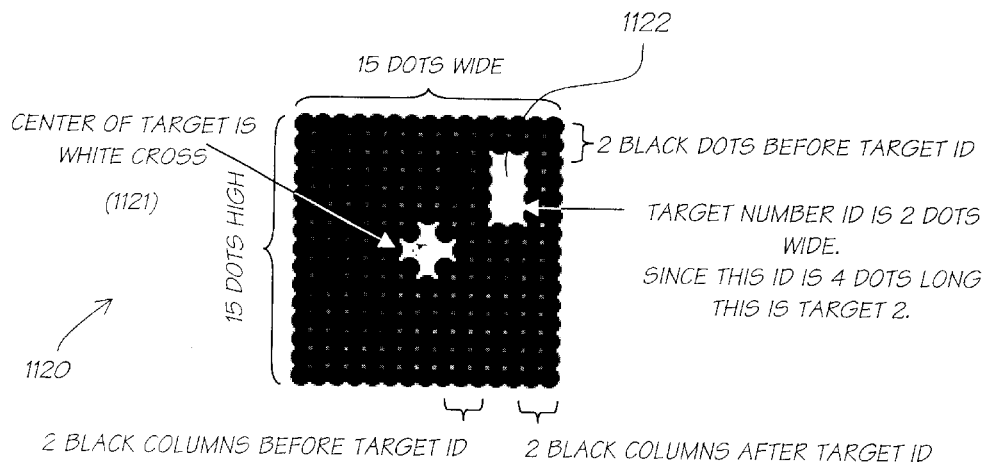
FIG. 53 illustrates a single target structure.
Figure 54:
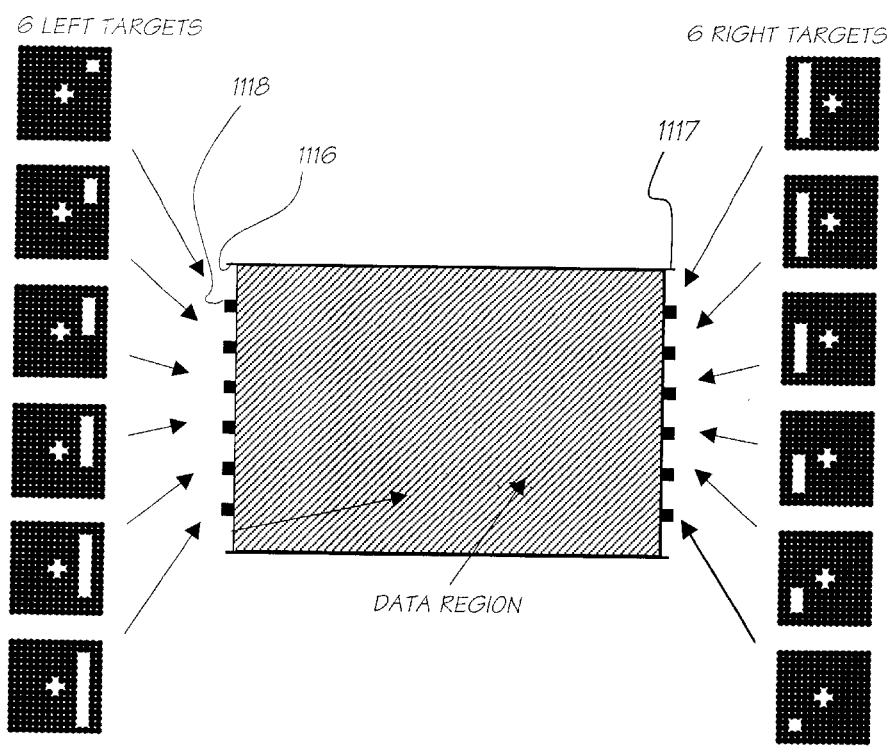
FIG. 54 illustrates the target structure of a datablock.

As shown in FIG. 54, there are two 15-dot wide target regions 1116, 1117 in each data block: one to the left and one to the right of the data region: The target regions are separated from the data region by a single column of dots used for orientation. The purpose of the Target Regions 1116, 1117 is to point the way to the clockmarks, border and data regions. Each Target Region contains 6 targets eg. 1118 that are designed to be easy to find by an alternative Artcard reader. Turning now to FIG. 53 there is shown the structure of a single target 1120. Each target 1120 is a 15×15 dot black square with a center structure 1121 and a run-length encoded target number 1122. The center structure 1121 is a simple white cross, and the target number component 1122 is simply two columns of white dots, each being 2 dots long for each part of the target number. Thus target number 1's target id 1122 is 2 dots long, target number 2's target id 1122 is 4 dots wide etc.

As shown in FIG. 54, the targets are arranged so that they are rotation invariant with regards to card insertion. This means that the left targets and right targets are the same, except rotated 180 degrees. In the left Target Region 1116, the targets are arranged such that targets 1 to 6 are located top to bottom respectively. In the right Target Region, the targets are arranged so that target numbers 1 to 6 are located bottom to top. The target number id is always in the half closest to the data region. The magnified view portions of FIG. 54 reveals clearly the how the right targets are simply the same as the left targets, except rotated 180 degrees.

Figure 55:
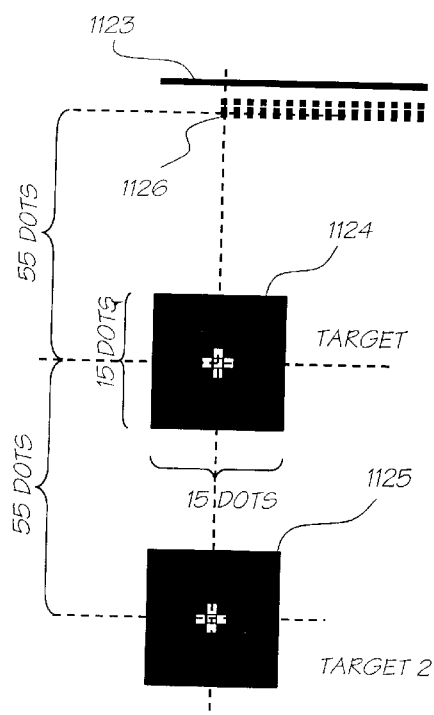
FIG. 55 illustrates the positional relationship of targets relative to border clocking regions of a data region.

As shown in FIG. 55, the targets 1124, 1125 are specifically placed within the Target Region with centers 55 dots apart. In addition, there is a distance of 55 dots from the center of target 1 (1124) to the first clockmark dot 1126 in the upper clockmark region, and a distance of 55 dots from the center of the target to the first clockmark dot in the lower clockmark region (not shown). The first black clockmark in both regions begins directly in line with the target center (the 8th dot position is the center of the 15 dot-wide target).

The simplified schematic illustrations of FIG. 55 illustrates the distances between target centers as well as the distance from Target 1 (1124) to the first dot of the first black clockmark (1126) in the upper border/clockmark region. Since there is a distance of 55 dots to the clockmarks from both the upper and lower targets, and both sides of the alternative Artcard are symmetrical (rotated through 180 degrees), the card can be read left-to-right or right-to-left. Regardless of reading direction, the orientation does need to be determined in order to extract the data from the data region.

Orientation Columns

Figure 56:
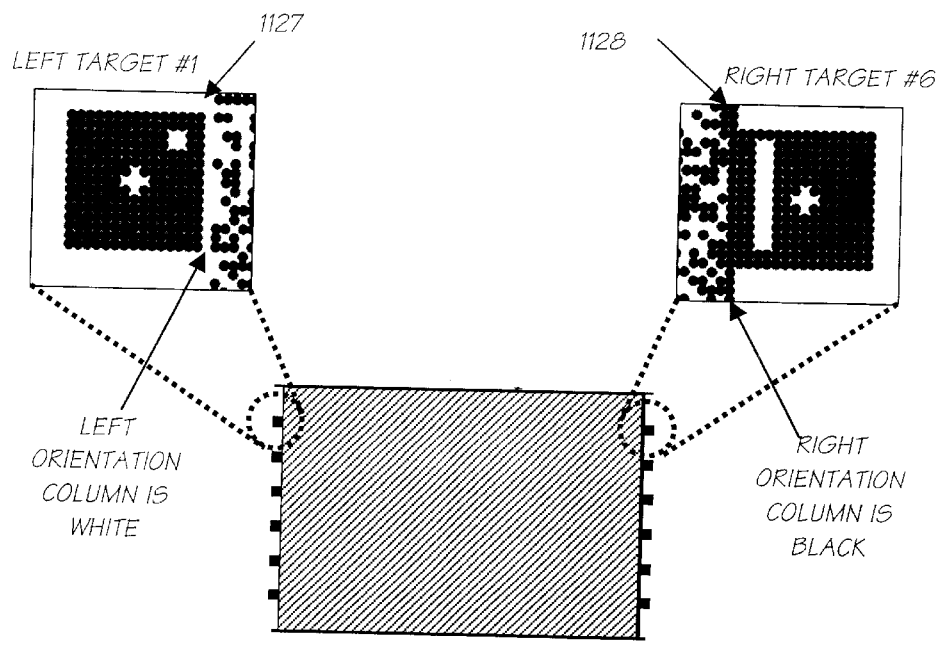
FIG. 56 illustrates the orientation columns of a datablock.
Figure 60:
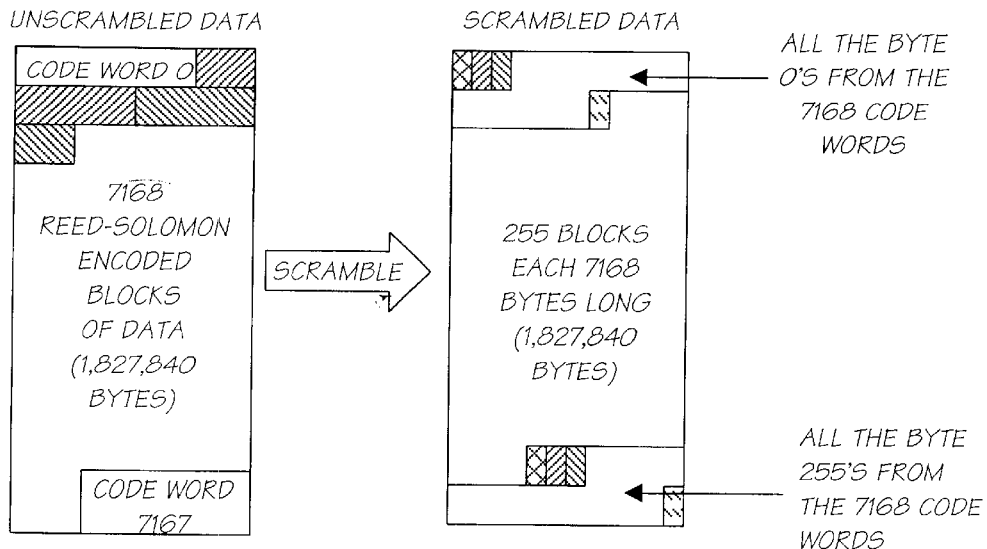
FIG. 60 illustrates the Reed-Solomon encoding process.

As illustrated in FIG. 56, there are two 1 dot wide Orientation Columns 1127, 1128 in each data block: one directly to the left and one directly to the right of the data region. The Orientation Columns are present to give orientation information to an alternative Artcard reader: On the left side of the data region (to the right of the Left Targets) is a single column of white dots 1127. On the right side of the data region (to the left of the Right Targets) is a single column of black dots 1128. Since the targets are rotation invariant, these two columns of dots allow an alternative Artcard reader to determine the orientation of the alternative Artcard—has the card been inserted the right way, or back to front. From the alternative Artcard reader's point of view, assuming no degradation to the dots, there are two possibilities:

If the column of dots to the left of the data region is white, and the column to the right of the data region is black, then the reader will know that the card has been inserted the same way as it was written.

If the column of dots to the left of the data region is black, and the column to the right of the data region is white, then the reader will know that the card has been inserted backwards, and the data region is appropriately rotated. The reader must take appropriate action to correctly recover the information from the alternative Artcard.

Data Region

As shown in FIG. 57, the data region of a data block consists of 595 columns of 384 dots each, for a total of 228,480 dots. These dots must be interpreted and decoded to yield the original data. Each dot represents a single bit, so the 228,480 dots represent 228,480 bits, or 28,560 bytes. The interpretation of each dot can be as follows:

The actual interpretation of the bits derived from the dots, however, requires understanding of the mapping from the original data to the dots in the data regions of the alternative Artcard.

Mapping Original Data to Data Region Dots

There will now be described the process of taking an original data file of maximum size 910,082 bytes and mapping it to the dots in the data regions of the 64 data blocks on a 1600 dpi alternative Artcard. An alternative Artcard reader would reverse the process in order to extract the original data from the dots on an alternative Artcard. At first glance it seems trivial to map data onto dots: binary data is comprised of 1s and 0s, so it would be possible to simply write black and white dots onto the card. This scheme however, does not allow for the fact that ink can fade, parts of a card may be damaged with dirt, grime, or even scratches. Without error-detection encoding, there is no way to detect if the data retrieved from the card is correct. And without redundancy encoding, there is no way to correct the detected errors. The aim of the mapping process then, is to make the data recovery highly robust, and also give the alternative Artcard reader the ability to know it read the data correctly.

There are three basic steps involved in mapping an original data file to data region dots:

Redundancy encode the original data

Shuffle the encoded data in a deterministic way to reduce the effect of localized alternative Artcard damage Write out the shuffled, encoded data as dots to the data blocks on the alternative Artcard Each of these steps is examined in detail in the following sections.

Redundancy Encode Using Reed-Solomon Encoding

The mapping of data to alternative Artcard dots relies heavily on the method of redundancy encoding employed. Reed-Solomon encoding is preferably chosen for its ability to deal with burst errors and effectively detect and correct errors using a minimum of redundancy. Reed Solomon encoding is adequately discussed in the standard texts such as Wicker, S., and Bhargava, V., 1994, Reed-Solomon Codes and their Applications, IEEE Press. Rorabaugh, C, 1996, Error Coding Cookbook, McGraw-Hill. Lyppens, H., 1997, Reed-Solomon Error Correction, Dr. Dobb's Journal, January 1997 (Volume 22, Issue 1).

A variety of different parameters for Reed-Solomon encoding can be used, including different symbol sizes and different levels of redundancy. Preferably, the following encoding parameters are used:

m=8 t=64

Having m=8 means that the symbol size is 8 bits (1 byte). It also means that each Reed-Solomon encoded block size n is 255 bytes ($2^8-1$ symbols). In order to allow correction of up to t symbols, 2t symbols in the final block size must be taken up with redundancy symbols. Having t=64 means that 64 bytes (symbols) can be corrected per block if they are in error. Each 255 byte block therefore has 128 (2×64) redundancy bytes, and the remaining 127 bytes (k=127) are used to hold original data. Thus:

n=255 k=127

The practical result is that 127 bytes of original data are encoded to become a 255-byte block of Reed-Solomon encoded data. The encoded 255-byte blocks are stored on the alternative Artcard and later decoded back to the original 127 bytes again by the alternative Artcard reader. The 384 dots in a single column of a data block's data region can hold 48 bytes (384/8). 595 of these columns can hold 28,560 bytes. This amounts to 112 Reed-Solomon blocks (each block having 255 bytes). The 64 data blocks of a complete alternative Artcard can hold a total of 7168 Reed-Solomon blocks (1,827,840 bytes, at 255 bytes per Reed-Solomon block). Two of the 7,168 Reed-Solomon blocks are reserved for control information, but the remaining 7166 are used to store data. Since each Reed-Solomon block holds 127 bytes of actual data, the total amount of data that can be stored on an alternative Artcard is 910,082 bytes (7166×127). If the original data is less than this amount, the data can be encoded to fit an exact number of Reed-Solomon blocks, and then the encoded blocks can be replicated until all 7,166 are used. FIG. 58 illustrates the overall form of encoding utilised.

Each of the 2 Control blocks 1132, 1133 contain the same encoded information required for decoding the remaining 7,166 Reed-Solomon blocks:

The number of Reed-Solomon blocks in a full message (16 bits stored lo/hi), and

The number of data bytes in the last Reed-Solomon block of the message (8 bits)

These two numbers are repeated 32 times (consuming 96 bytes) with the remaining 31 bytes reserved and set to 0. Each control block is then Reed-Solomon encoded, turning the 127 bytes of control information into 255 bytes of Reed-Solomon encoded data.

The Control Block is stored twice to give greater chance of it surviving. In addition, the repetition of the data within the Control Block has particular significance when using Reed-Solomon encoding. In an uncorrupted Reed-Solomon encoded block, the first 127 bytes of data are exactly the original data, and can be looked at in an attempt to recover the original message if the Control Block fails decoding (more than 64 symbols are corrupted). Thus, if a Control Block fails decoding, it is possible to examine sets of 3 bytes in an effort to determine the most likely values for the 2 decoding parameters. It is not guaranteed to be recoverable, but it has a better chance through redundancy. Say the last 159 bytes of the Control Block are destroyed, and the first 96 bytes are perfectly ok. Looking at the first 96 bytes will show a repeating set of numbers. These numbers can be sensibly used to decode the remainder of the message in the remaining 7,166 Reed-Solomon blocks.

By way of example, assume a data file containing exactly 9,967 bytes of data. The number of Reed-Solomon blocks required is 79. The first 78 Reed-Solomon blocks are completely utilized, consuming 9,906 bytes (78×127). The 79th block has only 61 bytes of data (with the remaining 66 bytes all 0s).

The alternative Artcard would consist of 7,168 Reed-Solomon blocks. The first 2 blocks would be Control Blocks, the next 79 would be the encoded data, the next 79 would be a duplicate of the encoded data, the next 79 would be another duplicate of the encoded data, and so on. After storing the 79 Reed-Solomon blocks 90 times, the remaining 56 Reed-Solomon blocks would be another duplicate of the first 56 blocks from the 79 blocks of encoded data (the final 23 blocks of encoded data would not be stored again as there is not enough room on the alternative Artcard). A hex representation of the 127 bytes in each Control Block data before being Reed-Solomon encoded would be as illustrated in FIG. 59.

Scramble the Encoded Data

Assuming all the encoded blocks have been stored contiguously in memory, a maximum 1,827,840 bytes of data can be stored on the alternative Artcard (2 Control Blocks and 7,166 information blocks, totalling 7,168 Reed-Solomon encoded blocks). Preferably, the data is not directly stored onto the alternative Artcard at this stage however, or all 255 bytes of one Reed-Solomon block will be physically together on the card. Any dirt, grime, or stain that causes physical damage to the card has the potential of damaging more than 64 bytes in a single Reed-Solomon block, which would make that block unrecoverable. If there are no duplicates of that Reed-Solomon block, then the entire alternative Artcard cannot be decoded.

The solution is to take advantage of the fact that there are a large number of bytes on the alternative Artcard, and that the alternative Artcard has a reasonable physical size. The data can therefore be scrambled to ensure that symbols from a single Reed-Solomon block are not in close proximity to one another. Of course pathological cases of card degradation can cause Reed-Solomon blocks to be unrecoverable, but on average, the scrambling of data makes the card much more robust. The scrambling scheme chosen is simple and is illustrated schematically in FIG. 14. All the Byte 0s from each Reed-Solomon block are placed together 1136, then all the Byte 1's etc. There will therefore be 7,168 byte 0's, then 7,168 Byte 1's etc. Each data block on the alternative Artcard can store. 28,560 bytes. Consequently there are approximately 4 bytes from each Reed-Solomon block in each of the 64 data blocks on the alternative Artcard.

Under this scrambling scheme, complete damage to 16 entire data blocks on the alternative Artcard will result in 64 symbol errors per Reed-Solomon block. This means that if there is no other damage to the alternative Artcard, the entire data is completely recoverable, even if there is no data duplication.

Write the Scrambled Encoded Data to the Alternative Artcard

Once the original data has been Reed-Solomon encoded, duplicated, and scrambled, there are 1,827,840 bytes of data to be stored on the alternative Artcard. Each of the 64 data blocks on the alternative Artcard stores 28,560 bytes.

The data is simply written out to the alternative Artcard data blocks so that the first data block contains the first 28,560 bytes of the scrambled data, the second data block contains the next 28,560 bytes etc.

Figure 61:
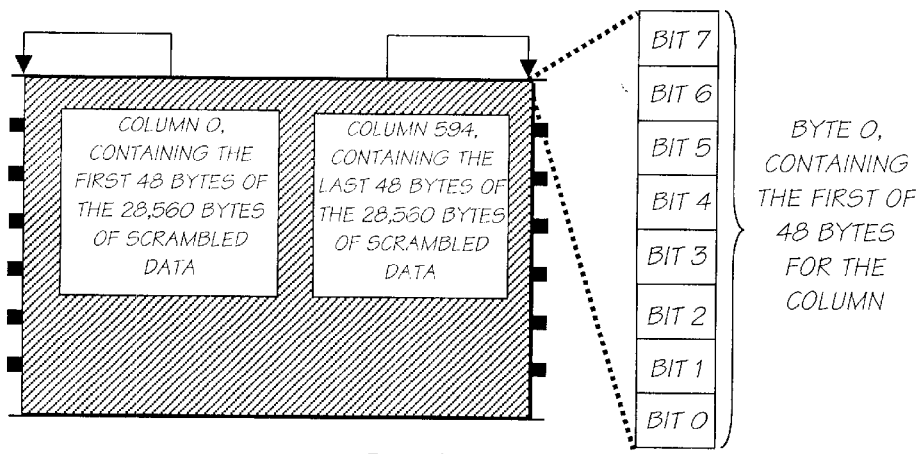
FIG. 61 illustrates the layout of encoded data within a datablock.

As illustrated in FIG. 61, within a data block, the data is written out column-wise left to right. Thus the left-most column within a data block contains the first 48 bytes of the 28,560 bytes of scrambled data, and the last column contains the last 48 bytes of the 28,560 bytes of scrambled data. Within a column, bytes are written out top to bottom, one bit at a time, starting from bit 7 and finishing with bit 0. If the bit is set (1), a black dot is placed on the alternative Artcard, if the bit is clear (0), no dot is placed, leaving it the white background color of the card.

For example, a set of 1,827,840 bytes of data can be created by scrambling 7,168 Reed-Solomon encoded blocks to be stored onto an alternative Artcard. The first 28,560 bytes of data are written to the first data block. The first 48 bytes of the first 28,560 bytes are written to the first column of the data block, the next 48 bytes to the next column and so on. Suppose the first two bytes of the 28,560 bytes are hex D3 5F. Those first two bytes will be stored in column 0 of the data block. Bit 7 of byte 0 will be stored first, then bit 6 and so on. Then Bit 7 of byte 1 will be stored through to bit 0 of byte 1. Since each "1" is stored as a black dot, and each "0" as a white dot, these two bytes will be represented on the alternative Artcard as the following set of dots:

D3 (1101 0011) becomes: black, black, white, black, white, white, black, black 5F (0101 1111) becomes: white, black, white, black, black, black, black, black Decoding an Alternative Artcard This section deals with extracting the original data from an alternative Artcard in an accurate and robust manner. Specifically, it assumes the alternative Artcard format as described in the previous chapter, and describes a method of extracting the original pre-encoded data from the alternative Artcard.

There are a number of general considerations that are part of the assumptions for decoding an alternative Artcard.

User

The purpose of an alternative Artcard is to store data for use in different applications. A user inserts an alternative Artcard into an alternative Artcard reader, and expects the data to be loaded in a "reasonable time". From the user's perspective, a motor transport moves the alternative Artcard into an alternative Artcard reader. This is not perceived as a problematic delay, since the alternative Artcard is in motion. Any time after the alternative Artcard has stopped is perceived as a delay, and should be minimized in any alternative Artcard reading scheme. Ideally, the entire alternative Artcard would be read while in motion, and thus there would be no perceived delay after the card had stopped moving.

For the purpose of the preferred embodiment, a reasonable time for an alternative Artcard to be physically loaded is defined to be 1.5 seconds. There should be a minimization of time for additional decoding after the alternative Artcard has stopped moving. Since the Active region of an alternative Artcard covers most of the alternative Artcard surface we can limit our timing concerns to that region.

Sampling Dots

Figure 62:
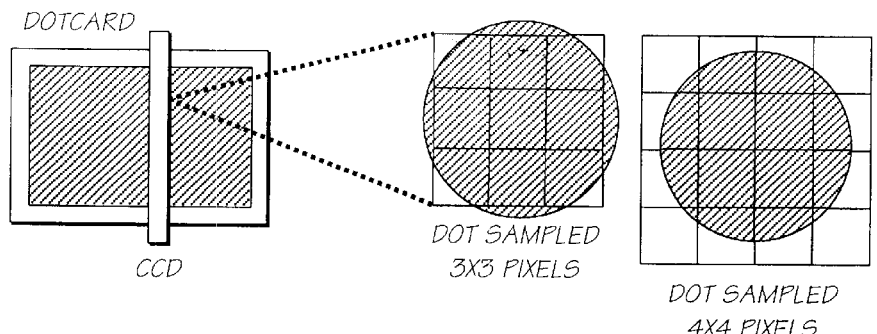
FIG. 62 illustrates the sampling process in sampling an alternative Artcard.

The dots on an alternative Artcard must be sampled by a CCD reader or the like at least at double the printed resolution to satisfy Nyquist's Theorem. In practice it is better to sample at a higher rate than this. In the alternative Artcard reader environment, dots are preferably sampled at 3 times their printed resolution in each dimension, requiring 9 pixels to define a single dot. If the resolution of the alternative Artcard dots is 1600 dpi, the alternative Artcard reader's image sensor must scan pixels at 4800 dpi. Of course if a dot is not exactly aligned with the sampling sensor, the worst and most likely case as illustrated in FIG. 62, is that a dot will be sensed over a 4×4 pixel area.

Each sampled pixel is 1 byte (8 bits). The lowest 2 bits of each pixel can contain significant noise. Decoding algorithms must therefore be noise tolerant.

Alignment/Rotation

Figure 63:
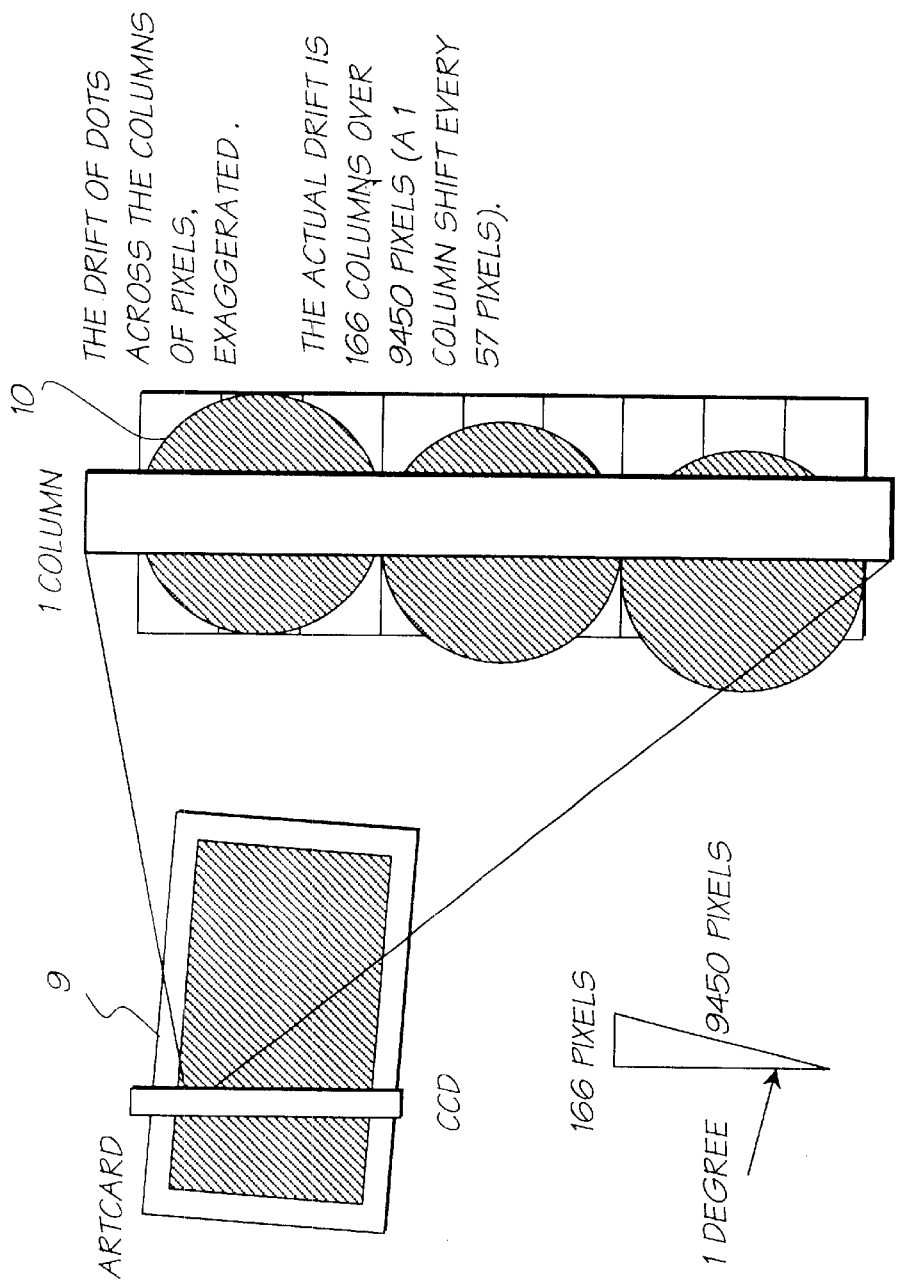
FIG. 63 illustrates, in exaggerated form, an example of sampling a rotated alternative Artcard.

It is extremely unlikely that a user will insert an alternative Artcard into an alternative Artcard reader perfectly aligned with no rotation. Certain physical constraints at a reader entrance and motor transport grips will help ensure that once inserted, an alternative Artcard will stay at the original angle of insertion relative to the CCD. Preferably this angle of rotation, as illustrated in FIG. 63 is a maximum of 1 degree. There can be some slight aberrations in angle due to jitter and motor rumble during the reading process, but these are assumed to essentially stay within the 1-degree limit.

The physical dimensions of an alternative Artcard are 86 mm×55 mm. A 1 degree rotation adds 1.5 mm to the effective height of the card as 86 mm passes under the CCD (86 sin 1°), which will affect the required CCD length.

The effect of a 1 degree rotation on alternative Artcard reading is that a single scanline from the CCD will include a number of different columns of dots from the alternative Artcard. This is illustrated in an exaggerated form in FIG. 63 which shows the drift of dots across the columns of pixels. Although exaggerated in this diagram, the actual drift will be a maximum 1 pixel column shift every 57 pixels.

When an alternative Artcard is not rotated, a single column of dots can be read over 3 pixel scanlines. The more an alternative Artcard is rotated, the greater the local effect. The more dots being read, the longer the rotation effect is applied. As either of these factors increase, the larger the number of pixel scanlines that are needed to be read to yield a given set of dots from a single column on an alternative Artcard. The following table shows how many pixel scanlines are required for a single column of dots in a particular alternative Artcard structure.

To read an entire alternative Artcard, we need to read 87 mm (86 mm+1 mm due to 1° rotation). At 4800 dpi this implies 16,252 pixel columns.

CCD (or Other Linear Image Sensor) Length

The length of the CCD itself must accommodate:

the physical height of the alternative Artcard (55 mm), vertical slop on physical alternative Artcard insertion (1 mm)

insertion rotation of up to 1 degree (86 sin 1°=1.5 mm)

These factors combine to form a total length of 57.5 mm.

When the alternative Artcard Image sensor CCD in an alternative Artcard reader scans at 4800 dpi, a single scanline is 10,866 pixels. For simplicity, this figure has been rounded up to 11,000 pixels. The Active Region of an alternative Artcard has a height of 3208 dots, which implies 9,624 pixels. A Data Region has a height of 384 dots, which implies 1,152 pixels.

DRAM Size

The amount of memory required for alternative Artcard reading and decoding is ideally minimized. The typical placement of an alternative Artcard reader is an embedded system where memory resources are precious. This is made more problematic by the effects of rotation. As described above, the more an alternative Artcard is rotated, the more scanlines are required to effectively recover original dots.

There is a trade-off between algorithmic complexity, user perceived delays, robustness, and memory usage. One of the simplest reader algorithms would be to simply scan the whole alternative Artcard, and then to process the whole data without real-time constraints. Not only would this require huge reserves of memory, it would take longer than a reader algorithm that occurred concurrently with the alternative Artcard reading process.

The actual amount of memory required for reading and decoding an alternative Artcard is twice the amount of space required to hold the encoded data, together with a small amount of scratch space (1–2 KB). For the 1600 dpi alternative Artcard, this implies a 4 MB memory requirement. The actual usage of the memory is detailed in the following algorithm description.

Transfer Rate

DRAM bandwidth assumptions need to be made for timing considerations and to a certain extent affect algorithmic design, especially since alternative Artcard readers are typically part of an embedded system.

A standard Rambus Direct RDRAM architecture is assumed, as defined in Rambus Inc, October 1997, *Direct Rambus Technology Disclosure*, with a peak data transfer rate of 1.6 GB/sec. Assuming 75% efficiency (easily achieved), we have an average of 1.2 GB/sec data transfer rate. The average time to access a block of 16 bytes is therefore 12 ns.

Dirty Data

Physically damaged alternative Artcards can be inserted into a reader. Alternative Artcards may be scratched, or be stained with grime or dirt. A alternative Artcard reader can't assume to read everything perfectly. The effect of dirty data is made worse by blurring, as the dirty data affects the surrounding clean dots.

Blurry Environment

There are two ways that blurring is introduced into the alternative Artcard reading environment:

Natural blurring due to nature of the CCD's distance from the alternative Artcard.

Warping of alternative Artcard

Figure 64:
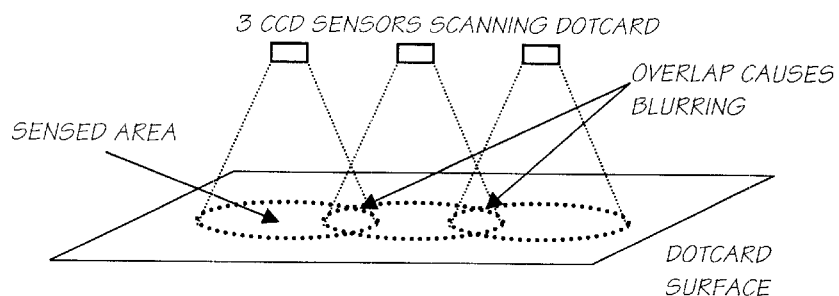
FIG. 64 illustrates the scanning process.

Natural blurring of an alternative Artcard image occurs when there is overlap of sensed data from the CCD. Blurring can be useful, as the overlap ensures there are no high frequencies in the sensed data, and that there is no data missed by the CCD. However if the area covered by a CCD pixel is too large, there will be too much blurring and the sampling required to recover the data will not be met. FIG. 64 is a schematic illustration of the overlapping of sensed data.

Another form of blurring occurs when an alternative Artcard is slightly warped due to heat damage. When the warping is in the vertical dimension, the distance between the alternative Artcard and the CCD will not be constant, and the level of blurring will vary across those areas.

Black and white dots were chosen for alternative Artcards to give the best dynamic range in blurry reading environments. Blurring can cause problems in attempting to determine whether a given dot is black or white.

Figure 65:
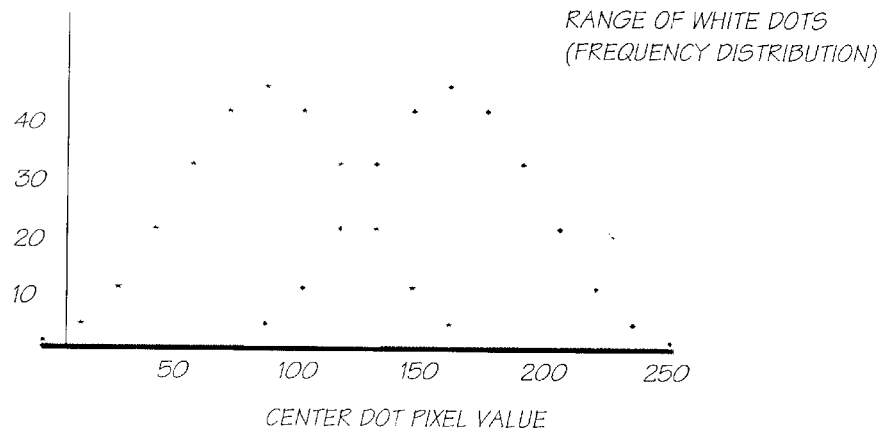
FIG. 65 illustrates the likely scanning distribution of the scanning process.

As the blurring increases, the more a given dot is influenced by the surrounding dots. Consequently the dynamic range for a particular dot decreases. Consider a white dot and a black dot, each surrounded by all possible sets of dots. The 9 dots are blurred, and the center dot sampled. FIG. 65 shows the distribution of resultant center dot values for black and white dots.

The diagram is intended to be a representative blurring. The curve 1140 from 0 to around 180 shows the range of black dots. The curve 1141 from 75 to 250 shows the range of white dots. However the greater the blurring, the more the two curves shift towards the center of the range and therefore the greater the intersection area, which means the more difficult it is to determine whether a given dot is black or white. A pixel value at the center point of intersection is ambiguous—the dot is equally likely to be a black or a white.

As the blurring increases, the likelihood of a read bit error increases. Fortunately, the Reed-Solomon decoding algorithm can cope with these gracefully up to t symbol errors. FIG. 65 is a graph of number predicted number of alternative Artcard Reed-Solomon blocks that cannot be recovered given a particular symbol error rate. Notice how the Reed-Solomon decoding scheme performs well and then substantially degrades. If there is no Reed-Solomon block duplication, then only 1 block needs to be in error for the data to be unrecoverable. Of course, with block duplication the chance of an alternative Artcard decoding increases.

Figure 66:
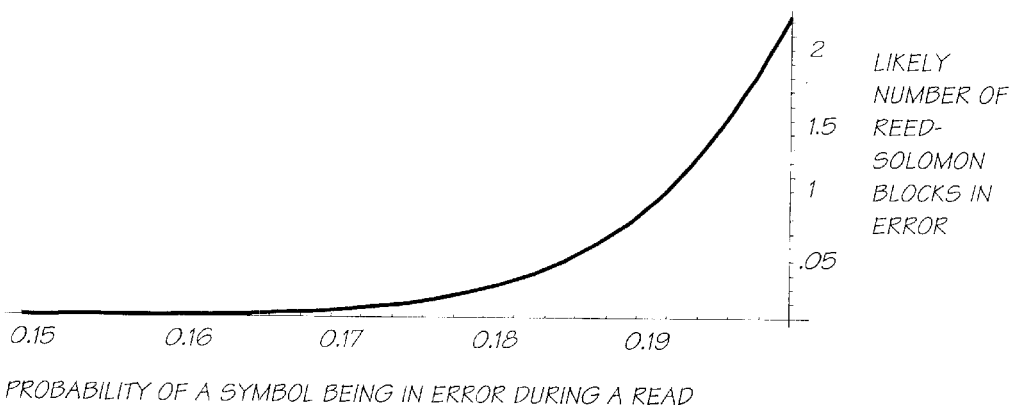
FIG. 66 illustrates the relationship between probability of symbol errors and Reed-Solomon block errors.

FIG. 66 only illustrates the symbol (byte) errors corresponding to the number of Reed-Solomon blocks in error. There is a trade-off between the amount of blurring that can be coped with, compared to the amount of damage that has been done to a card. Since all error detection and correction is performed by a Reed-Solomon decoder, there is a finite number of errors per Reed-Solomon data block that can be coped with. The more errors introduced through blurring, the fewer the number of errors that can be coped with due to alternative Artcard damage.

Overview of Alternative Artcard Decoding

As noted previously, when the user inserts an alternative Artcard into an alternative Artcard reading unit, a motor transport ideally carries the alternative Artcard past a monochrome linear CCD image sensor. The card is sampled in each dimension at three times the printed resolution. Alternative Artcard reading hardware and software compensate for rotation up to 1 degree, jitter and vibration due to the motor transport, and blurring due to variations in alternative Artcard to CCD distance. A digital bit image of the data is extracted from the sampled image by a complex method described here. Reed-Solomon decoding corrects arbitrarily distributed data corruption of up to 25% of the raw data on the alternative Artcard. Approximately 1 MB of corrected data is extracted from a 1600 dpi card.

Figure 67:
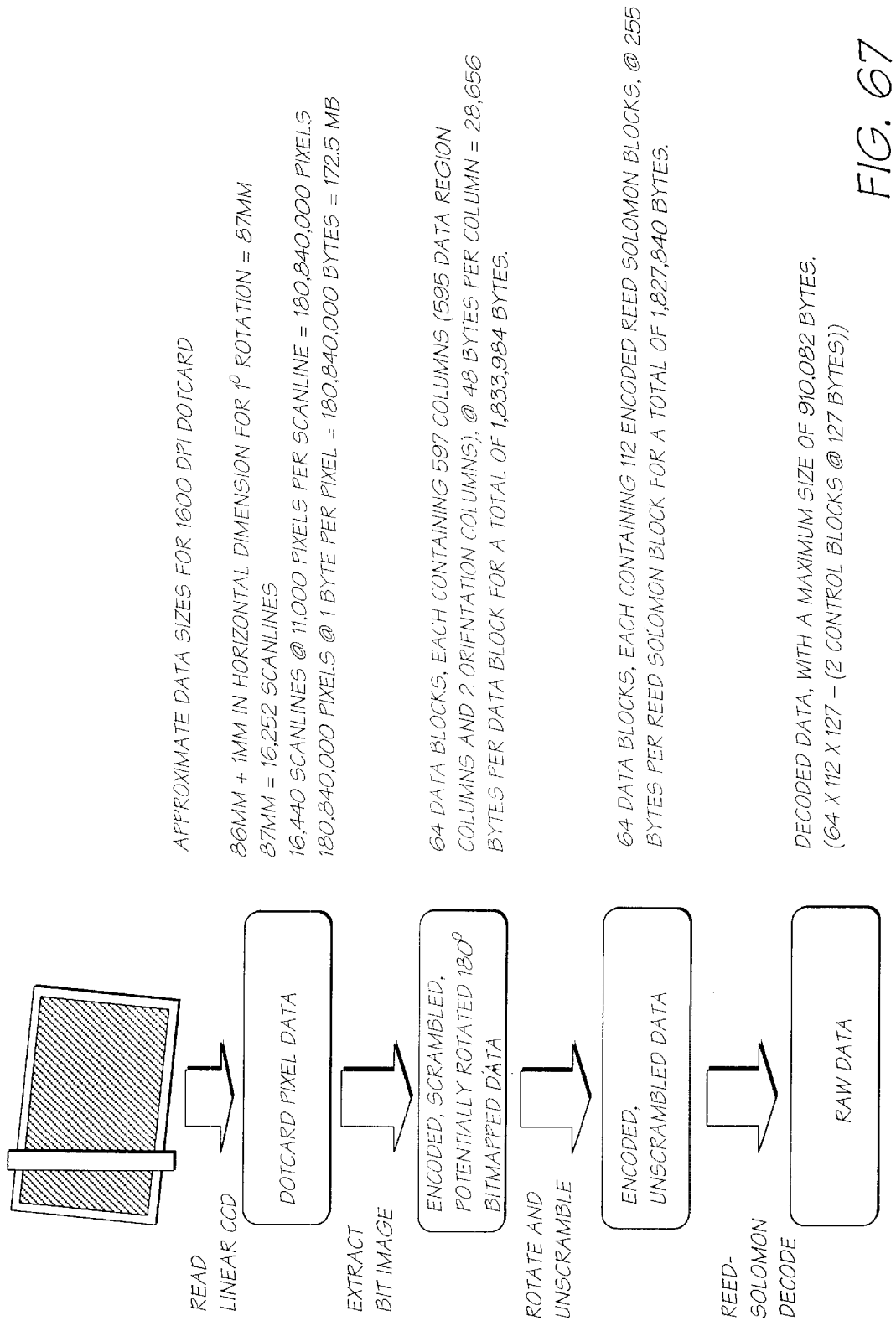
FIG. 67 illustrates a flow chart of the decoding process.

The steps involved in decoding are so as indicated in FIG. 67.

The decoding process requires the following steps:

Scan 1144 the alternative Artcard at three times printed resolution (eg scan 1600 dpi alternative Artcard at 4800 dpi)

Extract 1145 the data bitmap from the scanned dots on the card.

Reverse 1146 the bitmap if the alternative Artcard was inserted backwards.

Unscramble 1147 the encoded data

Reed-Solomon 1148 decode the data from the bitmap

Algorithmic Overview

Phase 1—Real Time Bit Image Extraction

A simple comparison between the available memory (4 MB) and the memory required to hold all the scanned pixels for a 1600 dpi alternative Artcard (172.5 MB) shows that unless the card is read multiple times (not a realistic option), the extraction of the bitmap from the pixel data must be done on the fly, in real time, while the alternative Artcard is moving past the CCD. Two tasks must be accomplished in this phase:

Scan the alternative Artcard at 4800 dpi

Extract the data bitmap from the scanned dots on the card

The rotation and unscrambling of the bit image cannot occur until the whole bit image has been extracted. It is therefore necessary to assign a memory region to hold the extracted bit image. The bit image fits easily within 2 MB, leaving 2 MB for use in the extraction process.

Rather than extracting the bit image while looking only at the current scanline of pixels from the CCD, it is possible to allocate a buffer to act as a window onto the alternative Artcard, storing the last N scanlines read. Memory requirements do not allow the entire alternative Artcard to be stored this way (172.5 MB would be required), but allocating 2 MB to store 190 pixel columns (each scanline takes less than 11,000 bytes) makes the bit image extraction process simpler.

The 4 MB memory is therefore used as follows:

2 MB for the extracted bit image

~2 MB for the scanned pixels 1.5 KB for Phase 1 scratch data (as required by algorithm)

The time taken for Phase 1 is 1.5 seconds, since this is the time taken for the alternative Artcard to travel past the CCD and physically load.

Phase 2—Data Extraction From Bit Image

Once the bit image has been extracted, it must be unscrambled and potentially rotated 180°. It must then be decoded. Phase 2 has no real-time requirements, in that the alternative Artcard has stopped moving, and we are only concerned with the user's perception of elapsed time. Phase 2 therefore involves the remaining tasks of decoding an alternative Artcard:

Re-organize the bit image, reversing it if the alternative Artcard was inserted backwards Unscramble the encoded data Reed-Solomon decode the data from the bit image The input to Phase 2 is the 2 MB bit image buffer. Unscrambling and rotating cannot be performed in situ, so a second 2 MB buffer is required. The 2 MB buffer used to hold scanned pixels in Phase 1 is no longer required and can be used to store the rotated unscrambled data.

The Reed-Solomon decoding task takes the unscrambled bit image and decodes it to 910,082 bytes. The decoding can be performed in situ, or to a specified location elsewhere. The decoding process does not require any additional memory buffers.

The 4 MB memory is therefore used as follows:

2 MB for the extracted bit image (from Phase 1)

~2 MB for the unscrambled, potentially rotated bit image

<1 KB for Phase 2 scratch data (as required by algorithm)

The time taken for Phase 2 is hardware dependent and is bound by the time taken for Reed-Solomon decoding. Using a dedicated core such as LSI Logic's L64712, or an equivalent CPU/DSP combination, it is estimated that Phase 2 would take 0.32 seconds.

Phase 1—Extract Bit Image

This is the real-time phase of the algorithm, and is concerned with extracting the bit image from the alternative Artcard as scanned by the CCD.

Figure 68:
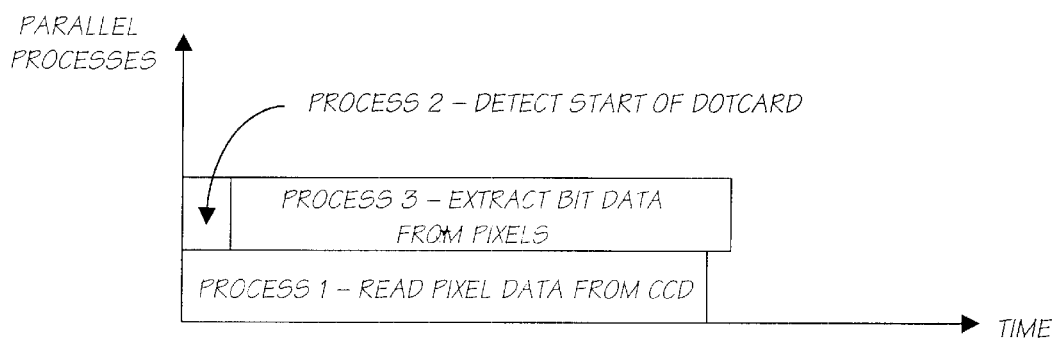
FIG. 68 illustrates a process utilization diagram of the decoding process.

As shown in FIG. 68 Phase 1 can be divided into 2 asynchronous process streams. The first of these streams is simply the real-time reader of alternative Artcard pixels from the CCD, writing the pixels to DRAM. The second stream involves looking at the pixels, and extracting the bits. The second process stream is itself divided into 2 processes. The first process is a global process, concerned with locating the start of the alternative Artcard. The second process is the bit image extraction proper.

Figure 69:
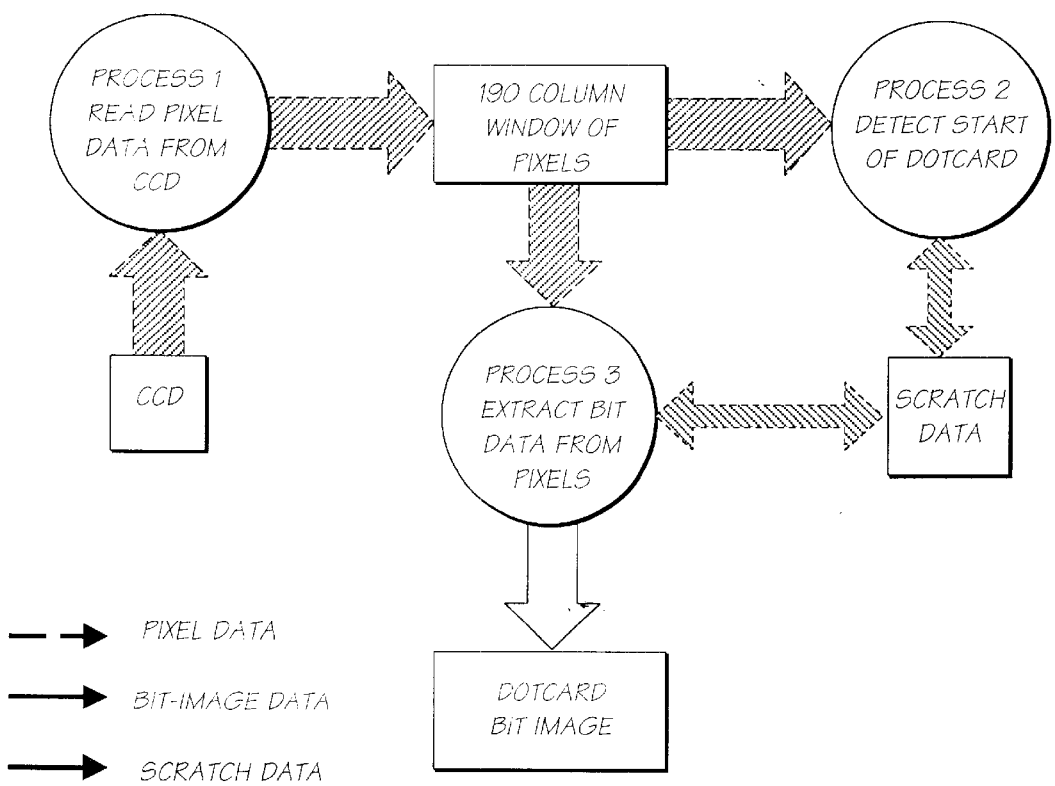
FIG. 69 illustrates the dataflow steps in decoding.

FIG. 69 illustrates the data flow from a data/process perspective.

Timing

For an entire 1600 dpi alternative Artcard, it is necessary to read a maximum of 16,252 pixel-columns. Given a total time of 1.5 seconds for the whole alternative Artcard, this implies a maximum time of 92,296 ns per pixel column during the course of the various processes.

Process 1—Read pixels from CCD

Figure 70:
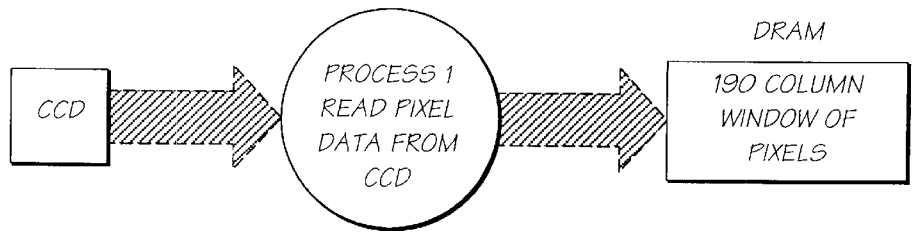
FIG. 70 illustrates the reading process in more detail.

The CCD scans the alternative Artcard at 4800 dpi, and generates 11,000 1-byte pixel samples per column. This process simply takes the data from the CCD and writes it to DRAM, completely independently of any other process that is reading the pixel data from DRAM. FIG. 70 illustrates the steps involved.

The pixels are written contiguously to a 2 MB buffer that can hold 190 full columns of pixels. The buffer always holds the 190 columns most recently read. Consequently, any process that wants to read the pixel data (such as Processes 2 and 3) must firstly know where to look for a given column, and secondly, be fast enough to ensure that the data required is actually in the buffer.

Process 1 makes the current scanline number (CurrentScanLine) available to other processes so they can ensure they are not attempting to access pixels from scanlines that have not been read yet.

The time taken to write out a single column of data (11,000 bytes) to DRAM is:

$$11{,}000/16*12=8{,}256 \text{ ns}$$

Process 1 therefore uses just under 9% of the available DRAM bandwidth (8256/92296).

Process 2—Detect Start of Alternative Artcard

Figure 71:
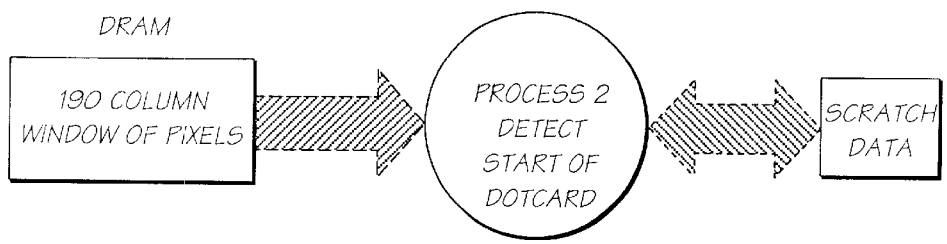
FIG. 71 illustrates the process of detection of the start of an alternative Artcard in more detail.

This process is concerned with locating the Active Area on a scanned alternative Artcard. The input to this stage is the pixel data from DRAM (placed there by Process 1). The output is a set of bounds for the first 8 data blocks on the alternative Artcard, required as input to Process 3. A high level overview of the process can be seen in FIG. 71.

An alternative Artcard can have vertical slop of 1 mm upon insertion. With a rotation of 1 degree there is further vertical slop of 1.5 mm (86 sin 1°). Consequently there is a total vertical slop of 2.5 mm. At 1600 dpi, this equates to a slop of approximately 160 dots. Since a single data block is only 394 dots high, the slop is just under half a data block. To get a better estimate of where the data blocks are located the alternative Artcard itself needs to be detected.

Process 2 therefore consists of two parts:

Locate the start of the alternative Artcard, and if found,

Calculate the bounds of the first 8 data blocks based on the start of the alternative Artcard.

Locate the Start of the Alternative Artcard

The scanned pixels outside the alternative Artcard area are black (the surface can be black plastic or some other non-reflective surface). The border of the alternative Artcard area is white. If we process the pixel columns one by one, and filter the pixels to either black or white, the transition point from black to white will mark the start of the alternative Artcard. The highest level process is as follows:

The ProcessColumn function is simple. Pixels from two areas of the scanned column are passed through a threshold filter to determine if they are black or white. It is possible to then wait for a certain number of white pixels and announce the start of the alternative Artcard once the given number has been detected. The logic of processing a pixel column is shown in the following pseudocode. 0 is returned if the alternative Artcard has not been detected during the column. Otherwise the pixel number of the detected location is returned.

Calculate Data Block Bounds

At this stage, the alternative Artcard has been detected. Depending on the rotation of the alternative Artcard, either the top of the alternative Artcard has been detected or the lower part of the alternative Artcard has been detected. The second step of Process 2 determines which was detected and sets the data block bounds for Phase 3 appropriately.

A look at Phase 3 reveals that it works on data block segment bounds: each data block has a StartPixel and an EndPixel to determine where to look for targets in order to locate the data block's data region.

If the pixel value is in the upper half of the card, it is possible to simply use that as the first StartPixel bounds. If the pixel value is in the lower half of the card, it is possible to move back so that the pixel value is the last segment's EndPixel bounds. We step forwards or backwards by the alternative Artcard data size, and thus set up each segment with appropriate bounds. We are now ready to begin extracting data from the alternative Artcard.

```
// Adjust to become first pixel if is lower pixel
if (pixel >LOWER_REGION_BOUND)
{
pixel -=6*1152
if (pixel <0)
   pixel=0
}
for (i=0; i<6; i++)
{
endPixel=pixel+1152
segment[i].MaxPixel=MAX_PIXEL_BOUND
segment[i].SetBounds(pixel, endPixel)
pixel=endPixel
}
```

The MaxPixel value is defined in Process 3, and the SetBounds function simply sets StartPixel and EndPixel clipping with respect to 0 and MaxPixel.

Process 3—Extract Bit Data from Pixels

Figure 72:
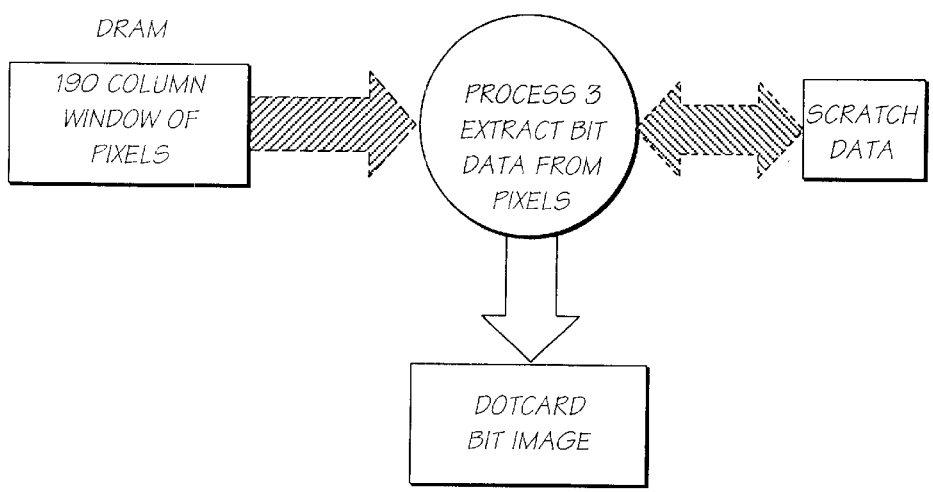
FIG. 72 illustrates the extraction of bit data process in more detail.

This is the heart of the alternative Artcard Reader algorithm. This process is concerned with extracting the bit data from the CCD pixel data. The process essentially creates a bit-image from the pixel data, based on scratch information created by Process 2, and maintained by Process 3. A high level overview of the process can be seen in FIG. 72.

Figure 73:
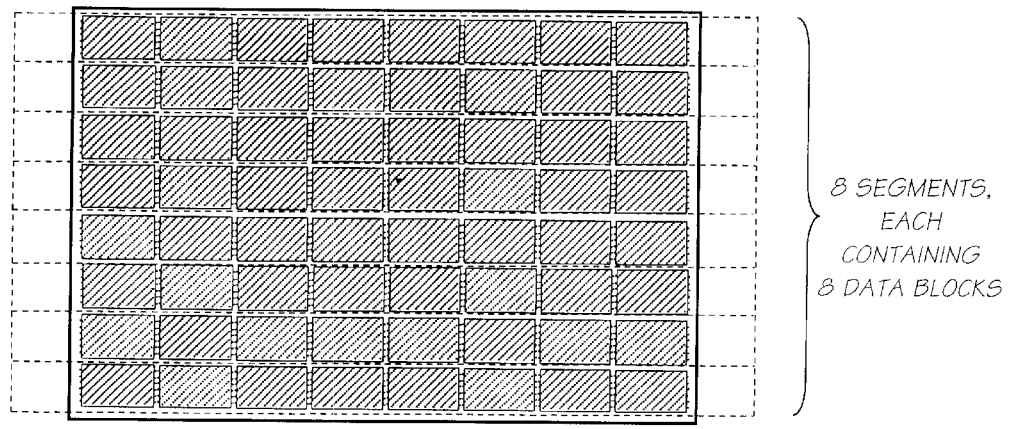
FIG. 73 illustrates the segmentation process utilized in the decoding process.

Rather than simply read an alternative Artcard's pixel column and determine what pixels belong to what data block, Process 3 works the other way around. It knows where to look for the pixels of a given data block. It does this by dividing a logical alternative Artcard into 8 segments, each containing 8 data blocks as shown in FIG. 73.

The segments as shown match the logical alternative Artcard. Physically, the alternative Artcard is likely to be rotated by some amount. The segments remain locked to the logical alternative Artcard structure, and hence are rotation-independent. A given segment can have one of two states:

LookingForTargets: where the exact data block position for this segment has not yet been determined. Targets are being located by scanning pixel column data in the bounds indicated by the segment bounds. Once the data block has been located via the targets, and bounds set for black & white, the state changes to ExtractingBitImage.

ExtractingBitImage: where the data block has been accurately located, and bit data is being extracted one dot column at a time and written to the alternative Artcard bit image. The following of data block clockmarks gives accurate dot recovery regardless of rotation, and thus the segment bounds are ignored. Once the entire data block has been extracted, new segment bounds are calculated for the next data block based on the current position. The state changes to LookingForTargets.

The process is complete when all 64 data blocks have been extracted, 8 from each region.

Each data block consists of 595 columns of data, each with 48 bytes. Preferably, the 2 orientation columns for the data block are each extracted at 48 bytes each, giving a total of 28,656 bytes extracted per data block. For simplicity, it is possible to divide the 2 MB of memory into 64×32 k chunks. The nth data block for a given segment is stored at the location:

StartBuffer+(256 k*n)

Data Structure for Segments

Each of the 8 segments has an associated data structure. The data structure defining each segment is stored in the scratch data area. The structure can be as set out in the following table:

High Level of Process 3

Process 3 simply iterates through each of the segments, performing a single line of processing depending on the segment's current state. The pseudocode is straightforward:

```
blockCount=0
while (blockCount<64)
   for (i=0; i<8; i++)
   {
   finishedBlock=segment[i].ProcessState( )
   if (finishedBlock)
      blockCount++
   }
```

Process 3 must be halted by an external controlling process if it has not terminated after a specified amount of time. This will only be the case if the data cannot be extracted. A simple mechanism is to start a countdown after Process 1 has finished reading the alternative Artcard. If Process 3 has not finished by that time, the data from the alternative Artcard cannot be recovered.

CurrentState=LookingForTargets

Targets are detected by reading columns of pixels, one pixel-column at a time rather than by detecting dots within a given band of pixels (between StartPixel and EndPixel) certain patterns of pixels are detected. The pixel columns are processed one at a time until either all the targets are found, or until a specified number of columns have been processed. At that time the targets can be processed and the data area located via clockmarks. The state is changed to ExtractingBitImage to signify that the data is now to be extracted. If enough valid targets are not located, then the data block is ignored, skipping to a column definitely within the missed data block, and then beginning again the process of looking for the targets in the next data block. This can be seen in the following pseudocode:

```
finishedBlock=FALSE
if(CurrentColumn<Process1.CurrentScanLine)
{
ProcessPixelColumn( )
CurrentColumn++
}
if ((TargetsFound==6)||(CurrentColumn>LastColumn))
{
if (TargetsFound>=2)
   ProcessTargets( )
   if (TargetsFound>=2)
   {
BuildClockmarkEstimates( )
SetBlackAndWhiteBounds( )
CurrentState=ExtractingBitImage
CurrentDotColumn=-8
}
else
{
// data block cannot be recovered. Look for
// next instead. Must adjust pixel bounds to
// take account of possible 1 degree rotation.
finishedBlock=TRUE
```

```
SetBounds(StartPixel-12, EndPixel+12)
BitImage+=256 KB
CurrentByte=0
LastColumn+=1024
TargetsFound=0
    }
}
return finishedBlock
```
ProcessPixelColumn Each pixel column is processed within the specified bounds (between StartPixel and EndPixel) to search for certain patterns of pixels which will identify the targets. The structure of a single target (target number 2) is as previously shown in FIG. 54:

From a pixel point of view, a target can be identified by:

Left black region, which is a number of pixel columns consisting of large numbers of contiguous black pixels to build up the first part of the target.

Target center, which is a white region in the center of further black columns

Second black region, which is the 2 black dot columns after the target center

Figure 74:
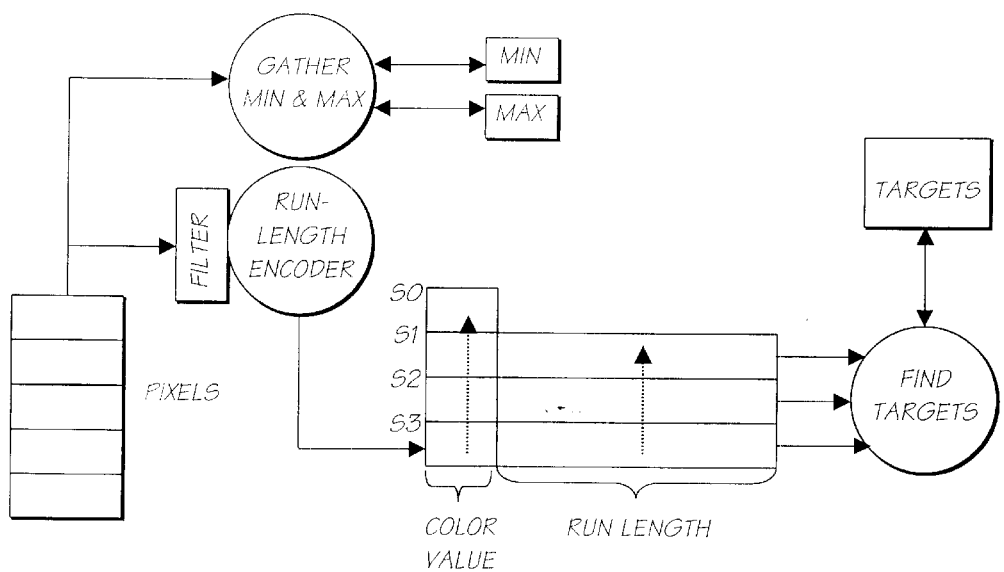
FIG. 74 illustrates the decoding process of finding targets in more detail.

Target number, which is a black-surrounded white region that defines the target number by its length Third black region, which is the 2 black columns after the target number An overview of the required process is as shown in FIG. 74.

Since identification only relies on black or white pixels, the pixels 1150 from each column are passed through a filter 1151 to detect black or white, and then run length encoded 1152. The run-lengths are then passed to a state machine 1153 that has access to the last 3 run lengths and the 4th last color. Based on these values, possible targets pass through each of the identification stages.

The GatherMin&Max process 1155 simply keeps the minimum & maximum pixel values encountered during the processing of the segment. These are used once the targets have been located to set BlackMax, WhiteMin, and MidRange values.

Each segment keeps a set of target structures in its search for targets. While the target structures themselves don't move around in memory, several segment variables point to lists of pointers to these target structures. The three pointer lists are repeated here:

There are counters associated with each of these list pointers: TargetsFound, PossibleTargetCount, and AvailableTargetCount respectively.

Figure 75:
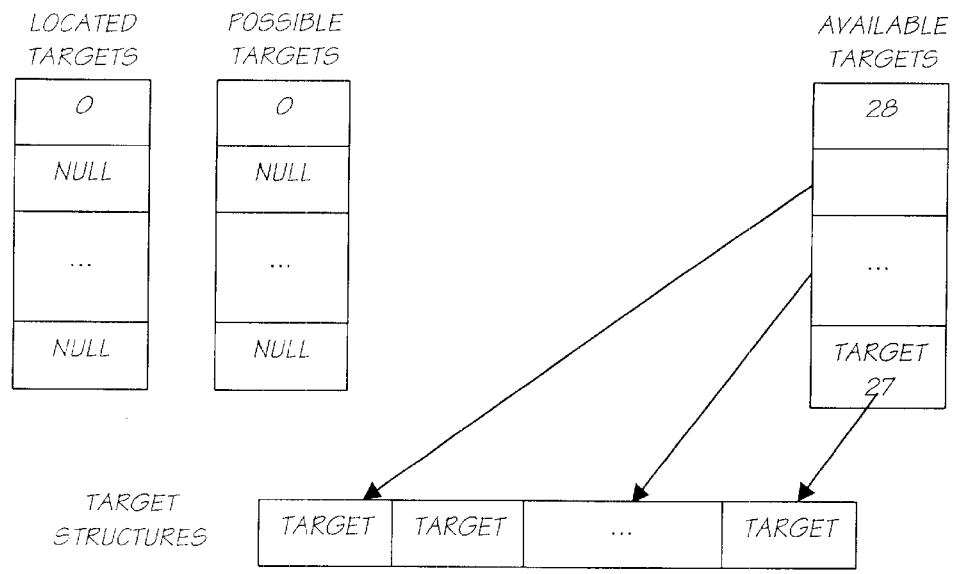
FIG. 75 illustrates the data structures utilized in locating targets.

Before the alternative Artcard is loaded, TargetsFound and PossibleTargetCount are set to 0, and AvailableTargetCount is set to 28 (the maximum number of target structures possible to have under investigation since the minimum size of a target border is 40 pixels, and the data area is approximately 1152 pixels). An example of the target pointer layout is as illustrated in FIG. 75.

As potential new targets are found, they are taken from the AvailableTargets list 1157, the target data structure is updated, and the pointer to the structure is added to the PossibleTargets list 1158. When a target is completely verified, it is added to the LocatedTargets list 1159. If a possible target is found not to be a target after all, it is placed back onto the AvailableTargets list 1157. Consequently there are always 28 target pointers in circulation at any time, moving between the lists.

The Target data structure 1160 can have the following form:

The ProcessPixelColumn function within the find targets module 1162 (FIG. 74) then, goes through all the run lengths one by one, comparing the runs against existing possible targets (via StartPixel), or creating new possible targets if a potential target is found where none was previously known. In all cases, the comparison is only made if S0.color is white and S1.color is black.

The pseudocode for the ProcessPixelColumn set out hereinafter. When the first target is positively identified, the last column to be checked for targets can be determined as being within a maximum distance from it. For 1° rotation, the maximum distance is 18 pixel columns.

```
pixel=StartPixel
t=0
target=PossibleTarget[t]
while ((pixel<EndPixel) && (TargetsFound<6))
{
  if ((S0.Color==white) && (S1.Color==black))
  {
    do
    {
      keepTrying=FALSE
      if
      (
        (target !=NULL)
        &&
        (target->AddToTarget(Column, pixel, S1, S2, S3))
      )
      {
        if (target->CurrentState==IsATarget)
        {
          Remove target from PossibleTargets List Add target to LocatedTargets List TargetsFound++ if (TargetsFound==1)
            FinalColumn=Column+MAX_TARGET_DELTA}
        }
        else if (target->CurrentState==NotATarget)
        {
          Remove target from PossibleTargets List Add target to AvailableTargets List keepTrying=TRUE
        }
        else
        {
          t++ // advance to next target
        }
        target=PossibleTarget[t]
      }
      else
      {
        tmp=AvailableTargets[0]
        if (tmp->AddToTarget(Column,pixel,S1,S2,S3)
        {
          Remove tmp from AvailableTargets list Add tmp to PossibleTargets list t++ // target t has been shifted right
        }
      }
    } while (keepTrying)
  pixel+=S1.RunLength
  Advance S0/S1/S2/S3
}
```

AddToTarget is a function within the find targets module that determines whether it is possible or not to add the specific run to the given target:

If the run is within the tolerance of target's starting position, the run is directly related to the current target, and can therefore be applied to it.

If the run starts before the target, we assume that the existing target is still ok, but not relevant to the run. The target is therefore left unchanged, and a return value of FALSE tells the caller that the run was not applied. The caller can subsequently check the run to see if it starts a whole new target of its own.

If the run starts after the target, we assume the target is no longer a possible target. The state is changed to be NotATarget, and a return value of TRUE is returned.

If the run is to be applied to the target, a specific action is performed based on the current state and set of runs in S1, S2, and S3. The AddToTarget pseudocode is as follows:

```
MAX_TARGET_DELTA=1
if (CurrentState !=NothingKnown)
{
  if (pixel>StartPixel) // run starts after target
  {
    diff=pixel-StartPixel
    if (diff>MAX_TARGET_DELTA)
    {
      CurrentState=NotATarget return TRUE
    }
  }
  else
  {
    diff StartPixel-pixel
    if (diff>MAX_TARGET_DELTA) return FALSE
  }
}
runtype=DetermineRunType(S1, S2, S3)
EvaluateState(runType)
StartPixel=currentPixel
return TRUE
```

Types of pixel runs are identified in DetermineRunType is as follows:

The EvaluateState procedure takes action depending on the current state and the run type.

The actions are shown as follows in tabular form:

Processing Targets he located targets (in the LocatedTargets list) are stored in the order they were located. Depending on alternative Artcard rotation these targets will be in ascending pixel order or descending pixel order. In addition, the target numbers recovered from the targets may be in error. We may have also have recovered a false target. Before the clockmark estimates can be obtained, the targets need to be processed to ensure that invalid targets are discarded, and valid targets have target numbers fixed if in error (e.g. a damaged target number due to dirt). Two main steps are involved:

Sort targets into ascending pixel order

Locate and fix erroneous target numbers

The first step is simple. The nature of the target retrieval means that the data should already be sorted in either ascending pixel or descending pixel. A simple swap sort ensures that if the 6 targets are already sorted correctly a maximum of 14 comparisons is made with no swaps. If the data is not sorted, 14 comparisons are made, with 3 swaps. The following pseudocode shows the sorting process:

```
for (i=0; i<TargetsFound-1; i++)
{
  oldTarget=LocatedTargets[i]
  bestPixel=oldTarget->Pixel
  best=i
  j=i+1
  while (j<TargetsFound)
  {
    if (LocatedTargets[j]->Pixel<bestPixel) best=j
    j++
  }
  if (best !=i) // move only if necessary
    LocatedTargets[i]=LocatedTargets[best]
    LocatedTargets[best]=oldTarget
  }
}
```

Locating and fixing erroneous target numbers is only slightly more complex. One by one, each of the N targets found is assumed to be correct. The other targets are compared to this "correct" target and the number of targets that require change should target N be correct is counted. If the number of changes is 0, then all the targets must already be correct. Otherwise the target that requires the fewest changes to the others is used as the base for change. A change is registered if a given target's target number and pixel. position do not correlate when compared to the "correct" target's pixel position and target number. The change may mean updating a target's target number, or it may mean elimination of the target. It is possible to assume that ascending targets have pixels in ascending order (since they have already been sorted).

In most cases this function will terminate with bestChanges=0, which means no changes are required. Otherwise the changes need to be applied. The functionality of applying the changes is identical to counting the changes (in the pseudocode above) until the comparison with target-Number. The change application is:

```
if ((targetNumber<1)||(targetNumber>TARGETS_PER_
  BLOCK))
{
  LocatedTargets[j]=NULL
  TargetsFound--
}
else
{
  LocatedTargets[j]->TargetNumber=targetNumber
}
```

At the end of the change loop, the LocatedTargets list needs to be compacted and all NULL targets removed.

At the end of this procedure, there may be fewer targets. Whatever targets remain may now be used (at least 2 targets are required) to locate the clockmarks and the data region.

Building Clockmark Estimates from Targets

As shown previously in FIG. 55, the upper region's first clockmark dot 1126 is 55 dots away from the center of the first target 1124 (which is the same as the distance between target centers). The center of the clockmark dots is a further 1 dot away, and the black border line 1123 is a further 4 dots away from the first clockmark dot. The lower region's first clockmark dot is exactly 7 targets-distance away (7×55 dots) from the upper region's first clockmark dot 1126.

It cannot be assumed that Targets 1 and 6 have been located, so it is necessary to use the upper-most and lower-most targets, and use the target numbers to determine which targets are being used. It is necessary at least 2 targets at this point. In addition, the target centers are only estimates of the actual target centers. It is to locate the target center more accurately. The center of a target is white, surrounded by black. We therefore want to find the local maximum in both pixel & column dimensions. This involves reconstructing the continuous image since the maximum is unlikely to be aligned exactly on an integer boundary (our estimate).

Before the continuous image can be constructed around the target's center, it is necessary to create a better estimate of the 2 target centers. The existing target centers actually are the top left coordinate of the bounding box of the target center. It is a simple process to go through each of the pixels for the area defining the center of the target, and find the pixel with the highest value. There may be more than one pixel with the same maximum pixel value, but the estimate of the center value only requires one pixel.

The pseudocode is straightforward, and is performed for each of the 2 targets:

```
CENTER_WIDTH CENTER_HEIGHT=12
maxPixel=0x00
for (i=0; i<CENTER_WIDTH; i++)
for (j=0; j<CENTER_HEIGHT; j++)
{
p=GetPixel(column+i, pixel+j)
if (p>maxPixel)
{
maxPixel=p
centerColumn=column+i
centerPixel=pixel+j
}
}
Target.Column=centerColumn
Target.Pixel=centerPixel
```

At the end of this process the target center coordinates point to the whitest pixel of the target, which should be within one pixel of the actual center. The process of building a more accurate position for the target center involves reconstructing the continuous signal for 7 scanline slices of the target, 3 to either side of the estimated target center. The 7 maximum values found (one for each of these pixel dimension slices) are then used to reconstruct a continuous signal in the column dimension and thus to locate the maximum value in that dimension.

```
// Given estimates column and pixel, determine a
// betterColumn and betterPixel as the center of
// the target
for (y=0; y<7; y++)
{
   for (x=0; x<7; x++)
      samples[x]=GetPixel(column-3+y, pixel-3+x)
   FindMax(samples, pos, maxVal)
   reSamples[y]=maxVal
   if (y==3)
   betterPixel=pos+pixel
}
FindMax(reSamples, pos, maxVal)
betterColumn=pos+column
```

Figure 76:
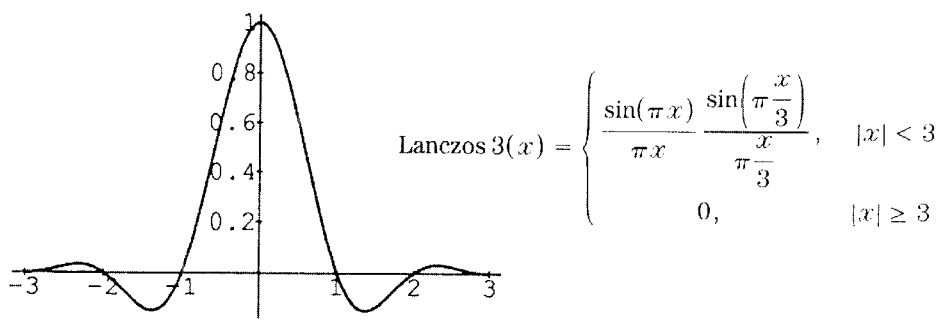
FIG. 76 illustrates the Lancos 3 function structure.

FindMax is a function that reconstructs the original 1 dimensional signal based sample points and returns the position of the maximum as well as the maximum value found. The method of signal reconstruction/resampling used is the Lanczos3 windowed sinc function as shown in FIG. 76.

The Lanczos3 windowed sinc function takes 7 (pixel) samples from the dimension being reconstructed, centered around the estimated position X, i.e. at X−3, X−2, X−1, X, X+1, X+2, X+3. We reconstruct points from X−1 to X+1, each at an interval of 0.1, and determine which point is the maximum. The position that is the maximum value becomes the new center. Due to the nature of the kernel, only 6 entries are required in the convolution kernel for points between X and X+1. We use 6 points for X−1 to X, and 6 points for X to X+1, requiring 7 points overall in order to get pixel values from X−1 to X+1 since some of the pixels required are the same.

Given accurate estimates for the upper-most target from and lower-most target to, it is possible to calculate the position of the first clockmark dot for the upper and lower regions as follows:

```
TARGETS_PER_BLOCK=6
numTargetsDiff=to.TargetNum−from.TargetNum
deltaPixel=(to.Pixel−from.Pixel)/numTargetsDiff
deltaColumn=(to.Column−from.Column)/
   numTargetsDiff
UpperClock.pixel=from.Pixel−
   (from.TargetNum*deltaPixel)
UpperClock.column=from.Column−
   (from.TargetNum*deltaColumn)
// Given the first dot of the upper clockmark, the
// first dot of the lower clockmark is straightforward.
LowerClock.pixel=UpperClock.pixel+
   ((TARGETS_PER_BLOCK+1)*deltaPixel)
LowerClock.column=UpperClock.column+
   ((TARGETS_PER_BLOCK+1)*deltaColumn)
```

This gets us to the first clockmark dot. It is necessary move the column position a further 1 dot away from the data area to reach the center of the clockmark. It is necessary to also move the pixel position a further 4 dots away to reach the center of the border line. The pseudocode values for deltaColumn and deltaPixel are based on a 55 dot distance (the distance between targets), so these deltas must be scaled by 1/55 and 4/55 respectively before being applied to the clockmark coordinates. This is represented as:

```
kDeltaDotFactor=1/DOTS_BETWEEN_TARGET_
   CENTRES
deltaColumn*=kDeltaDotFactor
deltaPixel*=4* kDeltaDotFactor
UpperClock.pixel−=deltaPixel
UpperClock.column−=deltaColumn
LowerClock.pixel+=deltaPixel
LowerClock.column+=deltaColumn
```

UpperClock and LowerClock are now valid clockmark estimates for the first clockmarks directly in line with the centers of the targets.

Setting Black and White Pixel/Dot Ranges

Before the data can be extracted from the data area, the pixel ranges for black and white dots needs to be ascertained. The minimum and maximum pixels encountered during the search for targets were stored in WhiteMin and BlackMax respectively, but these do not represent valid values for these variables with respect to data extraction. They are merely used for storage convenience. The following pseudocode shows the method of obtaining good values for WhiteMin and BlackMax based on the min & max pixels encountered:

```
MinPixel=WhiteMin
MaxPixel=BlackMax
MidRange=(MinPixel+MaxPixel)/2
WhiteMin=MaxPixel−105
BlackMax=MinPixel+84
CurrentState=ExtractingBitImage
```

The ExtractingBitImage state is one where the data block has already been accurately located via the targets, and bit data is currently being extracted one dot column at a time and written to the alternative Artcard bit image. The following of data block clockmarks/borders gives accurate dot recovery regardless of rotation, and thus the segment bounds are ignored. Once the entire data block has been extracted (597 columns of 48 bytes each; 595 columns of data+2 orientation columns), new segment bounds are calculated for the next data block based on the current position. The state is changed to LookingForTargets.

Processing a given dot column involves two tasks:

The first task is to locate the specific dot column of data via the clockmarks.

The second task is to run down the dot column gathering the bit values, one bit per dot.

These two tasks can only be undertaken if the data for the column has been read off the alternative Artcard and transferred to DRAM. This can be determined by checking what scanline Process 1 is up to, and comparing it to the clockmark columns. If the dot data is in DRAM we can update the clockmarks and then extract the data from the column before advancing the clockmarks to the estimated value for the next dot column. The process overview is given in the following pseudocode, with specific functions explained hereinafter:

```
finishedBlock=FALSE
if((UpperClock.column<Process1.CurrentScanLine)
   &&
   (LowerClock.column<Process1.CurrentScanLine))
{
  DetermineAccurateClockMarks( )
  DetermineDataInfo( )
  if (CurrentDotColumn>=0)
     ExtractDataFromColumn( )
  AdvanceClockMarks( )
  if (CurrentDotColumn==FINAL_COLUMN)
  {
  finishedBlock=TRUE
  currentState=LookingForTargets
  SetBounds(UpperClock.pixel, LowerClock.pixel)
  BitImage+=256 KB
  CurrentByte=0
  TargetsFound=0
  }
}
return finishedBlock
```

Locating the Dot Column

Figure 77:
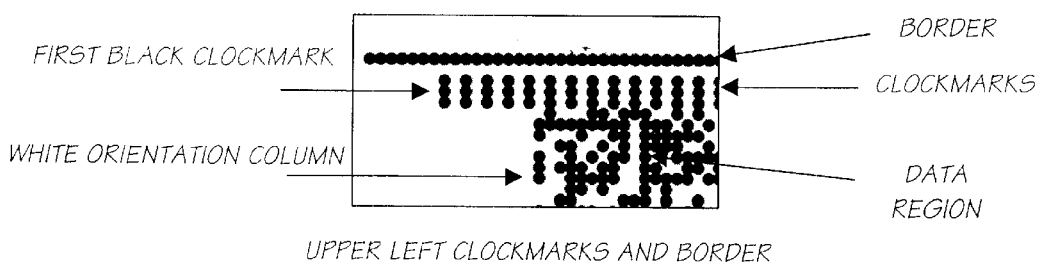
FIG. 77 illustrates an enlarged portion of a datablock illustrating the clockmark and border region.
Figure 78:
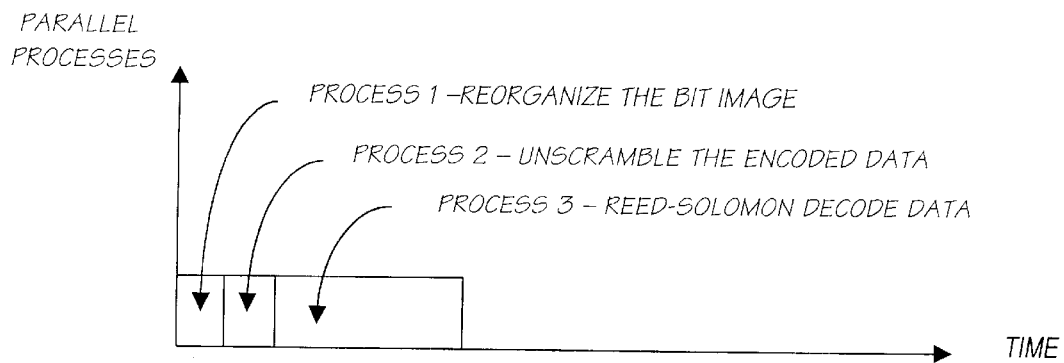
FIG. 78 illustrates the processing steps in decoding a bit image.

A given dot column needs to be located before the dots can be read and the data extracted. This is accomplished by following the clockmarks/borderline along the upper and lower boundaries of the data block. A software equivalent of a phase-locked-loop is used to ensure that even if the clockmarks have been damaged, good estimations of clockmark positions will be made. FIG. 77 illustrates an example data block's top left which corner reveals that there are clockmarks 3 dots high 1166 extending out to the target area, a white row, and then a black border line.

Initially, an estimation of the center of the first black clockmark position is provided (based on the target positions). We use the black border 1168 to achieve an accurate vertical position (pixel), and the clockmark eg. 1166 to get an accurate horizontal position (column). These are reflected in the UpperClock and LowerClock positions.

The clockmark estimate is taken and by looking at the pixel data in its vicinity, the continuous signal is reconstructed and the exact center is determined. Since we have broken out the two dimensions into a clockmark and border, this is a simple one-dimensional process that needs to be performed twice. However, this is only done every second dot column, when there is a black clockmark to register against. For the white clockmarks we simply use the estimate and leave it at that. Alternatively, we could update the pixel coordinate based on the border each dot column (since it is always present). In practice it is sufficient to update both ordinates every other column (with the black clockmarks) since the resolution being worked at is so fine. The process therefore becomes:

If there is a deviation by more than a given tolerance (MAX_CLOCKMARK_DEVIATION), the found signal is ignored and only deviation from the estimate by the maximum tolerance is allowed. In this respect the functionality is similar to that of a phase-locked loop. Thus DetermineAccurateUpperDotCenter is implemented via the following pseudocode:

DetermineAccurateLowerDotCenter is the same, except that the direction from the border to the clockmark is in the negative direction (−3 dots rather than+3 dots).

GetAccuratePixel and GetAccurateColumn are functions that determine an accurate dot center given a coordinate, but only from the perspective of a single dimension. Determining accurate dot centers is a process of signal reconstruction and then finding the location where the minimum signal value is found (this is different to locating a target center, which is locating the maximum value of the signal since the target center is white, not black). The method chosen for signal reconstruction/resampling for this application is the Lanczos3 windowed sinc function as previously discussed with reference to FIG. 76.

It may be that the clockmark or border has been damaged in some way—perhaps it has been scratched. If the new center value retrieved by the resampling differs from the estimate by more than a tolerance amount, the center value is only moved by the maximum tolerance. If it is an invalid position, it should be close enough to use for data retrieval, and future clockmarks will resynchronize the position.

Determining the Center of the First Data Dot and the Deltas to Subsequent Dots

Once an accurate UpperClock and LowerClock position has been determined, it is possible to calculate the center of the first data dot (CurrentDot), and the delta amounts to be added to that center position in order to advance to subsequent dots in the column (DataDelta).

The first thing to do is calculate the deltas for the dot column. This is achieved simply by subtracting the UpperClock from the LowerClock, and then dividing by the number of dots between the two points. It is possible to actually multiply by the inverse of the number of dots since it is constant for an alternative Artcard, and multiplying is faster. It is possible to use different constants for obtaining the deltas in pixel and column dimensions. The delta in pixels is the distance between the two borders, while the delta in columns is between the centers of the two clockmarks. Thus the function DetermineDataInfo is two parts. The first is given by the pseudocode:

```
kDeltaColumnFactor=1/(DOTS_PER_DATA_
   COLUMN+2+2−1)
kDeltaPixelFactor=1/(DOTS_PER_DATA_
   COLUMN+5+5−1)
delta LowerClock.column−UpperClock.column
DataDelta.column=delta*kDeltaColumnFactor
delta=LowerClock.pixel−UpperClock.pixel
DataDelta.pixel=delta*kDeltaPixelFactor
```

It is now possible to determine the center of the first data dot of the column. There is a distance of 2 dots from the center of the clockmark to the center of the first data dot, and 5 dots from the center of the border to the center of the first data dot. Thus the second part of the function is given by the pseudocode:

CurrentDot.column=UpperClock.column+ (2*DataDelta.column)

CurrentDot.pixel=UpperClock.pixel+ (5*DataDelta.pixel)

Running Down a Dot Column

Since the dot column has been located from the phase-locked loop tracking the clockmarks, all that remains is to sample the dot column at the center of each dot down that column. The variable CurrentDot points is determined to the center of the first dot of the current column. We can get to the next dot of the column by simply adding DataDelta (2 additions: 1 for the column ordinate, the other for the pixel ordinate). A sample of the dot at the given coordinate (bi-linear interpolation) is taken, and a pixel value representing the center of the dot is determined. The pixel value is then used to determine the bit value for that dot. However it is possible to use the pixel value in context with the center value for the two surrounding dots on the same dot line to make a better bit judgement.

We can be assured that all the pixels for the dots in the dot column being extracted are currently loaded in DRAM, for if the two ends of the line (clockmarks) are in DRAM, then the dots between those two clockmarks must also be in DRAM. Additionally, the data block height is short enough (only 384 dots high) to ensure that simple deltas are enough to traverse the length of the line. One of the reasons the card is divided into 8 data blocks high is that we cannot make the same rigid guarantee across the entire height of the card that we can about a single data block.

The high level process of extracting a single line of data (48 bytes) can be seen in the following pseudocode. The dataBuffer pointer increments as each byte is stored, ensuring that consecutive bytes and columns of data are stored consecutively.

The GetPixel function takes a dot coordinate (fixed point) and samples 4 CCD pixels to arrive at a center pixel value via bilinear interpolation.

The DetermineCenterDot function takes the pixel values representing the dot centers to either side of the dot whose bit value is being determined, and attempts to intelligently guess the value of that center dot's bit value. From the generalized blurring curve of FIG. 64 there are three common cases to consider:

The dot's center pixel value is lower than WhiteMin, and is therefore definitely a black dot. The bit value is therefore definitely 1.

The dot's center pixel value is higher than BlackMax, and is therefore definitely a white dot. The bit value is therefore definitely 0.

The dot's center pixel value is somewhere between Black-Max and WhiteMin. The dot may be black, and it may be white. The value for the bit is therefore in question. A number of schemes can be devised to make a reasonable guess as to the value of the bit. These schemes must balance complexity against accuracy, and also take into account the fact that in some cases, there is no guaranteed solution. In those cases where we make a wrong bit decision, the bit's Reed-Solomon symbol will be in error, and must be corrected by the Reed-Solomon decoding stage in Phase 2.

The scheme used to determine a dot's value if the pixel value is between BlackMax and WhiteMin is not too complex, but gives good results. It uses the pixel values of the dot centers to the left and right of the dot in question, using their values to help determine a more likely value for the center dot:

If the two dots to either side are on the white side of MidRange (an average dot value), then we can guess that if the center dot were white, it would likely be a "definite" white. The fact that it is in the not-sure region would indicate that the dot was black, and had been affected by the surrounding white dots to make the value less sure. The dot value is therefore assumed to be black, and hence the bit value is 1.

If the two dots to either side are on the black side of MidRange, then we can guess that if the center dot were black, it would likely be a "definite" black. The fact that it is in the not-sure region would indicate that the dot was white, and had been affected by the surrounding black dots to make the value less sure. The dot value is therefore assumed to be white, and hence the bit value is 0.

If one dot is on the black side of MidRange, and the other dot is on the white side of MidRange, we simply use the center dot value to decide. If the center dot is on the black side of MidRange, we choose black (bit value 1). Otherwise we choose white (bit value 0).

The logic is represented by the following:

From this one can see that using surrounding pixel values can give a good indication of the value of the center dot's state. The scheme described here only uses the dots from the same row, but using a single dot line history (the previous dot line) would also be straightforward as would be alternative arrangements.

Updating Clockmarks for the Next Column

Once the center of the first data dot for the column has been determined, the clockmark values are no longer needed. They are conveniently updated in readiness for the next column after the data has been retrieved for the column. Since the clockmark direction is perpendicular to the traversal of dots down the dot column, it is possible to use the pixel delta to update the column, and subtract the column delta to update the pixel for both clocks:

UpperClock.column+=DataDelta.pixel
LowerClock.column+=DataDelta.pixel
UpperClock.pixel-=DataDelta.column
LowerClock.pixel-=DataDelta.column These are now the estimates for the next dot column.

Timing

The timing requirement will be met as long as DRAM utilization does not exceed 100%, and the addition of parallel algorithm timing multiplied by the algorithm DRAM utilization does not exceed 100%. DRAM utilization is specified relative to Process1, which writes each pixel once in a consecutive manner, consuming 9% of the DRAM bandwidth.

The timing as described in this section, shows that the DRAM is easily able to cope with the demands of the alternative Artcard Reader algorithm. The timing bottleneck will therefore be the implementation of the algorithm in terms of logic speed, not DRAM access. The algorithms have been designed however, with simple architectures in mind, requiring a minimum number of logical operations for every memory cycle. From this point of view, as long as the implementation state machine or equivalent CPU/DSP architecture is able to perform as described in the following sub-sections, the target speed will be met.

Locating the Targets

Targets are located by reading pixels within the bounds of a pixel column. Each pixel is read once at most. Assuming a run-length encoder that operates fast enough, the bounds on the location of targets is memory access. The accesses will therefore be no worse than the timing for Process 1, which means a 9% utilization of the DRAM bandwidth.

The total utilization of DRAM during target location (including Process1) is therefore 18%, meaning that the target locator will always be catching up to the alternative Artcard image sensor pixel reader.

Processing the Targets

The timing for sorting and checking the target numbers is trivial. The finding of better estimates for each of the two target centers involves 12 sets of 12 pixel reads, taking a total of 144 reads. However the fixing of accurate target centers is not trivial, requiring 2 sets of evaluations. Adjusting each target center requires 8 sets of 20 different 6-entry convolution kernels. Thus this totals 8×20×6 multiply-accumulates=960. In addition, there are 7 sets of 7 pixels to be retrieved, requiring 49 memory accesses. The total number per target is therefore 144+960+49=1153, which is approximately the same number of pixels in a column of pixels (1152). Thus each target evaluation consumes the time taken by otherwise processing a row of pixels. For two targets we effectively consume the time for 2 columns of pixels.

A target is positively identified on the first pixel column after the target number. Since there are 2 dot columns before the orientation column, there are 6 pixel columns. The Target Location process effectively uses up the first of the pixel columns, but the remaining 5 pixel columns are not processed at all. Therefore the data area can be located in ⅖ of the time available without impinging on any other process time.

The remaining ⅗ of the time available is ample for the trivial task of assigning the ranges for black and white pixels, a task that may take a couple of machine cycles at most.

Extracting Data

There are two parts to consider in terms of timing:

Getting accurate clockmarks and border values

Extracting dot values

Clockmarks and border values are only gathered every second dot column. However each time a clockmark estimate is updated to become more accurate, 20 different 6-entry convolution kernels must be evaluated. On average there are 2 of these per dot column (there are 4 every 2 dot-columns) Updating the pixel ordinate based on the border only requires 7 pixels from the same pixel scanline. Updating the column ordinate however, requires 7 pixels from different columns, hence different scanlines. Assuming worst case scenario of a cache miss for each scanline entry and 2 cache misses for the pixels in the same scanline, this totals 8 cache misses.

Extracting the dot information involves only 4 pixel reads per dot (rather than the average 9 that define the dot). Considering the data area of 1152 pixels (384 dots), at best this will save 72 cache reads by only reading 4 pixel dots instead of 9. The worst case is a rotation of 1° which is a single pixel translation every 57 pixels, which gives only slightly worse savings.

It can then be safely said that, at worst, we will be reading fewer cache lines less than that consumed by the pixels in the data area. The accesses will therefore be no worse than the timing for Process 1, which implies a 9% utilization of the DRAM bandwidth.

The total utilization of DRAM during data extraction (including Process1) is therefore 18%, meaning that the data extractor will always be catching up to the alternative Artcard image sensor pixel reader. This has implications. for the Process Targets process in that the processing of targets can be performed by a relatively inefficient method if necessary, yet still catch up quickly during the extracting data process.

Phase 2—Decode Bit Image

Figure 79:
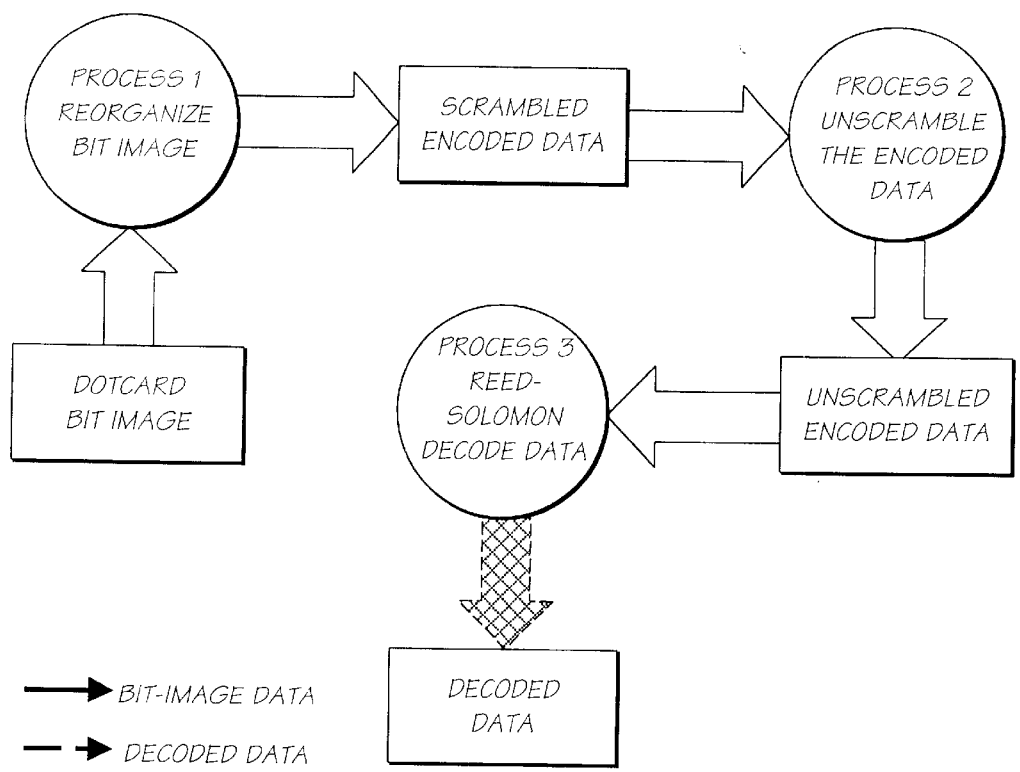
FIG. 79 illustrates the dataflow steps in decoding a bit image.

Phase 2 is the non-real-time phase. of alternative Artcard data recovery algorithm. At the start of Phase 2 a bit image has been extracted from the alternative Artcard. It represents the bits read from the data regions of the alternative Artcard. Some of the bits will be in error, and perhaps the entire data is rotated 180° because the alternative Artcard was rotated when inserted. Phase 2 is concerned with reliably extracting the original data from this encoded bit image. There are basically 3 steps to be carried out as illustrated in FIG. 79:

Reorganize the bit image, reversing it if the alternative Artcard was inserted backwards Unscramble the encoded data Reed-Solomon decode the data from the bit image Each of the 3 steps is defined as a separate process, and performed consecutively, since the output of one is required as the input to the next. It is straightforward to combine the first two steps into a single process, but for the purposes of clarity, they are treated separately here.

Figure 80:
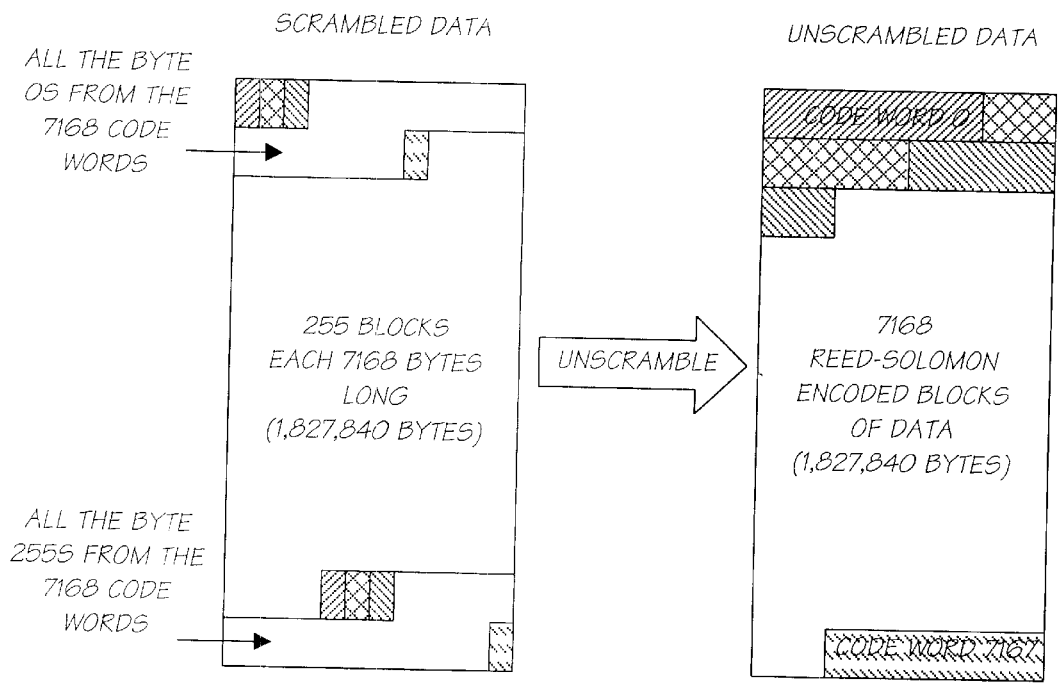
FIG. 80 illustrates the descrambling process of the preferred embodiment.

From a data/process perspective, Phase 2 has the structure as illustrated in FIG. 80.

The timing of Processes 1 and 2 are likely to be negligible, consuming less than $\frac{1}{1000}^{th}$ of a second between them. Process 3 (Reed Solomon decode) consumes approximately 0.32 seconds, making this the total time required for Phase 2.

Reorganize the bit image, reversing it if necessary The bit map in DRAM now represents the retrieved data from the alternative Artcard. However the bit image is not contiguous. It is broken into 64 32 k chunks, one chunk for each data block. Each 32 k chunk contains only 28,656 useful bytes:

48 bytes from the leftmost Orientation Column 28560 bytes from the data region proper 48 bytes from the rightmost Orientation Column 4112 unused bytes The 2 MB buffer used for pixel data (stored by Process 1 of Phase 1) can be used to hold the reorganized bit image, since pixel data is not required during Phase 2. At the end of the reorganization, a correctly oriented contiguous bit image will be in the 2 MB pixel buffer, ready for Reed-Solomon decoding.

If the card is correctly oriented, the leftmost Orientation Column will be white and the rightmost Orientation Column will be black. If the card has been rotated 180°, then the leftmost Orientation Column will be black and the rightmost Orientation Column will be white.

A simple method of determining whether the card is correctly oriented or not, is to go through each data block, checking the first and last 48 bytes of data until a block is found with an overwhelming ratio of black to white bits. The following pseudocode demonstrates this, returning TRUE if the card is correctly oriented, and FALSE if it is not:

totalCountL=0 totalCountR=0 for (i=0; i<64; i++)

{ blackCountL=0

```
blackCountR=0
currBuff=dataBuffer
for (j=0; j<48; j++)
{
blackCountL+=CountBits(*currBuff)
currBuff++
}
currBuff+=28560
for (j=0; j<48; j++)
{
blackCountR+=CountBits(*currBuff)
currBuff++
}
dataBuffer+=32 k
if (blackCountR>(blackCountL*4))
    return TRUE
    if (blackCountL>(blackCountR*4))
    return FALSE
    totalCountL+=blackCountL
    totalCountR+=blackCountR
}
return (totalCountR>totalCountL)
```

The data must now be reorganized, based on whether the card was oriented correctly or not. The simplest case is that the card is correctly oriented. In this case the data only needs to be moved around a little to remove the orientation columns and to make the entire data contiguous. This is achieved very simply in situ, as described by the following pseudocode:

```
DATA_BYTES_PER_DATA_BLOCK=28560
to=dataBuffer
from=dataBuffer+48)//left orientation column
for (i=0; i<64; i++)
{
BlockMove(from, to, DATA_BYTES_PER_DATA_
    BLOCK)
from +=32 k
to +=DATA_BYTES_PER_DATA_BLOCK
}
```

The other case is that the data actually needs to be reversed. The algorithm to reverse the data is quite simple, but for simplicity, requires a 256-byte table Reverse where the value of Reverse[N] is a bit-reversed N.

The timing for either process is negligible, consuming less than $\frac{1}{1000}^{th}$ of a second:

2 MB contiguous reads (2048/16×12 ns=1,536 ns)

2 MB effectively contiguous byte writes (2048/16×12 ns=1,536 ns)

Unscramble the Encoded Image

The bit image is now 1,827,840 contiguous, correctly oriented, but scrambled bytes. The bytes must be unscrambled to create the 7,168 Reed-Solomon blocks, each 255 bytes long. The unscrambling process is quite straightforward, but requires a separate output buffer since the unscrambling cannot be performed in situ. FIG. 80 illustrates the unscrambling process conducted memory The following pseudocode defines how to perform the unscrambling process:

```
groupSize 255
numBytes=1827840;
inBuffer=scrambledBuffer;
outBuffer=unscrambledBuffer;
for (i=0; i<groupSize; i++)
    for (j=i; j<numBytes; j+=groupSize)
        outBuffer[j]=*inBuffer++
```

The timing for this process is negligible, consuming less than $\frac{1}{1000}^{th}$ of a second:

2 MB contiguous reads (2048/16×12 ns=1,536 ns)

2 MB non-contiguous byte writes (2048×12 ns=24,576 ns)

At the end of this process the unscrambled data is ready for Reed-Solomon decoding.

Reed Solomon Decode

The final part of reading an alternative Artcard is the Reed-Solomon decode process, where approximately 2 MB of unscrambled data is decoded into approximately 1 MB of valid alternative Artcard data.

The algorithm performs the decoding one Reed-Solomon block at a time, and can (if desired) be performed in situ, since the encoded block is larger than the decoded block, and the redundancy bytes are stored after the data bytes.

The first 2 Reed-Solomon blocks are control blocks, containing information about the size of the data to be extracted from the bit image. This meta-information must be decoded first, and the resultant information used to decode the data proper. The decoding of the data proper is simply a case of decoding the data blocks one at a time. Duplicate data blocks can be used if a particular block fails to decode.

The highest level of the Reed-Solomon decode is set out in pseudocode:

```
// Constants for Reed Solomon decode
sourceBlockLength=255;
destBlockLength=127;
numControlBlocks=2;
// Decode the control information
if (! GetControlData(source, destBlocks, lastBlock))
    return error
destBytes=((destBlocks-1)*destBlockLength)+lastBlock
offsetToNextDuplicate=destBlocks*sourceBlockLength
// Skip the control blocks and position at data
source+=numControlBlocks*sourceBlockLength
// Decode each of the data blocks, trying
// duplicates as necessary
blocksInError=0;
for (i=0; i<destBlocks; i++)
{
    found=DecodeBlock(source, dest);
if (! found)
    {
    duplicate=source+offsetToNextDuplicate
    while ((! found) && (duplicate<sourceEnd))
    found=DecodeBlock(duplicate, dest)
    duplicate+=offsetToNextDuplicate
    }
}
    if (! found)
    blocksInError++
    source+=sourceBlockLength
    dest+=destBlockLength
}
return destBytes and blocksInError
```

DecodeBlock is a standard Reed Solomon block decoder using m=8 and t=64.

The GetControlData function is straightforward as long as there are no decoding errors. The function simply calls DecodeBlock to decode one control block at a time until successful. The control parameters can then be extracted from the first 3 bytes of the decoded data (destBlocks is stored in the bytes 0 and 1, and lastBlock is stored in byte 2). If there are decoding errors the function must traverse the 32 sets of 3 bytes and decide which is the most likely set value to be correct. One simple method is to find 2 consecutive equal copies of the 3 bytes, and to declare those values the correct ones. An alternative method is to count occurrences of the different sets of 3 bytes, and announce the most common occurrence to be the correct one.

The time taken to Reed-Solomon decode depends on the implementation. While it is possible to use a dedicated core to perform the Reed-Solomon decoding process (such as LSI Logic's L64712), it is preferable to select a CPU/DSP combination that can be more generally used throughout the embedded system (usually to do something with the decoded data) depending on the application. Of course decoding time must be fast enough with the CPU/DSP combination.

The L64712 has a throughput of 50 Mbits per second (around 6.25 MB per second), so the time is bound by the speed of the Reed-Solomon decoder rather than the maximum 2 MB read and 1 MB write memory access time. The time taken in the worst case (all 2 MB requires decoding) is thus 2/6.25s=approximately 0.32 seconds. Of course, many further refinements are possible including the following:

The blurrier the reading environment, the more a given dot is influenced by the surrounding dots. The current reading algorithm of the preferred embodiment has the ability to use the surrounding dots in the same column in order to make a better decision about a dot's value. Since the previous column's dots have already been decoded, a previous column dot history could be useful in determining the value of those dots whose pixel values are in the not-sure range.

A different possibility with regard to the initial stage is to remove it entirely, make the initial bounds of the data blocks larger than necessary and place greater intelligence into the ProcessingTargets functions. This may reduce overall complexity. Care must be taken to maintain data block independence.

Further the control block mechanism can be made more robust:

The control block could be the first and last blocks rather than make them contiguous (as is the case now). This may give greater protection against certain pathological damage scenarios.

The second refinement is to place an additional level of redundancy/error detection into the control block structure to be used if the Reed-Solomon decode step fails. Something as simple as parity might improve the likelihood of control information if the Reed-Solomon stage fails.

Phase 5 Running the Vark Script

The overall time taken to read the Artcard 9 and decode it is therefore approximately 2.15 seconds. The apparent delay to the user is actually only 0.65 seconds (the total of Phases 3 and 4), since the Artcard stops moving after 1.5 seconds.

Once the Artcard is loaded, the Artvark script must be interpreted, Rather than run the script immediately, the script is only run upon the pressing of the 'Print' button 13 (FIG. 1). The taken to run the script will vary depending on the complexity of the script, and must be taken into account for the perceived delay between pressing the print button and the actual print button and the actual printing.

As noted previously, the VLIW processor 74 is a digital processing system that accelerates computationally expensive Vark functions. The balance of functions performed in software by the CPU core 72, and in hardware by the VLIW processor 74 will be implementation dependent. The goal of the VLIW processor 74 is to assist all Artcard styles to execute in a time that does not seem too slow to the user. As CPUs become faster and. more powerful, the number of functions requiring hardware acceleration becomes less and less. The VLIW processor has a microcoded ALU subsystem that allows general hardware speed up of the following time-critical functions.

1) Image access mechanisms for general software processing
2) Image convolver.
3) Data driven image warper
4) Image scaling
5) Image tessellation
6) Affine transform
7) Image compositor
8) Color space transform
9) Histogram collector
10) Illumination of the Image
11) Brush stamper
12) Histogram collector
13) CCD image to internal image conversion
14) Construction of image pyramids (used by warper & for brushing)

The following table summarizes the time taken for each Vark operation if implemented in the ALU model. The method of implementing the function using the ALU model is described hereinafter.

For example, to convert a CCD image, collect histogram & perform lookup-color replacement (for image enhancement) takes: 9+2+0.5 cycles per pixel, or 11.5 cycles. For a 1500×1000 image that is 172,500,000, or approximately 0.2 seconds per component, or 0.6 seconds for all 3 components. Add a simple warp, and the total comes to 0.6+0.36, almost 1 second.

Image Convolver

A convolve is a weighted average around a center pixel. The average may be a simple sum, a sum of absolute values, the absolute value of a sum, or sums truncated at 0.

The image convolver is a general-purpose convolver, allowing a variety of functions to be implemented by varying the values within a variable-sized coefficient kernel. The kernel sizes supported are 3×3, 5×5 and 7×7 only.

Figure 82:
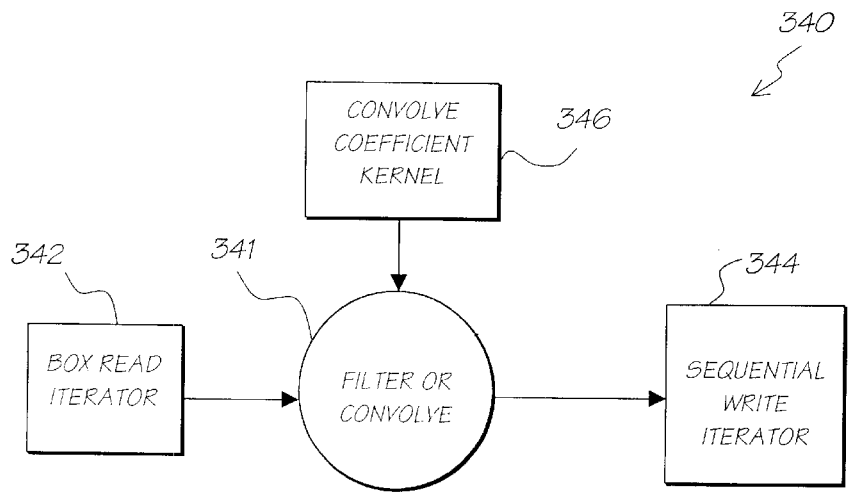
FIG. 82 illustrates a convolution process.

Turning now to FIG. 82, there is illustrated 340 an example of the convolution process. The pixel component values fed into the convolver process 341 come from a Box Read Iterator 342. The Iterator 342 provides the image data row by row, and within each row, pixel by pixel. The output from the convolver 341 is sent to a Sequential Write Iterator 344, which stores the resultant image in a valid image format.

A Coefficient Kernel 346 is a lookup table in DRAM. The kernel is arranged with coefficients in the same order as the Box Read Iterator 342. Each coefficient entry is 8 bits. A simple Sequential Read Iterator can be used to index into the kernel 346 and thus provide the coefficients. It simulates an image with ImageWidth equal to the kernel size, and a Loop option is set so that the kernel would continuously be provided.

Figure 81:
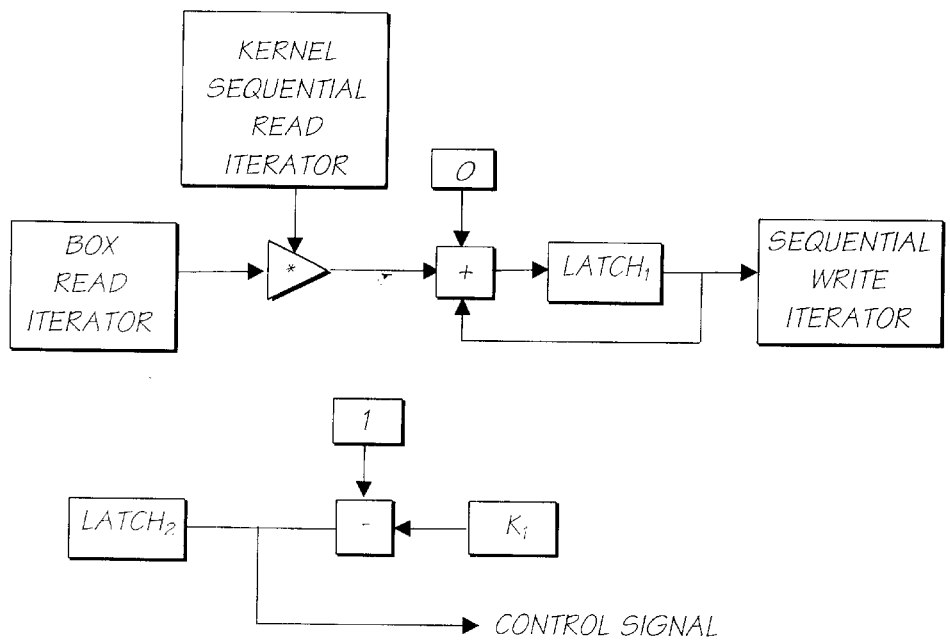
FIG. 81 illustrates one form of implementation of the convolver.

One form of implementation of the convolve process on an ALU unit is as illustrated in FIG. 81. The following constants are set by software:

The control logic is used to count down the number of multiply/adds per pixel. When the count (accumulated in Latch$_2$) reaches 0, the control signal generated is used to write out the current convolve value (from Latch$_1$) and to reset the count. In this way, one control logic block can be used for a number of parallel convolve streams.

Each cycle the multiply ALU can perform one multiply/add to incorporate the appropriate part of a pixel. The number of cycles taken to sum up all the values is therefore the number of entries in the kernel. Since this is compute bound, it is appropriate to divide the image into multiple sections and process them in parallel on different ALU units.

On a 7×7 kernel, the time taken for each pixel is 49 cycles, or 490 ns. Since each cache line holds 32 pixels, the time available for memory access is 12,740 ns. ((32−7+1)×490 ns). The time taken to read 7 cache lines and write 1 is worse case 1,120 ns (8*140 ns, all accesses to same DRAM bank) Consequently it is possible to process up to 10 pixels in parallel given unlimited resources. Given a limited number of ALUs it is possible to do at best 4 in parallel. The time taken to therefore perform the convolution using a 7×7 kernel is 0.18375 seconds (1500*1000*490 ns/4=183,750,000 ns).

On a 5×5 kernel, the time taken for each pixel is 25 cycles, or 250 ns. Since each cache line holds 32 pixels, the time available for memory access is 7,000 ns. ((32−5+1)×250 ns). The time taken to read 5 cache lines and write 1 is worse case 840 ns (6*140 ns, all accesses to same DRAM bank) Consequently it is possible to process up to 7 pixels in parallel given unlimited resources. Given a limited number of ALUs it is possible to do at best 4. The time taken to therefore perform the convolution using a 5×5 kernel is 0.09375 seconds (1500*1000*250 ns /4=93,750,000 ns).

On a 3×3 kernel, the time taken for each pixel is 9 cycles, or 90 ns. Since each cache line holds 32 pixels, the time available for memory access is 2,700 ns. ((32−3+1)×90 ns). The time taken to read 3 cache lines and write 1 is worse case 560 ns (4*140 ns, all accesses to same DRAM bank). Consequently it is possible to process up to 4 pixels in parallel given unlimited resources. Given a limited number of ALUs and Read/Write Iterators it is possible to do at best 4. The time taken to therefore perform the convolution using a 3×3 kernel is 0.03375 seconds (1500*1000*90 ns/4=33,750,000 ns). Consequently each output pixel takes kernelsize/3 cycles to compute. The actual timings are summarised in the following table:

Image Compositor

Compositing is to add a foreground image to a background image using a matte or a channel to govern the appropriate proportions of background and foreground in the final image. Two styles of compositing are preferably supported, regular compositing and associated compositing. The rules for the two styles are:

Regular composite: new Value=Foreground+(Background−Foreground) a

Associated composite: new value=Foreground+(1−a) Background

Figure 83:
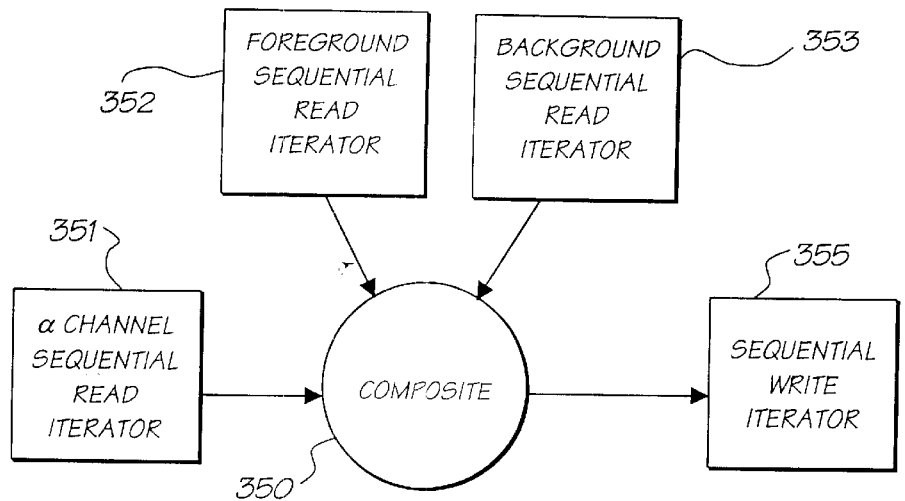
FIG. 83 illustrates the compositing process.

The difference then, is that with associated compositing, the foreground has been pre-multiplied with the matte, while in regular compositing it has not. An example of the compositing process is as illustrated in FIG. 83.

The alpha channel has values from 0 to 255 corresponding to the range 0 to 1.

Regular Composite

A regular composite is implemented as:

Foreground+(Background−Foreground)*α/255

Figure 84:
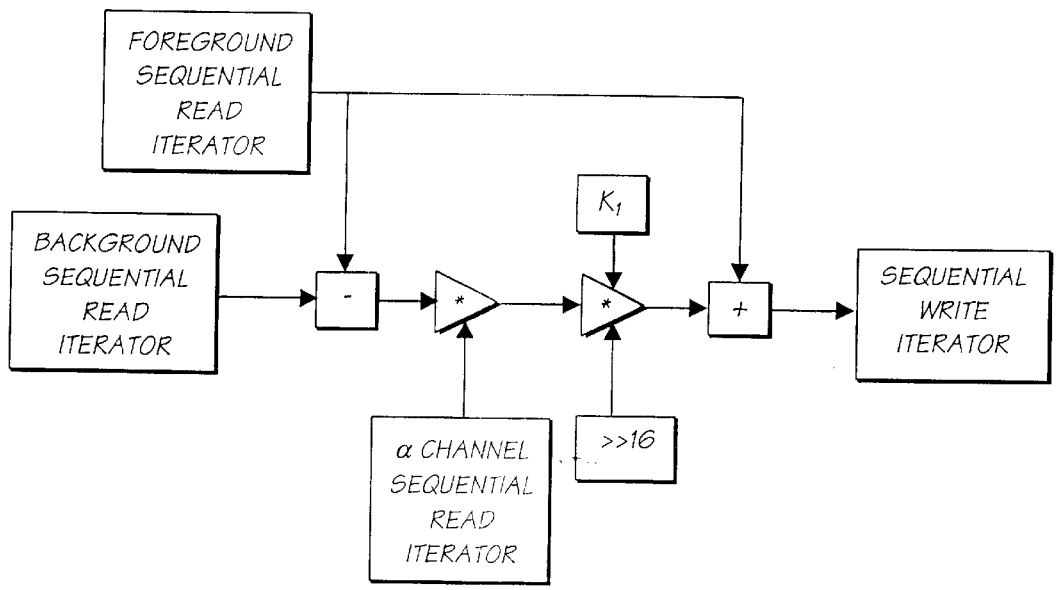
FIG. 84 illustrates the regular compositing process in more detail.

The division by X/255 is approximated by 257X/65536. An implementation of the compositing process is shown in more detail in FIG. 84, where the following constant is set by software:

Since 4 Iterators are required, the composite process takes 1 cycle per pixel, with a utilization of only half of the ALUs. The composite process is only run on a single channel. To composite a 3-channel image with another, the compositor must be run 3 times, once for each channel.

The time taken to composite a full size single channel is 0.015s (1500*1000*1*10 ns), or 0.045s to composite all 3 channels.

To approximate a divide by 255 it is possible to multiply by 257 and then divide by 65536. It can also be achieved by a single add (256*x+x) and ignoring (except for rounding purposes) the final 16 bits of the result.

As shown in FIG. 42, the compositor process requires 3 Sequential Read Iterators 351–353 and 1 Sequential Write Iterator 355, and is implemented as microcode using a Adder ALU in conjunction with a multiplier ALU. Composite time is 1 cycle (10 ns) per-pixel. Different microcode is required for associated and regular compositing, although the average time per pixel composite is the same.

The composite process is only run on a single channel. To composite one 3-channel image with another, the compositor must be run 3 times, once for each channel. As the a channel is the same for each composite, it must be read each time. However it should be noted that to transfer (read or write) 4×32 byte cache-lines in the best case takes 320 ns. The pipeline gives an average of 1 cycle per pixel composite, taking 32 cycles or 320 ns (at 10 MHz) to composite the 32 pixels, so the a channel is effectively read for free. An entire channel can therefore be composited in:

$$1500/32*1000*320 \text{ ns}=15{,}040{,}000 \text{ ns}=0.015 \text{ seconds.}$$

The time taken to composite a full size 3 channel image is therefore 0.045 seconds.

Construct Image Pyramid

Several functions, such as warping, tiling and brushing, require the average value of a given area of pixels. Rather than calculate the value for each area given, these functions preferably make use of an image pyramid. As illustrated previously in FIG. 33, an image pyramid 360 is effectively a multi-resolution pixelmap. The original image is a 1:1 representation. Sub-sampling by 2:1 in each dimension produces an image ¼ the original size. This process continues until the entire image is represented by a single pixel.

An image pyramid is constructed from an original image, and consumes ⅓ of the size taken up by the original image (¼+ 1/16+ 1/64+. . . ). For an original image of 1500×1000 the corresponding image pyramid is approximately ½ MB The image pyramid can be constructed via a 3×3 convolve performed on 1 in 4 input image pixels advancing the center of the convolve kernel by 2 pixels each dimension. A 3×3 convolve results in higher accuracy than simply averaging 4 pixels, and has the added advantage that coordinates on different pyramid levels differ only by shifting 1 bit per level.

The construction of an entire pyramid relies on a software loop that calls the pyramid level construction function once for each level of the pyramid.

The timing to produce 1 level of the pyramid is ¾*¼ of the resolution of the input image since we are generating an image ¼ of the size of the original. Thus for a 1500×1000 image:

Timing to produce level 1 of pyramid=¾*750*500=843,750 cycles

Timing to produce level 2 of pyramid=¾*375*250=210,938 cycles

Timing to produce level 3 of pyramid=¾*188*125=52,735 cycles Etc.

The total time is ¾ cycle per original image pixel (image pyramid is ⅓ of original image size, and each pixel takes ¾ cycles to be calculated, i.e. ⅓*9/4=¾). In the case of a 1500×1000 image is 1,125,000 cycles (at 100 MHz), or 0.011 seconds. This timing is for a single color channel, 3 color channels require 0.034 seconds processing time.

General Data Driven Image Warper

The ACP 31 is able to carry out image warping manipulations of the input image. The principles of image warping are well-known in theory. One thorough text book reference on the process of warping is "Digital Image Warping" by George Wolberg published in 1990 by the IEEE Computer Society Press, Los Alamitos, Calif. The warping process utilizes a warp map which forms part of the data fed in via Artcard 9. The warp map can be arbitrarily dimensioned in accordance with requirements and provides information of a mapping of input pixels to output pixels. Unfortunately, the utilization of arbitrarily sized warp maps presents a number of problems which must be solved by the image warper.

Figure 85:
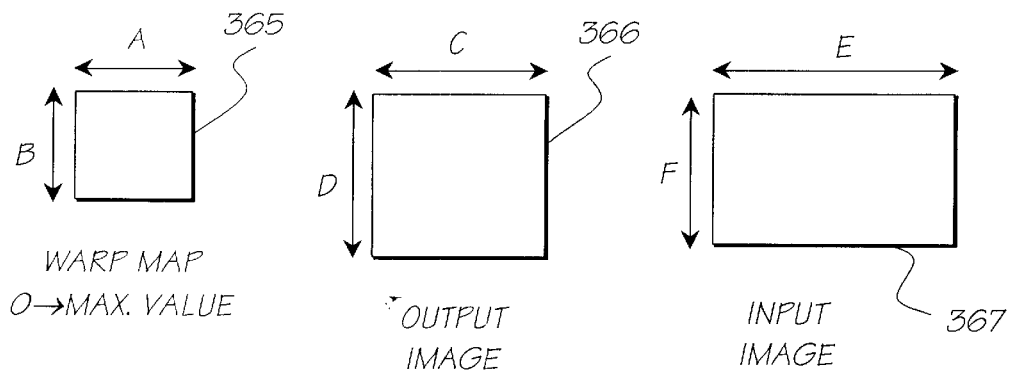
FIG. 85 illustrates the process of warping using a warp map.

Turning to FIG. 85, a warp map 365, having dimensions A×B comprises array values of a certain magnitude (for example 8 bit values from 0–255) which set out the coordinate of a theoretical input image which maps to the corresponding "theoretical" output image having the same array coordinate indices. Unfortunately, any output image eg. 366 will have its own dimensions C×D which may further be totally different from an input image which may have its own dimensions E×F. Hence, it is necessary to facilitate the remapping of the warp map 365. so that it can be utilised for output image 366 to determine, for each output pixel, the corresponding area or region of the input image 367 from which the output pixel color data is to be constructed. For each output pixel in output image 366 it is necessary to first determine a corresponding warp map value from warp map 365. This may include the need to bilinearly interpolate the surrounding warp map values when an output image pixel maps to a fractional position within warp map table 365. The result of this process will give the location of an input image pixel in a "theoretical" image which will be dimensioned by the size of each data value within the warp map 365. These values must be re-scaled so as to map the theoretical image to the corresponding actual input image 367.

In order to determine the actual value and output image pixel should take so as to avoid aliasing effects, adjacent output image pixels should be examined to determine a region of input image pixels 367 which will contribute to the final output image pixel value. In this respect, the image pyramid is utilised as will become more apparent hereinafter.

The image warper performs several tasks in order to warp an image.

Scale the warp map to match the output image size.

Determine the span of the region of input image pixels represented in each output pixel.

Calculate the final output pixel value via tri-linear interpolation from the input image pyramid Scale Warp Map As noted previously, in a data driven warp, there is the need for a warp map that describes, for each output pixel, the center of a corresponding input image map. Instead of having a single warp map as previously described, containing interleaved x and y value information, it is possible to treat the X and Y coordinates as separate channels.

Consequently, preferably there are two warp maps: an X warp map showing the warping of X coordinates, and a Y warp map, showing the warping of the Y coordinates. As noted previously, the warp map 365 can have a different spatial resolution than the image they being scaled (for example a 32×32 warp-map 365 may adequately describe a warp for a 1500×1000 image 366). In addition, the warp maps can be represented by 8 or 16 bit values that correspond to the size of the image being warped.

There are several steps involved in producing points in the input image space from a given warp map:

1. Determining the corresponding position in the warp map for the output pixel
2. Fetch the values from the warp map for the next step (this can require scaling in the resolution domain if the warp map is only 8 bit values)
3. Bi-linear interpolation of the warp map to determine the actual value
4. Scaling the value to correspond to the input image domain The first step can be accomplished by multiplying the current X/Y coordinate in the output image by a scale factor (which can be different in X & Y). For example, if the output image was 1500×1000, and the warp map was 150×100, we scale both X & Y by 1/10.

Fetching the values from the warp map requires access to 2 Lookup tables. One Lookup table indexes into the X warp-map, and the other indexes into the Y warp-map. The lookup table either reads 8 or 16 bit entries from the lookup table, but always returns 16 bit values (clearing the high 8 bits if the original values are only 8 bits).

The next step in the pipeline is to bi-linearly interpolate the looked-up warp map values.

Figure 86:
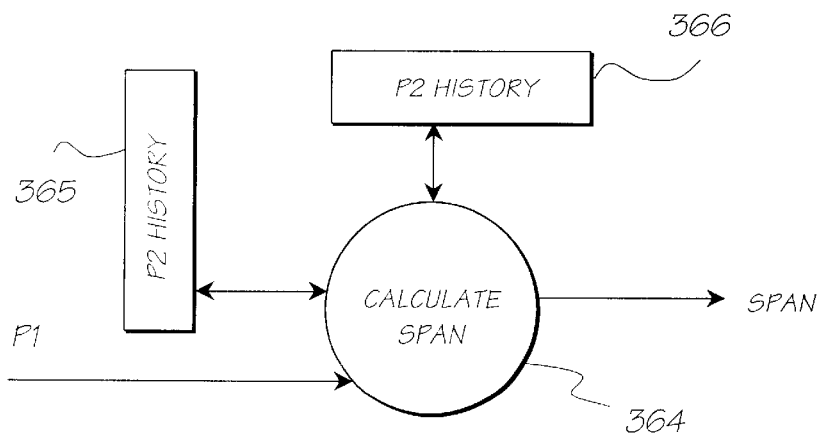
FIG. 86 illustrates the warping bi-linear interpolation process.

Finally the result from the bi-linear interpolation is scaled to place it in the same domain as the image to be warped. Thus, if the warp map range was 0–255, we scale X by 1500/255, and Y by 1000/255. The interpolation process is as illustrated in FIG. 86 with the following constants set by software:

The following lookup table is used:

Span Calculation

The points from the warp map 365 locate centers of pixel regions in the input image 367. The distance between input image pixels of adjacent output image pixels will indicate the size of the regions, and this distance can be approximated via a span calculation.

Figure 87:
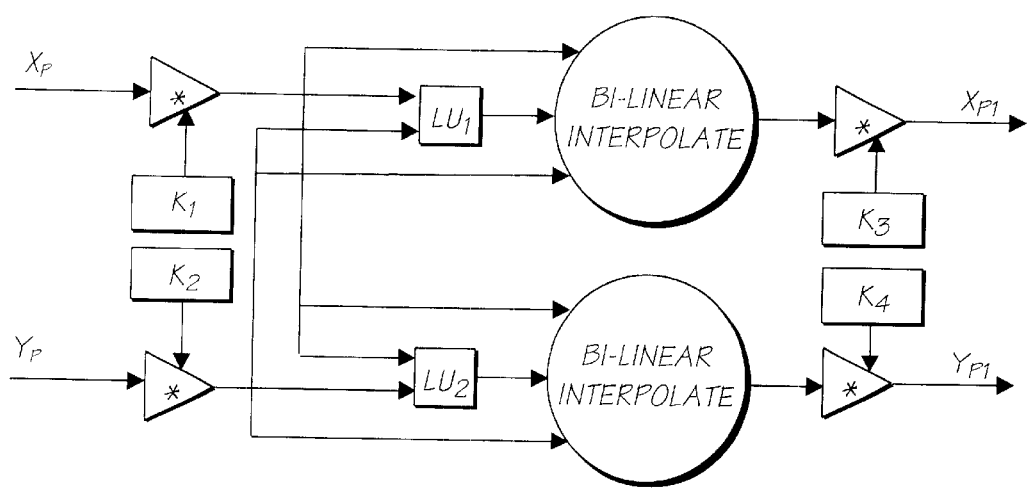
FIG. 87 illustrates the process of span calculation.

Turning to FIG. 87, for a given current point in the warp map P1, the previous point on the same line is called P0, and the previous line's point at the same position is called P2. We determine the absolute distance in X & Y between P1 and P0, and between P1 and P2. The maximum distance in X or Y becomes the span which will be a square approximation of the actual shape.

Figure 88:
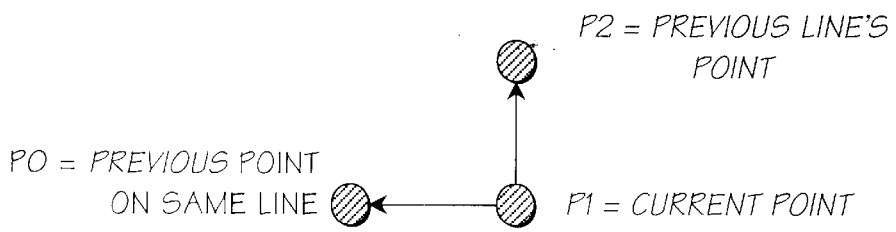
FIG. 88 illustrates the basic span calculation process.
Figure 89:
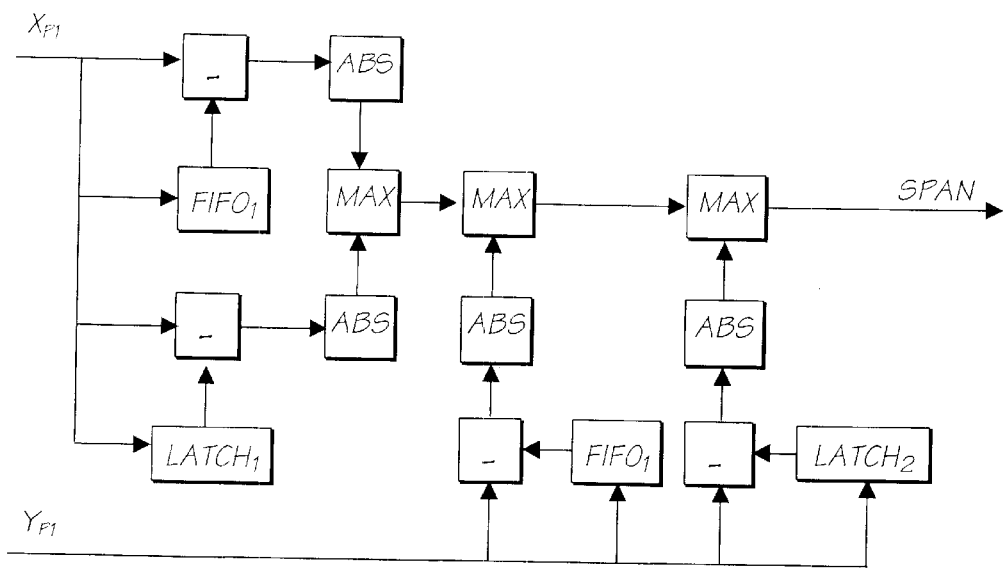
FIG. 89 illustrates one form of detail implementation of the span calculation process.

Preferably, the points are processed in a vertical strip output order, P0 is the previous point on the same line within a strip, and when P1 is the first point on line within a strip, then P0 refers to the last point in the previous strip's corresponding line. P2 is the previous line's point in the same strip, so it can be kept in a 32-entry history buffer. The basic of the calculate span. process are as illustrated in FIG. 88 with the details of the process as illustrated in FIG. 89.

The following DRAM FIFO is used:

Since a 32 bit precision span history is kept, in the case of a 1500 pixel wide image being warped 12,000 bytes temporary storage is required.

Calculation of the span 364 uses 2 Adder ALUs (1 for span calculation, 1 for looping and counting for P0 and P2 histories) takes 7 cycles as follows:

The history buffers 365, 366 are cached DRAM. The 'Previous Line' (for P2 history) buffer 366 is 32 entries of span-precision. The 'Previous Point' (for P0 history). Buffer 365 requires 1 register that is used most of the time (for calculation of points 1 to 31 of a line in a strip), and a DRAM buffered set of history values to be used in the calculation of point 0 in a strip's line.

32 bit precision in span history requires 4 cache lines to hold P2 history, and 2 for P0 history. P0's history is only written and read out once every 8 lines of 32 pixels to a temporary storage space of (ImageHeight*4 ) bytes. Thus a 1500 pixel high image being warped requires 6000 bytes temporary storage, and a total of 6 cache lines.

Tri-linear Interpolation

Having determined the center and span of the area from the input image to be averaged, the final part of the warp process is to determine the value of the output pixel. Since a single output pixel could theoretically be represented by the entire input image, it is potentially too time-consuming to actually read and average the specific area of the input image contributing to the output pixel. Instead, it is possible to approximate the pixel value by using an image pyramid of the input image.

If the span is 1 or less, it is necessary only to read the original image's pixels around the given coordinate, and perform bi-linear interpolation. If the span is greater than 1, we must read two appropriate levels of the image pyramid and perform tri-linear interpolation. Performing linear interpolation between two levels of the image pyramid is not strictly correct, but gives acceptable results (it errs on the side of blurring the resultant image).

Figure 90:
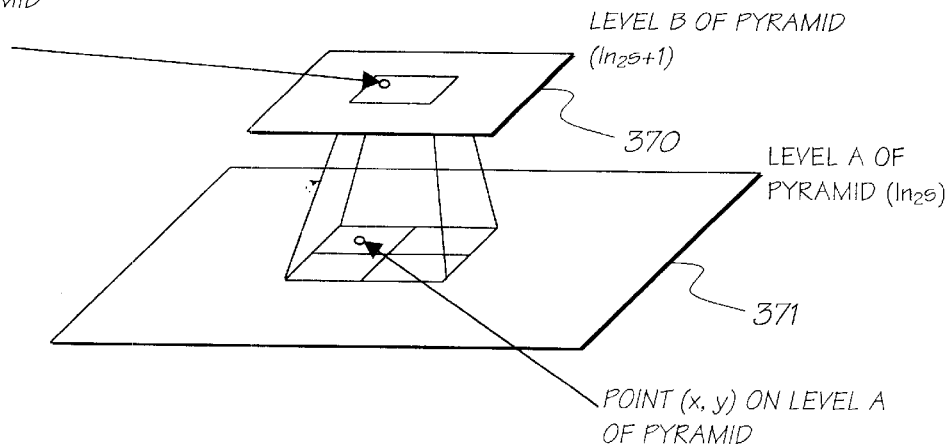
FIG. 90 illustrates the process of reading image pyramid levels.

Turning to FIG. 90, generally speaking, for a given span 's', it is necessary to read image pyramid levels given by $\ln_2 s$ (370) and $\ln_2 s+1$ (371). $\ln_2 s$ is simply decoding the highest set bit of s. We must bi-linear interpolate to determine the value for the pixel value on each of the two levels 370,371 of the pyramid, and then interpolate between levels.

Figure 91:
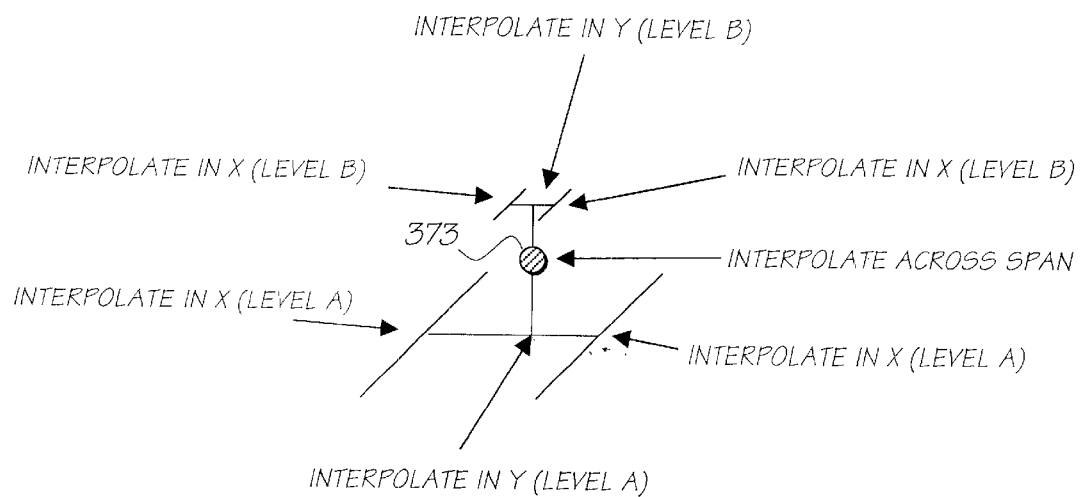
FIG. 91 illustrates using the pyramid table for blinear interpolation.

As shown in FIG. 91, it is necessary to first interpolate in X and Y for each pyramid level before interpolating between the pyramid levels to obtain a final output value 373.

The image pyramid address mode issued to generate addresses for pixel coordinates at (x, y) on pyramid level s & s+1. Each level of the image pyramid contains pixels sequential in x. Hence, reads in x are likely to be cache hits.

Reasonable cache coherence can be obtained as local regions in the output image are typically locally coherent in the input image (perhaps at a different scale however, but coherent within the scale). Since it is not possible to know the relationship between the input and output images, we ensure that output pixels are written in a vertical strip (via a Vertical-Strip Iterator) in order to best make use of cache coherence.

Tri-linear interpolation can be completed in as few as 2 cycles on average using 4 multiply ALUs and all 4 adder ALUs as a pipeline and assuming no memory access required. But since all the interpolation values are derived from the image pyramids, interpolation speed is completely dependent on cache coherence (not to mention the other units are busy doing warp-map scaling and span calculations). As many cache lines as possible should therefore be available to the image-pyramid reading. The best speed will be 8 cycles, using 2 Multiply ALUs.

The output pixels are written out to the DRAM via a Vertical-Strip Write Iterator that uses 2 cache lines. The speed is therefore limited to a minimum of 8 cycles per output pixel. If the scaling of the warp map requires 8 or fewer cycles, then the overall speed will be unchanged. Otherwise the throughput is the time taken to scale the warp map. In most cases the warp map will be scaled up to match the size of the photo.

Assuming a warp map that requires 8 or fewer cycles per pixel to scale, the time taken to convert a single color component of image is therefore 0.12s (1500*1000*8 cycles*10 ns per cycle).

Histogram Collector

The histogram collector is a microcode program that takes an image channel as input, and produces a histogram as output. Each of a channel's pixels has a value in the range 0–255. Consequently there are 256 entries in the histogram table, each entry 32 bits—large enough to contain a count of an entire 1500×1000 image.

Figures 92, 93:
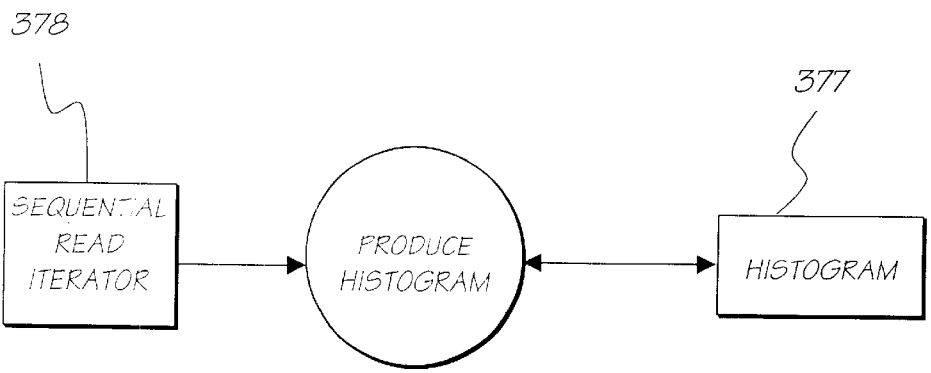
FIG. 92 illustrates the histogram collection process.
FIG. 93 illustrates the color transform process.

As shown in FIG. 92, since the histogram represents a summary of the entire image, a Sequential Read Iterator 378 is sufficient for the input. The histogram itself can be completely cached, requiring 32 cache lines (1 K).

The microcode has two passes: an initialization pass which sets all the counts to zero, and then a "count" stage that increments the appropriate counter for-each pixel read from the image. The first stage requires the Address Unit and a single Adder ALU, with the address of the histogram table 377 for initialising.

The second stage processes the actual pixels from the image, and uses 4 Adder ALUs:

The Zero flag from Adder 2 cycle 2 is used to stay at microcode address 2 for as long as the input pixel is the same. When it changes, the new count is written out in microcode address 3, and processing resumes at microcode address 2. Microcode address 4 is used at the end, when there are no more pixels to be read.

Stage 1 takes 256 cycles, or 2560 ns. Stage 2 varies according to the values of the pixels. The worst case time for lookup table replacement is 2 cycles per image pixel if every pixel is not the same as its neighbor. The time taken for a single color lookup is 0.03s (1500×1000×2 cycle per pixel× 10 ns per cycle =30,000,000 ns). The time taken for 3 color components is 3 times this amount, or 0.09s.

Color Transform

Color transformation is achieved in two main ways:
Lookup table replacement
Color space conversion Lookup Table Replacement As illustrated in FIG. 86, one of the simplest ways to transform the color of a pixel is to encode an arbitrarily complex transform function into a lookup table 380. The component color value of the pixel is used to lookup 381 the new component value of the pixel. For each pixel read from a Sequential Read Iterator, its new value is read from the New Color Table 380, and written to a Sequential Write Iterator 383. The input image can be processed simultaneously in two halves to make effective use of memory bandwidth. The following lookup table is used:

The total process requires 2 Sequential Read Iterators and 2 Sequential Write iterators. The 2 New Color Tables require 8 cache lines each to hold the 256 bytes (256 entries of 1 byte).

The average time for lookup table replacement is therefore ½ cycle per image pixel. The time taken for a single color lookup is 0.0075s (1500×1000×½ cycle per pixel×10 ns per cycle=7,500,000 ns). The time taken for 3 color components is 3 times this amount, or 0.0225s. Each color component has to be processed one after the other under control of software.

Color Space Conversion

Figure 94:
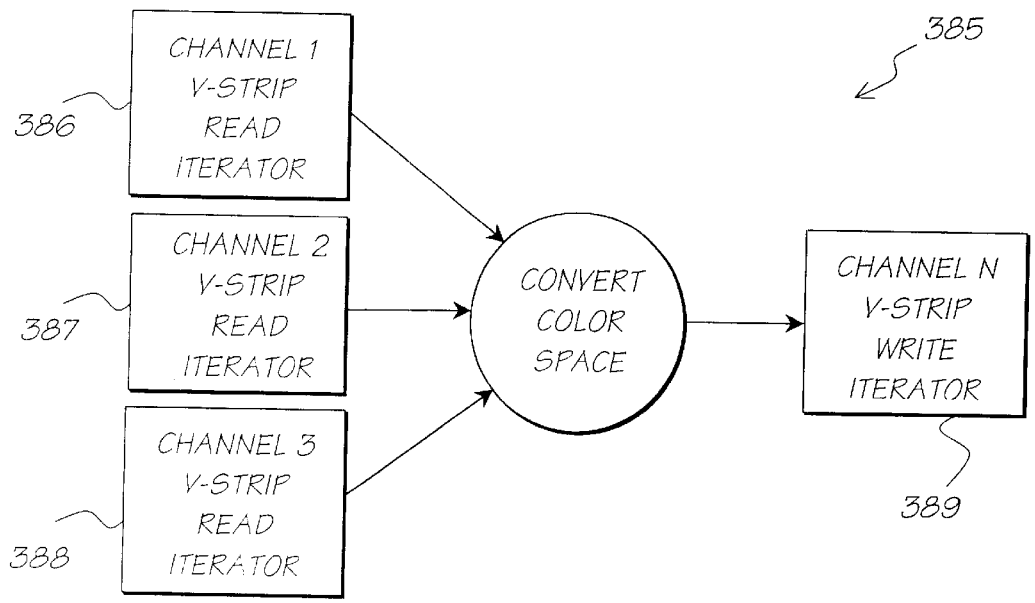
FIG. 94 illustrates the color conversion process.

Color Space conversion is only required when moving between color spaces. The CCD images are captured in RGB color space, and printing occurs in CMY color space, while clients of the ACP 31 likely process images in the Lab color space. All of the input color space channels are typically required as input to determine each output channel's component value. Thus the logical process is as illustrated 385 in FIG. 94.

Simply, conversion between Lab, RGB, and CMY is fairly straightforward. However the individual color profile of a particular device can vary considerably. Consequently, to allow future CCDs, inks, and printers, the ACP 31 performs color space conversion by means of tri-linear interpolation from color space conversion lookup tables.

Color coherence tends to be area based rather than line based. To aid cache coherence during tri-linear interpolation lookups, it is best to process an image in vertical strips. Thus the read 386–388 and write 389 iterators would be Vertical-Strip Iterators.

Tri-linear Color Space Conversion

For each output color component, a single 3D table mapping the input color space to the output color component is required. For example, to convert CCD images from RGB to Lab, 3 tables calibrated to the physical characteristics of the CCD are required:

RGB->L
RGB->a
RGB->b

To convert from Lab to CMY, 3 tables calibrated to the physical characteristics of the ink/printer are required:

Lab->C
Lab->M
Lab->Y

The 8-bit input color components are treated as fixed-point numbers (3:5) in order to index into the conversion tables. The 3 bits of integer give the index, and the 5 bits of fraction are used for interpolation. Since 3 bits gives 8 values, 3 dimensions gives 512 entries (8×8×8). The size of each entry is 1 byte, requiring 512 bytes per table.

Figure 95:
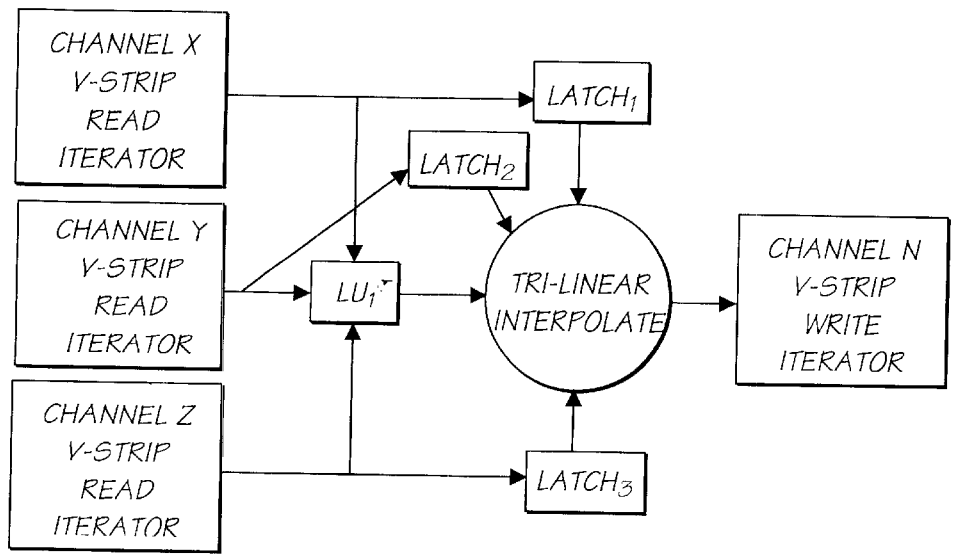
FIG. 95 illustrates the color space conversion process in more detail.

The Convert Color Space process can therefore be implemented as shown in FIG. 95 and the following lookup table is used:

Tri-linear interpolation returns interpolation between 8 values. Each 8 bit value takes 1 cycle to be returned from the lookup, for a total of 8 cycles. The tri-linear interpolation also takes 8 cycles when 2 Multiply ALUs are used per cycle. General tri-linear interpolation information is given in the ALU section of this document. The 512 bytes for the lookup table fits in 16 cache lines.

The time taken to convert a single color component of image is therefore 0.105 s (1500*1000*7 cycles*10 ns per cycle). To convert 3 components takes 0.415 s. Fortunately, the color space conversion for printout takes place on the fly during printout itself, so is not a perceived delay.

If color components are converted separately, they must not overwrite their input color space components since. all color components from the input color space are required for converting each component.

Since only 1 multiply unit is used to perform the interpolation, it is alternatively possible to do the entire Lab->CMY conversion as a single pass. This would require 3 Vertical-Strip Read Iterators, 3 Vertical-Strip Write Iterators, and access to 3 conversion tables simultaneously. In that case, it is possible to write back onto the input image and thus use no extra memory. However, access to 3 conversion tables equals ⅓ of the caching for each, that could lead to high latency for the overall process.

Affine Transform

Prior to compositing an image with a photo, it may be necessary to rotate, scale and translate it. If the image is only being translated, it can be faster to use a direct sub-pixel translation function. However, rotation, scale-up and translation can all be incorporated into a single affine transform.

A general affine transform can be included as an accelerated function. Affine transforms are limited to 2D, and if scaling down, input images should be pre-scaled via the Scale function. Having a general affine transform function allows an output image to be constructed one block at a time, and can reduce the time taken to perform a number of transformations on an image since all can be applied at the same time.

A transformation matrix needs to be supplied by the client—the matrix should be the inverse matrix of the transformation desired i.e. applying the matrix to the output pixel coordinate will give the input coordinate.

A 2D matrix is usually represented as a 3×3 array:

Since the $3^{rd}$ column is always [0, 0, 1] clients do not need to specify it. Clients instead specify a, b, c, d, e, and f.

Given a coordinate in the output image (x, y) whose top left pixel coordinate is given as (0, 0), the input coordinate is specified by: (ax+cy+e, bx+dy+f). Once the input coordinate is determined, the input image is sampled to arrive at the pixel value. Bi-linear interpolation of input image pixels is used to determine the value of the pixel at the calculated coordinate. Since affine transforms preserve parallel lines, images are processed in output vertical strips of 32 pixels wide for best average input image cache coherence.

Three Multiply ALUs are required to perform the bi-linear interpolation in 2 cycles. Multiply ALUs 1 and 2 do linear interpolation in X for lines Y and Y+1 respectively, and Multiply ALU 3 3does linear interpolation in Y between the values output by Multiply ALUs 1 and 2.

As we move to the right across an output line in X, 2 Adder ALUs calculate the actual input image coordinates by adding 'a' to the current X value, and 'b' to the current Y value respectively. When we advance to the next line (either the next line in a vertical strip after processing a maximum of 32 pixels, or to the first line in a new vertical strip) we update X and Y to pre-calculated start coordinate values constants for the given block.

Figure 96:
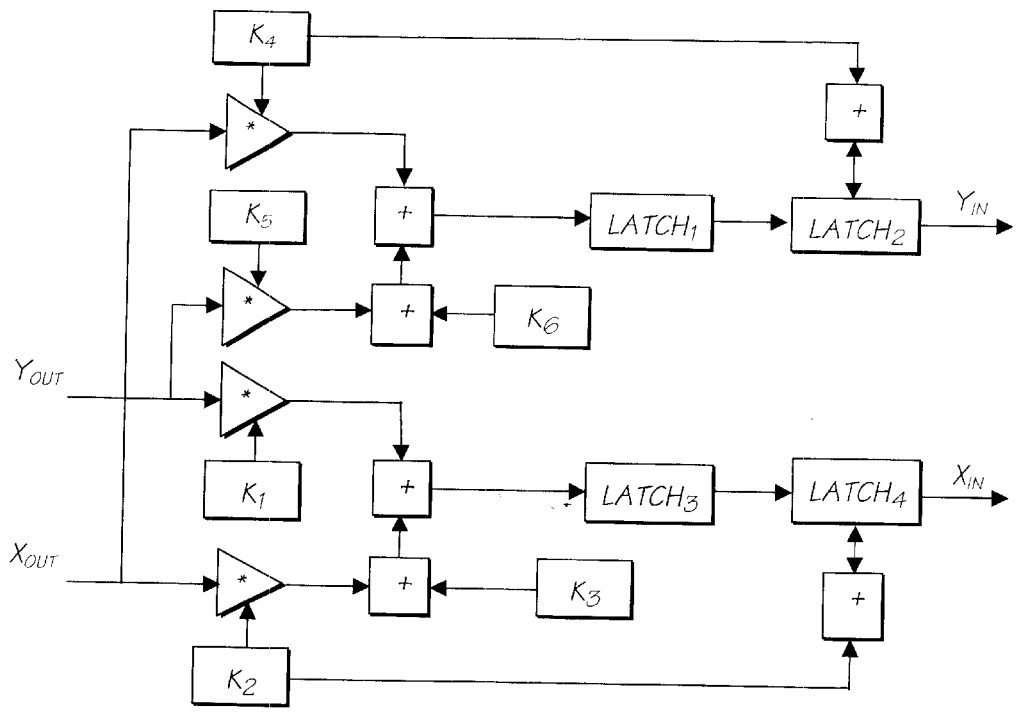
FIG. 96 illustrates the process of calculating an input coordinate.

The process for calculating an input coordinate is given in FIG. 96 where the following constants are set by software:

Calculate Pixel

Figure 97:
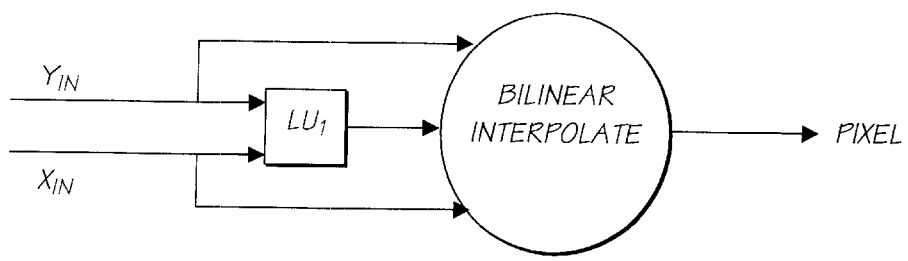
FIG. 97 illustrates the process of compositing with feedback.

Once we have the input image coordinates, the input image must be sampled. A lookup table is used to return the values at the specified coordinates in readiness for bilinear. interpolation. The basic process is as indicated in FIG. 97 and the following lookup table is used:

The affine transform requires all 4 Multiply Units and all 4 Adder ALUs, and with good cache coherence can perform an affine transform with an average of 2 cycles per output pixel. This timing assumes good cache coherence, which is true for non-skewed images. Worst case timings are severely skewed images, which meaningful Vark scripts are unlikely to contain.

The time taken to transform a 128×128 image is therefore 0.00033 seconds (32,768 cycles). If this is a clip image with 4 channels (including a channel), the total time taken is 0.00131 seconds (131,072 cycles).

A Vertical-Strip Write Iterator is required to output the pixels. No Read Iterator is required. However, since the affine transform accelerator is bound by time taken to access input image pixels, as many cache lines as possible should be allocated to the read of pixels from the input image. At least 32 should be available, and preferably 64 or more.

Scaling

Scaling is essentially a re-sampling of an image. Scale up of an image can be performed using the Affine Transform function. Generalized scaling of an image, including scale down, is performed by the hardware accelerated Scale function. Scaling is performed independently in X and Y, so different scale factors can be used in each dimension.

Figure 98:
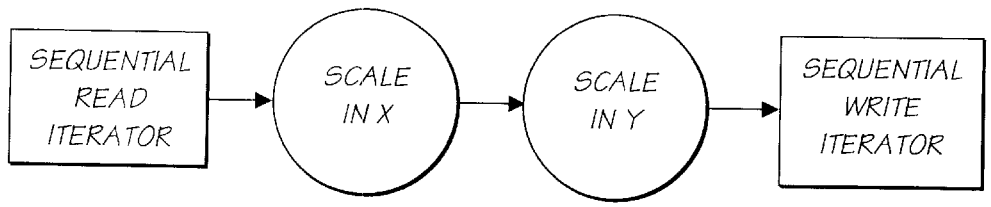
FIG. 98 illustrates the generalized scaling process.
Figure 99:
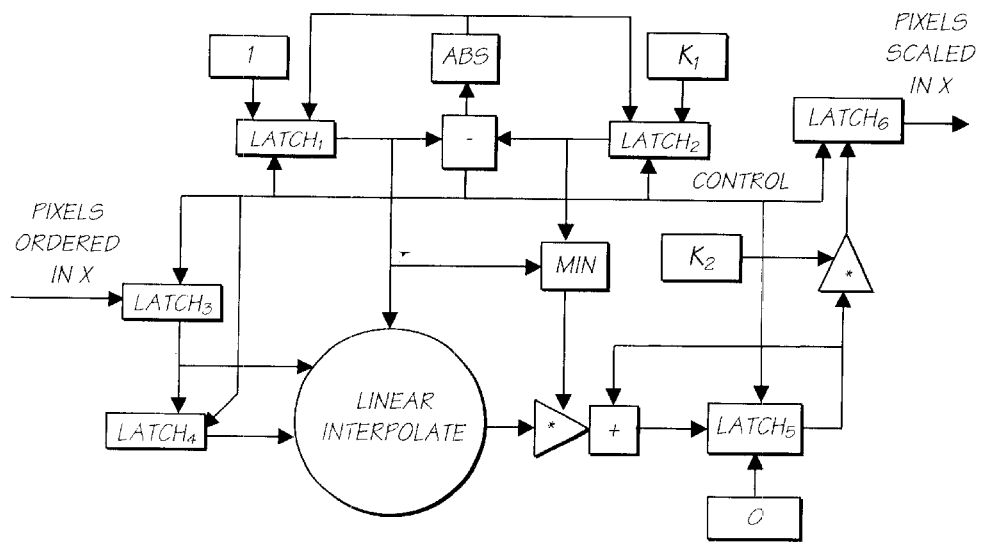
FIG. 99 illustrates the scale in X scaling process.

The generalized scale unit must match the Affine Transform scale function in terms of registration. The generalized scaling process is as illustrated in FIG. 98. The scale in X is accomplished by Fant's re-sampling algorithm as illustrated in FIG. 99.

Where the following constants are set by software:

| Constant | Value |
|---|---|
| $K_1$ | Number of input pixels that contribute to an output pixel in X |
| $K_2$ | $1/K_1$ |

The following registers are used to hold temporary variables:

| Variable | Value |
|---|---|
| $Latch_1$ | Amount of input pixel remaining unused (starts at 1 and decrements) |
| $Latch_2$ | Amount of input pixels remaining to contribute to current output pixel (starts at $K_1$ and decrements) |
| $Latch_3$ | Next pixel (in X) |
| $Latch_4$ | Current pixel |
| $Latch_5$ | Accumulator for output pixel (unscaled) |
| $Latch_6$ | Pixel Scaled in X (output) |

Figure 100:
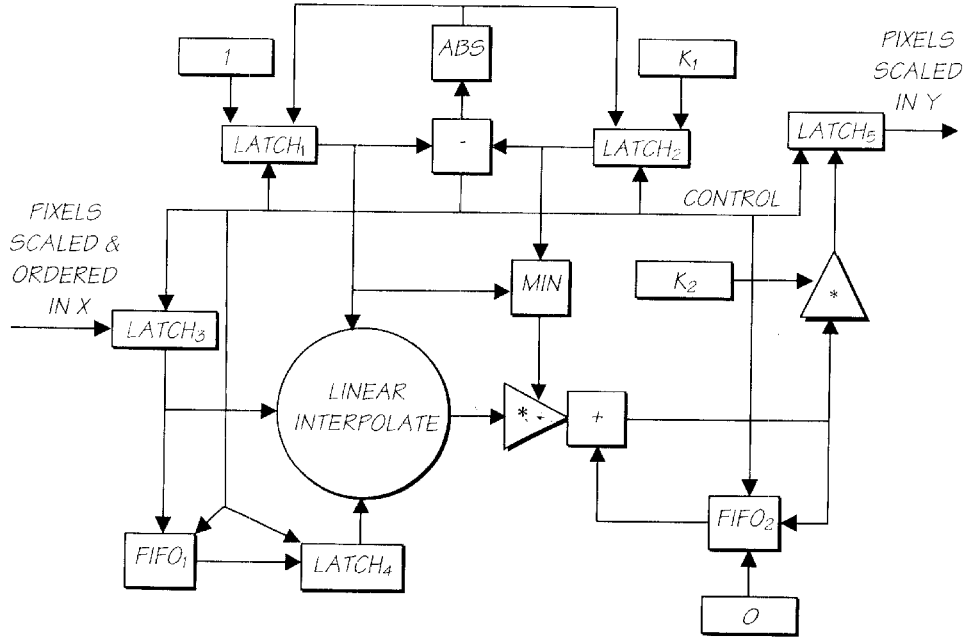
FIG. 100 illustrates the scale in Y scaling process.

The Scale in Y process is illustrated in FIG. 100 and is also accomplished by a slightly altered version of Fant's re-sampling algorithm to account for processing in order of X pixels.

Where the following constants are set by software:

| Constant | Value |
|---|---|
| $K_1$ | Number of input pixels that contribute to an output pixel in Y |
| $K_2$ | $1/K_1$ |

The following registers are used to hold temporary variables:

| Variable | Value |
|---|---|
| $Latch_1$ | Amount of input pixel remaining unused (starts at 1 and decrements) |
| $Latch_2$ | Amount of input pixels remaining to contribute to current output pixel (starts at $K_1$ and decrements) |
| $Latch_3$ | Next pixel (in Y) |
| $Latch_4$ | Current pixel |
| $Latch_5$ | Pixel Scaled in Y (output) |

The following DRAM FIFOs are used:

| Lookup | Size | Details |
|---|---|---|
| $FIFO_1$ | Image Width$_{OUT}$ entries 8 bits per entry | 1 row of image pixels already scaled in X 1 cycle transfer time |
| $FIFO_2$ | Image Width$_{OUT}$ entries 16 bits per entry | 1 row of image pixels already scaled in X 2 cycles transfer time (1 byte per cycle) |

Tessellate Image

Tessellation of an image is a form of tiling. It involves copying a specially designed "tile" multiple times horizontally and vertically into a second (usually larger) image space. When tessellated, the small tile forms a seamless picture. One example of this is a small tile of a section of a brick wall. It is designed so that when tessellated, it forms a full brick wall. Note that there is no scaling or sub-pixel translation involved in tessellation.

The most cache-coherent way to perform tessellation is to output the image sequentially line by line, and to repeat the same line of the input image for the duration of the line. When we finish the line, the input image must also advance to the next line (and repeat it multiple times across the output line).

Figure 101:
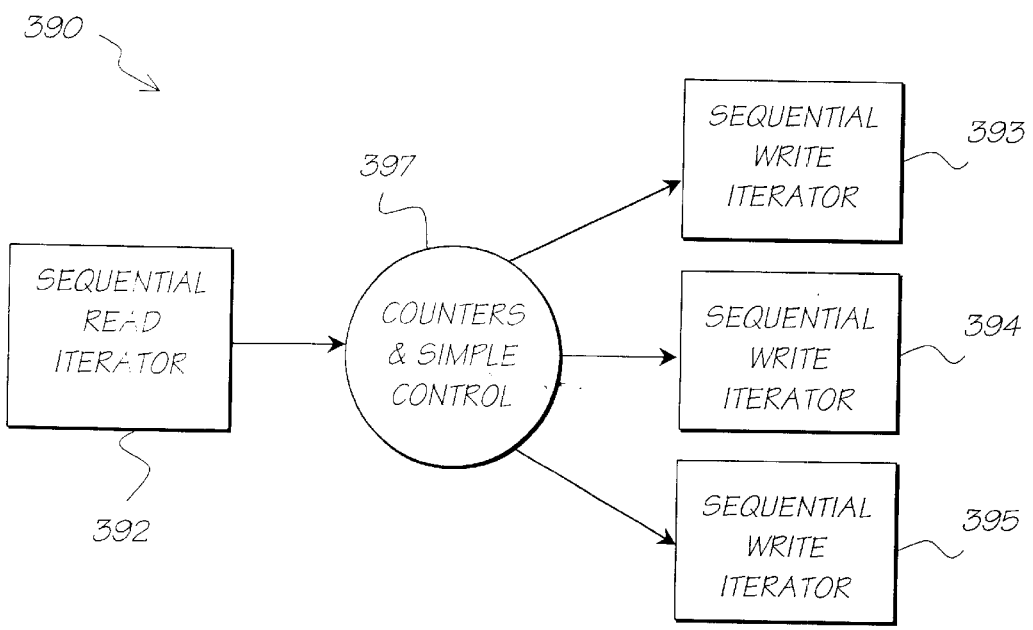
FIG. 101 illustrates the tessellation process.

An overview of the tessellation function is illustrated 390 in FIG. 101. The Sequential Read Iterator 392 is set up to continuously read a single line of the input tile (StartLine would be 0 and EndLine would be 1). Each input pixel is written to all 3 of the Write Iterators 393–395. A counter 397 in an Adder ALU counts down the number of pixels in an output line, terminating the sequence at the end of the line.

At the end of processing a line, a small software routine updates the Sequential Read Iterator's StartLine and EndLine registers before restarting the microcode and the Sequential Read Iterator (which clears the FIFO and repeats line 2 of the tile). The Write Iterators 393–395 are not updated, and simply keep on writing out to their respective parts of the output image. The net effect is that the tile has one line repeated across an output line, and then the tile is repeated vertically too.

This process does not fully use the memory bandwidth since we get good cache coherence in the input image, but it does allow the tessellation to function with tiles of any size. The process uses 1 Adder ALU. If the 3 Write Iterators 393–395 each write to ⅓ of the image (breaking the image on tile sized boundaries), then the entire tessellation process takes place at an average speed of ⅓ cycle per output image pixel. For an image of 1500×1000, this equates to 0.005 seconds (5,000,000 ns).

Sub-pixel Translator

Before compositing an image with a background, it may be necessary to translate it by a sub-pixel amount in both X and Y. Sub-pixel transforms can increase an image's size by 1 pixel in each dimension. The value of the region outside the image can be client determined, such as a constant value (e.g. black), or edge pixel replication. Typically it will be better to use black.

Figure 102:
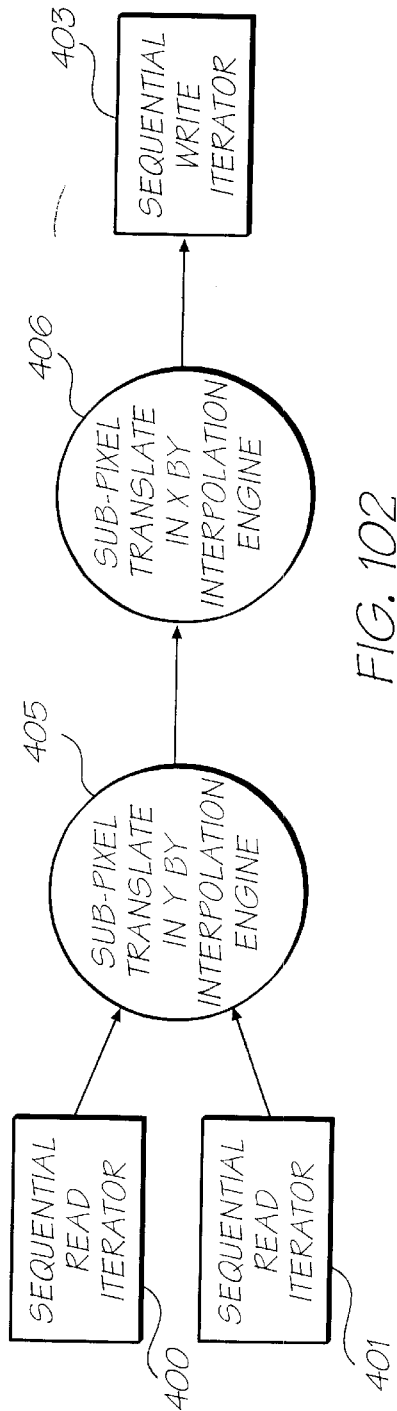
FIG. 102 illustrates the sub-pixel translation process.

The sub-pixel translation process is as illustrated in FIG. 102. Sub-pixel translation in a given dimension is defined by:

$$Pixel_{out}=Pixel_{in}*(1-Translation)+Pixel_{in-1}*Translation$$

It can also be represented as a form of interpolation:

$$Pixel_{out}=Pixel_{in-1}+(Pixel_{in}-Pixel_{in-1})*Translation$$

Implementation of a single (on average) cycle interpolation engine using a single Multiply ALU and a single Adder ALU in conjunction is straightforward. Sub-pixel translation in both X & Y requires 2 interpolation engines.

In order to sub-pixel translate in Y, 2 Sequential Read Iterators 400, 401 are required (one is reading a line ahead of the other from the same image), and a single Sequential Write Iterator 403 is required.

The first interpolation engine (interpolation in Y) accepts pairs of data from 2 streams, and linearly interpolates between them. The second interpolation engine (interpolation in X) accepts its data as a single 1 dimensional stream and linearly interpolates between values. Both engines interpolate in 1 cycle on average.

Each interpolation engine 405, 406 is capable of performing the sub-pixel translation in 1 cycle per output pixel on average. The overall time is therefore 1 cycle per output pixel, with requirements of 2 Multiply ALUs and 2 Adder ALUs.

The time taken to output 32 pixels from the sub-pixel translate function is on average 320 ns (32 cycles). This is enough time for 4 full cache-line accesses to DRAM, so the use of 3 Sequential Iterators is well within timing limits.

The total time taken to sub-pixel translate an image is therefore 1 cycle per pixel of the output image. A typical image to be sub-pixel translated is a tile of size 128*128. The output image size is 129*129. The process takes 129*129*10 ns=166,410 ns.

The Image Tiler function also makes use of the sub-pixel translation algorithm, but does not require the writing out of the sub-pixel-translated data, but rather processes it further.

Image Tiler

The high level algorithm for tiling an image is carried out in software. Once the placement of the tile has been determined, the appropriate colored tile must be composited. The actual compositing of each tile onto an image is carried out in hardware via the microcoded ALUs. Compositing a tile involves both a texture application and a color application to a background image. In some cases it is desirable to compare the actual amount of texture added to the background in relation to the intended amount of texture, and use this to scale the color being applied. In these cases the texture must be applied first.

Since color application functionality and texture application functionality are somewhat independent, they are separated into sub-functions.

The number of cycles per 4-channel tile composite for the different texture styles and coloring styles is summarised in the following table:

|  | Constant color | Pixel color |
|---|---|---|
| Replace texture | 4 | 4.75 |
| 25% background + tile texture | 4 | 4.75 |
| Average height algorithm | 5 | 5.75 |
| Average height algorithm with feedback | 5.75 | 6.5 |

Tile Coloring and Compositing

A tile is set to have either a constant color (for the whole tile), or takes each pixel value from an input image. Both of these cases may also have feedback from a texturing stage to scale the opacity (similar to thinning paint).

The steps for the 4 cases can be summarised as:
Sub-pixel translate the tile's opacity values,
Optionally scale the tile's opacity (if feedback from texture application is enabled).
Determine the color of the pixel (constant or from an image map).
Composite the pixel onto the background image.

Each of the 4 cases is treated separately, in order to minimize the time taken to perform the function. The summary of time per color compositing style for a single color channel is described in the following table:

Constant Color

In this case, the tile has a constant color, determined by software. While the ACP 31 is placing down one tile, the software can be determining the placement and coloring of the next tile.

The color of the tile can be determined by bi-linear interpolation into a scaled version of the image being tiled. The scaled version of the image can be created and stored in place of the image pyramid, and needs only to be performed once per entire tile operation. If the tile size is 128×128, then the image can be scaled down by 128:1 in each dimension.

Without Feedback

When there is no feedback from the texturing of a tile, the tile is simply placed at the specified coordinates. The tile color is used for each pixel's color, and the opacity for the composite comes from the tile's sub-pixel translated opacity channel. In this case color channels and the texture channel can be processed completely independently between tiling passes.

Figure 103:
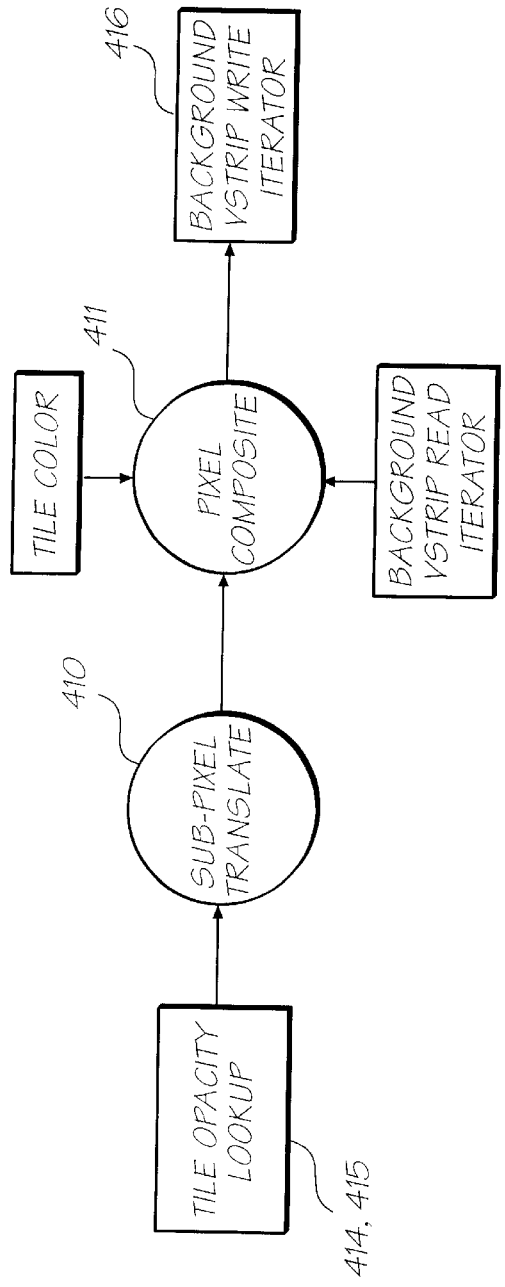
FIG. 103 illustrates the compositing process.
Figure 104:
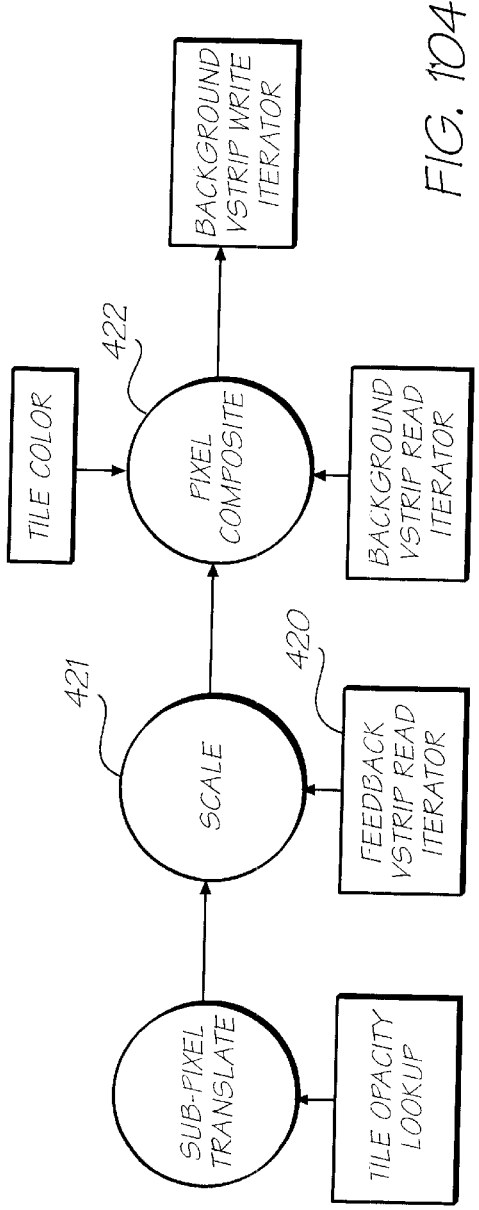
FIG. 104 illustrates the process of compositing with feedback.

The overview of the process is illustrated in FIG. 103. Sub-pixel translation 410 of a tile can be accomplished using 2 Multiply ALUs and 2 Adder ALUs in an average time of 1 cycle per output pixel. The output from the sub-pixel translation is the mask to be used in compositing 411 the constant tile color 412 with the background image from background sequential Read Iterator.

Compositing can be performed using 1 Multiply ALU and 1 Adder ALU in an average time of 1 cycle per composite. Requirements are therefore 3 Multiply ALUs and 3 Adder ALUS. 4 Sequential Iterators 413–416 are required, taking 320 ns to read or write their contents. With an average number of cycles of 1 per pixel to sub-pixel translate and composite, there is sufficient time to read and write the buffers.

With Feedback

When there is feedback from the texturing of a tile, the tile is placed at the specified coordinates. The tile color is used for each pixel's color, and the opacity for the composite comes from the tile's sub-pixel translated opacity channel scaled by the feedback parameter. Thus the texture values must be calculated before the color value is applied.

The overview of the process is illustrated in FIG. 97. Sub-pixel translation of a tile can be accomplished using 2 Multiply ALUs and 2 Adder ALUs in an average time of 1 cycle per output pixel. The output from the sub-pixel translation is the mask to be scaled according to the feedback read from the Feedback Sequential Read Iterator 420. The feedback is passed it to a Scaler (1 Multiply ALU) 421.

Compositing 422 can be performed using 1 Multiply ALU and 1 Adder ALU in an average time of 1 cycle per composite. Requirements are therefore 4 Multiply ALUs and all 4 Adder ALUs. Although the entire process can be accomplished in 1 cycle on average, the bottleneck is the memory access, since 5 Sequential Iterators are required. With sufficient buffering, the average time is 1.25 cycles per pixel.

Color from Input Image

One way of coloring pixels in a tile is to take the color from pixels in an input image. Again, there are two possibilities for compositing: with and without feedback from the texturing.

Without Feedback

In this case, the tile color simply comes from the relative pixel in the input image. The opacity for compositing comes from the tile's opacity channel sub-pixel shifted.

Figure 105:
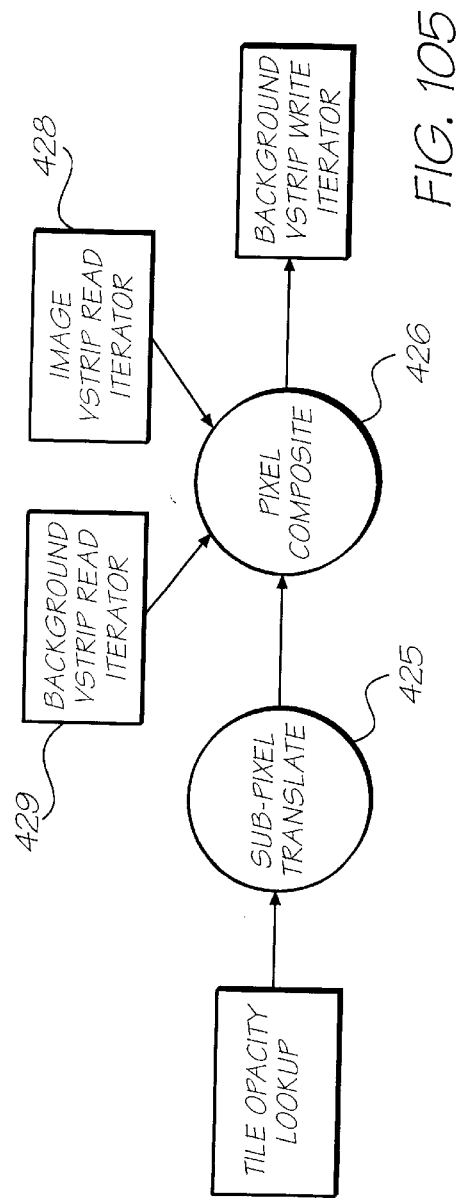
FIG. 105 illustrates the process of tiling with color from the input image.

The overview of the process is illustrated in FIG. 105. Sub-pixel translation 425 of a tile can be accomplished using 2 Multiply ALUs and 2 Adder ALUs in an average time of 1 cycle per output pixel. The output from the sub-pixel translation is the mask to be used in compositing 426 the tile's pixel color (read from the input image 428) with the background image 429.

Compositing 426 can be performed using 1 Multiply ALU and 1 Adder ALU in an average time of 1 cycle per composite. Requirements are therefore 3 Multiply ALUs and 3 Adder ALUs. Although the entire process can be accomplished in 1 cycle on average, the bottleneck is the memory access, since 5 Sequential Iterators are required. With sufficient buffering, the average time is 1.25 cycles per pixel.

With Feedback

Figure 106:
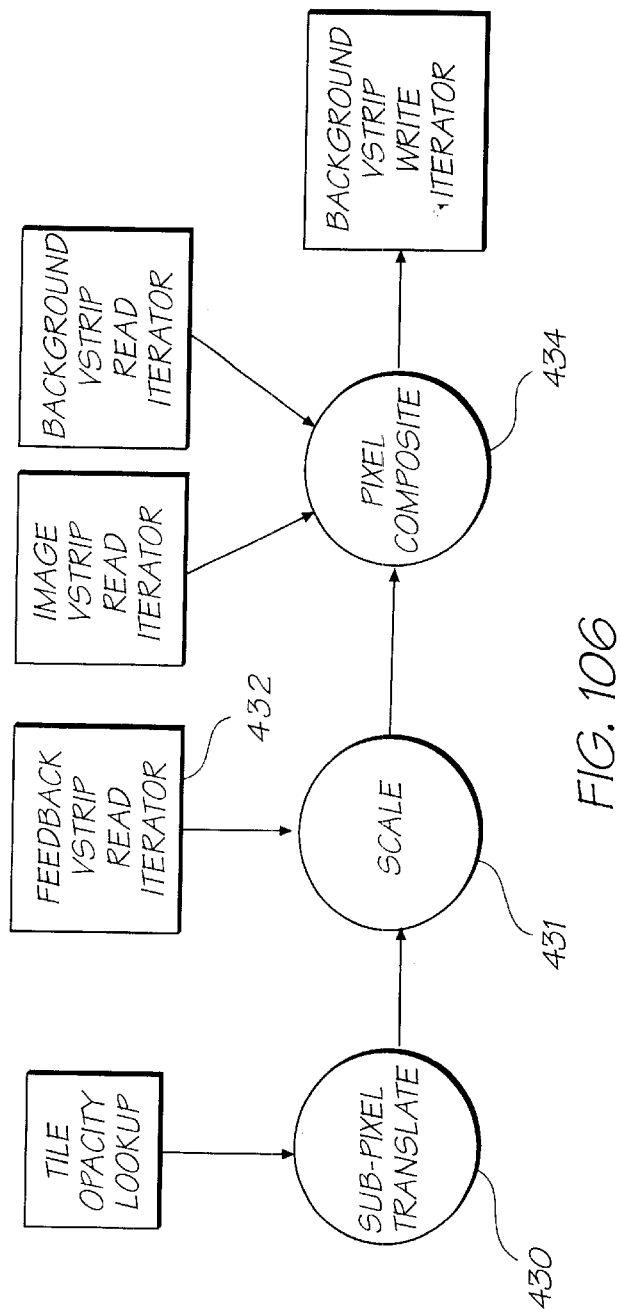
FIG. 106 illustrates the process of tiling with feedback.

In this case, the tile color still comes from the relative pixel in the input image, but the opacity for compositing is affected by the relative amount of texture height actually applied during the texturing pass. This process is as illustrated in FIG. 106.

Sub-pixel translation 431 of a tile can be accomplished using 2 Multiply ALUs and 2 Adder ALUs in an average time of 1 cycle per output pixel. The output from the sub-pixel translation is the mask to be scaled 431 according to the feedback read from the Feedback Sequential Read Iterator 432. The feedback is passed to a Scaler (1 Multiply ALU) 431.

Compositing 434 can be performed using 1 Multiply ALU and 1 Adder ALU in an average time of 1 cycle per composite.

Requirements are therefore all 4 Multiply ALUs and 3 Adder ALUs. Although the entire process can be accomplished in 1 cycle on average, the bottleneck is the memory access,-since 6 Sequential Iterators are required. With sufficient buffering, the average time is 1.5 cycles per pixel.

Tile Texturing

Each tile has a surface texture defined by its texture channel. The texture must be sub-pixel translated and then applied to the output image. There are 3 styles of texture compositing:

Replace texture

25% background+tile's texture

Average height algorithm

In addition, the Average height algorithm can save feedback parameters for color compositing.

The time taken per texture compositing style is summarised in the following table:

| Tiling color style | Cycles per pixel (no feedback from texture) | Cycles per pixel (feedback from texture) |
| --- | --- | --- |
| Replace texture | 1 | — |
| 25% background + tile texture value | 1 | — |
| Average height algorithm | 2 | 2 |

Replace Texture

Figure 107:
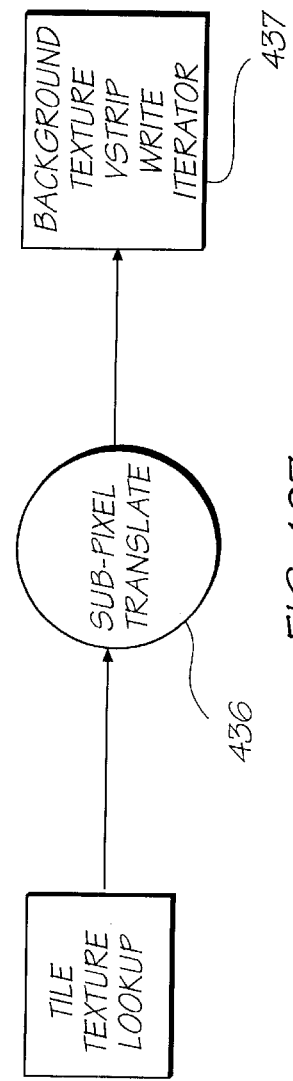
FIG. 107 illustrates the process of tiling with texture replacement.

In this instance, the texture from the tile replaces the texture channel of the image, as illustrated in FIG. 107. Sub-pixel translation 436 of a tile's texture can be accomplished using 2 Multiply ALUs and 2 Adder ALUs in an average time of 1 cycle per output pixel. The output from this sub-pixel translation is fed directly to the Sequential Write Iterator 437.

The time taken for replace texture compositing is 1 cycle per pixel. There is no feedback, since 100% of the texture value is always applied to the background. There is therefore no requirement for processing the channels in any particular order.

25% Background+Tile's Texture

Figure 108:
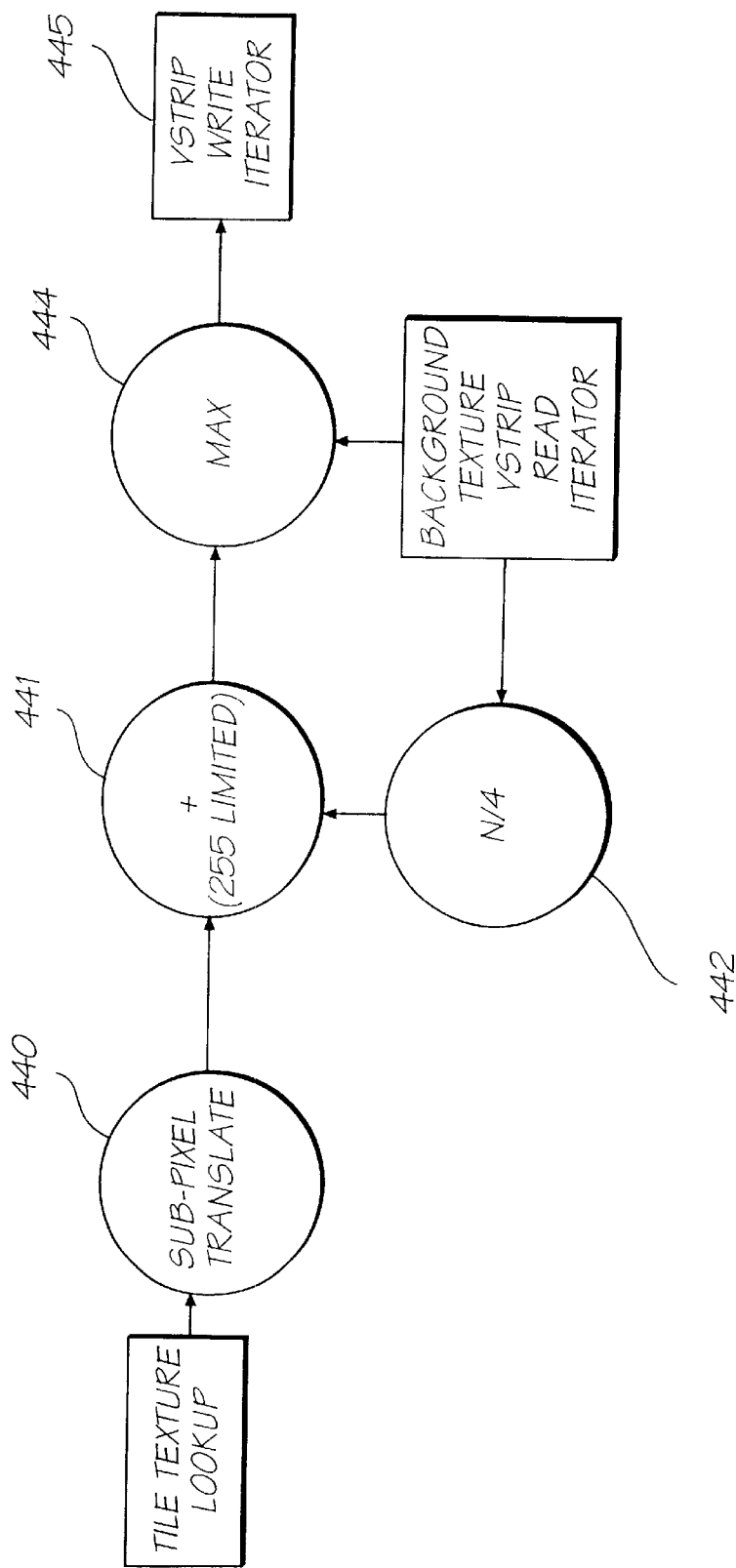
FIG. 108 illustrates the process of tiling with color from the input image.

In this instance, the texture from the tile is added to 25% of the existing texture value. The new value must be greater than or equal to the original value. In addition, the new texture value must be clipped at 255 since the texture channel is only 8 bits. The process utilised is illustrated in FIG. 108.

Sub-pixel translation 440 of a tile's texture can be accomplished using 2 Multiply ALUs and 2 Adder ALUs in an average time of 1 cycle per output pixel. The output from this sub-pixel translation 440 is fed to an adder 441 where it is added to ¼ 442 of the background texture value. Min and Max functions 444 are provided by the 2 adders not used for sub-pixel translation and the output written to a Sequential Write Iterator 445.

The time taken for this style of texture compositing is 1 cycle per pixel. There is no feedback, since 100% of the texture value is considered to have been applied to the background (even if clipping at 255 occurred). There is therefore no requirement for processing the channels in any particular order.

Average Height Algorithm

In this texture application algorithm, the average height under the tile is computed, and each pixel's height is compared to the average height. If the pixel's height is less than the average, the stroke height is added to the background height. If the pixel's height is greater than or equal to the average, then the stroke height is added to the average height. Thus background peaks thin the stroke. The height is constrained to increase by a minimum amount to prevent the background from thinning the stroke application to 0 (the minimum amount can be 0 however). The height is also clipped at 255 due to the 8-bit resolution of the texture channel.

There can be feedback of the difference in texture applied versus the expected amount applied. The feedback amount can be used as a scale factor in the application of the tile's color.

In both cases, the average texture is provided by software, calculated by performing a bi-level interpolation on a scaled version of the texture map. Software determines the next tile's average texture height while the current tile is being applied. Software must also provide the minimum thickness for addition, which is typically constant for the entire tiling process.

Without Feedback

Figure 109:
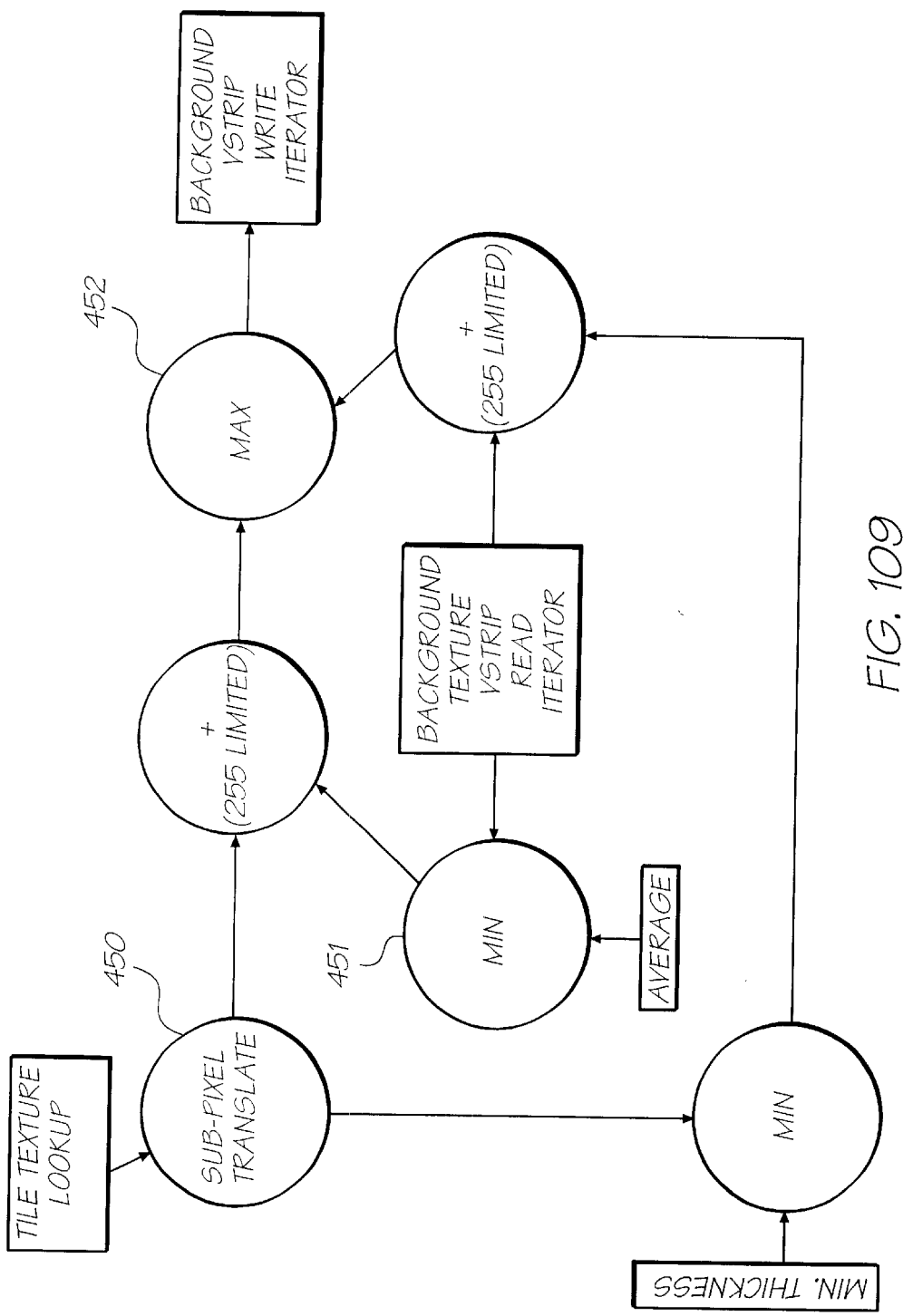
FIG. 109 illustrates the process of applying a texture without feedback.

With no feedback, the texture is simply applied to the background texture, as shown in FIG. 109.

4 Sequential Iterators are required, which means that if the process can be pipelined for 1 cycle, the memory is fast enough to keep up.

Sub-pixel translation 450 of a tile's texture can be accomplished using 2 Multiply ALUs and 2 Adder ALUs in an average time of 1 cycle per output pixel. Each Min & Max function 451,452 requires a separate Adder ALU in order to complete the entire operation in 1 cycle. Since 2 are already used by the sub-pixel translation of the texture, there are not enough remaining for a 1 cycle average time.

The average time for processing 1 pixel's texture is therefore 2 cycles. Note that there is no feedback, and hence the color channel order of compositing is irrelevant.

With Feedback

Figure 110:
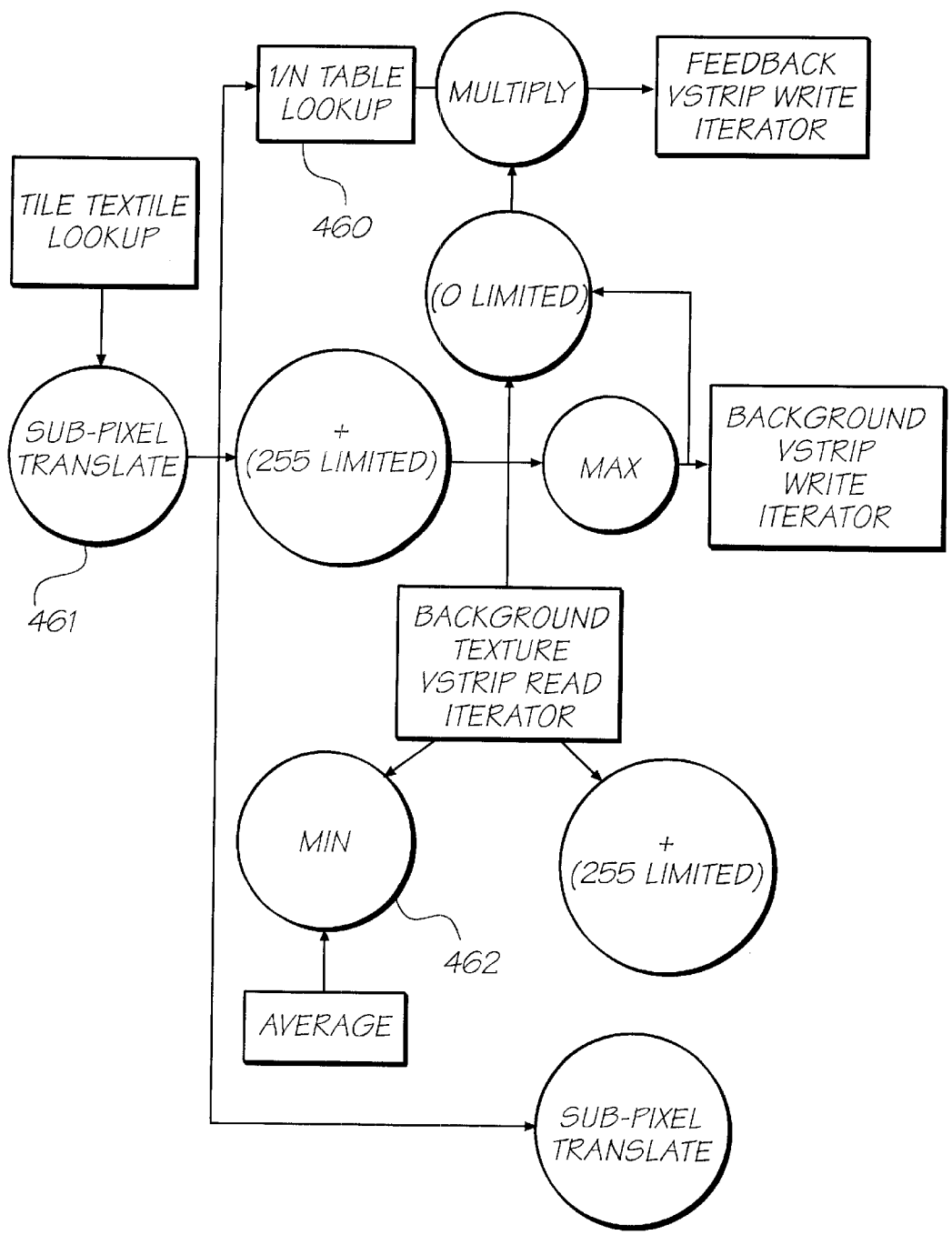
FIG. 110 illustrates the process of applying a texture with feedback.

This is conceptually the same as the case without feedback, except that in addition to the standard processing of the texture application algorithm, it is necessary to also record the proportion of the texture actually applied. The proportion can be used as a scale factor for subsequent compositing of the tile's color onto the background image. A flow diagram is illustrated in FIG. 110 and the following lookup table is used:

| Lookup | Size | Details |
|---|---|---|
| $LU_1$ | 256 entries 16 bits per entry | 1/N Table indexed by N (range 0–255) Resultant 16 bits treated as fixed point 0:16 |

Each of the 256 entries in the software provided 1/N table 460 is 16 bits, thus requiring 16 cache lines to hold continuously.

Sub-pixel translation 461 of a tile's texture can be accomplished using 2 Multiply ALUs and 2 Adder ALUs in an average time of 1 cycle per output pixel. Each Min 462 & Max 463 function requires a separate Adder ALU in order to complete the entire operation in 1 cycle. Since 2 are already used by the sub-pixel translation of the texture, there are not enough remaining for a 1 cycle average time.

The average time for processing 1 pixel's texture is therefore 2 cycles. Sufficient space must be allocated for the feedback data area (a tile sized image channel). The texture must be applied before the tile's color is applied, since the feedback is used in scaling the tile's opacity.

CCD Image Interpolator

Figure 111:
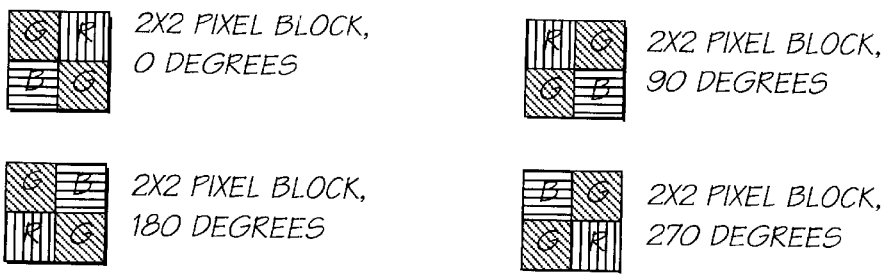
FIG. 111 illustrates the process of rotation of CCD pixels.

Images obtained from the CCD via the ISI 83 (FIG. 3) are 750×500 pixels. When the image is captured via the ISI, the orientation of the camera is used to rotate the pixels by 0, 90, 180, or 270 degrees so that the top of the image corresponds to 'up'. Since every pixel only has an R, G, or B color component (rather than all 3), the fact that these have been rotated must be taken into account when interpreting the pixel values. Depending on the orientation of the camera, each 2×2 pixel block has one of the configurations illustrated in FIG. 111:

Several processes need to be performed on the CCD captured image in order to transform it into a useful form for processing:

Up-interpolation of low-sample rate color components in CCD image (interpreting correct orientation of pixels)
Color conversion from RGB to the internal color space
Scaling of the internal space image from 750×500 to 1500×1000.
Writing out the image in a planar format The entire channel of an image is required to be available at the same time in order to allow warping. In a low memory model (8 MB), there is only enough space to hold a single channel at full resolution as a temporary object. Thus the color conversion is to a single color channel. The limiting factor on the process is the color conversion, as it involves tri-linear interpolation from RGB to the internal color space, a process that takes 0.026 ns per channel (750×500×7 cycles per pixel×10 ns per cycle=26,250,000 ns).

It is important to perform the color conversion before scaling of the internal color space image as this reduces the number of pixels scaled (and hence the overall process time) by a factor of 4.

The requirements for all of the transformations may not fit in the ALU scheme. The transformations are therefore broken into two phases:

Phase 1: Up-interpolation of low-sample rate color components in CCD image (interpreting correct orientation of pixels) Color conversion from RGB to the internal color space Writing out the image in a planar format Phase 2: Scaling of the internal space image from 750× 500 to 1500×1000.

Separating out the scale function implies that the small color converted image must be in memory at the same time as the large one. The output from Phase 1 (0.5 MB) can be safely written to the memory area usually kept for the image pyramid (1 MB). The output from Phase 2 can be the general expanded CCD image. Separation of the scaling also allows the scaling to be accomplished by the Affine Transform, and also allows for a different CCD resolution that may not be a simple 1:2 expansion.

Phase 1: Up-interpolation of low-sample rate color components.

Each of the 3 color components (R, G, and B) needs to be up interpolated in order for color conversion to take place for a given pixel. We have 7 cycles to perform the interpolation per pixel since the color conversion takes 7 cycles.

Figure 112:
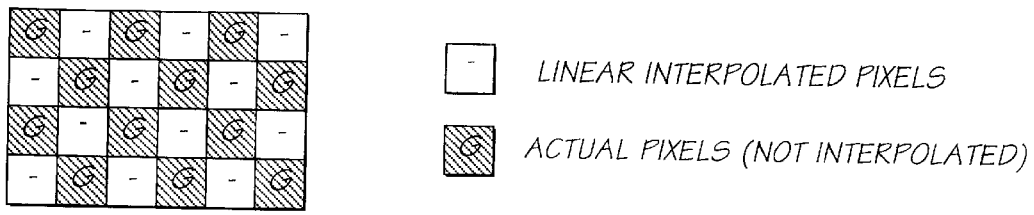
FIG. 112 illustrates the process of interpolation of Green subpixels.
Figure 113:
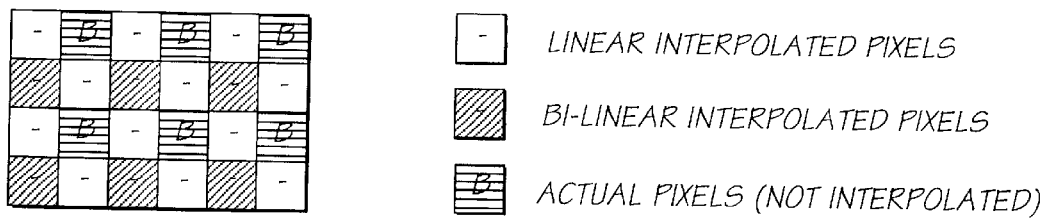
FIG. 113 illustrates the process of interpolation of Blue subpixels.
Figure 114:
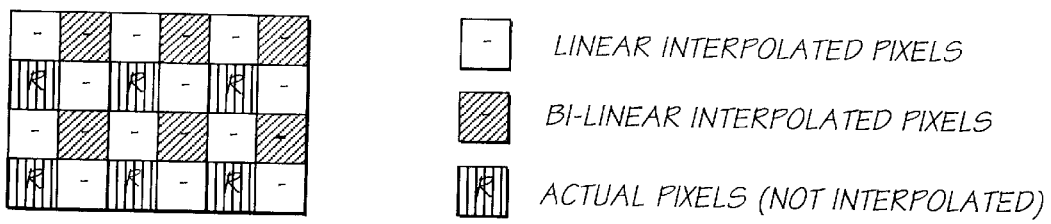
FIG. 114 illustrates the process of interpolation of Red subpixels.

Interpolation of G is straightforward and is illustrated in FIG. 112. Depending on orientation, the actual pixel value G alternates between odd pixels on odd lines & even pixels on even lines, and odd pixels on even lines & even pixels on odd lines. In both cases, linear interpolation is all that is required. Interpolation of R and B components as illustrated in FIG. 113 and FIG. 113, is more complicated, since in the horizontal and vertical directions, as can be seen from the diagrams, access to 3 rows of pixels simultaneously is required, so 3 Sequential Read Iterators are required, each one offset by a single row. In addition, we have access to the previous pixel on the same row via a latch for each row.

Each pixel therefore contains one component from the CCD, and the other 2 up-interpolated. When one component is being bi-linearly interpolated, the other is being linearly interpolated. Since the interpolation factor is a constant 0.5, interpolation can be calculated by an add and a shift 1 bit right (in 1 cycle), and bi-linear interpolation of factor 0.5 can be calculated by 3 adds and a shift 2 bits right (3 cycles). The total number of cycles required is therefore 4, using a single multiply ALU.

Figure 115:
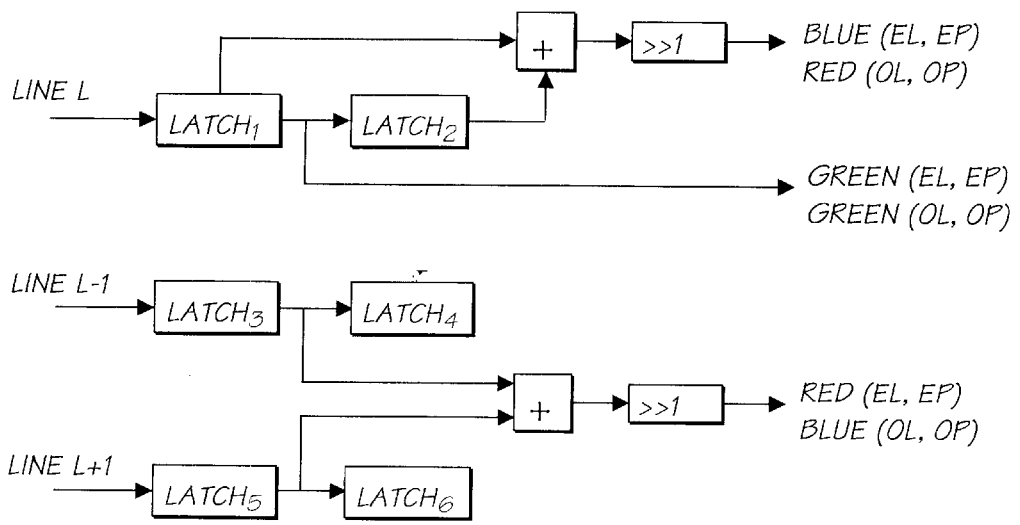
FIG. 115 illustrates the process of CCD pixel interpolation with 0 degree rotation for odd pixel lines.
Figure 116:
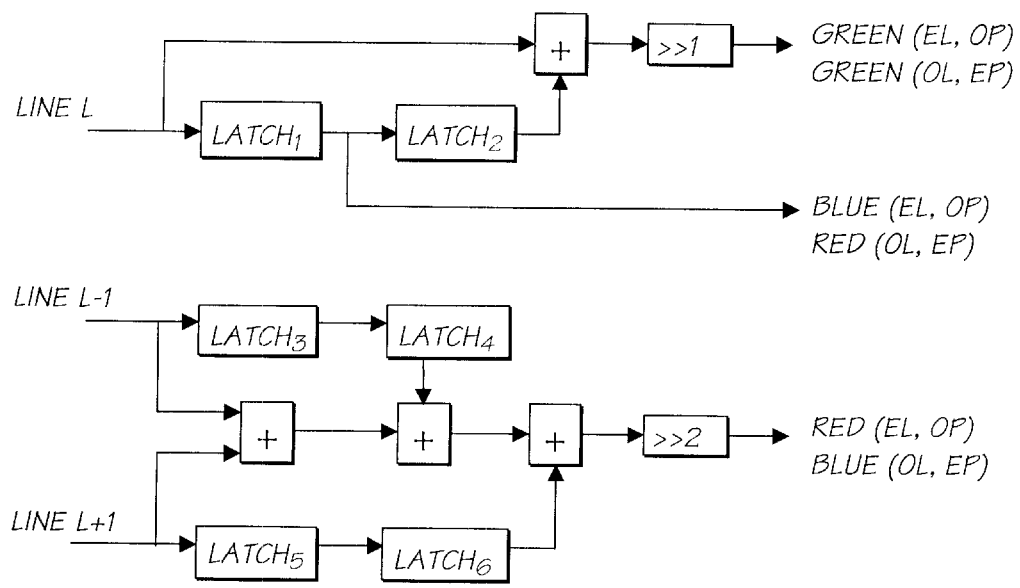
FIG. 116 illustrates the process of CCD pixel interpolation with 0 degree rotation for even pixel lines.

FIG. 115 illustrates the case for rotation 0 even line even pixel (EL, EP), and odd line odd pixel (OL, OP) and FIG. 116 illustrates the case for rotation 0 even line odd pixel (EL, OP), and odd line even pixel (OL, EP). The other rotations are simply different forms of these two expressions.

Color Conversion

Figure 117:
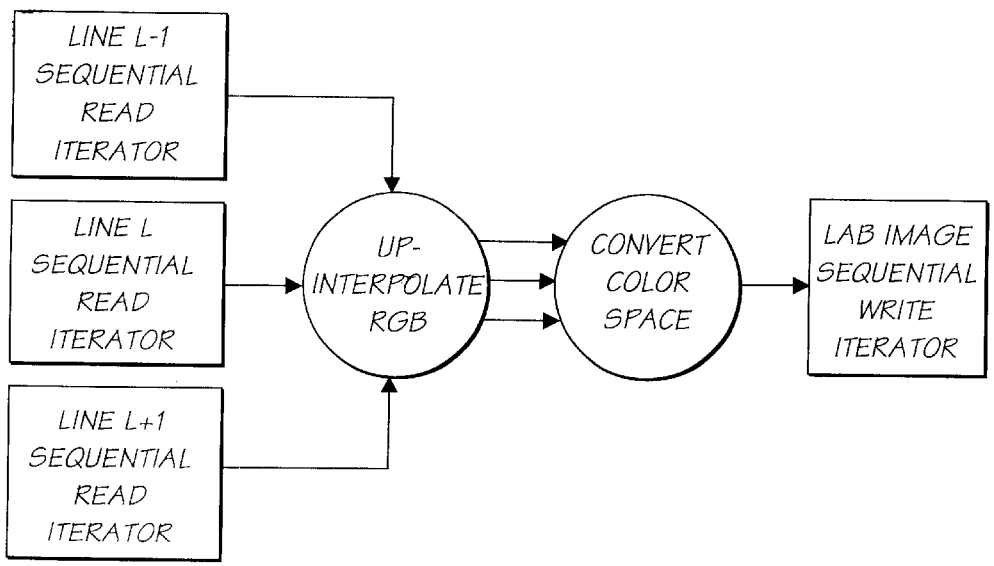
FIG. 117 illustrates the process of color conversion to Lab color space.

Color space conversion from RGB to Lab is achieved using the same method as that described in the general Color Space Convert function, a process that takes 8 cycles per pixel. Phase 1 processing can be described with reference to FIG. 117.

The up-interpolate of the RGB takes 4 cycles (1 Multiply ALU), but the conversion of the color space takes 8 cycles per pixel (2 Multiply ALUs) due to the lookup transfer time.

Phase 2

Scaling the Image

This phase is concerned with up-interpolating the image from the CCD resolution (750×500) to the working photo resolution (1500×1000). Scaling is accomplished by running the Affine transform with a scale of 1:2. The timing of a general affine transform is 2 cycles per output pixel, which in this case means an elapsed scaling time of 0.03 seconds.

Illuminate Image

Once an image has been processed, it can be illuminated by one or more light sources. Light sources can be:

1. Directional—is infinitely distant so it casts parallel light in a single direction 2. Omni—casts unfocused lights in all directions. 3. Spot—casts a focused beam of light at a specific target point. There is a cone and penumbra associated with a spotlight.

The scene may also have an associated bump-map to cause reflection angles to vary. Ambient light is also optionally present in an illuminated scene.

In the process of accelerated illumination, we are concerned with illuminating one image channel by a single light source. Multiple light sources can be applied to a single image channel as multiple passes one pass per light source. Multiple channels can be processed one at a time with or without a bump-map.

The normal surface vector (N) at a pixel is computed from the bump-map if present. The default normal vector, in the absence of a bump-map, is perpendicular to the image plane i.e. N=[0, 0, 1].

The viewing vector V is always perpendicular to the image plane i.e. V=[0, 0, 1].

For a directional light source, the light source vector (L) from a pixel to the light source is constant across the entire image, so is computed once for the entire image. For an omni light source (at a finite distance), the light source vector is computed independently for each pixel.

A pixel's reflection of 'ambient light is computed according to: $I_a k_a O_d$

A pixel's diffuse and specular reflection of a light source is. computed according to the Phong model:

$$f_{att}I_p[k_d O_d(N \cdot L)+k_s O_s(R \cdot V)^n]$$

When the light source is at infinity, the light source intensity is constant across the image.

Each light source has three contributions per pixel

Ambient Contribution

Diffuse contribution

Specular contribution

The light source can be defined using the following variables:

| | |
|---|---|
| $d_L$ | Distance from light source |
| $f_{att}$ | Attenuation with distance [$f_{att} = 1/d_L^2$] |
| R | Normalised reflection vector [$R = 2N(N.L) - L$] |
| $I_a$ | Ambient light intensity |
| $I_p$ | Diffuse light coefficient |
| $k_a$ | Ambient reflection coefficient |
| $k_d$ | Diffuse reflection coefficient |
| $k_s$ | Specular reflection coefficient |
| $k_{sc}$ | Specular color coefficient |
| L | Normalised light source vector |
| N | Normalised surface normal vector |
| n | Specular exponent |
| $O_d$ | Object's diffuse color (i.e. image pixel color) |
| $O_S$ | Object's specular color ($k_{sc}O_d + (1 - k_{sc})I_p$) |
| V | Normalised viewing vector [V = 0, 0, 1]] |

The same reflection coefficients ($k_a$, $k_s$, $k_d$) are used for each color component.

A given pixel's value will be equal to the ambient contribution plus the sum of each light's diffuse and specular contribution.

Sub-Processes of Illumination Calculation

In order to calculate diffuse and specular contributions, a variety of other calculations are required. These are calculations of:

1/√X

N

L

N·L

R·V $f_{att}$ $f_{cp}$

Sub-processes are also defined for calculating the contributions of:

ambient diffuse specular

The sub-processes can then be used to calculate the overall illumination of a light source. Since there are only 4 multiply ALUs, the microcode for a particular type of light source can have sub-processes intermingled appropriately for performance.

Calculation of 1/√X

The Vark lighting model uses vectors. In many cases it is important to calculate the inverse of the length of the vector for normalization purposes. Calculating the inverse of the length requires the calculation of 1/SquareRoot[X].

Figure 118:
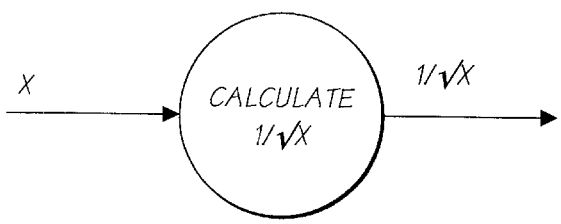
FIG. 118 illustrates the process of calculation of $1/\sqrt{X}$.
Figure 119:
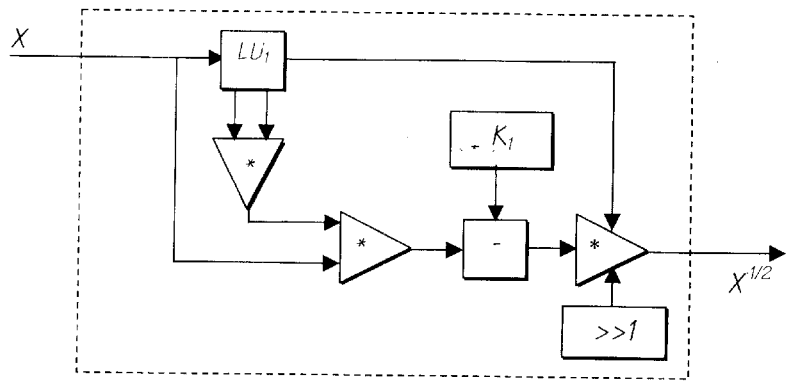

Logically, the process can be represented as a process with inputs and outputs as shown in FIG. 118. Referring to FIG. 119, the calculation can be made via a lookup of the estimation, followed by a single iteration of the following function:

$$V_{n+1} = \tfrac{1}{2}V_n(3-XV_n^2)$$

The number of iterations depends on the accuracy required. In this case only 16 bits of precision are required. The table can therefore have 8 bits of precision, and only a single iteration is necessary. The following constant is set by software:

| Constant | Value |
|---|---|
| $K_1$ | 3 |

The following lookup table is used:

| Lookup | Size | Details |
|---|---|---|
| $LU_1$ | 256 entries<br>8 bits per entry | 1/SquareRoot[X]<br>Table indexed by the 8 highest significant bits of X. Resultant 8 bits treated as fixed point 0:8 |

Calculation of N

N is the surface normal vector. When there is no bump-map, N is constant. When a bump-map is present, N must be calculated for each pixel.

No Bump-map

When there is no bump-map, there is a fixed normal N that has the following properties:

$$N=[X_N, Y_N, Z_N]=[0, 0, 1]$$

$$\|N\|=1$$

$$1/\|N\|=1$$

normalized N=N

These properties can be used instead of specifically calculating the normal vector and 1/∥N∥ and thus optimize other calculations.

With Bump-map

Figure 120:
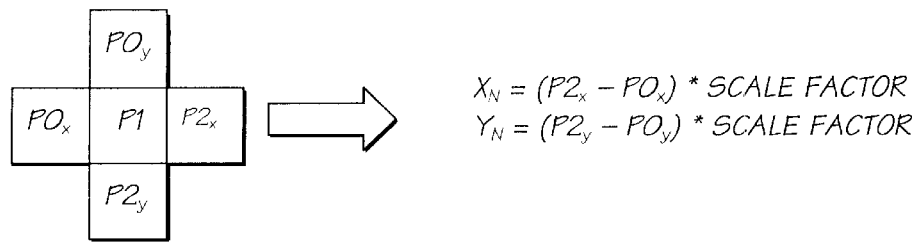
Figure 121:
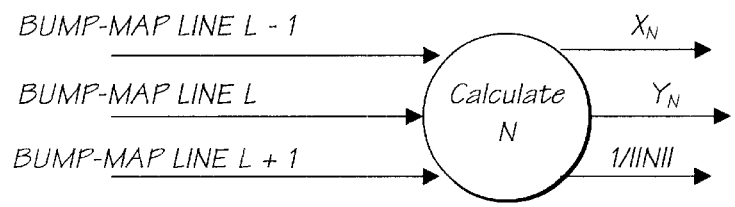

As illustrated in FIG. 120, when a bump-map is present, N is calculated by comparing bump-map values in X and Y dimensions. FIG. 120 shows the calculation of N for pixel P1 in terms of the pixels in the same row and column, but not including the value at P1 itself. The calculation of N is made resolution independent by multiplying by a scale factor (same scale factor in X & Y). This process can be represented as a process having inputs and outputs ($Z_N$ is always 1) as illustrated in FIG. 121.

As $Z_N$ is always 1. Consequently $X_N$ and $Y_N$ are not normalized yet (since $Z_N 1$). Normalization of N is delayed until after calculation of N.L so that there is only 1 multiply by $1/\|N\|$ instead of 3.

Figure 122:
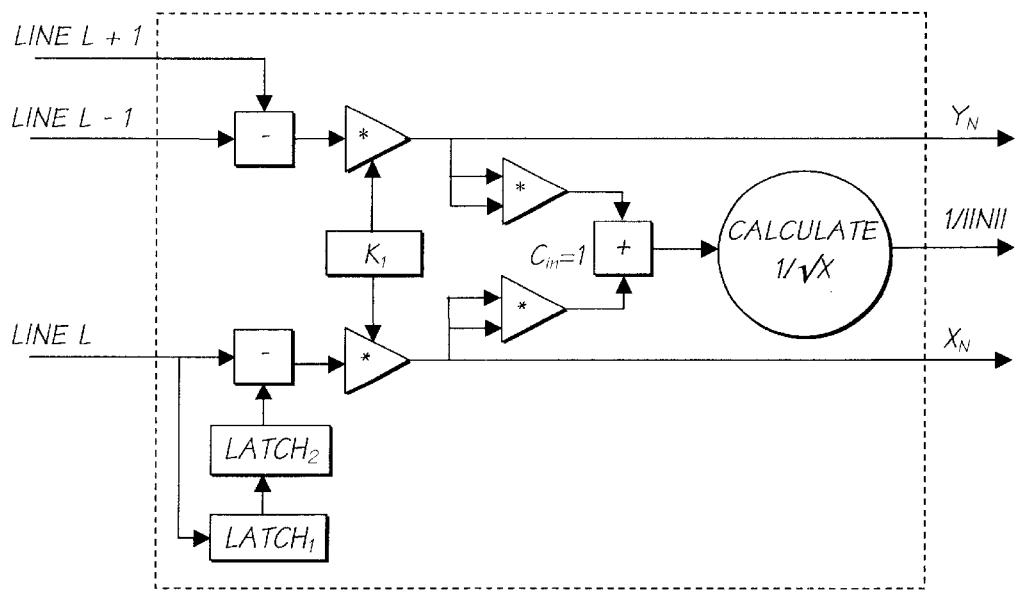

An actual process for calculating N is illustrated in FIG. 122.

The following constant is set by software:

| Constant | Value |
| --- | --- |
| $K_1$ | ScaleFactor (to make N resolution independent) |

Calculation of L
Directional Lights

When a light source is infinitely distant, it has an effective constant light vector L. L is normalized and calculated by software such that:

$$L=[X_L, Y_L, Z_L]$$

$$\|L\|1$$

$$1/\|L\|=1$$

Figure 123:
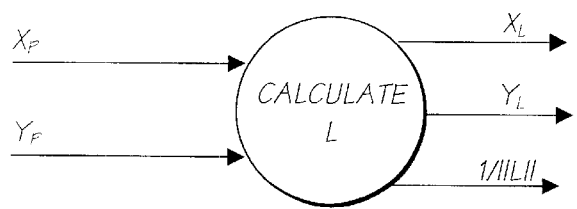

These properties can be used instead of specifically calculating the L and $1/\|L\|$ and thus optimize other calculations. This process is as illustrated in FIG. 123.

Omni Lights and Spotlights

When the light source is not infinitely distant, L is the vector from the current point P to the light source PL. Since $P=[X_P, Y_P, 0]$, L is given by:

$$L=[X_L, Y_L, Z_L]$$

$$X_L=X_P-X_{PL}$$

$$Y_L=Y_P-Y_{PL}$$

$$Z_L=-Z_{PL}$$

We normalize $X_L$, $Y_L$ and $Z_L$ by multiplying each by $1/\|L\|$. The calculation of $1/\|L\|$ (for later use in normalizing) is accomplished by calculating $$V=X_L^2+Y_L^2+Z_L^2$$

and then calculating $V^{-1/2}$

Figure 124:
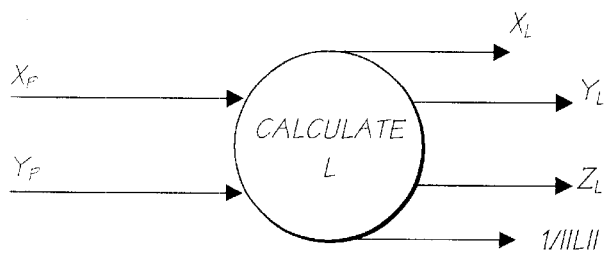

In this case, the calculation of L can be represented as a process with the inputs and outputs as indicated in FIG. 124.

$X_P$ and $Y_P$ are the coordinates of the pixel whose illumination is being calculated. $Z_P$ is always 0.

Figure 125:
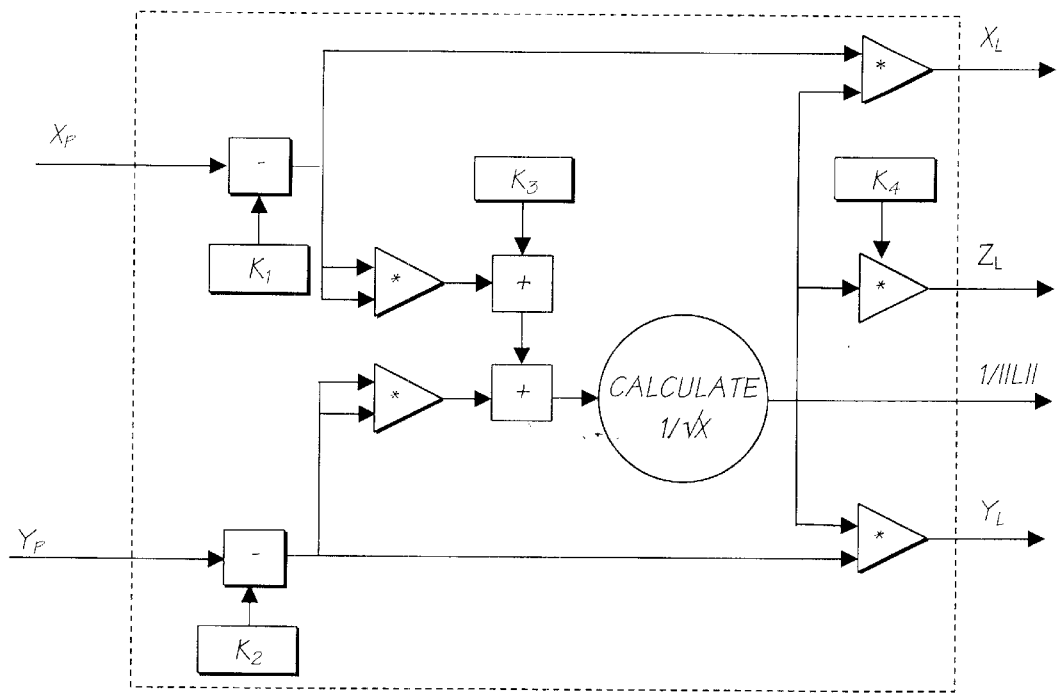

The actual process for calculating L can be as set out in FIG. 125.

Where the following constants are set by software:

| Constant | Value |
| --- | --- |
| $K_1$ | $X_{PL}$ |
| $K_2$ | $Y_{PL}$ |

-continued

| Constant | Value |
| --- | --- |
| $K_3$ | $Z_{PL}^2$ (as $Z_p$ is 0) |
| $K_4$ | $-Z_{PL}$ |

Calculation of N.L

Calculating the dot product of vectors N and L is defined as:

$$X_N X_L + Y_N Y_L + Z_N Z_L$$

No Bump-map

When there is no bump-map N is a constant [0, 0, 1]. N.L therefore reduces to $Z_L$.

With Bump-map

Figure 126:
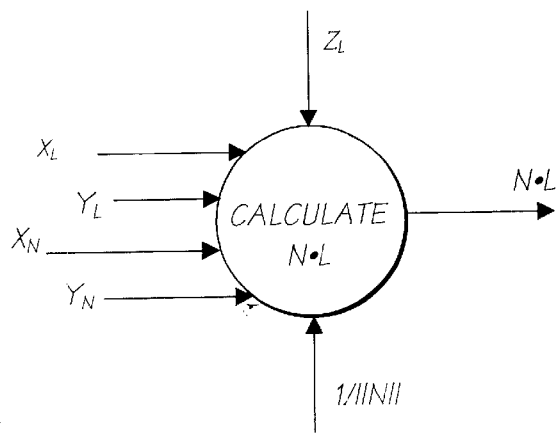

When there is a bump-map, we must calculate the dot product directly. Rather than take in normalized N components, we normalize after taking the dot product of a non-normalized N to a normalized L. L is either normalized by software (if it is constant), or by the Calculate L process. This process is as illustrated in FIG. 126.

Figure 127:
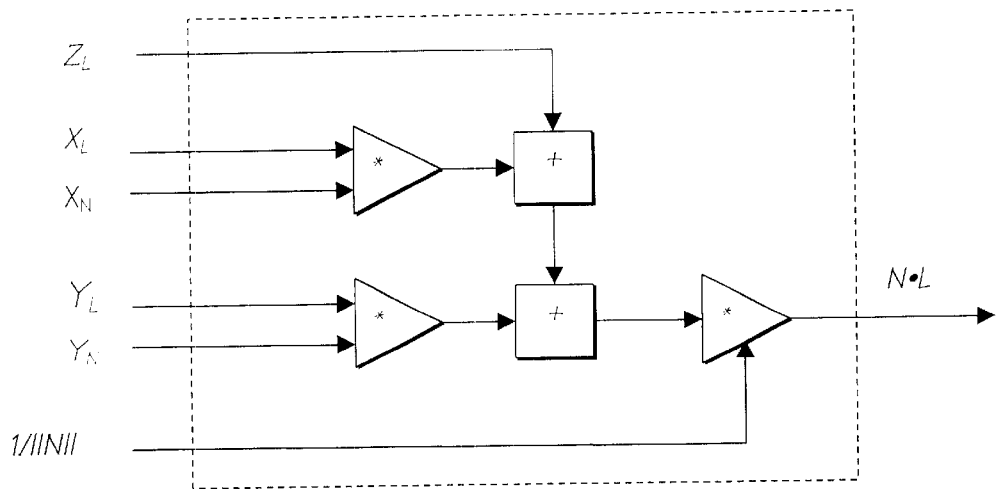

Note that $Z_N$ is not required as input since it is defined to be 1. However $1/\|L\|$ is required instead, in order to normalize the result. One actual process for calculating N.L is as illustrated in FIG. 127.

Calculation of R·V

R·V is required as input to specular contribution calculations. Since V=[0, 0, 1], only the Z components are required. R·V therefore reduces to:

$$R \cdot V = 2Z_N(N \cdot L) - Z_L$$

In addition, since the un-normalized $Z_N 1$, normalized $Z_N=1/\|N\|$

No Bump-map

The simplest implementation is when N is constant (i.e. no bump-map). Since N and V are constant, N.L and R·V can be simplified:

$$V=[0, 0, 1]$$

$$N=[0, 0, 1]$$

$$L=[X_L, Y_L, Z_L]$$

$$N.L=Z_L$$

When L is constant (Directional light source), a normalized $Z_L$ can be supplied by software in the form of a constant whenever R·V is required. When L varies (Omni lights and Spotlights), normalized $Z_L$ must be calculated on the fly. It is obtained as output from the Calculate L process.

With Bump-map

When N is not constant, the process of calculating R·V is simply an implementation of the generalized formula:

$$R \cdot V = 2Z_N(N.L) - Z_L$$

Figure 128:
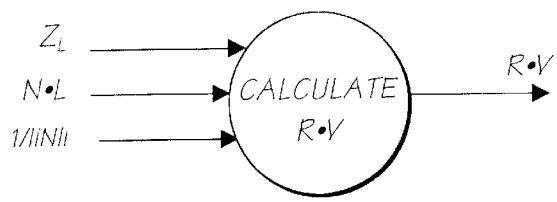
Figure 129:
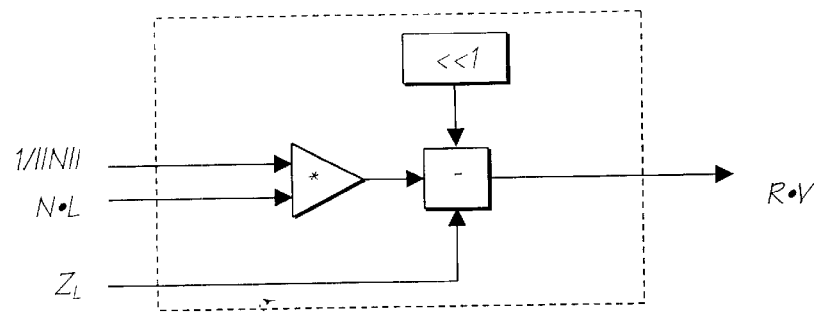

The inputs and outputs are as shown in FIG. 128 with the an actual implementation as shown in FIG. 129.

Calculation of Attenuation Factor
Directional Lights

When a light source is infinitely distant, the intensity of the light does not vary across the image. The attenuation factor $f_{att}$ is therefore 1. This constant can be used to optimize illumination calculations for infinitely distant light sources.

Omni Lights and Spotlights

When a light source is not infinitely distant, the intensity of the light can vary according to the following formula:

$$f_{att} = f_0 + f_1/d + f_2/d^2$$

Appropriate settings of coefficients $f_0$, $f_1$, and $f_2$ allow light intensity to be attenuated by a constant, linearly with distance, or by the square of the distance.

Figure 130:
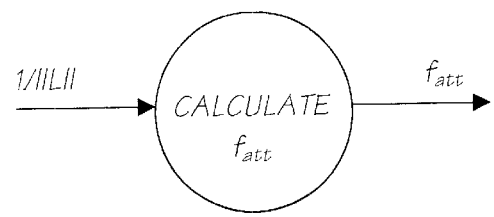

Since $d=\|L\|$, the calculation of $f_{att}$ can be represented as a process with the following inputs and outputs as illustrated in FIG. 130.

The actual process for calculating $f_{att}$ can be defined in FIG. 131.

Where the following constants are set by software:

| Constant | Value |
|---|---|
| $K_1$ | $F_2$ |
| $K_2$ | $f_1$ |
| $K_3$ | $F_0$ |

Calculation of Cone and Penumbra Factor

Directional Lights and Omni Lights

These two light sources are not focused, and therefore have no cone or penumbra. The cone-penumbra scaling factor $f_{cp}$ is therefore 1. This constant can be used to optimize illumination calculations for Directional and Omni light sources.

Spotlights

A spotlight focuses on a particular target point (PT). The intensity of the Spotlight varies according to whether the particular point of the image is in the cone, in the penumbra, or outside the cone/penumbra region.

Turning now to FIG. 132, there is illustrated a graph of $f_{cp}$ with respect to the penumbra position. Inside the cone 470, $f_{cp}$ is 1, outside 471 the penumbra $f_{cp}$ is 0. From the edge of the cone through to the end of the penumbra, the light intensity varies according to a cubic function 472.

The various vectors for penumbra 475 and cone 476 calculation are as illustrated in FIG. 133 and FIG. 134.

Looking at the surface of the image in 1 dimension as shown in FIG. 134, 3 angles A, B, and C are defined. A is the angle between the target point 479, the light source 478, and the end of the cone 480. C is the angle between the target point 479, light source 478, and the end of the penumbra 481. Both are fixed for a given light source. B is the angle between the target point 479, the light source 478, and the position being calculated 482, and therefore changes with every point being calculated on the image.

We normalize the range A to C to be 0 to 1, and find the distance that B is along that angle range by the formula:

$$(B-A)/(C-A)$$

The range is forced to be in the range 0 to 1 by truncation, and this value used as a lookup for the cubic approximation of $f_{cp}$.

The calculation of $f_{att}$ can therefore be represented as a process with the inputs and outputs as illustrated in FIG. 135 with an actual process for calculating $f_{cp}$ is as shown in FIG. 136 where the following constants are set by software:

| Constant | Value |
|---|---|
| $K_1$ | $X_{LT}$ |
| $K_2$ | $Y_{LT}$ |
| $K_3$ | $Z_{LT}$ |
| $K_4$ | A |
| $K_5$ | 1/(C − A).[MAXNUM if no penumbra] |

The following lookup tables are used:

| Lookup | Size | Details |
|---|---|---|
| $LU_1$ | 64 entries 16 bits per entry | Arcos(X) Units are same as for constants $K_5$ and $K_6$ Table indexed by highest 6 bits Result by linear interpolation of 2 entries Timing is 2 * 8 bits * 2 entries = 4 cycles |
| $LU_2$ | 64 entries 16 bits per entry | Light Response function $f_{cp}$ F(1) = 0, F(0) = 1, others are according to cubic Table indexed by 6 bits (1:5) Result by linear interpolation of 2 entries Timing is 2 * 8 bits = 4 cycles |

Calculation of Ambient Contribution

Regardless of the number of lights being applied to an image, the ambient light contribution is performed once for each pixel, and does not depend on the bump-map.

The ambient calculation process can be represented as a process with the inputs and outputs as illustrated in FIG. 131. The implementation of the process requires multiplying each pixel from the input image ($O_d$) by a constant value ($I_a k_a$), as shown in FIG. 138 where the following constant is set by software:

| Constant | Value |
|---|---|
| $K_1$ | $I_a k_a$ |

Calculation of Diffuse Contribution

Each light that is applied to a surface produces a diffuse illumination. The diffuse illumination is given by the formula:

$$\text{diffuse} = k_d O_d (N.L)$$

There are 2 different implementations to consider:

Implementation 1—Constant N and L

When N and L are both constant (Directional light and no bump-map):

$$N.L = Z_L$$

Therefore:

$$\text{diffuse} = k_d O_d Z_L$$

Since $O_d$ is the only variable, the actual process for calculating the diffuse contribution is as illustrated in FIG. 139 where the following constant is set by software:

| Constant | Value |
|---|---|
| $K_1$ | $k_d(N.L) = k_d Z_L$ |

Implementation 2—Non-constant N & L

When either N or L are non-constant (either a bump-map or illumination from an Omni light or a Spotlight), the diffuse calculation is performed directly according to the formula:

$$\text{diffuse} = k_d O_d (N.L)$$

The diffuse calculation process can be represented as a process with the inputs as illustrated in FIG. 140. N.L can either be calculated using the Calculate N.L Process, or is provided as a constant. An actual process for calculating the diffuse contribution is as shown in FIG. 141 where the following constants are set by software:

| Constant | Value |
|---|---|
| $K_1$ | $k_d$ |

Calculation of Specular Contribution

Each light that is applied to a surface produces a specular illumination. The specular illumination is given by the formula:

$$\text{specular} = k_s O_s (R \cdot V)^n$$

where $O_s = k_{sc} O_d + (1 - k_{sc}) I_p$

There are two implementations of the Calculate Specular process.

Implementation 1—Constant N and L

The first implementation is when both N and L are constant (Directional light and no bump-map). Since N, L and V are constant, N.L and R·V are also constant:

$$V = [0, 0, 1]$$

$$N = [0, 0, 1]$$

$$L = [X_L, Y_L, Z_L]$$

$$N.L = Z_L$$

The specular calculation can thus be reduced to:

Since only $O_d$ is a variable in the specular calculation, the calculation of the specular contribution can therefore be represented as a process with the inputs and outputs as indicated in FIG. 142 and an actual process for calculating the specular contribution is illustrated in FIG. 143 where the following constants are set by software:

| Constant | Value |
|---|---|
| $K_1$ | $k_s k_{sc} Z_L^n$ |
| $K_2$ | $(1 - k_{sc}) I_p k_s Z_L^n$ |

Implementation 2—Non constant N and L

This implementation is when either N or L are not constant (either a bump-map or illumination from an Omni light or a Spotlight). This implies that R·V must be supplied, and hence $R \cdot V^n$ must also be calculated.

The specular calculation process can be represented as a process with the inputs and outputs as shown in FIG. 144. FIG. 145 shows an actual process for calculating the specular contribution where the following constants are set by software:

| Constant | Value |
|---|---|
| $K_1$ | $k_s$ |
| $K_2$ | $k_{sc}$ |
| $K_3$ | $(1 - k_{sc}) I_p$ |

The following lookup table is used:

| Lookup | Size | Details |
|---|---|---|
| $LU_1$ | 32 entries 16 bits per entry | $X^n$ Table indexed by 5 highest bits of integer R.V Result by linear interpolation of 2 entries using fraction of R.V Interpolation by 2 Multiplies. The time taken to retrieve the data from the lookup is 2 * 8 bits * 2 entries = 4 cycles. |

When Ambient Light is the Only Illumination

If the ambient contribution is the only light source, the process is very straightforward since it is not necessary to add the ambient light to anything with the overall process being as illustrated in FIG. 146. We can divide the image vertically into 2 sections, and process each half simultaneously by duplicating the ambient light logic (thus using a total of 2 Multiply ALUs and 4 Sequential Iterators). The timing is therefore ½ cycle per pixel for ambient light application.

The typical illumination case is a scene lit by one or more lights. In these cases, because ambient light calculation is so cheap, the ambient calculation is included with the processing of each light source. The first light to be processed should have the correct $I_a k_a$ setting, and subsequent lights should have an $I_a k_a$ value of 0 (to prevent multiple ambient contributions).

If the ambient light is processed as a separate pass (and not the first pass), it is necessary to add the ambient light to the current calculated value (requiring a read and write to the same address). The process overview is shown in FIG. 147.

The process uses 3 Image Iterators, 1 Multiply ALU, and takes 1 cycle per pixel on average.

Infinite Light Source

In the case of the infinite light source, we have a constant light source intensity across the image. Thus both L and $f_{att}$ are constant.

No Bump Map

When there is no bump-map, there is a constant normal vector N [0, 0, 1]. The complexity of the illumination is greatly reduced by the constants of N, L, and $f_{att}$. The process of applying a single Directional light with no bump-map is as illustrated in FIG. 147 where the following constant is set by software:

| Constant | Value |
|---|---|
| $K_1$ | $I_p$ |

For a single infinite light source we want to perform the logical operations as shown in FIG. 148 where $K_1$ through $K_4$ are constants with the following values:

| Constant | Value |
|---|---|
| $K_1$ | $K_d(NsL) = K_d L_Z$ |
| $K_2$ | $k_{sc}$ |
| $k_3$ | $K_s(NsH)^n = K_s H_Z^2$ |
| $K_4$ | $I_p$ |

The process can be simplified since $K_2$, $K_3$, and $K_4$ are constants. Since the complexity is essentially in the calculation of the specular and diffuse contributions (using 3 of the Multiply ALUs), it is possible to safely add an ambient calculation as the $4^{th}$ Multiply ALU. The first infinite light source being processed can have the true ambient light parameter $I_a k_a$, and all subsequent infinite lights can set $I_a k_a$ to be 0. The ambient light calculation becomes effectively free.

If the infinite light source is the first light being applied, there is no need to include the existing contributions made by other light sources and the situation is as illustrated in FIG. 149 where the constants have the following values:

| Constant | Value |
|---|---|
| $K_1$ | $k_d(LsN) = k_d L_Z$ |
| $K_4$ | $I_p$ |
| $K_5$ | $(1 - k_s(NsH)^n)I_p = (1 - k_s H_Z^n)I_p$ |
| $K_6$ | $k_{sc} k_s (NsH)^n I_p = k_{sc} k_s H_Z^n I_p$ |
| $K_7$ | $I_a k_a$ |

If the infinite light source is not the first light being applied, the existing contribution made by previously processed lights must be included (the same constants apply) and the situation is as illustrated in FIG. 148.

In the first case 2 Sequential Iterators 490, 491 are required, and in the second case, 3 Sequential Iterators 490, 491, 492 (the extra Iterator is required to read the previous light contributions). In both cases, the application of an infinite light source with no bump map takes 1 cycle per pixel, including optional application of the ambient light.

With Bump Map

When there is a bump-map, the normal vector N must be calculated per pixel and applied to the constant light source vector L. $1/\|N\|$ is also used to calculate R·V, which is required as input to the Calculate Specular 2 process. The following constants are set by software:

| Constant | Value |
|---|---|
| $K_1$ | $X_L$ |
| $K_2$ | $Y_L$ |
| $K_3$ | $Z_L$ |
| $K_4$ | $I_p$ |

Bump-map Sequential Read Iterator 490 is responsible for reading the current line of the bump-map. It provides the input for determining the slope in X. Bump-map Sequential Read Iterators 491, 492 and are responsible for reading the line above and below the current line. They provide the input for determining the slope in Y.

Omni Lights

In the case of the Omni light source, the lighting vector L and attenuation factor $f_{att}$ change for each pixel across an image. Therefore both L and $f_{att}$ must be calculated for each pixel.

No Bump Map

When there is no bump-map, there is a constant normal vector N [0, 0, 1]. Although L must be calculated for each pixel, both N.L and R·V are simplified to $Z_L$. When there is no bump-map, the application of an Omni light can be calculated as shown in FIG. 149 where the following constants are set by software:

| Constant | Value |
|---|---|
| $K_1$ | $X_p$ |
| $K_2$ | $Y_p$ |
| $K_3$ | $I_p$ |

The algorithm optionally includes the contributions from previous light sources, and also includes an ambient light calculation. Ambient light needs only to be included once. For all other light passes, the appropriate constant in the Calculate Ambient process should be set to 0.

The algorithm as shown requires a total of 19 multiply/accumulates. The times taken for the lookups are 1 cycle during the calculation of L, and 4 cycles during the specular contribution. The processing time of 5 cycles is therefore the best that can be accomplished. The time taken is increased to 6 cycles in case it is not possible to optimally microcode the ALUs for the function. The speed for applying an Omni light onto an image with no associated bump-map is 6 cycles per pixel.

With Bump-map

When an Omni light is applied to an image with an associated a bump-map, calculation of N, L, N.L and R·V are all necessary. The process of applying an Omni light onto an image with an associated bump-map is as indicated in FIG. 150 where the following constants are set by software:

| Constant | Value |
|---|---|
| $K_1$ | $X_p$ |
| $K_2$ | $Y_p$ |
| $K_3$ | $I_p$ |

The algorithm optionally includes the contributions from previous light sources, and also includes an ambient light calculation. Ambient light needs only to be included once. For all other light passes, the appropriate constant in the Calculate Ambient process should be set to 0.

The algorithm as shown requires a total of 32 multiply/accumulates. The times taken for the lookups are 1 cycle each during the calculation of both L and N, and 4 cycles for the specular contribution. However the lookup required for N and L are both the same (thus 2 LUs implement the 3 LUs). The processing time of 8 cycles is adequate. The time taken is extended to 9 cycles in case it is not possible to optimally microcode the ALUs for the function. The speed for applying an Omni light onto an image with an associated bump-map is 9 cycles per pixel.

Spotlights

Spotlights are similar to Omni lights except that the attenuation factor $f_{att}$ is modified by a cone/penumbra factor $f_{cp}$ that effectively focuses the light around a target.

No Bump-map

When there is no bump-map, there is a constant normal vector N [0, 0, 1]. Although L must be calculated for each pixel, both N.L and R·V are simplified to $Z_L$. FIG. 151 illustrates the application of a Spotlight to an image where the following constants are set by software:

| Constant | Value |
| --- | --- |
| $K_1$ | $X_p$ |
| $K_2$ | $Y_p$ |
| $K_3$ | $I_p$ |

The algorithm optionally includes the contributions from previous light sources, and also includes an ambient light calculation. Ambient light needs only to be included once. For all other light passes, the appropriate constant in the Calculate Ambient process should be set to 0.

The algorithm as shown requires a total of 30 multiply/accumulates. The times taken for the lookups are 1 cycle during the calculation of L, 4 cycles for the specular contribution, and 2 sets of 4 cycle lookups in the cone/penumbra calculation.

With Bump-map

When a Spotlight is applied to an image with an associated a bump-map, calculation of N, L, N.L and R·V are all necessary. The process of applying a single Spotlight onto an image with associated bump-map is illustrated in FIG. 152 where the following constants are set by software:

The algorithm optionally includes the contributions from previous light sources, and also includes an ambient light calculation. Ambient light needs only to be included once. For all other light passes, the appropriate constant in the Calculate Ambient process should be set to 0. The algorithm as shown requires a total of 41 multiply/accumulates.

Print Head 44

FIG. 153 illustrates the logical layout of a single print Head which logically consists of 8 segments, each printing bi-level cyan, magenta, and yellow onto a portion of the page.

Loading a Segment for Printing

Before anything can be printed, each of the 8 segments in the Print Head must be loaded with 6 rows of data corresponding to the following relative rows in the final output image:

Row 0=Line N, Yellow, even dots 0, 2, 4, 6, 8, . . .

Row 1=Line N+8, Yellow, odd dots 1, 3, 5, 7, . . .

Row 2=Line N+10, Magenta, even dots 0, 2, 4, 6, 8, . . .

Row 3=Line N+18, Magenta, odd dots 1, 3, 5, 7, . . .

Row 4=Line N+20, Cyan, even dots 0, 2, 4, 6, 8, . . .

Row 5=Line N+28, Cyan, odd dots 1, 3, 5, 7, . . .

Each of the segments prints dots over different parts of the page. Each segment prints 750 dots of one color, 375 even dots on one row, and 375 odd dots on another. The 8 segments have dots corresponding to positions:

| Segment | First dot | Last dot |
| --- | --- | --- |
| 0 | 0 | 749 |
| 1 | 750 | 1499 |
| 2 | 1500 | 2249 |
| 3 | 2250 | 2999 |
| 4 | 3000 | 3749 |
| 5 | 3750 | 4499 |
| 6 | 4500 | 5249 |
| 7 | 5250 | 5999 |

Each dot is represented in the Print Head segment by a single bit. The data must be loaded 1 bit at a time by placing the data on the segment's BitValue pin, and clocked in to a shift register in the segment according to a BitClock. Since the data is loaded into a shift register, the order of loading bits must be correct. Data can be clocked in to the Print Head at a maximum rate of 10 MHz.

Once all the bits have been loaded, they must be transferred in parallel to the Print Head output buffer, ready for printing. The transfer is accomplished by a single pulse on the segment's ParallelXferClock pin.

Controlling the Print

In order to conserve power, not all the dots of the Print Head have to be printed simultaneously. A set of control lines enables the printing of specific dots. An external controller, such as the ACP, can change the number of dots printed at once, as well as the duration of the print pulse in accordance with speed and/or power requirements.

Each segment has 5 NozzleSelect lines, which are decoded to select 32 sets of nozzles per row. Since each row has 375 nozzles, each set contains 12 nozzles. There are also 2 BankEnable lines, one for each of the odd and even rows of color. Finally, each segment has 3 ColorEnable lines, one for each of C, M, and Y colors. A pulse on one of the ColorEnable lines causes the specified nozzles of the color's specified rows to be printed. A pulse is typically about 2 $\mu$s in duration.

If all the segments are controlled by the same set of NozzleSelect, BankEnable and ColorEnable lines (wired externally to the print head), the following is true:

If both odd and even banks print simultaneously (both BankEnable bits are set), 24 nozzles fire simultaneously per segment, 192 nozzles in all, consuming 5.7 Watts.

If odd and even banks print independently, only 12 nozzles fire simultaneously per segment, 96 in all, consuming 2.85 Watts.

Print Head Interface 62

The Print Head Interface 62 connects the ACP to the Print Head, providing both data and appropriate signals to the external Print Head. The Print Head Interface 62 works in conjunction with both a VLIW processor 74 and a software algorithm running on the CPU in order to print a photo in approximately 2 seconds.

An overview of the inputs and outputs to the Print Head Interface is shown in FIG. 154. The Address and Data Buses are used by the CPU to address the various registers in the Print Head Interface. A single BitClock output line connects to all 8 segments on the print head. The 8 DataBits lines lead one to each segment, and are clocked in to the 8 segments on the print head simultaneously (on a BitClock pulse). For example, dot 0 is transferred to segments$_0$, dot 750 is transferred to segment$_1$, dot 1500 to segment$_2$ etc. simultaneously.

The VLIW Output FIFO contains the dithered bi-level C, M, and Y 6000×9000 resolution print image in the correct order for output to the 8 DataBits. The ParallelXferClock is connected to each of the 8 segments on the print head, so that on a single pulse, all segments transfer their bits at the same time. Finally, the NozzleSelect, BankEnable and ColorEnable lines are connected to each of the 8 segments, allowing the Print Head Interface to control the duration of the C, M, and Y drop pulses as well as how many drops are printed with each pulse. Registers in the Print Head Interface allow the specification of pulse durations between 0 and 6 $\mu$s, with a typical duration of 2 $\mu$s.

Printing an Image

There are 2 phases that must occur before an image is in the hand of the Artcam user:

1. Preparation of the image to be printed
2. Printing the prepared image

Preparation of an image only needs to be performed once. Printing the image can be performed as many times as desired.

Prepare the Image

Preparing an image for printing involves:

1. Convert the Photo Image into a Print Image
2. Rotation of the Print Image (internal color space) to align the output for the orientation of the printer
3. Up-interpolation of compressed channels (if necessary)
4. Color conversion from the internal color space to the CMY color space appropriate to the specific printer and ink At the end of image preparation, a 4.5 MB correctly oriented 1000×1500 CMY image is ready to be printed.

Convert Photo Image to Print Image

The conversion of a Photo Image into a Print Image requires the execution of a Vark script to perform image processing. The script is either a default image enhancement script or a Vark script taken from the currently inserted Artcard. The Vark script is executed via the CPU, accelerated by functions performed by the VLIW Vector Processor.

Rotate the Print Image

The image in memory is originally oriented to be top upwards. This allows for straightforward Vark processing. Before the image is printed, it must be aligned with the print roll's orientation. The re-alignment only needs to be done once. Subsequent Prints of a Print Image will already have been rotated appropriately.

The transformation to be applied is simply the inverse of that applied during capture from the CCD when the user pressed the "Image Capture" button on the Artcam. If the original rotation was 0, then no transformation needs to take place. If the original rotation was +90 degrees, then the rotation before printing needs to be −90 degrees (same as 270 degrees). The method used to apply the rotation is the Vark accelerated Affine Transform function. The Affine Transform engine can be called to rotate each color channel independently. Note that the color channels cannot be rotated in place. Instead, they can make use of the space previously used for the expanded single channel (1.5 MB).

FIG. 155 shows an example of rotation of a Lab image where the a and b channels are compressed 4:1. The L channel is rotated into the space no longer required (the single channel area), then the a channel can be rotated into the space left vacant by L, and finally the b channel can be rotated. The total time to rotate the 3 channels is 0.09 seconds. It is an acceptable period of time to elapse before the first print image. Subsequent prints do not incur this overhead.

Up Interpolate and Color Convert

The Lab image must be converted to CMY before printing. Different processing occurs depending on whether the a and b channels of the Lab image is compressed. If the Lab image is compressed, the a and b channels must be decompressed before the color conversion occurs. If the Lab image is not compressed, the color conversion is the only necessary step. The Lab image must be up interpolated (if the a and b channels are compressed) and converted into a CMY image. A single VLIW process combining scale and color transform can be used.

The method used to perform the color conversion is the Vark accelerated Color Convert function. The Affine Transform engine can be called to rotate each color channel independently. The color channels cannot be rotated in place. Instead, they can make use of the space previously used for the expanded single channel (1.5 MB).

Print the Image

Printing an image is concerned with taking a correctly oriented 1000×1500 CMY image, and generating data and signals to be sent to the external Print Head. The process involves the CPU working in conjunction with a VLIW process and the Print Head Interface.

The resolution of the image in the Artcam is 1000×1500. The printed image has a resolution of 6000×9000 dots, which makes for a very straightforward relationship: 1 pixel=6×6=36 dots. As shown in FIG. 156 since each dot is 16.6 $\mu$m, the 6×6 dot square is 100 $\mu$m square. Since each of the dots is bi-level, the output must be dithered.

The image should be printed in approximately 2 seconds. For 9000 rows of dots this implies a time of 222 $\mu$s time between printing each row. The Print Head Interface must generate the 6000 dots in this time, an average of 37 ns per dot. However, each dot comprises 3 colors, so the Print Head Interface must generate each color component in approximately 12 ns, or 1 clock cycle of the ACP (10 ns at 100 MHz). One VLIW process is responsible for calculating the next line of 6000 dots to be printed. The odd and even C, M, and Y dots are generated by dithering input from 6 different 1000×1500 CMY image lines. The second VLIW process is responsible for taking the previously calculated line of 6000 dots, and correctly generating the 8 bits of data for the 8 segments to be transferred by the Print Head Interface to the Print Head in a single transfer.

A CPU process updates registers in the fist VLIW process 3 times per print line (once per color component=27000 times in 2 seconds0, and in the 2nd VLIW process once every print line (9000 times in 2 seconds). The CPU works one line ahead of the VLIW process in order to do this.

Finally, the Print Head Interface takes the 8 bit data from the VLIW Output FIFO, and outputs it unchanged to the Print Head, producing the BitClock signals appropriately. Once all the data has been transferred a ParallelXferClock signal is generated to load the data for the next print line. In conjunction with transferring the data to the Print Head, a separate timer is generating the signals for the different print cycles of the Print Head using the NozzleSelect, ColorEnable, and BankEnable lines a specified by Print Head Interface internal registers.

The CPU also controls the various motors and guillotine via the parallel interface during the print process.

Generate C, M, and Y Dots

The input to this process is a 1000×1500 CMY image correctly oriented for printing. The image is not compressed in any way. As illustrated in FIG. 157, a VLIW microcode program takes the CMY image, and generates the C, M, and Y pixels required by the Print Head Interface to be dithered.

The process is run 3 times, once for each of the 3 color components. The process consists of 2 sub-processes run in parallel—one for producing even dots, and the other for producing odd dots. Each sub-process takes one pixel from the input image, and produces 3 output dots (since one pixel=6 output dots, and each sub-process is concerned with either even or odd dots). Thus one output dot is generated each cycle, but an input pixel is only read once every 3 cycles.

The original dither cell is a 64×64 cell, with each entry 8 bits. This original cell is divided into an odd cell and an even cell, so that each is still 64 high, but only 32 entries wide. The even dither cell contains original dither cell pixels 0, 2, 4 etc., while the odd contains original dither cell pixels 1, 3, 5 etc. Since a dither cell repeats across a line, a single 32 byte line of each of the 2 dither cells is required during an entire line, and can therefore be completely cached. The odd and even lines of a single process line are staggered 8 dot lines apart, so it is convenient to rotate the odd dither cell's lines by 8 lines. Therefore the same offset into both odd and even dither cells can be used. Consequently the even dither cell's line corresponds to the even entries of line L in the original dither cell, and the even dither cell's line corresponds to the odd entries of line L+8 in the original dither cell.

The process is run 3 times, once for each of the color components. The CPU software routine must ensure that the Sequential Read Iterators for odd and even lines are pointing to the correct image lines corresponding to the print heads. For example, to produce one set of 18,000 dots (3 sets of 6000 dots):

Yellow even dot line=0, therefore input Yellow image line=0/6=0

Yellow odd dot line=8, therefore input Yellow image line=8/6=1

Magenta even line=10, therefore input Magenta image line=10/6=1

Magenta odd line=18, therefore input Magenta image line=18/6=3

Cyan even line=20, therefore input Cyan image line=20/6=3

Cyan odd line=28, therefore input Cyan image line=28/6=4

Subsequent sets of input image lines are:

Y=[0, 1], M=[1, 3], C=[3, 4]

Y=[0, 1], M=[1, 3], C=[3, 4]

Y=[0, 1], M=[2, 3], C=[3, 5]

Y=[0, 1], M=[2, 3], C=[3, 5]

Y=[0, 2], M=[2, 3], C=[4, 5]

The dither cell data however, does not need to be updated for each color component. The dither cell. for the 3 colors becomes the same, but offset by 2 dot lines for each component.

The Dithered Output is written to a Sequential Write Iterator, with odd and even dithered dots written to. 2 separate outputs. The same two Write Iterators are used for all 3 color components, so that they are contiguous within the break-up of odd and even dots.

While one set of dots is being generated for a print line, the previously generated set of dots is being merged by a second VLIW process as described in the next section.

Generate Merged 8 Bit Dot Output

This process, as illustrated in FIG. 158, takes a single line of dithered dots and generates the 8 bit data stream for output to the Print Head Interface via the VLIW Output FIFO. The process requires the entire line to have been prepared, since it requires semi-random access to most of the dithered line at once. The following constant is set by software:

| Constant | Value |
|---|---|
| $K_1$ | 375 |

The Sequential Read Iterators point to the line of previously generated dots, with the Iterator registers set up to limit access to a single color component. The distance between subsequent pixels is 375, and the distance between one line and the next is given to be 1 byte. Consequently 8 entries are read for each "line". A single "line" corresponds to the 8 bits to be loaded on the print head. The total number of "lines" in the image is set to be 375. With at least 8 cache lines assigned to the Sequential Read Iterator, complete cache coherence is maintained. Instead of counting the 8 bits, 8 Microcode steps count implicitly.

The generation process first reads all the entries from the even dots, combining 8 entries into a single byte which is then output to the VLIW Output FIFO. Once all 3000. even dots have been read, the 3000 odd dots are read and processed. A software routine must update the address of the dots in the odd and even Sequential Read Iterators once per color component, which equates to 3 times per line. The two VLIW processes require all 8 ALUs and the VLIW Output FIFO. As long as the CPU is able to update the registers as described in the two processes, the VLIW processor can generate the dithered image dots fast enough to keep up with the printer.

Data Card Reader

FIG. 159, there is illustrated on form of card reader 500 which allows for the insertion of Artcards 9 for reading. FIG. 158 shows an exploded perspective of the reader of FIG. 159. Cardreader is interconnected to a computer system and includes a CCD reading mechanism 35. The cardreader includes pinch rollers 506, 507 for pinching an inserted Artcard 9. One of the roller e.g. 506 is driven by an Artcard motor 37 for the advancement of the card 9 between the two rollers 506 and 507 at a uniformed speed. The Artcard 9 is passed over a series of LED lights 512 which are encased within a clear plastic mould 514 having a semi circular cross section. The cross section focuses the light from the LEDs eg 512 onto the surface of the card 9 as it passes by the LEDs 512. From the surface it is reflected to a high resolution linear CCD 34 which is constructed to a resolution of approximately 480 dpi. The surface of the Artcard 9 is encoded to the level of approximately 1600 dpi hence, the linear CCD 34 supersamples the. Artcard surface with an approximately three times multiplier. The Artcard 9 is further driven at a speed such that the linear CCD 34 is able to supersample in the direction of Artcard movement at a rate of approximately 4800 readings per inch. The scanned Artcard CCD data is forwarded from the Artcard reader to ACP 31 for processing. A sensor 49, which can comprise a light sensor acts to detect of the presence of the card 13.

The CCD reader includes a bottom substrate 516, a top substrate 514 which comprises a transparent molded plastic. In between the two substrates is inserted the linear CCD array 34 which comprises a thin long linear CCD array constructed by means of semi-conductor manufacturing processes.

Turning to FIG. 160, there is illustrated a side perspective view, partly in section, of an example construction of the CCD reader unit. The series of LEDs eg. 512 are operated to emit light when a card 9 is passing across the surface of the CCD reader 34. The emitted light is transmitted through a portion of the top substrate 523. The substrate includes a portion eg. 529 having a curved circumference so as to focus light emitted from LED 512 to a point eg. 532 on the surface of the card 9. The focused light is reflected from the point 532 towards the CCD array 34. A series of microlenses eg. 534, shown in exaggerated form, are formed on the surface of the top substrate 523. The microlenses 523 act to focus light received across the surface to the focused down to a point 536 which corresponds to point on the surface of the CCD reader 34 for sensing of light falling on the light sensing portion of the CCD array 34.

A number of refinements of the above arrangement are possible. For example, the sensing devices on the linear CCD 34 may be staggered. The corresponding microlenses 34 can also be correspondingly formed as to focus light into a staggered series of spots so as to correspond to the staggered CCD sensors.

To assist reading, the data surface area of the Artcard 9 is modulated with a checkerboard pattern as previously discussed with reference to FIG. 38. Other forms of high frequency modulation may be possible however.

It will be evident that an Artcard printer can be provided as for the printing out of data on storage Artcard. Hence, the Artcard system can be utilized as a general form of information distribution outside of the Artcam device. An Artcard printer can prints out Artcards on high quality print surfaces and multiple Artcards can be printed on same sheets and later separated. On a second surface of the Artcard 9 can be printed information relating to the files etc. stored on the Artcard 9 for subsequent storage.

Hence, the Artcard system allows for a simplified form of storage which is suitable for use in place of other forms of storage such as CD ROMs, magnetic disks etc. The Artcards 9 can also be mass produced and thereby produced in a substantially inexpensive form for redistribution.

Print Rolls

Turning to FIG. 162, there is illustrated the print roll 42 and print-head portions of the Artcam. The paper/film 611 is fed in a continuous "web-like" process to a printing mechanism 15 which includes further pinch rollers 616–619 and a print head 44.

The pinch roller 613 is connected to a drive mechanism (not shown) and upon rotation of the print roller 613, "paper" in the form of film 611 is forced through the printing mechanism 615 and out of the picture output slot 6. A rotary guillotine mechanism (not shown) is utilised to cut the roll of paper 611 at required photo sizes.

It is therefore evident that the printer roll 42 is responsible for supplying "paper" 611 to the print mechanism 615 for printing of photographically imaged pictures.

In FIG. 163, there is shown an exploded perspective of the print roll 42. The printer roll 42 includes output printer paper 611 which is output under the operation of pinching rollers 612, 613.

Referring now to FIG. 164, there is illustrated a more fully exploded perspective view, of the print roll 42 of FIG. 163 without the "paper" film roll. The print roll 42 includes three main parts comprising ink reservoir section 620, paper roll sections .622, 623 and outer casing sections 626, 627.

Turning first to the ink reservoir section 620, which includes the ink reservoir or ink supply sections 633. The ink for printing is contained within three bladder type containers 630–632. The printer roll 42 is assumed to provide full color output inks. Hence, a first ink reservoir or bladder container 630 contains cyan colored ink. A second reservoir 631 contains magenta colored ink and a third reservoir 632 contains yellow ink. Each of the reservoirs 630–632, although having different volumetric dimensions, are designed to have substantially the same volumetric size.

The ink reservoir sections 621, 633, in addition to cover 624 can be made of plastic sections and are designed to be mated together by means of heat sealing, ultra violet radiation, etc. Each of the equally sized ink reservoirs 630–632 is connected to a corresponding ink channel 639–641 for allowing the flow of ink from the reservoir 630–632 to a corresponding ink output port 635–637. The ink reservoir 632 having ink channel 641, and output port 637, the ink reservoir 631 having ink channel 640 and output port 636, and the ink reservoir 630 having ink channel 639 and output port 637.

In operation, the ink reservoirs 630–632 can be filled with corresponding ink and the section 633 joined to the section 621. The ink reservoir sections 630–632, being collapsible bladders, allow for ink to traverse ink channels 639–641 and therefore be in fluid communication with the ink output ports 635–637. Further, if required, an air inlet port can also be provided to allow the pressure associated with ink channel reservoirs 630–632 to be maintained as required.

The cap 624 can be joined to the ink reservoir section 620 so as to form a pressurized cavity, accessible by the air pressure inlet port.

The ink reservoir sections 621, 633 and 624 are designed to be connected together as an integral unit and to be inserted inside printer roll sections 622, 623. The printer roll sections 622, 623 are designed to mate together by means of a snap fit by means of male portions 645–647 mating with corresponding female portions (not shown). Similarly, female portions 654–656 are designed to mate with corresponding male portions 660–662. The paper roll sections 622, 623 are therefore designed to be snapped together. One end of the film within the role is pinched between the two sections 622, 623 when they are joined together. The print film can then be rolled on the print roll sections 622, 625 as required.

As noted previously, the ink reservoir sections 620, 621, 633, 624 are designed to be inserted inside the paper roll sections 622, 623. The printer roll sections 622, 623 are able to be rotatable around stationery ink reservoir sections 621, 633 and 624 to dispense film on demand.

The outer casing sections 626 and 627 are further designed to be coupled around the print roller sections 622, 623. In addition to each end of pinch rollers eg 612, 613 is designed to clip in to a corresponding cavity eg 670 in cover 626, 627 with roller 613 being driven externally (not shown) to feed the print film and out of the print roll.

Finally, a cavity 677 can be provided in the ink reservoir sections 620, 621 for the insertion and gluing of an silicon chip integrated circuit type device 53 for the storage of information associated with the print roll 42.

As shown in FIG. 155 and FIG. 164, the print roll 42 is designed to be inserted into the Artcam camera device so as to couple with a coupling unit 680 which includes connector pads 681 for providing a connection with the silicon chip 53. Further, the connector 680 includes end connectors of four connecting with ink supply ports 635–637. The ink supply ports are in turn to connect to ink supply lines eg 682 which are in turn interconnected to printheads supply ports eg. 687 for the flow of ink to print-head 44 in accordance with requirements.

The "media" 611 utilised to form the roll can comprise many different materials on which it is designed to print suitable images. For example, opaque rollable plastic material may be utilized, transparencies may be used by using transparent plastic sheets, metallic printing can take place via utilization of a metallic sheet film. Further, fabrics could be utilised within the printer roll 42 for printing images on fabric, although care must be taken that only fabrics having a suitable stiffness or suitable backing material are utilised.

When the print media is plastic, it can be coated with a layer which fixes and absorbs the ink. Further, several types of print media may be used, for example, opaque white matte, opaque white gloss, transparent film, frosted transparent film, lenticular array film for stereoscopic 3D prints, metallised film, film with the embossed optical variable devices such as gratings or holograms, media which is pre-printed on the reverse side, and media which includes a magnetic recording layer. When utilising a metallic foil, the metallic foil can have a polymer base, coated with a thin (several micron) evaporated layer of aluminum or other metal and then coated with a clear protective layer adapted to receive the ink via the ink printer mechanism.

In use the print roll 42 is obviously designed to be inserted inside a camera device so as to provide ink and paper for the printing of images on demand. The ink output ports 635–637 meet with corresponding ports within the camera device and the pinch rollers 672, 673 are operated to allow the supply of paper to the camera device under the control of the camera device.

As illustrated in FIG. 164, a mounted silicon chip 53 is insert in one end of the print roll 42. In FIG. 165 the authentication chip 53 is shown in more detail and includes four communications leads 680–683 for communicating details from the chip 53 to the corresponding camera to which it is inserted.

Turning to FIG. 165, the chip can be separately created by means of encasing a small integrated circuit 687 in epoxy and running bonding leads eg. 688 to the external communications leads 680–683. The integrated chip 687 being approximately 400 microns square with a 100 micron scribe boundary. Subsequently, the chip can be glued to an appropriate surface of the cavity of the print roll 42. In FIG. 166, there is illustrated the integrated circuit 687 interconnected to bonding pads 681, 682 in an exploded view of the arrangement of FIG. 165.

Authentication Chip

Authentication Chips 53

The authentication chip 53 of the preferred embodiment is responsible for ensuring that only correctly manufactured print rolls are utilized in the camera system. The authentication chip 53 utilizes technologies that are generally valuable when utilized with any consumables and are not restricted to print roll system. Manufacturers of other systems that require consumables (such as a laser printer that requires toner cartridges) have struggled with the problem of authenticating consumables, to varying levels of success. Most have resorted to specialized packaging. However this does not stop home refill operations or clone manufacture. The prevention of copying is important to prevent poorly manufactured substitute consumables from damaging the base system. For example, poorly filtered ink may clog print nozzles in an ink jet printer, causing the consumer to blame the system manufacturer and not admit the use of non-authorized consumables.

To solve the authentication problem, the Authentication chip 53 contains an authentication code and circuit specially designed to prevent copying. The chip is manufactured using the standard Flash memory manufacturing process, and is low cost enough to be included in consumables such as ink and toner cartridges. Once programmed, the Authentication chips as described here are compliant with the NSA export guidelines. Authentication is an extremely large and constantly growing field. Here we are concerned with authenticating consumables only.

Symbolic Nomenclature

The following symbolic nomenclature is used throughout the discussion of this embodiment:

| Symbolic Nomenclature | Description |
|---|---|
| F[X] | Function F, taking a single parameter X |
| F[X, Y] | Function F, taking two parameters, X and Y |
| X \| Y | X concatenated with Y |
| X ∧ Y | Bitwise X AND Y |
| X ∨ Y | Bitwise X OR Y (inclusive-OR) |
| X ⊕ Y | Bitwise X XOR Y (exclusive-OR) |
| ~X | Bitwise NOT X (complement) |
| X ← Y | X is assigned the value Y |
| X ← {Y, Z} | The domain of assignment inputs to X is Y and Z. |
| X = Y | X is equal to Y |
| X ≠ Y | X is not equal to Y |
| ⇓ X | Decrement X by 1 (floor 0) |
| ⇑ X | Increment X by 1 (with wrapping based on register length) |
| Erase X | Erase Flash memory register X |
| SetBits[X, Y] | Set the bits of the Flash memory register X based on Y |
| Z ← ShiftRight[X, Y] | Shift register X right one bit position, taking input bit from Y and placing the output bit in Z |

Basic Terms

A message, denoted by M, is plaintext. The process of transforming M into cyphertext C, where the substance of M is hidden, is called encryption. The process of transforming C back into M is called decryption. Referring to the encryption function as E, and the decryption function as D, we have the following identities:

$$E[M]=C$$

$$D[C]=M$$

Therefore the following identity is true:

$$D[E[M]]=M$$

Symmetric Cryptography

A symmetric encryption algorithm is one where:

the encryption function E relies on key $K_1$, the decryption function D relies on key $K_2$, $K_2$ can be derived from $K_1$, and $K_1$ can be derived from $K_2$.

In most symmetric algorithms, $K_1$ usually equals $K_2$. However, even if $K_1$ does not equal $K_2$, given that one key can be derived from the other, a single key K can suffice for the mathematical definition. Thus:

$$E_K[M]=C$$

$$D_K[C]=M$$

An enormous variety of symmetric algorithms exist, from the textbooks of ancient history through to sophisticated modern algorithms. Many of these are insecure, in that modern cryptanalysis techniques can successfully attack the algorithm to the extent that K can be derived. The security of the particular symmetric algorithm is normally a function of two things: the strength of the algorithm and the length of the key. The following algorithms include suitable aspects for utilization in the authentication chip.

DES

Blowfish

RC5

IDEA

DES

DES (Data Encryption Standard) is a US and international standard, where the same key is used to encrypt and decrypt.

The key length is 56 bits. It has been implemented in hardware and software, although the original design was for hardware only. The original algorithm used in DES is described in U.S. Pat. No. 3,962,539. A variant of DES, called triple-DES is more secure, but requires 3 keys: $K_1$, $K_2$, and $K_3$. The keys are used in the following manner:

$$E_{K3}[D_{K2}[E_{K1}[M]]]=C$$

$$D_{K3}[E_{K2}[D_{K1}[C]]]=M$$

The main advantage of triple-DES is that existing DES implementations can be used to give more security than single key DES. Specifically, triple-DES gives protection of equivalent key length of 112 bits. Triple-DES does not give the equivalent protection of a 168-bit key (3×56) as one might naively expect. Equipment that performs triple-DES decoding and/or encoding cannot be exported from the United States.

Blowfish

Blowfish, is a symmetric block cipher first presented by Schneier in 1994. It takes a variable length key, from 32 bits to 448 bits. In addition, it is much faster than DES. The Blowfish algorithm consists of two parts: a key-expansion part and a data-encryption part. Key expansion converts a key of at most 448 bits into several subkey arrays totaling 4168 bytes. Data encryption occurs via a 16-round Feistel network. All operations are XORs and additions on 32-bit words, with four index array lookups per round. It should be noted that decryption is the same as encryption except that the subkey arrays are used in the reverse order. Complexity of implementation is therefore reduced compared to other algorithms that do not have such symmetry.

RC5

Designed by Ron Rivest in 1995, RC5 has a variable block size, key size, and number of rounds. Typically, however, it uses a 64-bit block size and a 128-bit key. The RC5 algorithm consists of two parts: a key-expansion part and a data-encryption part. Key expansion converts a key into $2r+2$ subkeys (where r=the number of rounds), each subkey being w bits. For a 64-bit blocksize with 16 rounds (w=32, r=16), the subkey arrays total 136 bytes. Data encryption uses addition mod $2^w$, XOR and bitwise rotation.

IDEA

Developed in 1990 by Lai and Massey, the first incarnation of the IDEA cipher was called PES. After differential cryptanalysis was discovered by Biham and Shamir in 1991, the algorithm was strengthened, with the result being published in 1992 as IDEA. IDEA uses 128 bit-keys to operate on 64-bit plaintext blocks. The same algorithm is used for encryption and decryption. It is generally regarded to be the most secure block algorithm available today. It is described in U.S. Pat. No. 5,214,703, issued in 1993.

Asymmetric Cryptography

As alternative an asymmetric algorithm could be used. An asymmetric encryption algorithm is one where:

the encryption function E relies on key $K_1$, the decryption function D relies on key $K_2$, $K_2$ cannot be derived from $K_1$ in a reasonable amount of time, and $K_1$ cannot be derived from $K_2$ in a reasonable amount of time.

Thus:

$$E_{K1}[M]=C$$

$$D_{K2}[C]=M$$

These algorithms are also called public-key because one key $K_1$ can be made public. Thus anyone can encrypt a message (using $K_1$), but only the person with the corresponding decryption key ($K_2$) can decrypt and thus read the message. In most cases, the following identity also holds:

$$E_{K2}[M]=C$$

$$D_{K1}[C]=M$$

This identity is very important because it implies that anyone with the public key $K_1$ can see M and know that it came from the owner of $K_2$. No-one else could have generated C because to do so would imply knowledge of $K_2$. The property of not being able to derive $K_1$ from $K_2$ and vice versa in a reasonable time is of course clouded by the concept of reasonable time. What has been demonstrated time after time, is that a calculation that was thought to require a long time has been made possible by the introduction of faster computers, new algorithms etc. The security of asymmetric algorithms is based on the difficulty of one of two problems: factoring large numbers (more specifically large numbers that are the product of two large primes), and the difficulty of calculating discrete logarithms in a finite field. Factoring large numbers is conjectured to be a hard problem given today's understanding of mathematics. The problem however, is that factoring is getting easier much faster than anticipated. Ron Rivest in 1977 said that factoring a 125-digit number would take 40 quadrillion years. In 1994 a 129-digit number was factored. According to Schneier, you need a 1024-bit number to get the level of security today that you got from a 512-bit number in the 1980's. If the key is to last for some years then 1024 bits may not even be enough. Rivest revised his key length estimates in 1990: he suggests 1628 bits for high security lasting until 2005, and 1884 bits for high security lasting until 2015. By contrast, Schneier suggests 2048 bits are required in order to protect against corporations and governments until 2015.

A number of public key cryptographic algorithms exist. Most are impractical to implement, and many generate a very large C for a given M or require enormous keys. Still others, while secure, are far too slow to be practical for several years. Because of this, many public-key systems are hybrid—a public key mechanism is used to transmit a symmetric session key, and then the session key is used for the actual messages. All of the algorithms have a problem in terms of key selection. A random number is simply not secure enough. The two large primes p and q must be chosen carefully—there are certain weak combinations that can be factored more easily (some of the weak keys can be tested for). But nonetheless, key selection is not a simple matter of randomly selecting 1024 bits for example. Consequently the key selection process must also be secure. of the practical algorithms in use under public scrutiny, the following may be suitable for utilization:

RSA

DSA

ElGamal

RSA

The RSA cryptosystem, named after Rivest, Shamir, and Adleman, is the most widely used public-key cryptosystem, and is a de facto standard in much of the world. The security of RSA is conjectured to depend on the difficulty of factoring large numbers that are the product of two primes (p and q). There are a number of restrictions on the generation of p and q. They should both be large, with a similar number of bits, yet not be close to one another (otherwise pq≈√pq). In addition, many authors have suggested that p and q should be strong primes. The RSA algorithm patent was issued in 1983 (U.S. Pat. No. 4,405,829).

DSA

DSA (Digital Signature Standard) is an algorithm designed as part of the Digital Signature Standard (DSS). As defined, it cannot be used for generalized encryption. In addition, compared to RSA, DSA is 10 to 40 times slower for signature verification. DSA explicitly uses the SHA-1 hashing algorithm (see definition in One-way Functions below). DSA key generation relies on finding two primes p and q such that q divides p−1. According to Schneier, a 1024-bit p value is required for long term DSA security. However the DSA standard does not permit values of p larger than 1024 bits (p must also be a multiple of 64 bits) The US Government owns the DSA algorithm and has at least one relevant patent (U.S. Pat. No. 5,231,688 granted in 1993).

ElGamal

The ElGamal scheme is used for both encryption and digital signatures. The security is based on the difficulty of calculating discrete logarithms in a finite field. Key selection involves the selection of a prime p, and two random numbers g and x such that both g and x are less than p. Then calculate y=gx mod p. The public key is y, g, and p. The private key is x.

Cryptographic Challenge-Response Protocols and Zero Knowledge Proofs

The general principle of a challenge-response protocol is to provide identity authentication adapted to a camera system. The simplest form of challenge-response takes the form of a secret password. A asks B for the secret password, and if B responds with the correct password, A declares B authentic. There are three main problems with this kind of simplistic protocol. Firstly, once B has given out the password, any observer C will know what the password is. Secondly, A must know the password in order to verify it. Thirdly, if C impersonates A, then B will give the password to C (thinking C was A), thus compromising B. Using a copyright text (such as a haiku) is a weaker alternative as we are assuming that anyone is able to copy the password (for example in a country where intellectual property is not respected). The idea of cryptographic challenge-response protocols is that one entity (the claimant) proves its identity to another (the verifier) by demonstrating knowledge of a secret known to be associated with that entity, without revealing the secret itself to the verifier during the protocol. In the generalized case of cryptographic challenge-response protocols, with some schemes the verifier knows the secret, while in others the secret is not even known by the verifier. Since the discussion of this embodiment specifically concerns Authentication, the actual cryptographic challenge-response protocols used for authentication are detailed in the appropriate sections. However the concept of Zero Knowledge Proofs will be discussed here. The Zero Knowledge Proof protocol, first described by Feige, Fiat and Shamir is extensively used in Smart Cards for the purpose of authentication. The protocol's effectiveness is based on the assumption that it is computationally infeasible to compute square roots modulo a large composite integer with unknown factorization. This is provably equivalent to the assumption that factoring large integers is difficult. It should be noted that there is no need for the claimant to have significant computing power. Smart cards implement this kind of authentication using only a few modular multiplications. The Zero Knowledge Proof protocol is described in U.S. Pat. No. 4,748,668.

One-way Functions

A one-way function F operates on an input X, and returns F[X] such that X cannot be determined from F[X]. When there is no restriction on the format of X, and F[X] contains fewer bits than X, then collisions must exist. A collision is defined as two different X input values producing the same F[X] value—i.e. $X_1$ and $X_2$ exist such that $X_1 \neq X_2$ yet $F[X_1]=F[X_2]$. When X contains more bits than F[X], the input must be compressed in some way to create the output. In many cases, X is broken into blocks of a particular size, and compressed over a number of rounds, with the output of one round being the input to the next. The output of the hash function is the last output once X has been consumed. A pseudo-collision of the compression function CF is defined as two different initial values $V_1$ and $V_2$ and two inputs $X_1$ and $X_2$ (possibly identical) are given such that $CF(V_1, X_1)=CF(V_2, X_2)$. Note that the existence of a pseudo-collision does not mean that it is easy to compute an $X_2$ for a given $X_1$.

We are only interested in one-way functions that are fast to compute. In addition, we are only interested in deterministic one-way functions that are repeatable in different implementations. Consider an example F where F[X] is the time between calls to F. For. a given F[X] X cannot be determined because X is not even used by F. However the output from F will be different for different implementations. This kind of F is therefore not of interest.

In the scope of the discussion of the implementation of the authentication chip of this embodiment, we are interested in the following forms of one-way functions:

Encryption using an unknown key

Random number sequences

Hash Functions

Message Authentication Codes

Encryption Using an Unknown Key

When a message is encrypted using an unknown key K, the encryption function E is effectively one-way. Without the key, it is computationally infeasible to obtain M from $E_K[M]$ without K. An encryption function is only one-way for as long as the key remains hidden. An encryption algorithm does not create collisions, since E creates $E_K[M]$ such that it is possible to reconstruct M using function D. Consequently F[X] contains at least as many bits as X (no information is lost) if the one-way function F is E. Symmetric encryption algorithms (see above) have the advantage over Asymmetric algorithms for producing one-way functions based on encryption for the following reasons:

The key for a given strength encryption algorithm is shorter for a symmetric algorithm than an asymmetric algorithm Symmetric algorithms are faster to compute and require less software/silicon The selection of a good key depends on the encryption algorithm chosen. Certain keys are not strong for particular encryption algorithms, so any key needs to be tested for strength. The more tests that need to be performed for key selection, the less likely the key will remain hidden.

Random Number Sequences

Consider a random number sequence $R_0, R_1, \ldots, R_i, R_{i+1}$. We define the one-way function F such that F[X] returns the $X^{th}$ random number in the random sequence. However we must ensure that F[X] is repeatable for a given X on different implementations. The random number sequence therefore cannot be truly random. Instead, it must be pseudo-random, with the generator making use of a specific seed.

There are a large number of issues concerned with defining good random number generators. Knuth, describes what makes a generator "good" (including statistical tests), and the general problems associated with constructing them. The majority of random number generators produce the ith random number from the $i-1^{th}$ state—the only way to determine the $i^{th}$ number is to iterate from the $0^{th}$ number to the $i^{th}$. If i is large, it may not be practical to wait for-i iterations. However there is a type of random number generator that does allow random access. Blum, Blum and Shub define the ideal generator as follows: " . . . we would like a pseudo-random sequence generator to quickly produce, from short seeds, long sequences (of bits) that appear in every way to be generated by successive flips of a fair coin". They defined the $x^2$ mod n generator, more commonly referred to as the BBS generator. They showed that given certain assumptions upon which modern cryptography relies, a BBS generator passes extremely stringent statistical tests. The BBS generator relies on selecting n which is a Blum integer (n=pq where p and q are large prime numbers, p≠q, p mod 4=3, and q mod 4=3). The initial state of the generator is given by $x_0$ where $x_0=x^2$ mod n, and x is a random integer relatively prime to n. The $i^{th}$ pseudo-random bit is the least significant bit of $x_i$ where $x_i=x_{i-1}^2$ mod n. As an extra property, knowledge of p and q allows a direct calculation of the $i^{th}$ number in the sequence as follows: $x_i=x_0^y$ mod n, where $y=2^i$ mod $((p-1)(q-1))$ Without knowledge of p and q, the generator must iterate (the security of calculation relies on the difficulty of factoring large numbers). When first defined, the primary problem with the BBS generator was the amount of work required for a single output bit. The algorithm was considered too slow for most applications. However the advent of Montgomery reduction arithmetic has given rise to more practical implementations. In addition, Vazirani and Vazirani have shown that depending on the size of n, more bits can safely be taken from $x_i$ without compromising the security of the generator. Assuming we only take 1 bit per $x_i$, N bits (and hence N iterations of the bit generator function) are needed in order to generate an N-bit random number. To the outside. observer, given a particular set of bits, there is no way to determine the next bit other than a 50/50 probability. If the x, p and q are hidden, they act as a key, and it is computationally unfeasible to take an output bit stream and compute x, p, and q. It is also computationally unfeasible to determine the value of i used to generate a given set of pseudo-random bits. This last feature makes the generator one-way. Different values of i can produce identical bit sequences of a given length (e.g. 32 bits of random bits). Even if x, p and q are known, for a given F[i], i can only be derived as a set of possibilities, not as a certain value (of course if the domain of i is known, then the set of possibilities is reduced further). However, there are problems in selecting a good p and q, and a good seed x. In particular, Ritter describes a problem in selecting x. The nature of the problem is that a BBS generator does not create a single cycle of known length. Instead, it creates cycles of various lengths, including degenerate (zero-length) cycles. Thus a BBS generator cannot be initialized with a random state—it might be on a short cycle.

Hash Functions

Special one-way functions, known as Hash functions map arbitrary length messages to fixed-length hash values. Hash functions are referred to as H[M]. Since the input is arbitrary length, a hash function has a compression component in order to produce a fixed length output. Hash functions also have an obfuscation component in order to make it difficult to find collisions and to determine information about M from H[M]. Because collisions do exist, most applications require that the hash algorithm is preimage resistant, in that for a given $X_1$ it is difficult to find $X_2$ such that $H[X_1]=H[X_2]$. In addition, most applications also require the hash algorithm to be collision resistant (i.e. it should be hard to find two messages $X_1$ and $X_2$ such that $H[X_1]=H[X_2]$). It is an open problem whether a collision-resistant hash function, in the idealist sense, can exist at all. The primary application for hash functions is in the reduction of an input message into a digital "fingerprint" before the application of a digital signature algorithm. One problem of collisions with digital signatures can be seen in the following example.

A has a long message $M_1$ that says "I owe B $10". A signs $H[M_1]$ using his private key. B, being greedy, then searches for a collision message $M_2$ where $H[M_2]=H[M_1]$ but where $M_2$ is favorable to B, for example "I owe B $1 million". Clearly it is in A's interest to ensure that it is difficult to find such an $M_2$.

Examples of collision resistant one-way hash functions are SHA-1, MD5 and RIPEMD-160, all derived from MD4.

MD4

Ron Rivest introduced MD4 in 1990. It is mentioned here because all other one-way hash functions are derived in some way from MD4. MD4 is now considered completely broken in that collisions can be calculated instead of searched for. In the example above, B could trivially generate a substitute message $M_2$ with the same hash value as the original message $M_1$.

MD5

Ron Rivest introduced MD5 in 1991 as a more secure MD4. Like MD4, MD5 produces a 128-bit hash value. Dobbertin describes the status of MD5 after recent attacks. He describes how pseudo-collisions have been found in MD5, indicating a weakness in the compression function, and more recently, collisions have been found. This means that MD5 should not be used for compression in digital signature schemes where the. existence of collisions may have dire consequences. However MD5 can still be used as a one-way function. In addition, the HMAC-MD5 construct is not affected by these recent attacks.

SHA-1

SHA-1 is very similar to MD5, but has a 160-bit hash value (MD5 only has 128 bits of hash value). SHA-1 was designed and introduced by the NIST and NSA for use in the Digital Signature Standard (DSS). The original published description was called SHA, but very soon afterwards, was revised to become SHA-1, supposedly to correct a security flaw in SHA (although the NSA has not released the mathematical reasoning behind the change). There are no known cryptographic attacks against SHA-1. It is also more resistant to brute-force attacks than MD4 or MD5 simply because of the longer hash result. The US Government owns the SHA-1 and DSA algorithms (a digital signature authentication algorithm defined as part of DSS) and has at least one relevant patent (U.S. Pat. No. 5,231,688 granted in 1993).

RIPEMD-160

RIPEMD-160 is a hash function derived from its predecessor RIPEMD (developed for the European Community's RIPE project in 1992). As its name suggests, RIPEMD-160 produces a 160-bit hash result. Tuned for software implementations on 32-bit architectures, RIPEMD-160 is intended to provide a high level of security for 10 years or more. Although there have been no successful attacks on RIPEMD-160, it is comparatively new and has not been extensively cryptanalyzed. The original RIPEMD algorithm was specifically designed to resist known cryptographic attacks on MD4. The recent attacks on MD5 showed similar weaknesses in the RIPEMD 128-bit hash function. Although the attacks showed only theoretical weaknesses, Dobbertin, Preneel and Bosselaers further strengthened RIPEMD into a new algorithm RIPEMD-160.

Message Authentication Codes

The problem of message authentication can be summed up as follows:

How can A be sure that a message supposedly from B is in fact from B?

Message authentication is different from entity authentication. With entity authentication, one entity (the claimant) proves its identity to another (the verifier). With message authentication, we are concerned with making sure that a given message is from who we think it is from i.e. it has not been tampered en route from the source to its destination. A one-way hash function is not sufficient protection for a message. Hash functions such as MD5 rely on generating a hash value that. is representative of the original input, and the original input cannot be derived from the hash value. A simple attack by E, who is in-between A and B, is to intercept the message from B, and substitute his own. Even if A also sends a hash of the original message, E can. simply substitute the hash of his new message. Using a one-way hash function alone, A has no way of knowing that B's message has been changed. One solution to the problem of message authentication is the Message Authentication Code, or MAC. When B sends message M, it also sends MAC[M] so that the receiver will know that M is actually from B. For this to be possible, only B must be able to produce a MAC of M, and in addition, A should be able to verify M against MAC[M]. Notice that this is different from encryption of M—MACs are useful when M does not have to be secret. The simplest method of constructing a MAC from a hash function is to encrypt the hash value with a symmetric-algorithm:

Hash the input message H[M]

Encrypt the hash $E_K[H[M]]$

This is more secure than first encrypting the message and then hashing the encrypted message. Any symmetric or asymmetric cryptographic function can be used. However, there are advantages to using a key-dependant one-way hash function instead of techniques that use encryption (such as that shown above):

Speed, because one-way hash functions in general work much faster than encryption;

Message size, because $E_K[H[M]]$ is at least the same size as M, while H[M] is a fixed size (usually considerably smaller than M);

Hardware/software requirements—keyed one-way hash functions are typically far less complexity than their encryption-based counterparts; and One-way hash function implementations are not considered to be encryption or decryption devices and therefore are not subject to US export controls.

It should be noted that hash functions were never originally designed to contain a key or to support message authentication. As a result, some ad hoc methods of using hash functions to perform message authentication, including various functions that concatenate messages with secret prefixes, suffixes, or both have been proposed. Most of these ad hoc methods have been successfully attacked by sophisticated means. Additional MACs have been suggested based on XOR schemes and Toeplitz matricies (including the special case of LFSR-based constructions).

HMAC

The HMAC construction in particular is gaining acceptance as a solution for Internet message authentication security protocols. The HMAC construction acts as a wrapper, using the underlying hash function in a black-box way. Replacement of the hash function is straightforward if desired due to security or performance reasons. However, the major advantage of the HMAC construct is that it can be proven secure provided the underlying hash function has some reasonable cryptographic strengths÷that is, HMAC's strengths are directly connected to the strength of the hash function. Since the HMAC construct is a wrapper, any iterative hash function can be used in an HMAC. Examples include HMAC-MD5, HMAC-SHA1, HMAC-RIPEMD160 etc.

Given the following definitions:

H=the hash function (e.g. MD5 or SHA-1)

n=number of bits output from H (e.g. 160 for SHA-1, 128 bits for MD5)

M=the data to which the MAC function is to be applied

K=the secret key shared by the two parties ipad=0x36 repeated 64 times opad=0x5C repeated 64 times The HMAC algorithm is as follows:

Extend K to 64 bytes by appending 0x00 bytes to the end of K

XOR the 64 byte string created in (1) with ipad

Append data stream M to the 64 byte string created in (2)

Apply H to the stream generated in (3)

XOR the 64 byte string created in (1) with opad

Append the H result from (4) to the 64 byte string resulting from (5)

Apply H to the output of (6) and output the result

Thus:

$$HMAC[M]=H[(K \oplus opad)|H[(K \oplus ipad)|M]]$$

The recommended key length is at least n bits, although it should not be longer than 64 bytes (the length of the hashing block). A key longer than n bits does not add to the security of the function. HMAC optionally allows truncation of the final output e.g. truncation to 128 bits from 160 bits. The HMAC designers' Request for Comments was issued in 1997, one year after the algorithm was first introduced. The designers claimed that the strongest known attack against HMAC is based on the frequency of collisions for the hash function H and is totally impractical for minimally reasonable hash functions. More recently, HMAC protocols with replay prevention components have been defined in order to prevent the capture and replay of any M, HMAC[M] combination within a given time period.

Random Numbers and Time Varying Messages

The use of a random number generator as a one-way function has already been examined. However, random number generator theory is very much intertwined with cryptography, security, and authentication. There are a large number of issues concerned with defining good random number generators. Knuth, describes what makes a generator good (including statistical tests), and the general problems associated with constructing them. One of the uses for random numbers is to ensure that messages vary over time. Consider a system where A encrypts commands and sends them to B. If the encryption algorithm produces the same output for a given input, an attacker could simply record the messages and play them back to fool B. There is no need for the attacker to crack the encryption mechanism other than to know which message to play to B (while pretending to be A). Consequently messages often include a random number and a time stamp to ensure that the message (and hence its encrypted counterpart) varies each time. Random number generators are also often used to generate keys. It is therefore best to say at the moment, that all generators are insecure for this purpose. For example, the Berlekamp-Massey algorithm, is a classic attack on an LFSR random number generator. If the LFSR is of length n, then only 2n bits of the sequence suffice to determine the LFSR, compromising the key generator. If, however, the only role of the random number generator is to make sure that messages vary over time, the security of the generator and seed is not as important as it is for session key generation. If however, the random number seed generator is compromised, and an attacker is able to calculate future "random" numbers, it can leave some protocols open to attack. Any new protocol should be examined with respect to this situation. The actual type of random number generator required will depend upon the implementation and the purposes for which the generator is used. Generators include Blum, Blum, and Shub, stream ciphers such as RC4 by Ron Rivest, hash functions such as SHA-1 and RIPEMD-160, and traditional-generators such LFSRs (Linear Feedback Shift Registers) and their more recent counterpart FCSRs (Feedback with Carry Shift Registers).

Attacks

This section describes the various types of attacks that can be undertaken to break an authentication cryptosystem such as the authentication chip. The attacks are grouped into physical and logical attacks. Physical attacks describe methods for breaking a physical implementation of a cryptosystem (for example, breaking open a chip to retrieve the key), while logical attacks involve attacks on the cryptosystem that are implementation independent. Logical types of attack work on the protocols or algorithms, and attempt to do one of three things:

Bypass the authentication process altogether

Obtain the secret key by force or deduction, so that any question can be answered Find enough about the nature of the authenticating questions and answers in order to, without the key, give the right answer to each question.

The attack styles and the forms they take are detailed below. Regardless of the algorithms and protocol used by a security chip, the circuitry of the authentication part of the chip can come under physical attack. Physical attack comes in four main ways, although the form of the attack can vary:

Bypassing the Authentication Chip altogether

Physical examination of chip while in operation (destructive and non-destructive)

Physical decomposition of chip

Physical alteration of chip

The attack styles and the forms they take are detailed below. This section does not suggest solutions to these attacks. It merely describes each attack type. The examination is restricted to the context of an Authentication chip 53 (as opposed to some other kind of system, such as Internet authentication) attached to some System.

Logical Attacks

These attacks are those which do not depend on the physical implementation of the cryptosystem. They work against the protocols and the security of the algorithms and random number generators.

Ciphertext Only Attack

This is where an attacker has one or more encrypted messages, all encrypted using the same algorithm. The aim of the attacker is to obtain the plaintext messages from the encrypted messages. Ideally, the key can be recovered so that all messages in the future can also be recovered.

Known Plaintext Attack

This is where an attacker has both the plaintext and the encrypted form of the plaintext. In the case of an Authentication Chip, a known-plaintext attack is one where the attacker can see the data flow between the System and the Authentication Chip. The inputs and outputs are observed (not chosen by the attacker), and can be analyzed for weaknesses (such as birthday attacks or by a search for differentially interesting input/output pairs). A known plaintext attack is a weaker type of attack than the chosen plaintext attack, since the attacker can only observe the data flow. A known plaintext attack can be carried out by connecting a logic analyzer to the connection between the System and the Authentication Chip.

Chosen Plaintext Attacks

A chosen plaintext attack describes one where a cryptanalyst has the ability to send any chosen message to the cryptosystem, and observe the response. If the cryptanalyst knows the algorithm, there may be a relationship between inputs and outputs that can be exploited by feeding a specific output to the input of another function. On a system using an embedded Authentication Chip, it is generally very difficult to prevent chosen plaintext attacks since the cryptanalyst can logically pretend he/she is the System, and thus send any chosen bit-pattern streams to the Authentication Chip.

Adaptive Chosen Plaintext Attacks

This type of attack is similar to the chosen plaintext attacks except that the attacker has the added ability to modify subsequent chosen plaintexts based upon the results of previous experiments. This is certainly the case with any System/Authentication Chip scenario described when utilized for consumables such as photocopiers and toner cartridges, especially since both Systems and Consumables are made available to the public.

Brute Force Attack

A guaranteed way to break any key-based cryptosystem algorithm is simply to try every key. Eventually the right one will be found. This is known as a Brute Force Attack. However, the more key possibilities there are, the more keys must be tried, and hence the longer it takes (on average) to find the right one. If there are N keys, it will take a maximum of N tries. If the key is N bits long, it will take a maximum of $2^N$ tries, with a 50% chance of finding the key after only half the attempts ($2^{N-1}$). The longer N becomes, the longer it will take to find the key, and hence the more secure the key is. Of course, an attack may guess the key on the first try, but this is more unlikely the longer the key is. Consider a key length of 56 bits. In the worst case, all $2^{56}$ tests ($7.2 \times 10^{16}$ tests). must be made to find the key. In 1977, Diffie and Hellman described a specialized machine for cracking DES, consisting of one million processors, each capable of running one million tests per second. Such a machine would take 20 hours to break any DES code. Consider a key length of 128 bits. In the worst case, all $2^{128}$ tests ($3.4 \times 10^{38}$ tests) must be made to find the key. This would take ten billion years on an array of a trillion processors each running 1 billion tests per second. With a long enough key length, a Brute Force Attack takes too long to be worth the attacker's efforts.

Guessing Attack

This type of attack is where an attacker attempts to simply "guess" the key. As an attack it is identical to the Brute force attack, where the odds of success depend on the length of the key.

Quantum Computer Attack

To break an n-bit key, a quantum computer (NMR, Optical, or Caged Atom) containing n qubits embedded in an appropriate algorithm must be built. The quantum computer effectively exists in $2^n$ simultaneous coherent states. The trick is to extract the right coherent state without causing any decoherence. To date this has been achieved with a 2 qubit system (which exists in 4 coherent states). It is thought possible to extend this to 6 qubits (with 64 simultaneous coherent states) within a few years.

Unfortunately, every additional qubit halves the relative strength of the signal representing the key. This rapidly becomes a serious impediment to key retrieval, especially with the long keys used in cryptographically secure systems. As a result, attacks on a cryptographically secure key (e.g. 160 bits) using a Quantum Computer are likely not to be feasible and it is extremely unlikely that quantum computers will have achieved more than 50 or so qubits within the commercial lifetime of the Authentication Chips. Even using a 50 qubit quantum computer, $2^{110}$ tests are required to crack a 160 bit key.

Purposeful Error Attack

With certain algorithms, attackers can gather valuable information from the results of a bad input. This can range from the error message text to the time taken for the error to be generated. A simple example is that of a userid/password scheme. If the error message usually says "Bad userid", then when an attacker gets a message saying "Bad password" instead, then they know that the userid is correct. If the message always says "Bad userid/password" then much less information is given to the attacker. A more complex example is that of the recent published method of cracking encryption codes from secure web sites. The attack involves sending particular messages to a server and observing the error message responses. The responses give enough information to learn the keys—even the lack of a response gives some information. An example of algorithmic time can be seen with an algorithm that returns an error as soon as an erroneous bit is detected in the input message. Depending on hardware implementation, it may be a simple method for the attacker to time the response and alter each bit one by one depending on the time taken for the error response, and thus obtain the key. Certainly in a chip implementation the time taken can be observed with far greater accuracy than over the Internet.

Birthday Attack

This attack is named after the famous "birthday paradox" (which is not actually a paradox at all). The odds of one person sharing a birthday with another, is 1 in 365 (not counting leap years). Therefore there must be 183 people in a room for the odds to be more than 50% that one of them shares your birthday. However, there only needs to be 23 people in a room for there to be more than a 50% chance that any two share a birthday. This is because 23 people yields 253 different pairs. Birthday attacks are common attacks against hashing algorithms, especially those algorithms that combine hashing with digital signatures. If a message has been generated and already signed, an attacker must search for a collision message that hashes to the same value (analogous to finding one person who shares your birthday). However, if the attacker can generate the message, the Birthday Attack comes into play. The attacker searches for two messages that share the same hash value (analogous to any two people sharing a birthday), only one message is acceptable to the person signing it, and the other is beneficial for the attacker. Once the person has signed the original message the attacker simply claims now that the person signed the alternative message—mathematically there is no way to tell which message was the original, since they both hash to the same value. Assuming a Brute Force Attack is the only way to determine a match, the weakening of an n-bit key by the birthday attack is $2^{n/2}$. A key length of 128 bits that is susceptible to the birthday attack has an effective length of only 64 bits.

Chaining Attack

These are attacks made against the chaining nature of hash functions. They focus on the compression function of a hash function. The idea is based on the fact that a hash function generally takes arbitrary length input and produces a constant length output by processing the input n bits at a time. The output from one block is used as the chaining variable set into the next block. Rather. than finding a collision against an entire input, the idea is that given an input chaining variable set, to find a substitute block that will result in the same output chaining variables as the proper message. The number of choices for a particular block is based on the length of the block. If the chaining variable is c bits, the hashing function behaves like a random mapping, and the block length is b bits, the number of such b-bit blocks is approximately 2b/2c. The challenge for finding a substitution block is that such blocks are a sparse subset of. all possible blocks. For SHA-1, the number of 512 bit blocks is approximately $2^{512}/2^{160}$, or $2^{352}$. The chance of finding a block by brute force search is about 1 in $2^{160}$.

Substitution with a Complete Lookup Table

If the number of potential messages sent to the chip is small, then there is no need for a clone manufacturer to crack the key. Instead, the clone manufacturer could incorporate a ROM in their chip that had a record of all of the responses from a genuine chip to the codes sent by the system. The larger the key, and the larger the response, the more space is required for such a lookup table.

Substitution with a Sparse Lookup Table

If the messages sent to the chip are somehow predictable, rather than effectively random, then the clone manufacturer need not provide a complete lookup table. For example:

- If the message is simply a serial number, the clone manufacturer need simply provide a lookup table that contains values for past and predicted future serial numbers. There are unlikely to be more than $10^9$ of these.
- If the test code is simply the date, then the clone manufacturer can produce a lookup table using the date as the address.
- If the test code is a pseudo-random number using either the serial number or the date as a seed, then the clone manufacturer just needs to crack the pseudo-random number generator in the System. This is probably not difficult, as they have access to the object code of the System. The clone manufacturer would then produce a content addressable memory (or other sparse array lookup) using these codes to access stored authentication codes.

Differential Cryptanalysis

Differential cryptanalysis describes an attack where pairs of input streams. are generated with known differences, and the differences in the encoded streams are analyzed. Existing differential attacks are heavily dependent on the structure of S boxes, as used in DES and other similar algorithms. Although other algorithms such as HMAC-SHA1 have no S boxes, an attacker can undertake a differential-like attack by undertaking statistical analysis of:

- Minimal-difference inputs, and their corresponding outputs
- Minimal-difference outputs, and their corresponding inputs Most algorithms were strengthened against differential cryptanalysis once the process was described. This is covered in the specific sections devoted to each cryptographic algorithm. However some recent algorithms developed in secret have been broken because the developers had not considered certain styles of differential attacks and did not subject their algorithms to public scrutiny.

Message Substitution Attacks

In certain protocols, a man-in-the-middle can substitute part or all of a message. This is where a real Authentication Chip is plugged into a reusable clone chip within the consumable. The clone chip intercepts all messages between the System and the Authentication Chip, and can perform a number of substitution attacks. Consider a message containing a header followed by content. An attacker may not be able to generate a valid header, but may be able to substitute their own content, especially if the valid response is something along the lines of "Yes, I received your message". Even if the return message is "Yes, I received the following message . . . ", the attacker may be able to substitute the original message before sending the acknowledgement back to the original sender. Message Authentication Codes were developed to combat most message substitution attacks.

Reverse Engineering the Key Generator

If a pseudo-random number generator is used to generate keys, there is the potential for a clone manufacture to obtain the generator program or to deduce the random seed used. This was the way in which the Netscape security program was initially broken.

Bypassing Authentication Altogether

It may be that there are problems in the authentication protocols that can allow a bypass of the authentication process altogether. With these kinds of attacks the key is completely irrelevant, and the attacker has no need to recover it or deduce it. Consider an example of a system that Authenticates at power-up, but does not authenticate at any other time. A reusable consumable with a clone Authentication Chip may make use of a real Authentication, Chip. The clone authentication chip 53 uses the real chip for the authentication call, and then simulates the real Authentication Chip's state data after that. Another example of bypassing authentication is if the System authenticates only after the consumable has been used. A clone Authentication Chip can accomplish a simple authentication bypass by simulating a loss of connection after the use. of the consumable but before the authentication protocol has completed (or even. started). One infamous attack known as the "Kentucky Fried Chip" hack involved replacing a microcontroller chip for a satellite TV system. When a subscriber stopped paying the subscription fee, the system would send out a "disable" message. However the new microcontroller would simply detect this message and not pass it on to the consumer's satellite TV system.

Garrote/bribe Attack

If people know the key, there is the possibility that they could tell someone else. The telling may be due to coercion (bribe, garrote etc), revenge (e.g. a disgruntled employee), or simply for principle. These attacks are usually cheaper and easier than other efforts at deducing the key. As an example, a number of people. claiming to be involved with the development of the Divx standard have recently (May/June 1998) been making noises on a variety of DVD newsgroups to the effect they would like to help develop Divx specific cracking devices out of principle.

Physical Attacks

The following attacks assume implementation of an authentication mechanism in a silicon chip that the attacker has physical access to. The first attack, Reading ROM, describes an attack when keys are stored in ROM, while the remaining attacks assume that a secret key is stored in Flash. memory.

Reading ROM

If a key is stored in ROM it can be read directly. A ROM can thus be safely used to hold a public key (for use in asymmetric cryptography), but not to hold a private key. In symmetric cryptography, a ROM is completely insecure. Using a copyright text (such as a haiku) as the key is not sufficient, because we are assuming that the cloning of the chip is occurring in a country where intellectual property is not respected.

Reverse Engineering of Chip

Reverse engineering of the chip is where an attacker opens the chip and analyzes the circuitry. Once the circuitry has been analyzed the inner workings of the chip's algorithm can be recovered. Lucent Technologies have developed an active method known as TOBIC (Two photon OBIC, where OBIC stands for Optical Beam Induced Current), to image circuits. Developed primarily for static RAM analysis, the process involves removing any back materials, polishing the back surface to a mirror finish, and then focusing light on the surface. The excitation wavelength is specifically chosen not to induce a current in the IC. A Kerckhoffs in the nineteenth century made a fundamental assumption about cryptanalysis: if the algorithm's inner workings are the sole secret of the scheme, the scheme is as good as broken. He stipulated that the secrecy must reside entirely in the key. As a result, the best way to protect against reverse engineering of the chip is to make the inner workings irrelevant.

Usurping the Authentication Process

It must be assumed that any clone manufacturer has access to both the System and consumable designs. If the same channel is used for communication between the System and a trusted System Authentication Chip, and a non-trusted consumable Authentication Chip, it may be possible for the non-trusted chip to interrogate a trusted Authentication Chip in order to obtain the "correct answer". If this is so, a clone manufacturer would not have to determine the key. They would only have to trick the System into using the responses from the System Authentication Chip. The alternative method of usurping the authentication process follows the same method as the logical attack "Bypassing the Authentication Process", involving simulated loss of contact with the System whenever authentication processes take place, simulating power-down etc.

Modification of System

This kind of attack is where the System itself is modified to accept clone consumables. The attack may be a change of System ROM, a rewiring of the consumable, or, taken to the extreme case, a completely clone System. This kind of attack requires each individual System to be modified, and would most likely require the owner's consent. There would usually have to be a clear advantage for the consumer to undertake such a modification, since it would typically void warranty and would most likely be costly. An example of such a modification with a clear advantage to the consumer is a software patch to change fixed-region DVD players into region-free DVD players.

Direct Viewing of Chip Operation by Conventional Probing

If chip operation could be directly viewed using an STM or an electron beam, the keys could be recorded as they are read from the internal non-volatile memory and loaded into work registers. These forms of conventional probing require direct access to the top or front sides of the IC while it is powered.

Direct Viewing of the Non-volatile Memory

If the chip were sliced so that the floating gates of the Flash memory were exposed, without discharging them, then the key could probably be viewed directly using an STM or SKM (Scanning Kelvin Microscope) However, slicing the chip to this level without discharging the gates is probably impossible. Using wet etching, plasma etching, ion milling (focused ion beam etching), or chemical mechanical polishing will almost certainly discharge the small charges present on the floating gates.

Viewing the Light Bursts Caused by State Changes

Whenever a gate changes state, a small amount of infrared energy is emitted. Since silicon is transparent to infrared, these changes can be observed by looking at the circuitry from the underside of a chip. While the emission process is weak, it is bright enough to be detected by highly sensitive equipment developed for use in astronomy. The technique, developed by IBM, is called PICA (Picosecond Imaging Circuit Analyzer). If the state of a register is known at time t, then watching that register change over time will reveal the exact value at time t+n, and if the data is part of the key, then that part is compromised.

Monitoring EMI

Whenever electronic circuitry operates, faint electromagnetic signals are given off. Relatively inexpensive equipment (a few thousand dollars) can monitor these signals. This could give enough information to allow an attacker to deduce the keys.

Viewing $I_{dd}$ Fluctuations

Even if keys cannot be viewed, there is a fluctuation in current whenever registers change state. If there is a high enough signal to noise ratio, an attacker can monitor the difference in $I_{dd}$ that may occur when programming over either a high or a low bit. The change in $I_{dd}$ can reveal information about the key. Attacks such as these have already been used to break smart cards.

Differential Fault Analysis

This attack assumes introduction of a bit error by ionization, microwave radiation, or environmental stress. In most cases such an error is more likely to adversely affect the Chip (eg cause the program code to crash) rather than cause beneficial changes which would reveal the key. Targeted faults such as ROM overwrite, gate destruction etc are far more likely to produce useful results.

Clock Glitch Attacks

Chips are typically designed to properly operate within a certain clock speed range. Some attackers attempt to. introduce faults in logic by running the chip at extremely high clock speeds or introduce a clock glitch at a particular time for a particular duration. The idea is to create race conditions where the circuitry does not function properly. An example could be an AND gate that (because of race conditions) gates through $Input_1$ all the time instead of the AND of $Input_1$ and $Input_2$. If an attacker knows the internal structure of the chip, they can attempt to introduce race conditions at the correct moment in the algorithm execution, thereby revealing information about the key (or in the worst case, the key itself).

Power Supply Attacks

Instead of creating a glitch in the clock signal, attackers can also produce glitches in the power supply where the power is increased or decreased to be outside the working operating voltage range. The net effect is the same as a clock glitch—introduction of error in the execution of a particular instruction. The idea is to stop the CPU from XORing the key, or from shifting the data one bit-position etc. Specific instructions are targeted so that information about the key is revealed.

Overwriting ROM

Single bits in a ROM can be overwritten using a laser cutter microscope, to either 1 or 0 depending on the sense of the logic. With a given opcode/operand set, it may be a simple matter for an attacker to change a conditional jump to a non-conditional jump, or perhaps change the destination of a register transfer. If the target instruction is chosen carefully, it may result in the key being revealed.

Modifying EEPROM/Flash

EEPROM/Flash attacks are similar to ROM attacks except that the laser cutter microscope technique can be used to both set and reset individual bits. This gives much greater scope in terms of modification of algorithms.

Gate Destruction

Anderson and Kuhn described the rump session of the 1997 workshop on Fast Software Encryption, where Biham and Shamir presented an attack on DES. The attack was to use a laser cutter to destroy an individual gate in the hardware implementation of a known block cipher (DES). The net effect of the attack was to force a particular bit of a register to be "stuck". Biham and Shamir described the effect of forcing a particular register to be affected in this way—the least significant bit of the output from the round function is set to 0. Comparing the 6 least significant bits of the left half and the right half can recover several bits of the key. Damaging a number of chips in this way can reveal enough information about the key to make complete key recovery easy. An encryption chip modified in this way will have the property that encryption and decryption will no longer be inverses.

Overwrite Attacks

Instead of trying to read the Flash memory, an attacker may simply set a single bit by use of a laser cutter microscope. Although the attacker doesn't know the previous value, they know the new value. If the chip still works, the bit's original state must be the same as the new state. If the chip doesn't work any longer, the bit's original state must be the logical NOT of the current state. An attacker can perform this attack on each bit of the key and obtain the n-bit key using at most n chips (if the new bit matched the old bit, a new chip is not required for determining the next bit).

Test Circuitry Attack

Most chips contain test circuitry specifically designed to check for manufacturing defects. This includes BIST (Built In Self Test) and scan paths. Quite often the scan paths and test circuitry includes access and readout mechanisms for all the embedded latches. In some cases the test circuitry could potentially be used to give information about the contents of particular registers. Test circuitry is often disabled once the chip has passed all manufacturing tests, in some cases by blowing a specific connection within the chip. A determined attacker, however, can reconnect the test circuitry and hence enable it.

Memory Remanence

Values remain in RAM long after the power has been removed, although they do not remain long enough to be considered non-volatile. An attacker can remove power once sensitive information has been moved into RAM (for example working registers), and then attempt to read the value from RAM. This attack is most useful against security systems that have regular RAM chips. A classic example is where a security system was designed with an automatic power-shut-off that is triggered when the computer case is opened. The attacker was able to simply open the case, remove the RAM chips, and retrieve the key because of memory remanence.

Chip Theft Attack

If there are a number of stages in the lifetime of an Authentication Chip, each of these stages must be examined in terms of ramifications for security should chips be stolen. For example, if information is programmed into the chip in stages, theft of a chip between stages may allow an attacker to have access to key information or reduced efforts for attack. Similarly, if a chip is stolen directly after manufacture but before programming, does it give an attacker any logical or physical advantage?

Requirements

Existing solutions to the problem of authenticating consumables have typically relied on physical patents on packaging. However this does not stop home refill operations or clone manufacture in countries with weak industrial property protection. Consequently a much higher level of protection is required. The authentication mechanism is therefore built into an Authentication chip 53 that allows a system to authenticate a consumable securely and easily. Limiting ourselves to the system authenticating consumables (we don't consider the consumable authenticating the system), two levels of protection can be considered:

Presence Only Authentication

This is where only the presence of an Authentication Chip is tested. The Authentication Chip can be reused in another consumable without being reprogrammed.

Consumable Lifetime Authentication

This is where not only is the presence of the Authentication Chip tested for, but also the Authentication chip 53 must only last the lifetime of the consumable. For the chip to be reused it must be completely erased and reprogrammed. The two levels of protection address different requirements. We are primarily concerned with Consumable Lifetime Authentication in order to prevent cloned versions of high volume consumables. In this case, each chip should hold secure state information about the consumable being authenticated. It should be noted that a Consumable Lifetime Authentication Chip could be used in any situation requiring a Presence Only Authentication Chip. The requirements for authentication, data storage integrity and manufacture should be considered separately. The following sections summarize requirements of each.

Authentication

The authentication requirements for both Presence Only Authentication and Consumable Lifetime Authentication are restricted to case of a system authenticating a consumable. For Presence Only Authentication, we must be assured that an Authentication Chip is physically present. For Consumable Lifetime Authentication we also need to be assured that state data actually came from the Authentication Chip, and that it has not been altered en route. These issues cannot be separated —data that has been altered has a new source, and if the source cannot be determined, the question of alteration cannot be settled. It is not enough to provide an authentication method that is secret, relying on a home-brew security method that has not been scrutinized by security experts. The primary requirement therefore is to provide authentication by means that have withstood the scrutiny of experts. The authentication scheme used by the Authentication chip 53 should be resistant to defeat by logical means. Logical types of attack are extensive, and attempt to do one of three things:

Bypass the authentication process altogether

Obtain the secret key by force or deduction, so that any question can be answered Find enough about the nature of the authenticating questions and answers in order to, without the key, give the right answer to each question.

Data Storage Integrity

Although Authentication protocols take care of ensuring data integrity in communicated messages, data storage integrity is also required. Two kinds of data must be stored within the Authentication Chip:

Authentication data, such as secret keys

Consumable state data, such as serial numbers, and media remaining etc.

The access requirements of these two data types differ greatly. The Authentication chip 53 therefore requires a storage/access control mechanism that allows for the integrity requirements of each type.

Authentication Data

Authentication data must remain confidential. It needs to be stored in the chip during a manufacturing/programming stage of the chip's life, but from then on must not be permitted to leave the chip. It must be resistant to being read from non-volatile memory. The authentication scheme is responsible for ensuring the key cannot be obtained by deduction, and the manufacturing process is responsible for ensuring that the key cannot be obtained by physical means. The size of the authentication data memory area must be large enough to hold the necessary keys and secret information as mandated by the authentication protocols.

Consumable State Data

Each Authentication chip 53 needs to be able to also store 256 bits (32 bytes) of consumable state data. Consumable state data can be divided into the following types. Depending on the application, there will be different numbers of each of these types of data items. A maximum number of 32 bits for a single data item is to be considered.

Read Only

ReadWrite

Decrement Only

Read Only data needs to be stored in the chip during a manufacturing/programming stage of the chip's life, but from then on should not be allowed to change. Examples of Read Only data items are consumable batch numbers and serial numbers.

ReadWrite data is changeable state information, for example, the last time the particular consumable was used. ReadWrite data items can be read and written an unlimited number of times during the lifetime of the consumable. They can be used to store any state information about the consumable. The only requirement for this data is that it needs to be kept in non-volatile memory. Since an attacker can obtain access to a system (which can write to ReadWrite data), any attacker can potentially change data fields of this type. This data type should not be used for secret information, and must be considered insecure.

Decrement Only data is used to count down the availability of consumable resources. A photocopier's toner cartridge, for example, may store the amount of toner remaining as a Decrement Only data item. An ink cartridge for a color printer may store the amount of each ink color as a Decrement Only data item, requiring 3 (one for each of Cyan, Magenta, and Yellow), or even as many as 5 or 6 Decrement Only data items. The requirement for this kind of data item is that once programmed with an initial value at the manufacturing/programming stage, it can only reduce in value. Once it reaches the minimum value, it cannot decrement any further. The Decrement Only data item is only required by Consumable Lifetime Authentication.

Manufacture

The Authentication chip 53 ideally must have a low manufacturing cost in order to be included as the authentication mechanism for low cost consumables. The Authentication chip 53 should use a standard manufacturing process, such as Flash. This is necessary to:

Allow a great range of manufacturing location options

Use well-defined and well-behaved technology

Reduce cost

Regardless of the authentication scheme used, the circuitry of the authentication part of the chip must be resistant to physical attack. Physical attack comes in four main ways, although the form of the attack can vary:

Bypassing the Authentication Chip altogether

Physical examination of chip while in operation (destructive and non-destructive)

Physical decomposition of chip

Physical alteration of chip

Ideally, the chip should be exportable from the U.S., so it should not be possible to use an Authentication chip 53 as a secure encryption device. This is low priority requirement since there are many companies in other countries able to manufacture the Authentication chips. In any case, the export restrictions from the U.S. may change.

Authentication

Existing solutions to the problem of authenticating consumables have typically relied on physical patents on packaging. However this does not stop home refill operations or clone manufacture in countries with weak industrial property protection. Consequently a much higher level of protection is required. It is not enough to provide an authentication method that is secret, relying on a home-brew security method that has not been scrutinized by security experts. Security systems such as Netscape's original proprietary system and the GSM Fraud Prevention Network used by cellular phones are examples where design secrecy caused the vulnerability of the security. Both security systems were broken by conventional means that would have been detected if the companies had followed an open design process. The solution is to provide authentication by means that have withstood the scrutiny of experts. A number of protocols that can be used for consumables authentication. We only use security methods that are publicly described, using known behaviors in this new way. For all protocols, the security of the scheme relies on a secret key, not a secret algorithm. All the protocols rely on a time-variant challenge (i.e. the challenge is different each time), where the response depends on the challenge and the secret. The challenge involves a random number so that any observer will not be able to gather useful information about a subsequent identification. Two protocols are presented for each of Presence Only Authentication and Consumable Lifetime Authentication. Although the protocols differ in the number of Authentication Chips required for the authentication process, in all cases the System authenticates the consumable. Certain protocols will work with either one or two chips, while other protocols only work with two chips. Whether one chip or two Authentication Chips are used the System is still responsible for making the authentication decision.

Single Chip Authentication

When only one Authentication chip 53 is used for the authentication protocol, a single chip (referred to as ChipA) is responsible for proving to a system (referred to as System) that it is authentic. At the start of the protocol, System is unsure of ChipA's authenticity. System undertakes a challenge-response protocol with ChipA, and thus determines ChipA's authenticity. In all protocols the authenticity of the consumable is directly based on the authenticity of the chip, i.e. if ChipA is considered authentic, then the consumable is considered authentic. The data flow can be seen in FIG. 167. In single chip authentication protocols, System can be software, hardware or a combination of both. It is important to note that System is considered insecure—it can be easily reverse engineered by an attacker, either by examining the ROM or by examining circuitry. System is not specially engineered to be secure in itself.

Double Chip Authentication

In other protocols, two Authentication Chips are required as shown in FIG. 168. A single chip (referred to as ChipA) is responsible for proving to a system (referred to as System) that it is authentic. As part of the authentication process, System makes use of a trusted Authentication Chip (referred to as ChipT). In double chip authentication protocols, System can be software, hardware or a combination of both. However ChipT must be a physical Authentication Chip. In some protocols ChipT and ChipA have the same internal structure, while in others ChipT and ChipA have different internal structures.

Presence Only Authentication (Insecure State Data)

For this level of consumable authentication we are only concerned about validating the presence of the Authentication chip 53. Although the Authentication Chip can contain state information, the transmission of that state information would not be considered secure. Two protocols are presented. Protocol 1 requires 2 Authentication Chips, while Protocol 2 can be implemented using either 1 or 2 Authentication Chips.

Protocol 1

Protocol 1 is a double chip protocol (two Authentication Chips are required). Each Authentication Chip contains the following values:

K Key for $F_K[X]$. Must be secret.

R Current random number. Does not have to be secret, but must be seeded with a different initial value for each chip instance. Changes with each invocation of the Random function.

Each Authentication Chip contains the following logical functions:

Random[ ] Returns R, and advances R to next in sequence.

F[X] Returns $F_K[X]$, the result of applying a one-way function F to X based upon the secret key K.

The protocol is as follows:

System requests Random[ ] from ChipT;

ChipT returns R to System;

System requests F[R] from both ChipT and ChipA;

ChipT returns $F_{KT}[R]$ to System;

ChipA returns $F_{KA}[R]$ to System;

System compares $F_{KT}[R]$ with $F_{KA}[R]$. If they are equal, then ChipA is considered valid. If not, then ChipA is considered invalid.

The data flow can be seen in FIG. 169. The System does not have to comprehend $F_K[R]$ messages. It must merely check that the responses from ChipA and ChipT are the same. The System therefore does not require the key. The security of Protocol 1 lies in two places:

The security of F[X]. Only Authentication chips contain the secret key, so anything that can produce an F[X] from an X that matches the F[X] generated by a trusted Authentication chip 53 (ChipT) must be authentic.

The domain of R generated by all Authentication chips must be large and non-deterministic. If the domain of R generated by all Authentication chips is small, then there is no need for a clone manufacturer to crack the key. Instead, the clone manufacturer could incorporate a ROM in their chip that had a record of all of the responses from a genuine chip to the codes sent by the system. The Random function does not strictly have to be in the Authentication Chip, since System can potentially generate the same random number sequence However it simplifies the design of System and ensures the security of the random number generator will be the same for all implementations that use the Authentication Chip, reducing possible error in system implementation.

Protocol 1 has several advantages:

K is not revealed during the authentication process

Given X, a clone chip cannot generate $F_K[X]$ without K or access to a real Authentication Chip.

System is easy to design, especially in low cost systems such as ink-jet printers, as no encryption or decryption is required by System itself.

A wide range of keyed one-way functions exists, including symmetric cryptography, random number sequences, and message authentication codes.

One-way functions require fewer gates and are easier to verify than asymmetric algorithms).

Secure key size for a keyed one-way function does not have to be as large as for an asymmetric (public key) algorithm. A minimum of 128 bits can provide appropriate security if F[X] is a symmetric cryptographic function.

However there are problems with this protocol:

It is susceptible to chosen text attack. An attacker can plug the chip into their own system, generate chosen Rs, and observe the output. In order to find the key, an attacker can also search for an R that will generate a specific F[M] since multiple Authentication chips can be tested in parallel.

Depending on the one-way function chosen, key generation can be complicated. The method of selecting a good key depends on the algorithm being used. Certain keys are weak for a given algorithm.

The choice of the keyed one-way functions itself is non-trivial. Some require licensing due to patent protection.

A man-in-the middle could take action on a plaintext message M before passing it on to ChipA—it would be preferable if the man-in-the-middle did not see M until after ChipA had seen it. It would be even more preferable if a man-in-the-middle didn't see M at all.

If F is symmetric encryption, because of the key size needed for adequate security, the chips could not be exported from the USA since they could be used as strong encryption devices. If Protocol 1 is implemented with F as an asymmetric encryption algorithm, there is no advantage over the symmetric case—the keys needs to be longer and the encryption algorithm is more expensive in silicon. Protocol 1 must be implemented with 2 Authentication Chips in order to keep the key secure. This means that each System requires an Authentication Chip and each consumable requires an Authentication Chip.

Protocol 2

In some cases, System may contain a large amount of processing power. Alternatively, for instances of systems that are manufactured in large quantities, integration of ChipT into System may be desirable. Use of an asymmetrical encryption algorithm allows the ChipT portion of System to be insecure. Protocol 2 therefore, uses asymmetric cryptography. For this protocol, each chip contains the following values:

K Key for $E_K[X]$ and $D_K[X]$. Must be secret in ChipA. Does not have to be secret in ChipT.

R Current random number. Does not have to be secret, but must be seeded with a different initial value for each chip instance. Changes with each invocation of the Random function.

The following functions are defined:

E[X] ChipT only. Returns $E_K[X]$ where E is asymmetric encrypt function E.

D[X] ChipA only. Returns $D_K[X]$ where D is asymmetric decrypt function D.

Random[] ChipT only. Returns $R|E_K[R]$, where R is random number based on seed S. Advances R to next in random number sequence.

The public key $K_T$ is in ChipT, while the secret key KA is in ChipA. Having $K_T$ in ChipT has the advantage that ChipT can be implemented in software or hardware (with the proviso that the seed for R is different for each chip or system). Protocol 2 therefore can be implemented as a Single Chip Protocol or as a Double Chip Protocol. The protocol for authentication is as follows:

System calls ChipT's Random function;

ChipT returns $R|E_{KT}[R]$ to System;

System calls ChipA's D function, passing in $E_{KT}[R]$;

ChipA returns R, obtained by $D_{KA}[E_{KT}[R]]$;

System compares R from ChipA to the original R generated by ChipT. If they are equal, then ChipA is considered valid. If not, ChipA is invalid.

The data flow can be seen in FIG. 170. Protocol 2 has the following advantages:

$K_A$ (the secret key) is not revealed during the authentication process

Given $E_{KT}[X]$, a clone chip cannot generate X without $K_A$ or access to a real ChipA.

Since $K_T \neq K_A$, ChipT can be implemented completely in software or in insecure hardware or as part of System. Only ChipA (in the consumable) is required to be a secure Authentication Chip.

If ChipT is a physical chip, System is easy to design.

There are a number of well-documented and cryptanalyzed asymmetric algorithms to chose from for implementation, including patent-free and license-free solutions.

However, Protocol 2 has a number of its own problems:

For satisfactory security, each key needs to be 2048 bits (compared to minimum 128 bits for symmetric cryptography in Protocol 1). The associated intermediate memory used by the encryption and decryption algorithms is correspondingly larger.

Key generation is non-trivial. Random numbers are not good keys.

If ChipT is implemented as a core, there may be difficulties in linking it into a given System ASIC.

If ChipT is implemented as software, not only is the implementation of System open to programming error and non-rigorous testing, but the integrity of the compiler and mathematics primitives must be rigorously checked for each implementation of System. This is more complicated and costly than simply using a well-tested chip.

Although many symmetric algorithms are specifically strengthened to be resistant to differential cryptanalysis (which is based on chosen text attacks), the private key $K_A$ is susceptible to a chosen text attack If ChipA and ChipT are instances of the same Authentication Chip, each chip must contain both asymmetric encrypt and decrypt functionality. Consequently each chip is larger, more complex, and more expensive than the chip required for Protocol 1.

If the Authentication Chip is broken into 2 chips to save cost and reduce complexity of design/test, two chips still need to be manufactured, reducing the economies of scale. This is offset by the relative numbers of systems to consumables, but must still be taken into account.

Protocol 2 Authentication Chips could not be exported from the USA, since they would be considered strong encryption devices.

Even if the process of choosing a key for Protocol 2 was straightforward, Protocol 2 is impractical at the present time due to the high cost of silicon implementation (both key size and functional implementation). Therefore Protocol 1 is the protocol of choice for Presence Only Authentication.

Clone Consumable Using Real Authentication Chip

Protocols 1 and 2 only check that ChipA is a real Authentication Chip. They do not check to see if the consumable itself is valid. The fundamental assumption for authentication is that if ChipA is valid, the consumable is valid. It is therefore possible for a clone manufacturer to insert a real Authentication Chip into a clone consumable. There are two cases to consider:

In cases where state data is not written to the Authentication Chip, the chip is completely reusable. Clone manufacturers could therefore recycle a valid consumable into a clone consumable. This may be made more difficult by melding the Authentication Chip into the consumable's physical packaging, but it would not stop refill operators.

In cases where state data is written to the Authentication Chip, the chip may be new, partially used up, or completely used up. However this does not stop a clone manufacturer from using the Piggyback attack, where the clone manufacturer builds a chip that has a real Authentication Chip as a piggyback. The Attacker's chip (ChipE) is therefore a man-in-the-middle. At power up, ChipE reads all the memory state values from the real Authentication chip 53 into its own memory. ChipE then examines requests from System, and takes different actions depending on the request. Authentication requests can be passed directly to the real Authentication chip 53, while read/write requests can be simulated by a memory that resembles real Authentication Chip behavior. In this way the Authentication chip 53 will always appear fresh at power-up. ChipE can do this because the data access is not authenticated.

In order to fool System into thinking its data accesses were successful, ChipE still requires a real Authentication Chip, and in the second case, a clone chip is required in addition to a real Authentication Chip. Consequently Protocols 1 and 2 can be useful in situations where it is not cost effective for a clone manufacturer to embed a real Authentication chip 53 into the consumable. If the consumable cannot be recycled or refilled easily, it may be protection enough to use Protocols 1 or 2. For a clone operation to be successful each clone consumable must include a valid Authentication Chip. The chips would have to be stolen en masse, or taken from old consumables. The quantity of these reclaimed chips (as well as the effort in reclaiming them) should not be enough to base a business on, so the added protection of secure data transfer (see Protocols 3 and 4) may not be useful.

Longevity of Key

A general problem of these two protocols is that once the authentication key is chosen, it cannot easily be changed. In some instances a key-compromise is not a problem, while for others a key compromise is disastrous. For example, in a car/car-key System/Consumable scenario, the customer has only one set of car/car-keys. Each car has a different authentication key. Consequently the loss of a car-key only compromises the individual car. If the owner considers this a problem, they must get a new lock on the car by replacing the System chip inside the car's electronics. The owner's keys must be reprogrammed/replaced to work with the new car System Authentication Chip. By contrast, a compromise of a key for a high volume consumable market (for example ink cartridges in printers) would allow a clone ink cartridge manufacturer to make their own Authentication Chips. The only solution for existing systems is to update the System Authentication Chips, which is a costly and logistically difficult exercise. In any case, consumers' Systems already work—they have no incentive to hobble their existing equipment.

Consumable Lifetime Authentication

In this level of consumable authentication we are concerned with validating the existence of the Authentication Chip, as well as ensuring that the Authentication Chip lasts only as long as the consumable. In addition to validating that an Authentication Chip is present, writes and reads of the Authentication Chip's memory space must be authenticated as well. In this section we assume that the Authentication Chip's data storage integrity is secure—certain parts of memory are Read Only, others are Read/Write, while others are Decrement Only (see the chapter entitled Data Storage Integrity for more information). Two protocols are presented. Protocol 3 requires 2 Authentication Chips, while Protocol 4 can be implemented using either 1 or 2 Authentication Chips.

Protocol 3

This protocol is a double chip protocol (two Authentication Chips are required). For this protocol, each Authentication Chip contains the following values:

$K_1$ Key for calculating $F_{K1}[X]$. Must be secret.

$K_2$ Key for calculating $F_{K2}[X]$. Must be secret.

R Current random number. Does not have to be secret, but must be seeded with a different initial value for each chip instance. Changes with each successful authentication as defined by the Test function.

M Memory vector of Authentication chip 53. Part of this space should be different for each chip (does not have to be a random number).

Each Authentication Chip contains the following logical functions:

F[X] Internal function only. Returns $F_K[X]$, the result of applying a one-way function F to X based upon either key $K_1$ or key $K_2$ Random[ ] Returns $R|F_{K1}[R]$.

Test[X, Y] Returns 1 and advances R if $F_{K2}[R|X]$=Y. Otherwise returns 0. The time taken to return 0 must be identical for all bad inputs.

Read[X, Y] Returns $M|F_{K2}[X|M]$ if $F_{K1}[X]$=Y. Otherwise returns 0. The time taken to return 0 must be identical for all bad inputs.

Write[X] Writes X over those parts of M that can legitimately be written over.

To authenticate ChipA and read ChipA's memory M:

System calls ChipT's Random function;

ChipT produces $R|F_K[R]$ and returns these to System;

System calls ChipA's Read function, passing in R, $F_K[R]$;

ChipA returns M and $F_K[R|M]$;

System calls ChipT's Test function, passing in M and $F_K[R|M]$;

System checks response from ChipT. If the response is 1, then ChipA is considered authentic. If 0, ChipA is considered invalid.

To authenticate a write of $M_{new}$ to ChipA's memory M:

System calls ChipA's Write function, passing in $M_{new}$;

The authentication procedure for a Read is carried out;

If ChipA is authentic and $M_{new}$=M, the write succeeded. Otherwise it failed.

The data flow for read authentication is shown in FIG. 171. The first thing to note about Protocol 3 is that $F_K[X]$ cannot be called directly. Instead $F_K[X]$ is called indirectly by Random, Test and Read:

Random[ ] calls $F_{K1}[X]$ X is not chosen by the caller. It is chosen by the Random function. An attacker must perform a brute force search using multiple calls to Random, Read, and Test to obtain a desired X, $F_{K1}[X]$ pair.

Test[X,Y] calls $F_{K2}[R|X]$ Does not return result directly, but compares the result to Y and then returns 1 or 0. Any attempt to deduce $K_2$ by calling Test multiple times trying different values of $F_{K2}[R|X]$ for a given X is reduced to a brute force search where R cannot even be chosen by the attacker.

Read[X, Y] calls $F_{K1}[X]$ X and $F_{K1}[X]$ must be supplied by caller, so the caller must already know the X, $F_{K1}[X]$ pair. Since the call returns 0 if $Y \neq F_{K1}[X]$, a caller can use the Read function for a brute force attack on $K_1$.

Read[X, Y] calls $F_{K2}[X|M]$, X is supplied by caller, however X can only be those values already given out by the Random function (since X and Y are validated via $K_1$). Thus a chosen text attack must first collect pairs from Random (effectively a brute force attack). In addition, only part of M can be used in a chosen text attack since some of M is constant (read-only) and the decrement-only part of M can only be used once per consumable. In the next consumable the read-only part of M will be different.

Having $F_K[X]$ being called indirectly prevents chosen text attacks on the Authentication Chip. Since an attacker can only obtain a chosen R, $F_{K1}[R]$ pair by calling Random, Read, and Test multiple times until the desired R appears, a brute force attack on $K_1$ is required in order to perform a limited chosen text attack on $K_2$. Any attempt at a chosen text attack on $K_2$ would be limited since the text cannot be completely chosen: parts of M are read-only, yet different for each Authentication Chip. The second thing to note is that two keys are used. Given the small size of M, two different keys $K_1$ and $K_2$ are used in order to ensure there is no correlation between F[R] and F[R|M]. $K_1$ is therefore used to help protect $K_2$ against differential attacks. It is not enough to use a single longer key since M is only 256 bits, and only part of M changes during the lifetime of the consumable. Otherwise it is potentially possible that an attacker via some as-yet undiscovered technique, could determine the effect of the limited changes in M to particular bit combinations in R and thus calculate $F_{K2}[X|M]$ based on $F_{K1}[X]$. As an added precaution, the Random and Test functions in ChipA should be disabled so that in order to generate R, $F_K[R]$ pairs, an attacker must use instances of ChipT, each of which is more expensive than ChipA (since a system must be obtained for each ChipT). Similarly, there should be a minimum delay between calls to Random, Read and Test so that an attacker cannot call these functions at high speed. Thus each chip can only give a specific number of X, $F_K[X]$ pairs away in a certain time period. The only specific timing requirement of Protocol 3 is that the return value of 0 (indicating a bad input) must be produced in the same amount of time regardless of where the error is in the input. Attackers can therefore not learn anything about what was bad about the input value. This is true for both RD and TST functions. Another thing to note about Protocol 3 is that Reading data from ChipA also requires authentication of ChipA. The System can be sure that the contents of memory (M) is what ChipA claims it to be if $F_{K2}[R|M]$ is returned correctly. A clone chip may pretend that M is a certain value (for example it may pretend that the consumable is full), but it cannot return $F_{K2}[R|M]$ for any R passed in by System. Thus the effective signature $F_{K2}[R|M]$ assures System that not only did an authentic ChipA send M, but also that M was not altered in between ChipA and System. Finally, the Write function as defined does not authenticate the Write. To authenticate a write, the System must perform a Read after each Write. There are some basic advantages with Protocol 3:

$K_1$ and $K_2$ are not revealed during the authentication process

Given X, a clone chip cannot generate $F_{K2}[X|M]$ without the key or access to a real Authentication Chip.

System is easy to design, especially in low cost systems such as ink-jet printers, as no encryption or decryption is required by System itself.

A wide range of key based one-way functions exists, including symmetric cryptography, random number sequences, and message authentication codes.

Keyed one-way functions require fewer gates and are easier to verify than asymmetric algorithms).

Secure key size for a keyed one-way function does not have to be as large as for an asymmetric (public key) algorithm. A minimum of 128 bits can provide appropriate security if F[X] is a symmetric cryptographic function.

Consequently, with Protocol 3, the only way to authenticate ChipA is to read the contents of ChipA's memory. The security of this protocol depends on the underlying $F_K[X]$ scheme and the domain of R over the set of all Systems. Although $F_K[X]$ can be any keyed one-way function, there is no advantage to implement it as asymmetric encryption. The keys need to be longer and the encryption algorithm is more expensive in silicon. This leads to a second protocol for use with asymmetric algorithms—Protocol 4. Protocol 3 must be implemented with 2 Authentication Chips in order to keep the keys secure. This means that each System requires an Authentication Chip and each consumable requires an Authentication Chip Protocol 4

In some cases, System may contain a large amount of processing power. Alternatively, for instances of systems that are manufactured in large quantities, integration of ChipT into System may be desirable. Use of an asymmetrical encryption algorithm can allow the ChipT portion of System to be insecure. Protocol 4 therefore, uses asymmetric cryptography. For this protocol, each chip contains the following values:

K Key for $E_K[X]$ and $D_K[X]$. Must be secret in ChipA. Does not have to be secret in ChipT.

R Current random number. Does not have to be secret, but must be seeded with a different initial value for each chip instance. Changes with each successful authentication as defined by the Test function.

M Memory vector of Authentication chip 53. Part of this space should be different for each chip, (does not have to be a random number).

There is no point in verifying anything in the Read function, since anyone can encrypt using a public key. Consequently the following functions are defined:

E[X] Internal function only. Returns $E_K[X]$ where E is asymmetric encrypt function E.

D[X] Internal function only. Returns $D_K[X]$ where D is asymmetric decrypt function D.

Random[ ] ChipT only. Returns $E_K[R]$.

Test[X, Y] Returns 1 and advances R if $D_K[R|X]=Y$. Otherwise returns 0. The time taken to return 0 must be identical for all bad inputs.

Read[X] Returns $M|E_K[R|M]$ where $R=D_K[X]$ (does not test input).

Write[X] Writes X over those parts of M that can legitimately be written over.

The public key $K_T$ is in ChipT, while the secret key $K_A$ is in ChipA. Having $K_T$ in ChipT has the advantage that ChipT can be implemented in software or hardware (with the proviso that R is seeded with a different random number for each system). To authenticate ChipA and read ChipA's memory M:

System calls ChipT's Random function;

ChipT produces ad returns $E_{KT}[R]$ to System;

System calls ChipA's Read function, passing in $E_{KT}[R]$;

ChipA returns $M|E_{KA}[R|M]$, first obtaining R by $D_{KA}[E_{KT}[R]]$; p1 System calls ChipT's Test function, passing in M and $E_{KA}[R|M]$;

ChipT calculates $D_{KT}[E_{KA}[R|M]]$ and compares it to R|M.

System checks response from ChipT. If the response is 1, then ChipA is considered authentic. If 0, ChipA is considered invalid.

To authenticate a write of $M_{new}$ to ChipA's memory M:

System calls ChipA's Write function, passing in $M_{new}$;

The authentication procedure for a Read is carried out;

If ChipA is authentic and $M_{new}=M$, the write succeeded. Otherwise it failed.

The data flow for read authentication is shown in FIG. 172. Only a valid ChipA would know the value of R, since R is not passed into the Authenticate function (it is passed in as an encrypted value). R must be obtained by decrypting E[R], which can only be-done using the secret key $K_A$. Once obtained, R must be appended to M and then the result re-encoded. ChipT can then verify that the decoded form of $E_{KA}[R|M]=R|M$ and hence ChipA is valid. Since $K_T \neq K_A$, $E_{KT}[R] \neq E_{KA}[R]$. Protocol 4 has the following advantages:

$K_A$ (the secret key) is not revealed during the authentication process

Given $E_{KT}[X]$, a clone chip cannot generate X without $K_A$ or access to a real ChipA.

Since $K_T \neq K_A$, ChipT can be implemented completely in software or in insecure hardware or as part of System. Only ChipA is required to be a secure Authentication Chip.

Since ChipT and ChipA contain different keys, intense testing of ChipT will reveal nothing about $K_A$.

If ChipT is a physical chip, System is easy to design.

There are a number of well-documented and cryptanalyzed asymmetric algorithms to chose from for implementation, including patent-free and license-free solutions.

Even if System could be rewired so that ChipA requests were directed to ChipT, ChipT could never answer for ChipA since $K_T \neq K_A$. The attack would have to be directed at the System ROM itself to bypass the Authentication protocol.

However, Protocol 4 has a number of disadvantages:

All Authentication Chips need to contain both asymmetric encrypt and decrypt functionality. Consequently each chip is larger, more complex, and more expensive than the chip required for Protocol 3.

For satisfactory security, each key needs to be 2048 bits (compared to a minimum of 128 bits for symmetric cryptography in Protocol 1). The associated intermediate memory used by the encryption and decryption algorithms is correspondingly larger.

Key generation is non-trivial. Random numbers are not good keys.

If ChipT is implemented as a core, there may be difficulties in linking it into a given System ASIC.

If ChipT is implemented as software, not only is the implementation of System open to programming error and non-rigorous testing, but the integrity of the compiler and mathematics primitives must be rigorously checked for each implementation of System. This is more complicated and costly than simply using a well-tested chip.

Although many symmetric algorithms are specifically strengthened to be resistant to differential cryptanalysis (which is based on chosen text attacks), the private key $K_A$ is susceptible to a chosen text attack Protocol 4 Authentication Chips could not be exported from the USA, since they would be considered strong encryption devices. As with Protocol 3, the only specific timing requirement of Protocol 4 is that the return value of 0 (indicating a bad input) must be produced in the same amount of time regardless of where the error is in the input. Attackers can therefore not learn anything about what was bad about the input value. This is true for both RD and TST functions.

Variation on Call to TST

If there are two Authentication Chips used, it is theoretically possible for a clone manufacturer to replace the System Authentication Chip with one that returns 1 (success) for each call to TST. The System can test for this by calling TST a number of times—N times with a wrong hash value, and expect the result to be 0. The final time that TST is called, the true returned value from ChipA is passed, and the return value is trusted. The question then arises of how many times to call TST. The number of calls must be random, so that a clone chip manufacturer cannot know the number ahead of time. If System has a clock, bits from the clock can be used to determine how many false calls to TST should be made. Otherwise the returned value from ChipA can be used. In the latter case, an attacker could still rewire the System to permit a clone ChipT to view the returned value from ChipA, and thus know which hash value is the correct one. The worst case of course, is that the System can be completely replaced by a clone System that does not require authenticated consumables—this is the limit case of rewiring and changing the System. For this reason, the variation on calls to TST is optional, depending on the System, the Consumable, and how likely modifications are to be made. Adding such logic to System (for example in the case of a small desktop printer) may be considered not worthwhile, as the System is made more complicated. By contrast, adding such logic to a camera may be considered worthwhile.

Clone Consumable Using Real Authentication Chip

It is important to decrement the amount of consumable remaining before use that consumable portion. If the consumable is used first, a clone consumable could fake a loss of contact during a write to the special known address and then appear as a fresh new consumable. It is important to note that this attack still requires a real Authentication Chip in each consumable.

Longevity of Key

A general problem of these two protocols is that once the authentication keys are chosen, it cannot easily be changed. In some instances a key-compromise is not a problem, while for others a key compromise is disastrous.

Choosing a Protocol

Even if the choice of keys for Protocols 2 and 4 was straightforward, both protocols are impractical at the present time due to the high cost of silicon implementation (both due to key size and functional implementation). Therefore Protocols 1 and 3 are the two protocols of choice. However, Protocols 1 and 3 contain much of the same components:

both require read and write access;

both require implementation of a keyed one-way function; and both require random number generation functionality.

Protocol 3 requires an additional key ($K_2$), as well as some minimal state machine changes:

a state machine alteration to enable $F_{K1}[X]$ to be called during Random;

a Test function which calls $F_{K2}[X]$ a state machine alteration to the Read function to call $F_{K1}[X]$ and $F_{K2}[X]$ Protocol 3 only requires minimal changes over Protocol 1. It is more secure and can be used in all places where Presence Only Authentication is required (Protocol 1). It is therefore the protocol of choice. Given that Protocols 1 and 3 both make use of keyed one-way functions, the choice of one-way function is examined in more detail here. The following table outlines the attributes of the applicable choices. The attributes are worded so that the attribute is seen as an advantage.

An examination of the table shows that the choice is effectively between the 3 HMAC constructs and the Random Sequence. The problem of key size and key generation eliminates the Random Sequence. Given that a number of attacks have already been carried out on MD5 and since the hash result is only 128 bits, HMAC-MD5 is also eliminated. The choice is therefore between HMAC-SHA1 and HMAC-RIPEMD160. RIPEMD-160 is relatively new, and has not been as extensively cryptanalyzed as SHA1. However, SHA-1 was designed by the NSA, so this may be seen by some as a negative attribute.

Given that there is not much between the two, SHA-1 will be used for the HMAC construct.

Choosing a Random Number Generator

Each of the protocols described (1–4) requires a random number generator. The generator must be "good" in the sense that the random numbers generated over the life of all Systems cannot be predicted. If the random numbers were the same for each System, an attacker could easily record the correct responses from a real Authentication Chip, and place the responses into a ROM lookup for a clone chip. With such an attack there is no need to obtain $K_1$ or $K_2$. Therefore the random numbers from each System must be different enough to be unpredictable, or non-deterministic. As such, the initial value for R (the random seed) should be programmed with a physically generated random number gathered from a physically random phenomenon, one where there is no information about whether a particular bit will be 1 or 0. The seed for R must NOT be generated with a computer-run random number generator. Otherwise the generator algorithm and seed may be compromised enabling an attacker to generate and therefore know the set of all R values in all Systems. Having a different R seed in each Authentication Chip means that the first R will be both random and unpredictable across all chips. The question therefore arises of how to generate subsequent R values in each chip.

The base case is not to change R at all. Consequently R and $F_{K1}[R]$ will be the same for each call to Random[ ]. If they are the same, then $F_{K1}[R]$ can be a constant rather than calculated. An attacker could then use a single valid Authentication Chip to generate a valid lookup table, and then use that lookup table in a clone chip programmed especially for that System. A constant R is not secure.

The simplest conceptual method of changing R is to increment it by 1. Since R is random to begin with, the values across differing systems are still likely to be random. However given an initial R, all subsequent R values can be determined directly (there is no need to iterate 10,000 times—R will take on values from $R_0$ to $R_0+10000$). An incrementing R is immune to the earlier attack on a constant R. Since R is always different, there is no way to construct a lookup table for the particular System without wasting as many real Authentication Chips as the clone chip will replace.

Rather than increment using an adder, another way of changing R is to implement it as an LFSR (Linear Feedback Shift Register). This has the advantage of less silicon than an adder, but the advantage of an attacker not being able to directly determine the range of R for a particular. System, since an LFSR value-domain is determined by sequential access. To determine which values an given initial R will generate, an attacker must iterate through the possibilities and enumerate them. The advantages of a changing R are also evident in the LFSR solution. Since R is always different, there is no way to construct a lookup table for the particular System without using-up as many real Authentication Chips as the clone chip will replace (and only for that System). There is therefore no advantage in having a more complex function to change R. Regardless of the function, it will always be possible for an attacker to iterate through the lifetime set of values in a simulation. The primary security lies in the initial randomness of R. Using an LFSR to change R (apart from using less silicon than an adder) simply has the advantage of not being restricted to a consecutive numeric range (i.e. knowing R, $R_N$ cannot be directly calculated; an attacker must iterate through the LFSR N times).

The Random number generator within the Authentication Chip is therefore an LFSR with 160 bits. Tap selection of the 160 bits for a maximal-period LFSR (i.e. the LFSR will cycle through all $2^{160}-1$ states, 0 is not a valid state) yields bits 159, 4, 2, and 1, as shown in FIG. 173. The LFSR is sparse, in that not many bits are used for feedback (only 4 out of 160 bits are used). This is a problem for cryptographic applications, but not for this application of non-sequential number generation. The 160-bit seed value for R can be any random number except 0, since an LFSR filled with 0s will produce a never-ending stream of 0s. Since the LFSR described is a maximal period LFSR, all 160 bits can be used directly as R. There is no need to construct a number sequentially from output bits of $b_0$. After each successful call to TST, the random number (R) must be advanced by XORing bits 1, 2, 4, and 159, and shifting the result into the high order bit. The new R and corresponding $F_{K1}[R]$ can be retrieved on the next call to Random.

Holding Out Against Logical Attacks

Protocol 3 is the authentication scheme used by the Authentication Chip. As such, it should be resistant to defeat by logical means. While the effect of various types of attacks on Protocol 3 have been mentioned in discussion, this section details each type of attack in turn with reference to Protocol 3.

Brute Force Attack

A Brute Force attack is guaranteed to break Protocol 3. However the length of the key means that the time for an attacker to perform a brute force attack is too long to be worth the effort. An attacker only needs to break $K_2$ to build a clone Authentication Chip. $K_1$ is merely present to strengthen $K_2$ against other forms of attack. A Brute Force Attack on $K_2$ must therefore break a 160-bit key. An attack against $K_2$ requires a maximum of $2^{160}$ attempts, with a 50% chance of finding the key after only $2^{159}$ attempts. Assuming an array of a trillion processors, each running one million tests per second, $2^{159}$ ($7.3 \times 10^{47}$) tests takes $2.3 \times 10^{23}$ years, which is longer than the lifetime of the universe. There are only 100 million personal computers in the world. Even if these were all connected in an attack (e.g. via the Internet), this number is still 10,000 times smaller than the trillion-processor attack described. Further, if the manufacture of one trillion processors becomes a possibility in the age of nanocomputers, the time taken to obtain the key is longer than the lifetime of the universe.

Guessing the Key Attack

It is theoretically possible that an attacker can simply "guess the key". In fact, given enough time, and trying every possible number, an attacker will obtain the key. This is identical to the Brute Force attack described above, where $2^{159}$ attempts must be made before a 50% chance of success is obtained. The chances of someone simply guessing the key on the first try is $2^{160}$. For comparison, the chance of someone winning the top prize in a U.S. state lottery and being killed by lightning in the same day is only 1 in $2^{61}$. The chance of someone guessing the Authentication Chip key on the first go is 1 in $2^{160}$, which is comparative to two people choosing exactly the same atoms from a choice of all the atoms in the Earth i.e. extremely unlikely.

Quantum Computer Attack

To break $K_2$, a quantum computer containing 160 qubits embedded in an appropriate algorithm must be built. An attack against a 160-bit key is not feasible. An outside estimate of the possibility of quantum computers is that 50 qubits may be achievable within 50 years. Even using a 50 qubit quantum computer, $2^{110}$ tests are required to crack a 160 bit key. Assuming an array of 1 billion 50 qubit quantum computers, each able to try $2^{50}$ keys in 1 microsecond (beyond the current wildest estimates) finding the key would take an average of 18 billion years.

Cyphertext Only Attack

An attacker can launch a Cyphertext Only attack on $K_1$ by calling monitoring calls to RND and RD, and on $K_2$ by monitoring calls to RD and TST. However, given that all these calls also reveal the plaintext as well as the hashed form of the plaintext, the attack would be transformed into a stronger form of attack—a Known Plaintext attack.

Known Plaintext Attack

It is easy to connect a logic analyzer to the connection between the System and the Authentication Chip, and thereby monitor the flow of data. This flow of data results in known plaintext and the hashed form of the plaintext, which can therefore be used to launch a Known Plaintext attack against both $K_1$ and $K_2$. To launch an attack against $K_1$, multiple calls to RND and TST must be made (with the call to TST being successful, and therefore requiring a call to RD on a valid chip). This is straightforward, requiring the attacker to have both a System Authentication Chip and a Consumable Authentication Chip. For each $K_1$ X, $H_{K1}[X]$ pair revealed, a $K_2$ Y, $H_{K2}[Y]$ pair is also revealed. The attacker must collect these pairs for further analysis. The question arises of how many pairs must be collected for a meaningful attack to be launched with this data. An example of an attack that requires collection of data for statistical analysis is Differential Cryptanalysis. However, there are no known attacks against SHA-1 or HMAC-SHA1, so there is no use for the collected data at this time.

Chosen Plaintext Attacks

Given that the cryptanalyst has the ability to modify subsequent chosen plaintexts based upon the results of previous experiments, $K_2$ is open to a partial form of the Adaptive Chosen Plaintext attack, which is certainly a stronger form of attack than a simple Chosen Plaintext attack. A chosen plaintext attack is not possible against $K_1$, since there is no way for a caller to modify R, which used as input to the RND function (the only function to provide the result of hashing with $K_1$). Clearing R also has the effect of clearing the keys, so is not useful, and the SSI command calls CLR before storing the new R-value.

Adaptive Chosen Plaintext Attacks

This kind of attack is not possible against $K_1$, since $K_1$ is not susceptible to chosen plaintext attacks. However, a partial form of this attack is possible against $K_2$, especially since both System and consumables are typically available to the attacker (the System may not be available to the attacker in some instances, such as a specific car). The HMAC construct provides security against all forms of chosen plaintext attacks. This is primarily because the HMAC construct has 2 secret input variables (the result of the original hash, and the secret key). Thus finding collisions in the hash function itself when the input variable is secret is even harder than finding collisions in the plain hash function. This is because the former requires direct access to SHA-1 (not permitted in Protocol 3) in order to generate pairs of input/output from SHA-1. The only values that can be collected by an attacker are HMAC[R] and HMAC[R|M]. These are not attacks against the SHA-1 hash function itself, and reduce the attack to a Differential Cryptanalysis attack, examining statistical differences between collected data. Given that there is no Differential Cryptanalysis attack known against SHA-1 or HMAC, Protocol 3 is resistant to the Adaptive Chosen Plaintext attacks.

Purposeful Error Attack

An attacker can only launch a Purposeful Error Attack on the TST and RD functions, since these are the only functions that validate input against the keys. With both the TST and RD functions, a 0 value is produced if an error is found in the input—no further information is given. In addition, the time taken to produce the 0 result is independent of the input, giving the attacker no information about which bit(s) were wrong. A Purposeful Error Attack is therefore fruitless.

Chaining Attack

Any form of chaining attack assumes that the message to be hashed is over several blocks, or the input variables can somehow be set. The HMAC-SHA1 algorithm used by Protocol 3 only ever hashes a single 512-bit block at a time. Consequently chaining attacks are not possible against Protocol 3.

Birthday Attack

The strongest attack known against HMAC is the birthday attack, based on the frequency of collisions for the hash function. However this is totally impractical for minimally reasonable hash functions such as SHA-1. And the birthday attack is only possible when the attacker has control over the message that is signed. Protocol 3 uses hashing as a form of digital signature. The System sends a number that must be incorporated into the response from a valid Authentication Chip. Since the Authentication Chip must respond with H[R|M], but has no control over the input value R, the birthday attack is not possible. This is because the message has effectively already been generated and signed. An attacker must instead search for a collision message that hashes to the same value (analogous to finding one person who shares your birthday) The clone chip must therefore attempt to find a new value $R_2$ such that the hash of $R_2$ and a chosen $M_2$ yields the same hash value as H[R|M]. However the System Authentication Chip does not reveal the correct hash value (the TST function only returns 1 or 0 depending on whether the hash value is correct). Therefore the only way of finding out the correct hash value (in order to find a collision) is to interrogate a real Authentication Chip. But to find the correct value means to update M, and since the decrement-only parts of M are one-way, and the read-only parts of M cannot be changed, a clone consumable would have to update a real consumable before attempting to find a collision. The alternative is a Brute Force attack search on the TST function to find a success (requiring each clone consumable to have access to a System consumable). A Brute Force Search, as described above, takes longer than the lifetime of the universe, in this case, per authentication. Due to the fact that a timely gathering of a hash value implies a real consumable must be decremented, there is no point for a clone consumable to launch this kind of attack.

Substitution with a Complete Lookup Table

The random number seed in each System is 160 bits. The worst case situation for an Authentication Chip is that no state data is changed. Consequently there is a constant value returned as M. However a clone chip must still return $F_{K2}[R|M]$, which is a 160 bit value. Assuming a 160-bit lookup of a 160-bit result, this requires $7.3 \times 10^{48}$ bytes, or $6.6 \times 10^{36}$ terabytes, certainly more space than is feasible for the near future. This of course does not even take into account the method of collecting the values for the ROM. A complete lookup table is therefore completely impossible.

Substitution with a Sparse Lookup Table

A sparse lookup table is only feasible if the messages sent to the Authentication Chip are somehow predictable, rather than effectively random. The random number R is seeded with an unknown random number, gathered from a naturally random event. There is no possibility for a clone manufacturer to know what the possible range of R is for all Systems, since each bit has a 50% chance of being a 1 or a 0. Since the range of R in all systems is unknown, it is not possible to build a sparse lookup table that can be used in all systems. The general sparse lookup table is therefore not a possible attack. However, it is possible for a clone manufacturer to know what the range of R is for a given System. This can be accomplished by loading a LFSR with the current result from a call to a specific System Authentication Chip's RND function, and iterating some number of times into the future. If this is done, a special ROM can be built which will only contain the responses for that particular range of R, i.e. a ROM specifically for the consumables of that particular System. But the attacker still needs to place correct information in the ROM. The attacker will therefore need to find a valid Authentication Chip and call it for each of the values in R.

Suppose the clone Authentication Chip reports a full consumable, and then allows a single use before simulating loss of connection and insertion of a new full consumable. The clone consumable would therefore need to contain responses for authentication of a full consumable and authentication of a partially used consumable. The worst case ROM contains entries for full and partially used consumables for R over the lifetime of System. However, a valid Authentication Chip must be used to generate the information, and be partially used in the process. If a given System only produces about n R-values, the sparse lookup-ROM required is 10 n bytes multiplied by the number of different values for M. The time taken to build the ROM depends on the amount of time enforced between calls to RD.

After all this, the clone manufacturer must rely on the consumer returning for a refill, since the cost of building the ROM in the first place consumes a single consumable. The clone manufacturer's business in such a situation is consequently in the refills. The time and cost then, depends on the size of R and the number of different values for M that must be incorporated in the lookup. In addition, a custom clone consumable ROM must be built to match each and every System, and a different valid Authentication Chip must be used for each System (in order to provide the full and partially used data). The use of an Authentication Chip in a System must therefore be examined to determine whether or not this kind of attack is worthwhile for a clone manufacturer. As an example, of a camera system that has about 10,000 prints in its lifetime. Assume it has a single Decrement Only value (number of prints remaining), and a delay of 1 second between calls to RD. In such a system, the sparse table will take about 3 hours to build, and consumes 100K. Remember that the construction of the ROM requires the consumption of a valid Authentication Chip, so any money charged must be worth more than a single consumable and the clone consumable combined. Thus it is not cost effective to perform this function for a single consumable (unless the clone consumable somehow contained the equivalent of multiple authentic consumables). If a clone manufacturer is going to go to the trouble of building a custom ROM for each owner of a System, an easier approach would be to update System to completely ignore the Authentication Chip.

Consequently, this attack is possible as a per-System attack, and a decision must be made about the chance of this occurring for a given System/Consumable combination. The chance will depend on the cost of the consumable and Authentication Chips, the longevity of the consumable, the profit margin on the consumable, the time taken to generate the ROM, the size of the resultant ROM, and whether customers will come back to the clone manufacturer for refills that use the same clone chip etc.

Differential Cryptanalysis

Existing differential attacks are heavily dependent on the structure of S boxes, as used in DES and other similar algorithms. Although other algorithms such as HMAC-SHA1 used in Protocol 3 have no S boxes, an attacker can undertake a differential-like attack by undertaking statistical analysis of:

Minimal-difference inputs, and their corresponding outputs

Minimal-difference outputs, and their corresponding inputs

To launch an attack of this nature, sets of input/output pairs must be collected. The collection from Protocol 3 can be via Known Plaintext, or from a Partially Adaptive Chosen Plaintext attack. Obviously the latter, being chosen, will be more useful. Hashing algorithms in general are designed to be resistant to differential analysis. SHA-1 in particular has been specifically strengthened, especially by the 80 word expansion so that minimal differences in input produce will still produce outputs that vary in a larger number of bit positions (compared to 128 bit hash functions). In addition, the information collected is not a direct SHA-1 input/output set, due to the nature of the HMAC algorithm. The HMAC algorithm hashes a known value with an unknown value (the key), and the result of this hash is then rehashed with a separate unknown value. Since the attacker does not know the secret value, nor the result of the first hash, the inputs and outputs from SHA-1 are not known, making any differential attack extremely difficult. The following is a more detailed discussion of minimally different inputs and outputs from the Authentication Chip.

Minimal Difference Inputs

This is where an attacker takes a set of X, $F_K[X]$ values where the X values are minimally different, and examines the statistical differences between the outputs $F_K[X]$. The attack relies on X values that only differ by a minimal number of bits. The question then arises as to how to obtain minimally different X values in order to compare the $F_K[X]$ values.

$K_1$:With $K_1$, the attacker needs to statistically examine minimally different X, $F_{K1}[X]$ pairs. However the attacker cannot choose any X value and obtain a related $F_{K1}[X]$ value. Since X, $F_{K1}[X]$ pairs can only be generated by calling the RND function on a System Authentication Chip, the attacker must call RND multiple times, recording each observed pair in a table. A search must then be made through the observed values for enough minimally different X values to undertake a statistical analysis of the $F_{K1}[X]$ values.

$K_2$:With $K_2$, the attacker needs to statistically examine minimally different X, $F_{K2}[X]$ pairs. The only way of generating X, $F_{K2}[X]$ pairs is via the RD function, which produces $F_{K2}[X]$ for a given Y, $F_{K1}[Y]$ pair, where X=Y|M. This means that Y and the changeable part of M can be chosen to a limited extent by an attacker. The amount of choice must therefore be limited as much as possible.

The first way of limiting an attacker's choice is to limit Y, since RD requires an input of the format Y, $F_{K1}[Y]$. Although a valid pair can be readily obtained from the RND function, it is a pair of RND's choosing. An attacker can only provide their own Y if they have obtained the appropriate pair from RND, or if they know $K_1$. Obtaining the appropriate pair from RND requires a Brute Force search. Knowing $K_1$ is only logically possible by performing cryptanalysis on pairs obtained from the RND function—effectively a known text attack. Although RND can only be called so many times per second, $K_1$ is common across System chips. Therefore known pairs can be generated in parallel.

The second way to limit an attacker's choice is to limit M, or at least the attacker's ability to choose M. The limiting of M is done by making some parts of M Read Only, yet different for each Authentication Chip, and other parts of M Decrement Only. The Read Only parts of M should ideally be different for each Authentication Chip, so could be information such as serial numbers, batch numbers, or random numbers. The Decrement Only parts of M mean that for an attacker to try a different M, they can only decrement those parts of M so many times—after the Decrement Only parts of M have been reduced to 0 those parts cannot be changed again. Obtaining a new Authentication chip 53 provides a new M, but the Read Only portions will be different from the previous Authentication Chip's Read Only portions, thus reducing an attacker's ability to choose M even further. Consequently an attacker can only gain a limited number of chances at choosing values for Y and M.

Minimal Difference Outputs

This is where an attacker takes a set of X, $F_K[X]$ values where the $F_K[X]$ values are minimally different, and examines the statistical differences between the X values. The attack relies on $F_K[X]$ values that only differ by a minimal number of bits. For both $K_1$ and $K_2$, there is no way for an attacker to generate an X value for a given $F_K[X]$. To do so would violate the fact that F is a one-way function. Consequently the only way for an attacker to mount an attack of this nature is to record all observed X, $F_K[X]$ pairs in a table. A search must then be made through the observed values for enough minimally different $F_K[X]$ values to undertake a statistical analysis of the X values. Given that this requires more work than a minimally different input attack (which is extremely limited due to the restriction on M and the choice of R), this attack is not fruitful.

Message Substitution Attacks

In order for this kind of attack to be carried out, a clone consumable must contain a real Authentication chip 53, but one that is effectively reusable since it never gets decremented. The clone Authentication Chip would intercept messages, and substitute its own. However this attack does not give success to the attacker. A clone Authentication Chip may choose not to pass on a WR command to the real Authentication Chip. However the subsequent RD command must return the correct response (as if the WR had succeeded). To return the correct response, the hash value must be known for the specific R and M. As described in the Birthday Attack section, an attacker can only determine the hash value by actually updating M in a real Chip, which the attacker does not want to do. Even changing the R sent by System does not help since the System Authentication Chip must match the R during a subsequent TST. A Message substitution attack would therefore be unsuccessful. This is only true if System updates the amount of consumable remaining before it is used.

Reverse Engineering the Key Generator

If a pseudo-random number generator is used to generate keys, there is the potential for a clone manufacture to obtain the generator program or to deduce the random seed used. This was the way in which the Netscape security program was initially broken.

Bypassing Authentication Altogether

Protocol 3 requires the System to update the consumable state data before the consumable is used, and follow every write by a read (to authenticate the write). Thus each use of the consumable requires an authentication. If the System adheres to these two simple rules, a clone manufacturer will have to simulate authentication via a method above (such as sparse ROM lookup).

Reuse of Authentication Chips

As described above, Protocol 3 requires the System to update the consumable state data before the consumable is used, and follow every write by a read (to authenticate the write). Thus each use of the consumable requires an authentication. If a consumable has been used up, then its Authentication Chip will have had the appropriate state-data values decremented to 0. The chip can therefore not be used in another consumable. Note that this only holds true for Authentication Chips that hold Decrement-Only data items. If there is no state data decremented with each usage, there is nothing stopping the reuse of the chip. This is the basic difference between Presence-Only Authentication and Consumable Lifetime Authentication. Protocol 3 allows both. The bottom line is that if a consumable has Decrement Only data items that are used by the System, the Authentication Chip cannot be reused without being completely reprogrammed by a valid Programming Station that has knowledge of the secret key.

Management Decision to Omit Authentication to Save Costs

Although not strictly an external attack, a decision to omit authentication in future Systems in order to save costs will have widely varying effects on different markets. In the case of high volume consumables, it is essential to remember that it is very difficult to introduce authentication after the market has started, as systems requiring authenticated consumables will not work with older consumables still in circulation. Likewise, it is impractical to discontinue authentication at any stage, as older Systems will not work with the new, unauthenticated, consumables. In he second case, older Systems can be individually altered by replacing the System Authentication Chip by a simple chip that has the same programming interface, but whose TST function always succeeds. Of course the System may be programmed to test for an always-succeeding TST function, and shut down. In the case of a specialized pairing, such as a car/car-keys, or door/door-key, or some other similar situation, the omission of authentication in future systems is trivial and non-repercussive. This is because the consumer is sold the entire set of System and Consumable Authentication Chips at the one time.

Garrote/Bribe Attack

This form of attack is only successful in one of two circumstances:

$K_1$, $K_2$, and R are already recorded by the chip-programmer, or the attacker can coerce future values of $K_1$, $K_2$, and R to be recorded.

If humans or computer systems external to the Programming Station do not know the keys, there is no amount of force or bribery that can reveal them. The level of security against this kind of attack is ultimately a decision for the System/Consumable owner, to be made according to the desired level of service. For example, a car company may wish to keep a record of all keys manufactured, so that a person can request a new key to be made for their car. However this allows the potential compromise of the entire key database, allowing an attacker to make keys for any of the manufacturer's existing cars. It does not allow an attacker to make keys for any new cars. Of course, the key database itself may also be encrypted with a further key that requires a certain number of people to combine their key portions together for access. If no record is kept of which key is used in a particular car, there is no way to make additional keys should one become lost. Thus an owner will have to replace his car's Authentication Chip and all his car-keys. This is not necessarily a bad situation. By contrast, in a consumable such as a printer ink cartridge, the one key combination is used for all Systems and all consumables. Certainly if no backup of the keys is kept, there is no human with knowledge of the key, and therefore no attack is possible. However, a no-backup situation is not desirable for a consumable such as ink cartridges, since if the key is lost no more consumables can be made. The manufacturer should therefore keep a backup of the key information in several parts, where a certain number of people must together combine their portions to reveal the full key information. This may be required if case the chip programming station needs to be reloaded. In any case, none of these attacks are against Protocol 3 itself, since no humans are involved in the authentication process. Instead, it is an attack against the programming stage of the chips.

HMAC-SHA1

The mechanism for authentication is the HMAC-SHA1 algorithm, acting on one of:

HMAC-SHA1 (R,$K_1$), or

HMAC-SHA1 (R|M, $K_2$)

We will now examine the HMAC-SHA1 algorithm in greater detail than covered so far, and describes an optimization of the algorithm that requires fewer memory resources than the original definition.

HMAC

The HMAC algorithm proceeds, given the following definitions:

H=the hash function (e.g. MD5 or SHA-1)

n=number of bits output from H (e.g. 160 for SHA-1, 128 bits for MD5)

M=the data to which the MAC function is to be applied

K=the secret key shared by the two parties ipad=0x36 repeated 64 times opad=0x5C repeated 64 times The HMAC algorithm is as follows:

Extend K to 64 bytes by appending 0x00 bytes to the end of K

XOR the 64 byte string created in (1) with ipad

Append data stream M to the 64 byte string created in (2)

Apply H to the stream generated in (3)

XOR the 64 byte string created in (1) with opad

Append the H result from (4) to the 64 byte string resulting from (5)

Apply H to the output of (6) and output the result

Thus:

$$HMAC[M]=H[(K\oplus opad)|H[(K\oplus ipad)|M]]$$

HMAC-SHA1 algorithm is simply HMAC with H=SHA-1.

SHA-1

The SHA1 hashing algorithm is defined in the algorithm as summarized here.

Nine 32-bit constants are defined. There are 5 constants used to initialize the chaining variables, and there are 4 additive constants.

| | Initial Chaining Values | | Additive Constants |
|---|---|---|---|
| $h_1$ | 0x67452301 | $y_1$ | 0x5A827999 |
| $h_2$ | 0xEFCDAB89 | $y_2$ | 0x6ED9EBA1 |
| $h_3$ | 0x98BADCFE | $y_3$ | 0x8F1BBCDC |
| $h_4$ | 0x10325476 | $y_4$ | 0xCA62C1D6 |
| $h_5$ | 0xC3D2E1F0 | | |

Non-optimized SHA-1 requires a total of 2912 bits of data storage:

Five 32-bit chaining variables are defined: $H_1$, $H_2$, $H_3$, $H_4$ and $H_5$.

Five 32-bit working variables are defined: A, B, C, D, and E.

One 32-bit temporary variable is defined: t.

Eighty 32-bit temporary registers are defined: $X_{0-79}$.

The following functions are defined for SHA-1:

| Symbolic Nomenclature | Description |
|---|---|
| + | Addition modulo $2^{32}$ |
| X ↻ Y | Result of rotating X left through Y bit positions |
| f(X, Y, Z) | (X ∧ Y) ∨ (~X ∧ Z) |

| Symbolic Nomenclature | Description |
| --- | --- |
| g(X, Y, Z) | (X ∧ Y) ∨ (X ∧ Z) ∨ (Y ∧ Z) |
| h(X, Y, Z) | X ⊕ Y ⊕ Z |

The hashing algorithm consists of firstly padding the input message to be a multiple of 512 bits and initializing the chaining variables $H_{1-5}$ with $h_{1-5}$. The padded message is then processed in 512-bit chunks, with the output hash value being the final 160-bit value given by the concatenation of the chaining variables: $H_1|H_2|H_3|H_4|H_5$. The steps of the SHA-1 algorithm are now examined in greater detail.

Step 1. Preprocessing

The first step of SHA-1 is to pad the input message to be a multiple of 512 bits as follows and to initialize the chaining variables.

| Steps to follow to preprocess the input message | |
| --- | --- |
| Pad the input message | Append a 1 bit to the message |
| | Append 0 bits such that the length of the padded message is 64-bits short of a multiple of 512 bits. |
| | Append a 64-bit value containing the length in bits of the original input message. Store the length as most significant bit through to least significant bit. |
| Initialize the chaining variables | $H_1 \leftarrow h_1, H_2 \leftarrow h_2, H_3 \leftarrow h_3, H_4 \leftarrow h_4, H_5 \leftarrow h_5$ |

2. Processing

The padded input message can now be processed. We process the message in 512-bit blocks. Each 512-bit block is in the form of 16×32-bit words, referred to as $\text{InputWord}_{0-15}$.

| Steps to follow for each 512 bit block ($\text{InputWord}_{0-15}$) | |
| --- | --- |
| Copy the 512 input bits into $X_{0-15}$ | For j = 0 to 15 |
| | $X_j$ = $\text{InputWord}_j$ |
| Expand $X_{0-15}$ into $X_{16-79}$ | For j = 16 to 79 |
| | $X_j \leftarrow ((X_{j-3} \oplus X_{j-8} \oplus X_{j-14} \oplus X_{j-16}) \circlearrowleft 1)$ |
| Initialize working variables | $A \leftarrow H_1, B \leftarrow H_2, C \leftarrow H_3, D \leftarrow H_4, E \leftarrow H_5$ |
| Round 1 | For j = 0 to 19 |
| | $t \leftarrow ((A \circlearrowleft 5) + f(B, C, D) + E + X_j + y_1)$ |
| | $E \leftarrow D, D \leftarrow C, C \leftarrow (B \circlearrowleft 30), B \leftarrow A, A \leftarrow t$ |
| Round 2 | For j = 20 to 39 |
| | $t \leftarrow ((A \circlearrowleft 5) + h(B, C, D) + E + X_j + y_2)$ |
| | $E \leftarrow D, D \leftarrow C, C \leftarrow (B \circlearrowleft 30), B \leftarrow A, A \leftarrow t$ |
| Round 3 | For j = 40 to 59 |
| | $t \leftarrow ((A \circlearrowleft 5) + g(B, C, D) + E + X_j + y_3)$ |
| | $E \leftarrow D, D \leftarrow C, C \leftarrow (B \circlearrowleft 30), B \leftarrow A, A \leftarrow t$ |
| Round 4 | For j = 60 to 79 |
| | $t \leftarrow ((A \circlearrowleft 5) + h(B, C, D) + E + X_j + y_4)$ |
| | $E \leftarrow D, D \leftarrow C, C \leftarrow (B \circlearrowleft 30), B \leftarrow A, A \leftarrow t$ |
| Update chaining variables | $H_1 \leftarrow H_1 + A, H_2 \leftarrow H_2 + B,$ |
| | $H_3 \leftarrow H_3 + C, H_4 \leftarrow H_4 + D,$ |
| | $H_5 \leftarrow H_5 + E$ |

Step 3. Completion

After all the 512-bit blocks of the padded input message have been processed, the output hash value is the final 160-bit value given by: $H_1|H_2|H_3|H_4|H_5$.

Optimization for Hardware Implementation

The SHA-1 Step 2 procedure is not optimized for hardware. In particular, the 80 temporary 32-bit registers use up valuable silicon on a hardware implementation. This section describes an optimization to the SHA-1 algorithm that only uses 16 temporary registers. The reduction in silicon is from 2560 bits down to 512 bits, a saving of over 2000 bits. It may not be important in some applications, but in the Authentication Chip storage space must be reduced where possible. The optimization is based on the fact that although the original 16-word message block is expanded into an 80-word message block, the 80 words are not updated during the algorithm. In addition, the words rely on the previous 16 words only, and hence the expanded words. can be calculated on-the-fly during processing, as long as we keep 16 words for the backward references. We require rotating counters to keep track of which register we are up to using, but the effect is to save a large amount of storage. Rather than index X by a single value j, we use a 5 bit counter to count through the iterations. This can be achieved by initializing a 5-bit register with either 16 or 20, and decrementing it until it reaches 0. In order to update the 16 temporary variables as if they were 80, we require 4 indexes, each a 4-bit register. All 4 indexes increment (with wraparound) during the course of the algorithm.

| Steps to follow for each 512 bit block ($\text{InputWord}_{0-15}$) | |
| --- | --- |
| Initialize working variables | $A \leftarrow H_1, B \leftarrow H_2, C \leftarrow H_3, D \leftarrow H_4, E \leftarrow H_5$ |
| | $N_1 \leftarrow 13, N_2 \leftarrow 8, N_3 \leftarrow 2, N_4 \leftarrow 0$ |
| Round 0 | Do 16 times: |
| Copy the 512 input bits into $X_{0-15}$ | $X_{N4} = \text{InputWord}_{N4}$ |
| | $[\Uparrow N_1, \Uparrow N_2, \Uparrow N_3]_{\text{optional}} \Uparrow N_4$ |
| Round 1A | Do 16 times: |
| | $t \leftarrow ((A \circlearrowleft 5) + f(B, C, D) + E + X_{N4} + y_1)$ |
| | $[\Uparrow N_1, \Uparrow N_2, \Uparrow N_3]_{\text{optional}} \Uparrow N_4$ |
| | $E \leftarrow D, D \leftarrow C, C \leftarrow (B \circlearrowleft 30), B \leftarrow A, A \leftarrow t$ |
| Round 1B | Do 4 times: |
| | $X_{N4} \leftarrow ((X_{N1} \oplus X_{N2} \oplus X_{N3} \oplus X_{N4}) \circlearrowleft 1)$ |
| | $t \leftarrow ((A \circlearrowleft 5) + f(B, C, D) + E + X_{N4} + y_1)$ |
| | $\Uparrow N_1, \Uparrow N_2, \Uparrow N_3, \Uparrow N_4$ |
| | $E \leftarrow D, D \leftarrow C, C \leftarrow (B \circlearrowleft 30), B \leftarrow A, A \leftarrow t$ |
| Round 2 | Do 20 times: |
| | $X_{N4} \leftarrow ((X_{N1} \oplus X_{N2} \oplus X_{N3} \oplus X_{N4}) \circlearrowleft 1)$ |
| | $t \leftarrow ((A \circlearrowleft 5) + h(B, C, D) + E + X_{N4} + y_2)$ |
| | $\Uparrow N_1, \Uparrow N_2, \Uparrow N_3, \Uparrow N_4$ |
| | $E \leftarrow D, D \leftarrow C, C \leftarrow (B \circlearrowleft 30), B \leftarrow A, A \leftarrow t$ |
| Round 3 | Do 20 times: |
| | $X_{N4} \leftarrow ((X_{N1} \oplus X_{N2} \oplus X_{N3} \oplus X_{N4}) \circlearrowleft 1)$ |
| | $t \leftarrow ((A \circlearrowleft 5) + g(B, C, D) + E + X_{N4} + y_3)$ |
| | $\Uparrow N_1, \Uparrow N_2, \Uparrow N_3, \Uparrow N_4$ |
| | $E \leftarrow D, D \leftarrow C, C \leftarrow (B \circlearrowleft 30), B \leftarrow A, A \leftarrow t$ |
| Round 4 | Do 20 times: |
| | $X_{N4} \leftarrow ((X_{N1} \oplus X_{N2} \oplus X_{N3} \oplus X_{N4}) \circlearrowleft 1)$ |
| | $t \leftarrow ((A \circlearrowleft 5) + h(B, C, D) + E + X_{N4} + y_4)$ |
| | $\Uparrow N_1, \Uparrow N_2, \Uparrow N_3, \Uparrow N_4$ |
| | $E \leftarrow D, D \leftarrow C, C \leftarrow (B \circlearrowleft 30), B \leftarrow A, A \leftarrow t$ |
| Update chaining variables | $H_1 \leftarrow H_1 + A, H_2 \leftarrow H_2 + B,$ |
| | $H_3 \leftarrow H_3 + C, H_4 \leftarrow H_4 + D,$ |
| | $H_5 \leftarrow H_5 + E$ |

The incrementing of $N_1$, $N_2$, and $N_3$ during Rounds 0 and 1A is optional. A software implementation would not increment them, since it takes time, and at the end of the 16 times through the loop, all 4 counters will be their original values. Designers of hardware may wish to increment all 4 counters together to save on control logic. Round 0 can be completely omitted if the caller loads the 512 bits of $X_{0-15}$.

HMAC-SHA1

In the Authentication Chip implementation, the HMAC-SHA1 unit only ever performs hashing on two types of inputs: on R using $K_1$ and on R|M using $K_2$. Since the inputs are two constant lengths, rather than have HMAC and SHA-1 as separate entities on chip, they can be combined and the hardware optimized. The padding of messages in SHA-1 Step 1 (a 1 bit, a string of 0 bits, and the length of the message) is necessary to ensure that different messages will not look the same after padding. Since we only deal with 2 types of messages, our padding can be constant 0s. In addition, the optimized version of the SHA-1 algorithm is used, where only 16 32-bit words are used for temporary storage. These 16 registers are loaded directly by the optimized HMAC-SHA1 hardware. The Nine 32-bit constants $h_{1-5}$ and $y_{1-4}$ are still required, although the fact that they are constants is an advantage for hardware implementation. Hardware optimized HMAC-SHA-1 requires a total of 1024 bits of data storage:

Five 32-bit chaining variables are defined: $H_1$, $H_2$, $H_3$, $H_4$ and $H_5$.

Five 32-bit working variables are defined: A, B, C, D, and E.

Five 32-bit variables for temporary storage and final result: $Buff160_{1-5}$

One 32 bit temporary variable is defined: t.

Sixteen 32-bit temporary registers are defined: $X_{0-15}$.

The following two sections describe the steps for the two types of calls to HMAC-SHA1.

H[R, $K_1$]

The case of producing the keyed hash of R using $K_1$, the original input message R is a constant length of 160 bits. We can therefore take advantage of this fact during processing. Rather than load $X_{0-15}$ during the first part of the SHA-1 algorithm, we load $X_{0-15}$ directly, and thereby omit Round 0 of the optimized Process Block (Step 2) of SHA-1. The pseudocode takes on the following steps:

| Step | Description | Action |
|---|---|---|
| 1 | Process K ⊕ ipad | $X_{0-4} \leftarrow K_1 \oplus 0x363636\ldots$ |
| 2 | | $X_{5-15} \leftarrow 0x363636\ldots$ |
| 3 | | $H_{1-5} \leftarrow h_{1-5}$ |
| 4 | | Process Block |
| 5 | Process R | $X_{0-4} \leftarrow R$ |
| 6 | | $X_{5-15} \leftarrow 0$ |
| 7 | | Process Block |
| 8 | | $Buff160_{1-5} \leftarrow H_{1-5}$ |
| 9 | Process K ⊕ opad | $X_{0-4} \leftarrow K_1 \oplus 0x5C5C5C\ldots$ |
| 10 | | $X_{5-15} \leftarrow 0x5C5C5C\ldots$ |
| 11 | | $H_{1-5} \leftarrow h_{1-5}$ |
| 12 | | Process Block |
| 13 | Process previous H[x] | $X_{0-4} \leftarrow$ Result |
| 14 | | $X_{5-15} \leftarrow 0$ |
| 15 | | Process Block |
| 16 | Get results | $Buff160_{1-5} \leftarrow H_{1-5}$ |

H[R|M, $K_2$]

In the case of producing the keyed hash of R|M using $K_2$, the original input message is a constant length of 416 (256+160) bits. We can therefore take advantage of this fact during processing. Rather than load $X_{0-15}$ during the first part of the SHA-1 algorithm, we load $X_{0-15}$ directly, and thereby omit Round 0 of the optimized Process Block (Step 2) of SHA-1. The pseudocode takes on the following steps:

| Step | Description | Action |
|---|---|---|
| 1 | Process K ⊕ ipad | $X_{0-4} \leftarrow K_2 \oplus 0x363636\ldots$ |
| 2 | | $X_{5-15} \leftarrow 0x363636\ldots$ |
| 3 | | $H_{1-5} \leftarrow h_{1-5}$ |
| 4 | | Process Block |
| 5 | Process R \| M | $X_{0-4} \leftarrow R$ |
| 6 | | $X_{5-12} \leftarrow M$ |
| 7 | | $X_{13-15} \leftarrow 0$ |

-continued

| Step | Description | Action |
|---|---|---|
| 8 | | Process Block |
| 9 | | Temp $\leftarrow H_{1-5}$ |
| 10 | Process K ⊕ opad | $X_{0-4} \leftarrow K_2 \oplus 0x5C5C5C\ldots$ |
| 11 | | $X_{5-15} \leftarrow 0x5C5C5C\ldots$ |
| 12 | | $H_{1-5} \leftarrow h_{1-5}$ |
| 13 | | Process Block |
| 14 | Process previous H[x] | $X_{0-4} \leftarrow$ Temp |
| 15 | | $X_{5-15} \leftarrow 0$ |
| 16 | | Process Block |
| 17 | Get results | Result $\leftarrow H_{1-5}$ |

Data Storage Integrity

Each Authentication Chip contains some non-volatile memory in order to hold the variables required by Authentication Protocol 3. The following non-volatile variables are defined:

Note that if these variables are in Flash memory, it is not a simple matter to write a new value to replace the old. The memory must be erased first, and then the appropriate bits set. This has an effect on the algorithms used to change Flash memory based variables. For example, Flash memory cannot easily be used as shift registers. To update a Flash memory variable by a general operation, it is necessary to follow these steps:

Read the entire N bit value into a general purpose register;

Perform the operation on the general purpose register;

Erase the Flash memory corresponding to the variable; and

Set the bits of the Flash memory location based on the bits set in the general-purpose register.

A RESET of the Authentication Chip has no effect on these non-volatile variables.

M and AccessMode

Variables M[0] through M[15] are used to hold consumable state data, such as serial numbers, batch numbers, and amount of consumable remaining. Each M[n] register is 16 bits, making the entire M vector 256 bits (32 bytes). Clients cannot read from or written to individual M[n] variables. Instead, the entire vector, referred to as M, is read or written in a single logical access. M can be read using the RD (read) command, and written to via the WR (write) command. The commands only succeed if $K_1$ and $K_2$ are both defined (SIWritten=1) and the Authentication Chip is a consumable non-trusted chip (IsTrusted=0). Although M may contain a number of different data types, they differ only in their write permissions. Each data-type can always be read. Once in client memory, the 256 bits can be interpreted in any way chosen by the client. The entire 256 bits of M are read at one time instead of in smaller amounts for reasons of security, as described in the chapter entitled Authentication. The different write permissions are outlined in the following table:

To accomplish the protection required for writing, a 2-bit access mode value is defined for each M[n]. The following table defines the interpretation of the 2-bit access mode bit-pattern:

The 16 sets of access mode bits for the 16 M[n] registers are gathered together in a single 32-bit AccessMode register. The 32 bits of the AccessMode register correspond to M[n] with n as follows:

Each 2-bit value is stored in hi/lo format. Consequently, if M[0-5] were access mode MSR, with M[6–15] access mode RO, the 32-bit AccessMode register would be:

11-11-11-11-11-11-11-11-11-11-01-01-01-01-01-01

During execution of a WR (write) command, AccessMode[n] is examined for each M[n], and a decision made as to whether the new M[n] value will replace the old. The AccessMode register is set using the Authentication Chip's SAM (Set Access Mode) command. Note that the Decrement Only comparison is unsigned, so any Decrement Only values that require negative ranges must be shifted into a positive range. For example, a consumable with a Decrement Only data item range of −50 to 50 must have the range shifted to be 0 to 100. The System must then interpret the range 0 to 100 as being −50 to 50. Note that most instances of Decrement Only ranges are N to 0, so there is no range shift required. For Decrement Only data items, arrange the data in order from most significant to least significant 16-bit quantities from M[n] onward. The access mode for the most significant 16 bits (stored in M[n]) should be set to MSR. The remaining registers (M[n+1], M[n+2] etc) should have their access modes set to NMSR. If erroneously set to NMSR, with no associated MSR region, each NMSR region will be considered independently.instead of being a multi-precision comparison.

$K_1$ $K_1$ is the 160-bit secret key used to transform R during the authentication protocol. $K_1$ is programmed along with $K_2$ and R with the SSI (Set Secret Information) command. Since $K_1$ must be kept secret, clients cannot directly read $K_1$. The commands that make use of $K_1$ are RND and RD. RND returns a pair R, $F_{K1}[R]$ where R is a random number, while RD requires an X, $F_{K1}[X]$ pair as input. $K_1$ is used in the keyed one-way hash function HMAC-SHA1. As such it should be programmed with a physically generated random number, gathered from a physically random phenomenon. $K_1$ must NOT be generated with a computer-run random number generator. The security of the Authentication chips depends on $K_1$, $K_2$ and R being generated in a way that is not deterministic. For example, to set $K_1$, a person can toss a fair coin 160 times, recording heads as 1, and tails as 0. $K_1$ is automatically cleared to 0 upon execution of a CLR command. It can only be programmed to a non-zero value by the SSI command.

$K_2$ $K_2$ is the 160-bit secret key used to transform M|R during the authentication protocol. $K_2$ is programmed along with $K_1$ and R with the SSI (Set Secret Information) command. Since $K_2$ must be kept secret, clients cannot directly read $K_2$. The commands that make use of $K_2$ are RD and TST. RD returns a pair M, $F_{K2}[M|X]$ where X was passed in as one of the parameters to the RD function. TST requires an M, $F_{K2}[M|R]$ pair as input, where R was obtained from the Authentication Chip's RND function. $K_2$ is used in the keyed one-way hash function HMAC-SHA1. As such it should be programmed with a physically generated random number, gathered from a physically random phenomenon. $K_2$ must NOT be generated with a computer-run random number generator. The security of the Authentication chips depends on $K_1$, $K_2$ and R being generated in a way that is not deterministic. For example, to set $K_2$, a person can toss a fair coin 160 times, recording heads as 1, and tails as 0. $K_2$ is automatically cleared to 0 upon execution of a CLR command. It can only be programmed to a non-zero value by the SI command.

R and IsTrusted

R is a 160-bit random number seed that is programmed along with $K_1$ and $K_2$ with the SSI (Set Secret Information) command. R does not have to be kept secret, since it is given freely to callers via the RND command. However R must be changed only by the Authentication Chip, and not set to any chosen value by a caller. R is used during the TST command to ensure that the R from the previous call to RND was used to generate the $F_{K2}[M|R]$ value in the non-trusted Authentication Chip (ChipA). Both RND and TST are only used in trusted Authentication Chips (ChipT). IsTrusted is a 1-bit flag register that determines whether or not the Authentication Chip is a trusted chip (ChipT):

If the IsTrusted bit is set, the chip is considered to be a trusted chip, and hence clients can call RND and TST functions (but not RD or WR).

If the IsTrusted bit is clear, the chip is not considered to be trusted. Therefore RND and TST functions cannot be called (but RD and WR functions can be called instead). System never needs to call RND or TST on the consumable (since a clone chip would simply return 1 to a function such as TST, and a constant value for RND).

The IsTrusted bit has the added advantage of reducing the number of available R, $F_{K1}[R]$ pairs obtainable by an attacker, yet still maintain the integrity of the Authentication protocol. To obtain valid R, $F_{K1}[R]$ pairs, an attacker requires a System Authentication Chip, which is more expensive and less readily available than the consumables. Both R and the IsTrusted bit are cleared to 0 by the CLR command. They are both written to by the issuing of the SSI command. The IsTrusted bit can only set by storing a non-zero seed value in R via the SSI command (R must be non-zero to be a valid LFSR state, so this is quite reasonable). R is changed via a 160-bit maximal period LFSR with taps on bits 1, 2, 4, and 159, and is changed only by a successful call to TST (where 1 is returned).

Authentication Chips destined to be trusted Chips used in Systems (ChipT) should have their IsTrusted bit set during programming, and Authentication Chips used in Consumables (ChipA) should have their IsTrusted bit kept clear (by storing 0 in R via the SSI command during programming). There is no command to read or write the IsTrusted bit directly. The security of the Authentication Chip does not only rely upon the randomness of $K_1$ and $K_2$ and the strength of the HMAC-SHA1 algorithm. To prevent an attacker from building a sparse lookup table, the security of the Authentication Chip also depends on the range of R over the lifetime of all Systems. What this means is that an attacker must not be able to deduce what values of R there are in produced and future Systems. As such R should be programmed with a physically generated random number, gathered from a physically random phenomenon. R must NOT be generated with a computer-run random number generator. The generation of R must not be deterministic. For example, to generate an R for use in a trusted System chip, a person can toss a fair coin 160 times, recording heads as 1, and tails as 0. 0 is the only non-valid initial value for a trusted R is 0 (or the IsTrusted bit will not be set)

SIWritten

The SIWritten (Secret Information Written) 1-bit register holds the status of the secret information stored within the Authentication Chip. The secret information is $K_1$, $K_2$ and R. A client cannot directly access the SIWritten bit. Instead, it is cleared via the CLR command (which also clears $K_1$, $K_2$ and R). When the Authentication Chip is programmed with secret keys and random number seed using the SSI command (regardless of the value written), the SIWritten bit is set automatically. Although R is strictly not secret, it must be written together with $K_1$ and $K_2$ to ensure that an attacker cannot generate their own random number seed in order to obtain chosen R, $F_{K1}[R]$ pairs. The SIWritten status bit is used by all functions that access $K_1$, $K_2$, or R. If the SIWritten bit is clear, then calls to RD, WR, RND, and TST are interpreted as calls to CLR.

MinTicks

There are two mechanisms for preventing an attacker from generating multiple calls to TST and RD functions in a short period of time. The first is a clock limiting hardware component that prevents the internal clock from operating at a speed more than a particular maximum (e.g. 10 MHz). The second mechanism is the 32-bit MinTicks register, which is used to specify the minimum number of clock ticks that must elapse between calls to key-based functions. The MinTicks variable is cleared to 0 via the CLR command. Bits can then be set via the SMT (Set MinTicks) command. The input parameter to SMT contains the bit pattern that represents which bits of MinTicks are to be set. The practical effect is that an attacker can only increase the value in MinTicks (since the SMT function only sets bits). In addition, there is no function provided to allow a caller to read the current value of this register. The value of MinTicks depends on the operating clock speed and the notion of what constitutes a reasonable time between key-based function calls (application specific). The duration of a single tick depends on the operating clock speed. This is the maximum of the input clock speed and the Authentication Chip's clock-limiting hardware. For example, the Authentication Chip's clock-limiting hardware may be set at 10 MHz (it is not changeable), but the input clock is 1 MHz. In this case., the value of 1 tick is based on 1 MHz, not 10 MHz. If the input clock was 20 MHz instead of 1 MHz, the value of 1 tick is based on 10 MHz (since the clock speed is limited to 10 MHz).

Once the duration of a tick is known, the MinTicks value can to be set. The value for MinTicks is the minimum number of ticks required to pass between calls to the key-based RD and TST functions. The value is a real-time number, and divided by the length of an operating tick. Suppose the input clock speed matches the maximum clock speed of 10 MHz. If we want a minimum of 1 second between calls to key based functions, the value for MinTicks is set to 10,000,000. Consider an attacker attempting to collect X, $F_{K1}[X]$ pairs by calling RND, RD and TST multiple times. If the MinTicks value is set such that the amount of time between calls to TST is 1 second, then each pair requires 1 second to generate. To generate $2^{25}$ pairs (only requiring 1.25 GB of storage), an attacker requires more than 1 year. An attack requiring $2^{64}$ pairs would require $5.84 \times 10^{11}$ years using a single chip, or 584 years if 1 billion chips were used, making such an attack completely impractical in terms of time (not to mention the storage requirements!).

With regards to $K_1$, it should be noted that the MinTicks variable only slows down an attacker and causes the attack to cost more since it does not stop an attacker using multiple System chips in parallel. However MinTicks does make an attack on $K_2$ more difficult, since each consumable has a different M (part of M is random read-only data). In order to launch a differential attack, minimally different inputs are required, and this can only be achieved with a single consumable (containing an effectively constant part of M). Minimally different inputs require the attacker to use a single chip, and MinTicks causes the use of a single chip to be slowed down. If it takes a year just to get the data to start searching for values to begin a differential attack this increases the cost of attack and reduces the effective market time of a clone consumable.

Authentication Chip Commands

The System communicates with the Authentication Chips via a simple operation command set. This section details the actual commands and parameters necessary for implementation of Protocol 3. The Authentication Chip is defined here as communicating to System via a serial interface as a minimum implementation. It is a trivial matter to define an equivalent chip that operates over a wider interface (such as 8, 16 or 32 bits). Each command is defined by 3-bit opcode. The intepretation of the opcode can depend on the current value of the IsTrusted bit and the current value of the IsWritten bit. The following operations are defined:

Any command not defined in this table is interpreted as NOP (No Operation). Examples include opcodes 110 and 111 (regardless of IsTrusted or IsWritten values), and any opcode other than SSI when IsWritten=0. Note that the opcodes for RD and RND are the same, as are the opcodes for WR and TST. The actual command run upon receipt of the opcode will depend on the current value of the IsTrusted bit (as long as IsWritten is 1). Where the IsTrusted bit is clear, RD and WR functions will be called. Where the IsTrusted bit is set, RND and TST functions will be called. The two sets of commands are mutually exclusive between trusted and non-trusted Authentication Chips, and the same opcodes enforces this relationship. Each of the commands is examined in detail in the subsequent sections. Note that some algorithms are specifically designed because. Flash memory is assumed for the implementation of non-volatile variables.

The CLR (Clear) Command is designed to completely erase the contents of all Authentication Chip memory. This includes all keys and secret information, access mode bits, and state data. After the execution of the CLR command, an Authentication Chip will be in a programmable state, just as if it had been freshly manufactured. It can be reprogrammed with a new key and reused. A CLR command consists of simply the CLR command opcode. Since the Authentication Chip is serial, this must be transferred one bit at a time. The bit order is LSB to MSB for each command component. A CLR command is therefore sent as bits 0–2 of the CLR opcode. A total of 3 bits are transferred. The CLR command can be called directly at any time. The order of erasure is important. SIWritten must be cleared first, to disable further calls to key access functions (such as RND, TST, RD and WR). If the AccessMode bits are cleared before SIWritten, an attacker could remove power at some point after they have been cleared, and manipulate M, thereby have a better chance of retrieving the secret information with a partial chosen text attack. The CLR command is implemented with the following steps:

Once the chip has been cleared it is ready for reprogramming and reuse. A blank chip is of no use to an attacker, since although they can create any value for M (M can be read from and written to), key-based functions will not provide any. information as $K_1$ and $K_2$ will be incorrect. It is not necessary to consume any input parameter bits if CLR is called for any opcode other than CLR. An attacker will simply have to RESET the chip. The reason for calling CLR is to ensure that all secret information has been destroyed, making the chip useless to an attacker.

SSI—Set Secret Information

Input: $K_1$, $K_2$, R=[160 bits, 160 bits, 160 bits]

Output: None

Changes: $K_1$, $K_2$, R, SIWritten, IsTrusted

The SSI (Set Secret Information) command is used to load the $K_1$, $K_2$ and R variables, and to set SIWritten and IsTrusted flags for later calls to RND, TST, RD and WR commands. An SSI command consists of the SSI command opcode followed by the secret information to be stored in the $K_1$, $K_2$ and R registers. Since the Authentication Chip is serial, this must be transferred one bit at a time. The bit order is LSB. to MSB for each command component. An SSI command is therefore sent as: bits 0–2 of the SSI opcode, followed by bits 0–159 of the new value for $K_1$, bits 0–159 of the new value for $K_2$, and finally bits 0–159 of the seed value for R. A total of 483 bits are transferred. The $K_1$, $K_2$, R, SIWritten, and IsTrusted registers are all cleared to 0 with a CLR command. They can only be set using the SSI command.

The SSI command uses the flag SIWritten to store the fact that data has been loaded into $K_1$, $K_2$ and R. If the SIWritten and IsTrusted flags are clear (this is the case after a CLR instruction), then $K_1$, $K_2$ and R are loaded with the new values. If either flag is set, an attempted call to SSI results in a CLR command being executed, since only an attacker or an erroneous client would attempt to change keys or the random seed without calling CLR first. The SSI command also sets the IsTrusted flag depending on the value for R. If R=0, then the chip is considered untrustworthy, and therefore IsTrusted remains at 0. If R≠0, then the chip is considered trustworthy, and therefore IsTrusted is set to 1. Note that the setting of the IsTrusted bit only occurs during the SSI command. If an Authentication Chip is to be reused, the CLR command must be called first. The keys can then be safely reprogrammed with an SSI command, and fresh state information loaded into M using the SAM and WR commands. The SSI command is implemented with the following steps:

RD—Read

Input: X, $F_{K1}[X]$=[160 bits, 160 bits]

Output: M, $F_{K2}[X|M]$=[256 bits, 160 bits]

Changes: R

The RD (Read) command is used to securely read the entire 256 bits of state data (M) from a non-trusted Authentication Chip. Only a valid Authentication Chip will respond correctly to the RD request. The output bits from the RD command can be fed as the input bits to the TST command on a trusted Authentication Chip for verification, with the first 256 bits (M) stored for later use if (as we hope) TST returns 1. Since the Authentication Chip is serial, the command and input parameters must be transferred one bit at a time. The bit order is LSB to MSB for each command component. A RD command is therefore: bits 0–2 of the RD opcode, followed by bits 0–159 of X, and bits 0–159 of $F_{K1}[X]$. 323 bits are transferred in total. X and $F_{K1}[X]$ are obtained by calling the trusted Authentication Chip's RND command. The 320 bits output by the trusted chip's RND command can therefore be fed directly into the non-trusted chip's RD command, with no need for these bits to be stored by System. The RD command can only be used when the following conditions have been met:

In addition, calls to RD must wait for the MinTicksRemaining register to reach 0. Once it has done so, the register is reloaded with MinTicks to ensure that a minimum time will elapse between calls to RD. Once MinTicksRemaining has been reloaded with MinTicks, the RD command verifies that the input parameters are valid. This is accomplished by internally generating $F_{K1}[X]$ for the input X, and then comparing the result against the input $F_{K1}[X]$. This generation and comparison must take the same amount of time regardless of whether the input parameters are correct or not. If the times are not the same, an attacker can gain information about which bits of $F_{K1}[X]$ are incorrect. The only way for the input parameters to be invalid is an erroneous System (passing the wrong bits), a case of the wrong consumable in the wrong System, a bad trusted chip (generating bad pairs), or an attack on the Authentication Chip. A constant value of 0 is returned when the input parameters are wrong. The time taken for 0 to be returned must be the same for all bad inputs so that attackers can learn nothing about what was invalid. Once the input parameters have been verified the output values are calculated. The 256 bit content of M are transferred in the following order: bits 0–15 of M[0], bits 0–15 of M[1], through to bits 0–15 of M[15]. $F_{K2}[X|M]$ is calculated and output as bits 0–159. The R register is used to store the X value during the validation of the X, $F_{K1}[X]$ pair. This is because RND and RD are mutually exclusive. The RD command is implemented with the following steps:

RND—Random

Input: None

Output: R, $F_{K1}[R]$=[160 bits, 160 bits]

Changes: None

The RND (Random) command is used by a client to obtain a valid R, $F_{K1}[R]$ pair for use in a subsequent authentication via the RD and TST commands. Since there are no input parameters, an RND command is therefore simply bits 0–2 of the RND opcode. The RND command can only be used when the following conditions have been met: RND returns both R and $F_{K1}[R]$ to the caller. The 288-bit output of the RND command can be fed straight into the non-trusted chip's RD command as the input parameters. There is no need for the client to store them at all, since they are not required again. However the TST command will only succeed if the random number passed into the RD command was obtained first from the RND command. If a caller only calls RND multiple times, the same R, $F_{K1}[R]$ pair will be returned each time. R will only advance to the next random number in the sequence after a successful call to TST. See TST for more information. The RND command is implemented with the following steps:

TST—Test

Input: X, $F_{K2}[R|X]$=[256 bits, 160 bits]

Output: 1 or 0=[1 bit]

Changes: M, R and MinTicksRemaining (or all registers if attack detected)

The TST (Test) command is used to authenticate a read of M from a non-trusted Authentication Chip. The TST (Test) command consists of the TST command opcode followed by input parameters: X and $F_{K2}[R X]$. Since the Authentication Chip is serial, this must be transferred one bit at a time. The bit order is LSB to MSB for each command component. A TST command is therefore: bits 0–2 of the TST opcode, followed by bits 0–255 of M, bits 0–159 of $F_{K2}[R|M]$. 419 bits are transferred in total. Since the last 416 input bits are obtained as the output bits from a RD command to a non-trusted Authentication Chip, the entire data does not even have to be stored by the client. Instead, the bits can be passed directly to the trusted Authentication Chip's TST command. Only the 256 bits of M should be kept from a RD command. The TST command can only be used when the following conditions have been met:

In addition, calls to TST must wait for the MinTicksRemaining register to reach 0. Once it has done so, the register is reloaded with MinTicks to ensure that a minimum time. will elapse between calls to TST. TST causes the internal M value to be replaced by the input M value. $F_{K2}[M|R]$ is then calculated, and compared against the 160 bit input hash value. A single output bit is produced: 1 if they are the same, and 0 if they are different. The use of the internal M value is to save space on chip, and is the reason why RD and TST are mutually exclusive commands. If the output bit is 1, R is updated to be the next random number in the sequence. This forces the caller to use a new random number each time RD and TST are called. The resultant output bit is not output until the entire input string has been compared, so that the time to evaluate the comparison in the TST function is always the same. Thus no attacker can compare execution times or number of bits processed before an output is given.

The next random number is generated from R using a 160-bit maximal period LFSR (tap selections on bits 159, 4, 2, and 1). The initial 160-bit value for R is set up via the SSI command, and can be any random number except 0 (an LFSR filled with 0s will produce a never-ending stream of 0s). R is transformed by XORing bits 1, 2, 4, and 159 together, and shifting all 160 bits right 1 bit using the XOR result as the input bit to $b_{159}$. The new R will be returned on the next call to RND. Note that the time taken for 0 to be returned from TST must be the same for all bad inputs so that attackers can learn nothing about what was invalid about the input.

The TST command is implemented with the following steps:

Note that we can't simply advance R directly in Step 7 since R is Flash memory, and must be erased in order for any set bit to become 0. If power is removed from the Authentication Chip during Step 7 after erasing the old value of R, but before the new value for R has been written, then R will be erased but not reprogrammed. We therefore have the situation of IsTrusted=1, yet R=0, a situation only possible due to an attacker. Step 4 detects this event, and takes action if the attack is detected. This problem can be avoided by having a second 160-bit Flash register for R and a Validity Bit, toggled after the new value has been loaded. It has not been included in this implementation for reasons of space, but if chip space allows it, an extra 160-bit Flash register would be useful for this purpose.

WR—Write

Input: $M_{new}$=[256 bits]

Output: None

Changes: M

A WR (Write) command is used to update the writeable parts of M containing Authentication Chip state data. The WR command by itself is not secure. It must be followed by an authenticated read of M (via a RD command) to ensure that the change was made as specified. The WR command is called by passing the WR command opcode followed by the new 256 bits of data to be written to M. Since the Authentication Chip is serial, the new value for M must be transferred one bit at a time. The bit order is LSB to MSB for each command component. A WR command is therefore: bits 0–2 of the WR opcode, followed by bits 0–15 of M[0], bits 0–15 of M[1], through to bits 0–15 of M[15]. 259 bits are transferred in total. The WR command can only be used when SIWritten=1, indicating that $K_1$, $K_2$ and R have been set up via the SSI command (if SIWritten is 0, then $K_1$, $K_2$ and R have not been setup yet, and the CLR command is called instead). The ability to write to, a specific M[n] is governed by the corresponding Access Mode bits as stored in the AccessMode register. The AccessMode bits can be set using the SAM command. When writing the new value to M[n] the fact that M[n] is Flash memory must be taken into account. All the bits of M[n] must be erased, and then the appropriate bits set. Since these two steps occur on different cycles, it leaves the possibility of attack open. An attacker can remove power after erasure, but before programming with the new value. However, there is no advantage to an attacker in doing this:

A Read/Write M[n] changed to 0 by this means is of no advantage since the attacker could have written any value using the WR command anyway.

A Read Only M[n] changed to 0 by this means allows an additional known text pair (where the M[n] is 0 instead of the original value). For future use M[n] values, they are already 0, so no information is given.

A Decrement Only M[n] changed to 0 simply speeds up the time in which the consumable is used up. It does not give any new information to an attacker that using the consumable would give.

The WR command is implemented with the following steps:

SAM—Set AccessMode

Input: AccessMode$_{new}$=[32 bits]

Output: AccessMode=[32 bits]

Changes: AccessMode

The SAM (Set Access Mode) command is used to set the 32 bits of the AccessMode register, and is only available for use in consumable Authentication Chips (where the IsTrusted flag=0) The SAM command is called by passing the SAM command opcode followed by a 32-bit value that is used to set bits in the AccessMode register. Since the Authentication Chip is serial, the data must be transferred one bit at a time. The bit order is LSB to MSB for each command component. A SAM command is therefore: bits 0–2 of the SAM opcode, followed by bits 0–31 of bits to be set in AccessMode. 35 bits are transferred in total. The AccessMode register is only cleared to 0 upon execution of a CLR command. Since an access mode of 00 indicates an access mode of RW (read/write), not setting any AccessMode bits after a CLR means that all of M can be read from and written to. The SAM command only sets bits in the AccessMode register. Consequently a client can change the access mode bits for M[n] from RW to RO (read only) by setting the appropriate bits in a 32-bit word, and calling SAM with that 32-bit value as the input parameter. This allows the programming of the access mode bits at different times, perhaps at different stages of the manufacturing process. For example, the read only random data can be written to during the initial key programming stage, while allowing a second programming stage for items such as consumable serial numbers.

Since the SAM command only sets bits, the effect is to allow the access mode bits corresponding to M[n] to progress from RW to either MSR, NMSR, or RO. It should be noted that an access mode of MSR can be changed to RO, but this would not help an attacker, since the authentication of M after a write to a doctored Authentication Chip would detect that the write was not successful and hence abort the operation. The setting of bits corresponds to the way that Flash memory works best. The only way to clear bits in the AccessMode register, for example to change a Decrement Only M[n] to be Read/Write, is to use the CLR command. The CLR command not only erases (clears) the AccessMode register, but also clears the keys and all of M. Thus the AccessMode[n] bits corresponding to M[n] can only usefully be changed once between CLR commands. The SAM command returns the new value of the AccessMode register (after the appropriate bits have been set due to the input parameter). By calling SAM with an input parameter of 0, AccessMode will not be changed, and therefore the current value of AccessMode will be returned to the caller.

The SAM command is implemented with the following steps:

GIT—Get Is Trusted

Input: None

Output: IsTrusted=[1 bit]

Changes: None

The GIT (Get Is Trusted) command is used to read the current value of the IsTrusted bit on the Authentication Chip.

If the bit returned is 1, the Authentication Chip is a trusted System Authentication Chip. If the bit returned is 0, the Authentication Chip is a consumable Authentication Chip. A GIT command consists of simply the GIT command opcode. Since the Authentication Chip is serial, this must be transferred one bit at a time. The bit order is LSB to MSB for each command component. A GIT command is therefore sent as bits 0–2 of the GIT opcode. A total of 3 bits are transferred. The GIT command is implemented with the following steps:
SMT—Set MinTicks Input: MinTicks$_{new}$=[32 bits]

Output: None

Changes: MinTicks

The SMT (Set MinTicks) command is used to set bits in the MinTicks register and hence define the minimum number of ticks that must pass in between calls to TST and RD. The SMT command is called by passing the SMT command opcode followed by a 32-bit value that is used to set bits in the MinTicks register. Since the Authentication Chip is serial, the data must be transferred one bit at a time. The bit order is LSB to MSB for each command component. An SMT command is therefore: bits 0–2 of the SMT opcode, followed by bits 0–31 of bits to be set in MinTicks. 35 bits are transferred in total. The MinTicks register is only cleared to 0 upon execution of a CLR command. A value of 0 indicates that no ticks need to pass between calls to key-based functions. The functions may therefore be called as frequently as the clock speed limiting hardware allows the chip to run.

Since the SMT command only sets bits, the effect is to allow a client to set a value, and only increase the time delay if further calls are made. Setting a bit that is already set has no effect, and setting a bit that is clear only serves to slow the chip down further. The setting of bits corresponds to the way that Flash memory works best. The only way to clear bits in the MinTicks register, for example to change a value of 10 ticks to a value of 4 ticks, is to use the CLR command. However the CLR command clears the MinTicks register to 0 as well as clearing all keys and M. It is therefore useless for an attacker. Thus the MinTicks register can only usefully be changed once between CLR commands.

The SMT command is implemented with the following steps:
Programming Authentication Chips Authentication Chips must be programmed with logically secure information in a physically secure environment. Consequently the programming procedures cover both logical and physical security. Logical security is the process of ensuring that $K_1$, $K_2$, R, and the random M[n] values are generated by a physically random process, and not by a computer. It is also the process of ensuring that the order in which parts of the chip are programmed is the most logically secure. Physical security is the process of ensuring that the programming station is physically secure, so that $K_1$ and $K_2$ remain secret, both during the key generation stage and during the lifetime of the storage of the keys. In addition, the programming station must be resistant to physical attempts to obtain or destroy the keys. The Authentication Chip has its own security mechanisms for ensuring that $K_1$ and $K_2$ are kept secret, but the Programming Station must also keep $K_1$ and $K_2$ safe.
Overview After manufacture, an Authentication Chip must be programmed before it can be used. In all chips values for $K_1$ and $K_2$ must be established. If the chip is destined to be a System Authentication Chip, the initial value for R must be determined. If the chip is destined to be a consumable Authentication Chip, R must be. set to 0, and initial values for M and AccessMode must be set up. The following stages are therefore identified:

Determine Interaction between Systems and Consumables

Determine Keys for Systems and Consumables

Determine MinTicks for Systems and Consumables

Program Keys, Random Seed, MinTicks and Unused M

Program State Data and Access Modes

Once the consumable or system is no longer required, the attached Authentication Chip can be reused. This is easily accomplished by reprogrammed the chip starting at Stage 4 again. Each of the stages is examined in the subsequent sections.
Stage 0: Manufacture The manufacture of Authentication Chips does not require any special security. There is no secret information programmed into the chips at manufacturing stage. The algorithms and chip process is not special. Standard Flash processes are used. A theft of Authentication Chips between the chip manufacturer and programming station would only provide the clone manufacturer with blank chips. This merely compromises the sale of Authentication chips, not anything authenticated by Authentication Chips. Since the programming station is the only mechanism with consumable and system product keys, a clone manufacturer would not be able to program the chips with the correct key. Clone manufacturers would be able to program the blank chips for their own systems and consumables, but it would be difficult to place these items on the market without detection. In addition, a single theft would be difficult to base a business around.
Stage 1: Determine Interaction Between Systems and Consumables The decision of what is a System and what is a Consumable needs to be determined before any Authentication Chips can be programmed. A decision needs to be made about which Consumables can be used in which Systems, since all connected Systems and Consumables must share the same key information. They also need to share state-data usage mechanisms even if some of the interpretations of that data have not yet been determined. A simple example is that of a car and car-keys. The car itself is the System, and the car-keys are the consumables. There are several car-keys for each car, each containing the same key information as the specific car. However each car (System) would contain a different key (shared by its car-keys), since we don't want car-keys from one car working in another. Another example is that of a photocopier that requires a particular toner cartridge. In simple terms the photocopier is the System, and the toner cartridge is the consumable. However the decision must be made as to what compatibility there is to be between cartridges and photocopiers. The decision has historically been made in terms of the physical packaging of the toner cartridge: certain cartridges will or won't fit in a new model photocopier based on the design decisions for that copier. When Authentication Chips are used, the components that must work together must share the same key information.

In addition, each type of consumable requires a different way of dividing M (the state data). Although the way in which M is used will vary from application to application, the method of allocating M[n] and AccessMode[n] will be the same:

Define the consumable state data for specific use

Set some M[n] registers aside for future use (if required). Set these to be 0 and Read Only. The value can be tested for in Systems to maintain compatibility.

Set the remaining M[n] registers (at least one, but it does not have to be M[15] to be Read Only, with the contents of each M[n] completely random. This is to make it more difficult for a clone manufacturer to attack the authentication keys.

The following examples show ways in which the state data may be organized.

EXAMPLE 1

Suppose we have a car with associated car-keys. A 16-bit key number is more than enough to uniquely identify. each car-key for a given car. The 256 bits of M could be divided up as follows:

If the car manufacturer keeps all logical keys for all cars, it is a trivial matter to manufacture a new physical car-key for a given car should one be lost. The new car-key would contain a new Key Number in M[0], but have the same $K_1$ and $K_2$ as the car's Authentication Chip. Car Systems could allow specific key numbers to be invalidated (for example if a key is lost). Such a system might require Key 0 (the master key) to be inserted first, then all valid keys, then Key 0 again. Only those valid keys would now work with the car. In the worst case, for example if all car-keys are lost, then a new set of logical keys could be generated for the car and its associated physical car-keys if desired. The Car engine number would be used to tie the key to the particular car. Future use data may include such things as rental information, such as driver/renter details.

EXAMPLE 2

Suppose we have a photocopier image unit which should be replaced every 100,000 copies. 32 bits are required to store the number of pages remaining. The 256 bits of M could be divided up as follows:

If a lower quality image unit is made that must be replaced after only 10,000 copies, the 32-bit page count can still be used for compatibility with existing photocopiers. This allows several consumable types to be used with the same system.

EXAMPLE 3

Consider a Polaroid camera consumable containing 25 photos. A 16-bit countdown is all that is required to store the number of photos remaining. The 256 bits of M could be divided up as follows:

The Photos Remaining value at M[2] allows a number of consumable types to be built for use with the. same camera System. For example, a new consumable with 36 photos is trivial to program. Suppose 2 years after the introduction of the camera, a new type of camera was introduced. It is able to use the old consumable, but also can process a new film type. M[3] can be used to define Film Type. Old film types would be 0, and the new film types would be some new value. New Systems can take advantage of this. Original systems would detect a non-zero value at M[3] and realize incompatibility with new film types. New Systems would understand the value of M[3] and so react appropriately. To maintain compatibility with the old consumable, the new consumable and System needs to have the same key information as the old one. To make a clean break with a new System and its own special consumables, a new key set would be required.

EXAMPLE 4

Consider a printer consumable containing 3 inks: cyan, magenta, and yellow. Each ink amount can be decremented separately. The 256 bits of M could be divided up as follows:

Stage 2: Determine Keys for Systems and Consumables

Once the decision has been made as to which Systems and consumables are to share the same keys, those keys must be defined. The values for $K_1$ and $K_2$ must therefore be determined. In most cases, $K_1$ and $K_2$ will be generated once for all time. All Systems and consumables that have to work together (both now and in the future) need to have the same $K_1$ and $K_2$ values. $K_1$ and $K_2$ must therefore be kept secret since the entire security mechanism for the System/Consumable combination is made void if the keys are compromised. If the keys are compromised, the damage depends on the number of systems and consumables, and the ease to which they can be reprogrammed with new non-compromised keys: In the case of a photocopier with toner cartridges, the worst case is that a clone manufacturer could then manufacture their own Authentication Chips (or worse, buy them), program the chips with the known keys, and then insert them into their own consumables. In the case of a car with car-keys, each car has a different set of keys. This leads to two possible general scenarios. The first is that after the car and car-keys are programmed with the keys, $K_1$ and $K_2$ are deleted so no record of their values are kept, meaning that there is no way to compromise $K_1$ and $K_2$. However no more car-keys can be made for that car without reprogramming the car's Authentication Chip. The second scenario is that the car manufacturer keeps $K_1$ and $K_2$, and new keys can be made for the car. A compromise of $K_1$ and $K_2$ means that someone could make a car-key specifically for a particular car.

The keys and random data used in the Authentication Chips must therefore be generated by a means that is non-deterministic (a completely computer generated pseudo-random number cannot be used because it is deterministic—knowledge of the generator's seed gives all future numbers). $K_1$ and $K_2$ should be generated by a physically random process, and not by a computer. However, random bit generators based on natural sources of randomness are subject to influence by external factors and also to malfunction. It is imperative that such devices be tested periodically for statistical randomness.

A simple yet useful source of random numbers is the Lavarand® system from SGI. This generator uses a digital camera to photograph six lava lamps every few minutes. Lava lamps contain chaotic turbulent systems. The resultant digital images are fed into an SHA-1 implementation that produces a 7-way hash, resulting in a 160-bit value from every 7th bye from the digitized image. These 7 sets of 160 bits total 140 bytes. The 140 byte value is fed into a BBS generator to position the start of the output bitstream. The output 160 bits from the BBS would be the key or the Authentication chip 53.

An extreme example of a non-deterministic random process is someone flipping a coin 160 times for $K_1$ and 160 times for $K_2$ in a clean room. With each head or tail, a 1 or 0 is entered on a panel of a Key Programmer Device. The process must be undertaken with several observers (for verification) in silence (someone may have a hidden microphone). The point to be made is that secure data entry and storage is not as simple as it sounds. The physical security of the Key Programmer Device and accompanying Programming Station requires an entire document of its own. Once keys $K_1$ and $K_2$ have been determined, they must be kept for as long as Authentication Chips need to be made that use the key. In the first car/car-key scenario $K_1$ and $K_2$ are destroyed after a single System chip and a few consumable chips have been programmed. In the case of the photocopier/toner cartridge, $K_1$ and $K_2$ must be retained for as long as the toner-cartridges are being made for the photocopiers. The keys must be kept securely.

Stage 3: Determine MinTicks for Systems and Consumables

The value of MinTicks depends on the operating clock speed of the Authentication Chip (System specific) and the notion of what constitutes a reasonable time between RD or TST function calls (application specific). The duration of a single tick depends on the operating clock speed. This is the maximum of the input clock speed and the Authentication Chip's clock-limiting hardware. For example, the Authentication Chip's clock-limiting hardware may be set at 10 MHz (it is not changeable), but the input clock is 1 MHz. In this case, the value of 1 tick is based on 1 MHz, not 10 MHz. If the input clock was 20 MHz instead of 1 MHz, the value of 1 tick is based on 10 MHz (since the clock speed is limited to 10 MHz). Once the duration of a tick is known, the MinTicks value can be set. The value for MinTicks is the minimum number of ticks required to pass between calls to RD or RND key-based functions. Suppose the input clock speed matches the maximum clock speed of 10 MHz. If we want a minimum of 1 second between calls to TST, the value for MinTicks is set to 10,000,000. Even a value such as 2 seconds might be a completely reasonable value for a System such as a printer (one authentication per page, and one page produced every 2 or 3 seconds).

Stage 4: Program Keys, Random Seed, MinTicks and Unused M

Authentication Chips are in an unknown state after manufacture. Alternatively, they have already been used in one consumable, and must be reprogrammed for use in another. Each Authentication Chip must be cleared and programmed with new keys and new state data. Clearing and subsequent programming of Authentication Chips must take place in a secure Programming Station environment.

Programming a Trusted System Authentication Chip

If the chip is to be a trusted System chip, a seed value for R must be generated. It must be a random number derived from a physically random process, and must not be 0. The following tasks must be undertaken, in the following order, and in a secure programming environment:

RESET the chip

CLR[ ]

Load R (160 bit register) with physically random data

SSI[$K_1$, $K_2$, R]

SMT[MinTicks$_{System}$]

The Authentication Chip is now ready for insertion into a System. It has been completely programmed. If the System Authentication Chips are stolen at this point, a clone manufacturer could use them to generate R, $F_{K1}$[R] pairs in order to launch a known text attack on $K_1$, or to use for launching a partially chosen-text attack on $K_2$. This is no different to the purchase of a number of Systems, each containing a trusted Authentication Chip. The security relies on the strength of the Authentication protocols and the randomness of $K_1$ and $K_2$.

Programming a Non-Trusted Consumable Authentication Chip

If the chip is to be a non-trusted Consumable Authentication Chip, the programming is slightly different to that of the trusted System Authentication Chip. Firstly, the seed value for R must be 0. It must have additional programming for M and the AccessMode values. The future use M[n] must be programmed with 0, and the random M[n] must be programmed with random data. The following tasks must be undertaken, in the following order, and in a secure programming environment:

RESET the chip

CLR[ ]

Load R (160 bit register) with 0

SSI[$K_1$, $K_2$, R]

Load X (256 bit register) with 0

Set bits in X corresponding to appropriate M[n] with physically random data

WR[X]

Load Y (32 bit register) with 0

Set bits in Y corresponding to appropriate M[n] with Read Only Access Modes

SAM[Y]

SMT[MinTicks$_{Consumable}$]

The non-trusted consumable chip is now ready to be programmed with the general state data. If the Authentication Chips are stolen at this point, an attacker could perform a limited chosen text attack. In the best situation, parts of M are Read Only (0 and random data), with the remainder of M completely chosen by an attacker (via the WR command). A number of RD calls by an attacker obtains $F_{K2}$[M|R] for a limited M. In the worst situation, M can be completely chosen by an attacker (since all 256 bits are used for state data). In both cases however, the attacker cannot choose any value for R since it is supplied by calls to RND from a System Authentication Chip. The only way to obtain a chosen R is by a Brute Force attack. It should be noted that if Stages 4 and 5 are carried out on the same Programming Station (the preferred and ideal situation), Authentication Chips cannot be removed in between the stages. Hence there is no possibility of the Authentication Chips being stolen at this point. The decision to program the Authentication Chips at one or two times depends on the requirements of the System/Consumable manufacturer.

Stage 5: Program State Data and Access Modes

This stage is only required for consumable Authentication Chips, since M and AccessMode registers cannot be altered on System Authentication Chips. The future use and random values of M[n] have already been programmed in Stage 4. The remaining state data values need to be programmed and the associated Access Mode values need to be set. Bear in mind that the speed of this stage will be limited by the value stored in the MinTicks register. This stage is separated from Stage 4 on. account of the differences either in physical location or in time between where/when Stage 4 is performed, and where/when Stage 5 is performed. Ideally, Stages 4 and 5 are performed at the same time in the same Programming Station. Stage 4 produces valid Authentication Chips, but does not load them with initial state values (other than 0). This is to allow the programming of the chips to coincide with production line runs of consumables. Although Stage 5 can be run multiple times, each time setting a different state data value and Access Mode value, it is more likely to be run a single time, setting all the remaining state data values and setting all the remaining Access Mode values. For example, a production line can be set up where the batch number and serial number of the Authentication Chip is produced according to the physical consumable being produced. This is much harder to match if the state data is loaded at a physically different factory.

The Stage 5 process involves first checking to ensure the chip is a valid consumable chip, which includes a RD to gather the data from the Authentication Chip, followed by a WR of the initial data values, and then a SAM to permanently set the new data values. The steps are outlined here:

IsTrusted=GIT[ ]
If (IsTrusted), exit with error (wrong kind of chip!)
Call RND on a valid System chip to get a valid input pair
Call RD on chip to be programmed, passing in valid input pair
Load X (256 bit register) with results from a RD of Authentication Chip
Call TST on valid System chip to ensure X and consumable chip are valid
If (TST returns 0), exit with error (wrong consumable chip for system)
Set bits of X to initial state values
WR[X]
Load Y (32 bit register) with 0
Set bits of Y corresponding to Access Modes for new state values
SAM[Y]

Of course the validation (Steps 1 to 7) does not have to occur if Stage 4 and 5 follow on from one another on the same Programming Station. But it should occur in all other situations where Stage 5 is run as a separate programming process from Stage 4. If these Authentication Chips are now stolen, they are already programmed for use in a particular consumable. An attacker could place the stolen chips into a clone consumable. Such a theft would limit the number of cloned products to the number of chips stolen. A single theft should not create a supply constant enough to provide clone manufacturers with a cost-effective business. The alternative use for the chips is to save the attacker from purchasing the same number of consumables, each with an Authentication Chip, in order to launch a partially chosen text attack or brute force attack. There is no special security breach of the keys if such an attack were to occur.

Manufacture

The circuitry of the Authentication Chip must be resistant to physical attack. A summary of manufacturing implementation guidelines is presented, followed by specification of the chip's physical defenses (ordered by attack).

Guidelines for Manufacturing

The following are general guidelines for implementation of an
  Authentication Chip in terms of manufacture:
  Standard process
  Minimum size (if possible)
  Clock Filter
  Noise Generator
  Tamper Prevention and Detection circuitry
  Protected memory with tamper detection
  Boot circuitry for loading program code
  Special implementation of FETs for key data paths
  Data connections in polysilicon layers where possible
  OverUnderPower Detection Unit
  No test circuitry Standard Process The Authentication Chip should be implemented with a standard manufacturing process (such as Flash). This is necessary to:
  Allow a great range of manufacturing location options
  Take advantage of well-defined and well-known technology
  Reduce cost
  Note that the standard process still allows physical protection mechanisms.

Minimum Size

The Authentication chip 53 must have a low manufacturing cost in order to be included as the authentication mechanism for low cost consumables. It is. therefore desirable to keep the chip size as low as reasonably possible. Each Authentication Chip requires 802 bits of non-volatile memory. In addition, the storage required for optimized HMAC-SHA1 is 1024 bits. The remainder of the chip (state machine, processor, CPU or whatever is chosen to implement Protocol 3) must be kept to a minimum in order that the number of transistors is minimized and thus the cost per chip is minimized. The circuit areas that process the secret key information or could reveal information about the key should also be minimized (see Non-Flashing CMOS below for special data paths).

Clock Filter

The Authentication Chip circuitry is designed to operate within a specific clock speed range. Since the user directly supplies the clock signal, it is possible for an attacker to attempt to introduce race-conditions in the circuitry at specific times during processing. An example of this is where a high clock speed (higher than the circuitry is designed for) may prevent an XOR from working properly, and of the two inputs, the first may always be returned. These styles of transient fault attacks can be very efficient at recovering secret key information. The lesson to be learned from this is that the input clock signal cannot be trusted. Since the input clock signal cannot be trusted, it must be limited to operate up to a maximum frequency. This can be achieved a number of ways. One way to filter the clock signal is to use an edge detect unit passing the edge on to a delay, which in turn enables the input clock signal to pass through. FIG. 174 shows clock signal flow within the Clock Filter. The delay should be set so that the maximum clock speed is a particular frequency (e.g. about 4 MHz). Note that this delay is not programmable—it is fixed. The filtered clock signal would be further divided internally as required.

Noise Generator

Each Authentication Chip should contain a noise generator that generates continuous circuit noise. The noise will interfere with other electromagnetic emissions from the chip's regular activities and add noise to the $I_{dd}$ signal. Placement of the noise generator is not an issue on an Authentication Chip due to the length of the emission wavelengths. The noise generator is used to generate electronic noise, multiple state changes each clock cycle, and as a source of pseudo-random bits for the Tamper Prevention and Detection circuitry. A simple implementation of a noise generator is a 64-bit LFSR seeded with a non-zero number. The clock used for the noise generator should be running at the maximum clock rate for the chip in order to generate as much noise as possible.

Tamper Prevention and Detection Circuitry

A set of circuits is required to test for and prevent physical attacks on the Authentication Chip. However what is actually detected as an attack may not be an intentional physical attack. It is therefore important to distinguish between these two types of attacks in an Authentication Chip:
  where you can be certain that a physical attack has occurred.
  where you cannot be certain that a physical attack has occurred.

The two types of detection differ in what is performed as a result of the detection. In the first case, where the circuitry can be certain that a true physical attack has occurred, erasure of Flash memory key information is a sensible action. In the second case, where the circuitry cannot be sure if an attack has occurred, there is still certainly something wrong. Action must be taken, but the action should not be the erasure of secret key information. A suitable action to take in the second case is a chip RESET. If what was detected was an attack that has permanently damaged the chip, the same conditions will occur next time and the chip will RESET again. If, on the other hand, what was detected was part of the normal operating environment of the chip, a RESET will not harm the key.

A good example of an event that circuitry cannot have knowledge about, is a power glitch. The glitch may be an intentional attack, attempting to reveal information about the key. It may, however, be the result of a faulty connection, or simply the start of a power-down sequence. It is therefore best to only RESET the chip, and not erase the key. If the chip was powering down, nothing is lost. If the System is faulty, repeated RESETs will cause the consumer to get the System repaired. In both cases the consumable is still intact. A good example of an event that circuitry can have knowledge about, is the cutting of a data line within the chip. If this attack is somehow detected, it could only be a result of a faulty chip (manufacturing defect) or an attack. In either case, the erasure of the secret information is a sensible step to take.

Consequently each Authentication Chip should have 2 Tamper Detection Lines as illustrated in FIG. 175—one for definite attacks, and one for possible attacks. Connected to these Tamper Detection Lines would be a number of Tamper Detection test units, each testing for different forms of tampering. In addition, we want to ensure that the Tamper Detection Lines and Circuits themselves cannot also be tampered with.

At one end of the Tamper Detection Line is a source of pseudo-random bits (clocking at high speed compared to the general operating circuitry). The Noise Generator circuit described above is an adequate source. The generated bits pass through two different paths—one carries the original data, and the other carries the inverse of the data. The wires carrying these bits are in the layer above the general chip circuitry (for example, the memory, the key manipulation circuitry etc). The wires must also cover the random bit generator. The bits are recombined at a number of places via an XOR gate. If the bits are different (they should be), a 1 is output, and used by the particular unit (for example, each output bit from a memory read should be ANDed with this bit value). The lines finally come together at the Flash memory Erase circuit, where a complete erasure is triggered by a 0 from the XOR. Attached to the line is a number of triggers, each detecting a physical attack on the chip. Each trigger has an oversize nMOS transistor attached to GND. The Tamper Detection Line physically goes through this nMOS transistor. If the test fails, the trigger causes the Tamper Detect Line to become 0. The XOR test will therefore fail on either this clock cycle or the next one (on average), thus RESETing or erasing the chip. FIG. 175 illustrates the basic principle of a Tamper Detection Line in terms of tests and the XOR connected to either the Erase or RESET circuitry.

The Tamper Detection Line must go through the drain of an output transistor for each test, as illustrated by the oversize nMOS transistor layout of FIG. 176: It is not possible to break the Tamper Detect Line since this would stop the flow of 1s and 0s from the random source. The XOR tests would therefore fail. As the Tamper Detect Line physically passes through each test, it is not possible to eliminate any particular test without breaking the Tamper Detect Line. It is important that the XORs take values from a variety of places along the Tamper Detect Lines in order to reduce the chances of an attack. FIG. 177 illustrates the taking of multiple XORs from the Tamper Detect Line to be used in the different parts of the chip. Each of these XORs can be considered to be generating a ChipOK bit that can be used within each unit or sub-unit.

A sample usage would be to have an OK bit in each unit that is ANDed with a given ChipOK bit each cycle. The OK bit is loaded with 1 on a RESET. If OK is 0, that unit will fail until the next RESET. If the Tamper Detect Line is functioning correctly, the chip will either RESET or erase all key information. If the RESET or erase circuitry has been destroyed, then this unit will not function, thus thwarting an attacker. The destination of the RESET and Erase line and associated circuitry is very context sensitive. It needs to be protected in much the same way as the individual tamper tests. There is no point generating a RESET pulse if the attacker can simply cut the wire leading to the RESET circuitry. The actual implementation will depend very much on what is to be cleared at RESET, and how those items are cleared. Finally, FIG. 178 shows how the Tamper Lines cover the noise generator circuitry of the chip. The generator and NOT gate are on one level, while the Tamper Detect Lines run on a level above the generator.

Protected Memory with Tamper Detection

It is not enough to simply store secret information or program code in Flash memory. The Flash memory and RAM must be protected from an attacker who would attempt to modify (or set) a particular bit of program code or key information. The mechanism used. must conform to being used in the Tamper Detection Circuitry (described above). The first part of the solution is to ensure that the Tamper Detection Line passes directly above each Flash or RAM bit. This ensures that an attacker cannot probe the contents of Flash or RAM. A breach of the covering wire is a break in the Tamper Detection Line. The breach causes the Erase signal to be set, thus deleting any contents of the memory. The high frequency noise on the Tamper Detection Line also obscures passive observation.

The second part of the solution for Flash is to use multi-level data storage, but only to use a subset of those multiple levels for valid bit representations. Normally, when multi-level Flash storage is used, a single floating gate holds more than one bit. For example, a 4-voltage-state transistor can represent two bits. Assuming a minimum and maximum voltage representing 00 and 11 respectively, the two middle voltages represent 01 and 10. In the Authentication Chip, we can use the two middle voltages to represent a single bit, and consider the two extremes to be invalid states. If an attacker attempts to force the state of a bit one way or the other by closing or cutting the gate's circuit, an invalid voltage (and hence invalid state) results.

The second part of the solution for RAM is to use a parity bit. The data part of the register can be checked against the parity bit (which will not match after an attack). The bits coming from Flash and RAM can therefore be validated by a number of test units (one per bit) connected to the common Tamper Detection Line. The Tamper Detection circuitry would be the first circuitry the data passes through (thus stopping an attacker from cutting the data lines).

Boot Circuitry for Loading Program Code

Program code should be kept in multi-level Flash instead of ROM, since ROM is subject to being altered in a non-testable way. A boot mechanism is therefore required to load the program code into Flash memory (Flash memory is in an indeterminate state after manufacture). The boot circuitry must not be in ROM—a small state-machine would suffice. Otherwise the boot code could be modified in an undetectable way. The boot circuitry must erase all Flash memory, check to ensure the erasure worked, and then load the program code. Flash memory must be erased before loading the program code. Otherwise an attacker could put the chip into the boot state, and then load program code that simply extracted the existing keys. The state machine must also check to ensure that all Flash memory has been cleared (to ensure that an attacker has not cut the Erase line) before loading the new program code. The loading of program code must be undertaken by the secure Programming Station before secret information (such as keys) can be loaded.

Special Implementation of FETs for Key Data Paths

The normal situation for FET implementation for the case of a CMOS Inverter (which involves a pMOS transistor combined with an nMOS transistor) is shown in FIG. 179. During the transition, there is a small period of time where both the nMOS transistor and the pMOS transistor have an intermediate resistance. The resultant power-ground short circuit causes a temporary increase in the current, and in fact accounts for the majority of current consumed by a CMOS device. A small amount of infrared light is emitted during the short circuit, and can be viewed through the silicon substrate (silicon is transparent to infrared light). A small amount of light is also emitted during the charging and discharging of the transistor gate capacitance and transmission line capacitance.

For circuitry that manipulates secret key information, such information must be kept hidden. An alternative non-flashing CMOS implementation should therefore be used for all data paths that manipulate the key or a partially calculated value that is based on the key. The use of two non-overlapping clocks $\phi 1$ and $\phi 2$ can provide a non-flashing mechanism. $\phi 1$ is connected to a second gate of all nMOS transistors, and $\phi 2$ is connected to a second gate of all pMOS transistors. The transition can only take place in combination with the clock. Since $\phi 1$ and $\phi 2$ are non-overlapping, the pMOS and nMOS transistors will not have a simultaneous intermediate resistance. The setup is shown in FIG. 180.

Finally, regular CMOS inverters can be positioned near critical non-Flashing CMOS components. These inverters should take their input signal from the Tamper Detection Line above. Since the Tamper Detection Line operates multiple times faster than the regular operating circuitry, the net effect will be a high rate of light-bursts next to each non-Flashing CMOS component. Since a bright light overwhelms observation of a nearby faint light, an observer will not be able to detect what switching operations are occurring in the chip proper. These regular CMOS inverters will also effectively increase the amount of circuit noise, reducing the SNR and obscuring useful EMI.

There are a number of side effects due to the use of non-Flashing CMOS:

- The effective speed of the chip is reduced by twice the rise time of the clock per clock cycle. This is not a problem for an Authentication Chip.
- The amount of current drawn by the non-Flashing CMOS is reduced (since the short circuits do not occur). However, this is offset by the use of regular CMOS inverters.
- Routing of the clocks increases chip area, especially since multiple versions of $\phi 1$ and $\phi 2$ are required to cater for different levels of propagation. The estimation of chip area is double that of a regular implementation.
- Design of the non-Flashing areas of the Authentication Chip are slightly more complex than to do the same with a with a regular CMOS design. In particular, standard cell components cannot be used, making these areas full custom. This is not a problem for something as small as an Authentication Chip, particularly when the entire chip does not have to be protected in this manner.

Connections in Polysilicon Layers Where Possible

Wherever possible, the connections along which the key or secret data flows, should be made in the polysilicon layers. Where necessary, they can be in metal 1, but must never be in the top metal layer (containing the Tamper Detection Lines).

OverUnderPower Detection Unit

Each Authentication Chip requires an OverUnderPower Detection Unit to prevent Power Supply Attacks. An OverUnderPower Detection Unit detects power glitches and tests the power level against a Voltage Reference to ensure it is within a certain tolerance. The Unit contains a single Voltage Reference and two comparators. The OverUnderPower Detection Unit would be connected into the RESET Tamper Detection Line, thus causing a RESET when triggered. A side effect of the OverUnderPower Detection Unit is that as the voltage drops during a power-down, a RESET is triggered, thus erasing any work registers.

No Test Circuitry

Test hardware on an Authentication Chip could very easily introduce vulnerabilities. As a result, the Authentication Chip should not contain any BIST or scan paths. The Authentication Chip must therefore be testable with external test vectors. This should be possible since the Authentication Chip is not complex.

Reading ROM

This attack depends on the key being stored in an addressable ROM. Since each Authentication Chip stores its authentication keys in internal Flash memory and not in an addressable ROM, this attack is irrelevant.

Reverse Engineering the Chip

Reverse engineering a chip is only useful when the security of authentication lies in the algorithm alone. However our Authentication Chips rely on a secret key, and not in the secrecy of the algorithm. Our authentication algorithm is, by contrast, public, and in any case, an attacker of a high volume consumable is assumed to have been able to obtain detailed plans of the internals of the chip. In light of these factors, reverse engineering the chip itself, as opposed to the stored data, poses no threat.

Usurping the Authentication Process

There are several forms this attack can take, each with varying degrees of success. In all cases, it is assumed that a clone manufacturer will have access to both the System and the consumable designs. An attacker may attempt to build a chip that tricks the System into returning a valid code instead of generating an authentication code. This attack is not possible for two reasons. The first reason is that System Authentication chips and Consumable Authentication Chips, although physically identical, are programmed differently. In particular, the RD opcode and the RND opcode are the same, as are the WR and TST opcodes. A System authentication Chip cannot perform a RD command since every call is interpreted as a call to RND instead. The second reason this attack would fail is that separate serial data lines are provided from the System to the System and Consumable Authentication Chips. Consequently neither chip can see what is being transmitted to or received from the other. If the attacker builds a clone chip that ignores WR commands (which decrement the consumable remaining). Protocol 3 ensures that the subsequent RD will detect that the WR did not occur. The System will therefore not go ahead with the use of the consumable, thus thwarting the attacker. The same is true if an attacker simulates loss of contact before authentication—since the authentication does not take place, the use of the consumable doesn't occur. An attacker is therefore limited to modifying each System in order for clone consumables to be accepted Modification of System The simplest method of modification is to replace the System's Authentication Chip with one that simply reports success for each call to TST. This can be thwarted by System calling TST several times for each authentication, with the first few times providing false values, and expecting a fail from TST. The final call to TST would be expected to succeed. The number of false calls to TST could be determined by some part of the returned result from RD or from the system clock. Unfortunately an attacker could simply rewire System so that the new System clone authentication chip 53 can monitor the returned result from the consumable chip or clock. The clone System Authentication Chip would only return success when that monitored value is presented to its TST function. Clone consumables could then return any value as the hash result for RD, as the clone System chip would declare that value valid. There is therefore no point for the System to call the System Authentication Chip multiple times, since a rewiring attack will only work for the System that has been rewired, and not for all Systems. A similar form of attack on a System is a replacement of the System ROM. The ROM program code can be altered so that the Authentication never occurs. There is nothing that can be done about this, since the System remains in the hands of a consumer. Of course this would void any warranty, but the consumer may consider the alteration worthwhile if the clone consumable were extremely cheap and more readily available than the original item.

The-System/consumable manufacturer must therefore determine how likely an attack of this nature is. Such a study must include given the pricing structure of Systems and Consumables, frequency of System service, advantage to the consumer of having a physical modification performed, and where consumers would go to get the modification performed. The limit case of modifying a system is for a clone manufacturer to provide a completely clone System which takes clone consumables. This may be simple competition or violation of patents. Either way, it is beyond the scope of the Authentication Chip and depends on the technology or service being cloned.

Direct Viewing of Chip Operation by Conventional Probing

In order to view the chip operation, the chip must be operating. However, the Tamper Prevention and Detection circuitry covers those sections of the chip that process or hold the key. It is not possible to view those sections through the Tamper Prevention lines. An attacker cannot simply slice the chip past the Tamper Prevention layer, for this will break the Tamper Detection Lines and cause an erasure of all keys at power-up. Simply destroying the erasure circuitry is not sufficient, since the multiple ChipOK bits (now all 0) feeding into multiple units within the Authentication Chip will cause the chip's regular operating circuitry to stop functioning. To set up the chip for an attack, then, requires the attacker to delete the Tamper Detection lines, stop the Erasure of Flash memory, and somehow rewire the components that relied on the ChipOK lines. Even if all this could be done, the act of slicing the chip to this level will most likely destroy the charge patterns in the non-volatile memory that holds the keys, making the process fruitless.

Direct Viewing of the Non-volatile Memory

If the Authentication Chip were sliced so that the floating gates of the Flash memory were exposed, without discharging them, then the keys could probably be viewed directly using an STM or SKM. However, slicing the chip to this level without discharging the—gates is probably impossible. Using wet etching, plasma etching, ion milling, or chemical mechanical polishing will almost certainly discharge the small charges present on the floating gates. This is true of regular Flash memory, but even more so of multi-level Flash memory.

Viewing the Light Bursts Caused by State Changes

All sections of circuitry that manipulate secret key information are implemented in the non-Flashing CMOS described above. This prevents the emission of the majority of light bursts. Regular CMOS inverters placed in close proximity to the non-Flashing CMOS will hide any faint emissions caused by capacitor charge and discharge. The inverters are connected to the Tamper Detection circuitry, so they change state many times (at the high clock rate) for each non-Flashing CMOS state change.

Monitoring EMI

The Noise Generator described above will cause circuit noise. The noise will interfere with other electromagnetic emissions from the chip's regular activities and thus obscure any meaningful reading of internal data transfers.

Viewing $I_{dd}$ Fluctuations

The solution against this kind of attack is to decrease the SNR in the $I_{dd}$ signal. This is accomplished by increasing the amount of circuit noise and decreasing the amount of signal. The Noise Generator circuit (which also acts as a defense against EMI attacks) will also cause enough state changes each cycle to obscure any meaningful information in the $I_{dd}$ signal. In addition, the special Non-Flashing CMOS implementation of the key-carrying data paths of the chip prevents current from flowing when state changes occur. This has the benefit of reducing the amount of signal.

Differential Fault Analysis

Differential fault bit errors are introduced in a non-targeted fashion by ionization, microwave radiation, and environmental stress. The most likely effect of an attack of this nature is a change in Flash memory (causing an invalid state) or RAM (bad parity). Invalid states and bad parity are detected by the Tamper Detection Circuitry, and cause an erasure of the key. Since the Tamper Detection Lines cover the key manipulation circuitry, any error introduced in the key manipulation circuitry will be mirrored by an error in a Tamper Detection Line. If the Tamper Detection Line is affected, the chip will either continually RESET or simply erase the key upon a power-up, rendering the attack fruitless. Rather than relying on a non-targeted attack and hoping that "just the right part of the chip is affected in just the right way", an attacker is better off trying to introduce a targeted fault (such as overwrite attacks, gate destruction etc). For information on these targeted fault attacks, see the relevant sections below.

Clock Glitch Attacks

The Clock Filter (described above) eliminates the possibility of clock glitch attacks.

Power Supply Attacks

The OverUnderPower Detection Unit (described above) eliminates the possibility of power supply attacks.

Overwriting ROM

Authentication Chips store Program code, keys and secret information in Flash memory, and not in ROM. This attack is therefore not possible.

Modifying EEPROM/Flash

Authentication Chips store Program code, keys and secret information in Flash memory. However, Flash memory is covered by two Tamper Prevention and Detection Lines. If either of these lines is broken (in the process of destroying a gate) the attack will be detected on power-up, and the chip will either RESET (continually) or erase the keys from Flash memory. However, even if the attacker is able to somehow access the bits of Flash and destroy or short out the gate holding a particular bit, this will force the bit to have no charge or a full charge. These are both invalid states for the Authentication Chip's usage of the multi-level Flash memory (only the two middle states are valid). When that data value is transferred from Flash, detection circuitry will cause the Erasure Tamper Detection Line to be triggered—thereby erasing the remainder of Flash memory and RESETing the chip. A Modify EEPROM/Flash Attack is therefore fruitless.

Gate Destruction Attacks

Gate Destruction Attacks rely on the ability of an attacker to modify a single gate to cause the chip to reveal information during operation. However any circuitry that manipulates secret information is covered by one of the two Tamper Prevention and Detection lines. If either of these lines is broken (in the process of destroying a gate) the attack will be detected on power-up, and the chip will either RESET (continually) or erase the keys from Flash memory. To launch this kind of attack, an attacker must first reverse-engineer the chip to determine which gate(s) should be targeted. Once the location of the target gates has been determined, the attacker must break the covering Tamper Detection line, stop the Erasure of Flash memory, and somehow rewire the components that rely on the ChipOK lines. Rewiring the circuitry cannot be done without slicing the chip, and even if it could be done, the act of slicing the chip to this level will most likely destroy the charge patterns in the non-volatile memory that holds the keys, making the process fruitless.

Overwrite Attacks

An Overwrite Attack relies on being able to set individual bits of the key without knowing the previous value. It relies on probing the chip, as in the Conventional Probing Attack and destroying gates as in the Gate Destruction Attack. Both of these attacks (as explained in their respective sections), will not succeed due to the use of the Tamper Prevention and Detection Circuitry and ChipOK lines. However, even if the attacker is able to somehow access the bits of Flash and destroy or short out the gate holding a particular bit, this will force the bit to have no charge or a full charge. These are both invalid states for the Authentication Chip's usage of the multi-level Flash memory (only the two middle states are valid). When that data value is transferred from Flash detection circuitry will cause the Erasure Tamper Detection Line to be triggered—thereby erasing the remainder of Flash memory and RESETing the chip. In the same way, a parity check on tampered values read from RAM will cause the Erasure Tamper Detection Line to be triggered. An Overwrite Attack is therefore fruitless.

Memory Remanence Attack

Any working registers or RAM within the Authentication Chip may be holding part of the authentication keys when power is removed. The working registers and RAM would continue to hold the information for some time after the removal of power. If the chip were sliced so that the gates of the registers/RAM were exposed, without discharging them, then the data could probably be viewed directly using an STM. The first defense can be found above, in the description of defense against Power Glitch Attacks. When power is removed, all registers and RAM are cleared, just as the RESET condition causes a clearing of memory. The chances then, are less for this attack to succeed than for a reading of the Flash memory. RAM charges (by nature) are more easily lost than Flash memory. The slicing of the chip to reveal the RAM will certainly cause the charges to be lost (if they haven't been lost simply due to the memory not being refreshed and the time taken to perform the slicing). This attack is therefore fruitless.

Chip Theft Attack

There are distinct phases in the lifetime of an Authentication Chip, Chips can be stolen when at any of these stages:

After manufacture, but before programming of key

After programming of key, but before programming of state data

After programming of state data, but before insertion into the consumable or system After insertion into the system or consumable A theft in between the chip manufacturer and programming station would only provide the clone manufacturer with blank chips. This merely compromises the sale of Authentication chips, not anything authenticated by the Authentication chips. Since the programming station is the only mechanism with consumable and system product keys, a clone manufacturer would not be able to program the chips with the correct key. Clone manufacturers would be able to program the blank chips for their own Systems and Consumables, but it would be difficult to place these items on the market without detection. The second form of theft can only happen in a situation where an Authentication Chip passes through two or more distinct programming phases. This is possible, but unlikely. In any case, the worst situation is where no state data has been programmed, so all of M is read/write. If this were the case, an attacker could attempt. to launch an Adaptive Chosen Text Attack on the chip. The HMAC-SHA1 algorithm is resistant to such attacks. The third form of theft would have to take place in between the programming station and the installation factory. The Authentication chips would already be programmed for use in a particular system or for use in a particular consumable. The only use these chips have to a thief is to place them into a clone System or clone Consumable. Clone systems are irrelevant—a cloned System would not even require an authentication chip 53. For clone Consumables, such a theft would limit the number of cloned products to the number of chips stolen. A single theft should not create a supply constant enough to provide clone manufacturers with a cost-effective business. The final form of theft is where the System or Consumable itself is stolen. When the theft occurs at the manufacturer, physical security protocols must be enhanced. If the theft occurs anywhere else, it is a matter of concern only for the owner of the item and the police or insurance company. The security mechanisms that the Authentication Chip uses assume that the consumables and systems are in the hands of the public. Consequently, having them stolen makes no difference to the security of the keys.

Authentication Chip Design

The Authentication Chip has a physical and a logical external interface. The physical interface defines how the Authentication Chip can be connected to a physical System, and the logical interface determines how that System can communicate with the Authentication Chip.

Physical Interface

The Authentication Chip is a small 4-pin CMOS package (actual internal size is approximately 0.30 mm$^2$ using 0.25 $\mu$m Flash process). The 4 pins are GND, CLK, Power, and Data. Power is a nominal voltage. If the voltage deviates from this by more than a fixed amount, the chip will RESET. The recommended clock speed is 4–10 MHz. Internal circuitry filters the clock signal to ensure that a safe maximum clock speed is not exceeded. Data is transmitted and received one bit at a time along the serial data line. The chip performs a RESET upon power-up, power-down. In addition, tamper detection and prevention circuitry in the chip will cause the chip to either RESET or erase Flash memory (depending on the attack detected) if an attack is detected. A special Programming Mode is enabled by holding the CLK voltage at a particular level. This is defined further in the next section.

Logical Interface

The Authentication Chip has two operating modes—a Normal Mode and a Programming Mode. The two modes are required because the operating program code is stored in Flash memory instead of ROM (for security reasons). The Programming mode is used for testing purposes after manufacture and to load up the operating program code, while the normal mode is used for all subsequent usage of the chip.

Programming Mode

The Programming Mode is enabled by holding a specific voltage on the CLK line for a given amount of time. When the chip enters Programming Mode, all Flash memory is erased (including all secret key information and any program code). The Authentication Chip then validates the erasure. If the erasure was successful, the Authentication Chip receives 384 bytes of data corresponding to the new program code. The bytes are transferred in order $byte_0$ to $byte_{383}$. The bits are transferred from $bit_0$ to $bit_7$. Once all 384 bytes of program code have been loaded, the Authentication Chip hangs. If the erasure was not successful, the Authentication Chip will hang without loading any data into the Flash memory. After the chip has been programmed, it can be restarted. When the chip is RESET with a normal voltage on the CLK line, Normal Mode is entered.

Normal Mode

Whenever the Authentication Chip is not in Programming Mode, it is in Normal Mode. When the Authentication Chip starts up in Normal Mode (for example a power-up RESET), it executes the program currently stored in the program code region of Flash memory. The program code implements a communication mechanism between the System and Authentication Chip, accepting commands and data from the System and producing output values. Since the Authentication Chip communicates serially, bits are transferred one at a time. The System communicates with the Authentication Chips via a simple operation command set. Each command is defined by 3-bit opcode. The interpretation of the opcode depends on the current value of the IsTrusted bit and the IsWritten bit.

The following operations are defined:

Any command not defined in this table is interpreted as NOP (No operation). Examples include opcodes 110 and 111 (regardless of IsTrusted or IsWritten values), and any opcode other than SSI when IsWritten=0. Note that the opcodes for RD and RND are the same, as are the opcodes for WR and TST. The actual command run upon receipt of the opcode will depend on the current value of the IsTrusted bit (as long as IsWritten is 1). Where the IsTrusted bit is clear, RD and WR functions will be called. Where the IsTrusted bit is set, RND and TST functions will be called. The two sets of commands are mutually exclusive between trusted and non-trusted Authentication Chips. In order to execute a command on an Authentication Chip, a client (such as System) sends the command opcode followed by the required input parameters for that opcode. The opcode is sent least significant bit through to most significant bit. For example, to send the SSI command, the bits 1, 0, and 0 would be sent in that order. Each input parameter is sent in the same way, least significant bit first through to most significant bit last. Return values are read in the same way—least significant bit first and most significant bit last. The client must know how many bits to retrieve.

In some cases, the output bits from one chip's command can be fed directly as the input bits to another chip's command. An example of this is the RND and RD commands. The output bits from a call to RND on a trusted Authentication Chip do not have to be kept by System. Instead, System can transfer the output bits directly to the input of the non-trusted Authentication Chip's RD command. The description of each command points out where this is so. Each of the commands is examined in detail in the subsequent sections. Note that some algorithms are specifically designed because the permanent registers are kept in Flash memory.

Registers

The memory within the Authentication Chip contains some non-volatile memory to store the variables required by the Authentication Protocol. The following non-volatile (Flash) variables are defined:

Architecture Overview

This section chapter provides the high-level definition of a purpose-built CPU capable of implementing the functionality required of an Authentication Chip. Note that this CPU is not a general purpose CPU. It is tailor-made for implementing the Authentication logic. The authentication commands that a user of an Authentication Chip sees, such as WRITE, TST, RND etc are all implemented as small programs written in the CPU instruction set. The CPU contains a 32-bit Accumulator (which is used in most operations), and a number of registers. The CPU operates on 8-bit instructions specifically tailored to implementing authentication logic. Each 8-bit instruction typically consists of a 4-bit opcode, and a 4-bit operand.

Operating Speed

An internal Clock Frequency Limiter Unit prevents the chip from operating at speeds any faster than a predetermined frequency. The frequency is built into the chip during manufacture, and cannot be changed. The frequency is recommended to be about 4–10 MHz.

Composition and Block Diagram

The Authentication Chip contains the following components:

FIG. 181 illustrates a schematic block diagram of the Authentication Chip. The tamper prevention and Detection Circuitry is not shown: The Noise Generator, OverUnderPower Detection Unit, and ProgrammingMode Detection Unit are connected to the Tamper Prevention and Detection Circuitry and not to the remaining units.

Memory Map

FIG. 182 illustrates an example memory map. Although the Authentication Chip does not have external memory, it does have internal memory. The internal memory is addressed by 9 bits, and is either 32-bits wide or 8-bits wide (depending on address). The 32-bit wide memory is used to hold the non-volatile data, the variables used for HMAC-SHA1, and constants. The 8-bit wide memory is used to hold the program and the various jump tables used by the program. The address breakup (including reserved memory ranges) is designed to optimize address generation and decoding.

Constants

FIG. 183 illustrates an example of the constants memory map. The Constants region consists of 32-bit constants. These are the simple constants (such as 32-bits of all 0 and 32-bits of all 1), the constants used by the HMAC algorithm, and the constants $y_{0-3}$ and $h_{0-4}$ required for use in the SHA-1 algorithm. None of these values are affected by a RESET. The only opcode that makes use of constants is LDK. In this case, the operands and the memory placement are closely linked, in order to minimize the address generation and decoding.

RAM

FIG. 184 illustrates an example of the RAM memory map. The RAM region consists of the 32 parity-checked 32-bit registers required for the general functioning of the Authentication Chip, but only during the operation of the chip. RAM is volatile memory, which means that once power is removed, the values are lost. Note that in actual fact, memory retains its value for some period of time after power-down (due to memory remnance), but cannot be considered to. be available upon power-up. This has issues for security that are addressed in other sections of this document. RAM contains the variables used for the HMAC-SHA1 algorithm, namely: A–E, the temporary variable T, space for the 160-bit working hash value H, space for temporary storage of a hash result (required by HMAC) B160, and the space for the 512 bits of expanded hashing memory X. All RAM values are cleared to 0 upon a RESET, although any program code should not take this for granted. Opcodes that make use of RAM addresses are LD, ST, ADD, LOG, XOR, and RPL. In all cases, the operands and the memory placement are closely linked, in order to minimize the address generation and decoding (multiword variables are stored most significant word first).

Flash Memory—Variables

FIG. 185 illustrates an example of the Flash memory variables memory map. The Flash memory region contains the non-volatile information in the Authentication Chip. Flash memory retains its value after power is removed, and can be expected to be unchanged when the power is next turned on. The non-volatile information kept in multi-state Flash memory includes the two 160-bit keys ($K_1$ and $K_2$), the current random number value (R), the state data (M), the MinTicks value (MT), the AccessMode value (AM), and the IsWritten (ISW) and IsTrusted (IST) flags. Flash values are unchanged by a RESET, but are cleared (to 0) upon entering Programming Mode. Operations that make use of Flash addresses are LD, ST, ADD, RPL, ROR, CLR, and SET. In all cases, the operands and the memory placement are closely linked, in order to minimize the address generation and decoding. Multiword variables $K_1$, $K_2$, and M are stored most significant word first due to addressing requirements. The addressing scheme used is a base address offset by an index that starts at N and ends at $0$. Thus $M_N$ is the first word accessed, and $M_0$ is the last 32-bit word accessed in loop processing. Multiword variable R is stored least significant word first for ease of LFSR generation using the same indexing scheme.

Flash Memory—Program

FIG. 186 illustrates an example of the Flash memory program memory map. The second multi-state Flash memory region is 384×8-bits. The region contains the address tables for the JSR, JSI and TBR instructions, the offsets for the DBR commands, constants and the program itself. The Flash memory is unaffected by a RESET, but is cleared (to 0) upon entering Programming Mode. Once Programming Mode has been entered, the 8-bit Flash memory can be loaded with a new set of 384 bytes. Once this has been done, the chip can be RESET and the normal chip operations can occur.

Registers

A number of registers are defined in the Authentication Chip. They are used for temporary storage during function execution. Some are used for arithmetic functions, others are used for counting and indexing, and others are used for serial I/O. These registers do not need to be kept in non-volatile (Flash) memory. They can be read or written without the need for an erase cycle (unlike Flash memory). Temporary storage registers that contain secret information still need to be protected from physical attack by Tamper Prevention and Detection circuitry and parity checks.

All registers are cleared to 0 on a RESET. However, program code should not assume any particular state, and set up register values appropriately. Note that these registers do not include the various OK bits defined for the Tamper Prevention and Detection circuitry. The OK bits are scattered throughout the various units and are set to 1 upon a RESET.

Cycle

The 1-bit Cycle value determines whether the CPU is in a Fetch cycle (0) or an Execute cycle (1). Cycle is actually derived from a 1-bit register that holds the previous Cycle value. Cycle is not directly accessible from the instruction set. It is an internal register only.

Program Counter

A 6-level deep 9-bit Program Counter Array (PCA) is defined. It is indexed by a 3-bit Stack Pointer (SP). The current Program Counter (PC), containing the address of the currently executing instruction, is effectively. PCA[SP]. In addition, a 9-bit Adr register is defined, containing the resolved address of the current memory reference (for indexed or indirect memory accesses). The PCA, SP, and Adr registers are not directly accessible from the instruction set. They are internal registers only

CMD

The 8-bit CMD register is used to hold the currently executing command. While the CMD register is not directly accessible from the instruction set, and is an internal register only.

Accumulator and Z Flag

The Accumulator is a 32-bit general-purpose register. It is used as one of the inputs to all arithmetic operations, and is the register used for transferring information between memory registers. The Z register is a 1-bit flag, and is updated-each time the Accumulator is written to. The Z register contains the zero-ness of the Accumulator. Z=1 if the last value written to the Accumulator was 0, and 0 if the last value written was non-0. Both the Accumulator and Z registers are directly accessible from the instruction set.

Counters

A number of special purpose counters/index registers are defined:

All these counter registers are directly accessible from the instruction set. Special instructions exist to load them with specific values, and other instructions exist to decrement or increment them, or to branch depending on the whether or not the specific counter is zero. There are also 2 special flags (not registers) associated with C1 and C2, and these flags hold the zero-ness of C1 or C2. The flags are used for loop control, and are listed here, for although they are not registers, they can be tested like registers.

Flags

A number of 1-bit flags, corresponding to CPU operating modes, are defined:

All these 1-bit flags are directly accessible from the instruction set. Special instructions exist to set and clear these flags. Registers used for Write Integrity Registers used for I/O Four 1-bit registers are defined for communication between the client (System) and the Authentication Chip.

These registers are InBit, InBitValid, OutBit, and OutBitValid. InBit and InBitValid provide the means for clients to pass commands and data to the Authentication Chip. OutBit and OutBitValid provide the means for clients to get information from the Authentication Chip. A client sends commands and parameter bits to the Authentication Chip one bit at a time. Since the Authentication Chip is a slave device, from the Authentication Chip's point of view:

Reads from InBit will hang while InBitValid is clear. InBitValid will remain clear until the client has written the next input bit to InBit. Reading InBit clears the InBitValid bit to allow the next InBit to be read from the client. A client cannot write a bit to the Authentication Chip unless the InBitValid bit is clear.

Writes to OutBit will hang while OutBitValid is set. OutBitValid will remain set until the client has read the bit from OutBit. Writing OutBit sets the OutBitValid bit to allow the next OutBit to be read by the client. A client cannot read a bit from the Authentication Chip unless the OutBitValid bit is set.

Registers Used for Timing Access

A single 32-bit register is defined for use as a timer. The MTR (MinTicksRemaining) register decrements every time an instruction is executed. Once the MTR register gets to 0, it stays at zero. Associated with MTR is a 1-bit flag MTRZ, which contains the zero-ness of the MTR register. If MTRZ is 1, then the MTR register is zero. If MTRZ is 0, then the MTR register is not zero yet. MTR always starts off at the MinTicks value (after a RESET or a specific key-accessing function), and eventually decrements to 0. While MTR can be set and MTRZ tested by specific instructions, the value of MTR cannot be directly read by any instruction.

Register Summary

The following table summarizes all temporary registers (ordered by register name). It lists register names, size (in bits), as well as where the specified register can be found.

Instruction Set

The CPU operates on 8-bit instructions specifically tailored to implementing authentication logic. The majority of 8-bit instruction consists of a 4-bit opcode, and a 4-bit operand. The high-order 4 bits contains the opcode, and the low-order 4 bits contains the operand.

Opcodes and Operands (Summary)

The opcodes are summarized in the following table:

The following table is a summary of which operands can be used with which opcodes. The table is ordered alphabetically by opcode mnemonic. The binary value for each operand can be found in the subsequent tables.

The following operand table shows the interpretation of the 4-bit operands where all 4 bits are used for direct interpretation.

The following instructions make a selection based upon the highest bit of the operand:

The lowest 3 bits of the operand are either offsets (DBR, TBR), values from a special table (SC) or as in the case of LOG, they select the second input for the logical operation. The interpretation matches the interpretation for the ADD, LD, and ST opcodes:

ADD—Add To Accumulator

Mnemonic: ADD

Opcode: 1000

Usage: ADD Value

The ADD instruction adds the specified operand to the Accumalator via modulo $2^{32}$ addition. The operand is one of A, B, C, D, E, T, AM, MT, AE[C1], H[C1], B160[C1], R[C1], K[C1], M[C1], or X[N4]. The Z flag is also set during this operation, depending on whether the value loaded is zero or not.

CLR—Clear Bits

Mnemonic: CLR

Opcode: 0110

Usage: CLR Flag/Register

The CLR instruction causes the specified internal flag or Flash memory registers to be cleared. In the case of Flash memory, although the CLR instruction takes some time the next instruction is stalled until the erasure of Flash memory has finished. The registers that can be cleared are WE and K2MX. The Flash memory that can be cleared are: R, M[C1], Group1, and Group 2. Group1 is the IST and ISW flags. If these are cleared, then the only valid high level command is the SSI instruction. Group2 is the MT, AM, K1 and K2 registers. R is erased separately since it must be updated after each call to TST. M is also erased via an index mechanism to allow individual parts of M to be updated. There is also a corresponding SET instruction.

DBR—Decrement and Branch

Mnemonic: DBR

Opcode: 0001

Usage: DBR Counter, Offset

This instruction provides the mechanism for building simple loops. The high hit of the operand selects between testing C1 or C2 (the two counters). If the specified counter is non-zero, then the counter is decremented and the value at the given offset (sign extended) is added to the PC. If the specified counter is zero, it is decremented and processing continues at PC+1. The 8-entry offset table is stored at address 0 1100 0000 (the $64^{th}$ entry of the program memory). The 8 bits of offset are treated as a signed number. Thus 0xFF is treated as −1, and 0x01 is treated as +1. Typically the value will be negative for use in loops.

JSI—Jump Subroutine Indirect

Mnemonic: JSI

Opcode: 01001

Usage: JSI (Acc)

The JSI instruction allows the jumping to a subroutine dependant on the value currently in the Accumulator. The instruction pushes the current PC onto the stack, and loads the PC with a new value. The upper 8 bits of the new PC are loaded from Jump Table 2 (offfset given by the lower 5 bits of the Accumulator), and the lowest bit of the PC is cleared to 0. Thus all subroutines must start at even addresses. The stack provides for 6 levels of execution (5 subroutines deep). It is the responsibility of the programmer to ensure that this depth is not exceeded or the return value will be overwritten (since the stack wraps).

JSR—Jump Subroutine

Mnemonic: JSR

Opcode: 001

Usage: JSR Offset

The JSR instruction provides for the most common usage of the subroutine construct. The instruction pushes the current PC onto the stack, and loads the PC with a new value. The upper 8 bits of the new PC value comes from Address Table 1, with the offset into the table provided by the 5-bit operand (32 possible addresses). The lowest bit of the new PC is cleared to 0. Thus all subroutines must start at even addresses. The stack provides for 6 levels of execution (5 subroutines deep). It is the responsibility of the programmer to ensure that this depth is not exceeded or the return value will be overwritten (since the stack wraps).

LD—Load Accumulator
  Mnemonic: LD
  Opcode: 1011
  Usage: LD Value
  The LD instruction loads the Accumulator from the specified operand. The operand is one of A, B, C, D, E, T, AM, MT, AE[C1], H[C1], B160[C1], R[C1], K[C1], M[C1], or X[N4]. The Z flag is also set during this operation, depending on whether the value loaded is zero or not.

LDK—Load Constant
  Mnemonic: LDK
  Opcode: 1110
  Usage: LDK Constant
  The LDK instruction loads the Accumulator with the specified constant. The constants are those 32-bit values required for HMAC-SHA1 and all 0s and all 1s as most useful for general purpose processing. Consequently they are a choice of:.
  0x00000000
  0x36363636
  0x5C5C5C5C
  0xFFFFFFFF
or from the h and y constant tables, indexed by C1. The h and y constant tables hold the 32-bit tabular constants required for HMAC-SHA1. The Z flag is also set during this operation, depending on whether the constant loaded is zero or not.

LOG - Logical Operation.
  Mnemonic: LOG
  Opcode: 1001
  Usage: LOG Operation Value
  The LOG instruction performs 32-bit bitwise logical operations on the Accumulator and a specified value. The two operations supported by the LOG instruction are AND and OR. Bitwise NOT and XOR operations are supported by the XOR instruction. The 32-bit value to be ANDed or ORed with the accumulator is one of the following: A, B, C, D, E, T, MT and AM. The Z flag is also set during this operation, depending on whether resultant 32-bit value (loaded into the Accumulator) is zero or not.

ROR—Rotate Right
  Mnemonic: ROR
  Opcode: 1100
  Usage: ROR Value
  The ROR instruction provides a way of rotating the Accumulator right a set number of bits. The bit coming in at the top of the Accumulator (to become bit 31) can either come from the previous bit 0 of the Accumulator, or from an external 1-bit flag (such as a flag, or the serial input connection). The bit rotated out can also be output from the serial connection, or combined with an external flag. The allowed operands are: InBit, OutBit, LFSR, RLFSR, IST, ISW, MTRZ, 1, 2, 27, and 31. The Z flag is also set during this operation, depending on whether resultant 32-bit value (loaded into the Accumulator) is zero or not. In its simplest form, the operand for the ROR instruction is one of 1, 2, 27, 31, indicating how many bit positions the Accumulator should be rotated. For these operands, there is no external input or output—the bits of the Accumulator are merely rotated right. With operands IST, ISW, and MTRZ, the appropriate flag is transferred to the highest bit of the Accumulator. The remainder of the Accumulator is shifted right one bit position (bit 31 becomes bit 30 etc), with lowest bit of the Accumulator shifted out. With operand InBit, the next serial input bit is transferred to the highest bit of the Accumulator. The InBitValid bit is then cleared. If there is no input bit available from the client yet, execution is suspended until there is one. The remainder of the Accumulator is shifted right one bit position (bit 31 becomes bit 30 etc), with lowest bit of the Accumulator shifted out.

With operand OutBit, the Accumulator is shifted right one bit position. The bit shifted out from bit 0 is stored in the OutBit flag and the OutBitValid flag is set. It is therefore ready for a client to read. If the OutBitValid flag is already set, execution of the instruction stalls until the OutBit bit has been read by the client (and the OutBitValid flag cleared). The new bit shifted in to bit 31 should be considered garbage (actually the value currently in the InBit register). Finally, the RB and XRB operands allow the implementation of LFSRs and multiple precision shift registers. With RB, the bit shifted out (formally bit 0) is written to the RTMP register. The register currently in the RTMP register becomes the new bit 31 of the Accumulator. Performing multiple ROR RB commands over. several 32-bit values implements a multiple precision rotate/shift right. The XRB operates in the same way as RB, in that the current value in the RTMP register becomes the new bit of the Accumulator. However with the XRB instruction, the bit formally known as bit 0 does not simply replace RTMP (as in the RB instruction). Instead, it is XORed with RTMP, and the result stored in RTMP. This allows the implementation of long LFSRs, as required by the Authentication protocol.

RPL—Replace Bits
  Mnemonic: RPL
  Opcode: 1101
  Usage: ROR Value
  The RPL instruction is designed for implementing the high level WRITE command in the Authentication Chip. The instruction is designed to replace the upper 16 bits of the Accumulator by the value that will eventually-be-written to the M array (dependent on the Access Mode value). The instruction takes 3 operands: Init, MHI, and MLO. The Init operand sets all internal flags and prepares the RPL unit within the ALU for subsequent processing. The Accumulator is transferred to an internal AccessMode register. The Accumulator should have been loaded from the AM Flash memory location before the call to RPL Init in the case of implementing the WRITE command, or with 0 in the case of implementing the TST command. The Accumulator is left unchanged. The MHI and MLO operands refer to whether the upper or lower 16 bits of M[C1] will be used in the comparison against the (always) upper 16 bits of the Accumulator. Each MHI and MLO instruction executed uses the subsequent 2 bits from the initialized AccessMode value. The first execution of MHI or MLO uses the lowest 2 bits, the next uses the second two bits etc.

RTS—Return From Subroutine
  Mnemonic: RTS
  Opcode: 01000
  Usage: RTS
  The RTS instruction causes execution to resume at the instruction after the most recently executed JSR or JSI instruction. Hence the term: returning from the subroutine. In actuality, the instruction pulls the saved. PC from the stack, adds 1, and resumes execution at the resultant address. Although 6 levels of execution are provided for (5 subroutines), it is the responsibility of the programmer to balance each JSR and JSI instruction with an RTS. An RTS executed with no previous JSR will cause execution to begin at whatever address happens to be pulled from the stack.

SC—Set Counter
  Mnemonic: SC
  Opcode: 0101
  Usage: SC Counter Value

The SC instruction is used to load a counter with a particular value. The operand determines which of counters C1 and C2 is to be loaded. The Value to be loaded is one of 2, 3, 4, 7, 10, 15, 19, and 31. The counter values are used for looping and indexing. Both C1 and C2 can be used for looping constructs (when combined with the DBR instruction), while only C1 can be used for indexing 32-bit parts of multi-precision variables.

SET—Set Bits
  Mnemonic: SET
  Opcode: 0111
  Usage: SET Flag/Register

The SET instruction allows the setting of particular flags or flash memory. There is also a corresponding CLR instruction. The WE and K2MX operands each set the specified flag for later processing. The IST and ISW operands each set the appropriate bit in Flash memory, while the MTR operand transfers the current value in the Accumulator into the MTR register. The SET Nx command loads N1–N4 with the following constants:

Note that each initial $X[N_n]$ referred to matches the optimized SHA-1 algorithm initial states for indexes N1–N4. When each index value $N_n$ decrements, the effective X[N] increments. This is because the X words are stored in memory with most significant word first.

ST—Store Accumulator
  Mnemonic: ST
  Opcode: 1111
  Usage: ST Location

The ST instruction is stores the current value of the Accumulator in the specified location. The location is one of A, B, C, D, E, T, AM, MT, AE[C1], H[C1], B160[C1], R[C1], K[C1], M[C1], or X[N4]. The X[N4] operand has the side effect of advancing the N4 index. After the store has taken place, N4 will be pointing to the next element in the X array. N4 decrements by 1, but since the X array is ordered from high to low, to decrement the index advances to the next element in the array. If the destination is in Flash memory, the effect of the ST instruction is to set the bits in the Flash memory corresponding to the bits in the Accumulator. To ensure a store of the exact value from the Accumulator, be sure to use the CLR instruction to erase the appropriate memory location first.

TBR—Test and Branch
  Mnemonic: TBR
  Opcode: 0000
  Usage: TBR Value Index

The Test and Branch instruction tests whether the Accumulator is zero or non-zero, and then branches to the given address if the Accumulator's current state matches that being tested for. If the Z flag matches the TRB test, replace the PC by 9 bit value where bit0=0 and upper 8 bits come from MU. Otherwise increment current PC by 1. The Value operand is either 0 or 1. A 0 indicates the test is for the Accumulator to be zero. A 1 indicates the test is for the Accumulator to be non-zero. The Index operand indicates where execution is to jump to should the test succeed. The remaining 3 bits of operand index into the lowest 8 entries of Jump Table 1. The upper 8 bits are taken from the table, and the lowest bit (bit 0) is cleared to 0. CMD is cleared to 0 upon a RESET. 0 is translated as TBR 0, which means branch to the address stored in address offset 0 if the Accumulator=0. Since the Accumulator and Z flag are also cleared to 0 on a RESET, the test will be true, so the net effect is a jump to the address stored in the 0th entry in the jump table.

XOR—Exclusive OR
  Mnemonic: XOR
  Opcode: 1010
  Usage: XOR Value

The XOR instruction performs a 32-bit bitwise XOR with the Accumulator, and stores the result in the Accumulator. The operand is one of A, B. C, D, E, T, AM, MT, X[N1], X[N2], X [N3], or X[N4]. The Z flag is also set during this operation, depending on the result (i.e. what value is loaded into the Accumulator). A bitwise NOT operation can be performed by XORing the Accumulator with 0xFFFFFFFF (via the LDK instruction). The X[N] operands have a side effect of advancing the appropriate index to the next value (after the operation). After the XOR has taken place, the index will be pointing to the next element in the X array. N4 is also advanced by the ST X[N4] instruction. The index decrements by 1, but since the X array is ordered from high to low, to decrement the index advances to the next element in the array.

ProgrammingMode Detection Unit

The ProgrammingMode Detection Unit monitors the input clock voltage. If the clock voltage is a particular value the Erase Tamper Detection Line is triggered to erase all keys, program code, secret information etc and enter Program Mode. The ProgrammingMode Detection Unit can be implemented with regular CMOS, since the key does not pass through this unit. It does not have to be implemented with non-flashing CMOS. There is no particular need to cover the ProgrammingMode Detection Unit by the Tamper Detection Lines, since an attacker can always place the chip in ProgrammingMode via the CLK input. The use of the Erase Tamper Detection Line as the signal for entering Programming Mode means that if an attacker wants to use Programming Mode as part of an attack, the Erase Tamper Detection Lines must be active and functional. This makes an attack on the Authentication Chip far more difficult.

Noise Generator

The Noise Generator can be implemented with regular CMOS, since the key does not pass through this unit. It does not have to be implemented with non-flashing CMOS. However, the Noise Generator must be protected by both Tamper Detection and Prevention lines so that if an attacker attempts to tamper with the unit, the chip will either RESET or erase all secret information. In addition, the bits in the LFSR must be validated to ensure they have not been tampered with (i.e. a parity check). If the parity check fails, the Erase Tamper Detection Line is triggered. Finally, all 64 bits of the Noise Generator are ORed into a single bit. If this bit is 0, the Erase Tamper Detection Line is triggered. This is because 0 is an invalid state for an LFSR. There is no point in using an OK bit setup since the Noise Generator bits are only used by the Tamper Detection and Prevention circuitry.

State Machine

The State Machine is responsible for generating the two operating cycles of the CPU, stalling during long command operations, and storing the op-code and operand during operating cycles. The State Machine can be implemented with regular CMOS, since the key does not pass through this unit. It does not have to be implemented with non-flashing CMOS. However, the opcode/operand latch needs to be parity-checked. The logic and registers contained in the State Machine must be covered by both Tamper Detection Lines. This is to ensure that the instructions to be executed are not changed by an attacker. The Authentication Chip does not require the high speeds and throughput of a general purpose CPU. It must operate fast enough to perform the authentication protocols, but not faster. Rather than have specialized circuitry for optimizing branch control or executing opcodes while fetching the next one (and all the complexity associated with that), the state machine adopts a simplistic view of the world. This helps to minimize design time as well as reducing the possibility of error in implementation.

The general operation of the state machine is to generate sets of cycles:

Cycle 0: Fetch cycle. This is where the opcode is fetched from the program memory, and the effective address from the fetched opcode is generated.

Cycle 1: Execute cycle. This is where the operand is (potentially) looked up via the generated effective address (from Cycle 0) and the operation itself is executed.

Under normal conditions, the state machine generates cycles: 0, 1, 0, 1, 0, 1, 0, 1 . . . However, in some cases, the state machine stalls, generating Cycle 0 each clock tick until the stall condition finishes. Stall conditions include waiting for erase cycles of Flash memory, waiting for clients to read or write serial information, or an invalid opcode (due to tampering). If the Flash memory is currently being erased, the next instruction cannot execute until the Flash memory has finished being erased. This is determined by the Wait signal coming from the Memory Unit. If Wait=1, the State Machine must only generate Cycle 0s. There are also two cases for stalling due to serial I/O operations:

The opcode is ROR OutBit, and OutBitValid already=1. This means that the current operation requires outputting a bit to the client, but the client hasn't read the last bit yet.

The operation is ROR InBit, and InBitValid=0. This means that the current operation requires reading a bit from the client, but the client hasn't supplied the bit yet.

In both these cases, the state machine must stall until the stalling condition has finished. The next "cycle" therefore depends on the old or previous cycle, and the current values of CMD, Wait, OutBitValid, and InBitValid. Wait comes from the MU, and OutBitValid and InBitValid come from the I/O Unit. When Cycle is 0, the 8-bit op-code is fetched from the memory unit and placed in the 8-bit CMD register. The write enable for the CMD register is therefore ~Cycle. There are two outputs from this unit: Cycle and CMD. Both of these values are passed into all the other processing units within the Authentication Chip. The 1-bit Cycle value lets each unit know whether a fetch or execute cycle is taking place, while the 8-bit CMD value allows each unit to take appropriate action for commands related to the specific unit.

FIG. 187 shows the data flow and relationship between components of the State Machine where:

Old and CMD are both cleared to 0 upon a RESET. This results in the first cycle being 1, which causes the 0 vCMD to be executed. 0 is translated as TBR 0, which means branch to the address stored in address offset 0 if the Accumulator= 0. Since the Accumulator is also cleared to 0 on a RESET, the test will be true, so the net effect is a jump to the address stored in the 0th entry in the jump table. The two VAL units are designed to validate the data that passes through them. Each contains an OK bit connected to both Tamper Prevention and Detection Lines. The OK bit is set to 1 on RESET, and ORed with the ChipOK values from both Tamper Detection Lines each cycle. The OK bit is ANDed with each data bit that passes through the unit. In the case of $VAL_1$, the effective Cycle will always be 0 if the chip has been tampered with. Thus no program code will execute since there will never be a Cycle 1. There is no need to check if Old has been tampered with, for if an attacker freezes the Old state, the chip will not execute any further instructions. In the case of $VAL_2$, the effective 8-bit CMD value will always be 0 if the chip has been tampered with, which is the TBR 0 instruction. This will stop execution of any program code. $VAL_2$ also performs a parity check on the bits from CMD to ensure that CMD has not been tampered with. If the parity check fails, the Erase Tamper Detection Line is triggered.

I/O Unit

The I/O Unit is responsible for communicating serially with the outside world. The Authentication Chip acts as a slave serial device, accepting serial data from a client, processing the command, and sending the resultant data to the client serially. The I/O Unit can be implemented with regular CMOS, since the key does not pass through this unit. It does not have to be implemented with non-flashing CMOS. In addition, none of the latches need to be parity checked since there is no advantage for an attacker to destroy. or modify them. The I/O Unit outputs 0s and inputs 0s if either of the Tamper Detection Lines is broken. This will only come into effect if an attacker has disabled the, RESET and/or erase circuitry, since breaking either Tamper Detection Lines should result in a RESET or the erasure of all Flash memory The InBit, InBitValid, OutBit, and OutBitValid 1 bit registers are used for communication between the client (System) and the Authentication Chip. InBit and InBitValid provide the means for clients to pass commands and data to the Authentication Chip. OutBit and OutBitValid provide the means for clients to get information from the Authentication Chip. When the chip is RESET, InBitValid and OutBitValid are both cleared. A client sends commands and parameter bits to the Authentication Chip one bit at a time. From the Authentication Chip's point of view:

Reads from InBit will hang while InBitValid is clear. InBitValid will remain clear until the client has written the next input bit to InBit. Reading InBit clears the InBitValid bit to allow the next InBit to be read from the client. A client cannot write a bit to the Authentication Chip unless the InBitValid bit is clear.

Writes to OutBit will hang while OutBitValid is set. OutBitValid will remain set until the client has read the bit from OutBit. Writing OutBit sets the OutBitValid bit to allow the next OutBit to be read by the client. A client cannot read a bit from the Authentication Chip unless the OutBitValid bit is set.

The actual stalling of commands is taken care of by the State Machine, but the various communication registers and the communication circuitry is found in the I/O Unit.

FIG. 188 shows the data flow and relationship between components of the I/O Unit where:

The Serial I/O unit contains the circuitry for communicating externally with the external world via the Data pin. The InBitUsed control signal must be set by whichever unit consumes the InBit during a given clock cycle (which can be any state of Cycle). The two VAL units are validation units connected to the Tamper Prevention and Detection circuitry, each with an OK bit. The OK bit is set to 1 on RESET, and ORed with the ChipOK values from both Tamper Detection Lines each cycle. The OK bit is ANDed with each data bit that passes through the unit. In the case of $VAL_1$, the effective bit output from the chip will always be 0 if the chip has been tampered with. Thus no useful output can be generated by an attacker. In the case of $VAL_2$, the effective bit input to the chip will always be 0 if the chip has been tampered with. Thus no useful input can be chosen by an attacker. There is no need to verify the registers in the I/O Unit since an attacker does not gain anything by destroying or modifying them.

ALU

FIG. 189 illustrates a schematic block diagram of the Arithmetic Logic Unit. The Arithmetic Logic Unit (ALU) contains a 32-bit Acc (Accumulator) register as well as the circuitry for simple arithmetic and logical operations. The ALU and all sub-units must be implemented with non-flashing CMOS since the key passes through it. In addition, the Accumulator must be parity-checked. The logic and registers contained in the ALU must be covered by both Tamper Detection Lines. This is to ensure that keys and intermediate calculation values cannot be changed by an attacker. A 1-bit Z register contains the state of zero-ness of the Accumulator. Both the Z and Accumulator registers are cleared to 0 upon a RESET. The. Z register is updated whenever the Accumulator is updated, and the Accumulator is updated for any of the commands: LD, LDK, LOG, XOR, ROR, RPL, and ADD. Each arithmetic and logical block operates on two 32-bit inputs: the current value of the Accumulator, and the current 32-bit output of the MU. Where:

Since the WriteEnables of Acc and Z takes $CMD_7$ and Cycle into account (due to $Logic_1$), these two bits are not required by the multiplexor $MX_1$ in order to select the output. The output selection for $MX_1$ only requires bits 6–3 of CMD and is therefore simpler as a result.

The two VAL units are validation units connected to the. Tamper Prevention and Detection circuitry, each with an OK bit. The OK bit is set to 1 on RESET, and ORed with the ChipOK values from both Tamper Detection Lines each cycle. The OK bit is ANDed with each data bit that passes through the unit. In the case of $VAL_1$, the effective bit output from the Accumulator will always be 0 if the chip has been tampered with. This prevents an attacker from processing anything involving the Accumulator. $VAL_1$ also performs a parity check on the Accumulator, setting the Erase Tamper Detection Line if the check fails. In the case of $VAL_2$, the effective Z status of the Accumulator will always be true if the chip has been tampered with. Thus no looping constructs can be created by an attacker. The remaining function blocks in the ALU are described as follows. All must be implemented in non-flashing CMOS.

RPL

FIG. 190 illustrates a schematic block diagram of the RPL unit. The RPL unit is a component within the ALU. It is designed to implement the RPLCMP functionality of the Authentication Chip. The RPLCMP command is specifically designed for use in secure writing to Flash memory M, based upon the values in AccessMode. The RPL unit contains a 32-bit shift register called AMT (AccessModeTemp), which shifts right two bits each shift pulse, and two 1-bit registers called EE and DE, directly based upon the WR pseudocode's EqEncountered and DecEncountered flags. All registers are cleared to 0 upon a RESET. AMT is loaded with the 32 bit AM value (via the Accumulator) with a RPL INIT command, and EE and DE are set according to the general write algorithm via calls to RPL MHI and RPL MLO. The EQ and LT blocks have functionality exactly as documented in the WR command pseudocode. The EQ block outputs 1 if the 2 16-bit inputs are bit-identical and 0 if they are not. The LT block outputs 1 if the upper 16-bit input from the Accumulator is less than the 16-bit value selected from the MU via $MX_2$. The comparison is unsigned.

The bit patterns for the operands are specifically chosen to make the combinatorial logic simpler. The bit patterns for the operands are listed again here since we will make use of the patterns:

The MHI and MLO have the hi bit set to easily differentiate them from the Init bit pattern, and the lowest bit can be used to differentiate between MHI and MLO. The EE and DE flags must be updated each time the RPL command is issued. For the Init stage, we need to setup the two values with 0, and for MHI and MLO, we need to update the values of EE and DE appropriately. The WriteEnable for EE and DE is therefore:

With the 32 bit AMT register, we want to load the register with the contents of AM (read from the MU) upon an RPL Init command, and to shift the AMT register right two bit positions for the RPL MLO and RPL MHI commands. This can be simply tested for with the highest bit of the RPL operand ($CMD_3$) The WriteEnable and ShiftEnable for the AMT register is therefore:

The output from $Logic_3$ is also useful as input to multiplexor $MX_1$, since it can be used to gate through either the current 2 access mode bits or 00 (which results in a reset of the DE and EE registers since it represents the access mode RW). Consequently $MX_1$ is:

The RPL logic only replaces the upper 16 bits of the Accumulator. The lower 16 bits pass through untouched. However, of the 32 bits from the MU (corresponding to one of M[0–15]), only the upper or lower 16 bits are used. Thus $MX_2$ tests $CMD_0$ to distinguish between MHI and MLO.

The logic for updating the DE and EE registers matches the pseudocode of the WR command. Note that an input of an AccessMode value of 00 (=RW which occurs during an RPL INIT) causes both DE and EE to be loaded with 0 (the correct initialization value). EE is loaded with the result from $Logic_4$, and DE is loaded with the result from $Logic_5$.

The upper 16 bits of the Accumulator must be replaced with the value that is to be written to M. Consequently $Logic_6$ matches the WE flag from the WR command pseudocode.

The output from $Logic_6$ is used directly to drive the selection between the original 16 bits from the Accumulator and the value from M[0–15] via multiplexor $MX_3$. If the 16 bits from the Accumulator are selected (leaving the Accumulator unchanged), this signifies that the Accumulator value can be written to M[n]. If the 16-bit value from M is selected (changing the upper 16 bits of the Accumulator), this signifies that the 16-bit value in M will be unchanged. $MX_3$ therefore takes the following form:

There is no point parity checking AMT as an attacker is better off forcing the input to $MX_3$ to be 0 (thereby enabling an attacker to write any value to M). However, if an attacker is going to go to the trouble of laser-cutting the chip (including all Tamper Detection tests and circuitry), there are better targets than allowing the possibility of a limited chosen-text attack by fixing the input of $MX_3$.

ROR

FIG. 191 illustrates a schematic block diagram of the ROR block of the ALU. The ROR unit is a component within the ALU. It is designed to implement the ROR functionality of the Authentication Chip. A 1-bit register named RTMP is contained within the ROR unit. RTMP is cleared to 0 on a RESET, and set during the ROR RB and ROR XRB commands. The RTMP register allows implementation of Linear Feedback Shift Registers with any tap configuration. The XOR block is a 2 single-bit input, 1-bit out XOR. The RORn, blocks are shown for clarity, but in fact would be hardwired into multiplexor $MX_3$, since each block is simply a rewiring of the 32-bits, rotated right N bits. All 3 multiplexors ($MX_1$, $MX_2$, and $MX_3$) depend upon the 8-bit CMD value. However, the bit patterns for the ROR op-code are arranged for logic optimization purposes. The bit patterns for the operands are listed again here since we will make use of the patterns:

$Logic_1$ is used to provide the WriteEnable signal to RTMP. The RTMP register should only be written to during ROR RB and ROR XRB commands. $Logic_2$ is used to provide the control signal whenever the InBit is consumed. The two combinatorial logic blocks are:

With multiplexor $MX_1$, we are selecting the bit to be stored in RTMP. $Logic_2$ already narrows down the CMD inputs to one of RB and XRB. We can therefore simply-test $CMD_0$ to differentiate between the two. The following table expresses the relationship between $CMD_0$ and the value output from $MX_1$.

With multiplexor $MX_2$, we are selecting which input bit is going to replace bit 0 of the Accumulator input. We can only perform a small amount of optimization here, since each different input bit typically relates to a specific operand. The following table expresses the relationship between $CMD_{3-0}$ and the value output from $MX_2$.

The final multiplexor, $MX_3$, does the final rotating of the 32-bit value. Again, the bit patterns of the CMD operand are taken. advantage of:

MinTicks Unit

FIG. 192 shows the data flow and relationship between components of the MinTicks Unit. The MinTicks Unit is responsible for a programmable minimum delay (via a countdown) between key-based operations within the Authentication Chip. The logic and registers contained in the MinTicksUnit must be covered by both Tamper Detection Lines. This is to ensure that an attacker cannot change the time between calls to key-based functions. Nearly all of the MinTicks Unit can be implemented with regular CMOS, since the key does not pass through most of this unit. However the Accumulator is used in the SET MTR instruction. Consequently this tiny section of circuitry must be implemented in non-flashing CMOS. The remainder of the MinTicks Unit does not have to be implemented with non-flashing CMOS. However, the MTRZ latch (see below) needs to be parity checked.

The MinTicks Unit contains a 32-bit register named MTR (MinTicksRemaining). The MTR register contains the number of clock ticks remaining before the next key-based function can be called. Each cycle, the value in MTR is decremented by 1 until the value is 0. Once MTR hits 0, it does not decrement any further. An additional one-bit register named MTRZ (MinTicksRegisterZero) reflects the current zero-ness of the MTR register. MTRZ is 1 if the MTRZ register is 0, and MTRZ is 0 if the MTRZ register is not 0. The MTR register is cleared by a RESET, and set to a new count via the SET MTR command, which transfers the current value in the Accumulator into the MTR register. Where:

And :

Since Cycle is connected to the WriteEnables of MTR and MTRZ, these registers only update during the Execute cycle, i.e. when Cycle=1. The two VAL units are validation units connected to the Tamper Prevention and Detection circuitry, each with an OK bit. The OK bit is set to 1 on RESET, and ORed with the ChipOK values from both Tamper Detection Lines each cycle. The OK bit is ANDed with each data bit that passes through the unit. In the case of $VAL_1$, the effective output from MTR is 0, which means that the output from the decrementor unit is all 1s, thereby causing MTRZ to remain 0, thereby preventing an attacker from using the key-based functions. $VAL_1$ also validates the parity of the MTR register. If the parity check fails, the Erase Tamper Detection Line is triggered. In the case of $VAL_2$, if the chip has been tampered with, the effective output from MTRZ will be 0, indicating that the MinTicksRemaining register has not yet reached 0, thereby preventing an attacker from using the key-based functions.

Program Counter Unit

FIG. 192 is a block diagram of the Program Counter Unit. The Program Counter Unit (PCU) includes the 9 bit PC (Program Counter), as well as logic for branching and subroutine control. The Program Counter Unit can be implemented with regular CMOS, since the key does not pass through this unit. It does not have to be implemented with non-flashing CMOS. However, the latches need to be parity-checked. In addition, the logic and registers contained in the Memory Unit must be covered by both Tamper Detection Lines to ensure that the PC cannot be changed by an attacker. The PC is actually implemented as a 6-level by 9-bit PCA (PC Array), indexed by the 3-bit SP (Stack Pointer) register. The PC and SP registers are all cleared to 0 on a RESET, and updated during the flow of program control according to the opcodes. The current value for the PC is output to the MU during Cycle 0 (the Fetch cycle). The PC is updated during Cycle 1 (the Execute cycle) according on the command being executed. In most cases, the PC simply increments by 1. However, when branching occurs (due to subroutine or some other form of jump), the PC is replaced by a new value. The mechanism for calculating the new PC value depends upon the opcode being processed.

The ADD block is a simple adder modulo $2^9$. The inputs are the PC value and either 1 (for incrementing the PC by 1) or a 9 bit offset (with hi bit set and lower 8 bits from the MU). The "+1" block takes a 3-bit input and increments it by 1 (with wrap). The "−1" block takes a 3-bit input and decrements it by 1 (with wrap). The different forms of PC control are as follows:

Since the same action takes place for JSR, and JSI(ACC), we specifically detect that case in $Logic_1$. By the same concept, we can specifically test for the JSI RTS case in $Logic_2$.

When updating the PC, we must decide if the PC is to be replaced by a completely new item, or by the result of the adder. This is the case for JSR and JSI (ACC), as well as TBR as long as the test bit matches the state of the Accumulator. All but TBR is tested for by $Logic_1$, so $Logic_3$ also includes the output of $Logic_1$ as its input. The output from $Logic_3$ is then used by multiplexors $MX_2$ to obtain the new PC value.

The input to the 9-bit adder depends on whether we are incrementing by 1 (the usual case), or adding the offset as read from the MU (the DBR command). $Logic_4$ generates the test. The output from $Logic_4$ is then directly used by multiplexor $MX_3$ accordingly.

Finally, the selection of which PC entry to use depends on the current value for SP. As we enter a subroutine, the SP index value must increment, and as we return from a subroutine, the SP index value must decrement. In all other cases, and when we want to fetch a command (Cycle 0), the current value for the SP must be used. $Logic_1$ tells us when a subroutine is being entered, and $Logic_2$ tells us when the subroutine is being returned from. The multiplexor selection is therefore defined as follows:

The two VAL units are validation units connected to the Tamper Prevention and Detection circuitry), each with an OK bit. The OK bit is set to 1 on RESET, and ORed with the ChipOK values from both Tamper Detection Lines each cycle. The OK bit is ANDed with each data bit that passes through the unit. Both VAL units also parity-check the data bits to ensure that they are valid. If the parity-check fails, the Erase Tamper Detection Line is triggered. In the case of $VAL_1$, the effective output from the SP register will always be 0. If the chip has been tampered with. This prevents an attacker from executing any subroutines. In the case of $VAL_2$, the effective PC output will always be 0 if the chip has been tampered with. This prevents an attacker from executing any program code.

Memory Unit

The Memory Unit (MU) contains the internal memory of the Authentication Chip. The internal memory is addressed by 9 bits of address, which is passed in from the Address Generator Unit. The Memory Unit outputs the appropriate 32-bit and 8-bit values according to the address. The Memory Unit is also responsible for the special Programming Mode, which allows input of the program Flash memory. The contents of the entire Memory Unit must be protected from tampering. Therefore the logic and registers contained in the Memory Unit must be covered by both Tamper Detection Lines. This is to ensure that program code, keys, and intermediate data values cannot be changed by an attacker. All Flash memory needs to be multi-state, and must be checked upon being read for invalid voltages. The 32-bit RAM also needs to be parity-checked. The 32-bit data paths through the Memory Unit must be implemented with non-flashing CMOS since the key passes along them. The 8-bit data paths can be implemented in regular CMOS since the key does not pass along them.

Constants

The Constants memory region has address range: 000000000–000001111. It is therefore the range 00000xxxx. However, given that the next 48 addresses are reserved, this can be taken advantage of during decoding. The Constants memory region can therefore be selected by the upper 3 bits of the address ($Adr_{8-6}$=000), with the lower 4 bits fed into combinatorial logic, with the 4 bits mapping to 32-bit output values as follows:

RAM

The address space for the 32 entry 32-bit RAM is 001000000–001011111. It is therefore the range 0010xxxxx. The RAM memory region can therefore be selected by the upper 4 bits of the address ($Adr_{8-5}$=0010), with the lower 5 bits selecting which of the 32 values to address. Given the contiguous 32-entry address space, the RAM can easily be implemented as a simple 32×32-bit RAM. Although the CPU treats each address from the range 00000–11111 in special ways, the RAM address decoder itself treats no address specially. All RAM values are cleared to 0 upon a RESET, although any program code should not take this for granted.

Flash Memory—Variables

The address space for the 32-bit wide Flash memory is 001100000–001111111. It is therefore the range 0011xxxxx. The Flash memory region can therefore be selected by the upper 4 bits of the address ($Adr_{8-5}$=0111), with the lower 5 bits selecting which value to address. The Flash memory has special requirements for erasure. It takes quite some time for the erasure of Flash memory to complete. The Wait signal is therefore set inside the Flash controller upon receipt of a CLR command, and is only cleared once the requested memory has been erased. Internally, the erase lines of particular memory ranges are tied together, so that only 2 bits are required as indicated by the following table:

Flash values are unchanged by a RESET, although program code should not take the initial values for Flash (after manufacture) other than garbage. Operations that make use of Flash addresses are LD, ST, ADD, RPL, ROR, CLR, and SET. In all cases, the operands and the memory placement are closely linked, in order to minimize the address generation and decoding. The entire variable section of Flash memory is also erased upon entering Programming Mode, and upon detection of a definite physical Attack.

Flash Memory—Program

The address range for the 384 entry 8-bit wide program Flash memory is 010000000–111111111. It is therefore the range 01xxxxxxx–11xxxxxxx. Decoding is straightforward given the ROM start address and address range. Although the CPU treats parts of the address range in special ways, the address decoder itself treats no address specially. Flash values are unchanged by a RESET, and are cleared only by entering Programming Mode. After manufacture, the Flash contents must be considered to be garbage. The 384 bytes can only be loaded by the State machine when in Programming Mode.

Block Diagram of MU

FIG. 193 is a block diagram of the Memory Unit. The logic shown takes advantage of the fact that 32-bit data and 8-bit data are required by separate commands, and therefore fewer bits are required for decoding. As shown, 32-bit output and 8-bit output are always generated. The appropriate components within the remainder of the Authentication Chip simply use the 32-bit or 8-bit value depending on the command being executed. Multiplexor $MX_1$, selects the 32-bit output from a choice of Truth Table constants, RAM, and Flash memory. Only 2 bits are required to select between these 3 outputs, namely $Adr_6$ and $Adr_5$. Thus $MX_2$ takes the following form:

The logic for erasing a particular part of the 32-bit Flash memory is satisfied by $Logic_1$. The Erase Part control signal should. only be set during a CLR command to the correct part of memory while Cycle=1. Note that a single CLR command may clear a range of Flash memory. $Adr_6$ is sufficient as an address range for CLR since the range will always be within Flash for valid operands, and 0 for non-valid operands. The entire range of 32-bit wide Flash memory is erased when the Erase Detection Lines is triggered (either by an attacker, or by deliberately entering. Programming Mode).

The logic for writing to a particular part of Flash memory is satisfied by $Logic_2$. The WriteEnable control signal should only be set during an appropriate ST command to a Flash memory range while Cycle=1. Testing only $Adr_{6-5}$ is acceptable since the ST command only validly writes to Flash or RAM (if Adr6-5 is 00, K2MX must be 0).

The WE (WriteEnable) flag is set during execution of the SET WE and CLR WE commands. $Logic_3$ tests for these two cases. The actual bit written to WE is $CMD_4$.

The logic for writing to the RAM region of memory is satisfied by $Logic_4$. The WriteEnable control signal should only be set during an appropriate ST command to a RAM memory range while Cycle=1. However this is tempered by the WE flag, which governs whether writes to X[N] are permitted. The X[N] range is the upper half of the RAM, so this can be tested for using $Adr_4$. Testing only $Adr_{6-5}$ as the full address range of RAM is acceptable since the ST command only writes to Flash or RAM.

The three VAL units are validation units connected to the Tamper Prevention and Detection circuitry, each with an OK bit. The OK bit is set to 1 on RESET, and ORed with the ChipOK values from both Tamper Detection Lines each cycle. The OK bit is ANDed with each data bit that passes through the unit. The VAL units also check the data bits to ensure that they are valid. $VAL_1$ and $VAL_2$ validate by checking the state of each data bit, and $VAL_3$ performs a parity check. If any validity test fails, the Erase Tamper Detection Line is triggered. In the case of $VAL_1$, the effective output from the program Flash will always be 0 (interpreted as TBR 0) if the chip has been tampered with. This prevents an attacker from executing any useful instructions. In the case of $VAL_2$, the effective 32-bit output will always be 0 if the chip has been tampered with. Thus no key or intermediate storage value is available to an attacker. The 8-bit Flash memory is used to hold the program code, jump tables and other program information. The 384 bytes of Program Flash memory are selected by the full 9 bits of address (using address range 01xxxxxxx–11xxxxxxx). The Program Flash memory is erased only when the Erase Detection Lines is triggered (either by an attacker, or by entering Programming Mode due to the Programming Mode Detection Unit). When the Erase Detection Line is triggered, a small state machine in the Program Flash Memory Unit erases the 8-bit Flash. memory, validates the erasure, and loads in the new contents (384 bytes) from the serial input. The following pseudocode illustrates the state machine logic that is executed when the Erase Detection line is triggered:

Set WAIT output bit to prevent the remainder of the chip from functioning
   Fix 8-bit output to be 0
   Erase all 8-bit Flash memory
   Temp←0
   For Adr=0 to 383
     Temp←Temp OR $Flash_{Adr}$
   IF (Temp≠0)
     Hang
   For Adr=0 to 383
     Do 8 times
       Wait for InBitValid to be set
       ShiftRight[Temp, InBit]
       Set InBitUsed control signal
     $Flash_{Adr}$←Temp
   Hang During the Programming Mode state machine execution, 0 must be placed onto the 8-bit output. A 0 command causes the remainder of the Authentication chip to interpret the command as a TBR 0. When the chip has read all 384 bytes into the Program Flash Memory, it hangs (loops indefinitely). The Authentication Chip can then be reset and the program used normally. Note that the erasure is validated by the same 8-bit register that is used to load the new contents of the 8-bit program Flash memory. This helps to reduce the chances of a successful attack, since program code can't be loaded properly if the register used to validate the erasure is destroyed by an attacker. In addition, the entire state machine is protected by both Tamper Detection lines.

Address Generator Unit

The Address Generator Unit generates effective addresses for accessing the Memory Unit (MU). In Cycle 0, the PC is passed through to the MU in order to fetch the next opcode. The Address Generator interprets the returned opcode in order to generate the effective address for Cycle 1. In Cycle 1, the generated address is passed to the MU. The logic and registers contained in the Address Generator Unit must be covered by both Tamper Detection Lines. This is to ensure that an attacker cannot alter any generated address. Nearly all of the Address Generator Unit can be implemented with regular CMOS, since the key does not pass through most of this unit. However 5 bits of the Accumulator are used in the JSI Address generation. Consequently this tiny section of circuitry must be implemented in non-flashing CMOS. The remainder of the Address Generator Unit does not have to be implemented with non-flashing CMOS. However, the latches for the counters and calculated address should be parity-checked. If either of the Tamper Detection Lines is broken, the Address Generator Unit will generate address 0 each cycle and all counters will be fixed at 0. This will only come into effect if an attacker has disabled the RESET and/or erase circuitry, since under normal circumstances, breaking a Tamper Detection Line will result in a RESET or the erasure of all Flash memory.

Background to Address Generation

The logic for address generation requires an examination of the various opcodes and operand combinations. The relationship between opcode/operand and address is examined in this section, and is used as the basis for the Address Generator Unit.

Constants

The lower 4 entries are the simple constants for general-purpose use as well as the HMAC algorithm. The lower 4 bits of the LDK operand directly correspond to the lower 3 bits of the address in memory for these 4 values, i.e. 0000, 0001, 0010, and 0011 respectively. The y constants and the h constants are also addressed by the LDK command. However the address is generated by ORing the lower 3 bits of the operand with the inverse of the C1 counter value, and keeping the 4th bit of the operand intact. Thus for LDK y, the y operand is 0100, and with LDK h, the h operand is 1000. Since the inverted C1 value takes on the range 000–011 for y, and 000–100 for h, the ORed result gives the exact address. For all constants, the upper 5 bits of the final address are always 00000.

RAM

Variables A–T have addresses directly related to the lower 3 bits of their operand values. That is, for operand values 0000–0101 of the LD, ST, ADD, LOG, and XOR commands, as well as operand vales 1000–1101 of the LOG command, the lower 3 operand address bits can be used together with a constant high 6-bit address of 001000 to generate the final address. The remaining register values can only be accessed via an indexed mechanism. Variables A–E, B160, and H are only accessible as indexed by the C1 counter value, while X is indexed by $N_1$, $N_2$, $N_3$, and $N_4$. With the LD, ST and ADD commands, the address for AE as indexed by C1 can be generated by taking the lower 3 bits of the operand (000) and ORing them with the C1 counter value. However, H and B160 addresses cannot be generated in this way, (otherwise the RAM address space would be non-contiguous). Therefore simple combinatorial logic must convert AE into 0000, H into 0110, and B160 into 1011. The final address can be obtained by adding C1 to the 4-bit value (yielding a 4-bit result), and prepending the constant high 5-bit address of 00100. Finally, the X range of registers is only accessed as indexed by $N_1$, $N_2$, $N_3$, and $N_4$. With the XOR command, any of $N_{1-4}$ can be used to index, while with LD, ST, and ADD, only $N_4$ can be used. Since the operand of X in LD, ST, and ADD is the same as the $X_{N4}$ operand, the lower 2 bits of the operand selects which N to use. The address can thus be generated as a constant high 5-bit value of 00101, with the lower 4 bits coming from by the selected N counter.

Flash Memory—Variables

The addresses for variables MT and AM can be generated from the operands of associated commands. The 4 bits of operand can be used directly (0110 and 0111), and prepending the constant high 5-bit address of 00110. Variables $R_{1-5}$, $K1_{1-5}$, $K2_{1-5}$, and $M_{0-7}$ are only accessible as indexed by the inverse of the C1 counter value (and additionally in the case of R, by the actual C1 value). Simple combinatorial logic must convert R and RF into 00000, K into 01000 or 11000 depending on whether K1 or K2 is being addressed, and M (including MHI and MLO) into 10000. The final address can be obtained by ORing (or adding) C1 (or in the case of RF, using C1 directly) with the 5-bit value, and prepending the constant high 4-bit address of 0011. Variables IST and ISW are each only 1 bit of value, but can be implemented by any number of bits. Data is read and written as either 0x00000000 or 0xFFFFFFFF. They are addressed only by ROR, CLR and SET commands. In the case of ROR, the low bit of the operand is combined with a constant upper 8-bits value of 00111111, yielding 001111110 and 001111111 for IST and ISW respectively. This is because none of the other ROR operands make use of memory, so in cases other than IST and ISW, the value returned can be ignored. With SET and CLR, IST and ISW are addressed by combining a constant upper 4-bits of 0011 with a mapping from IST (0100) to 11110 and from ISW (0101) to 11111. Since IST and ISW share the same operand values with E and T from RAM, the same decoding logic can be used for the lower 5 bits. The final address requires bits 4, 3, and 1 to be set (this can be done by ORing in the result of testing for operand values 010x).

Flash Memory—Program

The address to lookup in program Flash memory comes directly from the 9-bit PC (in Cycle 0) or the 9-bit Adr register (in Cycle 1). Commands such as TBR, DBR, JSR and JSI modify the PC according to data stored in tables at specific addresses in the program memory. As a result, address generation makes use of some constant address components, with the command operand (or the Accumulator) forming the lower bits of the effective address:

Block Diagram of Address Generator Unit

FIG. 194 shows a schematic block diagram for the Address Generator Unit. The primary output from the Address Generator Unit is selected by multiplexor $MX_1$, as shown in the following table:

It is important to distinguish between the CMD data and the 8-bit data from the MU:

In Cycle 0, the 8-bit data line holds the next instruction to be executed in the following Cycle 1. This 8-bit command value is used to decode the effective address. By contrast, the CMD 8-bit data holds the previous instruction, so should be ignored.

In Cycle 1, the CMD line holds the currently executing instruction (which was in the 8-bit data line during Cycle 0), while the 8-bit data line holds the data at the effective address from the instruction. The CMD data must be executed during Cycle 1.

Consequently, the choice of 9-bit data from the MU or the CMD value is made by multiplexor MX3, as shown in the following table:

Since the 9-bit Adr register is updated every Cycle 0, the WriteEnable of Adr is connected to ~Cycle. The Counter Unit generates counters C1, C2 (used internally) and the selected N index. In addition, the Counter Unit outputs flags C1Z and C2Z for use by the Program Counter Unit. The various *GEN units generate addresses for particular command types during Cycle 0, and multiplexor $MX_2$ selects between them based on the command as read from program memory via the PC (i.e. the 8-bit data line). The generated values are as follows:

Multiplexor $MX_2$ has the following selection criteria:

The $VAL_1$ unit is a validation unit connected to the Tamper Prevention and Detection circuitry. It contains an OK bit that is set to 1 on RESET, and ORed with the ChipOK values from both Tamper Detection Lines each cycle. The OK bit is ANDed with the 9 bits of Effective Address before they can be used. If the chip has been tampered with, the address output will be always 0, thereby preventing an attacker from accessing other parts of memory. The $VAL_1$ unit also performs a parity check on the Effective Address bits to ensure it has not been tampered with. If the parity-check fails, the Erase Tamper Detection Line is triggered.

JSIGEN

FIG. 195 shows a schematic block diagram for the JSIGEN Unit. The JSIGEN Unit generates addresses for the JSI ACC instruction. The effective address is simply the concatenation of:

the 4-bit high part of the address for the JSI Table (0101) and the lower 5 bits of the Accumulator value.

Since the Accumulator may hold the key at other times (when a jump address is not being generated), the value must be hidden from sight. Consequently this unit must be implemented with non-flashing CMOS. The multiplexor $MX_1$ simply chooses between the lower 5 bits from Accumulator or 0, based upon whether the command is JSIGEN. Multiplexor $MX_1$ has the following selection criteria:

JSRGEN

FIG. 196 shows a schematic block diagram for the JSRGEN Unit. The JSRGEN Unit generates addresses for the JSR and TBR instructions. The effective address comes from the concatenation of:

the 4-bit high part of the address for the JSR table (0100), the offset within the table from the operand (5 bits for JSR commands, and 3 bits plus a constant 0 bit for TBR).

where Logic, produces bit 3 of the effective address. This bit should be bit 3 in the case of JSR, and 0 in the case of TBR:

Since the JSR instruction has a 1 in bit 5, (while TBR is 0 for this bit) ANDing this with bit 3 will produce bit 3 in the case of JSR, and 0 in the case of TBR.

DBRGEN

FIG. 197 shows a schematic block diagram for the DBRGEN Unit. The DBRGEN Unit generates addresses for the DBR instructions. The effective address comes from the concatenation of:

the 6-bit high part of the address for the DBR table (011000), and the lower 3 bits of the operand

LDKGEN

FIG. 198 shows a schematic block diagram for the LDKGEN Unit.

The LDKGEN Unit generates addresses for the LDK instructions. The effective address comes from the concatenation of:

the 5-bit high part of the address for the LDK table (00000), the high bit of the operand, and the lower 3 bits of the operand (in the case of the lower constants), or the lower 3 bits of the operand ORed with C1 (in the case of indexed constants).

The $OR_2$ block simply ORs the 3 bits of C1 with the 3 lowest bits from the 8-bit data output from the MU. The multiplexor $MX_1$ simply chooses between the actual data bits and the data bits ORed with C1, based upon whether the upper bits of the operand are set or not. The selector input to the multiplexor is a simple OR gate, ORing $bit_2$ with $bit_3$. Multiplexor $MX_1$ has the following selection criteria:

RPLGEN

FIG. 199 shows a schematic block diagram for the RPLGEN Unit. The RPLGEN Unit generates addresses for the RPL instructions. When K2MX is 0, the effective address is a constant 000000000. When K2MX is 1 (indicating reads from M return valid values), the effective address comes from the concatenation of:

the 6-bit high part of the address for M (001110), and
the 3 bits of the current value for C1

The multiplexor $MX_1$ chooses between the two addresses, depending on the current value of K2MX. Multiplexor $MX_1$ therefore has the following selection criteria:

VARGEN

FIG. 200 shows a schematic block diagram for the VARGEN Unit. The VARGEN Unit generates addresses for the LD, ST, ADD, LOG, and XOR instructions. The K2MX 1-bit flag is used to determine whether reads from M are mapped to the constant 0 address (which returns 0 and cannot be written to), and which of K1 and K2 is accessed when the. operand specifies K. The 4-bit Adder block takes 2 sets of 4-bit inputs, and produces a 4-bit output via addition modulo $2^4$. The single bit register K2MX is only ever written to during execution of a CLR K2MX or a SET K2MX instruction. $Logic_1$ sets the K2MX WriteEnable based on these conditions:

The bit written to the K2MX variable is 1 during a SET instruction, and 0 during a CLR instruction. It is convenient to use the low order bit of the opcode ($bit_4$) as the source for the input bit. During address generation, a Truth Table implemented as combinatorial logic determines part of the base address as follows:

Although the Truth Table produces 5 bits of output, the lower 4 bits are passed to the 4-bit Adder, where they are added to the index value (C1, N or the lower 3 bits of the operand itself). The highest bit passes the adder, and is prepended to the 4-bit result from the adder result in order to produce a 5-bit result. The second input to the adder comes from multiplexor $MX_1$, which chooses the index value from C1, N, and the lower 3 bits of the operand itself). Although C1 is only 3 bits, the fourth bit is a constant 0. Multiplexor $MX_1$ has the following selection criteria:

The 6th bit ($bit_5$) of the effective address is 0 for RAM addresses, and 1 for Flash memory addresses. The Flash memory addresses are MT, AM, R, K, and M. The computation for $bit_5$ is provided by $Logic_2$:

A constant 1 bit is prepended, making a total of 7 bits of effective address. These bits will form the effective address unless K2MX is 0 and the instruction is LD, ADD or STM[C1]. In the latter case, the effective address is the constant address of 0000000. In both cases, two 0 bits are prepended to form the final 9-bit address. The computation is shown here, provided by $Logic_3$ and multiplexor $MX_2$.

CLRGEN

FIG. 201 shows a schematic block diagram for the CLRGEN Unit. The CLRGEN Unit generates addresses for the CLR instruction. The effective address is always in Flash memory for valid memory accessing operands, and is 0 for invalid operands. The CLR M[C1] instruction always erases M[C1], regardless of the status of the K2MX flag (kept in the VARGEN Unit). The Truth Table is simple combinatorial logic that implements the following relationship:

It is a simple matter to reduce the logic required for the Truth Table since in all 4 main cases, the first 6 bits of the effective address are 00 followed by the operand ($bits_{3-0}$).

BITGEN

FIG. 202 shows a schematic block diagram for the BITGEN Unit. The BITGEN Unit generates addresses for the ROR and SET instructions. The effective address is always in Flash memory for valid memory accessing operands, and is 0 for invalid operands. Since ROR and SET instructions only access the IST and ISW Flash memory addresses (the remainder of the operands access registers), a simple combinatorial logic Truth Table suffices for address generation:

Counter Unit

FIG. Y37 shows a schematic block diagram for the Counter Unit. The Counter Unit generates counters C1, C2 (used internally) and the selected N index. In addition, the Counter Unit outputs flags C1Z and C2Z for use externally. Registers C1 and C2 are updated when they are the targets of a DBR or SC instruction. The high bit of the operand ($bit_3$ of the effective command) gives the selection between C1 and C2. $Logic_1$ and $Logic_2$ determine the WriteEnables for C1 and C2 respectively.

The single bit flags C1Z and C2Z are produced by the NOR of their multibit C1 and C2 counterparts. Thus C1Z is 1 if C1=0, and C2Z is 1 if C2=0. During a DBR instruction, the value of either C1 or C2 is decremented by 1 (with wrap). The input to the Decrementor unit is selected by multiplexor $MX_2$ as follows:

The actual value written to C1 or C2 depends on whether the DBR or SC instruction is being executed. Multiplexor $MX_1$ selects between the output from the Decrementor (for a DBR instruction), and the output from the Truth Table (for a SC instruction). Note that only the lowest 3 bits of the 5-bit output are written to C1. Multiplexor $MX_1$ therefore has the following selection criteria:

The Truth Table holds the values to be loaded by C1 and C2 via the SC instruction. The Truth Table is simple combinatorial logic that implements the following relationship:

Registers N1, N2, N3, and N4 are updated by their next value −1 (with wrap) when they are referred to by the XOR instruction. Register N4 is also updated when a ST X[N4] instruction is executed. LD and ADD instructions do not update N4. In addition, all 4 registers are updated during a SET Nx command. $Logic_{4-7}$ generate the WriteEnables for registers N1–N4. All use $Logic_3$, which produces a 1 if the command is SET Nx, or 0 otherwise.

The actual N index value passed out, or used as the input to the Decrementor, is simply selected by multiplexor $MX_4$ using the lower 2 bits of the operand:

The Incrementor takes 4 bits of input value (selected by multiplexor $MX_4$) and adds 1, producing a 4-bit result (due to addition modulo $2^4$). Finally, four instances of multiplexor $MX_3$ select between a constant value (different for each N, and to be loaded during the SET Nx command), and the result of the Decrementor (during XOR or ST instructions). The value will only be written if the appropriate WriteEnable flag is set (see $Logic_4$–$Logic_7$), so $Logic_3$ can safely be used for the multiplexor.

The SET Nx command loads N1–N4 with the following constants:

Note that each initial $X[N_n]$ referred to matches the optimized SHA-1 algorithm initial states for indexes N1–N4. When each index value $N_n$ decrements, the effective X[N] increments. This is because the X words are stored in memory with most significant word first. The three VAL units are validation units connected to the Tamper Prevention and Detection circuitry, each with an OK bit. The OK bit is set to 1 on RESET, and ORed with the ChipOK values from both Tamper Detection Lines each cycle. The OK bit is ANDed with each data bit that passese through the unit. All VAL units also parity check the data to ensure the counters have not been tampered with. If a parity check fails, the Erase Tamper Detection Line is triggered. In the case of $VAL_1$, the effective output from the counter C1 will always be 0 if the chip has been tampered with. This prevents an attacker from executing any looping constructs that index through the keys. In the case of $VAL_2$, the effective output from the counter C2 will always be 0 if the chip has been tampered with. This prevents an attacker from executing any looping constructs. In the case of $VAL_3$, the effective output from any N counter (N1–N4) will always be 0 if the chip has been tampered with. This prevents an attacker from executing any looping constructs that index through X.

Turning now to FIG. 203, there is illustrated 705 the information stored within the flash memory store 701. This data can include the following:

Factory Code

The factory code is a 16 bit code indicating the factory at which the print roll was manufactured. This identifies factories belonging to the owner of the print roll technology, or factories making print rolls under license. The purpose of this number is to allow the tracking of factory that a print roll came from, in case there are quality problems.

Batch Number

The batch number is a 32 bit number indicating the manufacturing batch of the print roll. The purpose of this number is to track the batch that a print roll came from, in case there are quality problems.

Serial Number

A 48 bit serial number is provided to allow unique identification of each print roll up to a maximum of 280 trillion print rolls.

Manufacturing Date

A 16 bit manufacturing date is included for tracking the age of print rolls, in case the shelf life is limited.

Media Length

The length of print media remaining on the roll is represented by this number. This length is represented in small units such as millimeters or the smallest dot pitch of printer devices using the print roll and to allow the calculation of the number of remaining photos in each of the well known C, H, and P formats, as well as other formats which may be printed. The use of small units also ensures a high resolution can be used to maintain synchronization with pre-printed media.

Media Type

The media type datum enumerates the media contained in the print roll.

(1) Transparent
(2) Opaque white
(3) Opaque tinted
(4) 3D lenticular
(5) Pre-printed: length specific
(6) Pre-printed: not length specific
(7) Metallic foil
(8) Holographic/optically variable device foil Pre-printed Media Length The length of the repeat pattern of any pre-printed media contained, for example on the back surface of the print roll is stored here.

Ink Viscosity

The viscosity of each ink color is included as an 8 bit number. The ink viscosity numbers can be used to adjust the print head actuator characteristics to compensate for viscosity (typically, a higher viscosity will require a longer actuator pulse to achieve the same drop volume).

Recommended Drop Volume for 1200 dpi

The recommended drop volume of each ink color is included as an 8 bit number. The most appropriate drop volume will be dependent upon the ink and print media characteristics. For example, the required drop volume will decrease with increasing dye concentration or absorptivity. Also, transparent media require around twice the drop volume as opaque white media, as light only passes through the dye layer once for transparent media.

As the print roll contains both ink and media, a custom match can be obtained. The drop volume is only the recommended drop volume, as the printer may be other than 1200 dpi, or the printer may be adjusted for lighter or darker printing.

Ink Color

The color of each of the dye colors is included and can be used to "fine tune" the digital half toning that is applied to any image before printing.

Remaining Media Length Indicator

The length of print media remaining on the roll is represented by this number and is updatable by the camera device. The length is represented in small units (eg. 1200 dpi pixels) to allow calculation of the number of remaining photos in each of C, H, and P formats, as well as other formats which may be printed. The high resolution can also be used to maintain synchronization with pre-printed media.

Copyright or Bit Pattern

This 512 bit pattern represents an ASCII character sequence sufficient to allow the contents of the flash memory store to be copyrightable.

Turning now to FIG. 204, there is illustrated the storage table 730 of the Artcam authorization chip. The table includes manufacturing code, batch number and serial number and date which have an identical format to that previously described. The table 730 also includes information 731 on the print engine within the Artcam device. The information stored can include a print engine type, the DPI resolution of the printer and a printer count of the number of prints produced by the printer device.

Further, an authentication test key 710 is provided which can randomly vary from chip to chip and is utilised as the Artcam random identification code in the previously described algorithm. The 128 bit print roll authentication key 713 is also provided and is equivalent to the key stored within the print rolls. Next, the 512 bit pattern is stored followed by a 120 bit spare area suitable for Artcam use.

As noted previously, the Artcam preferably includes a liquid crystal display 15 which indicates the number of prints left on the print roll stored within the Artcam. Further, the Artcam also includes a three state switch 17 which allows a user to switch between three standard formats C H and P (classic, HDTV and panoramic). Upon switching between the three states, the liquid crystal display 15 is updated to reflect the number of images left on the print roll if the particular format selected is used.

In order to correctly operate the liquid crystal display, the Artcam processor, upon the insertion of a print roll and the passing of the authentication test reads the from the flash memory store of the print roll chip 53 and determines the amount of paper left. Next, the value of the output format selection switch 17 is determined by the Artcam processor. Dividing the print length by the corresponding length of the selected output format the Artcam processor determines the number of possible prints and updates the liquid crystal display 15 with the number of prints left. Upon a user changing the output format selection switch 17 the Artcam processor 31 re-calculates the number of output pictures in accordance with that format and again updates the LCD display 15.

The storage of process information in the printer roll table 705 (FIG. 165) also allows the Artcam device to take advantage of changes in process and print characteristics of the print roll.

In particular, the pulse characteristics applied to each nozzle within the print head can be altered to take into account of changes in the process characteristics. Turning now to FIG. 205, the Artcam Processor can be adapted to run a software program stored in an ancillary memory ROM chip. The software program, a pulse profile characteriser 771 is able to read a number of variables from the printer roll. These variables include the remaining roll media on printer roll 772, the printer media type 773, the ink color viscosity 774, the ink color drop volume 775 and the ink color 776. Each of these variables are read by the pulse profile characteriser and a corresponding, most suitable pulse profile is determined in accordance with prior trial and experiment. The parameters alters the printer pulse received by each printer nozzle so as to improve the stability of ink output.

It will be evident that the authorization chip includes significant advances in that important and valuable information is stored on the printer chip with the print roll. This information can include process characteristics of the print roll in question in addition to information on the type of print roll and the amount of paper left in the print roll. Additionally, the print roll interface chip can provide valuable authentication information and can be constructed in a tamper proof manner. Further, a tamper resistant method of utilising the chip has been provided. The utilization of the print roll chip also allows a convenient and effective user interface to be provided for an immediate output form of Artcam device able to output multiple photographic formats whilst simultaneously able to provide an indicator of the number of photographs left in the printing device.

Print Head Unit

Turning now to FIG. 206, there is illustrated an exploded perspective view, partly in section, of the print head unit 615 of FIG. 162.

The print head unit 615 is based around the print-head 44 which ejects ink drops on demand on to print media 611 so as to form an image. The print media 611 is pinched between two set of rollers comprising a first set 618, 616 and second set 617, 619.

The print-head 44 operates under the control of power, ground and signal lines 810 which provides power and control for the print-head 44 and are bonded by means of Tape Automated Bonding (TAB) to the surface of the print-head 44.

Importantly, the print-head 44 which can be constructed from a silicon wafer device suitably separated, relies upon a series of anisotropic etches 812 through the wafer having near vertical side walls. The through wafer etches 812 allow for the direct supply of ink to the print-head surface from the back of the wafer for subsequent ejection.

The ink is supplied to the back of the inkjet print-head 44 by means of ink-head supply unit 814. The inkjet print-head 44 has three separate rows along its surface for the supply of separate colors of ink. The ink-head supply unit 814 also includes a lid 815 for the sealing of ink channels.

In FIG. 207 to FIG. 210, there is illustrated various perspective views of the ink-head supply unit 814. Each of FIG. 207 to FIG. 210 illustrate only a portion of the ink head supply unit which can be constructed of indefinite length, the portions shown so as to provide exemplary details. In FIG. 207 there is illustrated a bottom perspective view, FIG. 148 illustrates a top perspective view, FIG. 209 illustrates a close up bottom perspective view, partly in section, FIG. 210 illustrates a top side perspective view showing details of the ink channels, and FIG. 211 illustrates a top side perspective view as does FIG. 212.

There is considerable cost advantage in forming ink-head supply unit 814 from injection molded plastic instead of, say, micromachined silicon. The manufacturing cost of a plastic ink channel will be considerably less in volume and manufacturing is substantially easier. The design illustrated in the accompanying Figures assumes a 1600 dpi three color monolithic print head, of a predetermined length. The provided flow rate calculations are for a 100 mm photo printer.

The ink-head supply unit 814 contains all of the required fine details. The lid 815 (FIG. 206) is permanently glued or ultrasonically welded to the ink-head supply unit 814 and provides a seal for the ink channels.

Turning to FIG. 209, the cyan, magenta and yellow ink flows in through ink inlets 820–822, the magenta ink flows through the throughholes 824,825 and along the magenta main channels 826,827 (FIG. 141). The cyan ink flows along cyan main channel 830 and the yellow ink flows along the yellow main channel 831. As best seen from FIG. 209, the cyan ink in the cyan main channels then flows into a cyan sub-channel 833. The yellow subchannel 834 similarly receiving yellow ink from the yellow main channel 831.

As best seen in FIG. 210, the magenta ink also flows from magenta main channels 826,827 through magenta throughholes 836, 837. Returning again to FIG. 209, the magenta ink flows out of the throughholes 836, 837. The magenta ink flows along first magenta subchannel e.g. 838 and then along second magenta subchannel e.g. 839 before flowing into a magenta trough 840. The magenta ink then flows through magenta vias e.g. 842 which are aligned with corresponding inkjet head throughholes (e.g. 812 of FIG. 166) wherein they subsequently supply ink to inkjet nozzles for printing out.

Similarly, the cyan ink within the cyan subchannel 833 flows into a cyan pit area 849 which supplies ink two cyan vias 843, 844. Similarly, the yellow subchannel 834 supplies yellow pit area 46 which in turn'supplies yellow vias 847, 848.

As seen in FIG. 210, the print-head is designed to be received within print-head slot 850 with the various vias e.g. 851 aligned with corresponding through holes eg. 851 in the print-head wafer.

Returning to FIG. 206, care must be taken to provide adequate ink flow to the entire print-head chip 44, while satisfying the constraints of an injection moulding process. The size of the ink through wafer holes 812 at the back of the print head chip is approximately 100 $\mu$m×50 $\mu$m, and the spacing between through holes carrying different colors of ink is approximately 170 $\mu$m. While features of this size can readily be molded in plastic (compact discs have micron sized features), ideally the wall height must not exceed a few times the wall thickness so as to maintain adequate stiffness. The preferred embodiment overcomes these problems by using hierarchy of progressively smaller ink channels.

In FIG. 211, there is illustrated a small portion 870 of the surface of the print-head 44. The surface is divided into 3 series of nozzles comprising the cyan series 871, the magenta series 872 and the yellow series 873. Each series of nozzles is further divided into two rows eg. 875, 876 with the print-head 44 having a series of bond pads 878 for bonding of power and control signals.

The print head is preferably constructed in accordance with a large number of different forms of ink jet invented for uses including Artcam devices. These ink jet devices are discussed in further detail hereinafter.

The print-head nozzles include the ink supply channels 880, equivalent to anisotropic etch hole 812 of FIG. 206. The ink flows from the back of the wafer through supply channel 881 and in turn through the filter grill 882 to ink nozzle chambers eg. 883. The operation of the nozzle chamber 883 and print head 44 (FIG. 1) is, as mentioned previously, described in the abovementioned patent specification.

Ink Channel Fluid Flow Analysis

Turning now to an analysis of the ink flow, the main ink channels 826, 827, 830, 831 (FIG. 207, FIG. 141) are around 1 mm×1 mm, and supply all of the nozzles of one color. The sub-channels 833, 834, 838, 839 (FIG. 209) are around 200 µm×100 µm and supply about 25 inkjet nozzles each. The print head through holes 843, 844, 847, 848 and wafer through holes eg. 881 (FIG. 211) are 100 µm×50 µm and, supply 3 nozzles at each side of the print head through holes. Each nozzle filter 882 has 8 slits, each with an area of 20 µm×2 µm and supplies a single nozzle.

An analysis has been conducted of the pressure requirements of an ink jet printer constructed as described. The analysis is for a 1,600 dpi three color process print head for photograph printing. The print width was 100 mm which gives 6,250 nozzles for each color, giving a total of 18,750 nozzles.

The maximum ink flow rate required in various channels for full black printing is important. It determines the pressure drop along the ink channels, and therefore whether the print head will stay filled by the surface tension forces alone, or, if not, the ink pressure that is required to keep the print head full.

To calculate the pressure drop, a drop volume of 2.5 pl for 1,600 dpi operation was utilized. While the nozzles may be capable of operating at a higher rate, the chosen drop repetition rate is 5 kHz which is suitable to print a 150 mm long photograph in an little under 2 seconds. Thus, the print head, in the extreme case, has a 18,750 nozzles, all printing a maximum of 5,000 drops per second. This ink flow is distributed over the hierarchy of ink channels. Each ink channel effectively supplies a fixed number of nozzles when all nozzles are printing.

The pressure drop $\Delta p$ was calculated according to the Darcy-Weisbach formula:

Where $\rho$ is the density of the ink, U is the average flow velocity, L is the length, D is the hydraulic diameter, and f is a dimensionless friction factor calculated as follows:

Where Re is the Reynolds number and k is a dimensionless friction coefficient dependent upon the cross section of the channel calculated as follows:

Where v is the kinematic viscosity of the ink. For a rectangular cross section, k can be approximated by:

Where a is the longest side of the rectangular cross section, and b is the shortest side. The hydraulic diameter D for a rectangular cross section is given by:

Ink is drawn off the main ink channels at 250 points along the length of the channels. The ink velocity falls linearly from the start of the channel to zero at the end of the channel, so the average flow velocity U is half of the maximum flow velocity. Therefore, the pressure drop along the main ink channels is half of that calculated using the maximum flow velocity.

Utilizing these formulas, the pressure drops can be calculated in accordance with the following tables:

The total pressure drop from the ink inlet to the nozzle is therefore approximately 701 Pa for cyan and yellow, and 845 Pa for magenta. This is less than 1% of atmospheric pressure. Of course, when the image printed is less than full black, the ink flow (and therefore the pressure drop) is reduced from these values.

Making the Mould for the Ink-head Supply Unit

The ink head supply unit 14 (FIG. 1) has features as small as 50µ and a length of 106 mm. It is impractical to machine the injection moulding tools in the conventional manner. However, even though the overall shape may be complex, there are no complex curves required. The injection moulding tools can be made using conventional milling for the main ink channels and other millimeter scale features, with a lithographically fabricated inset for the fine features. A LIGA process can be used for the inset.

A single injection moulding tool could readily have 50 or more cavities. Most of the tool complexity is in the inset.

Turning to FIG. 206, the printing system is constructed via moulding ink supply unit 814 and lid 815 together and sealing them together as previously described. Subsequently print-head 44 is placed in its corresponding slot 850. Adhesive sealing strips 852, 853 are placed over the magenta main channels so to ensure they are properly sealed. The Tape Automated Bonding (TAB) strip 810 is then connected to the inkjet print-head 44 with the tab bonding wires running in the cavity 855. As can best be seen from FIG. 206, FIG. 207 and FIG. 212, aperture slots 855–862 are provided for the snap in insertion of rollers. The slots provided for the "clipping in" of the rollers with a small degree of play subsequently being provided for simple rotation of the rollers.

In FIG. 213 to FIG. 217, there are illustrated various perspective views of the internal portions of a finally assembled Artcam device with devices appropriately numbered.

FIG. 213 illustrates a top side perspective view of the internal portions of an Artcam camera, showing the parts flattened out;

FIG. 214 illustrates a bottom side perspective view of the internal portions of an Artcam camera, showing the parts flattened out; FIG. 215 illustrates a first top side perspective view of the internal portions of an. Artcam camera, showing the parts as encased in an Artcam;

FIG. 216 illustrates a second top side perspective view of the internal portions of an Artcam camera, showing the parts as encased in an Artcam;

FIG. 217 illustrates a second top side perspective view of the internal portions of an Artcam camera, showing the parts as encased in an Artcam;

Postcard Print Rolls

Turning now to FIG. 218, in one form of the preferred embodiment, the output printer paper 11 can, on the side that is not to receive the printed image, contain a number of pre-printed "postcard" formatted backing portions 885. The postcard formatted sections 885 can include prepaid postage "stamps" 886 which can comprise a printed authorization from the relevant postage authority within whose jurisdiction the print roll is to be sold or utilised. By agreement with the relevant jurisdictional postal authority, the print rolls can be made available having different postages. This is especially convenient where overseas travelers are in a local jurisdiction and wishing to send a number of postcards to their home country. Further, an address format portion 887 is provided for the writing of address dispatch details in the usual form of a postcard. Finally, a message area 887 is provided for the writing of a personalized information.

Turning now to FIG. 218 and FIG. 219, the operation of the camera device is. such that when a series of images 890–892 is printed on a first surface of the print roll, the corresponding backing surface is that illustrated in FIG. 218. Hence, as each image eg. 891 is printed by the camera, the back of the image has a ready made postcard 885 which can be immediately dispatched at the nearest post office box within the jurisdiction. In this way, personalized postcards can be created.

It would be evident that when utilising the postcard system as illustrated in FIG. 219 and FIG. 220 only predetermined image sizes are possible as the synchronization between the backing postcard portion 885 and the front image 891 must be maintained. This can be achieved by utilising the memory portions of the authentication chip stored within the print roll to store details of the length of each postcard backing format sheet 885. This can be achieved by either having each postcard the same size or by storing each size within the print rolls on board print chip memory.

The Artcam camera control system can ensure that, when utilising a print roll having pre-formatted postcards, that the printer roll is utilised only to print images such that each image will be on a postcard boundary. Of course, a degree of "play" can be provided by providing border regions at the edges of each photograph which can account for slight misalignment.

Turning now to FIG. 220, it will be evident that postcard rolls can be pre-purchased by a camera user when traveling within a particular jurisdiction where they are available. The postcard roll can, on its external surface, have printed information including country of purchase, the amount of postage on each postcard, the format of each postcard (for example being C,H or P or a combination of these image modes), the countries that it is suitable for use with and the postage expiry date after which the postage is no longer guaranteed to be sufficient can also be provided.

Hence, a user of the camera device can produce a postcard for dispatch in the mail by utilising their hand held camera to point at a relevant scene and taking a picture having the image on one surface and the pre-paid postcard details on the other. Subsequently, the postcard can be addressed and a short message written on the postcard before its immediate dispatch in the mail.

In respect of the software operation of the Artcam device, although many different software designs are possible, in one design, each Artcam device can consist of a set of loosely coupled functional modules utilised in a coordinated way by a single embedded application to serve the core purpose of the device. While the functional modules are reused in different combinations in various classes of Artcam device, the application is specific to the class of Artcam device.

Most functional modules contain both software and hardware components. The software is shielded from details of the hardware by a hardware abstraction layer, while users of a module are shielded from its software implementation by an abstract software interface. Because the system as a whole is driven by user-initiated and hardware-initiated events, most modules can run one or more asynchronous event-driven processes.

The most important modules which comprise the generic Artcam device are shown in FIG. 221. In this and subsequent diagrams, software components are shown on the left separated by a vertical dashed line 901 from hardware components on the right. The software aspects of these modules are described below:

Software Modules—Artcam Application 902

The Artcam Application implements the high-level functionality of the Artcam device. This normally involves capturing an image, applying an artistic effect to the image, and then printing the image. In a camera-oriented Artcam device, the image is captured via the Camera Manager 903. In a printer-oriented Artcam device, the image is captured via the Network Manager 904, perhaps as the result of the image being "squirted" by another device.

Artistic effects are found within the unified file system managed by the File Manager 905. An artistic effect consist of a script file and a set of resources. The script is interpreted and applied to the image via the Image Processing Manager 906. Scripts are normally shipped on ArtCards known as Artcards. By default the application uses the script contained on the currently mounted Artcard. The image is printed via the Printer Manager 908. When the Artcam device starts up, the bootstrap process starts the various manager processes before starting the application. This allows the application to immediately request services from the various managers when it starts. On initialization the application 902 registers itself as the handler for the events listed below. When it receives an event, it performs the action described in the table.

Where the camera includes a display, the application also constructs a graphical user interface via the User Interface Manager 910 which allows the user to edit the current date and time, and other editable camera parameters. The application saves all persistent parameters in flash memory.

Real-Time Microkernel 911

The Real-Time Microkernel schedules processes preemptively on the basis of interrupts and process priority. It provides integrated inter-process communication and timer services, as these are closely tied to process scheduling. All other operating system functions are implemented outside the microkernel.

Camera Manager 903

The Camera Manager provides image capture services. It controls the camera hardware embedded in the Artcam. It provides an abstract camera control interface which allows camera parameters to be queried and set, and images captured. This abstract interface decouples the application from details of camera implementation. The Camera Manager utilizes the following input/output parameters and commands:

The Camera Manager runs as an asynchronous event-driven process. It contains a set of linked state machines, one for each asynchronous operation. These include auto focussing, charging the flash, counting down the self-timer, and capturing the image. On initialization the Camera Manager sets the camera hardware to a known state. This includes setting a normal focal distance and retracting the zoom. The software structure of the Camera Manager is illustrated in FIG. 222. The software components are described in the following subsections:

Lock Focus 913

Lock Focus automatically adjusts focus and exposure for the current scene, and enables the flash if necessary, depending on the focus control mode, exposure control mode and flash mode. Lock Focus is normally initiated in response to the user pressing the Take button halfway. It is part of the normal image capture sequence, but may be separated in time from the actual capture of the image, if the user holds the take button halfway depressed. This allows the user to do spot focusing and spot metering.

Capture Image 914

Capture Image captures an image of the current scene. It lights a red-eye lamp if the flash mode includes red-eye removal, controls the shutter, triggers the flash if enabled, and senses the image through the image sensor. It determines the orientation of the camera, and hence the captured image, so that the image can be properly oriented during later image processing. It also determines the presence of camera. motion during image capture, to trigger deblurring during later image processing.

Self-Timed Capture 915

Self-Timed Capture captures an image of the current scene after counting down a 20s timer. It gives the user feedback during the countdown via the self-timer LED. During the first 15s it can light the LED. During the last 5s it flashes the LED.

View Scene 917

View Scene periodically senses the current scene through the image sensor and displays it on the color LCD, giving the user an LCD-based viewfinder.

Auto Focus 918

Auto Focus changes the focal length until selected regions of the image are sufficiently sharp to signify that they are in focus. It assumes the regions are in focus if an image sharpness metric derived from specified regions of the image sensor is above a fixed threshold. It finds the optimal focal length by performing a gradient descent on the derivative of sharpness by focal length, changing direction and stepsize as required. If the focus control mode is multi-point auto, then three regions are used, arranged horizontally across the field of view. If the focus control mode is single-point auto, then one region is used, in the center of the field of view. Auto Focus works within the available focal length range as indicated by the focus controller. In fixed-focus devices it is therefore effectively disabled.

Auto Flash 919

Auto Flash determines if scene lighting is dim enough to require the flash. It assumes the lighting is dim enough if the scene lighting is below a fixed threshold. The scene lighting is obtained from the lighting sensor, which derives a lighting metric from a central region of the image sensor. If the flash is required, then it charges the flash.

Auto Exposure 920

The combination of scene lighting, aperture, and shutter speed determine the exposure of the captured image. The desired exposure is a fixed value. If the exposure control mode is auto, Auto Exposure determines a combined aperture and shutter speed which yields the desired exposure for the given scene lighting. If the exposure control mode is aperture priority, Auto Exposure determines a shutter speed which yields the desired exposure for the given scene lighting and current aperture. If the exposure control mode is shutter priority, Auto Exposure determines an aperture which yields the desired exposure for the given scene lighting and current shutter speed. The scene lighting is obtained from the lighting sensor, which derives a lighting metric from a central region of the image sensor.

Auto Exposure works within the available aperture range and shutter speed range as indicated by the aperture controller and shutter speed controller. The shutter speed controller and shutter controller hide the absence of a mechanical shutter in most Artcam devices.

If the flash is enabled, either manually or by Auto Flash, then the effective shutter speed is the duration of the flash, which is typically in the range 1/1000 s to 1/10000 s.

Image Processing Manager 906 (FIG. 221)

The Image Processing Manager provides image processing and artistic effects services. It utilises the VLIW Vector Processor embedded in the Artcam to perform high-speed image processing. The Image Processing Manager contains an interpreter for scripts written in the Vark image processing language. An artistic effect therefore consists of a Vark script file and related resources such as fonts, clip images etc. The software structure of the Image Processing Manager is illustrated in more detail in FIG. 223 and include the following modules:

Convert and Enhance Image 921

The Image Processing Manager performs image processing in the device-independent CIE LAB color space, at a resolution which suits the reproduction capabilities of the Artcam printer hardware. The captured image is first enhanced by filtering out noise. It is optionally processed to remove motion-induced blur. The image is then converted from its device-dependent RGB color space to the CIE LAB color space. It is also rotated to undo the effect of any camera rotation at the time of image capture, and scaled to the working image resolution. The image is further enhanced by scaling its dynamic range to the available dynamic range.

Detect Faces 923

Faces are detected in the captured image based on hue and local feature analysis. The list of detected face regions is used by the Vark script for applying face-specific effects such as warping and positioning speech balloons.

Vark Image Processing Language Interpreter 924

Vark consists of a general-purpose programming language with a rich set of image processing extensions. It provides a range of primitive data types (integer, real, boolean, character), a range of aggregate data types for constructing more complex types (array, string, record), a rich set of arithmetic and relational operators, conditional and iterative control flow (if-then-else, while-do), and recursive functions and procedures. It also provides a range of image-processing data types (image, clip image, matte, color, color lookup. table, palette, dither matrix, convolution kernel, etc.), graphics data types (font, text, path), a set of image-processing functions (color transformations, compositing, filtering, spatial transformations and warping, illumination, text setting and rendering), and a set of higher-level artistic functions (tiling, painting and stroking).

A Vark program is portable in two senses. Because it is interpreted, it is independent of the CPU and image processing engines of its host. Because it uses a device-independent model space and a device-independent color space, it is independent of the input color characteristics and resolution of the host input device, and the output color characteristics and resolution of the host output device.

The Vark Interpreter 924 parses the source statements which make up the Vark script and produces a parse tree which represents the semantics of the script. Nodes in the parse tree correspond to statements, expressions, sub-expressions, variables and constants in the program. The root node corresponds to the main procedure statement list. The interpreter executes the program by executing the root statement in the parse tree. Each node of the parse tree asks its children to evaluate or execute themselves appropriately. An if statement node, for example, has three children—a condition expression node, a then statement node, and an else statement node. The if statement asks the condition expression node to evaluate itself, and depending on the boolean value returned asks the then statement or the else statement to execute itself. It knows nothing about the actual condition expression or the actual statements.

While operations on most data types are executed. during execution of the. parse tree, operations on image data types are deferred until after execution of the parse tree. This allows imaging operations to be optimized so that only those intermediate pixels which contribute to the final image are computed. It also allows the final image to be computed in multiple passes by spatial subdivision, to reduce the amount of memory required.

During execution of the parse tree, each imaging function simply returns an imaging graph—a graph whose nodes are imaging operators and whose leaves are images—constructed with its corresponding imaging operator as the root and its image parameters as the root's children. The image parameters are of course themselves image graphs. Thus each successive imaging function returns a deeper imaging graph.

After execution of the parse tree, an imaging graph is obtained which corresponds to the final image. This imaging graph is then executed in a depth-first manner (like any expression tree), with the following two optimizations: (1) only those pixels which contribute to the final image are computed at a given node, and (2) the children of a node are executed in the order which minimizes the amount of memory required. The imaging operators in the imaging graph are executed in the optimized order to produce the final image. Compute-intensive imaging operators are accelerated using the VLIW Processor embedded in the Artcam device. If the amount of memory required to execute the imaging graph exceeds available memory, then the final image region is subdivided until the required memory no longer exceeds available memory.

For a well-constructed Vark program the first optimization is unlikely to provide much benefit per se. However, if the final image region is subdivided, then the optimization is likely to provide considerable benefit. It is precisely this optimization, then, that allows subdivision to be used as an effective technique for reducing memory requirements. One of the consequences of deferred execution of imaging operations is that program control flow cannot depend on image content, since image content is not known during parse tree execution. In practice this is not a severe restriction, but nonetheless must be borne in mind during language design.

The notion of deferred execution (or lazy evaluation) of imaging operations is described by Guibas and Stolfi (Guibas, L. J., and J. Stolfi, "A Language for Bitmap Manipulation", *ACM Transactions on Graphics,* Vol. 1, No. 3, July 1982, pp. 191–214). They likewise construct an imaging graph during the execution of a program, and during subsequent graph evaluation propagate the result region backwards to avoid computing pixels which do not contribute to the final image. Shantzis additionally propagates regions of available pixels forwards during imaging graph evaluation (Shantzis, M. A., "A Model for Efficient and Flexible Image Computing", *Computer Graphics Proceedings, Annual Conference Series,* 1994, pp. 147–154). The Vark Interpreter uses the more sophisticated multi-pass bi-directional region propagation scheme described by Cameron (Cameron, S., "Efficient Bounds in . Constructive Solid Geometry", *IEEE Computer Graphics & Applications,* Vol. 11, No. 3, May 1991, pp. 68–74). The optimization of execution order to minimise memory usage is due to Shantzis, but is based on standard compiler theory (Aho, A. V., R. Sethi, and J. D. Ullman, "Generating Code from DAGs", in *Compilers: Principles, Techniques, and Tools,* Addison-Wesley, 1986, pp. 557–567,). The Vark Interpreter uses a more sophisticated scheme than Shantzis, however, to support variable-sized image buffers. The subdivision of the result region in conjunction with region propagation to reduce memory usage is also due to Shantzis.

Printer Manager 908 (FIG. 221)

The Printer Manager provides image printing services. It controls the Ink Jet printer hardware embedded in the Artcam. It provides an abstract printer control interface which allows printer parameters to be queried and set, and images printed. This abstract interface decouples the application from details of printer implementation and includes the following variables:

The Printer Manager runs as an asynchronous event-driven process. It contains a set of linked state machines, one for each asynchronous operation. These include printing the image and auto mounting the print roll. The software structure of the Printer Manager is illustrated in FIG. 224. The software components are described in the following description:

Print Image 930

Print Image prints the supplied image. It uses the VLIW Processor to prepare the image for printing. This includes converting the image color space to device-specific CMY and producing half-toned bi-level data in the format expected by the print head.

Between prints, the paper is retracted to the lip of the print roll to allow print roll removal, and the nozzles can be capped to prevent ink leakage and drying. Before actual printing starts, therefore, the nozzles are uncapped and cleared, and the paper is advanced to the print head. Printing itself consists of transferring line data from the VLIW processor, printing the line data, and advancing the paper, until the image is completely printed. After printing is complete, the paper is cut with the guillotine and retracted to the print roll, and the nozzles are capped. The remaining media length is then updated in the print roll.

Auto Mount Print Roll 131

Auto Mount Print Roll responds to the insertion and removal of the print roll. It generates print roll insertion and removal events which are handled by the application and used to update the status display. The print roll is authenticated according to a protocol between the authentication chip embedded in the print roll and the authentication chip embedded in Artcam. If the print roll fails authentication then it is rejected. Various information is extracted from the print roll. Paper and ink characteristics are used during the printing process. The remaining media length and the fixed page size of the media, if any, are published by the Print Manager and are used by the application.

User Interface Manager 910 (FIG. 221)

The User Interface Manager is illustrated in more detail if FIG. 225 and provides user interface management services. It consists of a Physical User Interface Manager 911, which controls status display and input hardware, and a Graphical User Interface Manager 912, which manages a virtual graphical user interface on the color display. The User Interface Manager translates virtual and physical inputs into events. Each event is placed in the event queue of the process registered for that event.

File Manager 905 (FIG. 222)

The File Manager provides file management services. It provides a unified hierarchical file system within which the file systems of all mounted volumes appear. The primary removable storage medium used in the Artcam is the ArtCards. A ArtCards is printed at high resolution with blocks of bi-level dots which directly represents—error tolerant Reed-Solomon-encoded binary data. The block structure supports append and append-rewrite in suitable read-write ArtCards devices (not initially used in Artcam). At a higher level a ArtCards can contain an extended append-rewriteable ISO9660 CD-ROM file system. The software structure of the File Manager, and the ArtCards Device Controller in particular, can be as illustrated in FIG. 226.

Network Manager 904 (FIG. 222)

The Network Manager provides "appliance" networking services across various interfaces including infra-red (IrDA) and universal serial bus (USB). This allows the Artcam to share captured images, and receive images for printing.

Clock Manager 907 (FIG. 222)

The Clock Manager provides date and time-of-day clock services. It utilises the battery-backed real-time clock embedded in the Artcam, and controls it to the extent that it automatically adjusts for clock drift, based on auto-calibration carried out when the user sets the time.

Power Management

When the system is idle it enters a quiescent power state during which only periodic scanning for input events occurs.

Input events include the press of a button or the insertion of a ArtCards. As soon as an input event is detected the Artcam device re-enters an active power state. The system then handles the input event in the usual way.

Even when the system is in an active power state, the hardware associated with individual modules is typically in a quiescent power state. This reduces overall power consumption, and allows particularly draining hardware components such as the printer's paper cutting guillotine to monopolise the power source when they are operating. A camera-oriented Artcam device is, by default, in image capture mode. This means that the camera is active, and other modules, such as the printer, are quiescent. This means that when non-camera functions are initiated, the application must explicitly suspend the camera module. Other modules naturally suspend themselves when they become idle.

Watchdog Timer

The system generates a periodic high-priority watchdog timer interrupt. The interrupt handler resets the system if it concludes that the system has not progressed since the last interrupt, i.e. that it has crashed.

Alternative Print Roll

In an alternative embodiment, there is provided a modified form of print roll which can be constructed mostly from injection moulded plastic pieces suitably snapped fitted together. The modified form of print roll has a high ink storage capacity in addition to a somewhat simplified construction. The print media onto which the image is to be printed is wrapped around a plastic sleeve former for simplified construction. The ink media reservoir has a series of air vents which are constructed so as to minimise the opportunities for the ink flow out of the air vents. Further, a rubber seal is provided for the ink outlet holes with the rubber seal being pierced on insertion of the print roll into a camera system. Further, the print roll includes a print media ejection slot and the ejection slot includes a surrounding moulded surface which provides and assists in the accurate positioning of the print media ejection slot relative to the printhead within the printing or camera system.

Turning to FIG. 227 to FIG. 231, in FIG. 227 there is illustrated a single point roll unit 1001 in an assembled form with a partial cutaway showing internal portions of the printroll. FIG. 228 and FIG. 229 illustrate left and right side exploded perspective views respectively. FIG. 230 and FIG. 231 are exploded perspective's of the internal core portion 1007 of FIG. 227 to FIG. 229.

The print roll 1001 is constructed around the internal core portion 1007 which contains an internal ink supply. Outside of the core portion 1007 is provided a former 1008 around which is wrapped a paper or film supply 1009. Around the paper supply it is constructed two cover pieces 1010, 1011 which snap together around the print roll so as to form a covering unit as illustrated in FIG. 227. The bottom cover piece 1011 includes a slot 1012 through which the output of the print media 1004 for interconnection with the camera system.

Two pinch rollers 1038, 1039 are provided to pinch the paper against a drive pinch roller 1040 so they together provide for a decurling of the paper around the roller 1040. The decurling acts to negate the strong curl that may be imparted to the paper from being stored in the form of print roll for an extended period of time. The rollers 1038, 1039 are provided to form a snap fit with end portions of the cover base portion 1077 and the roller 1040 which includes a cogged end 1043 for driving, snap fits into the upper cover piece 1010 so as to pinch the paper 1004 firmly between.

The cover pieces 1011 includes an end protuberance or lip 1042. The end lip 1042 is provided for accurately alignment of the exit hole of the paper with a corresponding printing heat platen structure within the camera system. In this way, accurate alignment or positioning of the exiting paper relative to an adjacent printhead is provided for full guidance of the paper to the printhead.

Turning now to FIG. 230 and FIG. 231, there is illustrated exploded perspectives of the internal core portion which can be formed from an injection moulded part and is based around 3 core ink cylinders having internal sponge portions 1034–1036.

At one end of the core portion there is provided a series of air breathing channels eg. 1014–1016. Each air breathing channel 1014–1016 interconnects a first hole eg. 1018 with an external contact point 1019 which is interconnected to the ambient atmosphere. The path followed by the air breathing channel eg. 1014 is preferably of a winding nature, winding back and forth. The air breathing channel is sealed by a portion of sealing tape 1020 which is placed over the end of the core portion. The surface of the sealing tape 1020 is preferably hydrophobically treated to make it highly hydrophobic and to therefore resist the entry of any fluid portions into the air breathing channels.

At a second end of the core portion 1007 there is provided a rubber sealing cap 1023 which includes three thickened portions 1024, 1025 and 1026 with each thickened portion having a series of thinned holes. For example, the portion 1024 has thinned holes 1029, 1030 and 1031. The thinned holes are arranged such that one hole from each of the separate thickened portions is arranged in a single line. For example, the thinned holes 1031, 1032 and 1033 (FIG. 230) are all arranged in a single line with each hole coming from a different thinned portion. Each of the thickened portions corresponds to a corresponding ink supply reservoir such that when the three holes are pierced, fluid communication is made with a corresponding reservoir.

An end cap unit 1044 is provided for attachment to the core portion 1007. The end cap 1044 includes an aperture 1046 for the insertion. of an authentication chip 1033 in addition to a pronged adaptor (not shown) which includes three prongs which are inserted through corresponding holes (e.g., 1048), piercing a thinned portion (e.g., 1033) of seal 1023 and interconnecting to a corresponding ink chamber (e.g., 1035).

Also inserted in the end portion 1044 is an authentication chip 1033, the authentication chip being provided to authenticate access of the print roll to the camera system. This core portion is therefore divided into three separate chambers with each containing a separate color of ink and internal sponge. Each chamber includes an ink outlet in a first end and an air breathing hole in the second end. A cover of the sealing tape 1020 is provided for covering the air breathing channels and the rubber seal 1023 is provided for sealing the second end of the ink chamber.

The internal ink chamber sponges and the hydrophobic channel allow the print roll to be utilized in a mobile environment and with many different orientations. Further, the sponge can itself be hydrophobically treated so as to force the ink out of the core portion in an orderly manner.

A series of ribs (e.g., 1027) can be provided on the surface of the core portion so as to allow for minimal frictional contact between the core portion 1007 and the printroll former 1008.

Most of the portions of the print roll can be constructed from ejection moulded plastic and the print roll includes a high internal ink storage capacity. The simplified construction also includes a paper decurling mechanism in addition to ink chamber air vents which provide for minimal leaking.

The rubber seal provides for effective communication with an ink supply chambers so as to provide for high operational capabilities.

Artcards can, of course, be used in many other environments. For example ArtCards can be used in both embedded and personal computer (PC) applications, providing a user-friendly interface to large amounts of data or configuration information. This leads to a large number of possible applications. For example, a ArtCards reader can be attached to a PC. The applications for PCs are many and varied. The simplest application is as a low cost read-only distribution medium. Since ArtCards are printed, they provide an audit trail if used for data distribution within a company.

Further, many times a PC is used as the basis for a closed system, yet a number of configuration options may exist. Rather than rely on a complex operating system interface for users, the simple insertion. of a ArtCards into the ArtCards reader can provide all the configuration requirements. While the back side of a ArtCards has the same visual appearance regardless of the application (since it stores the data), the front of a ArtCards is application dependent. It must make sense to the user in the context of the application.

It can therefore be seen that the arrangement of FIG. Z35 provides for an efficient distribution of information in the forms of books, newspapers, magazines, technical manuals, etc. In a further application, as illustrated in FIG. Z36, the front side of a ArtCards 80 can show an image that includes an artistic effect to be applied to a sampled image. A camera system 81 can be provided which includes a cardreader 82 for reading the programmed data on the back of the card 80 and applying the algorithmic data to a sampled image 83 so as to produce an output image 84. The camera unit 81 including an on board inkjet printer and sufficient processing means for processing the sampled image data. A further application of the ArtCards concept, hereinafter called "Biz-Card" is to store company information on business cards. BizCard is a new concept in company information. The front side of a bizCard as illustrated in FIG. Z37 and looks and functions exactly as today's normal business card. It includes a photograph and contact information, with as many varied card styles as there are business cards. However, the back of each bizCard contains a printed array of black and white dots that holds 1–2 megabytes of data about the company. The result is similar to having the storage of a 3.5" disk attached to each business card.

The information could be company information, specific product sheets, web-site pointers, e-mail addresses, a resume . . . in short, whatever the bizCard holder wants it to. BizCards can be read by any ArtCards reader such as an attached PC card reader, which can be connected to a standard PC by a USB port. BizCards can also be displayed as documents on specific embedded devices. In the case of a PC, a user simply inserts the bizCard into their reader. The bizCard is then preferably navigated just like a web-site using a regular web browser.

Simply by containing the owner's photograph and digital signature as well as a pointer to the company's public. key, each bizCard can be used to electronically verify that the person is in fact who they claim to be and does actually work for the specified company. In addition by pointing to the company's public key, a bizCard permits simple initiation of secure communications.

A further application, hereinafter known as "TourCard" is an application of the ArtCards which contains information for tourists and visitors to a city. When a tourCard is inserted into the ArtCards book reader, information can be in the form of:

Maps
Public Transport Timetables
Places of Interest
Local history
Events and Exhibitions
Restaurant locations
Shopping Centres TourCard is a low cost alternative to tourist brochures, guide books and street directories. With a manufacturing cost of just one cent per card, tourCards could be distributed at tourist information centres, hotels and tourist attractions, at a minimum cost, or free if sponsored by advertising. The portability of the bookreader makes it the perfect solution for tourists. TourCards can also be used at information kiosk's, where a computer equipped with the ArtCards reader can decode the information encoded into the tourCard on any web browser. It is interactivity of the bookreader that makes the tourCard so versatile. For example, Hypertext links contained on the map can be selected to show historical narratives of the feature buildings. In this way the tourist can embark on a guided tour of the city, with relevant transportation routes and timetables available at any time. The tourCard eliminates the need for separate maps, guide books, timetables and restaurant guides and creates a simple solution for the independent traveller. Of course, many other utilizations of the data cards are possible. For example, newspapers, study guides, pop group cards, baseball cards, timetables, music data files, product parts, advertising, TV guides, movie guides, trade show information, tear off cards in magazines, recipes, classified ads, medical information, programmes and software, horse racing form guides, electronic forms, annual reports, restaurant, hotel and vacation guides, translation programmes, golf course information, news broadcast, comics, weather details etc.

For example, the ArtCards could include a book's contents or a newspaper's contents. An example of such a system is as illustrated in FIG. Z35 wherein the ArtCards 70 includes a book title on one surface with the second surface having the encoded contents of the book printed thereon. The card 70 is inserted in the reader 72 which can include a flexible display 73 which allows for the folding up of card reader 72. The card reader 72 can include display controls 74 which allow for paging forward and back and other controls of the card reader 72.

Ink Jet Technologies

The embodiments of the invention use an ink jet printer type device. Of course many different devices could be used. However presently popular ink jet printing technologies are unlikely to be suitable.

The most significant problem with thermal inkjet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal inkjet applications. This leads to an efficiency of around 0.02%, from electricity input to drop momentum (and increased surface area) out.

The most significant problem with piezoelectric inkjet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewide print heads with 19,200 nozzles.

Ideally, the inkjet technologies used meet the stringent requirements of in camera digital color printing and other high quality, high speed, low cost printing applications. To meet the requirements of digital photography, new inkjet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the inkjet systems described below with differing levels of difficulty. 45 different inkjet technologies have been developed by the Assignee to give a wide range of choices for high volume manufacture. These technologies form part of separate applications assigned to the present Assignee as set out in the table below.

The inkjet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the inkjet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Cross-Referenced Applications

The following table is a guide to cross-referenced patent applications filed concurrently herewith and discussed hereinafter with the reference being utilized in subsequent tables when referring to a particular case:

Tables of Drop-on-Demand Inkjets

Eleven important characteristics of the fundamental operation of individual inkjet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of inkjet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of inkjet nozzle. While not all of the possible combinations result in a viable inkjet technology, many million configurations are viable. It is clearly impractical to elucidate all of the possible configurations. Instead, certain inkjet types have been investigated in detail. These are designated IJ01 to IJ45 above.

Other inkjet configurations can readily be derived from these 45 examples by substituting alternative configurations along one or more of the 11 axes. Most of the IJ01 to IJ45 examples can be made into inkjet print heads with characteristics superior to any currently available inkjet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

Ink Jet Printing

A large number of new forms of ink jet printers have been developed to facilitate alternative ink jet technologies for the image processing and data distribution system. Various combinations of ink jet devices can be included in printer devices incorporated as part of the present invention. Australian Provisional Patent Applications relating to these ink jets which are specifically incorporated by cross reference include:

Ink Jet Manufacturing

Further, the present application may utilize advanced semiconductor fabrication techniques in the construction of large arrays of ink jet printers. Suitable manufacturing techniques are described in the following Australian provisional patent specifications incorporated here by cross-reference:

Fluid Supply

Further, the present application may utilize an ink delivery system to the ink jet head. Delivery systems relating to the supply of ink to a series of ink jet nozzles are described in the following Australian provisional patent specifications, the disclosure of which are hereby incorporated by cross-reference:

MEMS Technology

Further, the present application may utilize advanced semiconductor microelectromechanical techniques in the construction of large arrays of ink jet printers. Suitable microelectromechanical techniques are described in the following Australian provisional patent specifications incorporated here by cross-reference:

IR Technologies

Further, the present application may include the utilization of a disposable camera system such as those described in the following Australian provisional patent specifications incorporated here by cross-reference:

DotCard Technologies

Further, the present application may include the utilization of a data distribution system such as that described in the following Australian provisional patent specifications incorporated here by cross-reference:

Artcam Technologies

Further, the present application may include the utilization of camera and data processing techniques such as an Artcam type device as described in the following Australian provisional patent specifications incorporated here by cross-reference:

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

What is claimed is:

1. A user interface for an image transformation device, said user interface comprising a card which is insertable into the device, a face of the card carrying a optically encoded representation of data that is capable of being read by a sensor of the device, the data being a program that is capable of being assimilated by a processor so that the processor can perform algorithmic manipulations to image data representing an image to transform the image, an opposed face of the card carrying a visual representation of a resultant transformation of the image.

2. A user interface as claimed in claim 1, wherein the optically encoded representation carried on said face of the card is in the form of a two-dimensional code that is capable of being read by a scanner of the device.

3. A user interface as claimed in claim 2, in which the two-dimensional code is in the form of a plurality of dots.

4. A user interface as claimed in claim 3, in which the dots are configured to carry data representing an error-correcting algorithm.

* * * * *

UNITED STATES PATENT AND TRADEMARK OFFICE
CERTIFICATE OF CORRECTION

PATENT NO. : 6,476,863 B1
DATED : November 5, 2002
INVENTOR(S) : Kia Silverbrook It is certified that error appears in the above-identified patent and that said Letters Patent is hereby corrected as shown below:

<u>Column 1,</u>
Please replace lines 5 to 12 with the following:

CROSS-REFERENCED AUSTRALIAN PROVISIONAL PATENT NO.

-- PO7991
PO8505
PO7988
PO9395
PO8017
PO8014
PO8025
PO8032
PO7999
PO7998
PO8031
PO8030
PO7997
PO7979
PO8015
PO7978
PO7982
PO7989
PO8019
PO7980
PO8018
PO7938
PO8016
PO8024
PO7940
PO7939
PO8501
PO8500
PO7987
PO8022
PO8497
PO8020
PO8023

UNITED STATES PATENT AND TRADEMARK OFFICE
CERTIFICATE OF CORRECTION

PATENT NO. : 6,476,863 B1
DATED : November 5, 2002
INVENTOR(S) : Kia Silverbrook It is certified that error appears in the above-identified patent and that said Letters Patent is hereby corrected as shown below:

CROSS-REFERENCED AUSTRALIAN PROVISIONAL PATENT NO. cont'd,
PO8504
PO8000
PO7977
PO7934
PO7990
PO8499
PO8502
PO7981
PO7986
PO7983
PO8026
PO8027
PO8028
PO9394
PO9396
PO9397
PO9398
PO9399
PO9400
PO9401
PO9402
PO9403
PO9405
PP0959
PP1397
PP2370
PP2371
PO8003
PO8005
PO9404
PO8066
PO8072
PO8040
PO8071
PO8047
PO8035
PO8044
PO8063
PO8057
PO8056
PO8069

UNITED STATES PATENT AND TRADEMARK OFFICE
CERTIFICATE OF CORRECTION

PATENT NO.   : 6,476,863 B1
DATED        : November 5, 2002
INVENTOR(S)  : Kia Silverbrook It is certified that error appears in the above-identified patent and that said Letters Patent is hereby corrected as shown below:

CROSS-REFERENCED AUSTRALIAN PROVISIONAL PATENT NO. cont'd,

PO8049
          PO8036
          PO8048
          PO8070
          PO8067
          PO8001
          PO8038
          PO8033
          PO8002
          PO8068
          PO8062
          PO8034
          PO8039
          PO8041
          PO8004
          PO8037
          PO8043
          PO8042
          PO8064
          PO9389
          PO9391
          PP0888
          PP0891
          PP0890
          PP0873
          PP0993
          PP0890
          PP1398
          PP2592
          PP2593
          PP3991
          PP3987
          PP3985
          PP3983
          PO7935
          PO7936
          PO7937
          PO8061
          PO8054
          PO8065
          PO8055

UNITED STATES PATENT AND TRADEMARK OFFICE
CERTIFICATE OF CORRECTION

PATENT NO. : 6,476,863 B1
DATED : November 5, 2002
INVENTOR(S) : Kia Silverbrook It is certified that error appears in the above-identified patent and that said Letters Patent is hereby corrected as shown below:

CROSS-REFERENCED AUSTRALIAN PROVISIONAL PATENT NO. cont'd,
PO8053
PO8078
PO7933
PO7950
PO7949
PO8060
PO8059
PO8073
PO8076
PO8075
PO8079
PO8050
PO8052
PO7948
PO7951
PO8074
PO7941
PO8077
PO8058
PO8051
PO8045
PO7952
PO8046
PO9390
PO9392
PP0889
PP0887
PP0882
PP0874
PP1396
PP3989
PP2591
PP3990
PP3986
PP3984
PP3982
PP0895
PP0870
PP0869
PP0887
PP0885

UNITED STATES PATENT AND TRADEMARK OFFICE
CERTIFICATE OF CORRECTION

PATENT NO. : 6,476,863 B1
DATED : November 5, 2002
INVENTOR(S) : Kia Silverbrook It is certified that error appears in the above-identified patent and that said Letters Patent is hereby corrected as shown below:

CROSS-REFERENCED AUSTRALIAN PROVISIONAL PATENT NO. cont'd,

```
PP0884
PP0886
PP0871
PP0876
PP0877
PP0878
PP0879
PP0883
PP0880
PP0881
PO8006
PO8007
PO8008
PO8010
PO8011
PO7947
PO7944
PO7946
PO9393
PP0875
PP0894 --
```

U.S. PATENT/PATENT APPLICATION (CLAIMING RIGHT OF PRIORITY
FROM AUSTRALIAN PROVISIONAL APPLICATION)

```
-- 09/113,060
   09/113,070
   09/113,073
   6,322,181
   09/112,747
   09/112,776
   09/112,750
   09/112,746
   09/112,743
   09/112,742
   09/112,741
   6,196,541
   6,195,150
   09/113,053
   09/112,738
```

UNITED STATES PATENT AND TRADEMARK OFFICE
CERTIFICATE OF CORRECTION

| | |
|---|---|
| PATENT NO. | : 6,476,863 B1 |
| DATED | : November 5, 2002 |
| INVENTOR(S) | : Kia Silverbrook |

It is certified that error appears in the above-identified patent and that said Letters Patent is U.S. PATENT/PATENT APPLICATION cont'd,
09/113,067
09/113,063
09/113,069
09/112,744
6,356,715
09/112,777
09/113,224
6,366,693
09/112,805
09/113,072
09/112,785
6,137,500
09/112,796
09/113,071
09/112,824
09/113,090
09/112,823
09/113,222
09/112,786
09/113,051
09/112,782
09/113,056
09/113,059
09/113,091
6,381,361
6,317,192
09/113,057
09/113,054
09/112,752
09/112,759
09/112,757
6,357,135
09/113,107
6,271,931
6,353,772
6,106,147
09/112,790
6,304,291
09/112,788
6,305,770
6,289,262

UNITED STATES PATENT AND TRADEMARK OFFICE
CERTIFICATE OF CORRECTION

PATENT NO.    : 6,476,863 B1
DATED         : November 5, 2002
INVENTOR(S)   : Kia Silverbrook It is certified that error appears in the above-identified patent and that said Letters Patent is hereby corrected as shown below:

U.S. PATENT/PATENT APPLICATION cont'd,
6,315,200
6,217,165
09/112,781
09/113,052
6,350,023
6,318,849
09/113,101
6,227,652
6,213,588
6,213,589
6,231,163
6,247,795
09/113,099
6,244,691
6,257,704
09/112,778
6,220,694
6,257,705
6,247,794
6,234,610
6,247,793
6,264,306
6,241,342
6,247,792
6,264,307
6,254,220
6,234,611
09/112,808
6,283,582
6,239,821
09/113,083
6,247,796
09/113,122
09/112,793
09/112,794
09/113,128
09/113,127
6,227,653
6,234,609
6,238,040
6,188,415

UNITED STATES PATENT AND TRADEMARK OFFICE
CERTIFICATE OF CORRECTION

PATENT NO. : 6,476,863 B1
DATED : November 5, 2002
INVENTOR(S) : Kia Silverbrook It is certified that error appears in the above-identified patent and that said Letters Patent is hereby corrected as shown below:

U.S. PATENT/PATENT APPLICATION cont'd, 6,227,654
6.209,989
6,247,791
6,336,710
6,217,153
09/112,767
6,243,113
6,283,581
6,247,790
6,260,953
6,267,469
6,224,780
6,235,212
6,280,643
6,284,147
6,214,244
6,071,750
6,267,905
6,251,298
6,258,285
6,225,138
6,241,904
09/113,129
09/113,124
6,231,773
6,190,931
6,248,249
09/113,120
6,241,906
09/113,116
6,241,905
09/113,117
6,231,772
6,274,056
09/113,110
6,248,248

UNITED STATES PATENT AND TRADEMARK OFFICE
CERTIFICATE OF CORRECTION

PATENT NO.    : 6,476,863 B1
DATED         : November 5, 2002
INVENTOR(S)   : Kia Silverbrook It is certified that error appears in the above-identified patent and that said Letters Patent is hereby corrected as shown below:

U.S. PATENT/PATENT APPLICATION cont'd,

09/113,087
        09/113,074
        6,110,754
        09/113,088
        09/112,771
        6, 264, 849
        6,254,793
        6,235,211
        09/112,801
        6,264,850
        6,258,284
        09/113,098
        6,228,668
        6,180,427
        6,171,875
        6,267,904
        6,245,247
        09/112,835
        6,231,148
        09/113,106
        09/113,105
        09/113,104
        6,238,033
        09/112,766
        6,238,111
        09/113,086
        09/113,094
        09/112,760
        6,196,739
        09/112,774
        6,270,182
        6,152,619
        09/113,092
        6,087,638
        09/113,093
        09/113,062
        6,041,600

UNITED STATES PATENT AND TRADEMARK OFFICE
CERTIFICATE OF CORRECTION

PATENT NO.     : 6,476,863 B1
DATED          : November 5, 2002
INVENTOR(S)    : Kia Silverbrook It is certified that error appears in the above-identified patent and that said Letters Patent is hereby corrected as shown below:

U.S. PATENT/PATENT APPLICATION cont'd,

09/113,082
        6,067,797
        09/113,080
        6,044,646
        09/113,065
        09/113,078
        09/113,075 --

Signed and Sealed this

Twenty-seventh Day of May, 2003

JAMES E. ROGAN
*Director of the United States Patent and Trademark Office*